US006934173B2

(12) United States Patent
Keeth et al.

(10) Patent No.: US 6,934,173 B2
(45) Date of Patent: Aug. 23, 2005

(54) 256 MEG DYNAMIC RANDOM ACCESS MEMORY

(75) Inventors: Brent Keeth, Boise, ID (US); Layne G. Bunker, Boise, ID (US); Scott J. Derner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 961 days.

(21) Appl. No.: 09/893,389

(22) Filed: Jun. 28, 2001

(65) Prior Publication Data

US 2001/0055218 A1 Dec. 27, 2001

Related U.S. Application Data

(62) Division of application No. 09/620,606, filed on Jul. 20, 2000, which is a division of application No. 08/916,692, filed on Aug. 22, 1997.

(60) Provisional application No. 60/050,929, filed on May 30, 1997.

(51) Int. Cl.[7] .................................................. G11C 5/02

(52) U.S. Cl. .......................................... 365/51; 365/226

(58) Field of Search ...................... 365/51, 226, 189.67

(56) References Cited

U.S. PATENT DOCUMENTS

| | | | | |
|---|---|---|---|---|
| 4,918,663 A | * 4/1990 | Remington et al. | ......... | 365/226 |
| 4,970,725 A | 11/1990 | McEnroe et al. | ............. | 714/25 |
| 5,155,704 A | 10/1992 | Walther et al. | ............. | 365/201 |
| 5,159,273 A | 10/1992 | Wright et al. | ............... | 324/537 |
| 5,212,440 A | 5/1993 | Waller | ........................ | 323/313 |
| 5,231,605 A | 7/1993 | Lee | ........................... | 365/201 |
| 5,266,821 A | 11/1993 | Chern et al. | ................ | 257/312 |
| 5,373,227 A | 12/1994 | Keeth | ......................... | 323/313 |
| 5,379,263 A | 1/1995 | Ogawa et al. | ......... | 365/230.04 |
| 5,481,179 A | 1/1996 | Keeth | ......................... | 323/315 |
| 5,519,360 A | 5/1996 | Keeth | .......................... | 331/57 |
| 5,526,364 A | 6/1996 | Roohparvar | ................ | 714/724 |

(Continued)

FOREIGN PATENT DOCUMENTS

JP 0108540 * 8/1979 ........... G11C/19/28

OTHER PUBLICATIONS

Betty Prince, "Semiconductor Memories", 1983, Wiley, 2nd edition pp. 458–459.*

(Continued)

*Primary Examiner*—M. Tran
(74) *Attorney, Agent, or Firm*—Thorp Reed & Armstrong, LLP

(57) ABSTRACT

A 256 Meg dynamic random access memory is comprised of a plurality of cells organized into individual arrays, with the arrays being organized into 32 Meg array blocks, which are organized into 64 Meg quadrants. Sense amplifiers are positioned between adjacent rows in the individual arrays while row decoders are positioned between adjacent columns in the individual arrays. In certain of the gap cells, multiplexers are provided to transfer signals from I/O lines to data lines. A datapath is provided which, in addition to the foregoing, includes array I/O blocks, responsive to the datalines from each quadrant to output data to a data read mux, data buffers, and data driver pads. The write data path includes a data in buffer and data write muxes for providing data to the array I/O blocks. A power bus is provided which minimizes routing of externally supplied voltages, completely rings each of the array blocks, and provides gridded power distribution within each of the array blocks. A plurality of voltage supplies provide the voltages needed in the array and in the peripheral circuits. The power supplies are organized to match their power output to the power demand and to maintain a desired ratio of power production capability and decoupling capacitance. A powerup sequence circuit is provided to control the powerup of the chip. Redundant rows and columns are provided as is the circuitry necessary to logically replace defective rows and columns with operational rows and columns. Circuitry is also provided on chip to support various types of test modes.

31 Claims, 367 Drawing Sheets

U.S. PATENT DOCUMENTS

| | | | | | |
|---|---|---|---|---|---|
| 5,552,739 | A | * | 9/1996 | Keeth et al. | 327/538 |
| 5,557,579 | A | | 9/1996 | Raad et al. | 365/226 |
| 5,574,697 | A | | 11/1996 | Manning | 365/226 |
| 5,614,859 | A | | 3/1997 | Ong | 327/333 |
| 5,651,011 | A | | 7/1997 | Keeth | 714/724 |
| 5,677,645 | A | | 10/1997 | Merritt | 327/536 |
| 5,710,741 | A | * | 1/1998 | McLaury | 365/226 |
| 5,751,652 | A | | 5/1998 | Tomita | 365/226 |
| 5,838,627 | A | | 11/1998 | Tomishima et al. | 365/230.03 |
| 5,880,622 | A | * | 3/1999 | Evertt et al. | 327/535 |
| 5,960,455 | A | | 9/1999 | Bauman | 711/120 |
| 6,043,118 | A | | 3/2000 | Suwanai et al. | 438/253 |

OTHER PUBLICATIONS

Sugibayashi et al., "A 30–ns 256–Mb DRAM with Multidivided Array Structure", IEEE Journal of Solid–State Circuits, vol. 28 (No. 11), (Nov. 1993).

Taguchi et al., "A 40–ns 64–Mb DRAM with 64–b Parallel Data Bus Architecture", IEEE Journal of Solid–State Circuits, vol. 26 (No. 11), (Nov. 1991).

Kitsukawa et al., "256–Mb DRAM Circuit Technologies for File Applications",IEEE Journal of Solid–State Circuits, vol. 28 (No. 11), (Nov. 1993).

JEDEC Solid State Products Engineering Council, "Committee Letter Ballot", JC–42.3–95–73, Item #633.13, Arlington, VA (Apr. 1995).

Yoo et al., "SP 23.6: A 32–Bank 1Gb DRAM with 1 GB/s Bandwidth", ISSCC96/Session 23/DRAM/Paper SP 23.6.

Nitta et al., "23.5: 1.6GB/s Data–Rate 1Gb Synchronous DRAM with Hierarchial Square–Shaped Memory Block and Distributed Bank Architecture", ISSCC96/Session 23/DRAM Paper SP 23.5.

U.S. Appl. No. 08/521,563, entitled Improved Voltage Regulator Circuit, filed Aug. 30, 1995.

U.S. Appl. No. 08/668,347, entitled Differential Voltage Regulator, filed Jun. 26, 1996.

U.S. Appl. No. 08/460,234, entitled Single Deposition Layer Metal Dynamic Random Access Memory, filed Aug. 17, 1995.

U.S. Appl. No. 08/420,943, entitled Dynamic Random–Access Memory, filed Jun. 4, 1995.

U.S. Appl. No. 08/194,184, entitled Integrated Circuit Power Supply Having Piecewise Linearity, filed Feb. 8, 1994.

U.S. Appl. No. 08/137,679, entitled A Voltage Reference Circuit with Common Gate Loading for a Current Mirror Output Stage, filed Oct. 14, 1993.

U.S. Appl. No. 08/325,766, entitled An Efficient Method for Obtaining Usable Parts From a Partially Good Memory Integrated Circuit, filed Oct. 19, 1994.

* cited by examiner

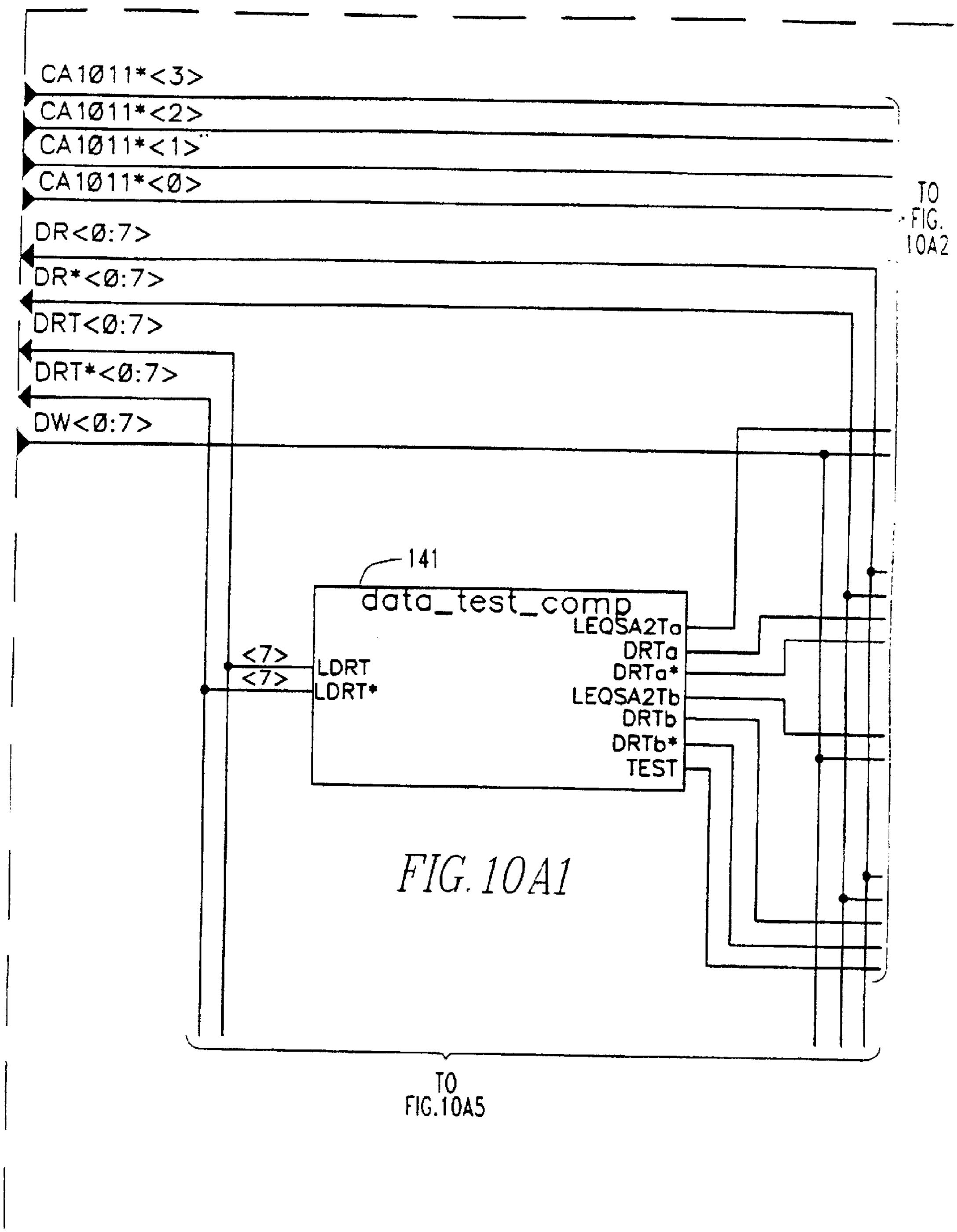
*FIG. 10A1*

FIG. 10A2
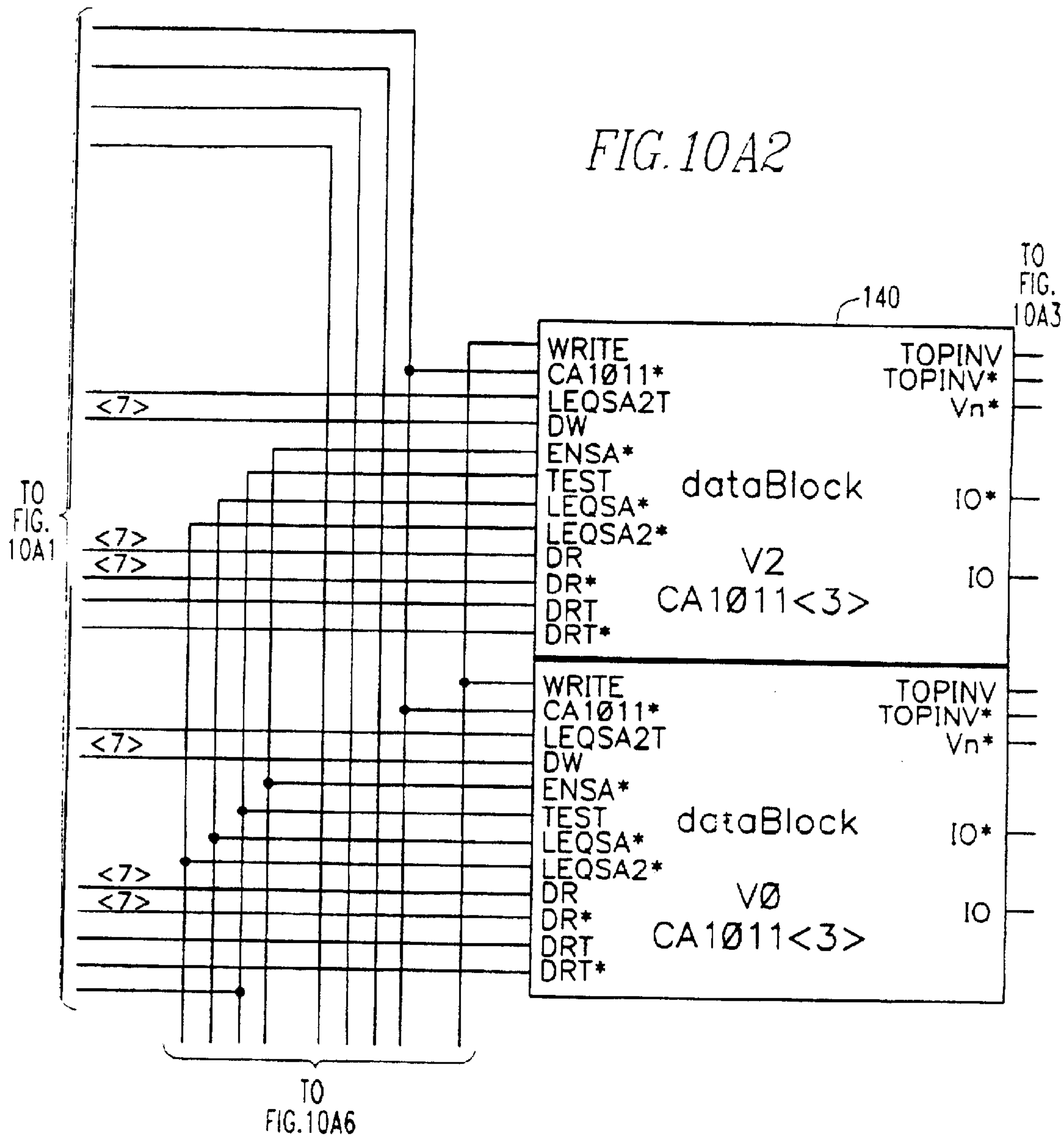

FIG. 10A3
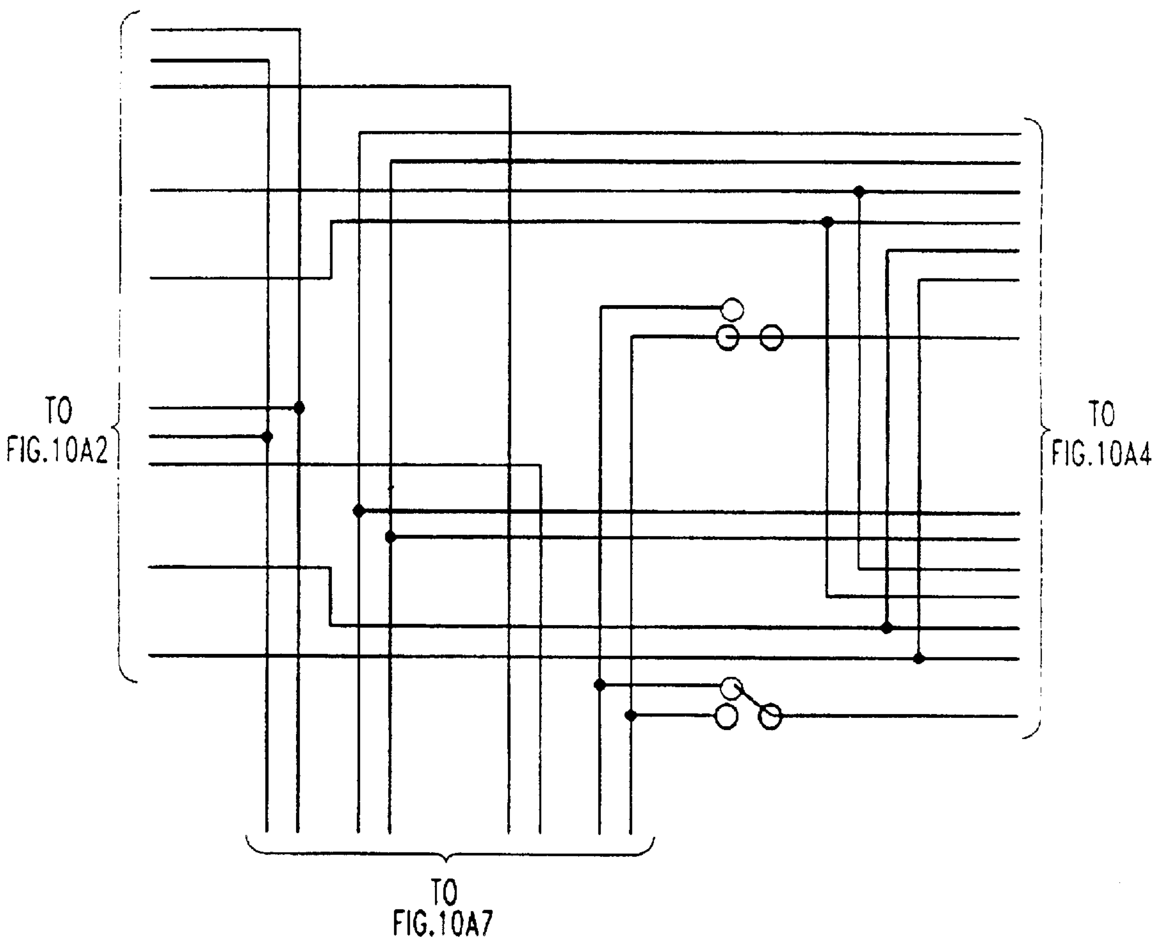

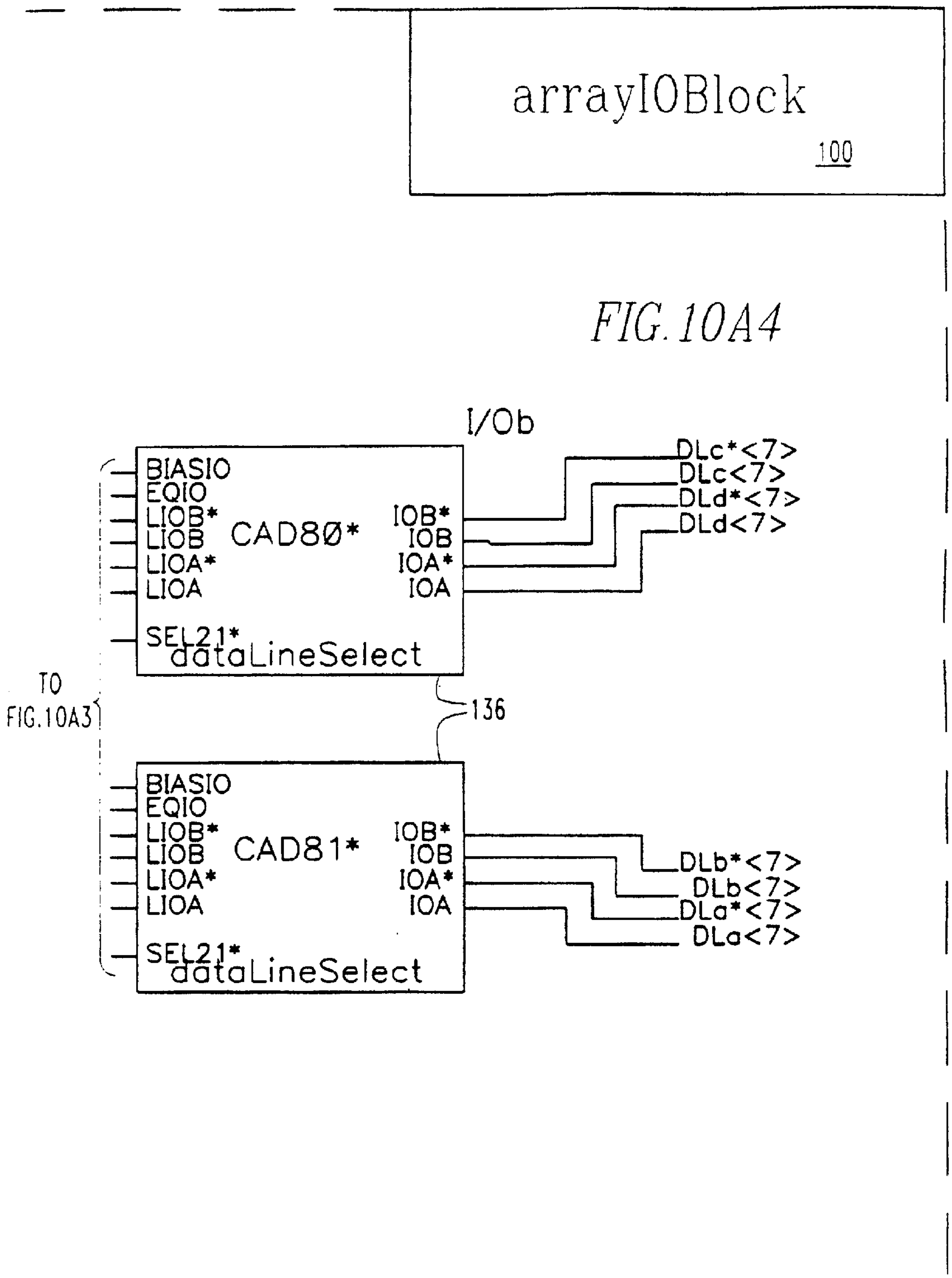
FIG. 10A4

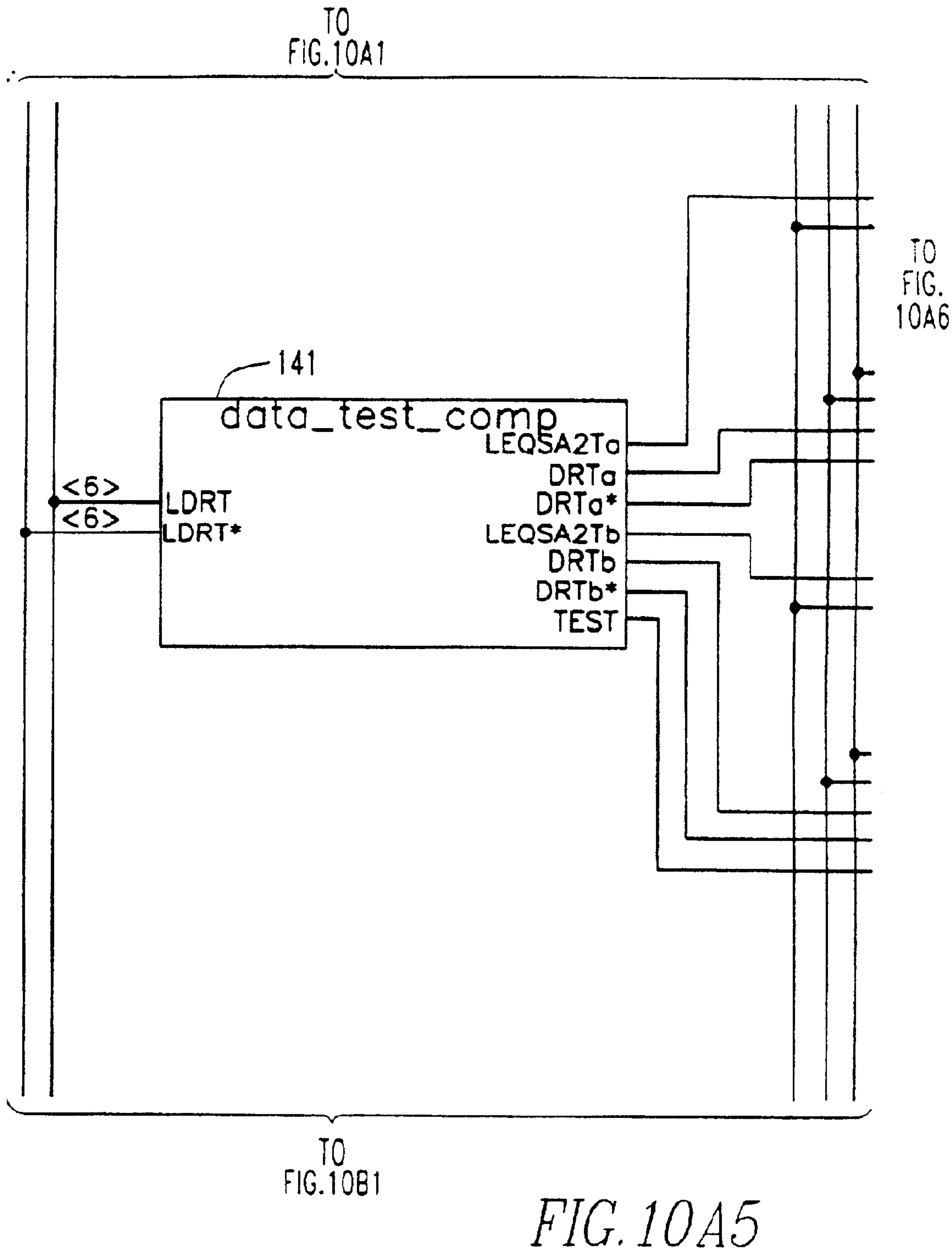
FIG. 10A5

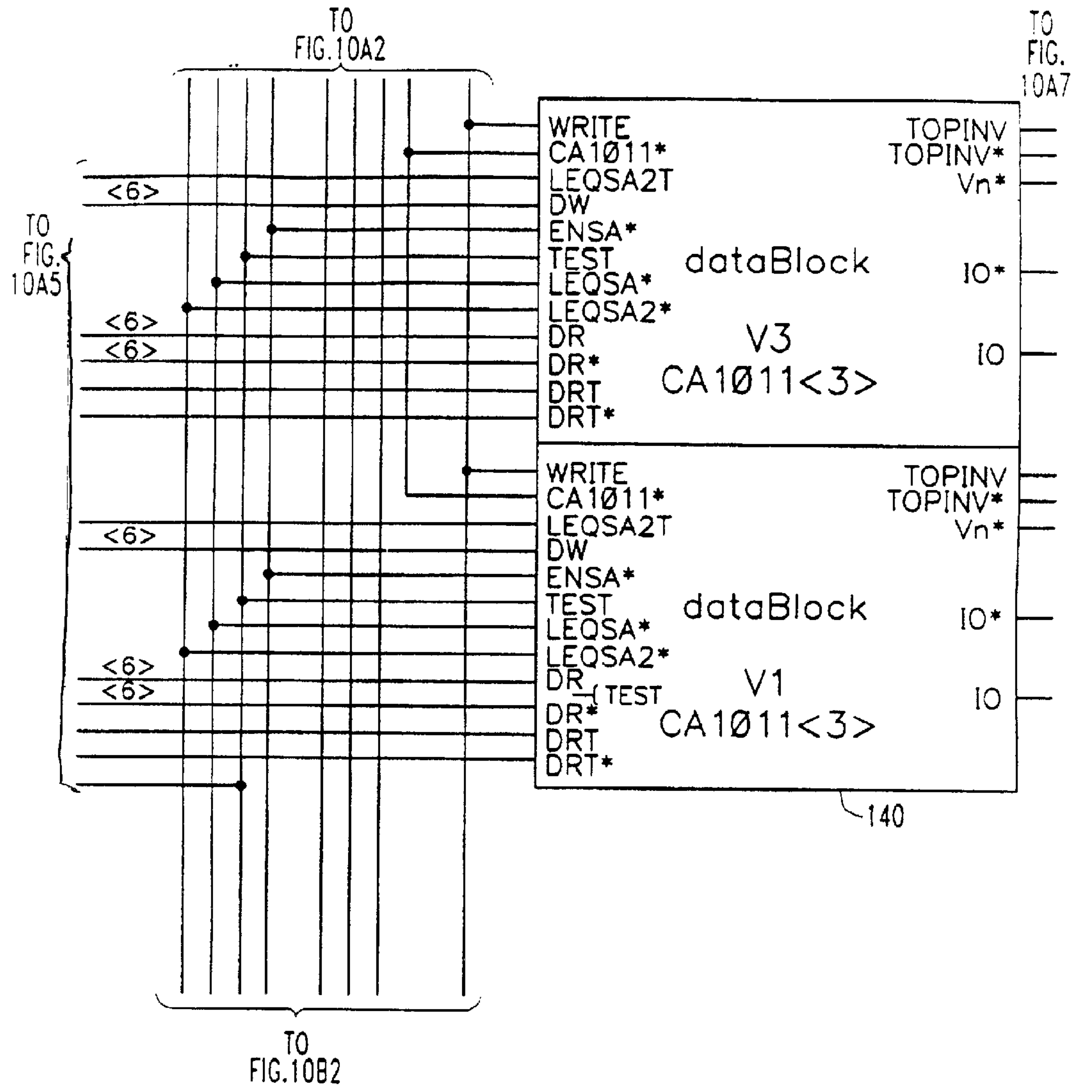
*FIG. 10A6*

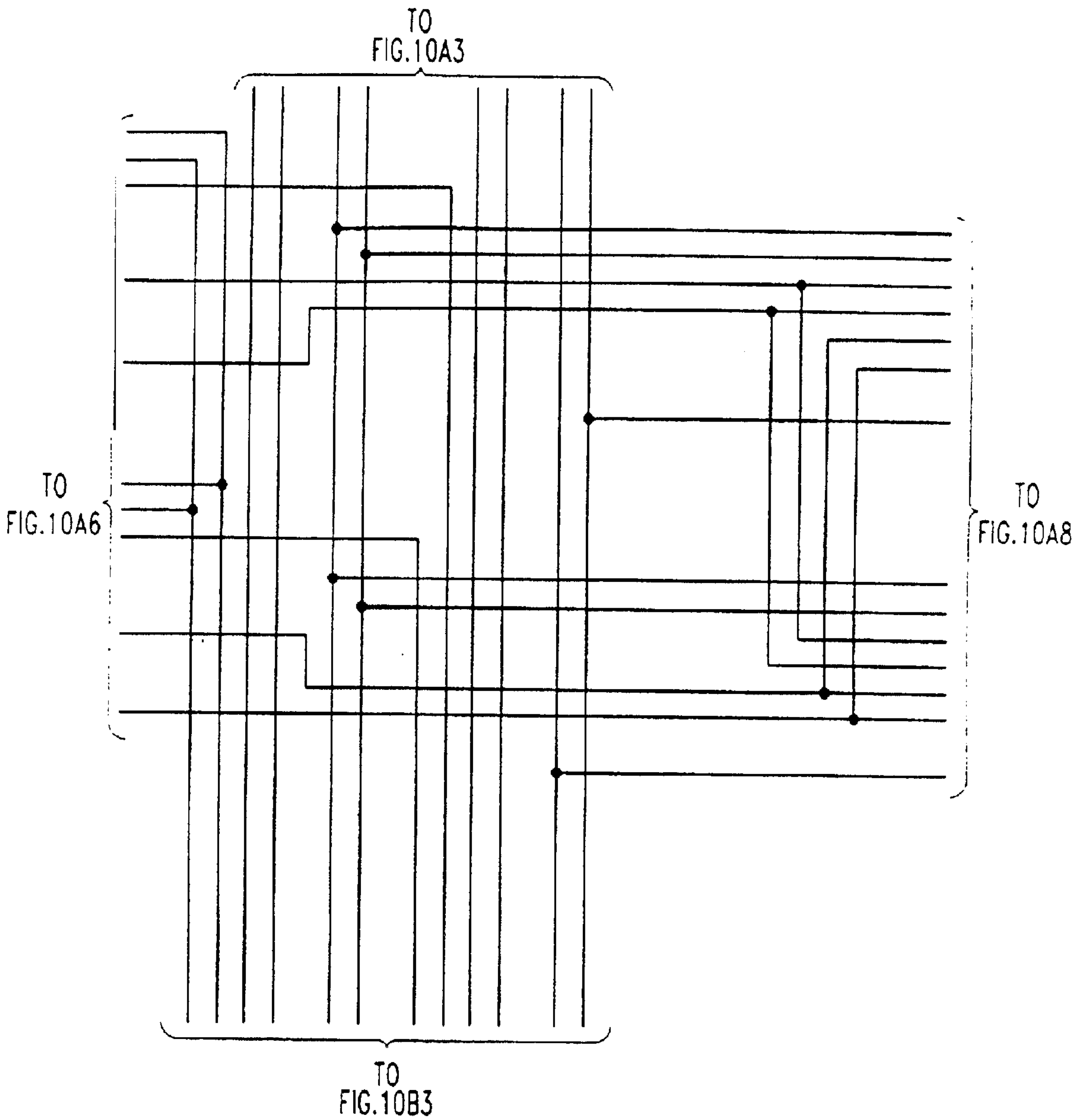
FIG. 10A7

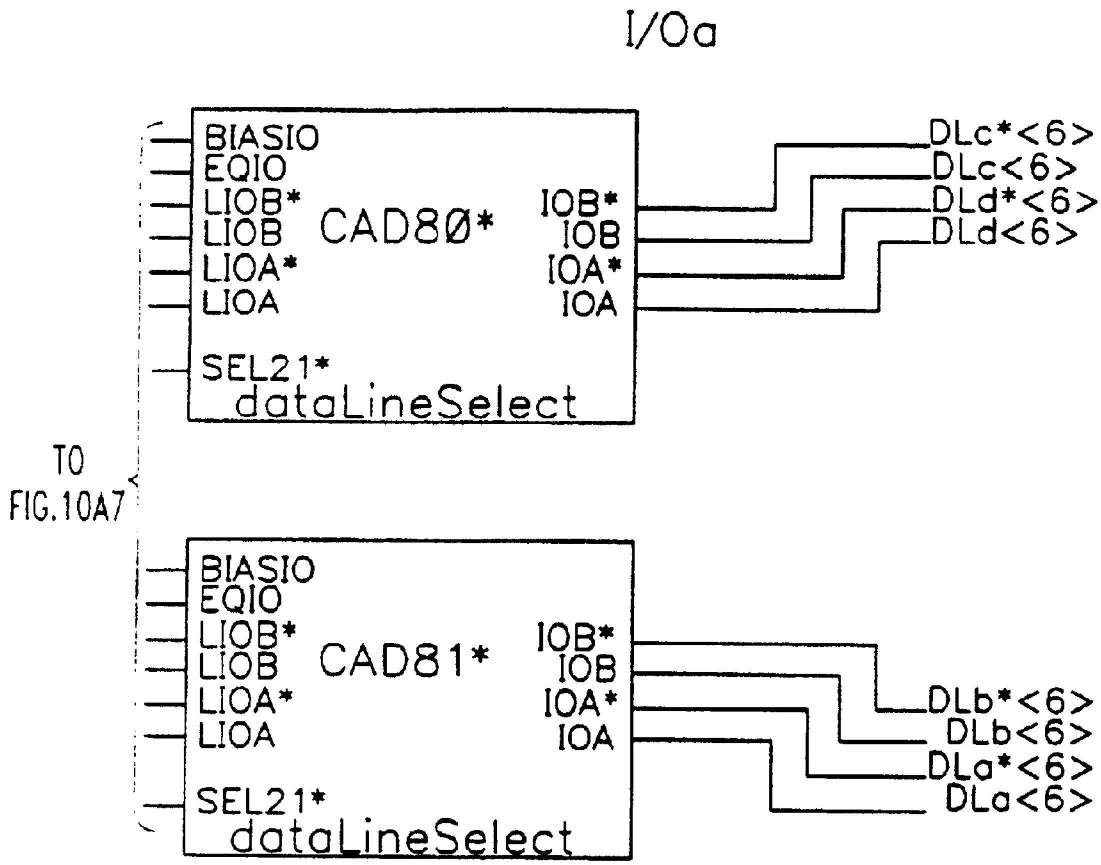
*FIG. 10A8*

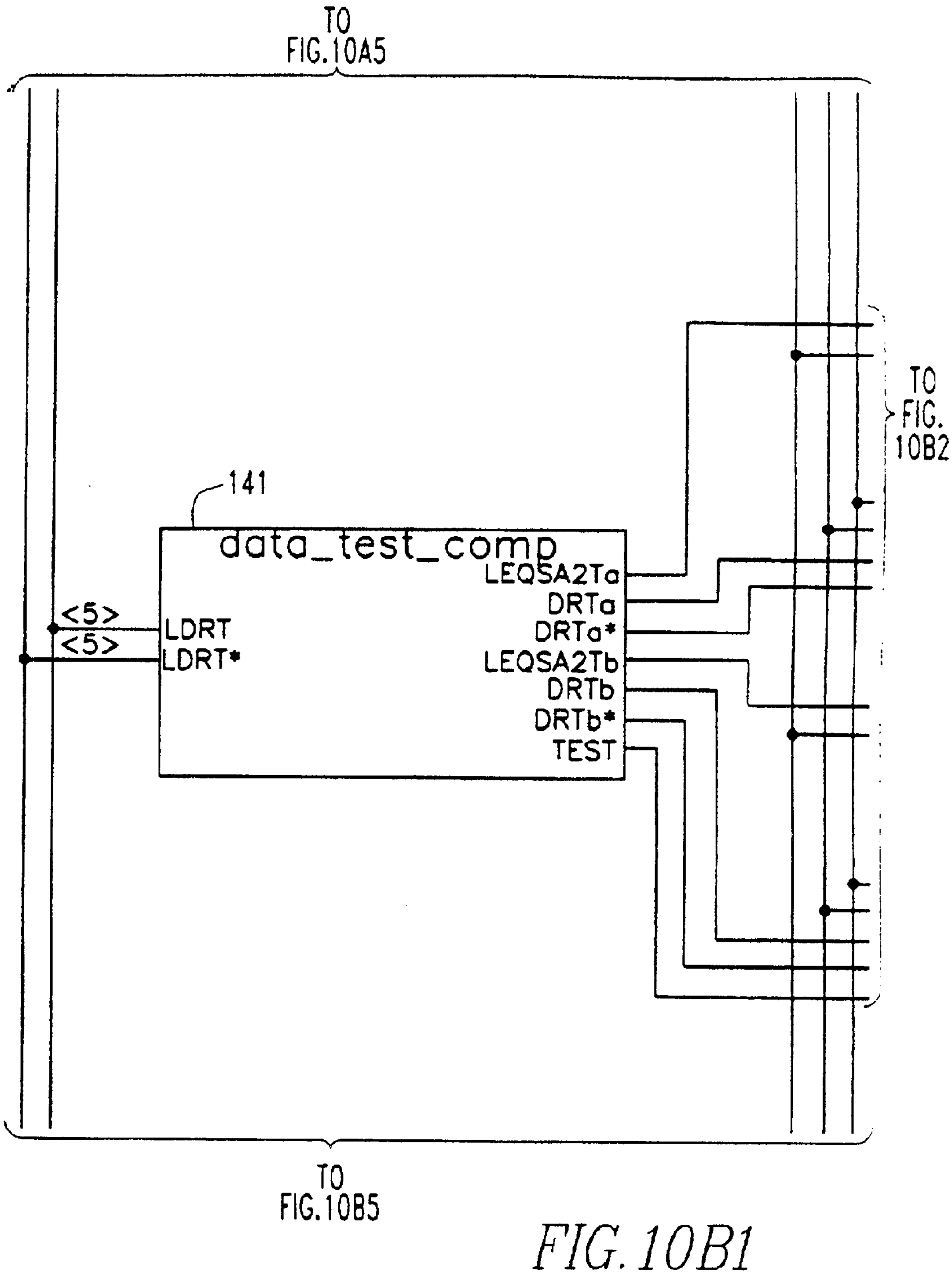
FIG. 10B1

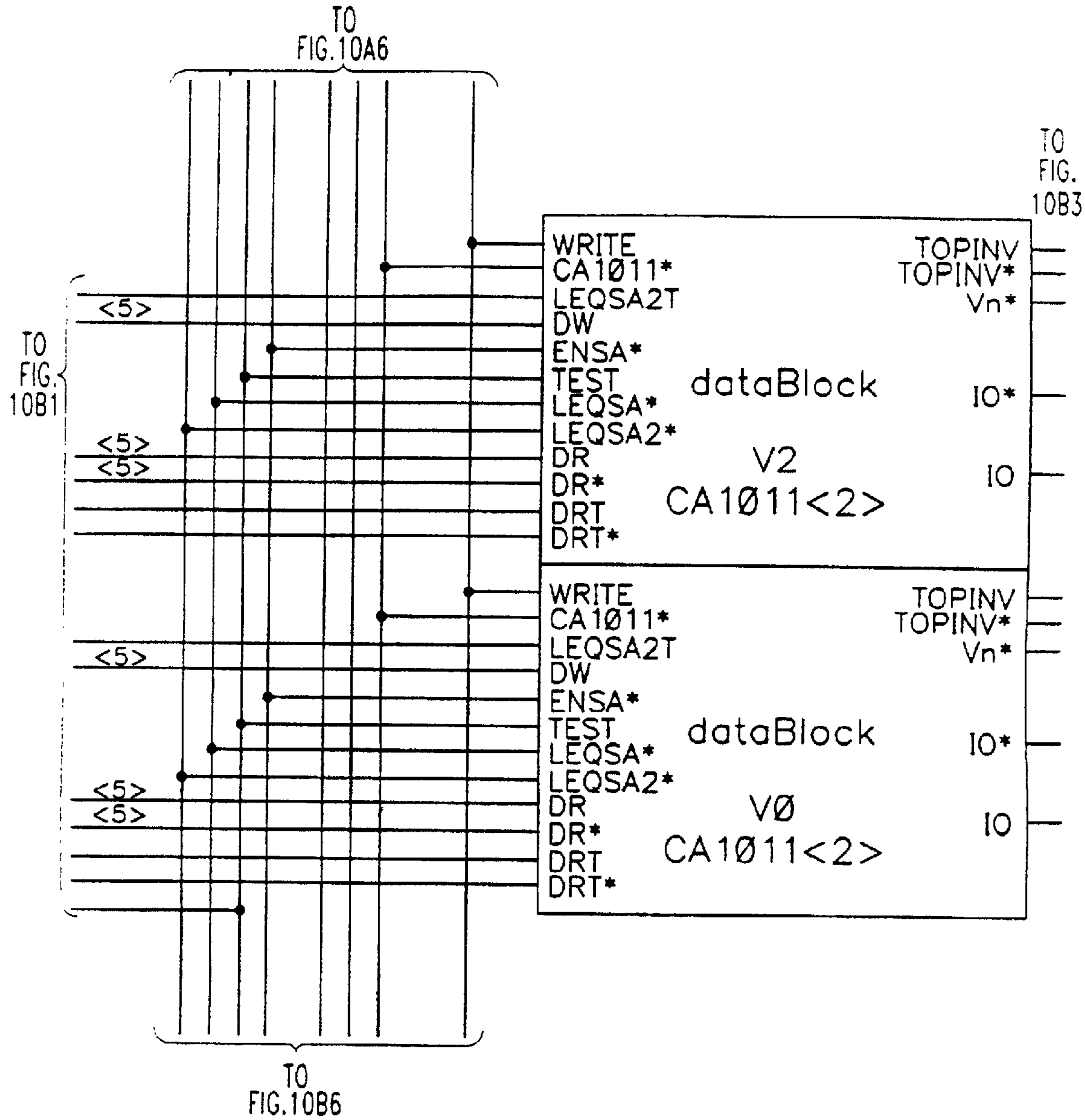
FIG. 10B2

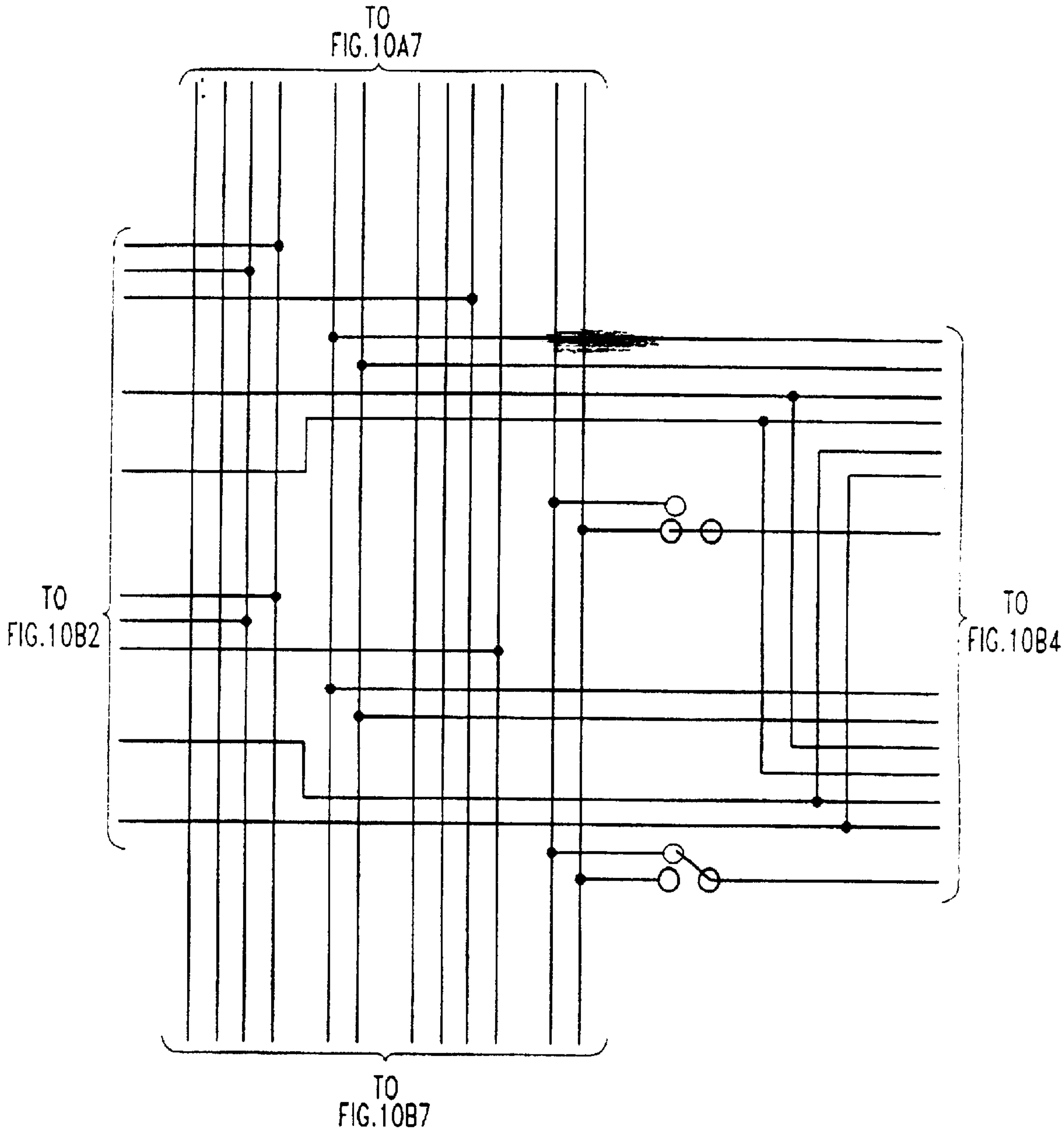
FIG. 10B3

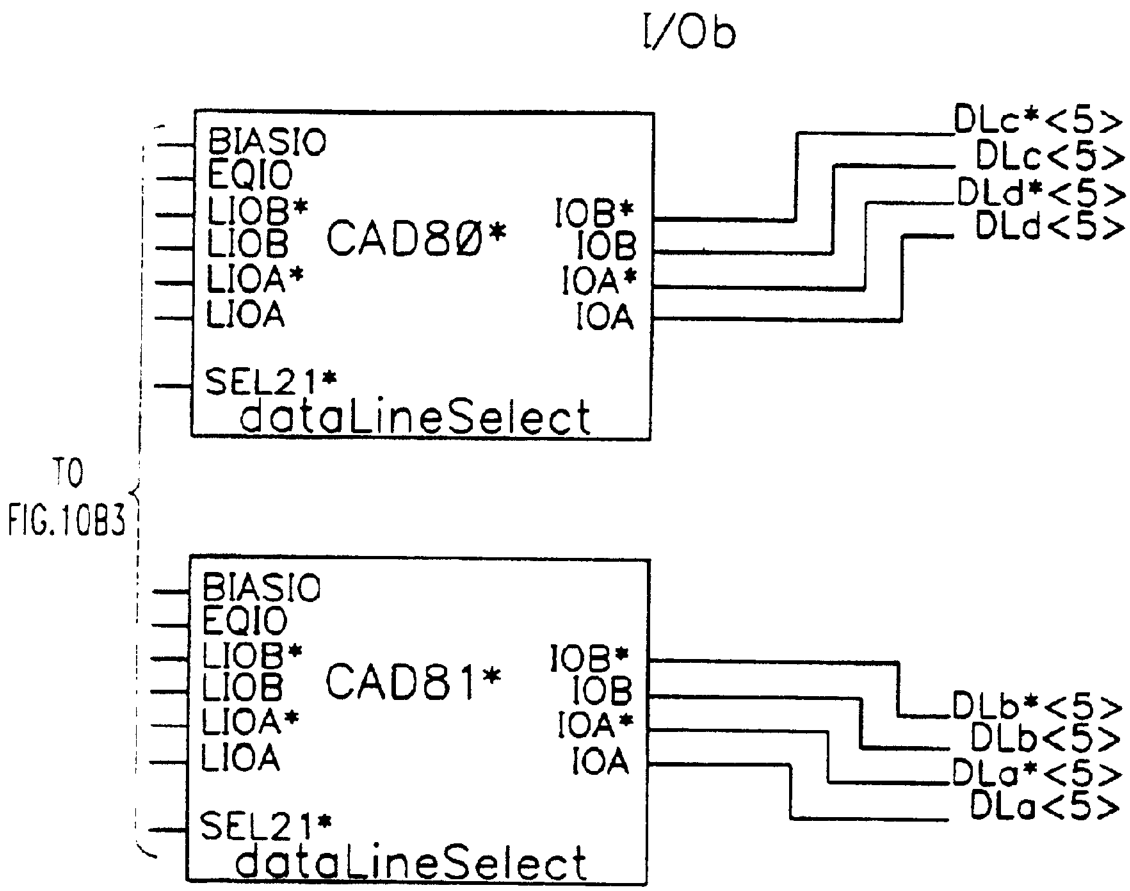
*FIG. 10B4*

FIG. 10B5
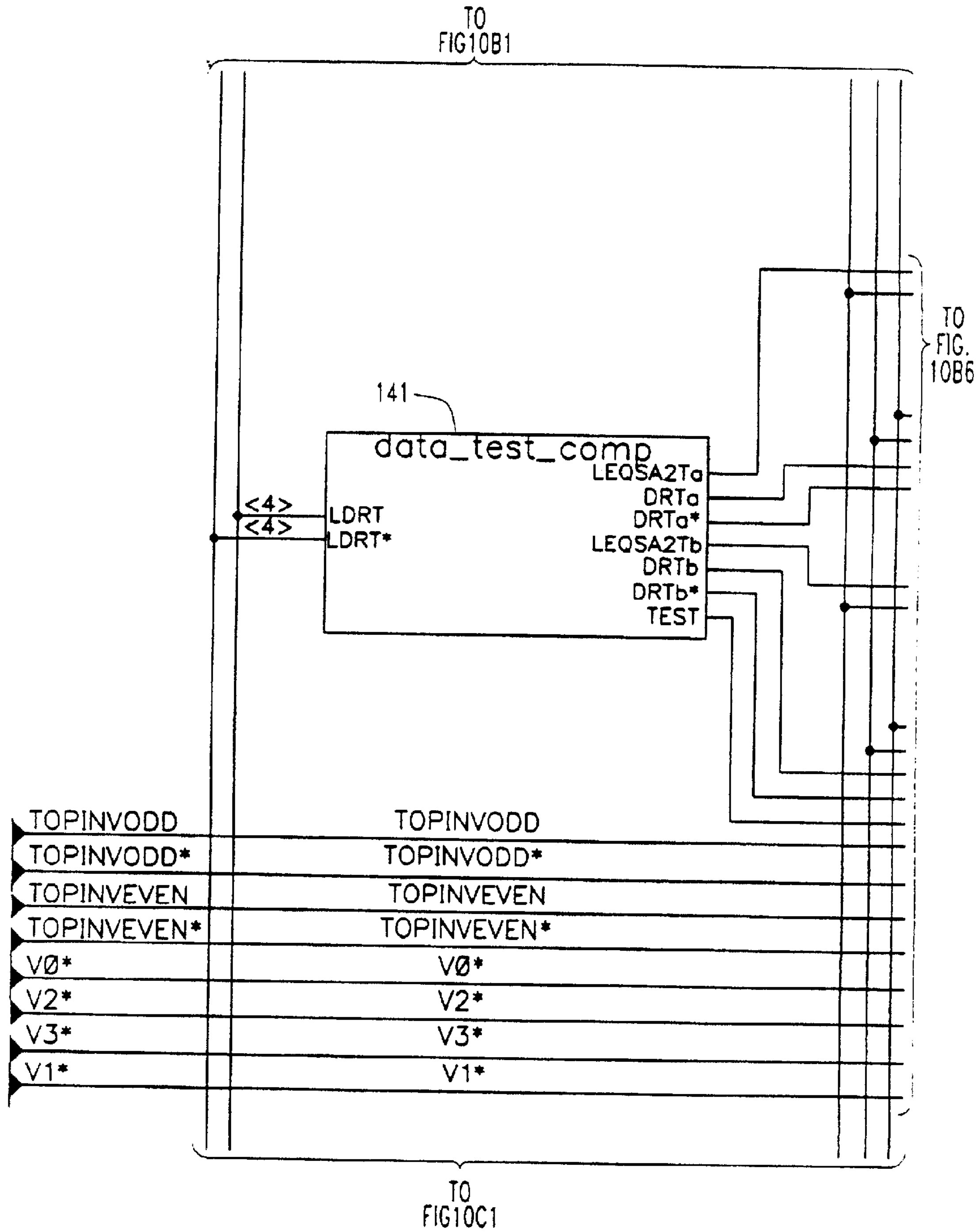

FIG. 10B6
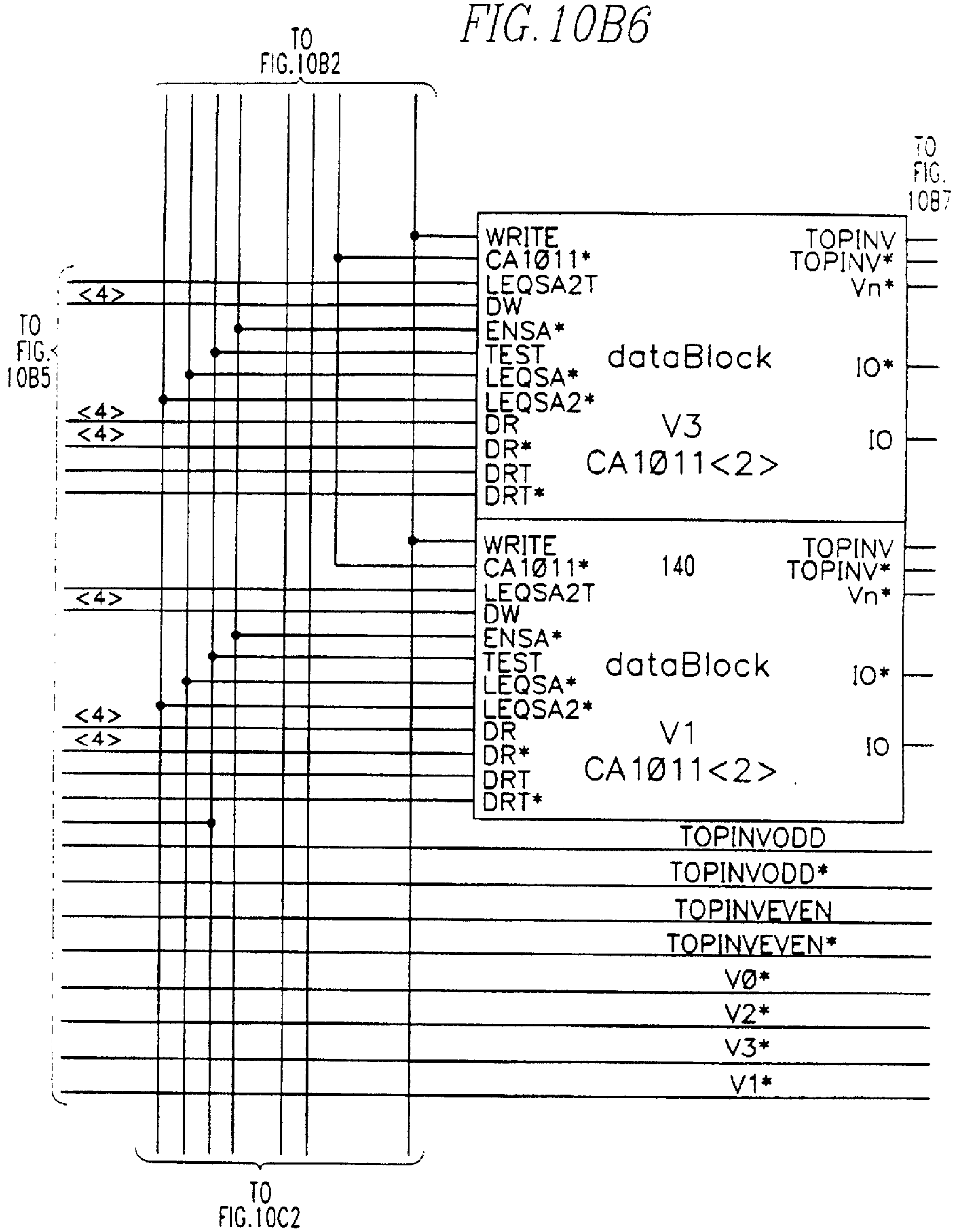

FIG. 10B7
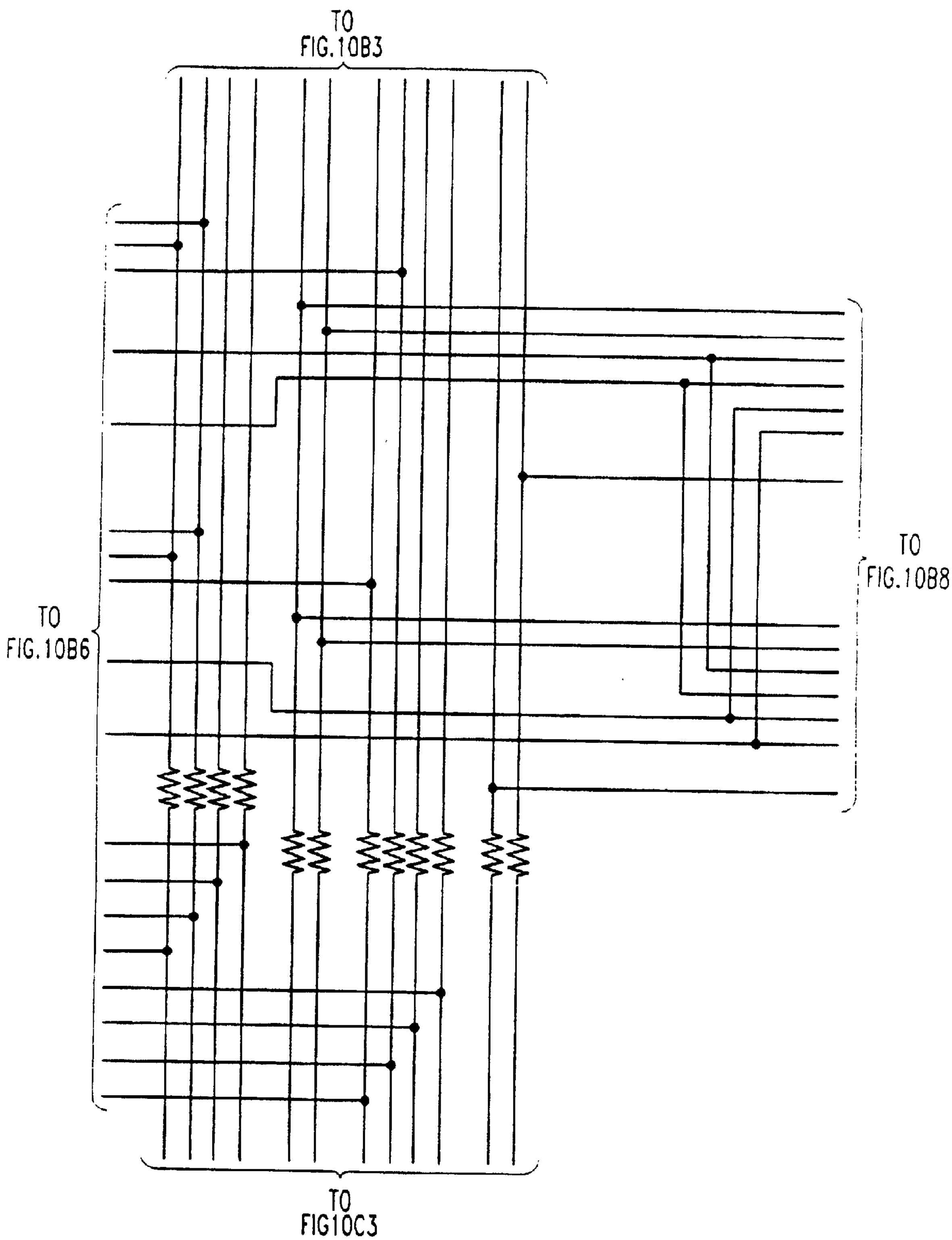

FIG. 10B8
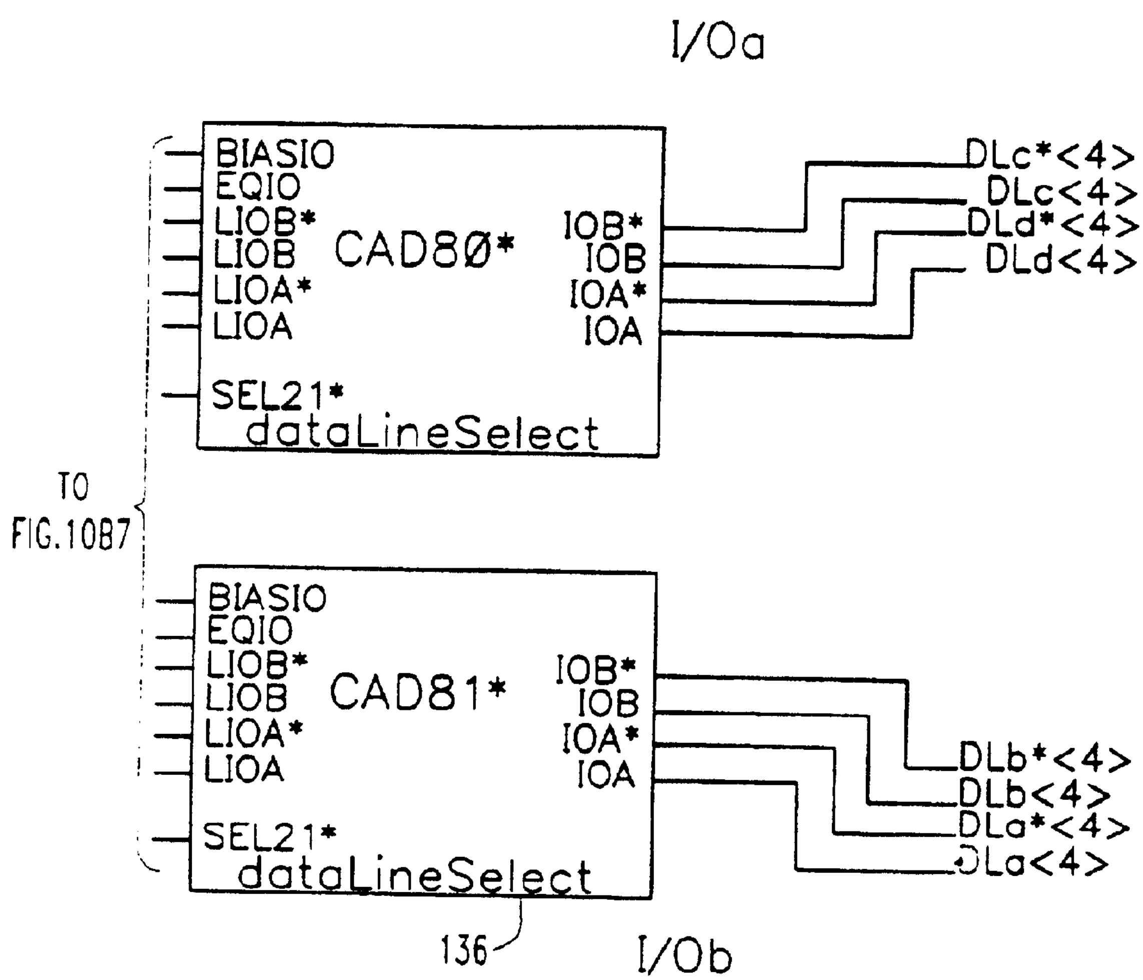

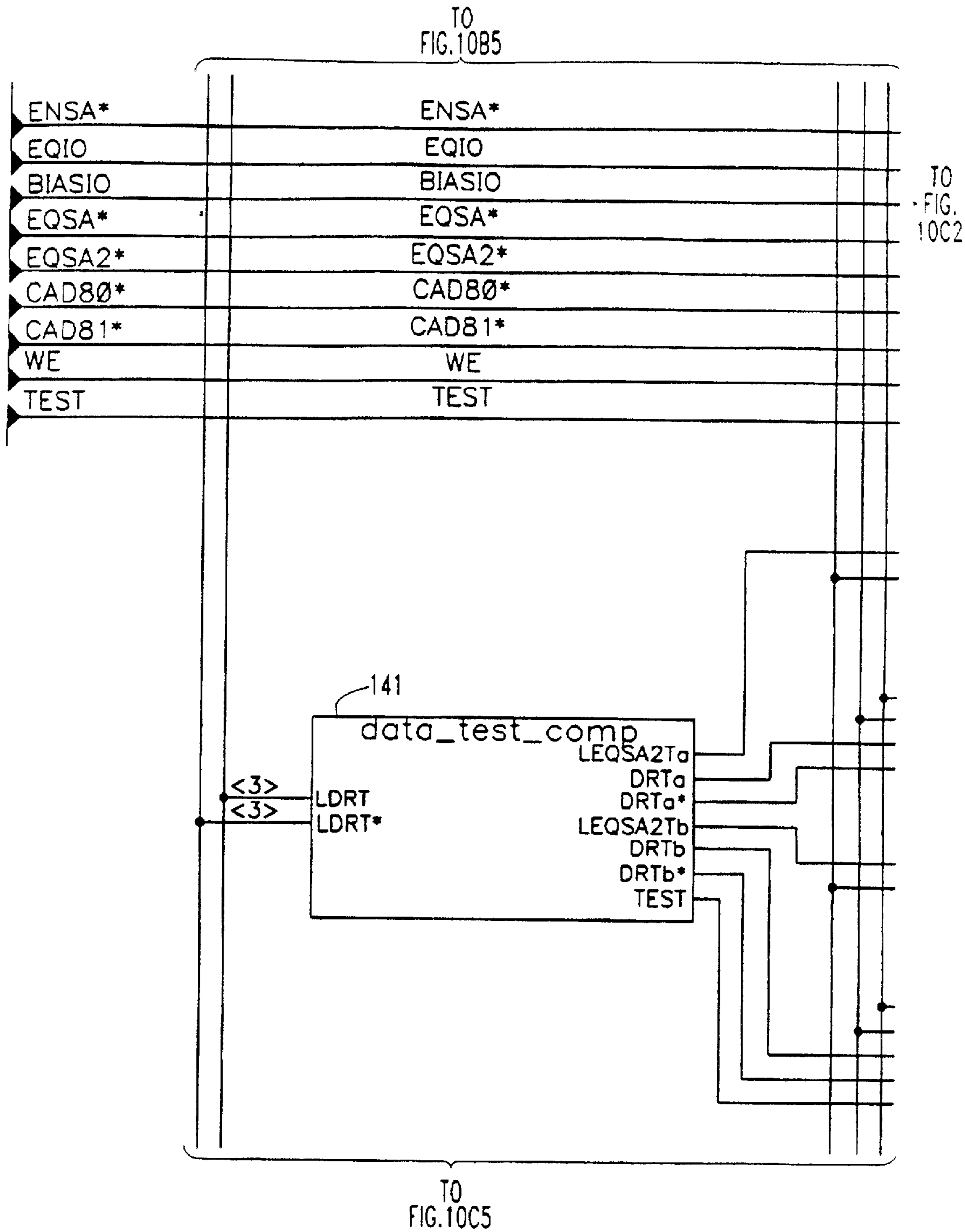
*FIG. 10C1*

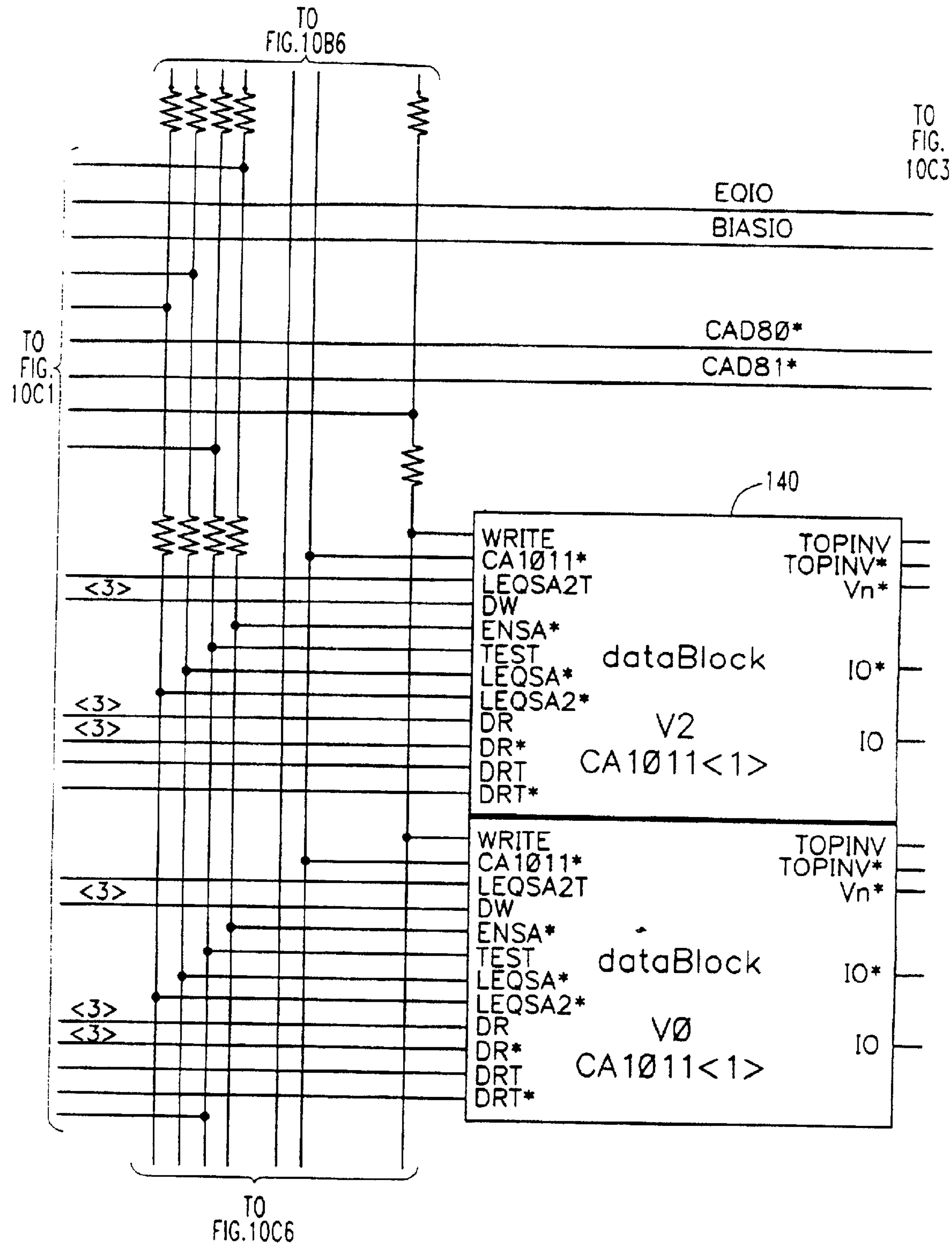
*FIG. 10C2*

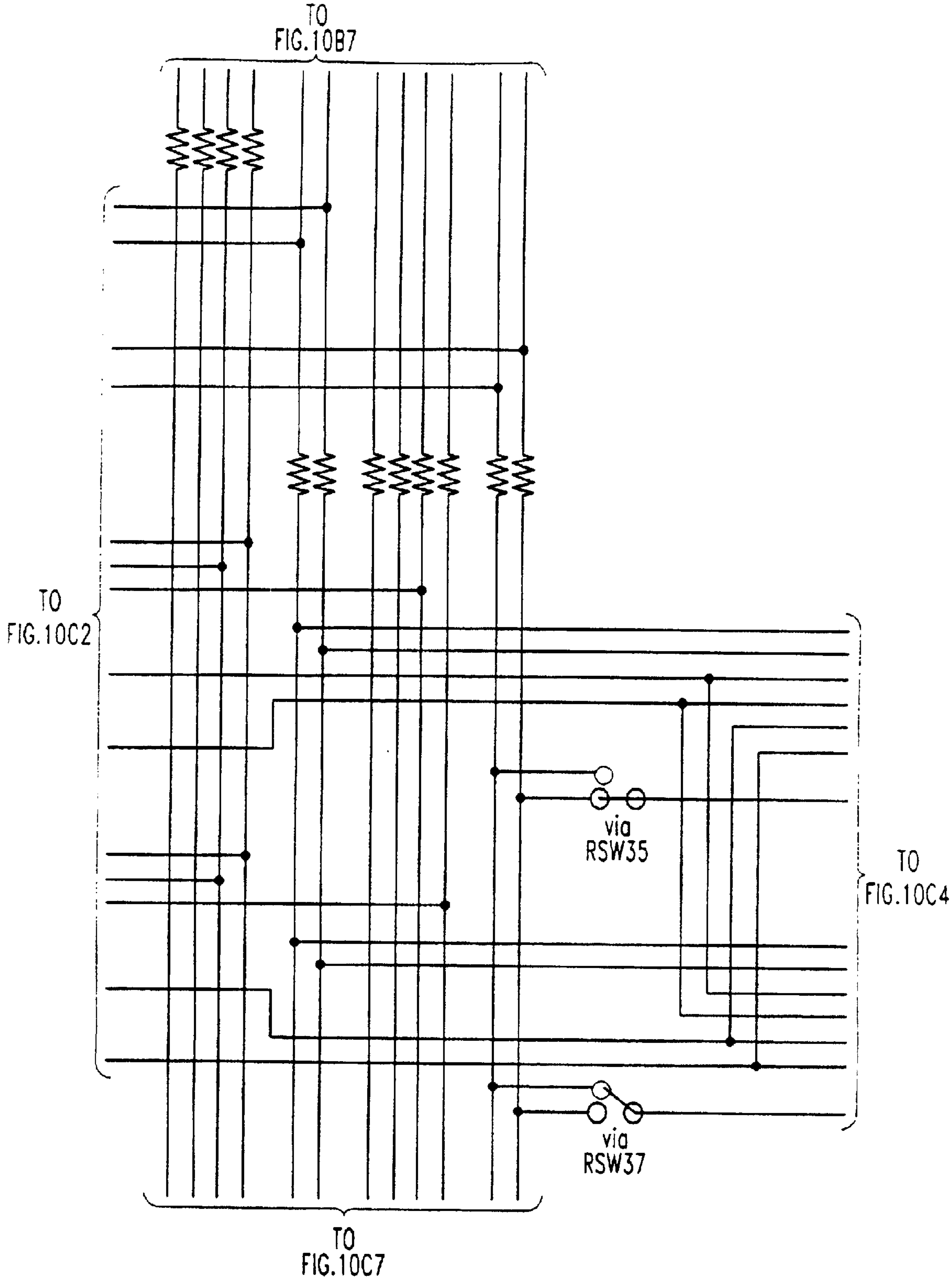
FIG. 10C3

FIG. 10C4
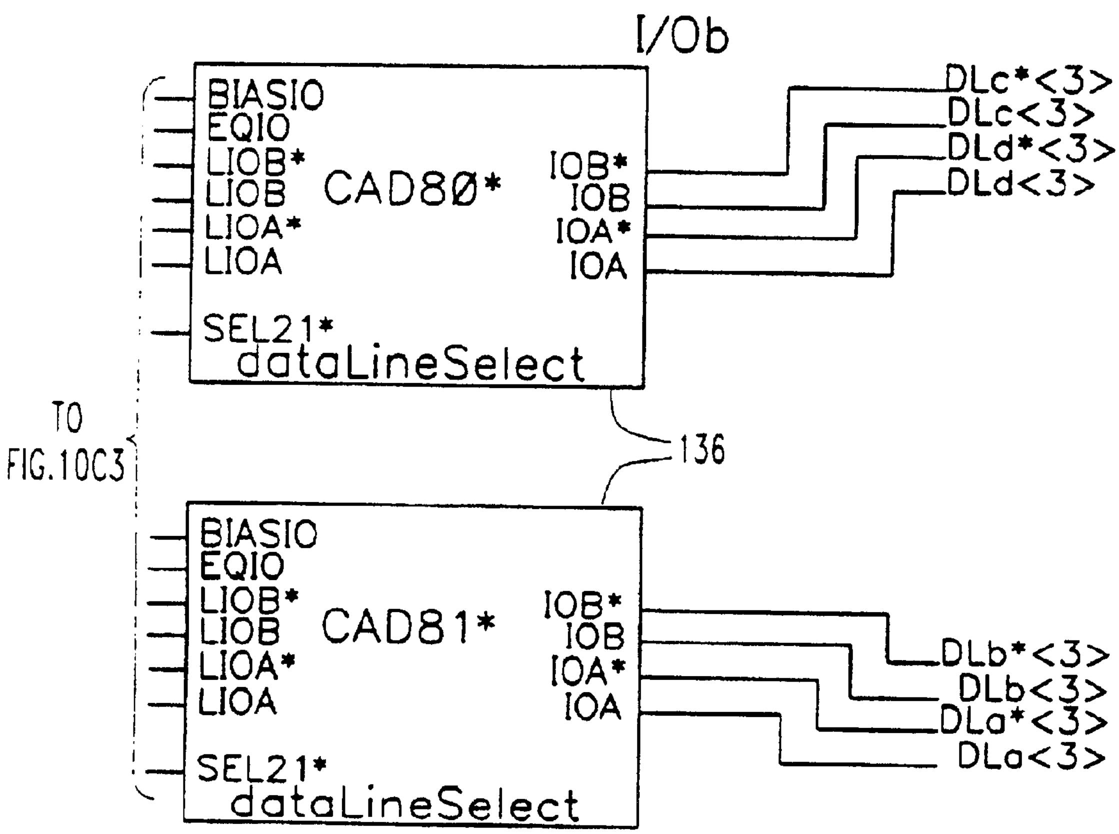

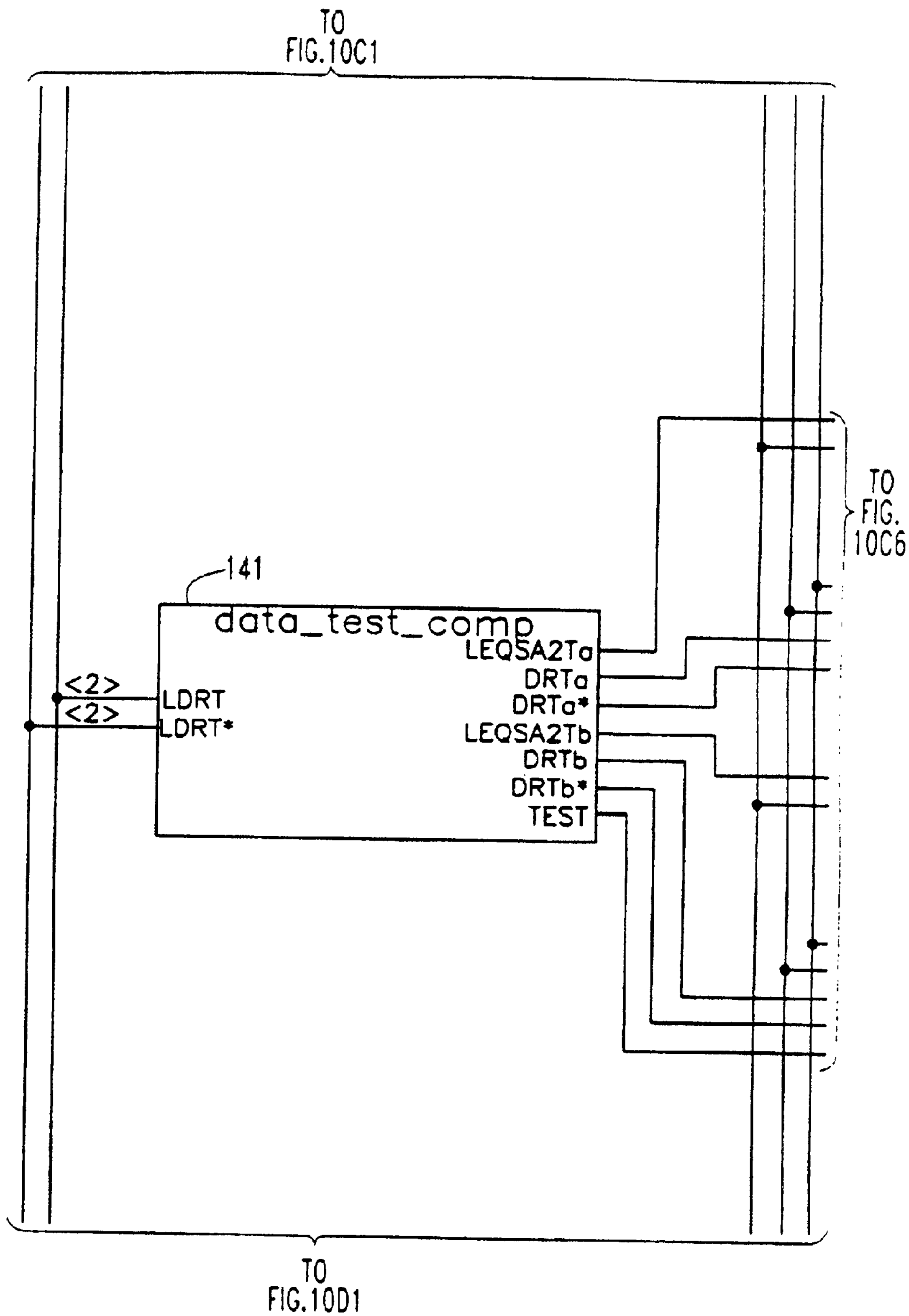
FIG. 10C5

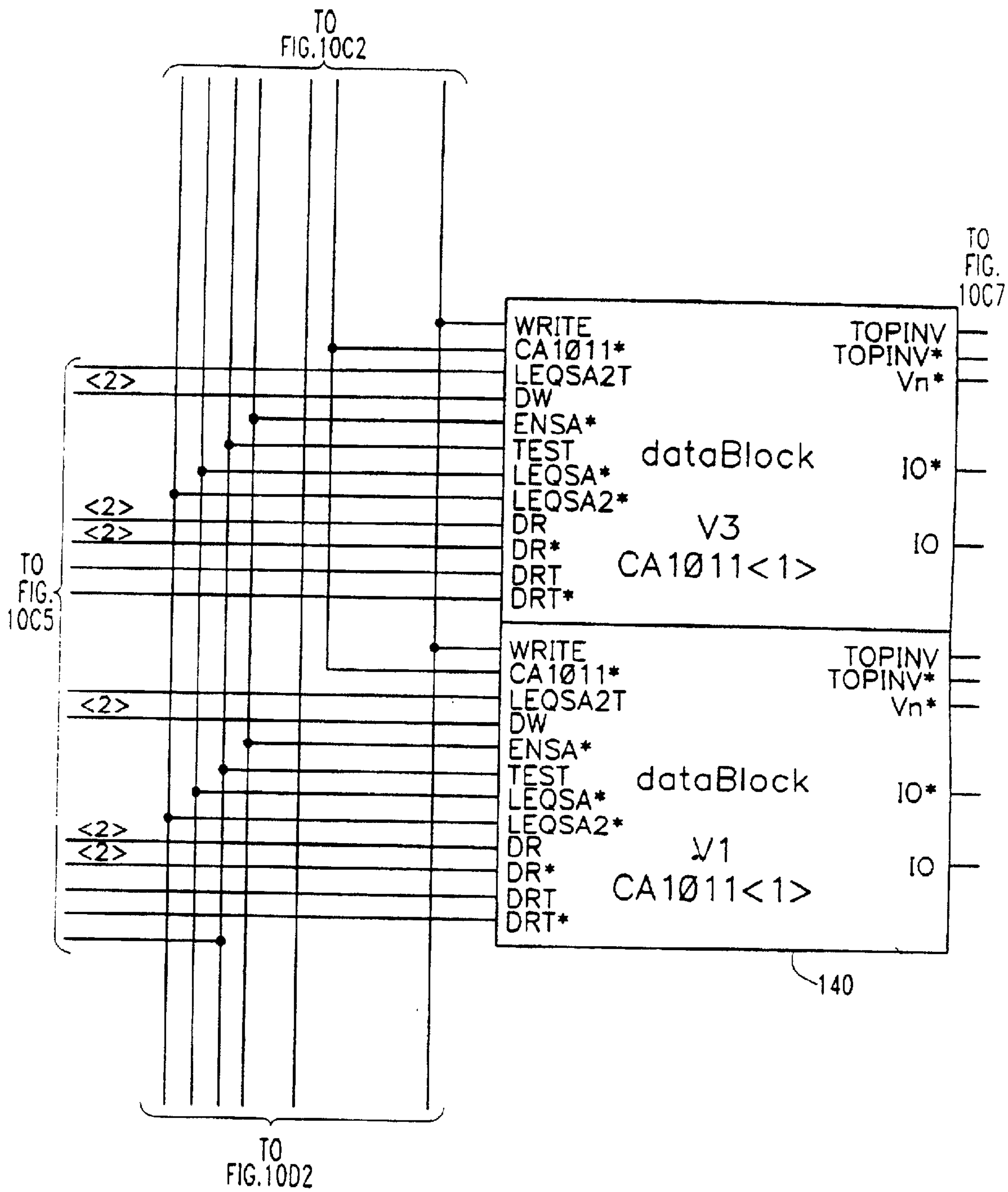
FIG. 10C6

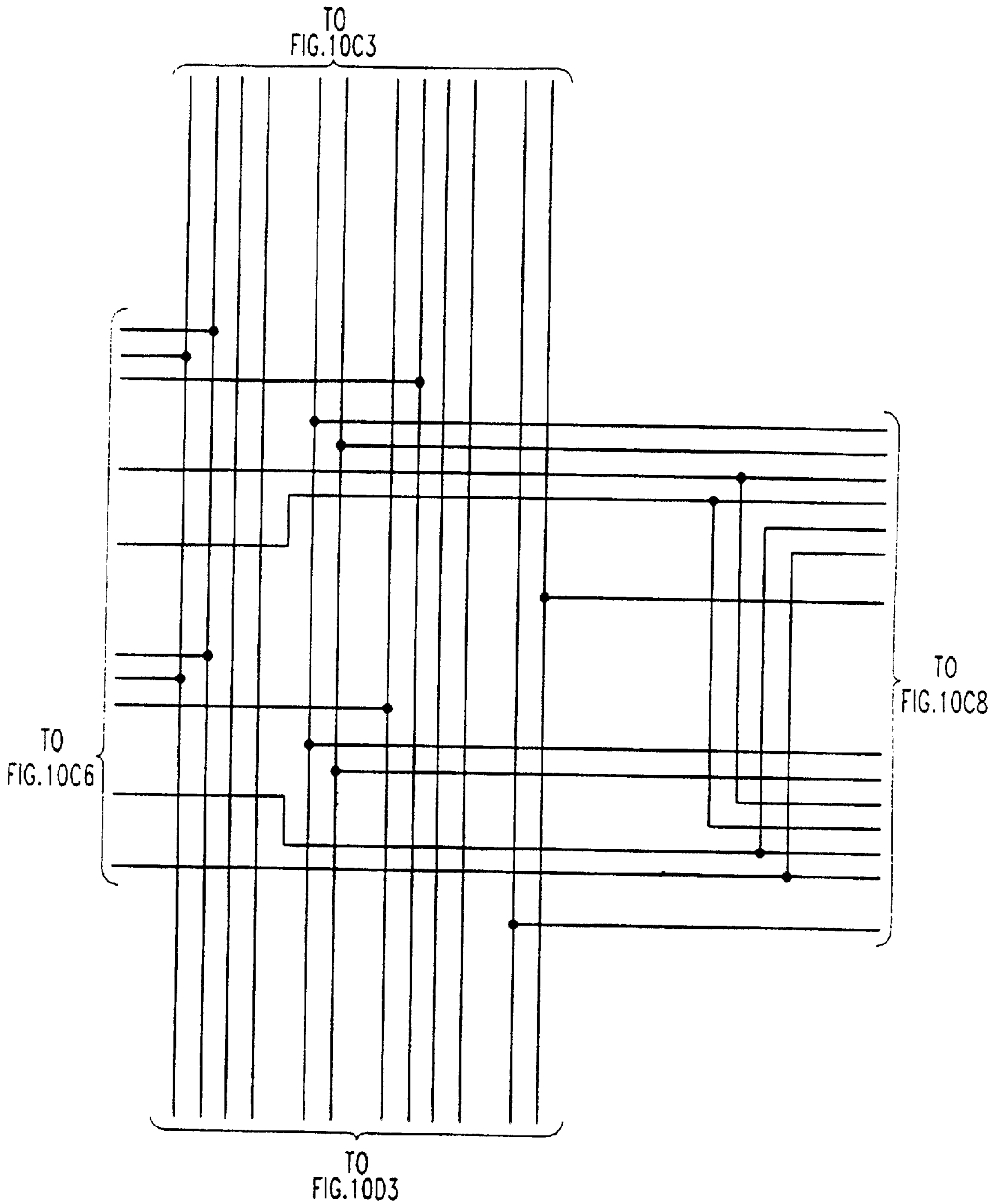
FIG. 10C7

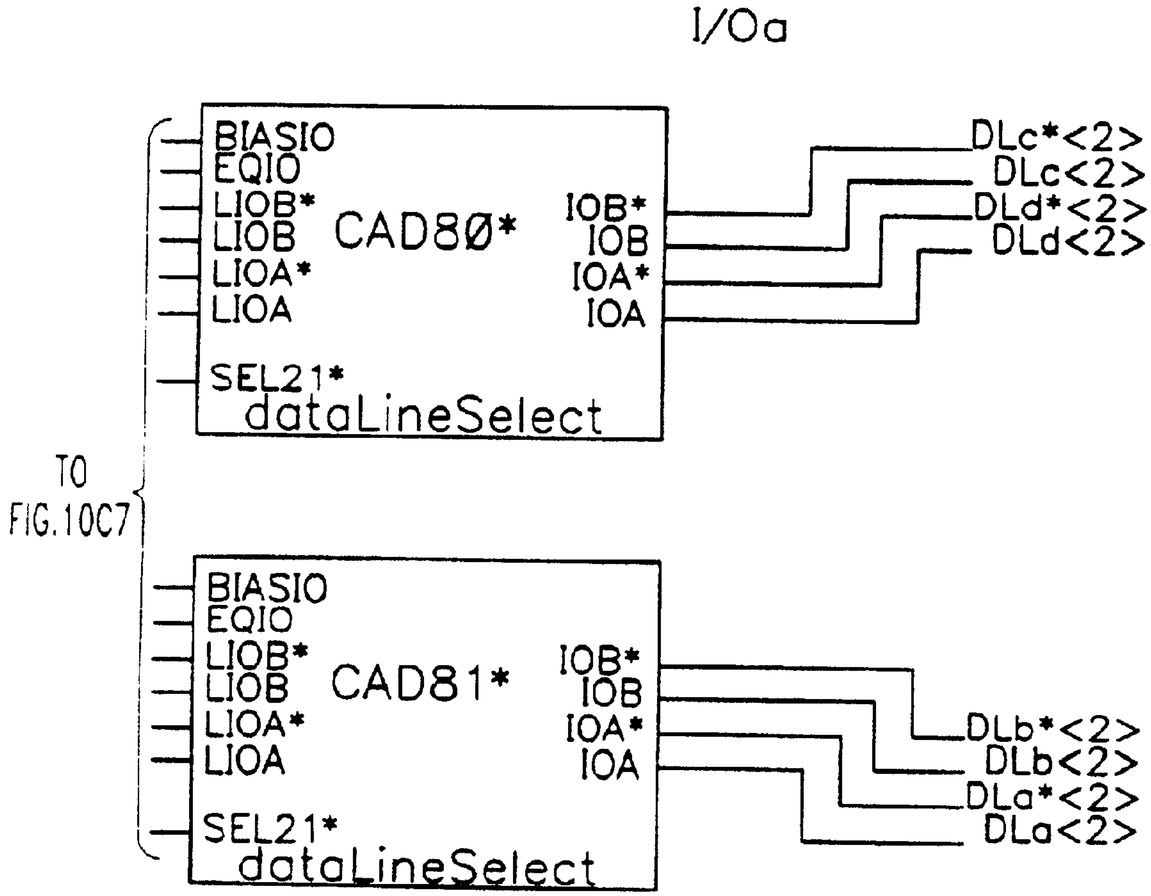
FIG. 10C8

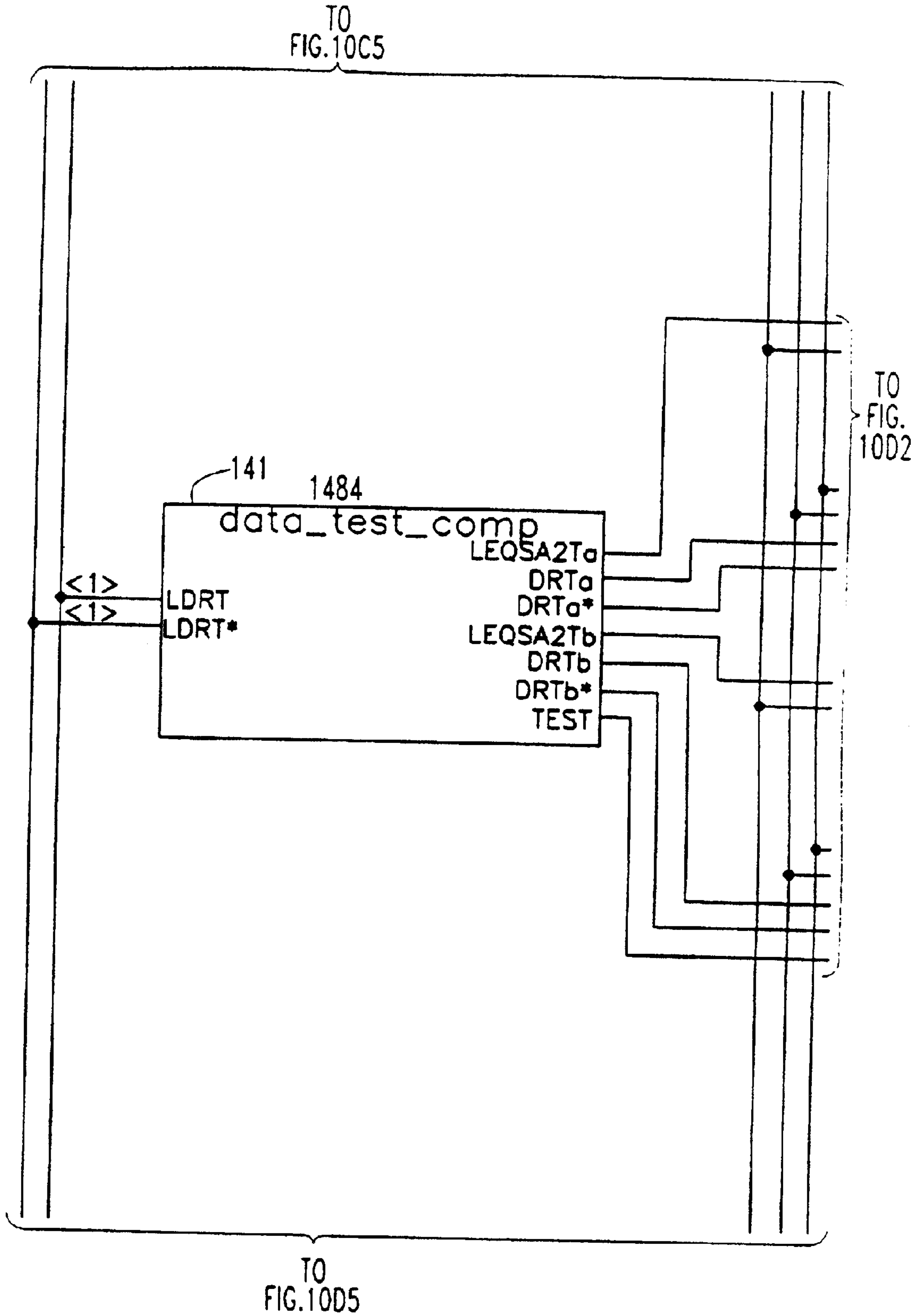
*FIG. 10D1*

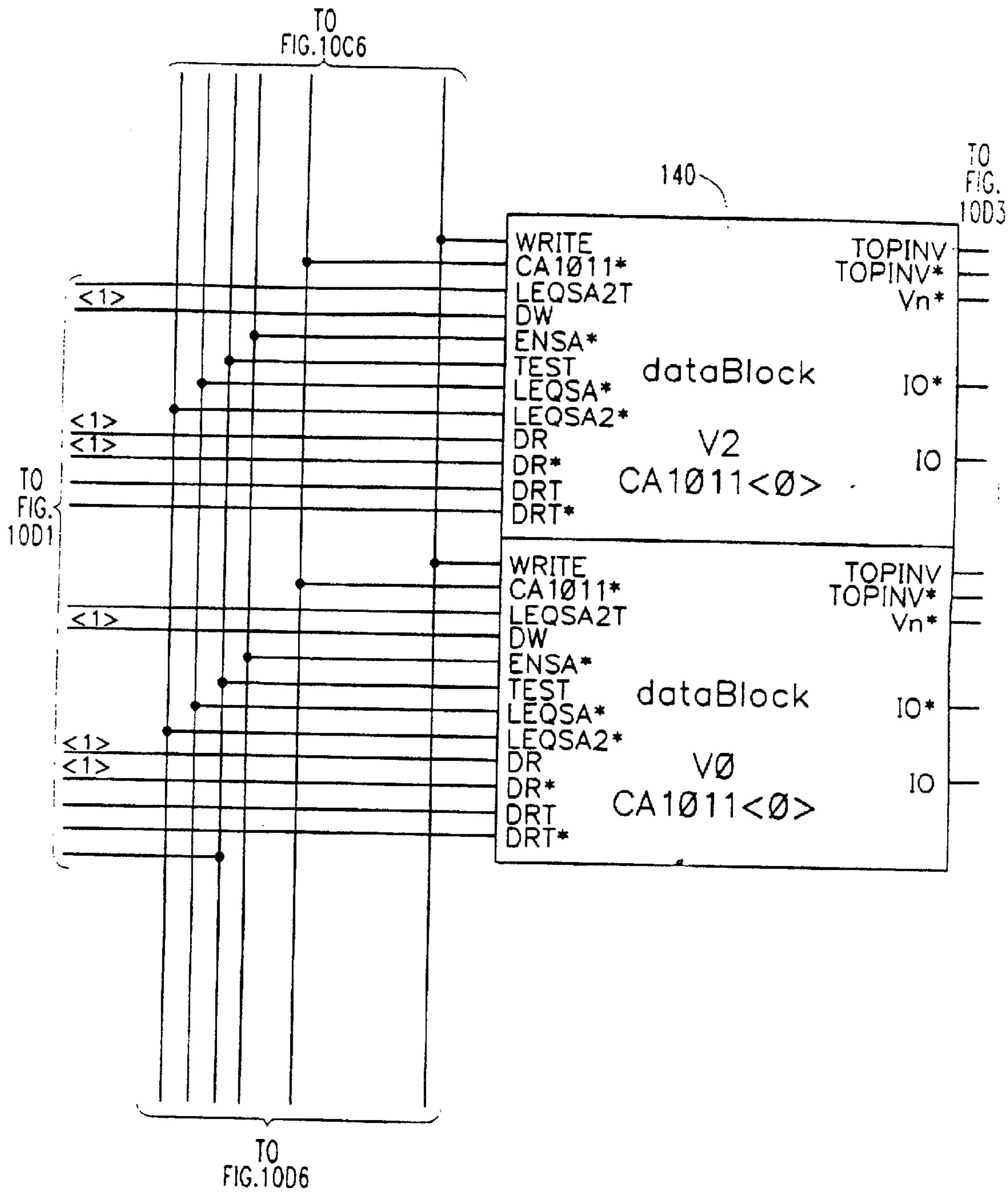
FIG. 10D2

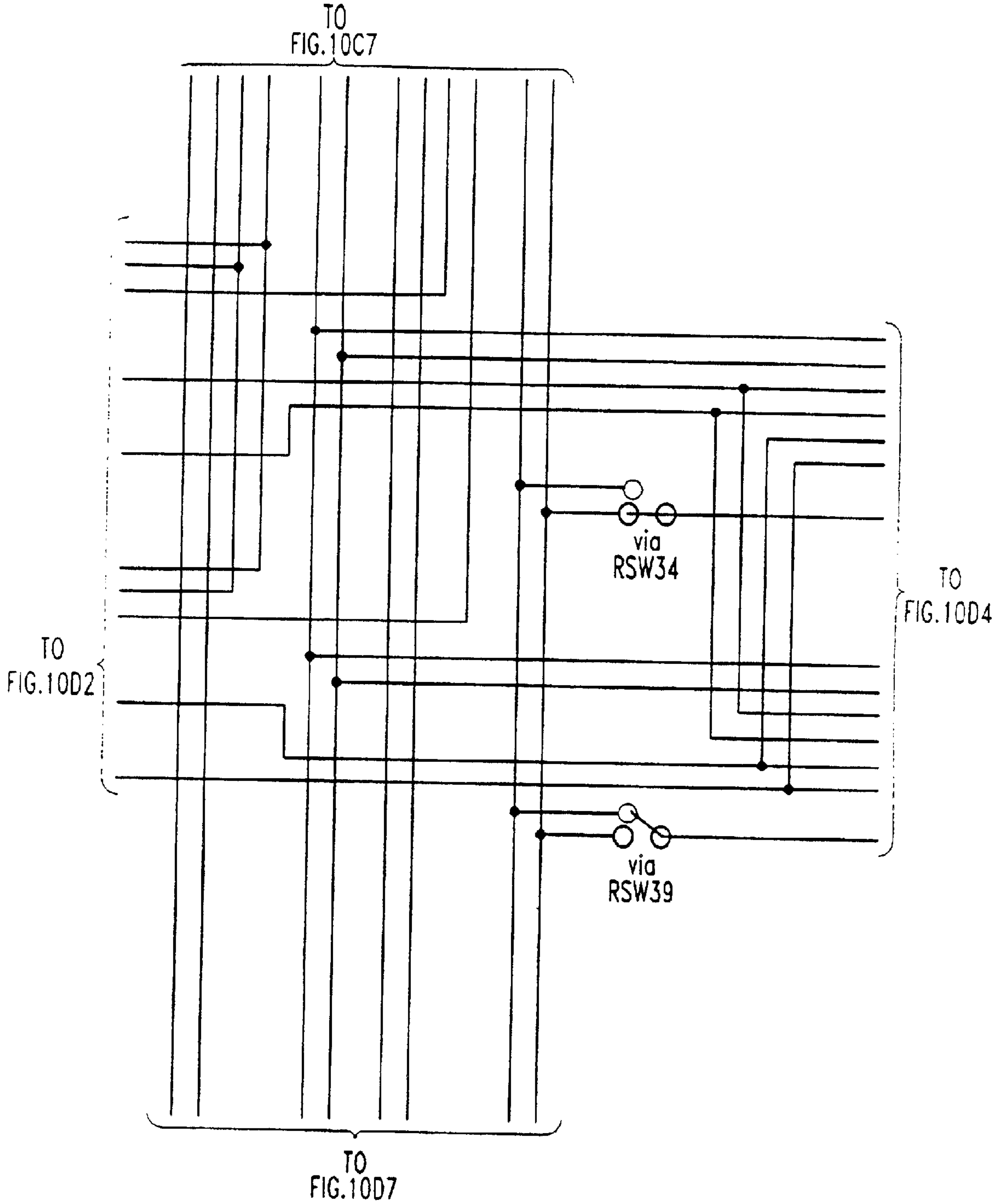
FIG. 10D3

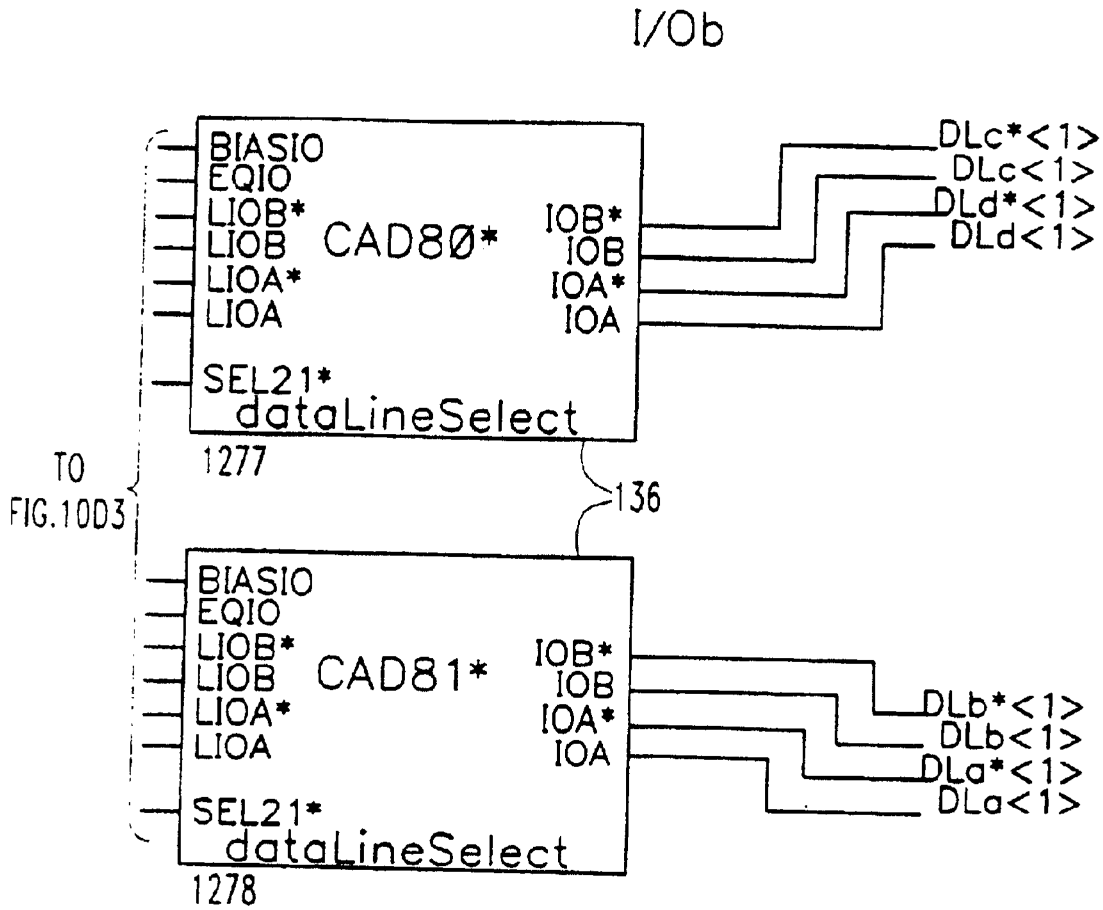
FIG. 10D4

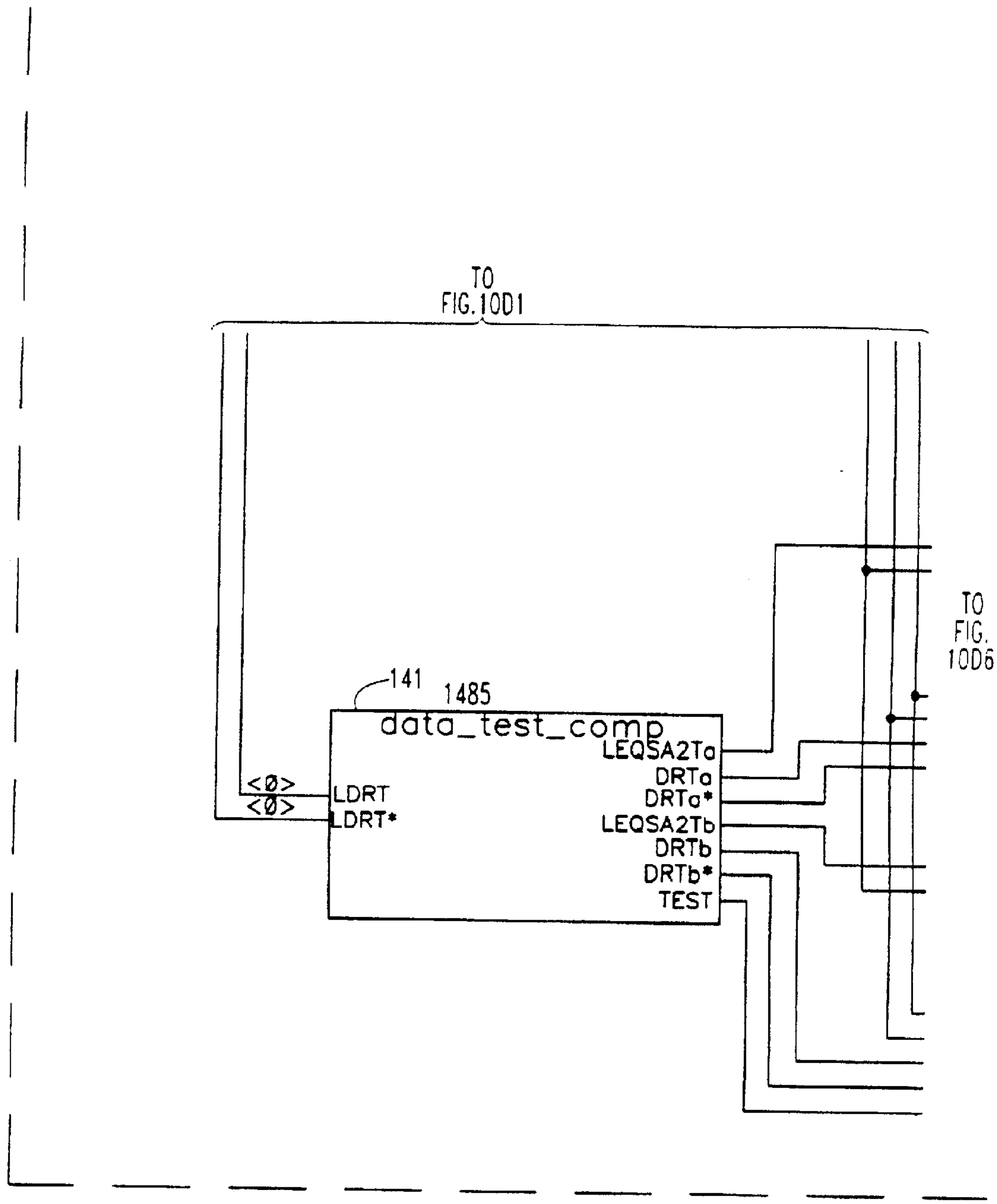
FIG. 10D5

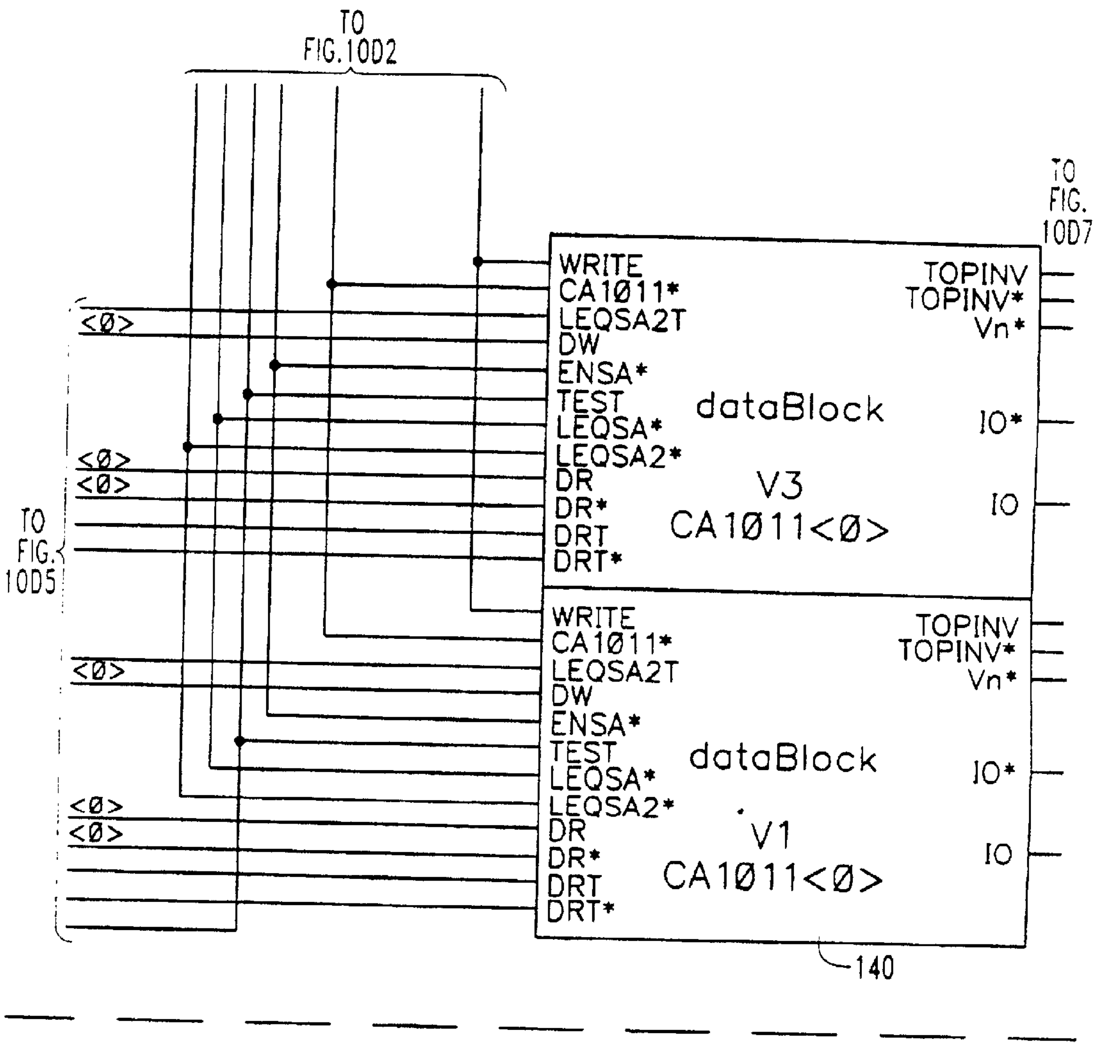
FIG. 10D6

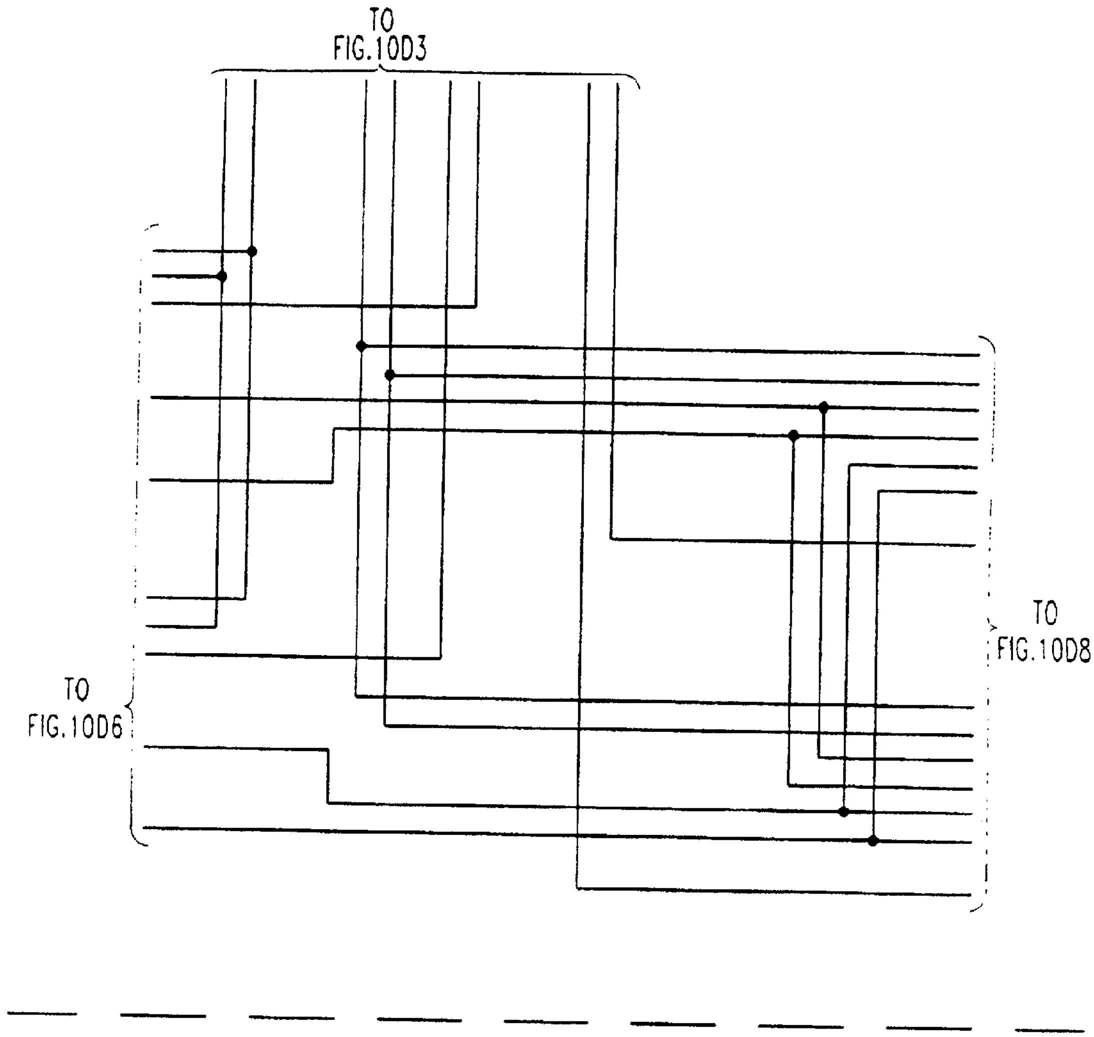
FIG. 10D7

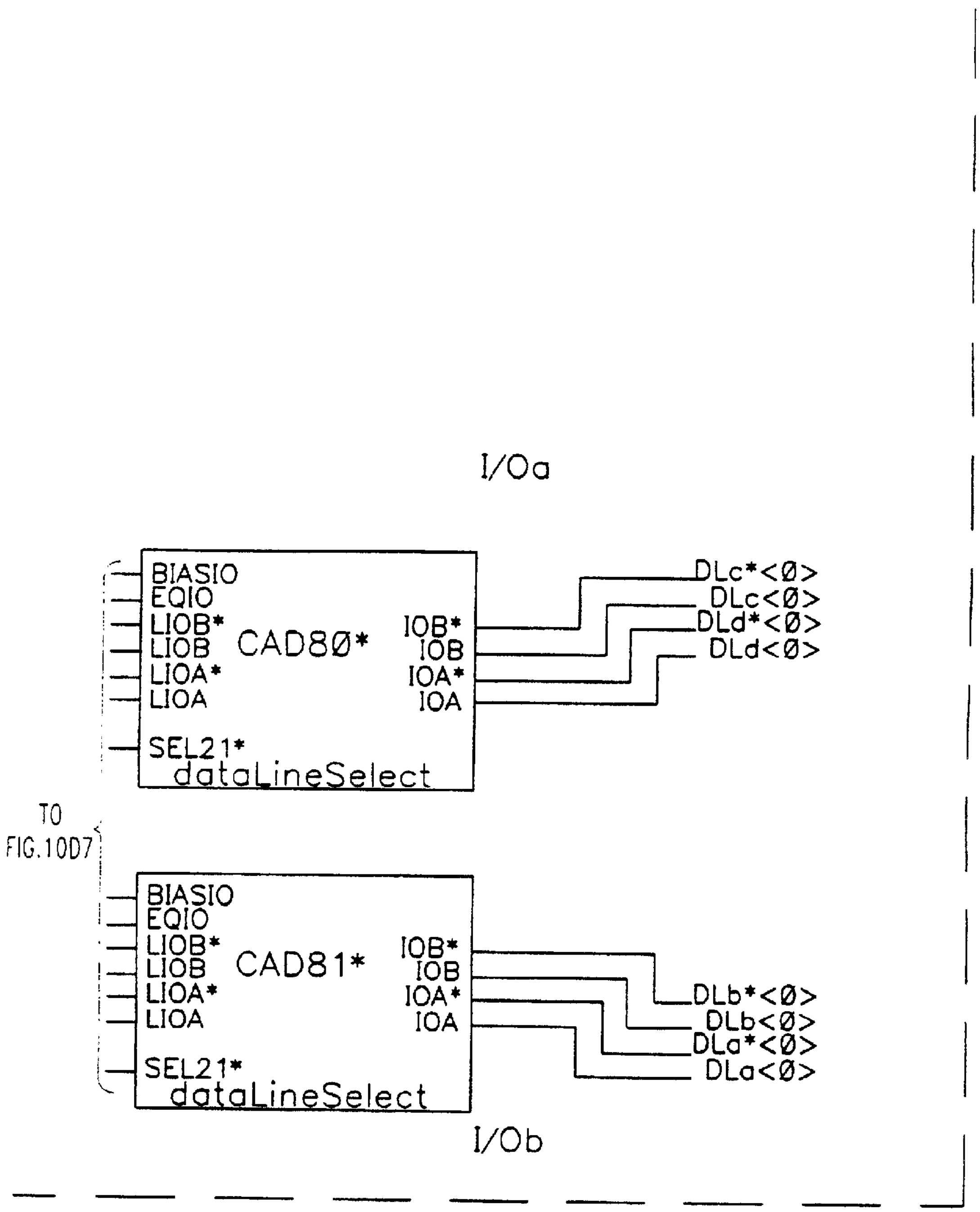
*FIG. 10D8*

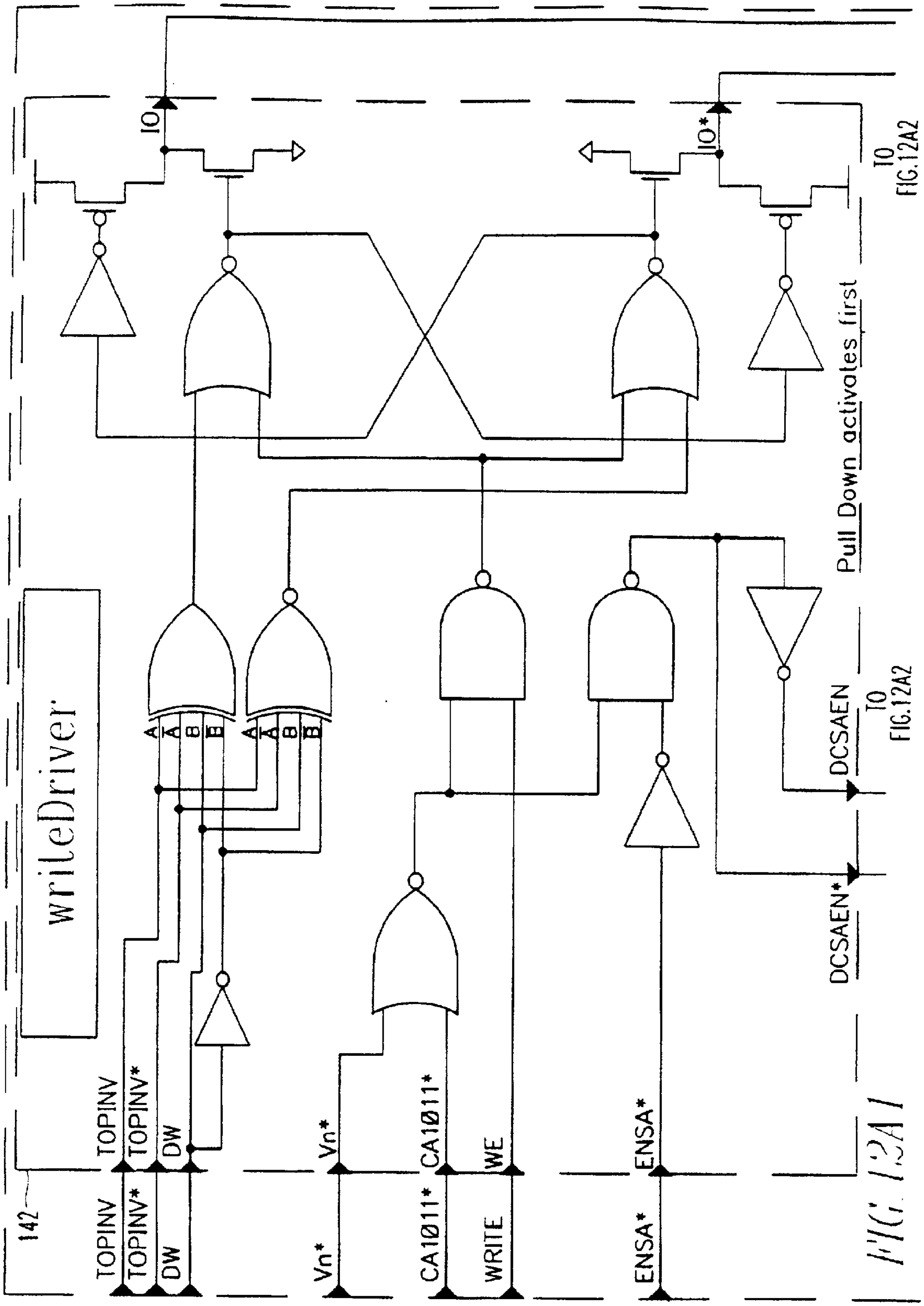
FIG. 12A1

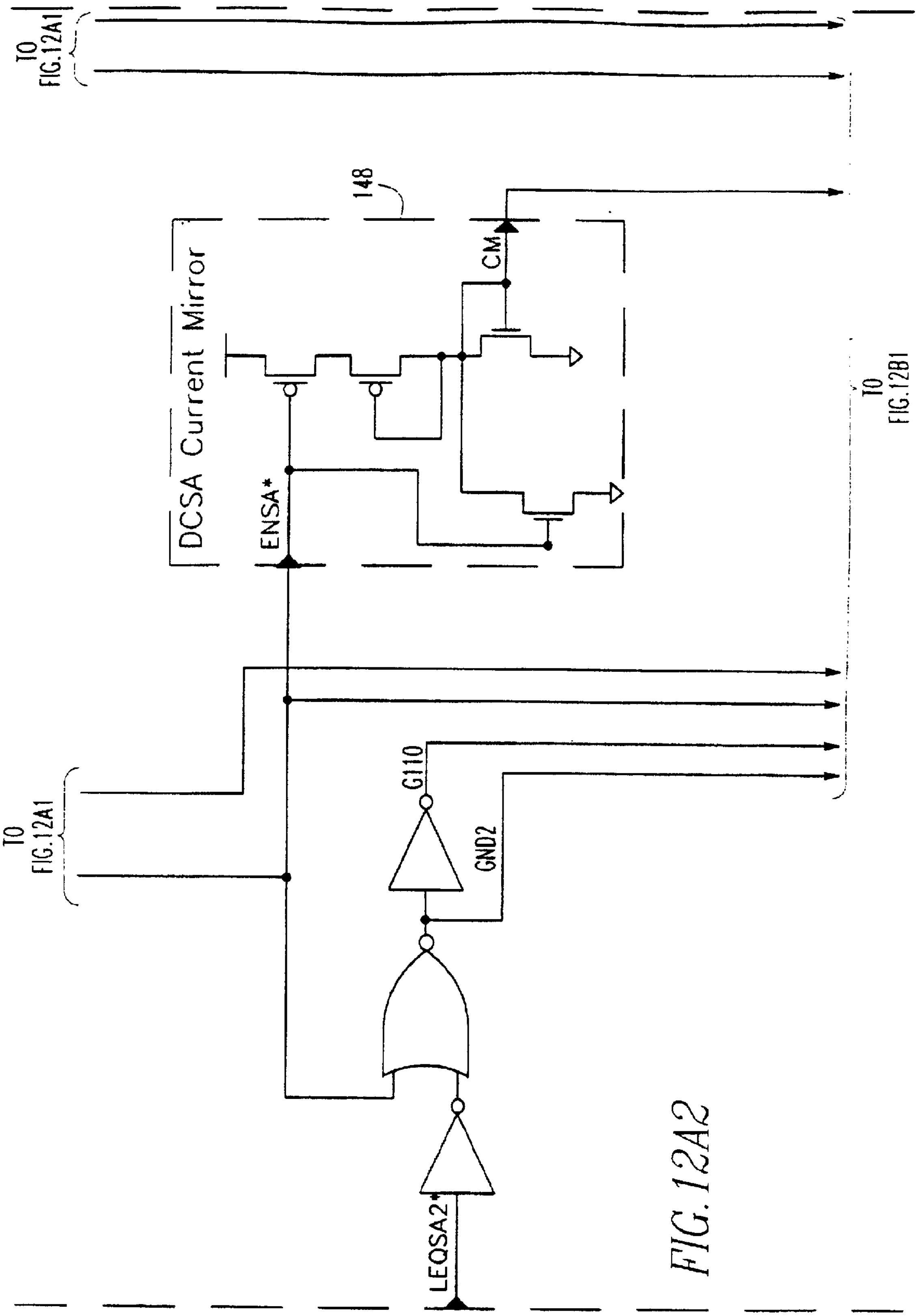
FIG. 12A2

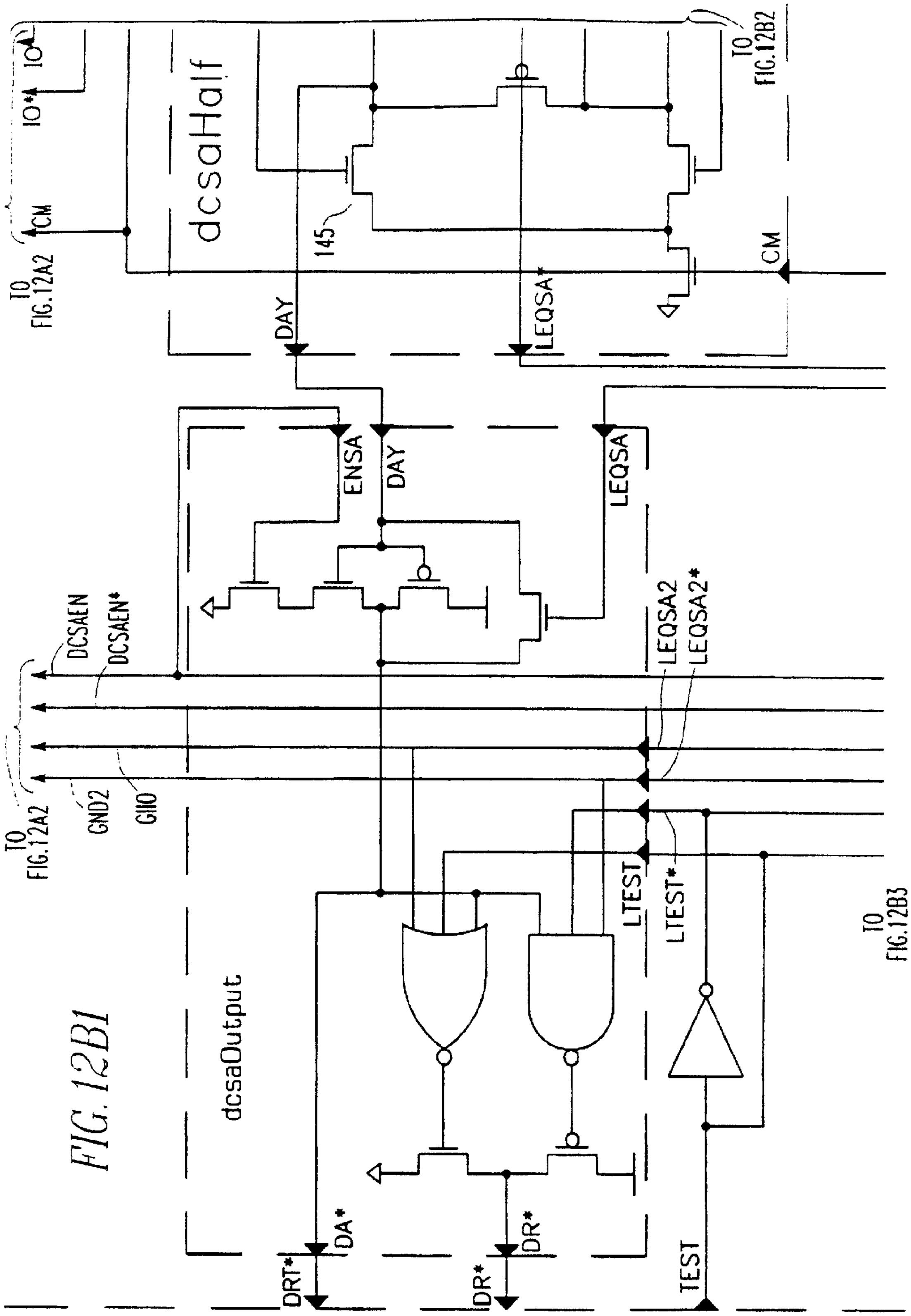
FIG. 12B1

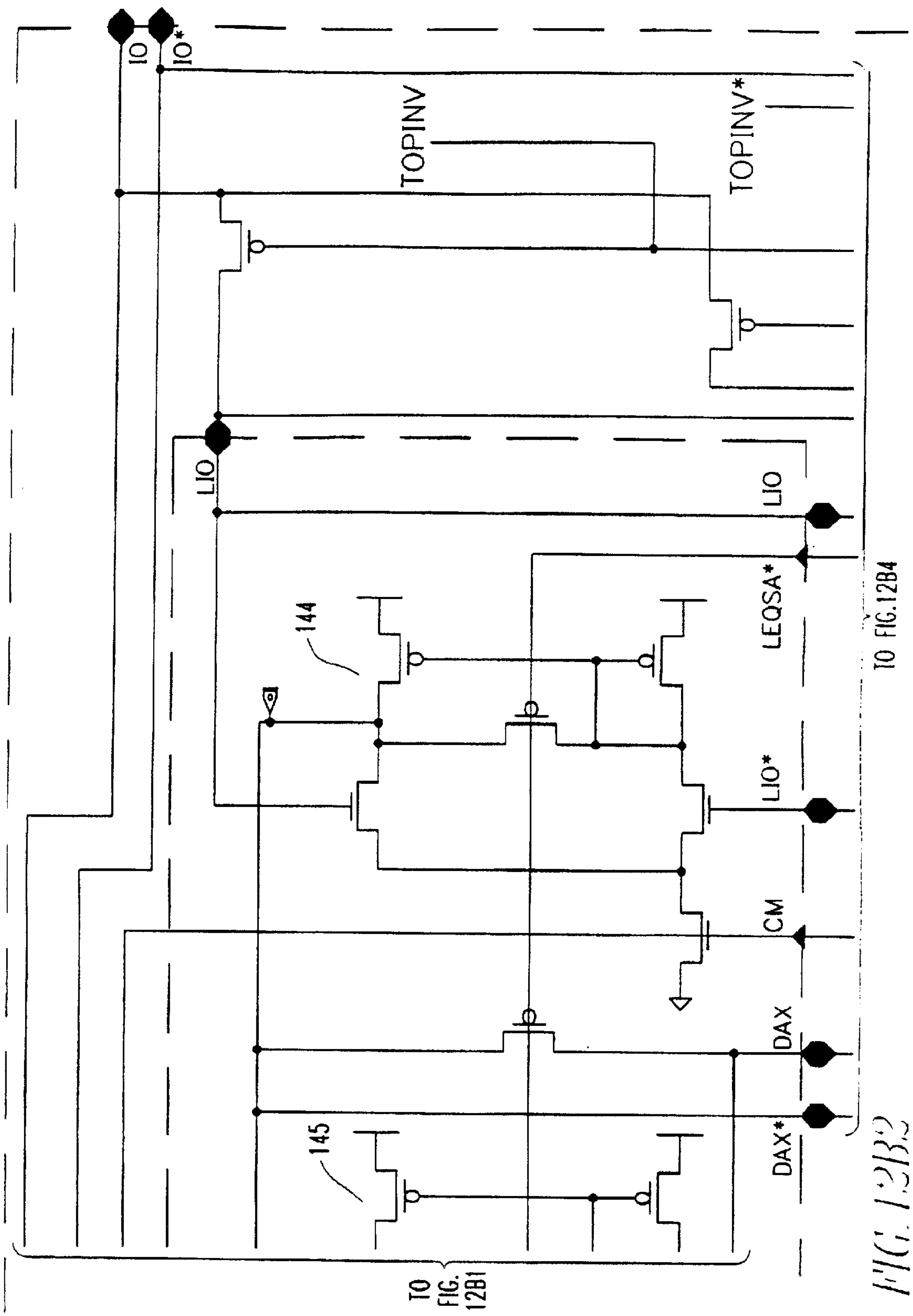
FIG. 12B2

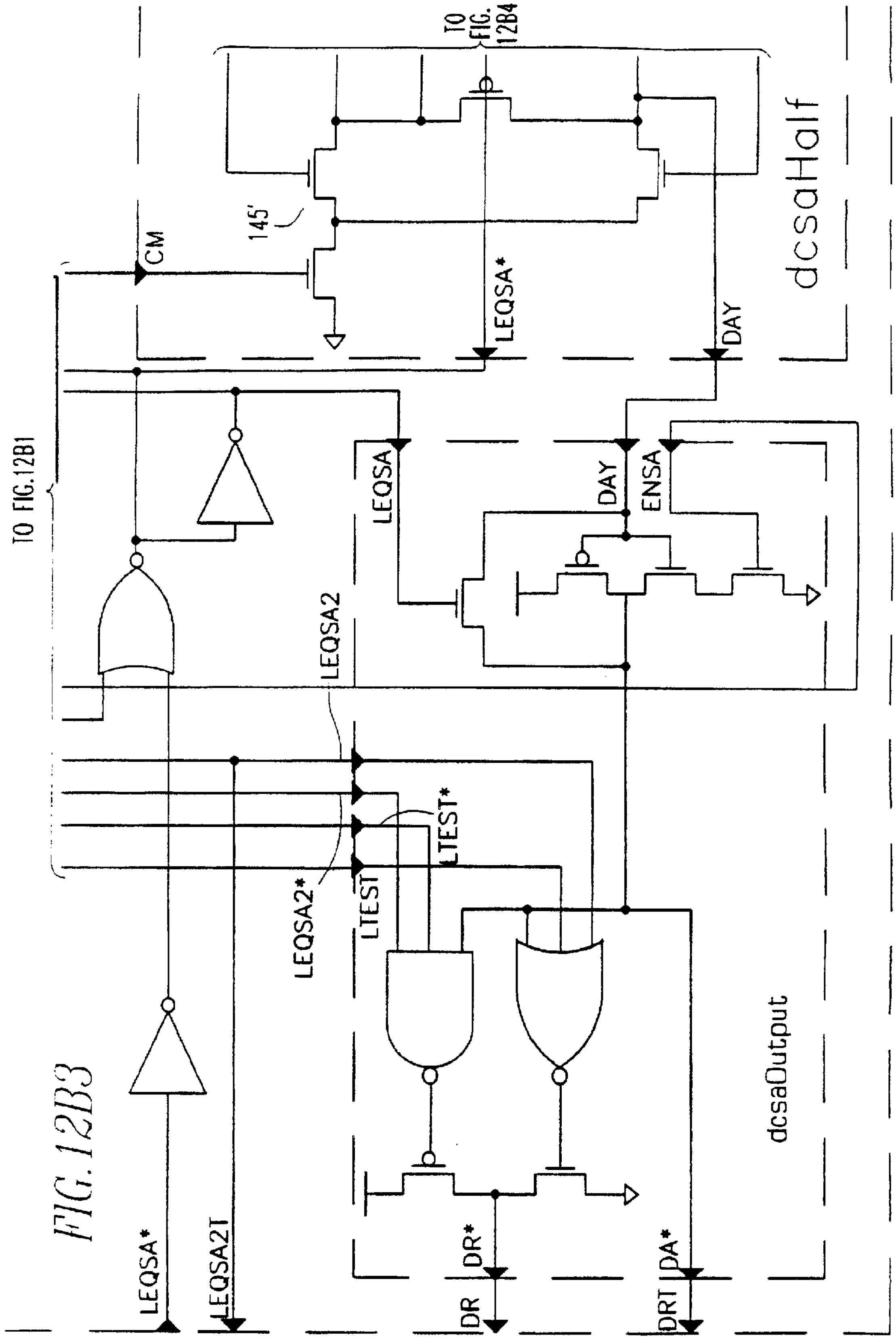
FIG. 12B3

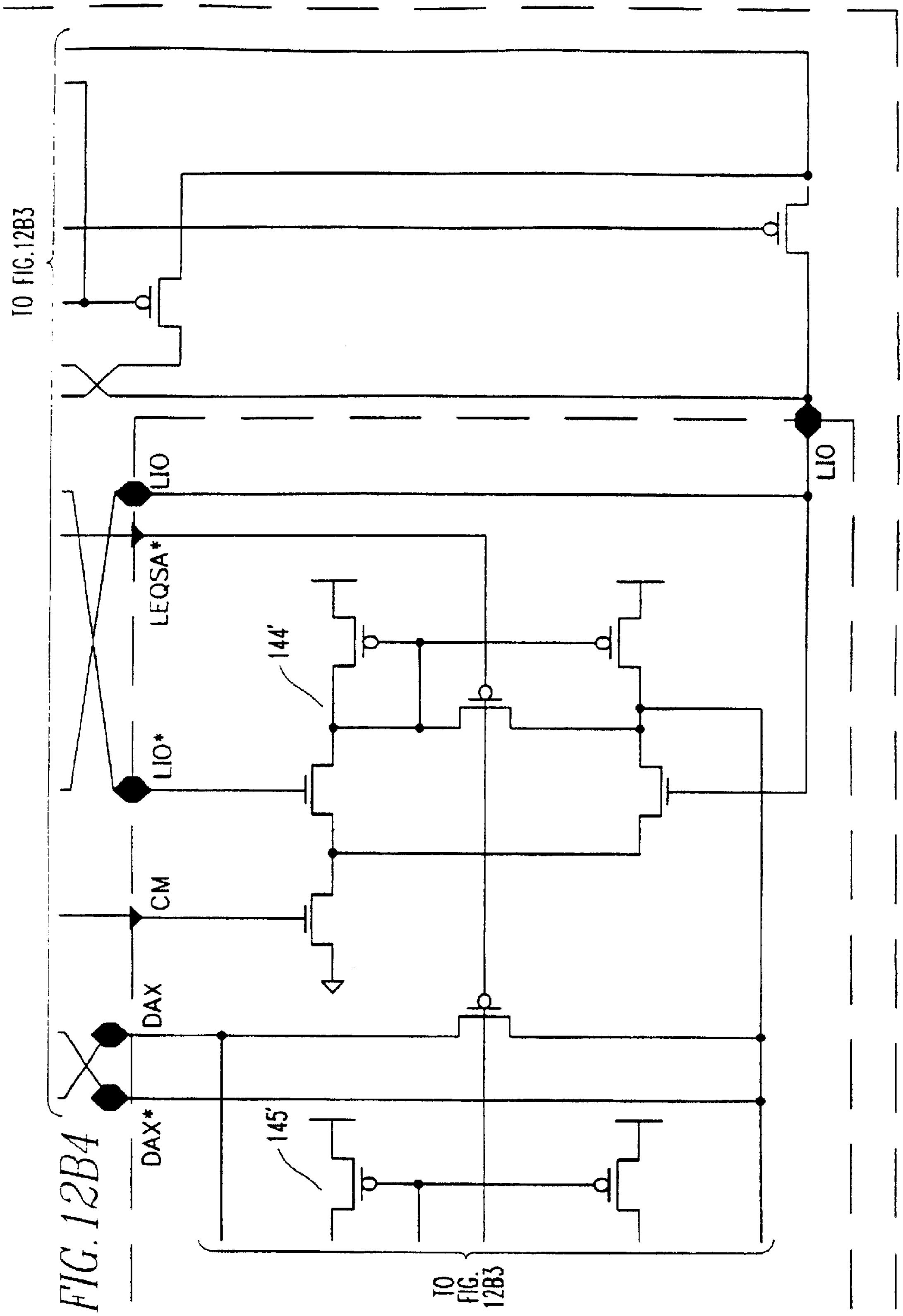
FIG. 12B4

| LDQ<n> | Read Data X16 | X8 | X4 |
|---|---|---|---|
| Ø | Ø | Ø,2 | Ø,2,4,6 |
| 1 | 1 | 1,3 | 1,3,5,7 |
| 2 | 2 | | |
| 3 | 3 | | |
| 4 | 4 | | |
| 5 | 5 | | |
| 6 | 6 | 4,6 | |
| 7 | 7 | 5,7 | |

122

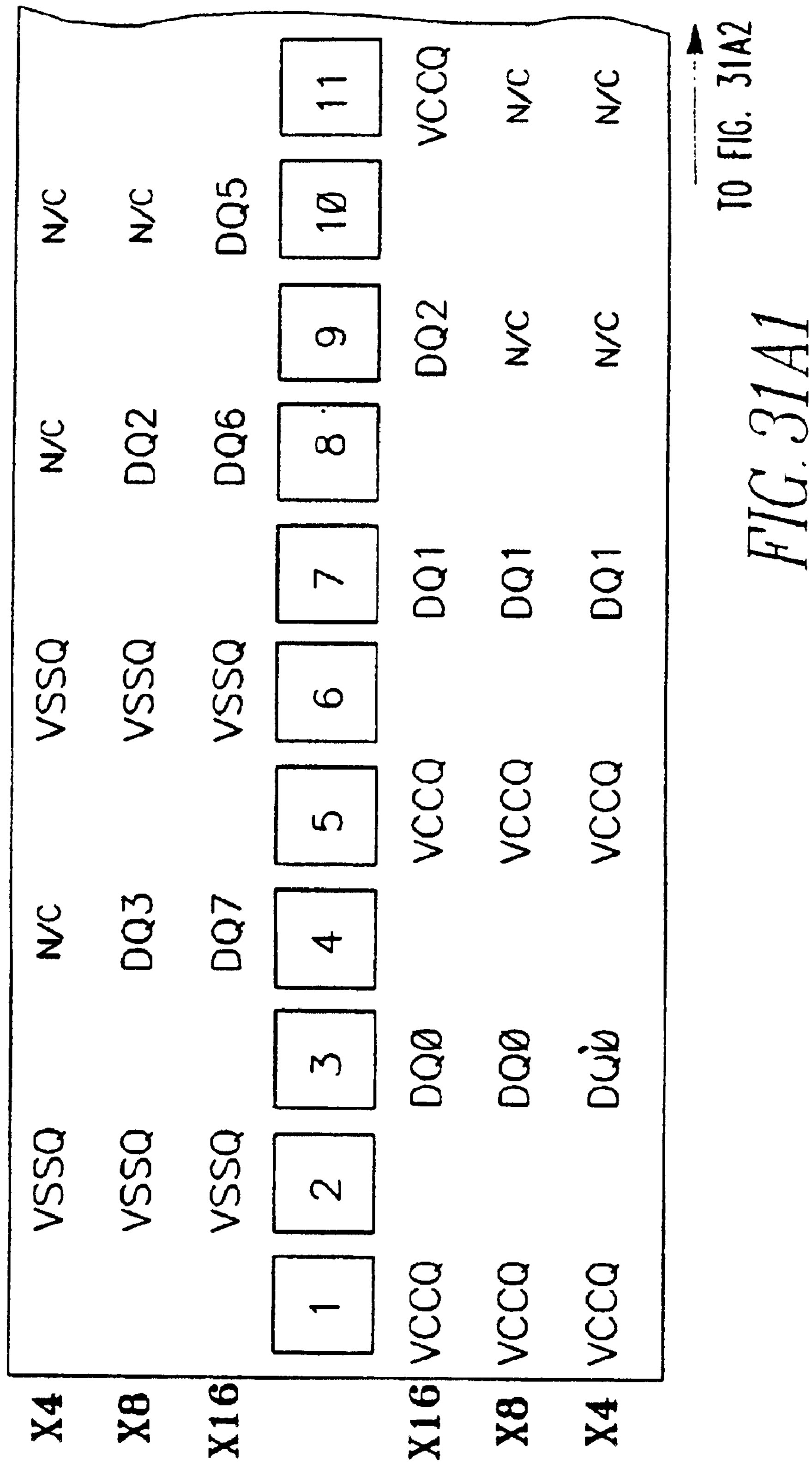
FIG. 31A1

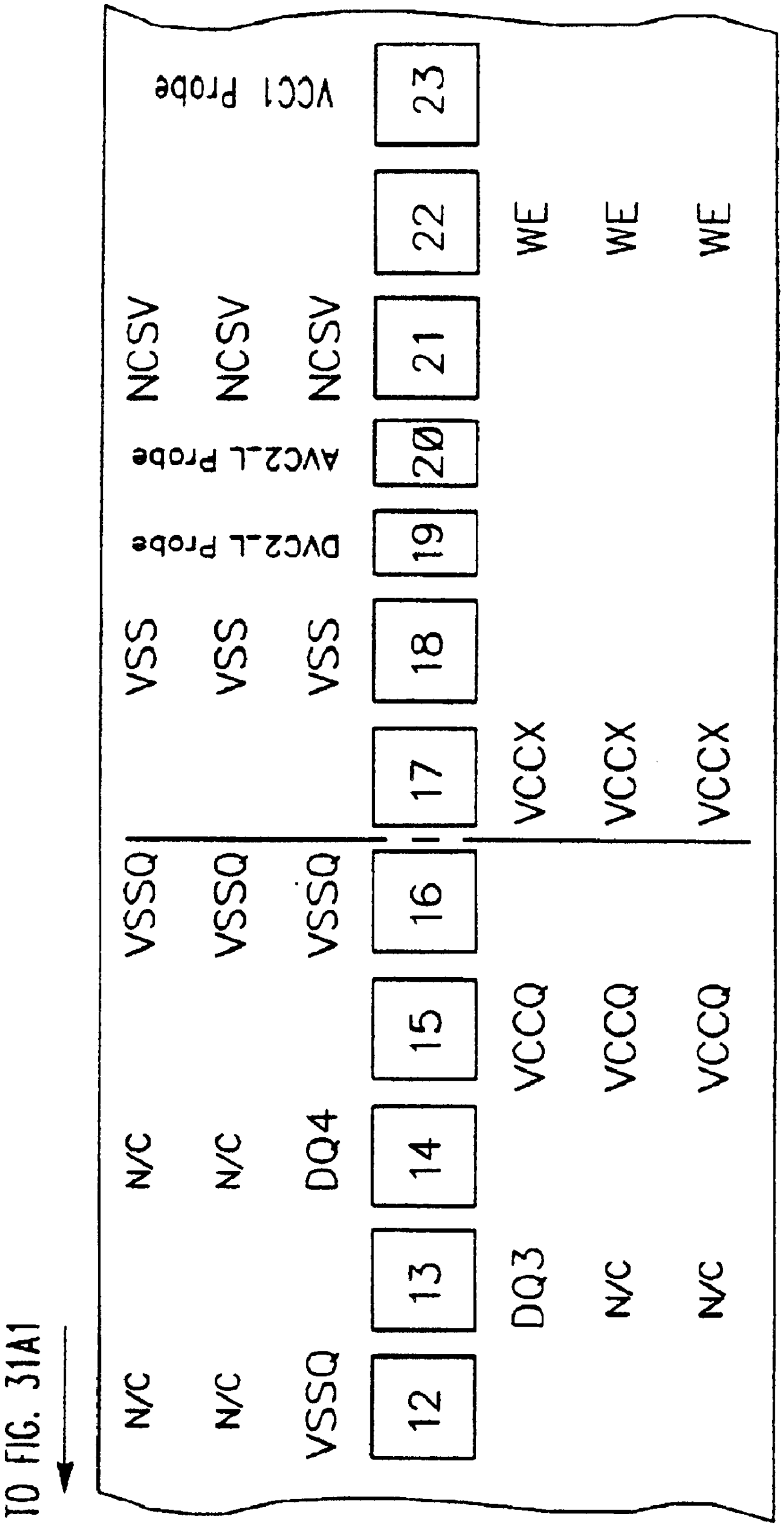
*FIG. 31A2*

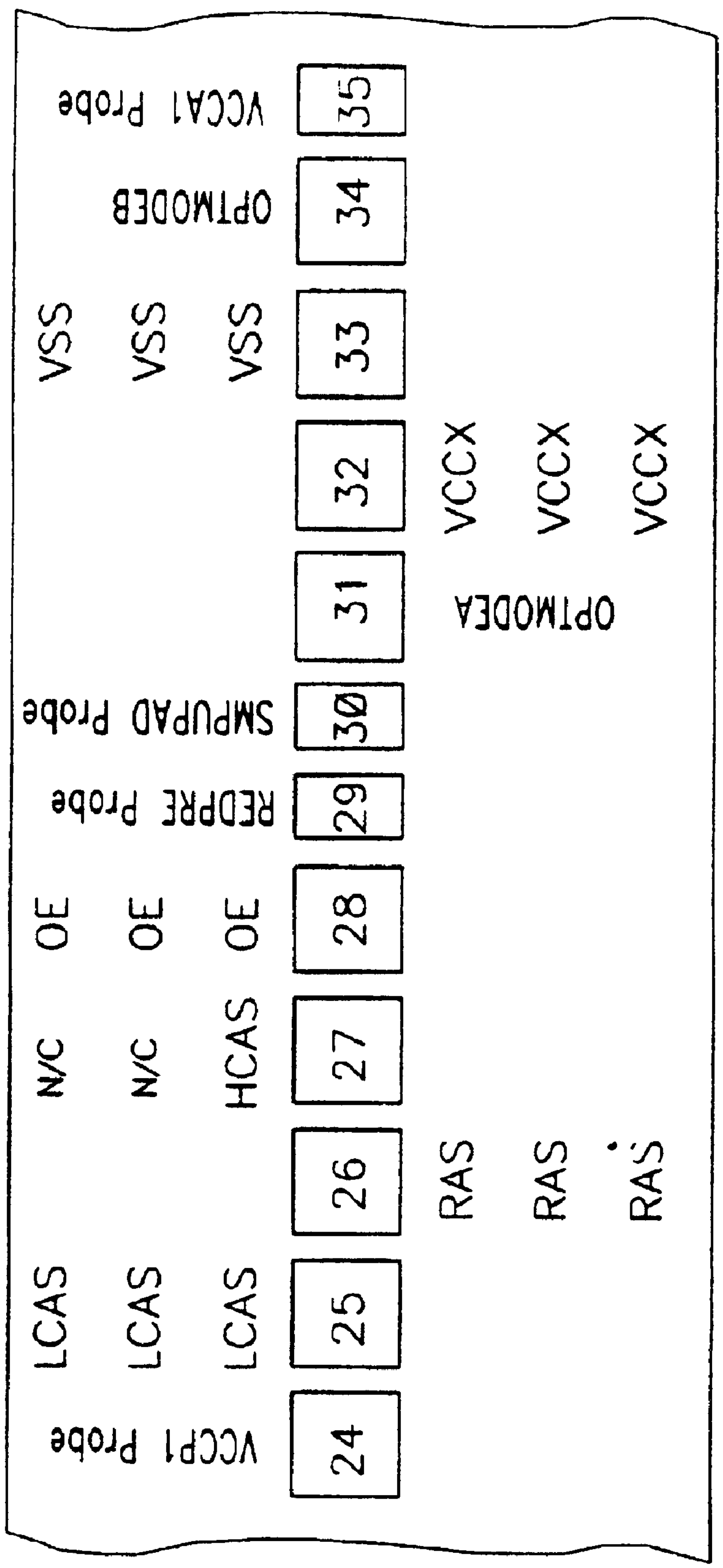
TO FIG. 31B2
FIG. 31B1

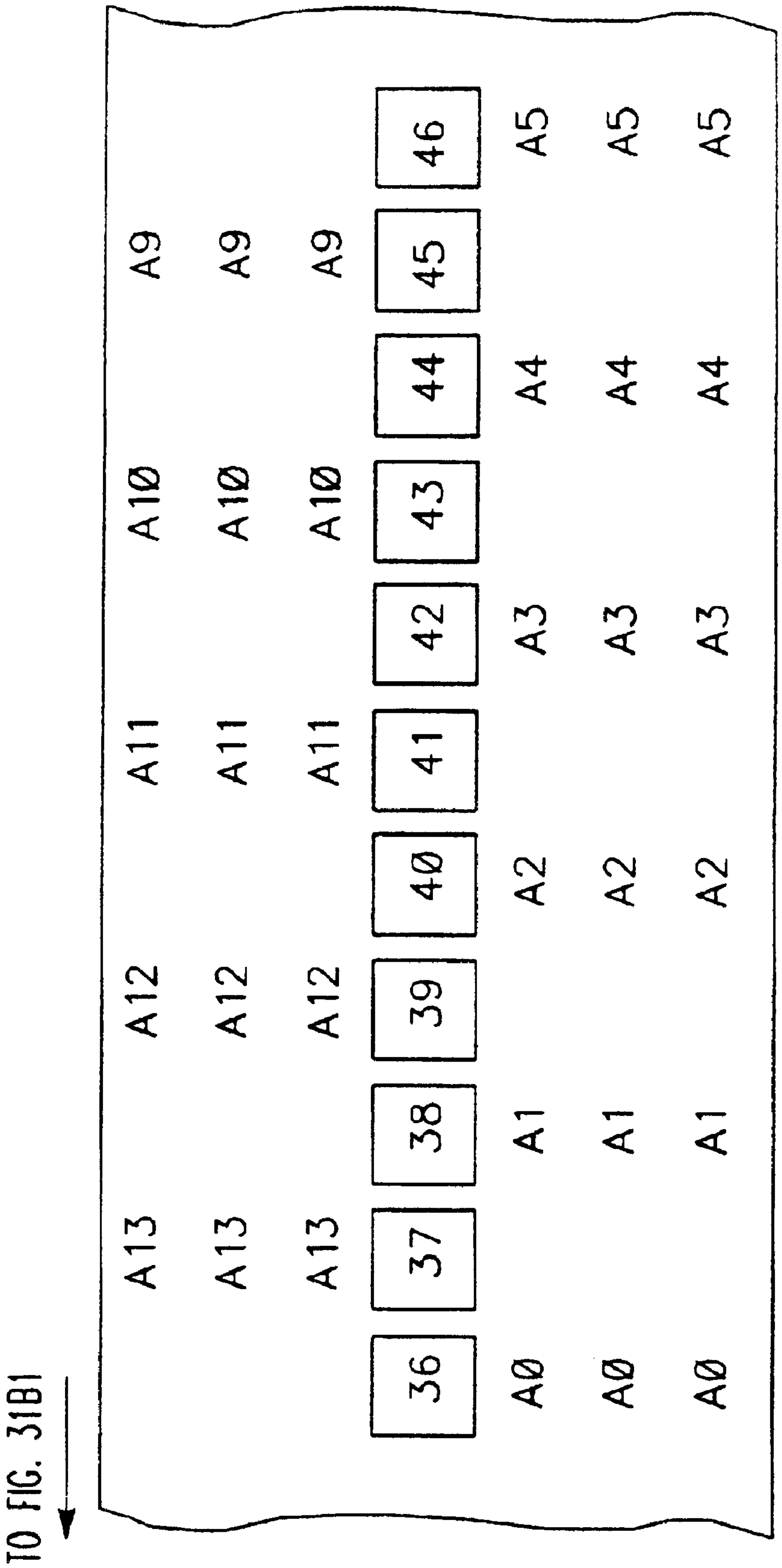
FIG. 31B2

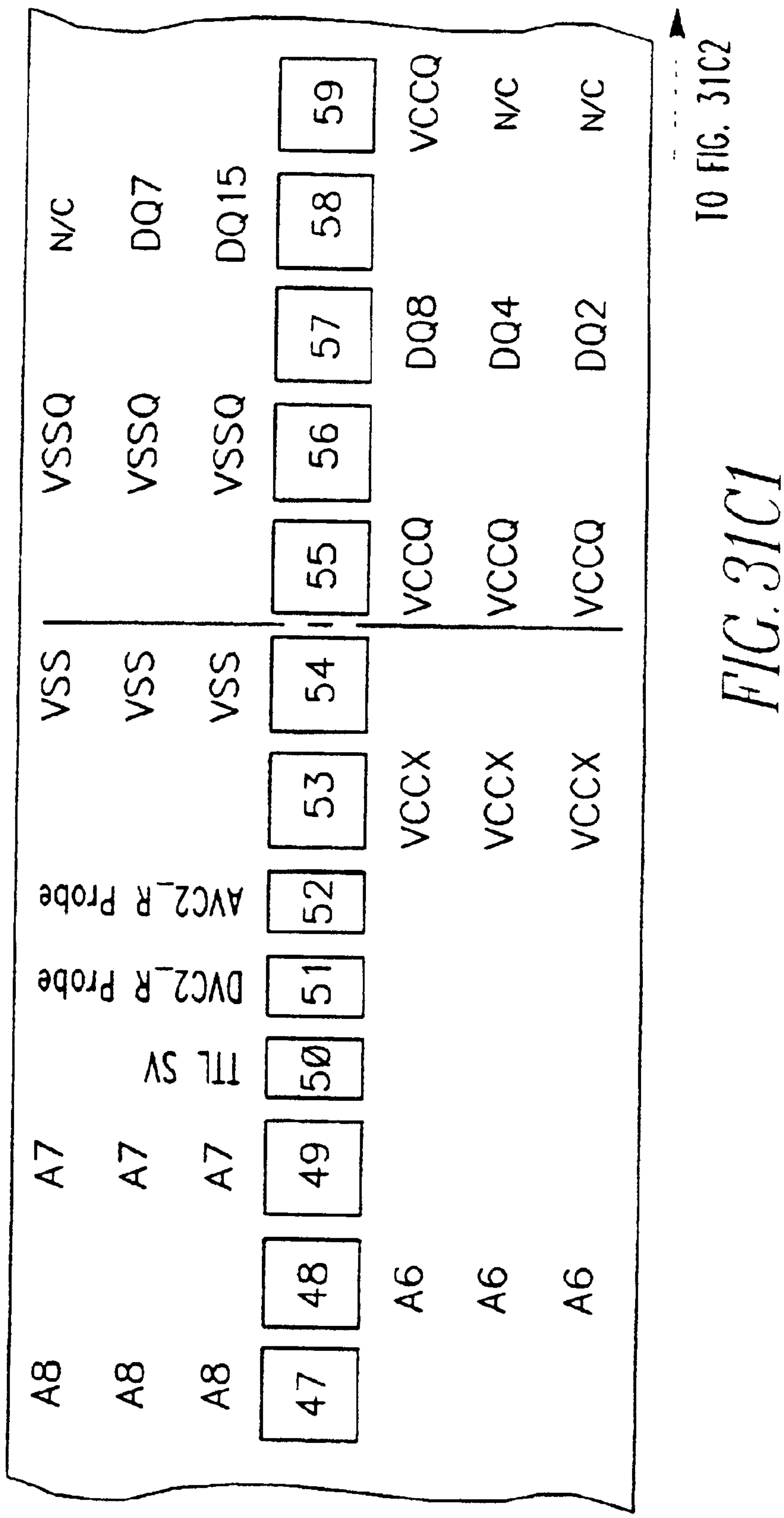
FIG. 31C1

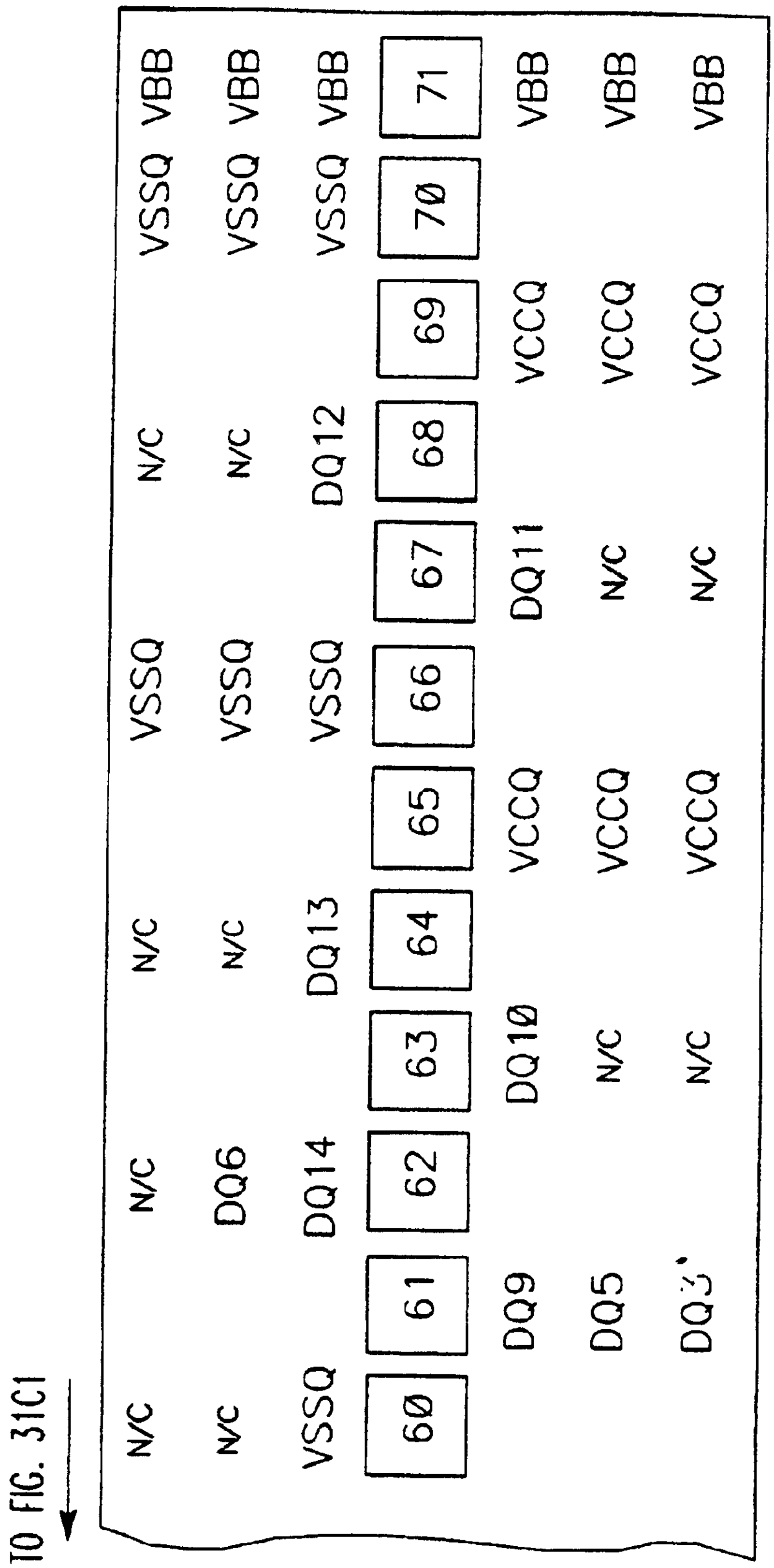
FIG. 31C2

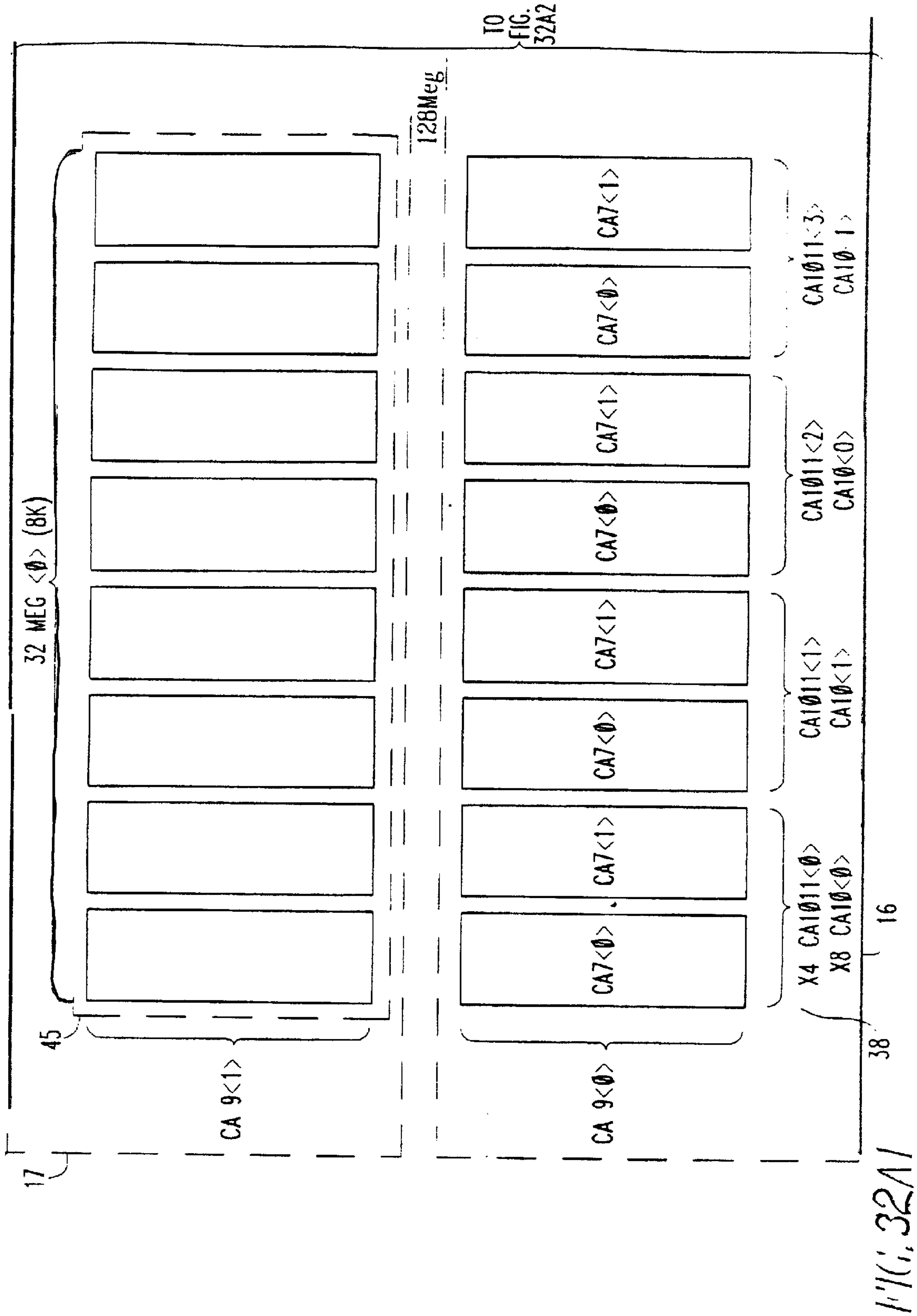
FIG. 32A1

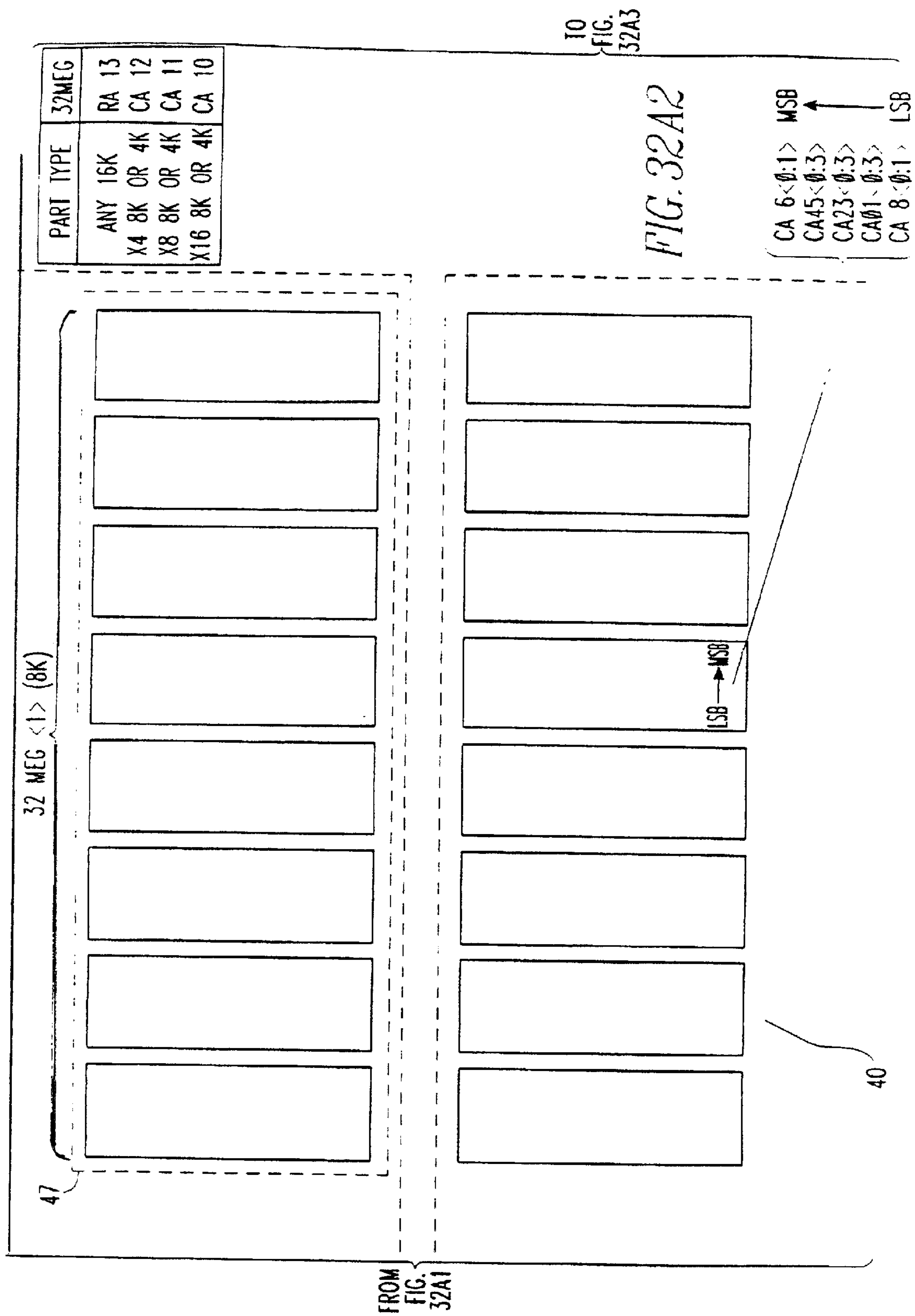
FIG. 32A2

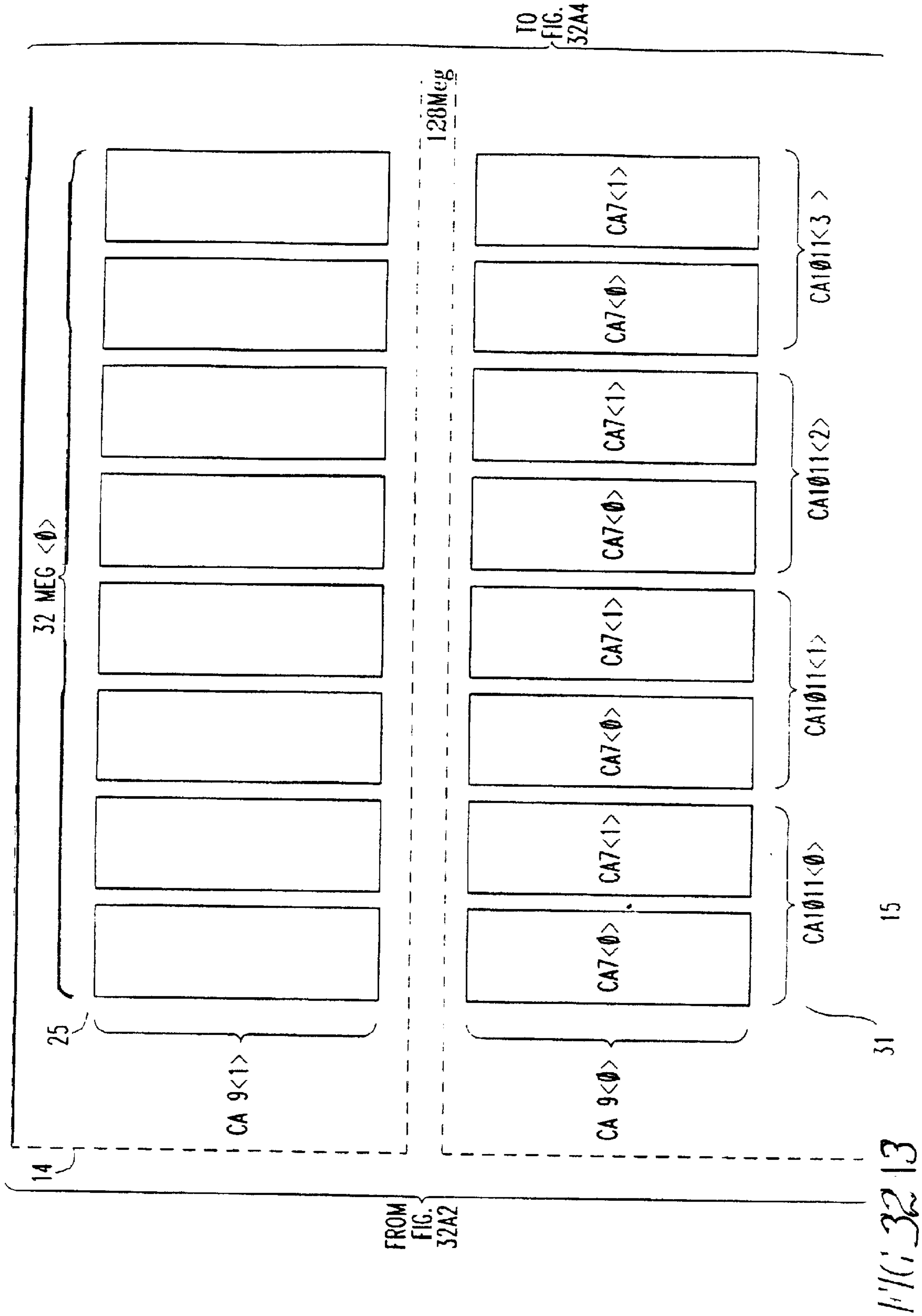
FIG. 32A3

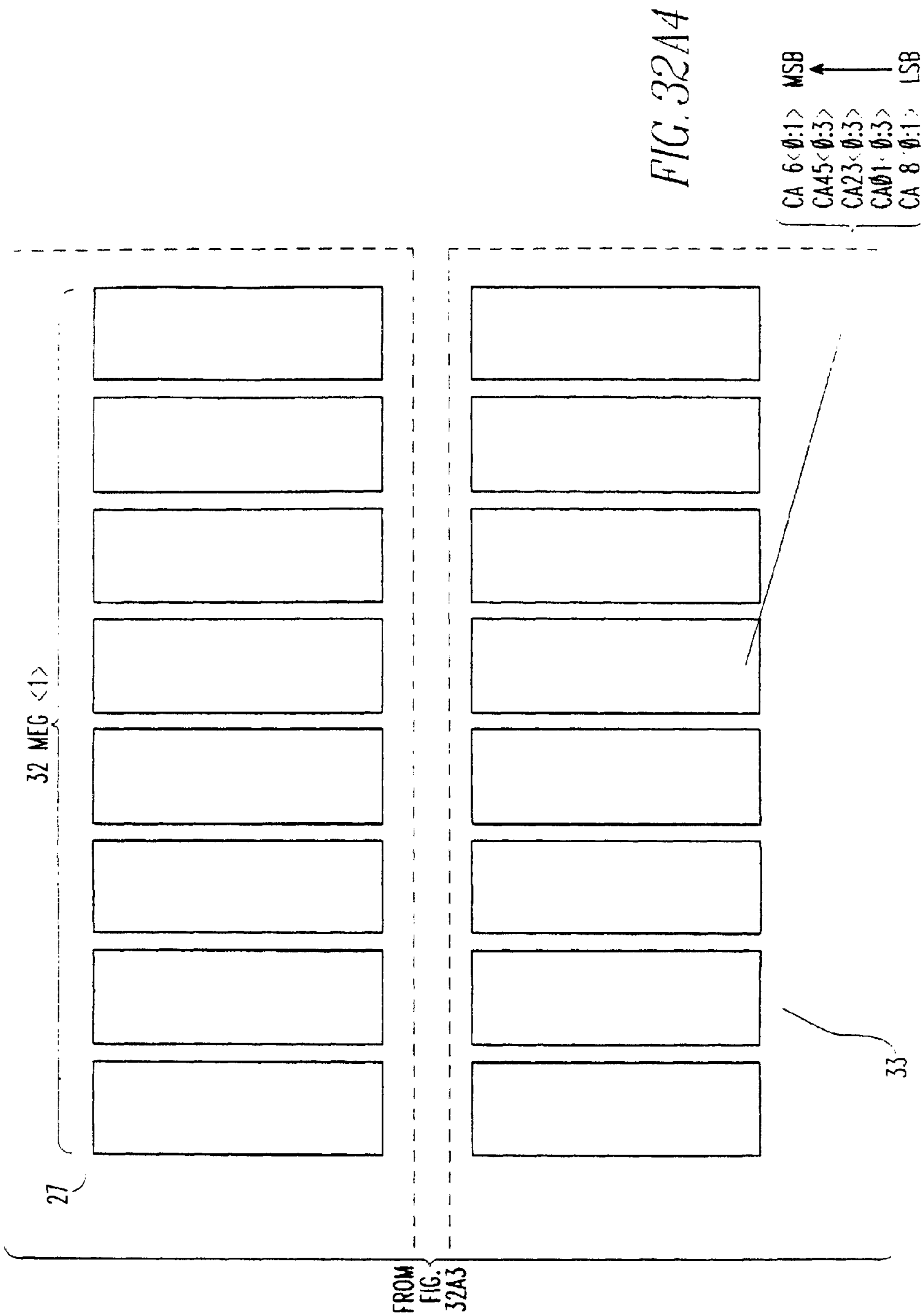
FIG. 32A4

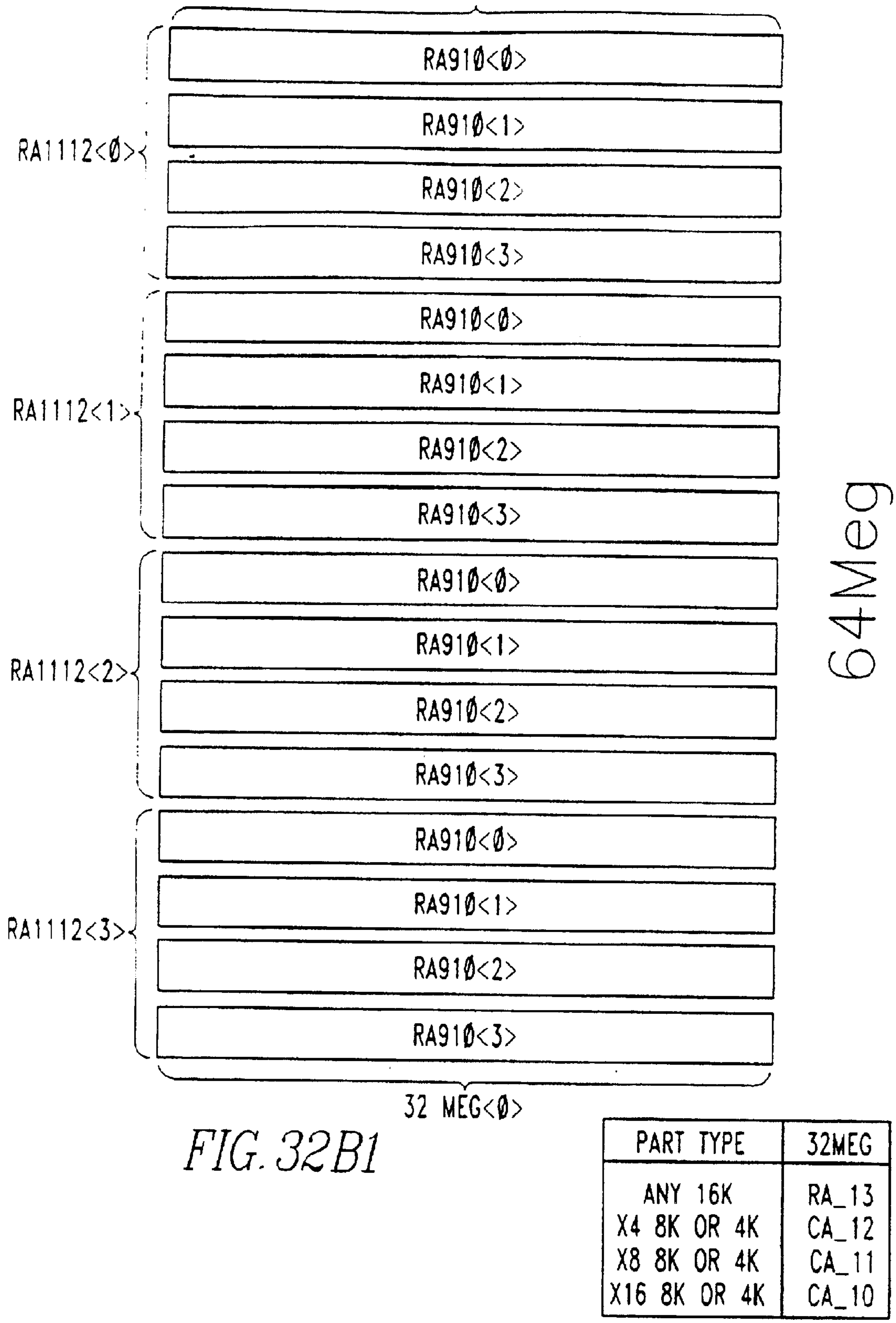
FIG. 32B1
| PART TYPE | 32MEG |
|---|---|
| ANY 16K | RA_13 |
| X4 8K OR 4K | CA_12 |
| X8 8K OR 4K | CA_11 |
| X16 8K OR 4K | CA_10 |

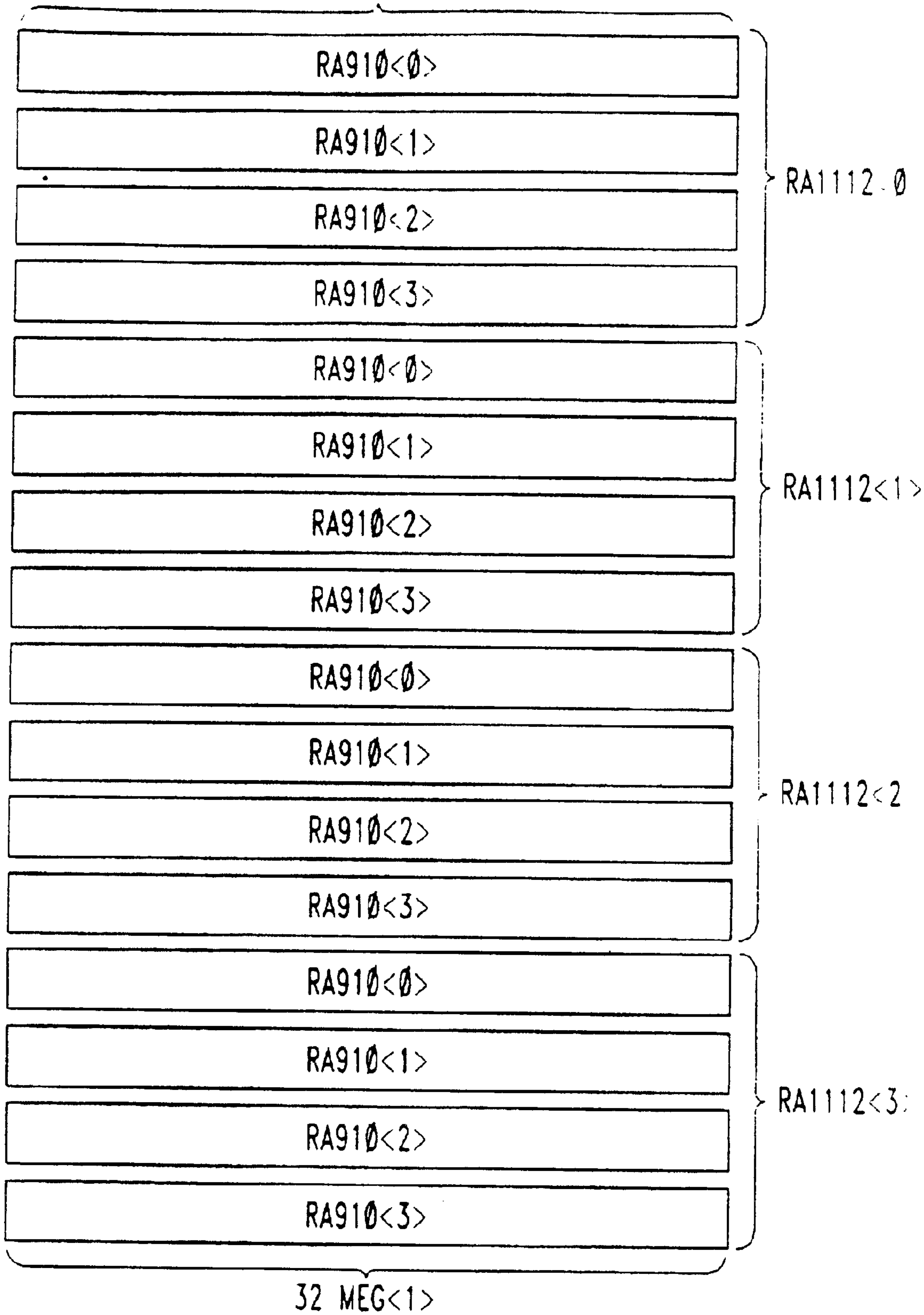
FIG. 32B2

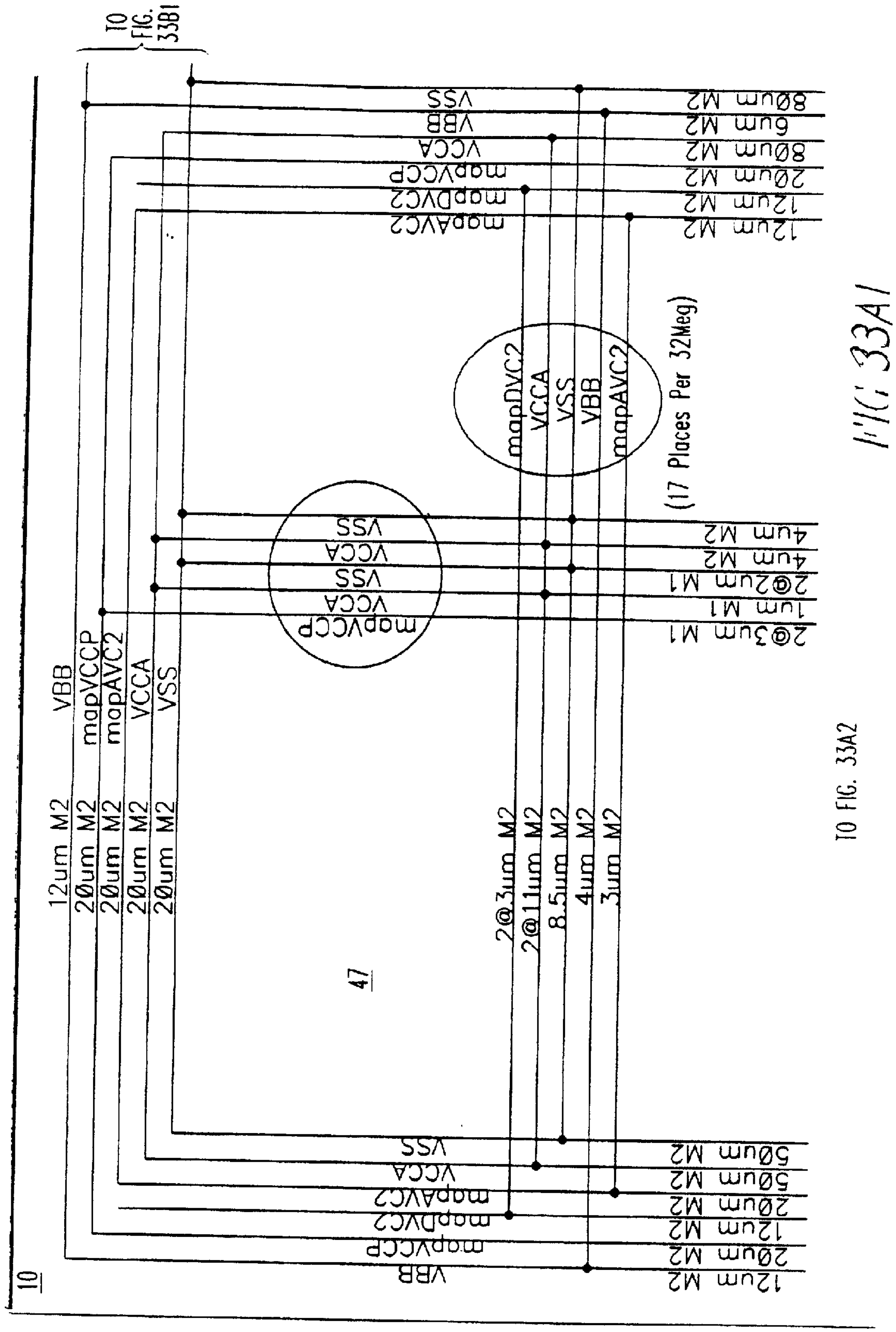
FIG. 33A1

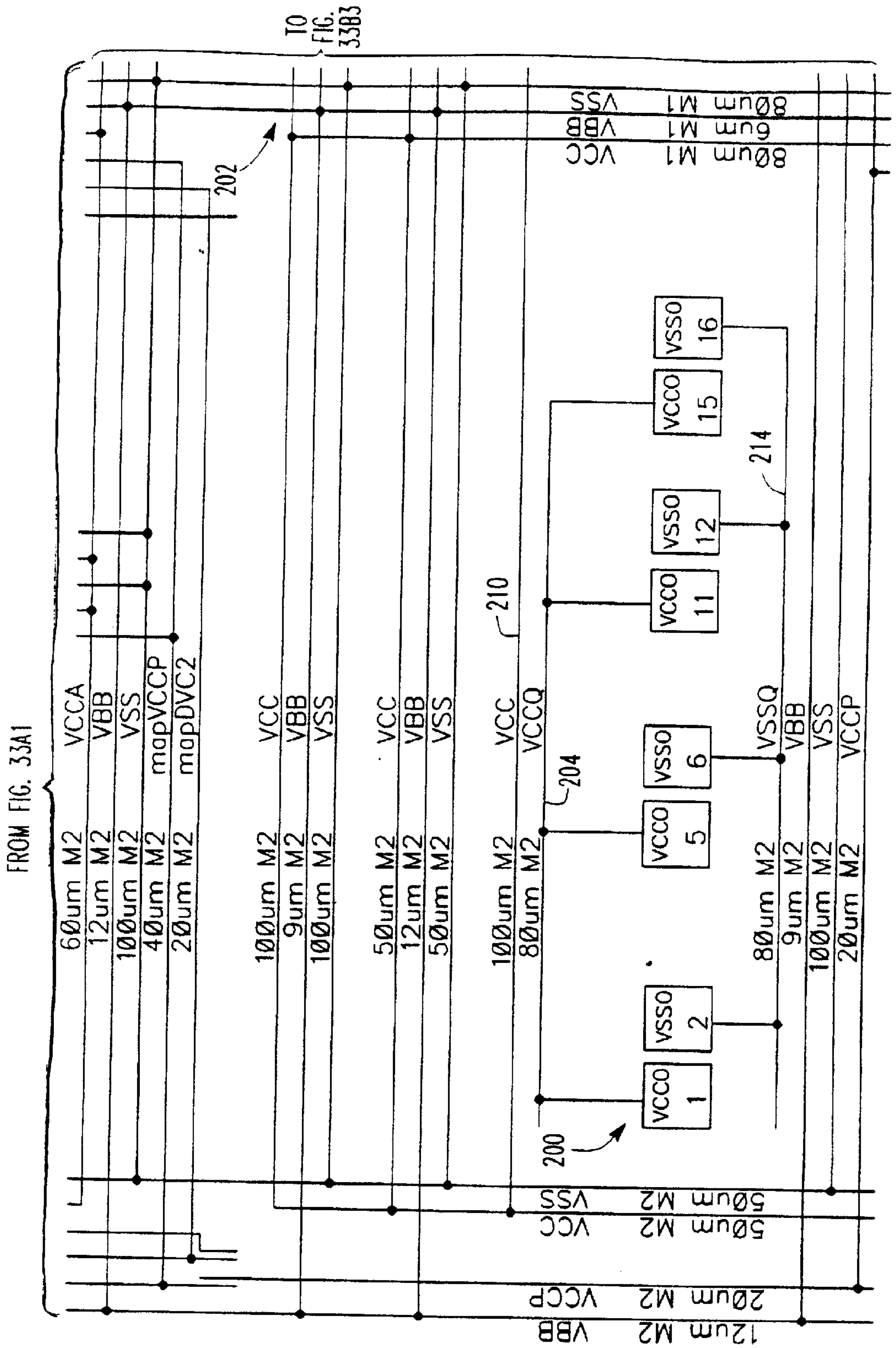
FIG. 33A2

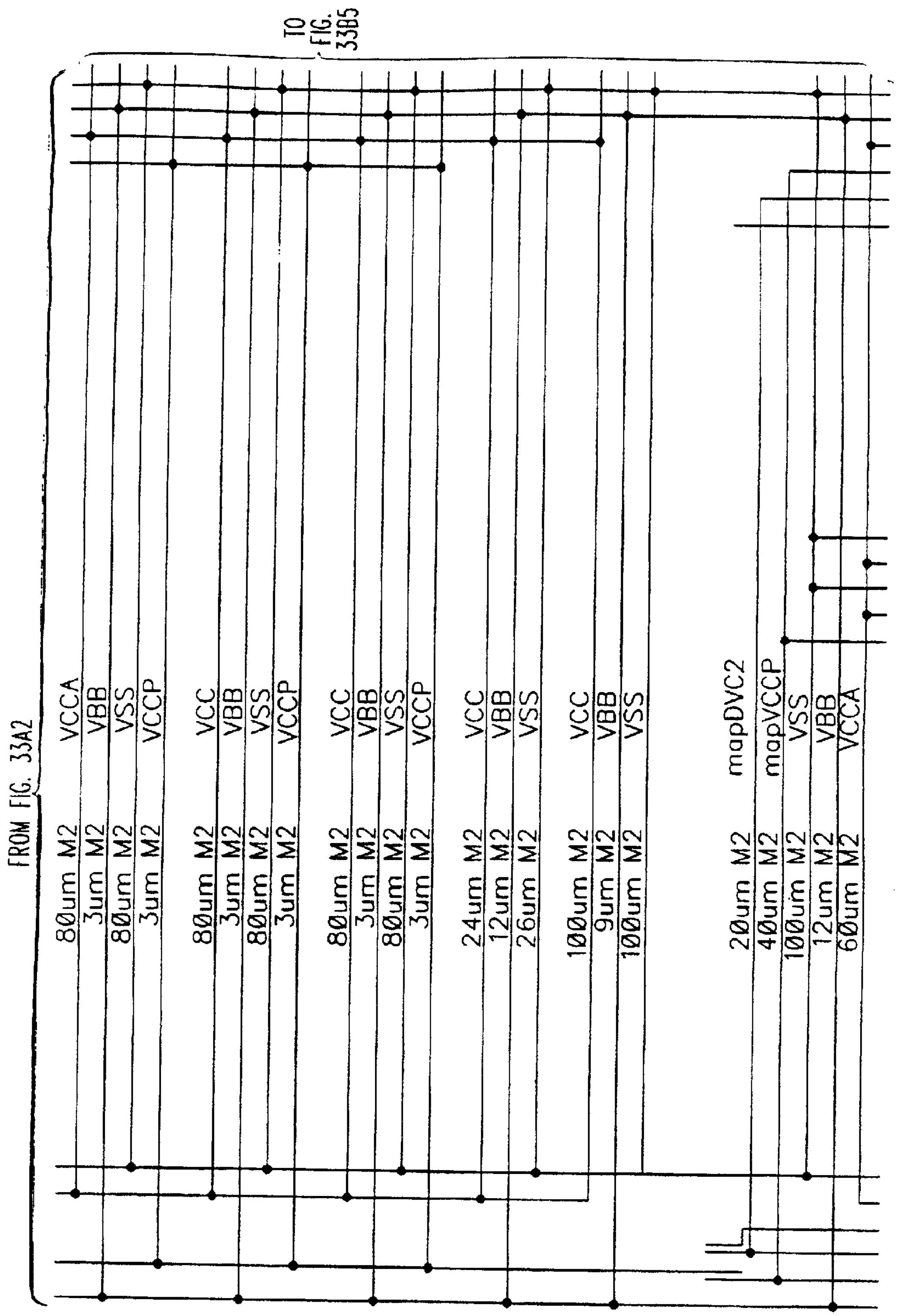
FIG. 33A3

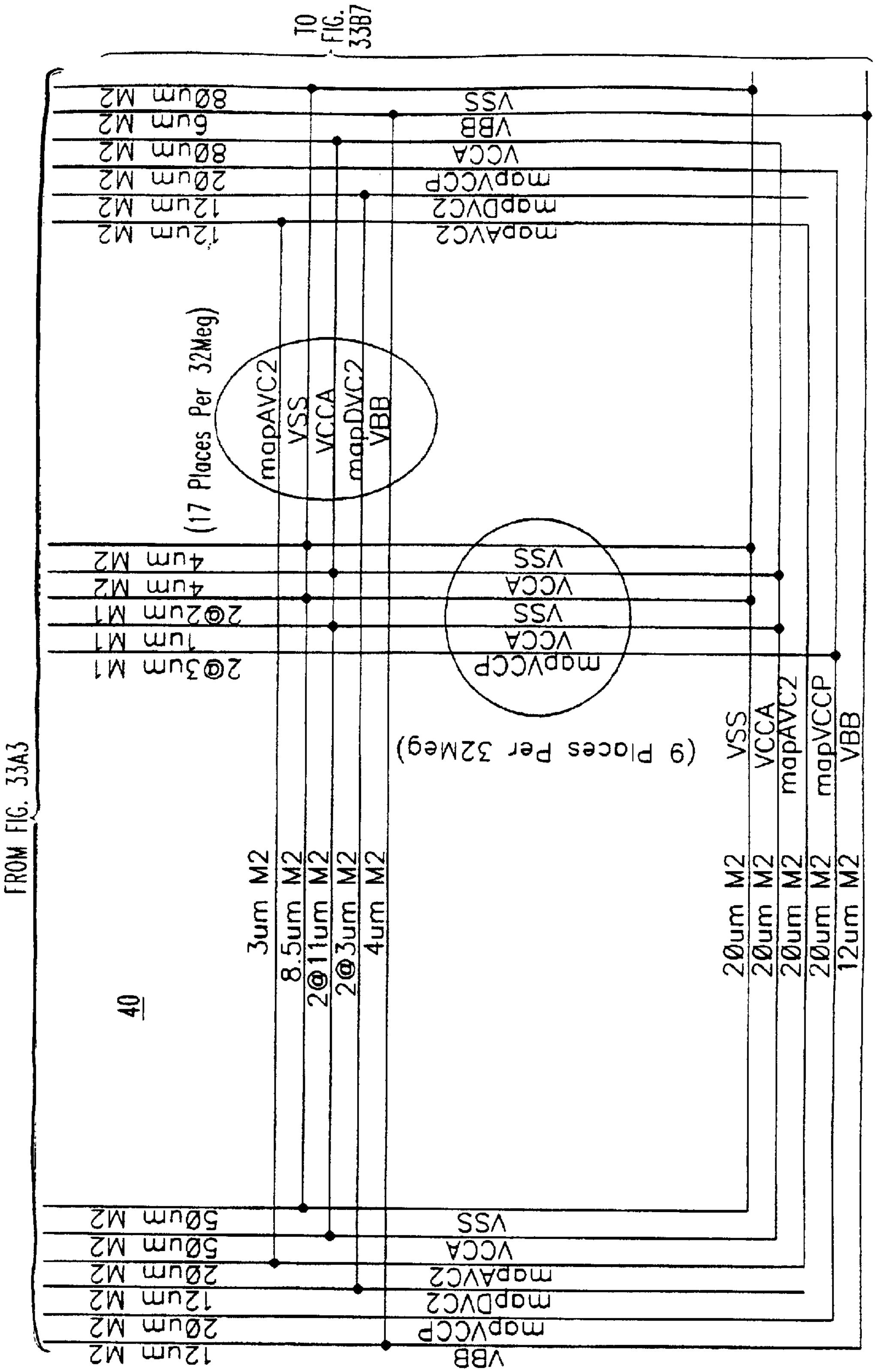
FIG. 33A4

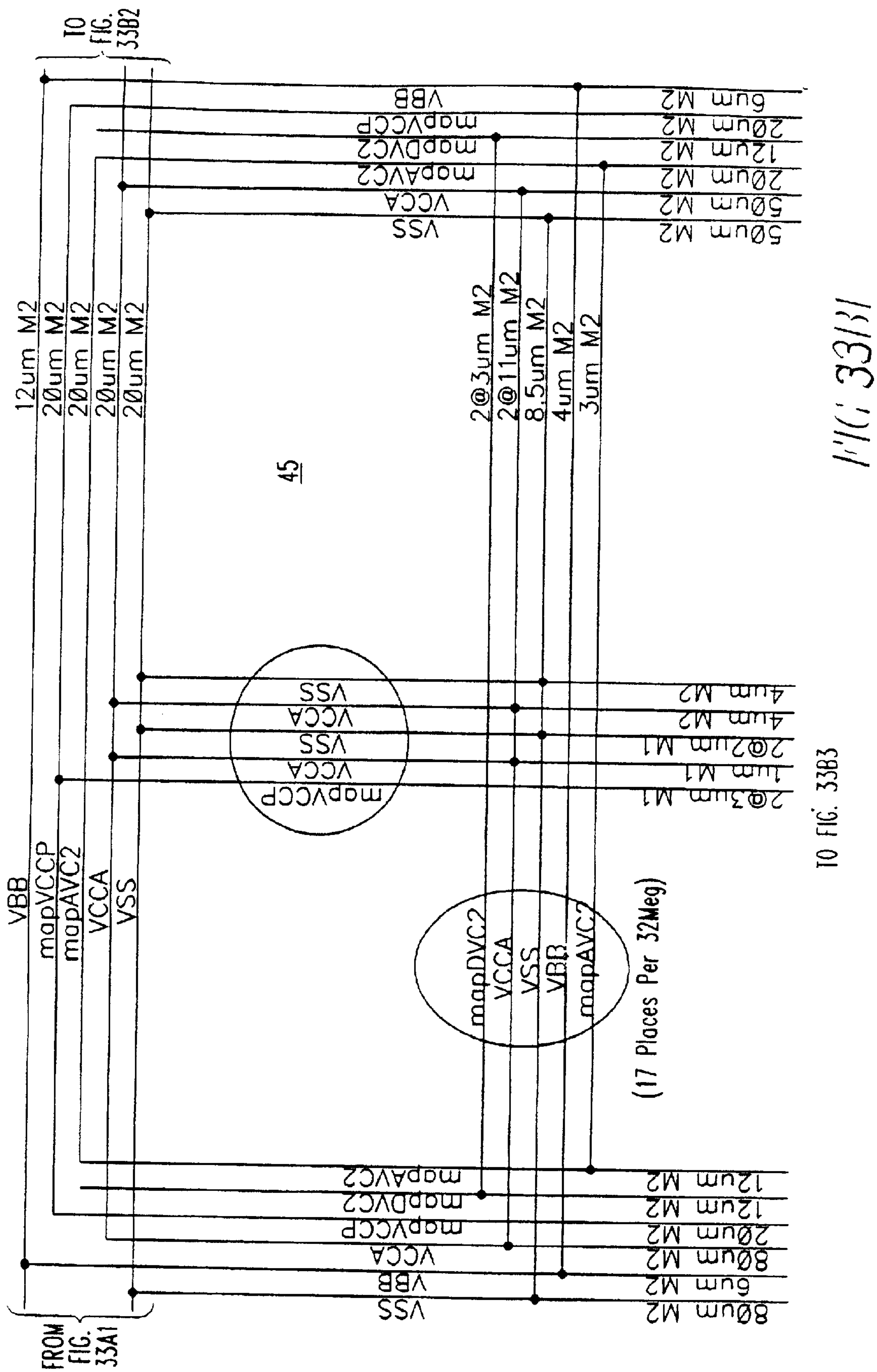
FIG. 33B1

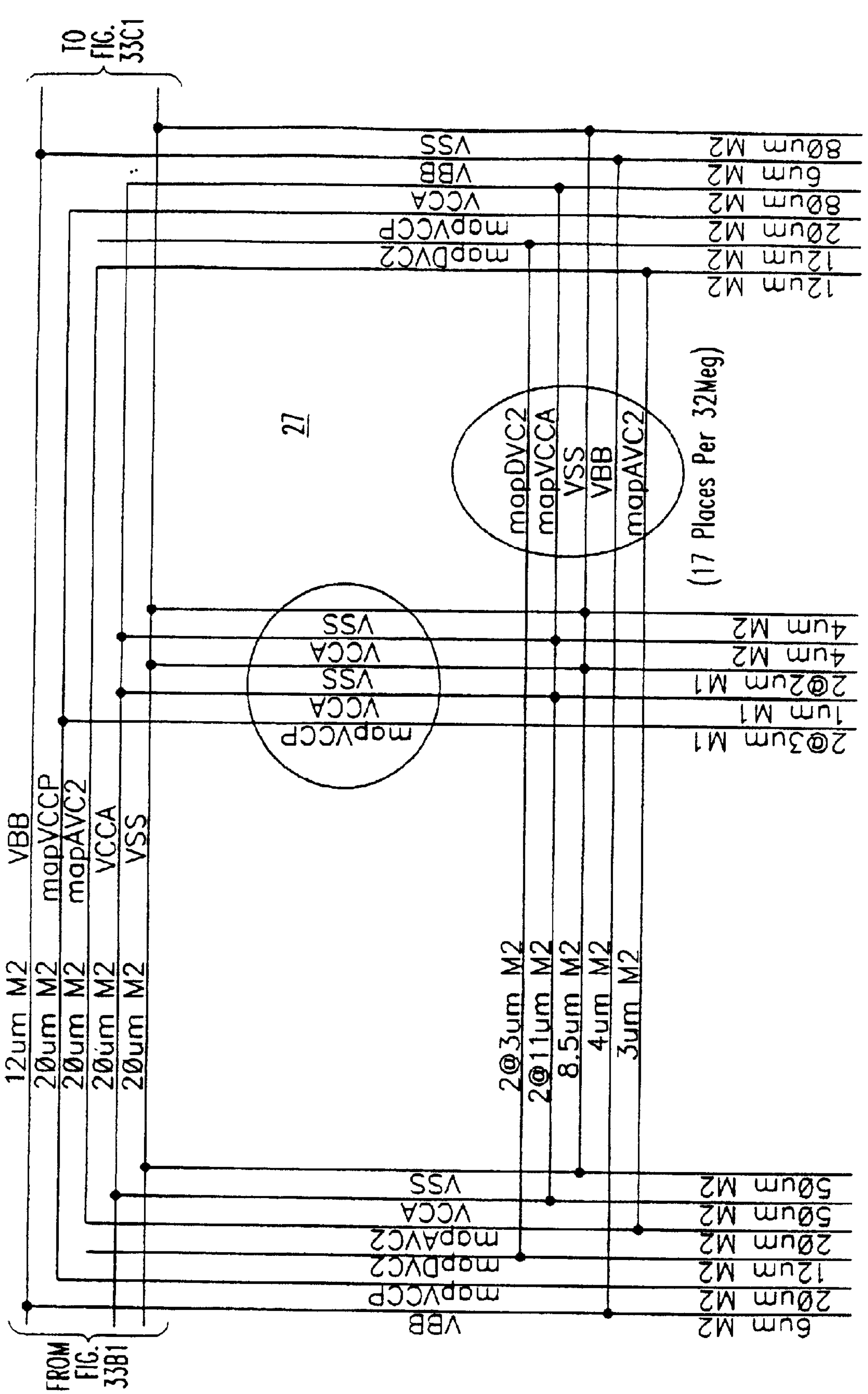
TO FIG. 33B4
FIG. 33B2

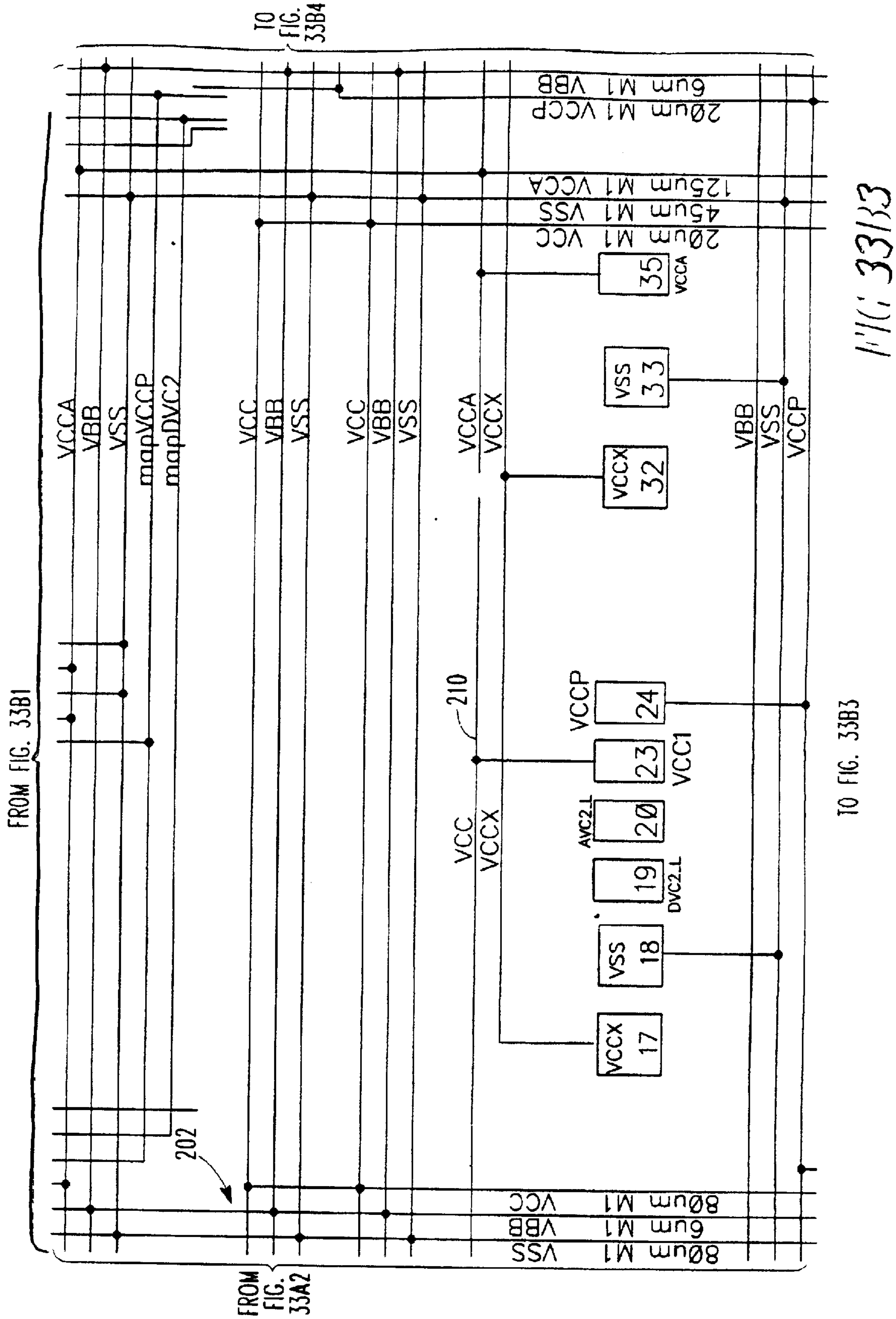
FIG 33B3

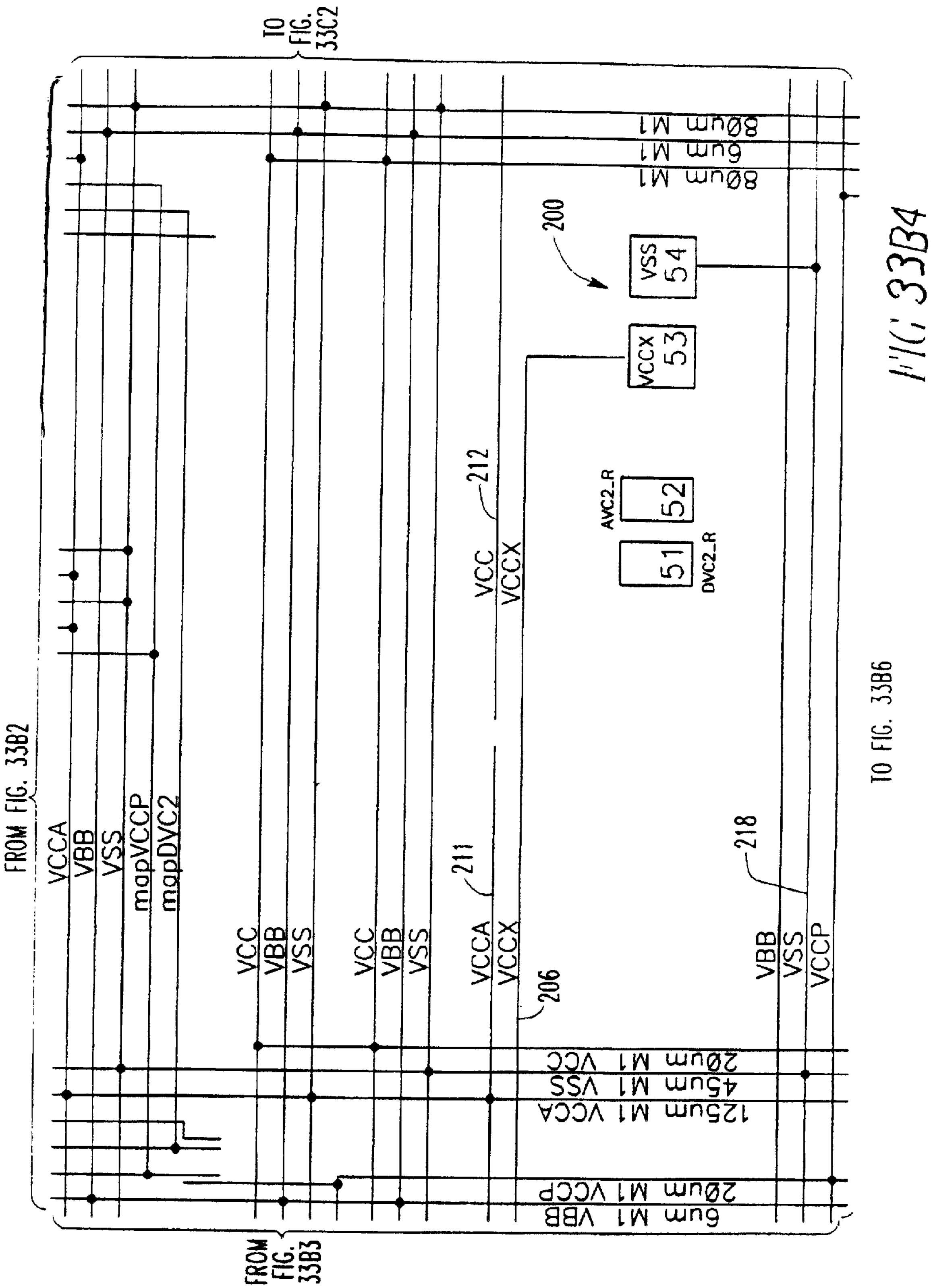
FIG 33B4

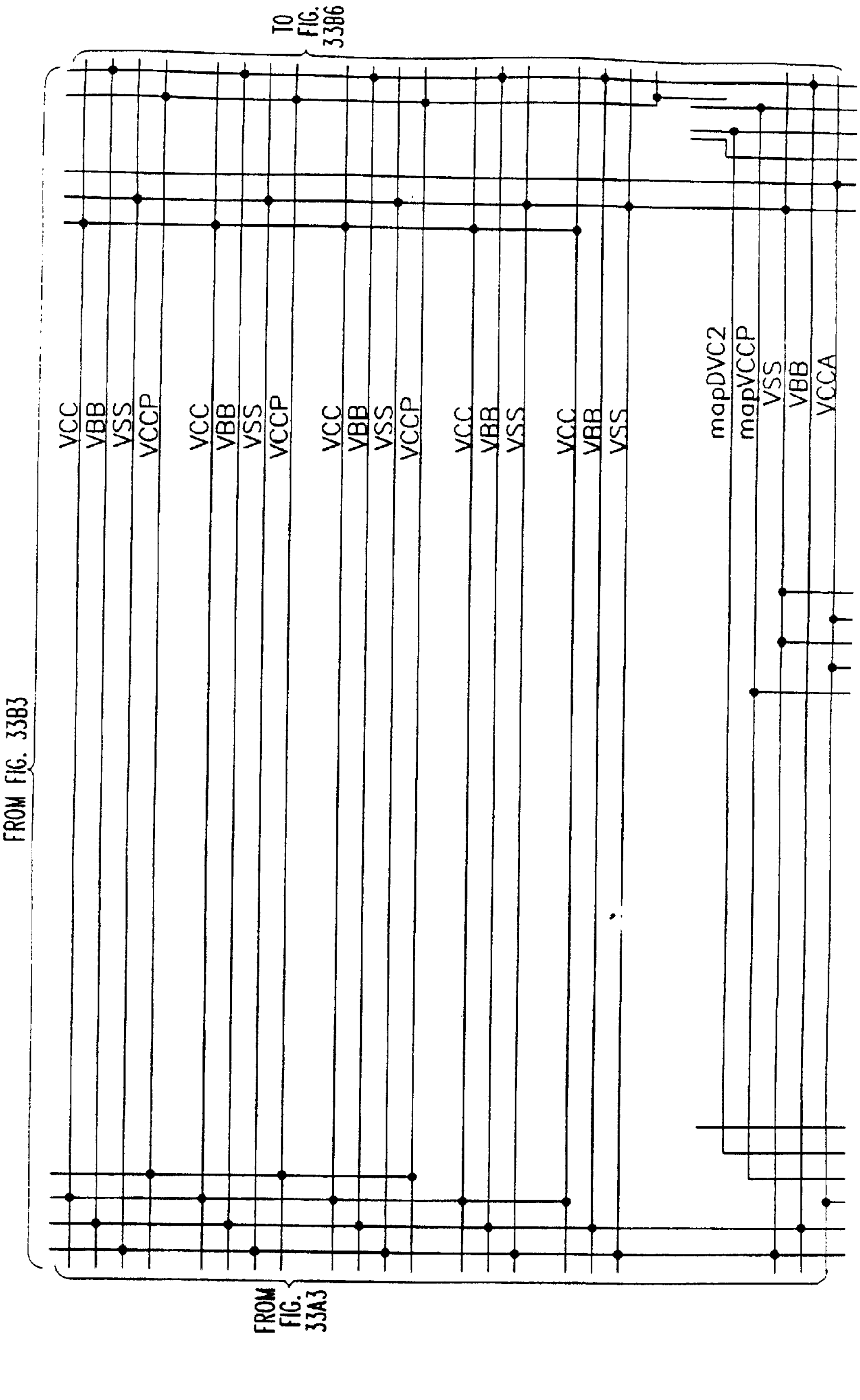
FIG. 33B5

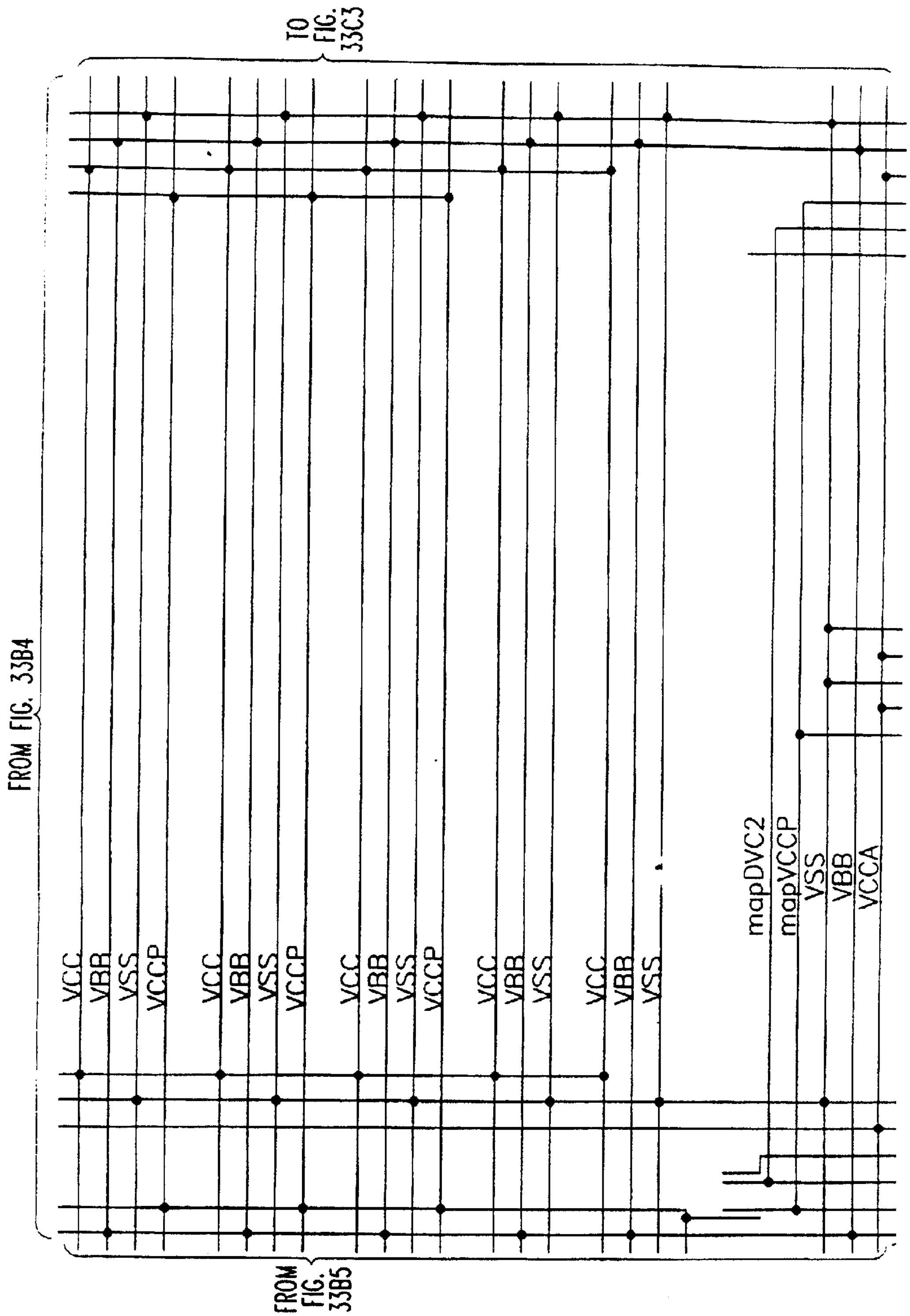
FIG. 33B6

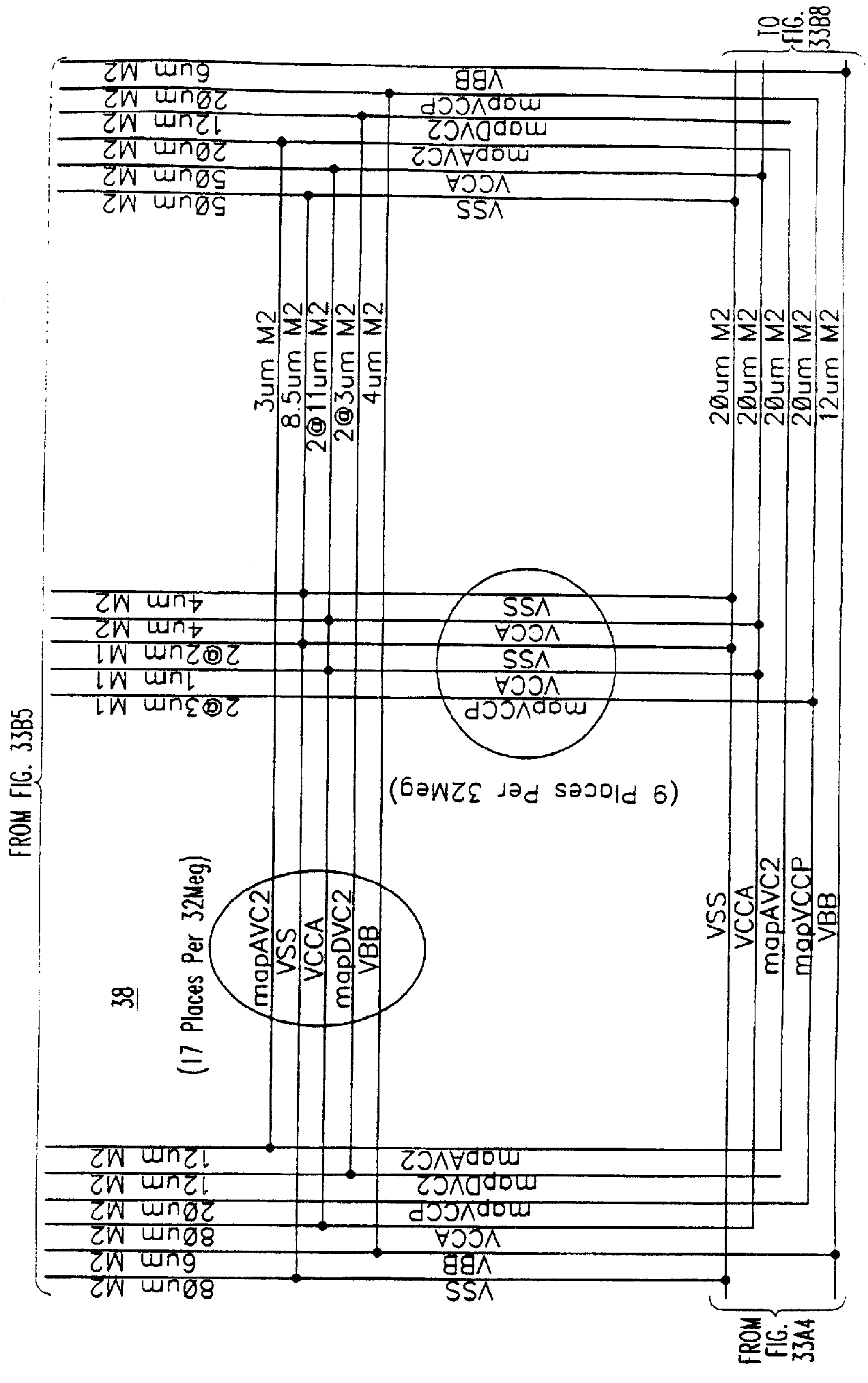
FIG 33B7

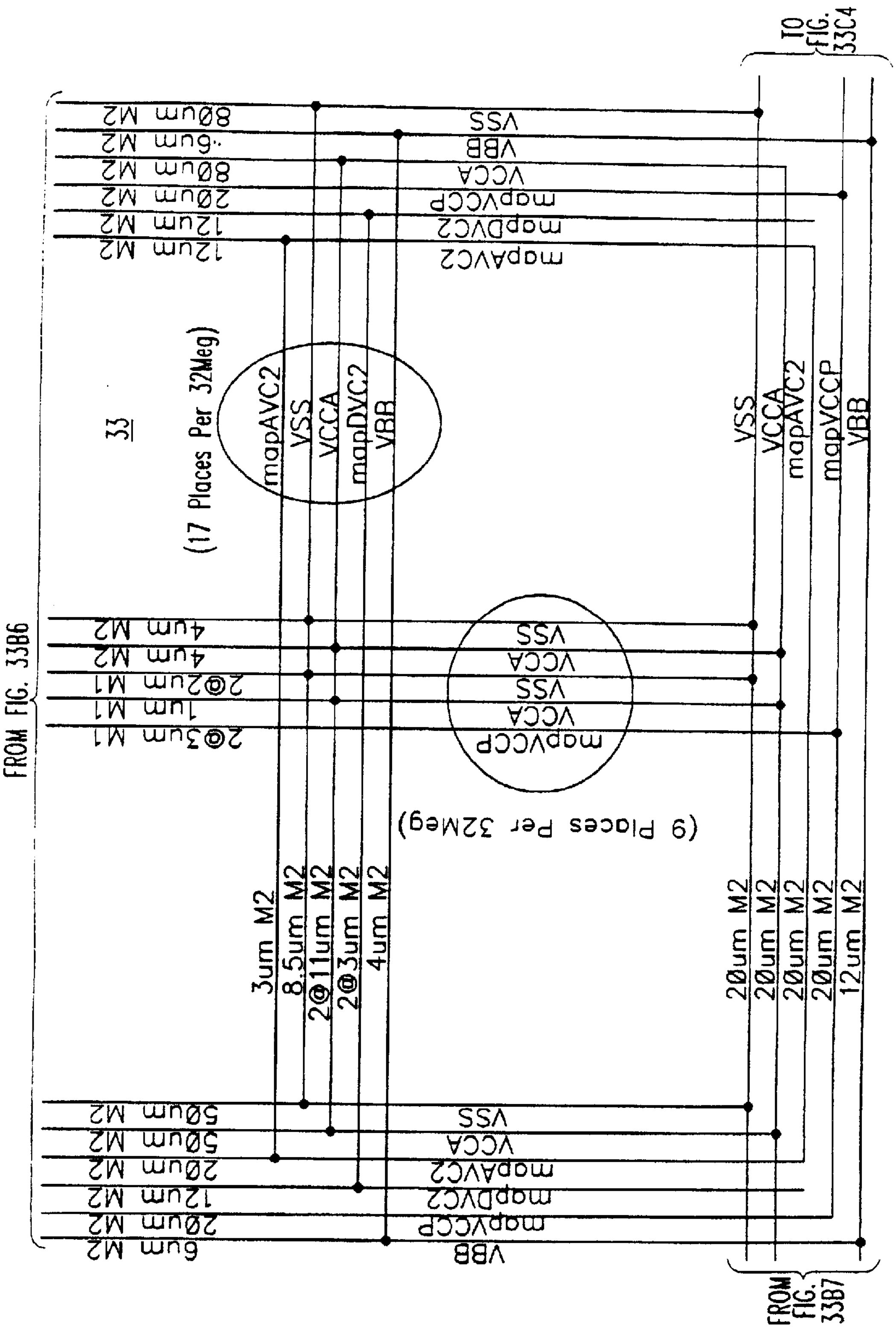
FIG. 33B8

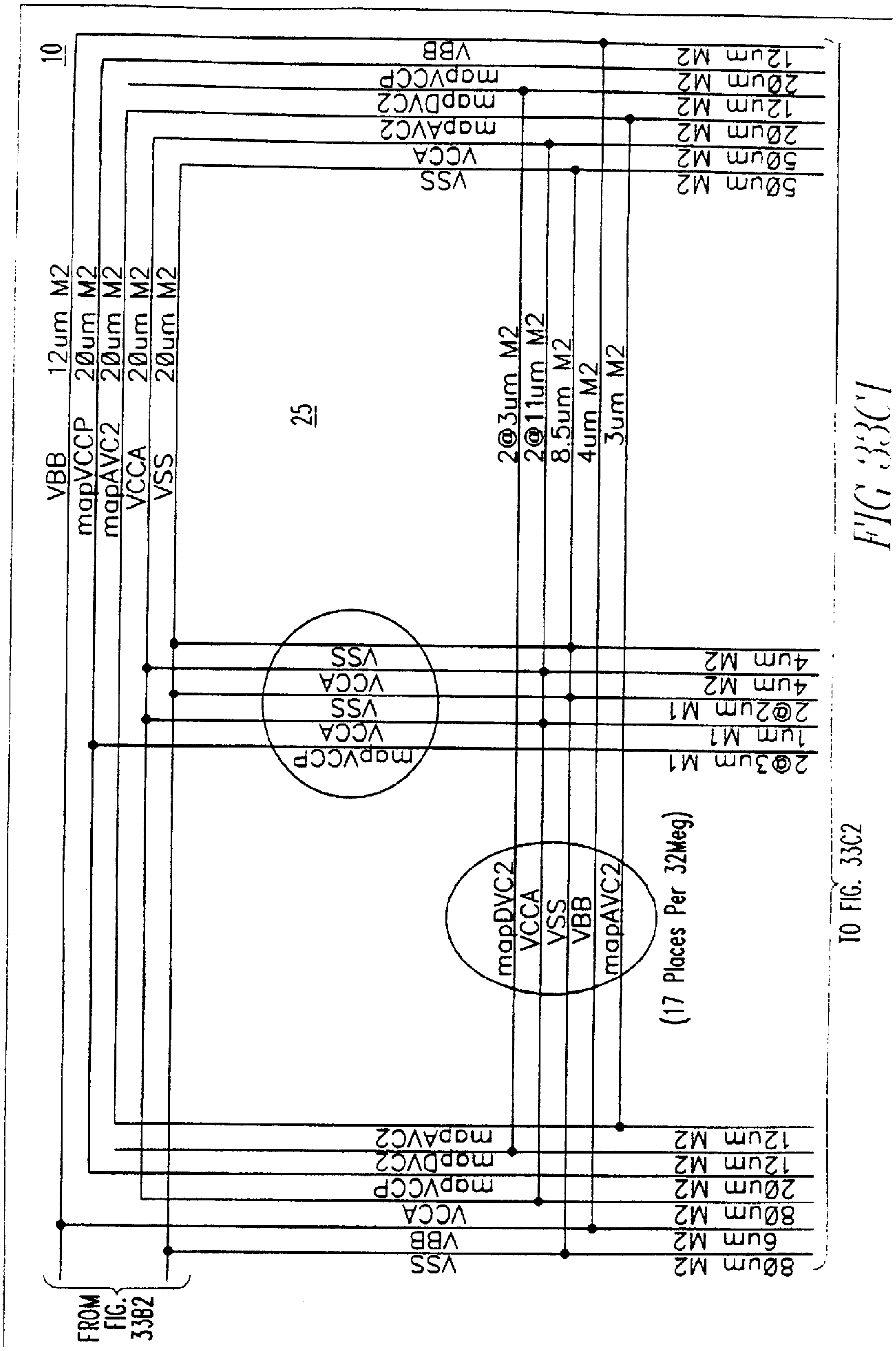
FIG 33C1

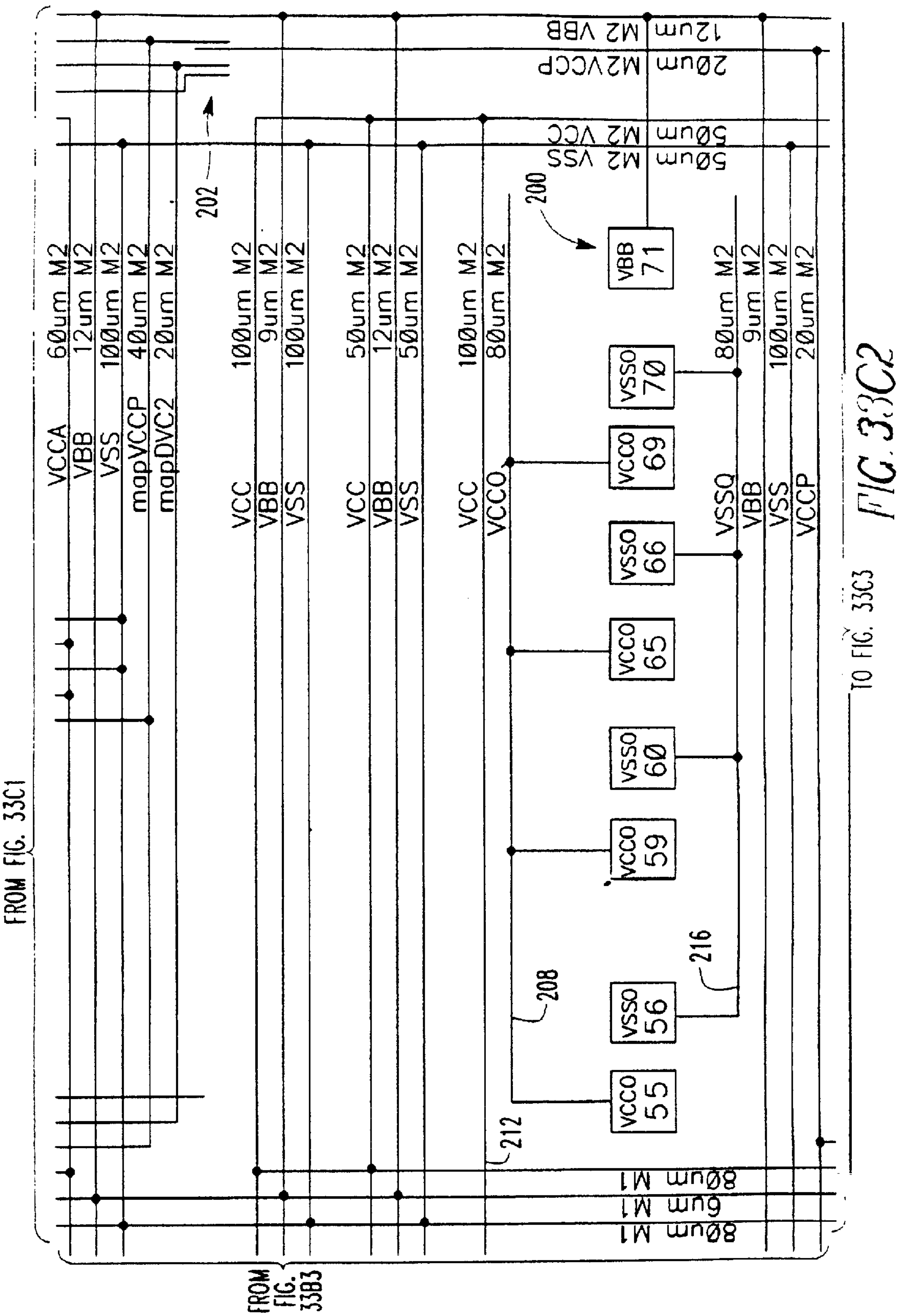
FIG. 33C2

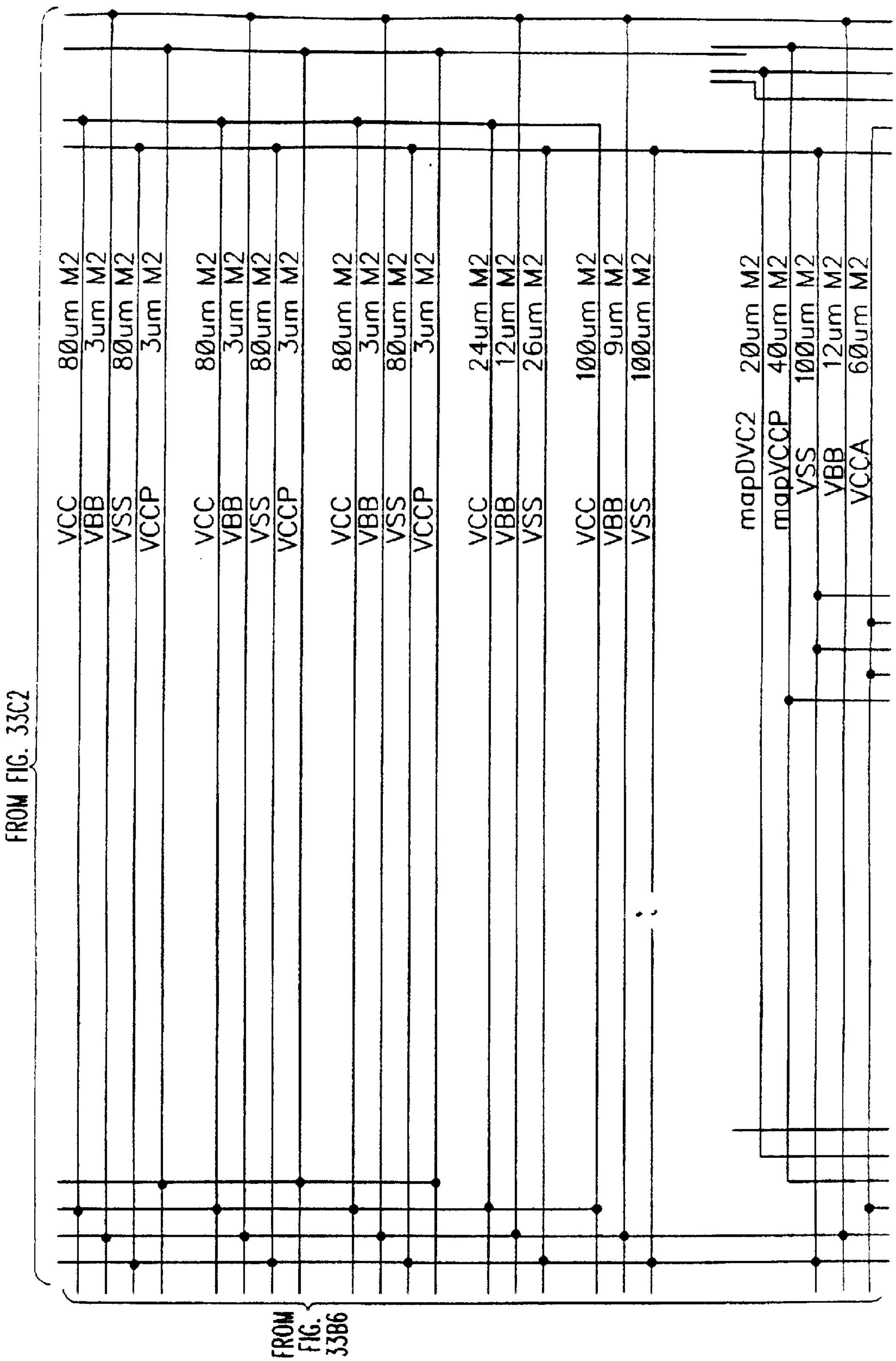
FIG 33C3

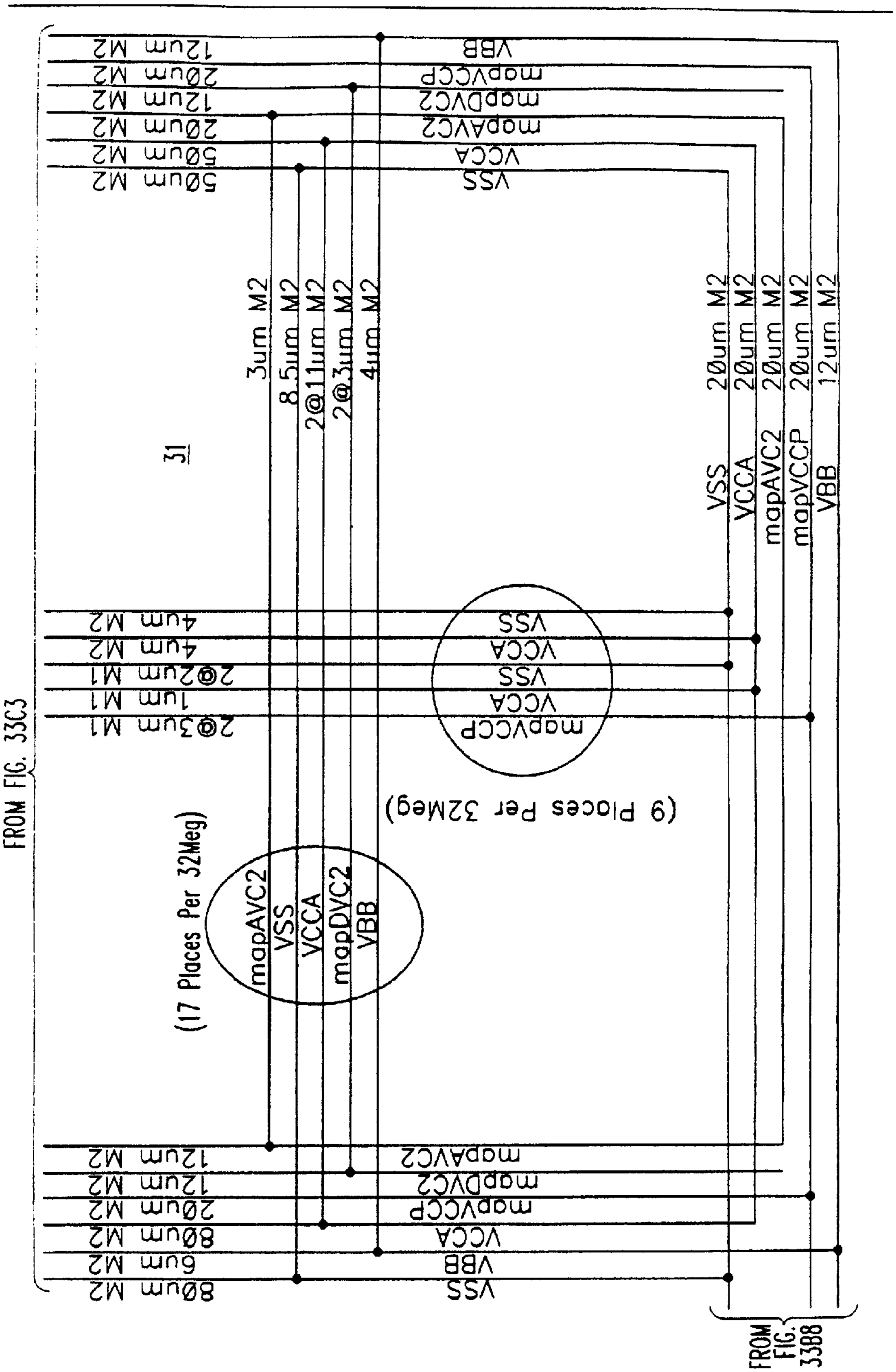
FIG 33C4

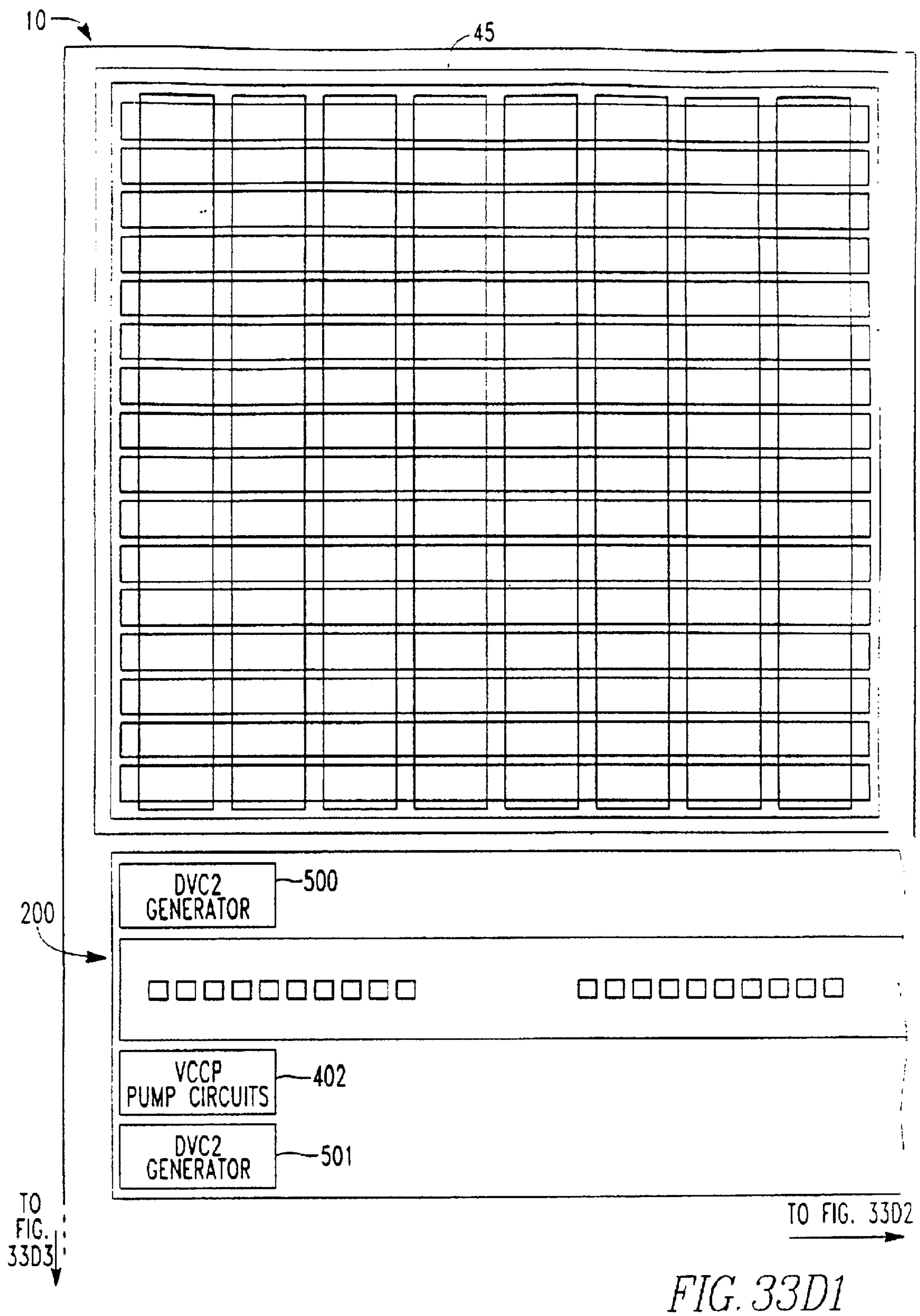
FIG. 33D1

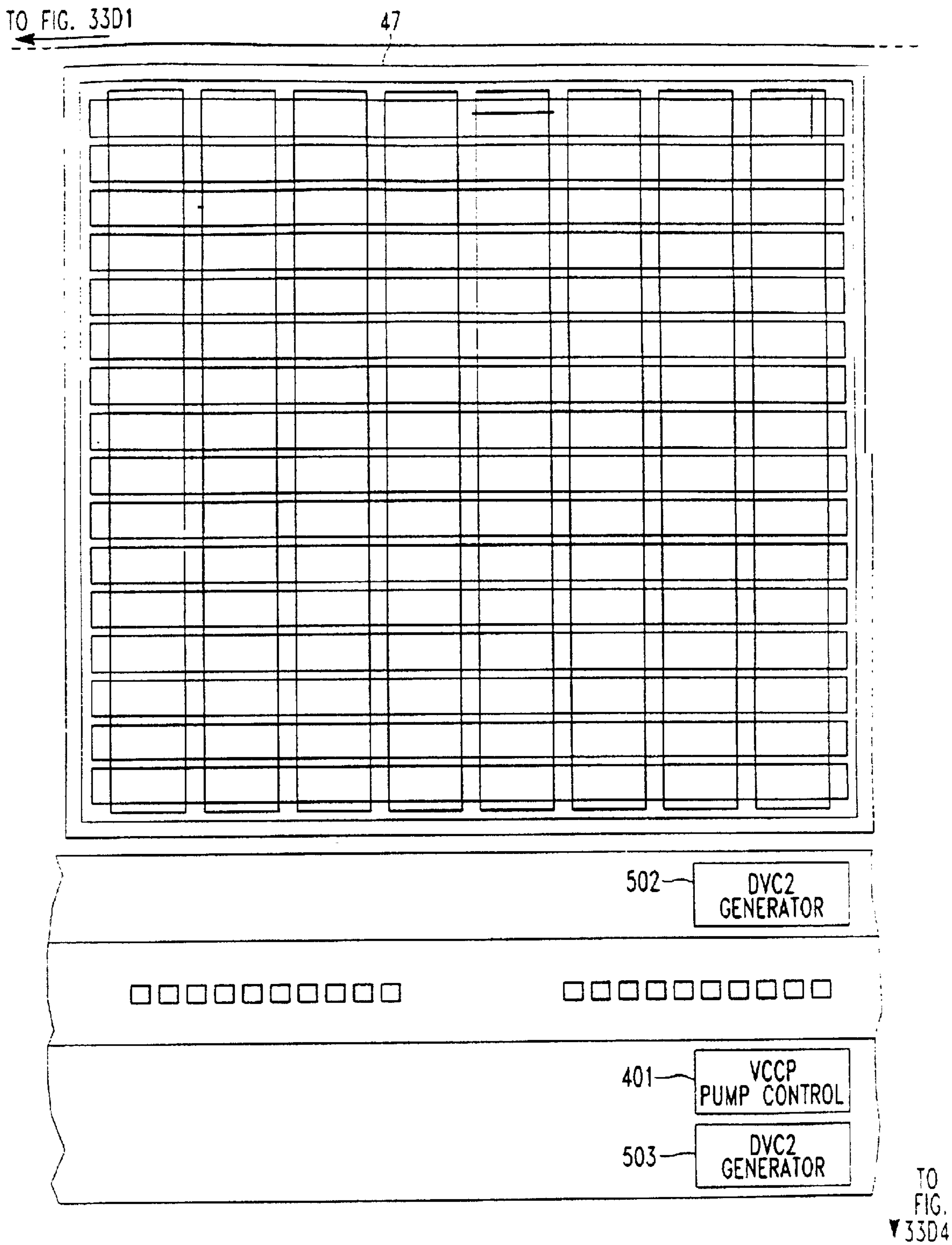
FIG. 33D2

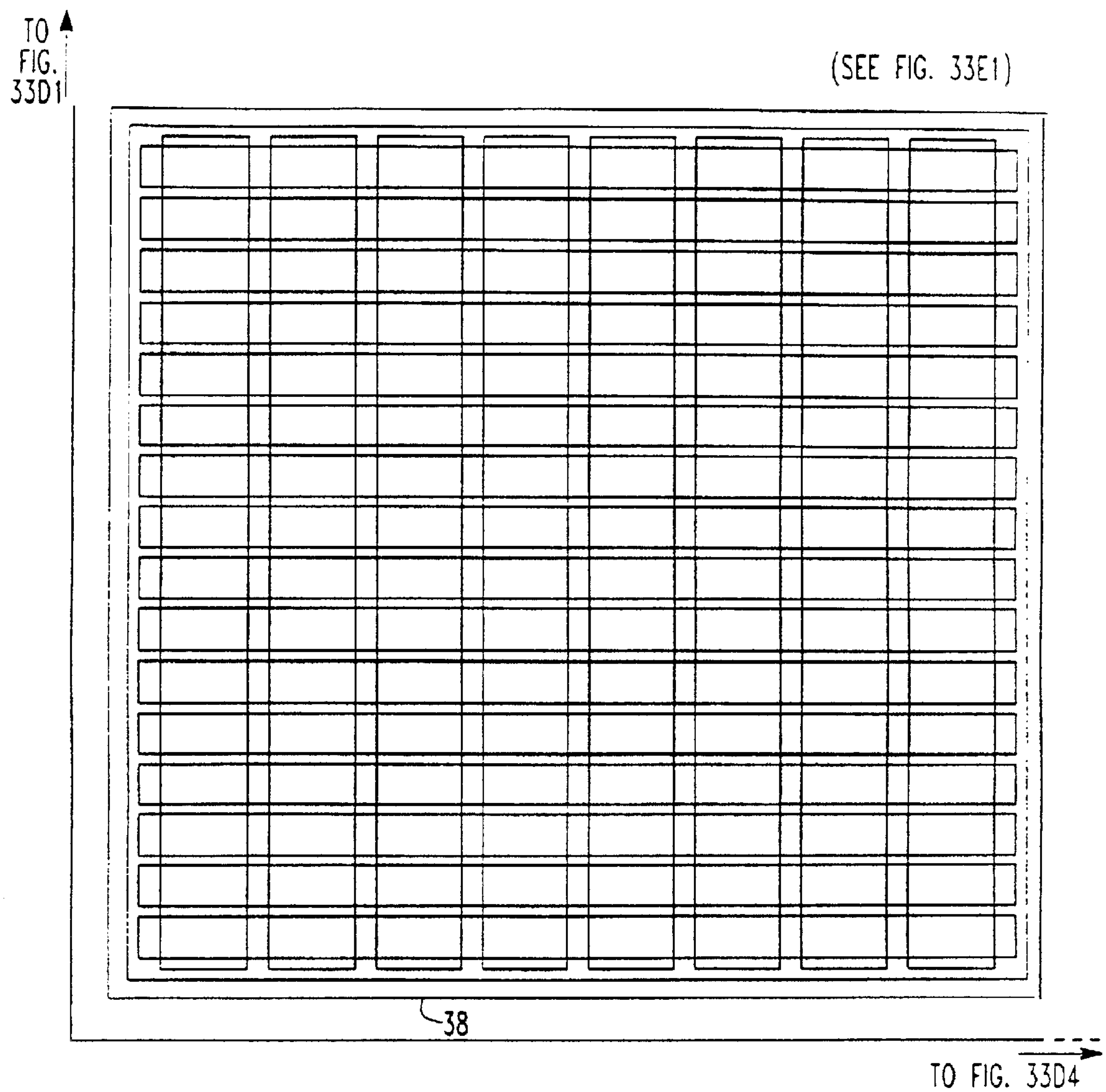
FIG. 33D3

TO FIG. 33D2
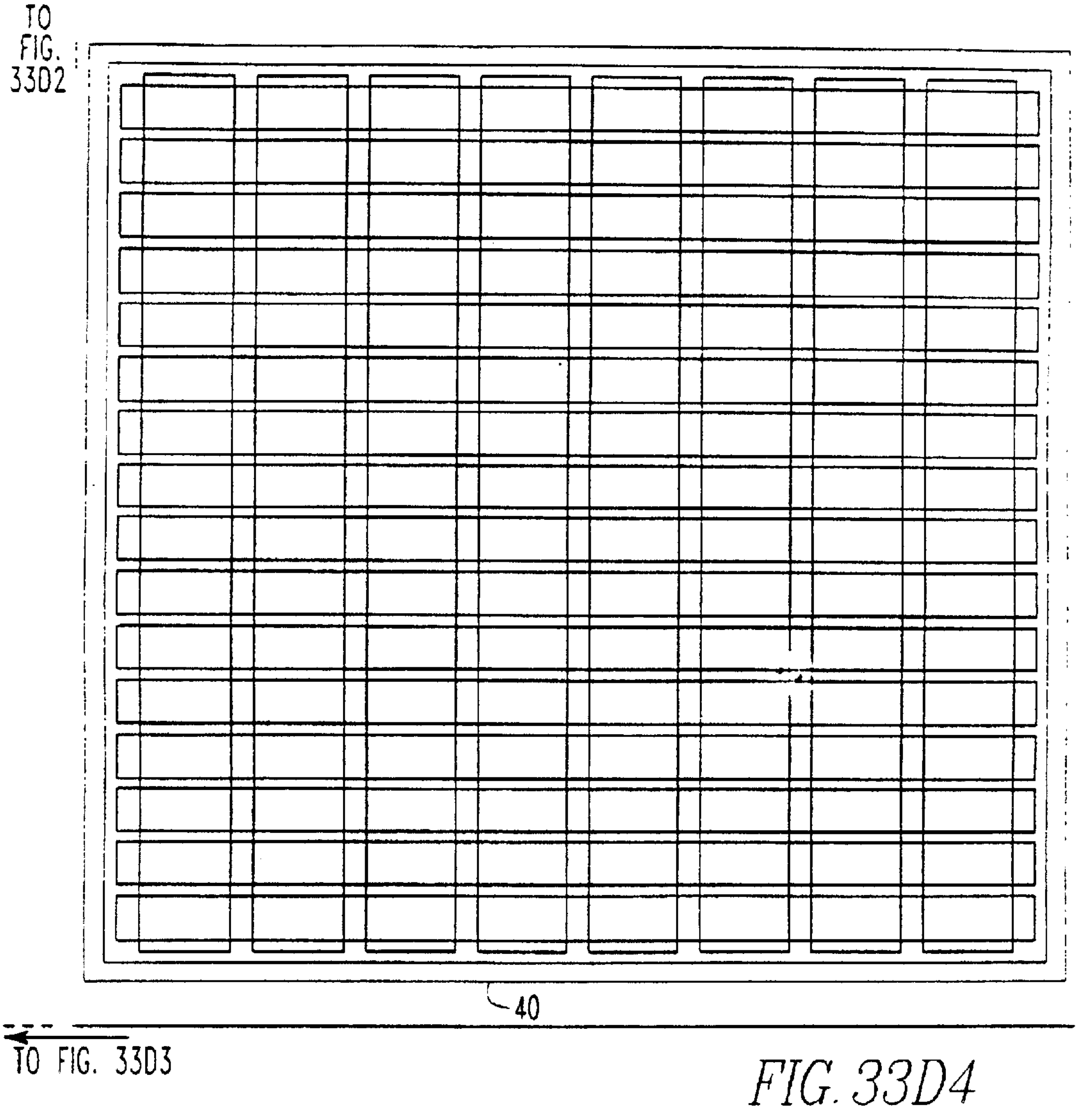
TO FIG. 33D3
FIG. 33D4

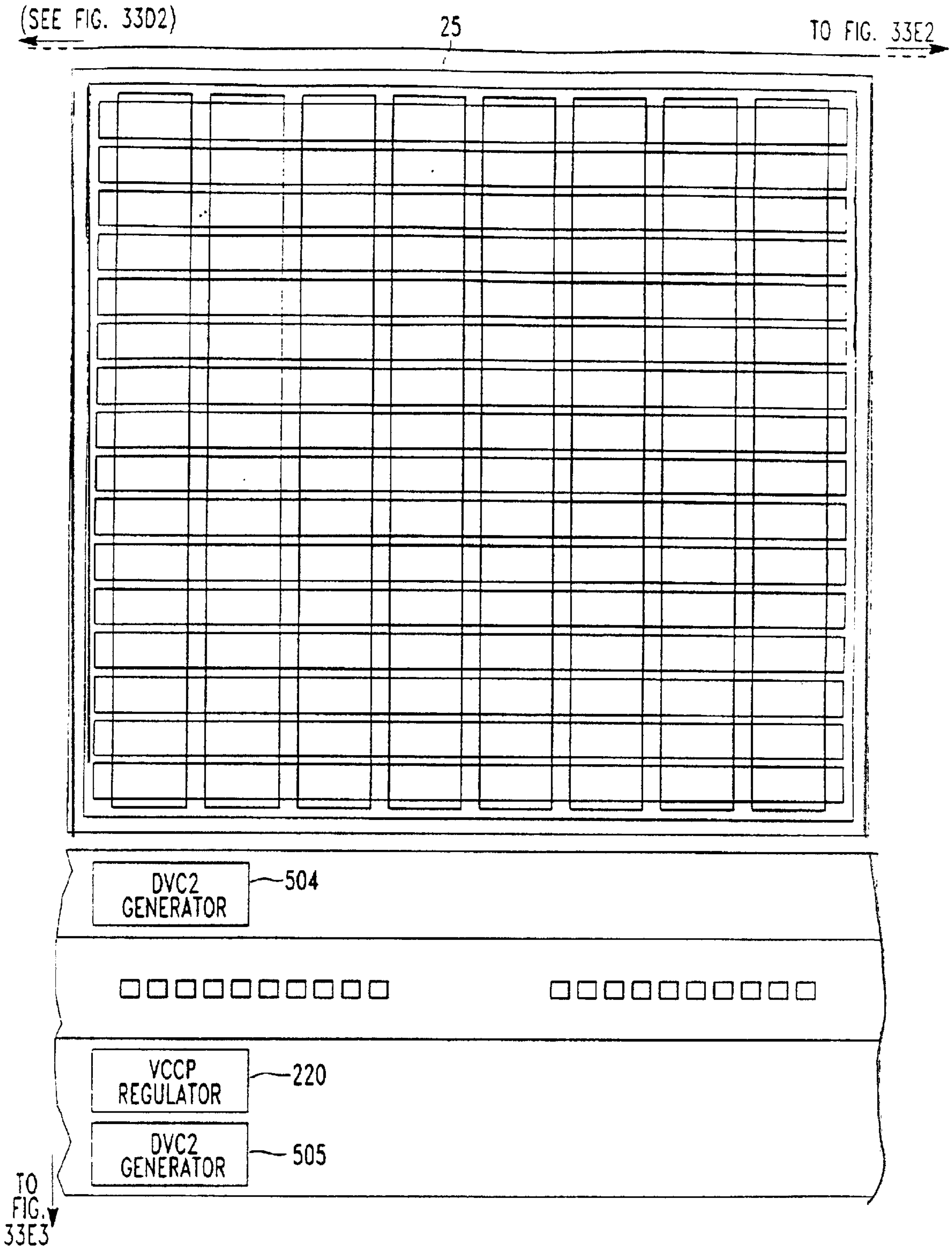
FIG. 33E1

TO FIG. 33E1
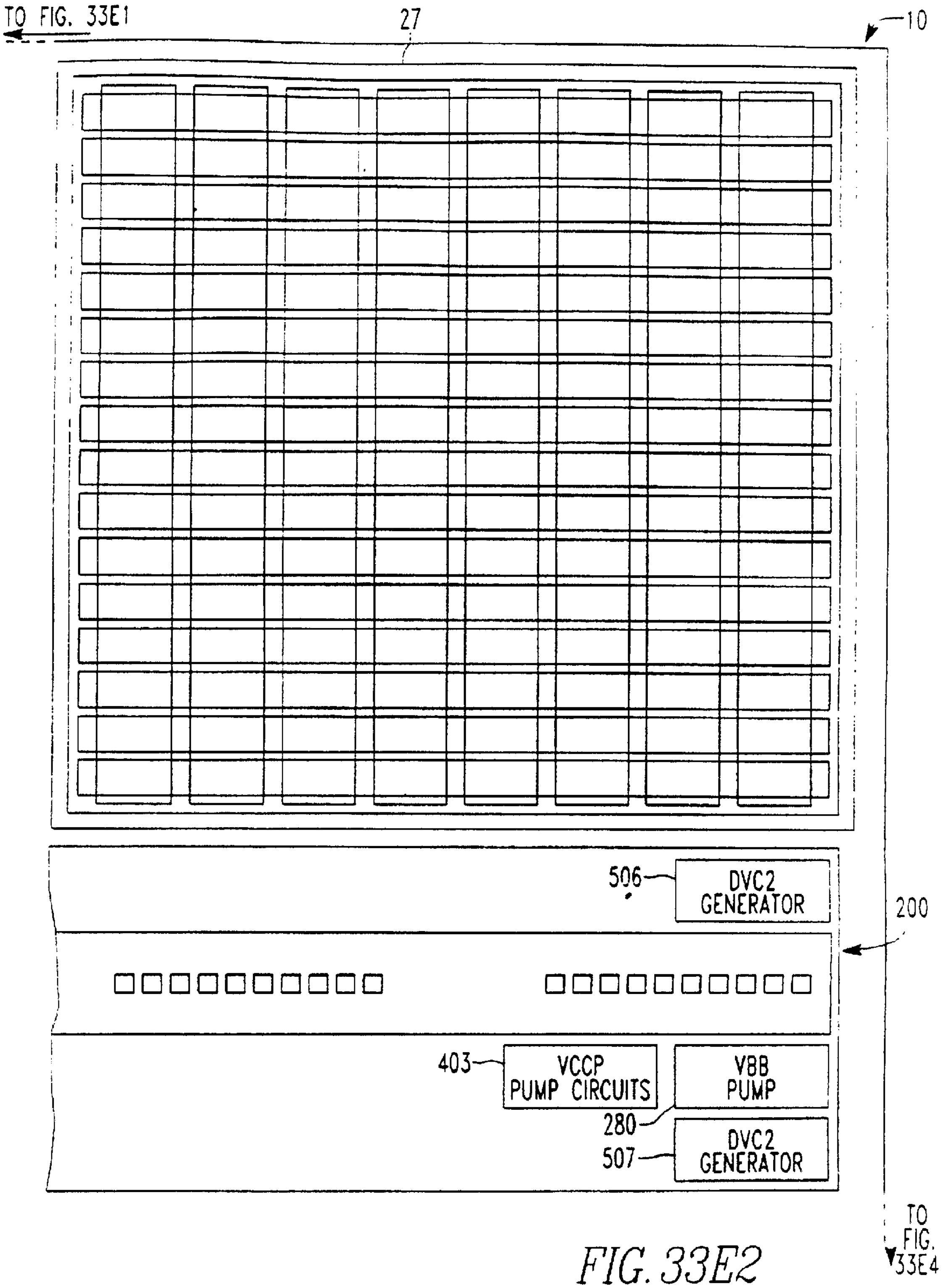
TO FIG. 33E4
FIG. 33E2

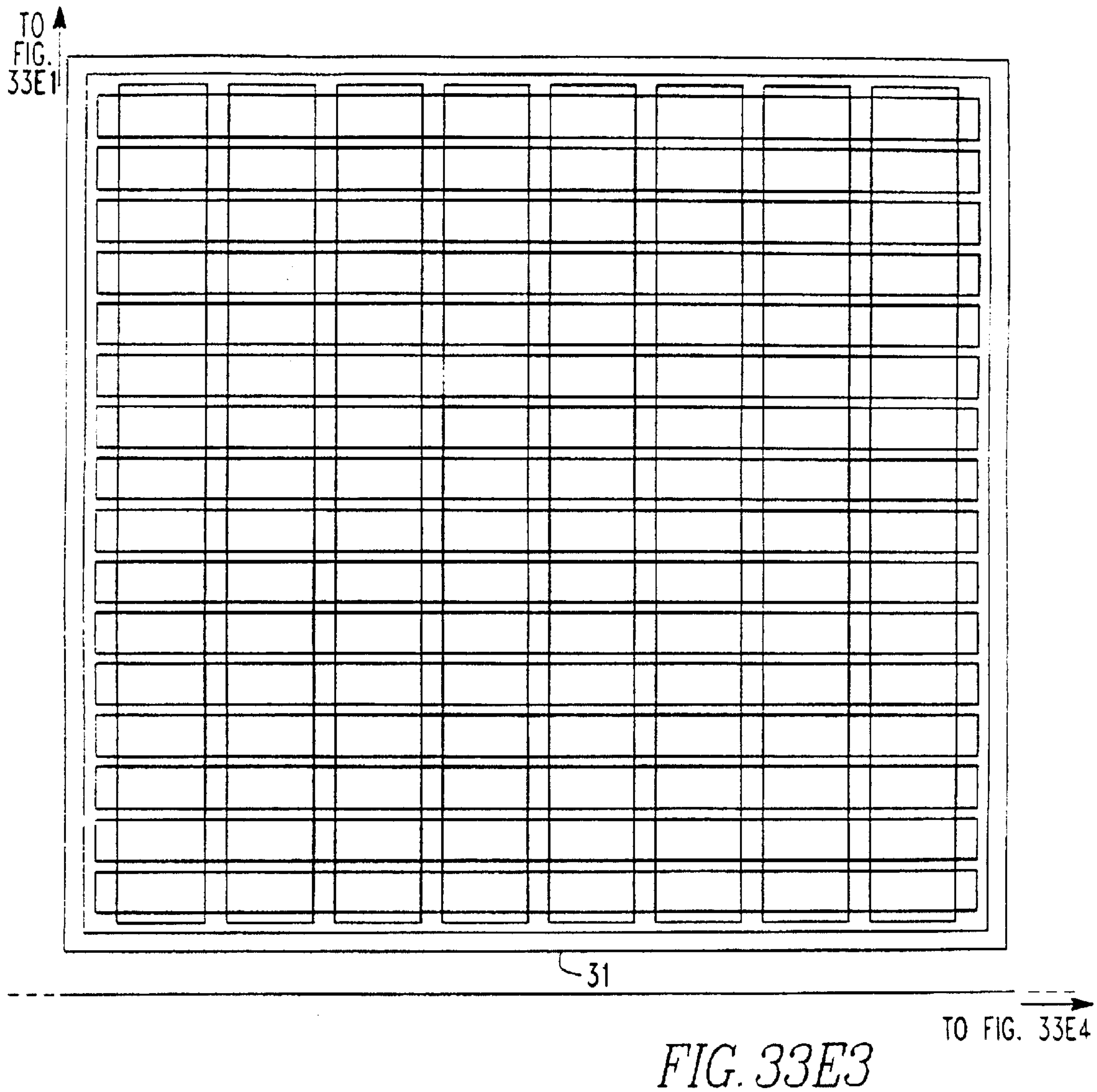
FIG. 33E3

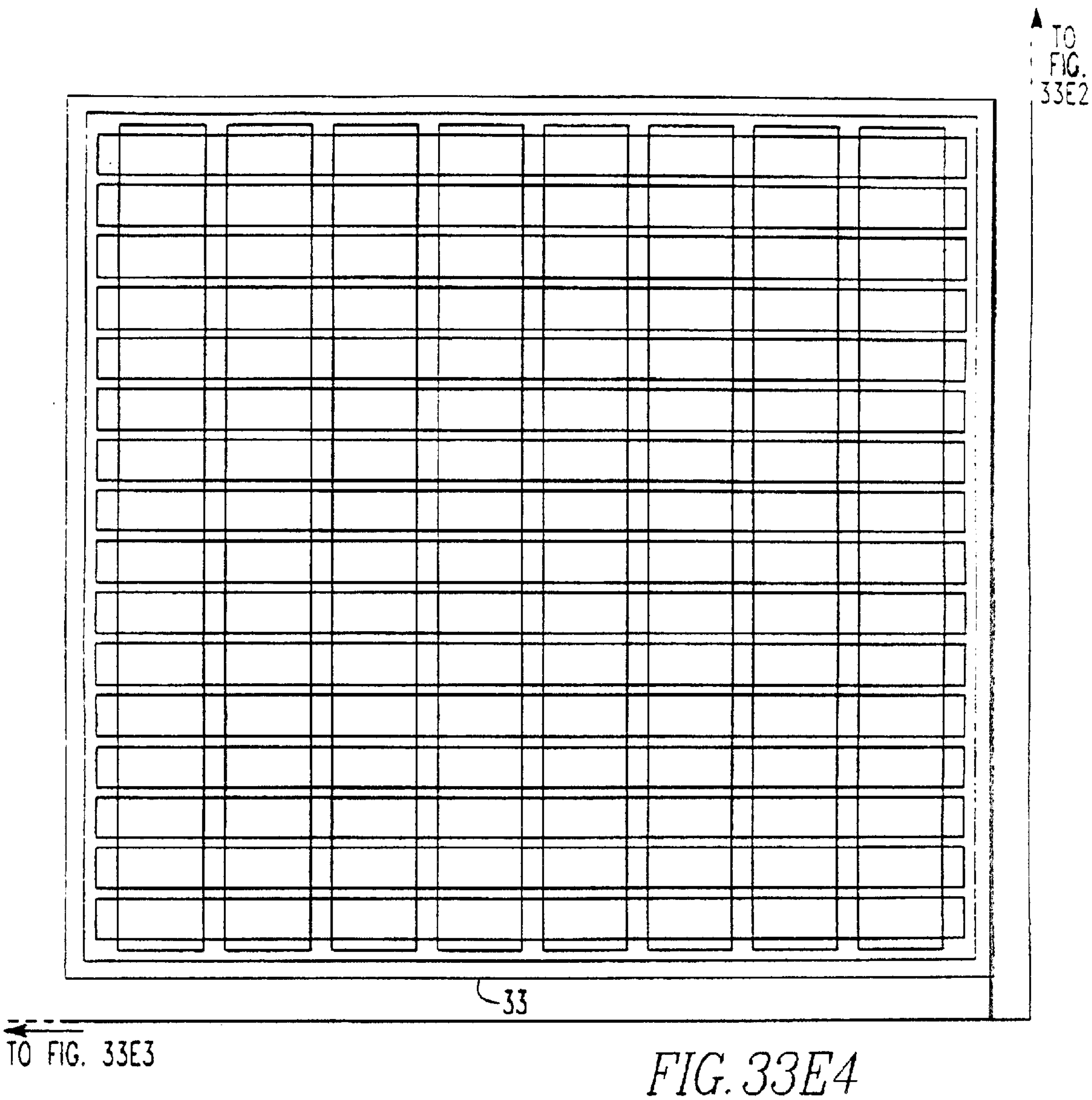
FIG. 33E4

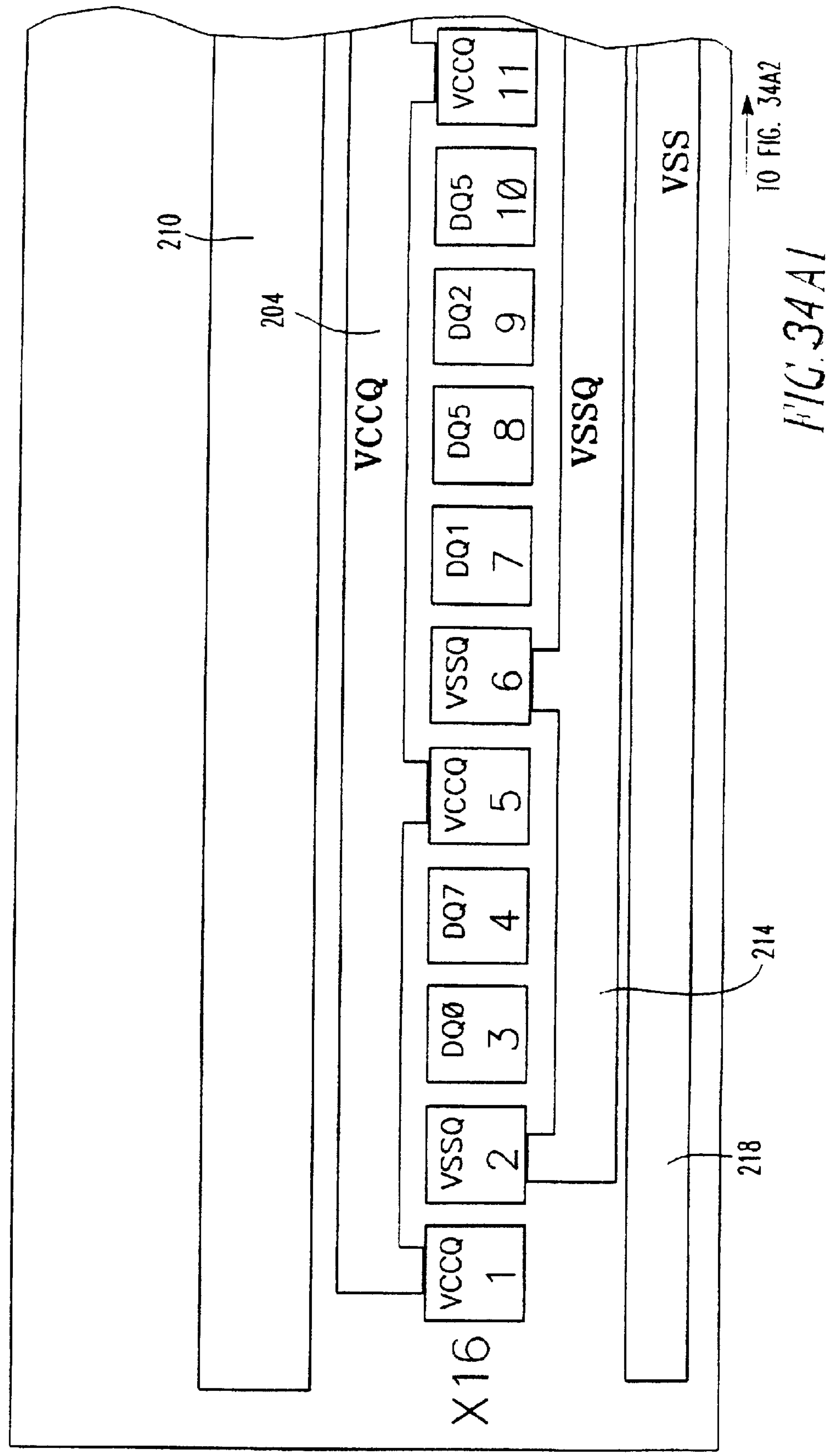
FIG. 34A1

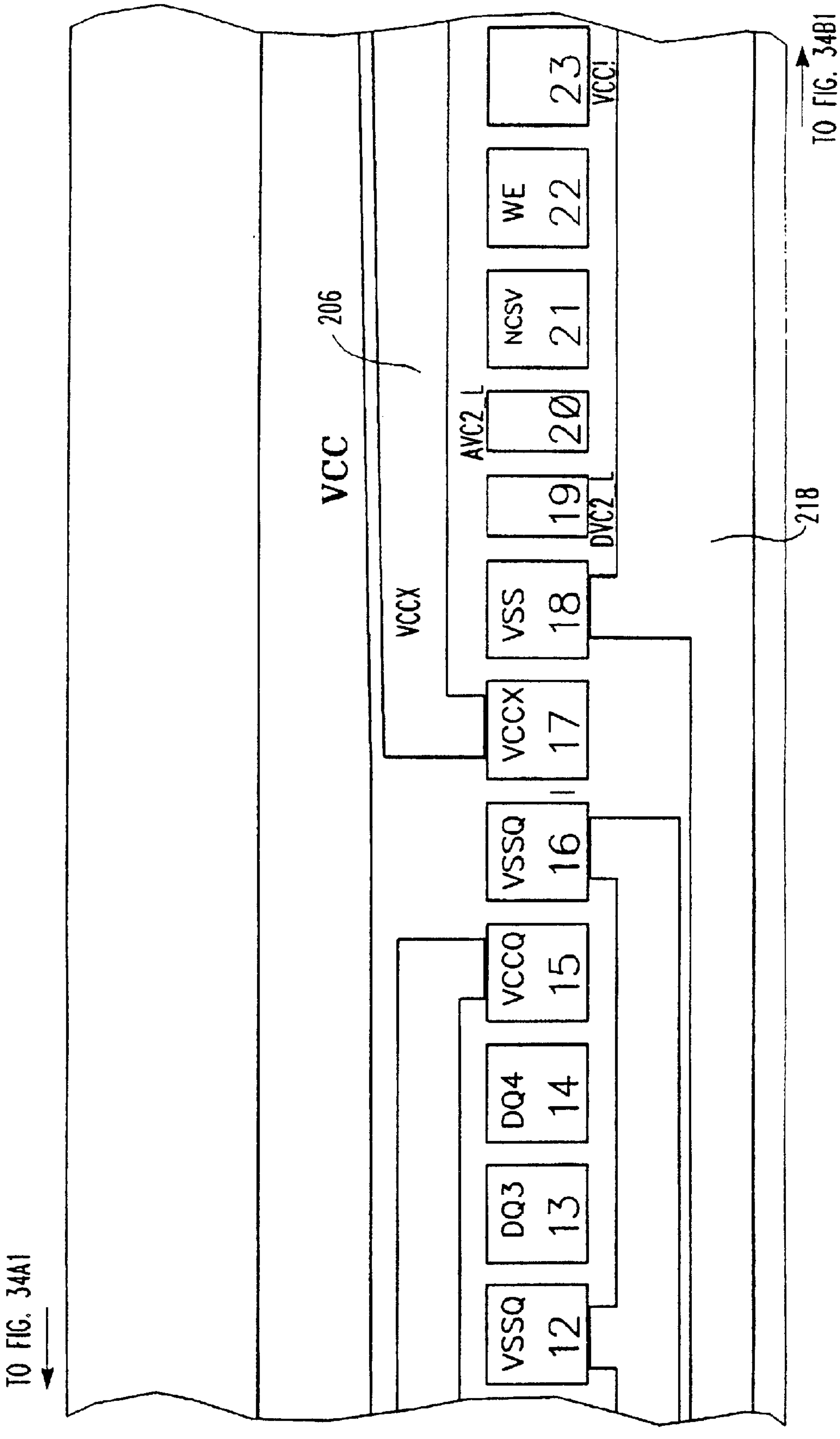
FIG. 34A2

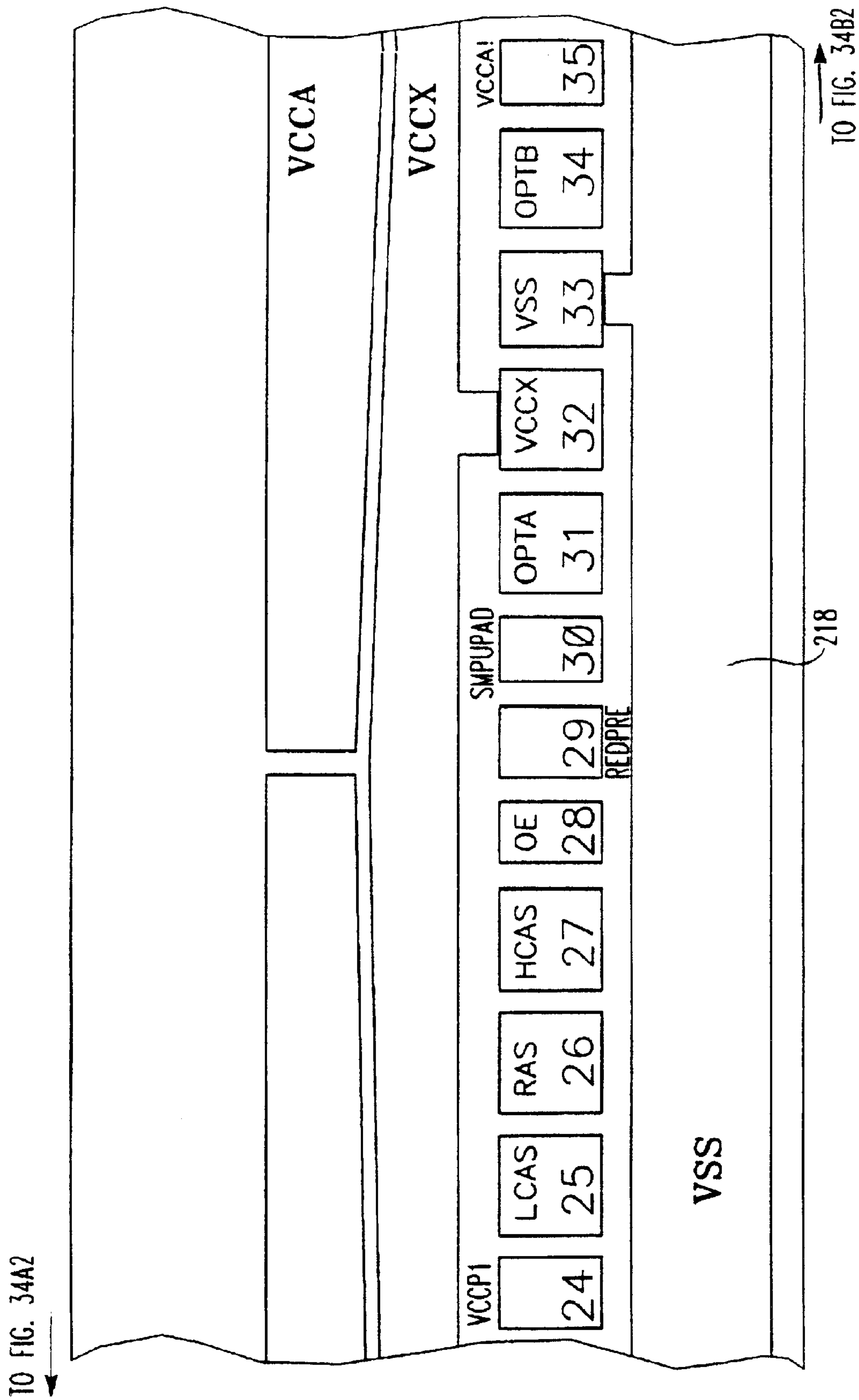
FIG. 34B1

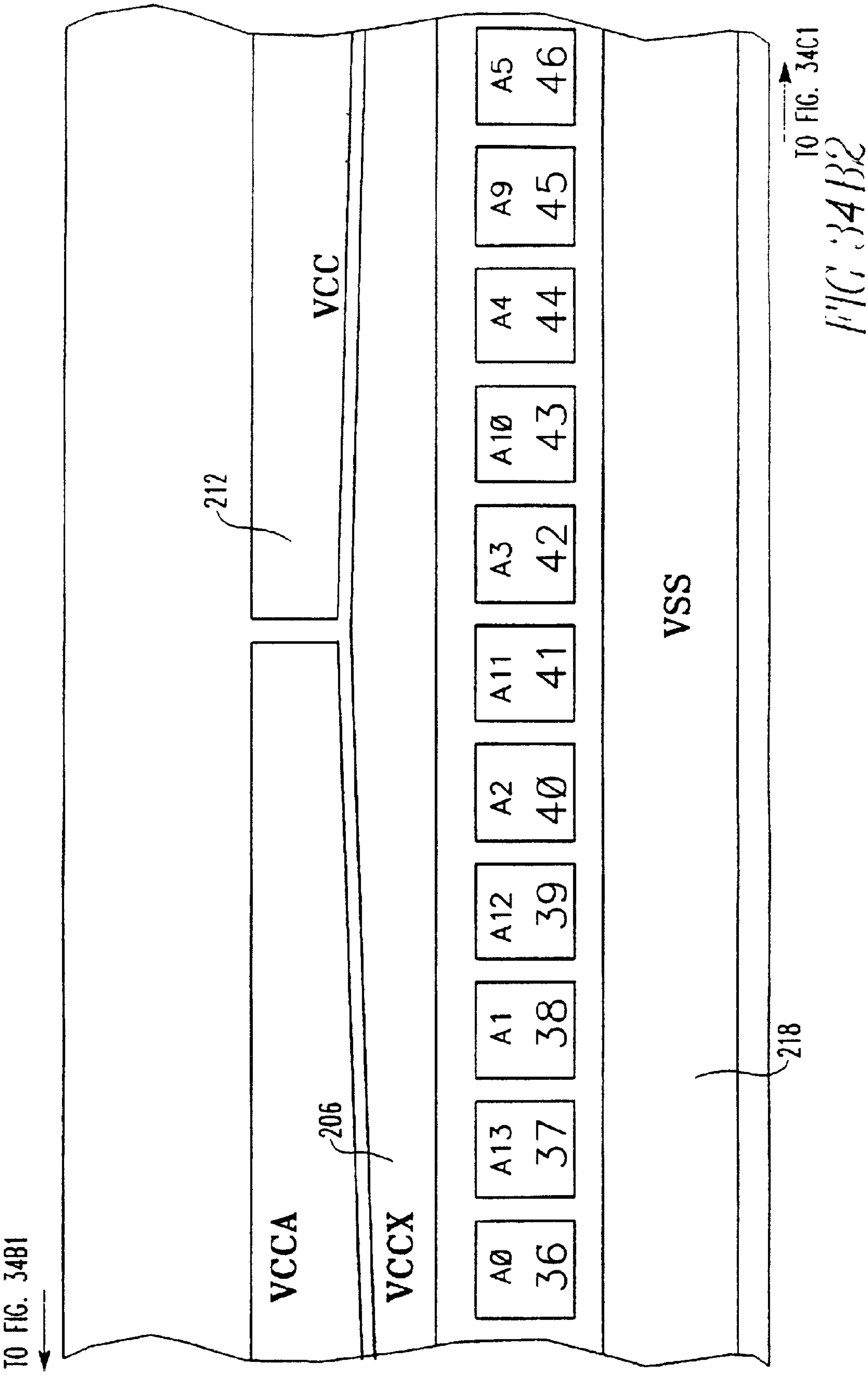
FIG. 34B2

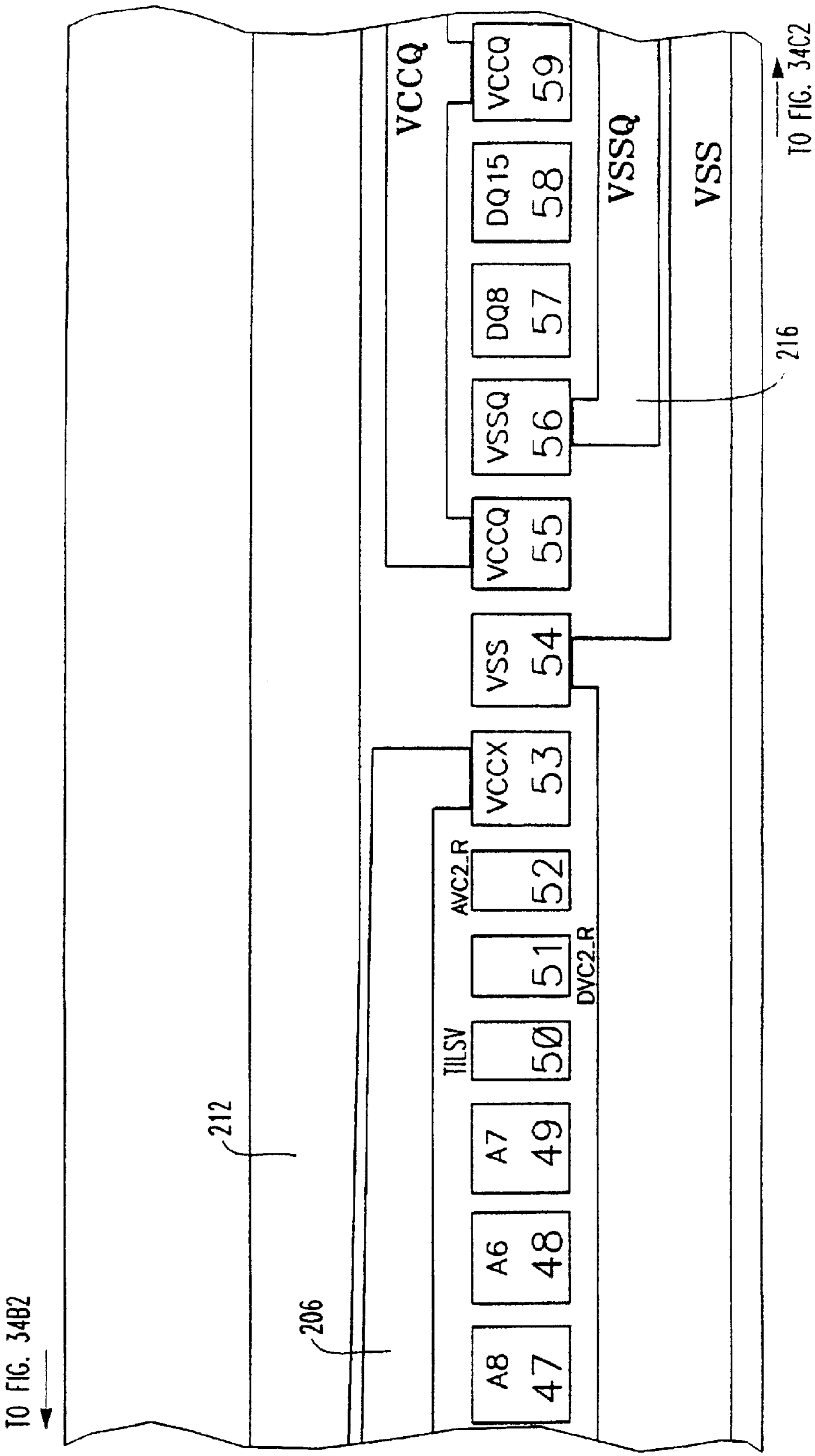
FIG. 34C1

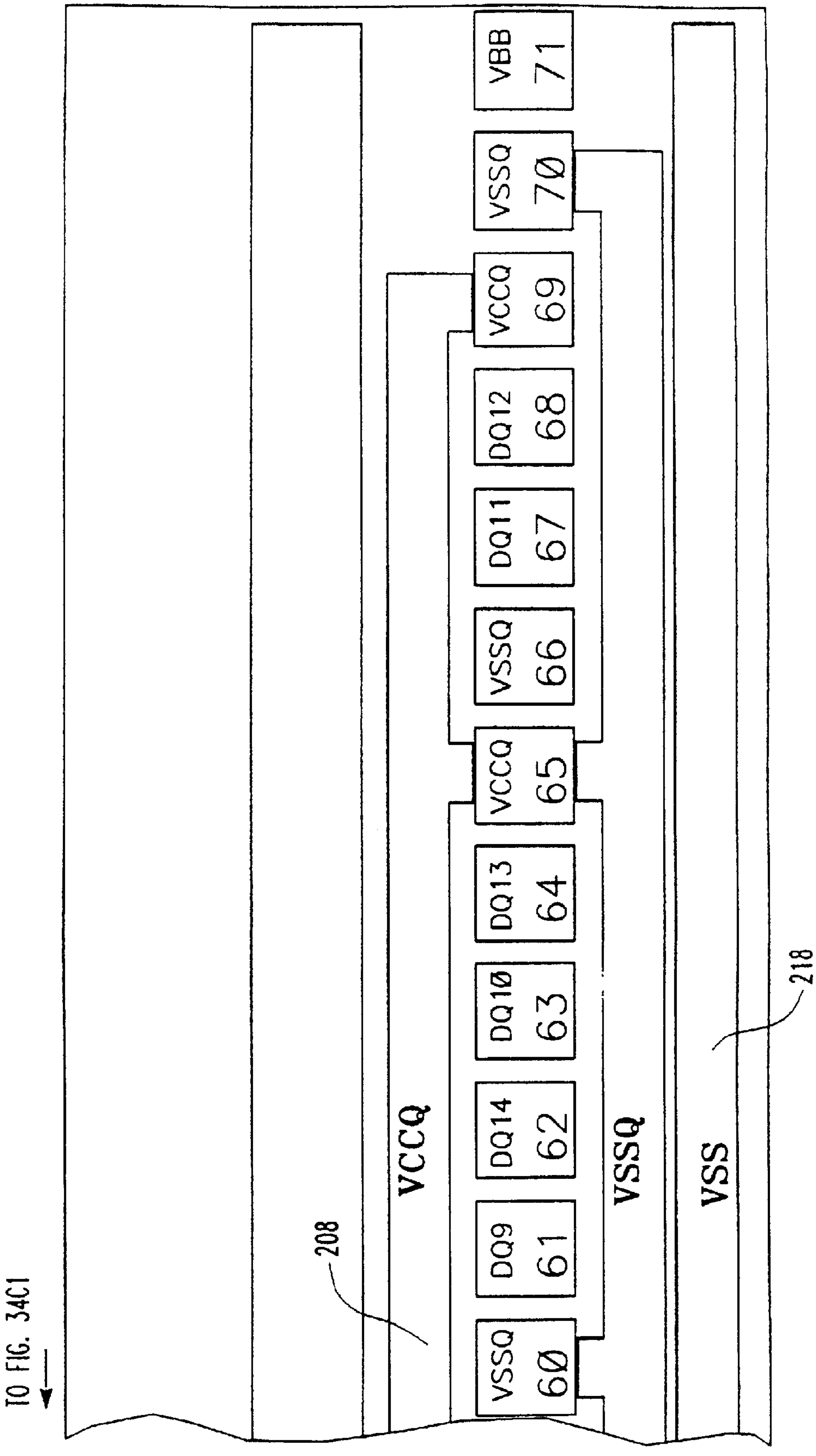
FIG 34C2

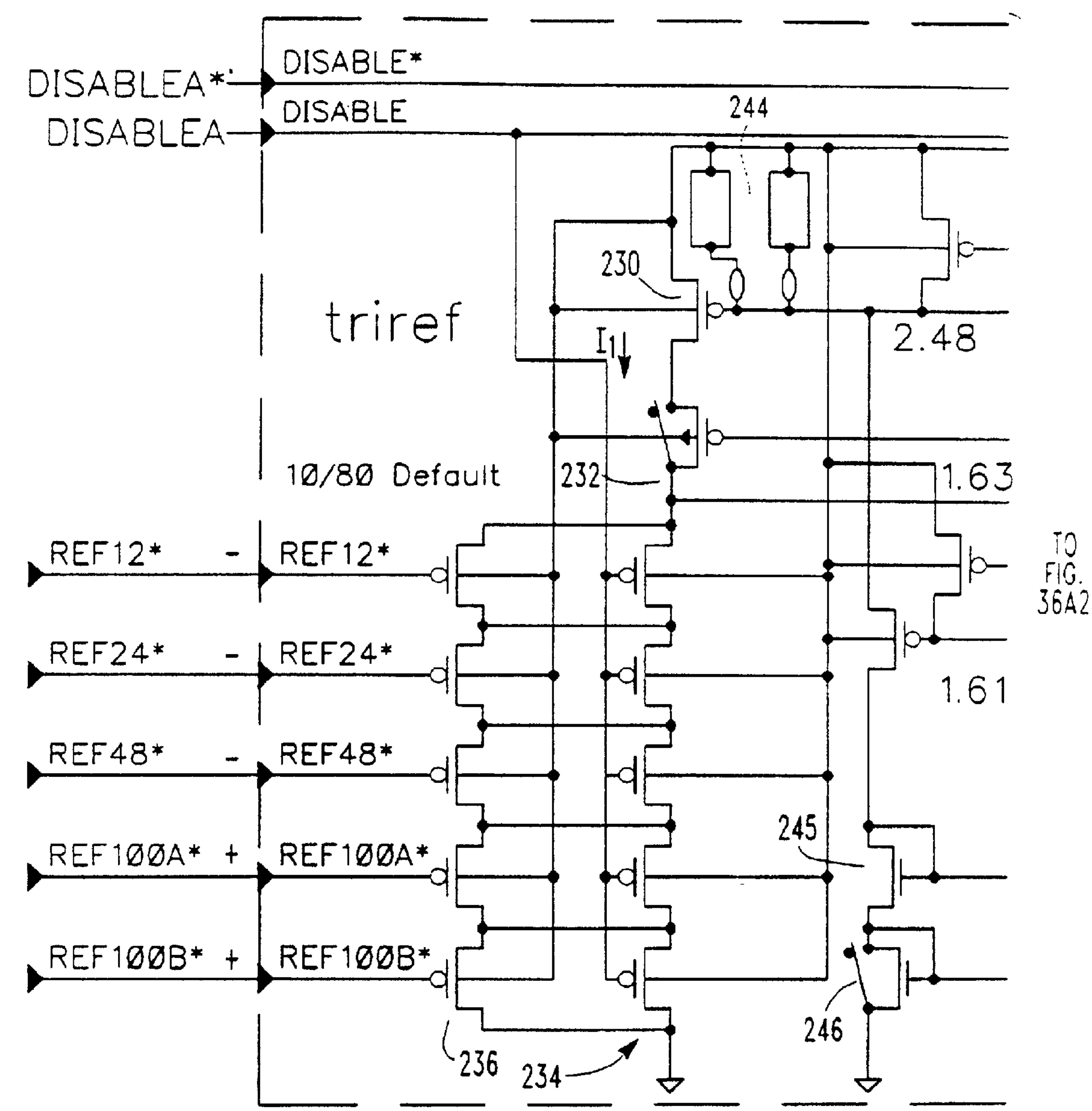
FIG. 36A1

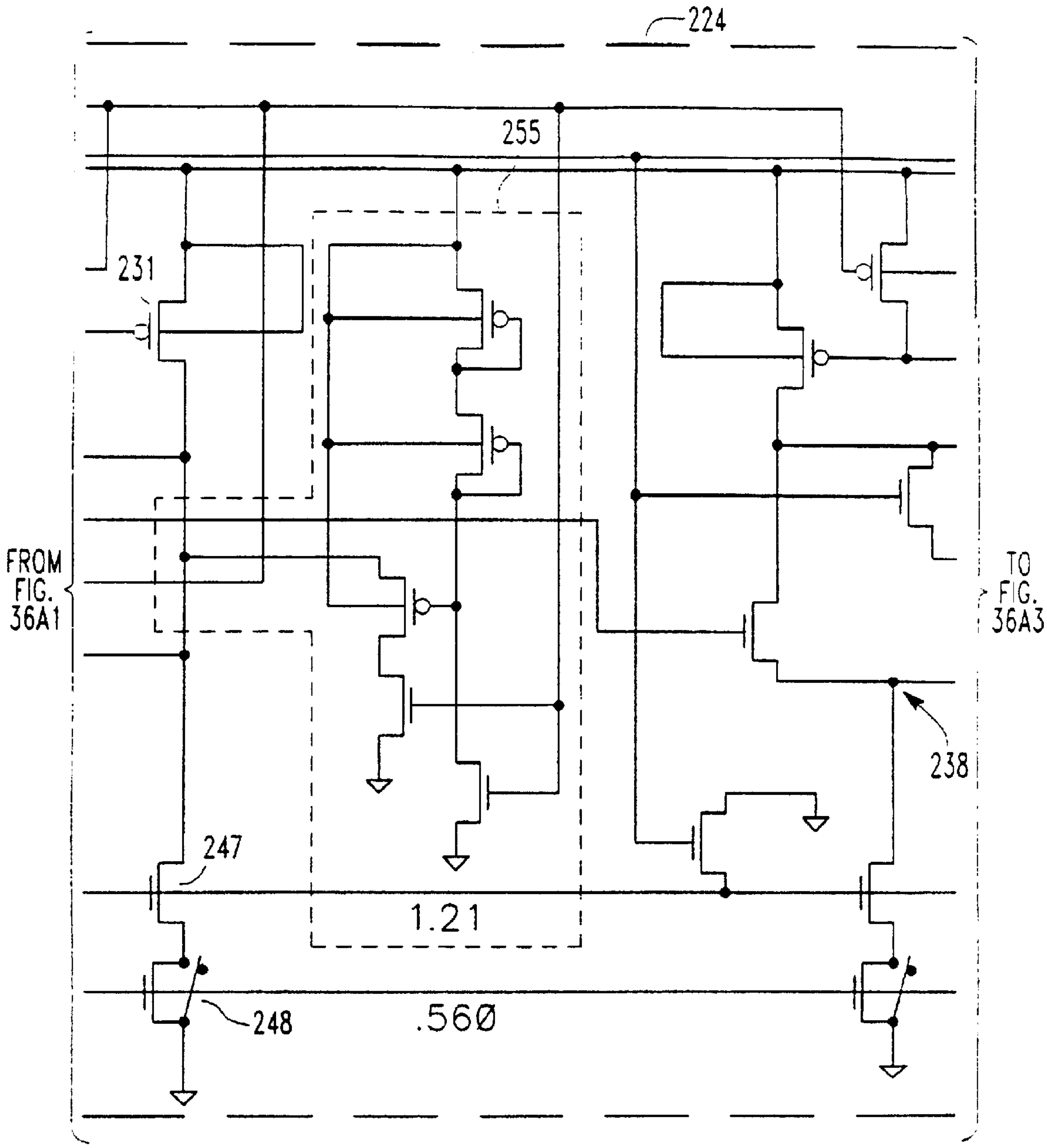
*FIG. 36A2*

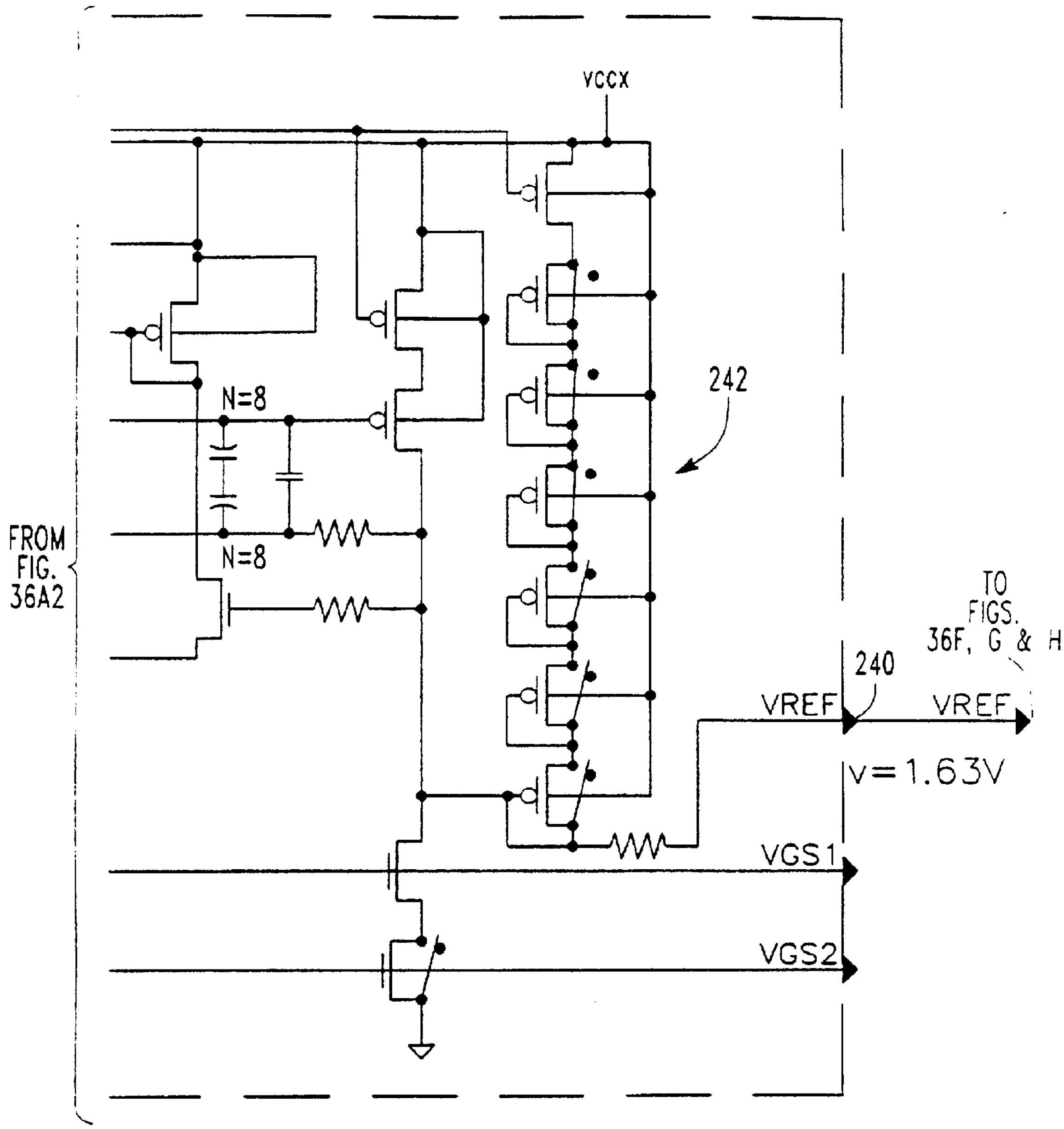
FIG. 36A3

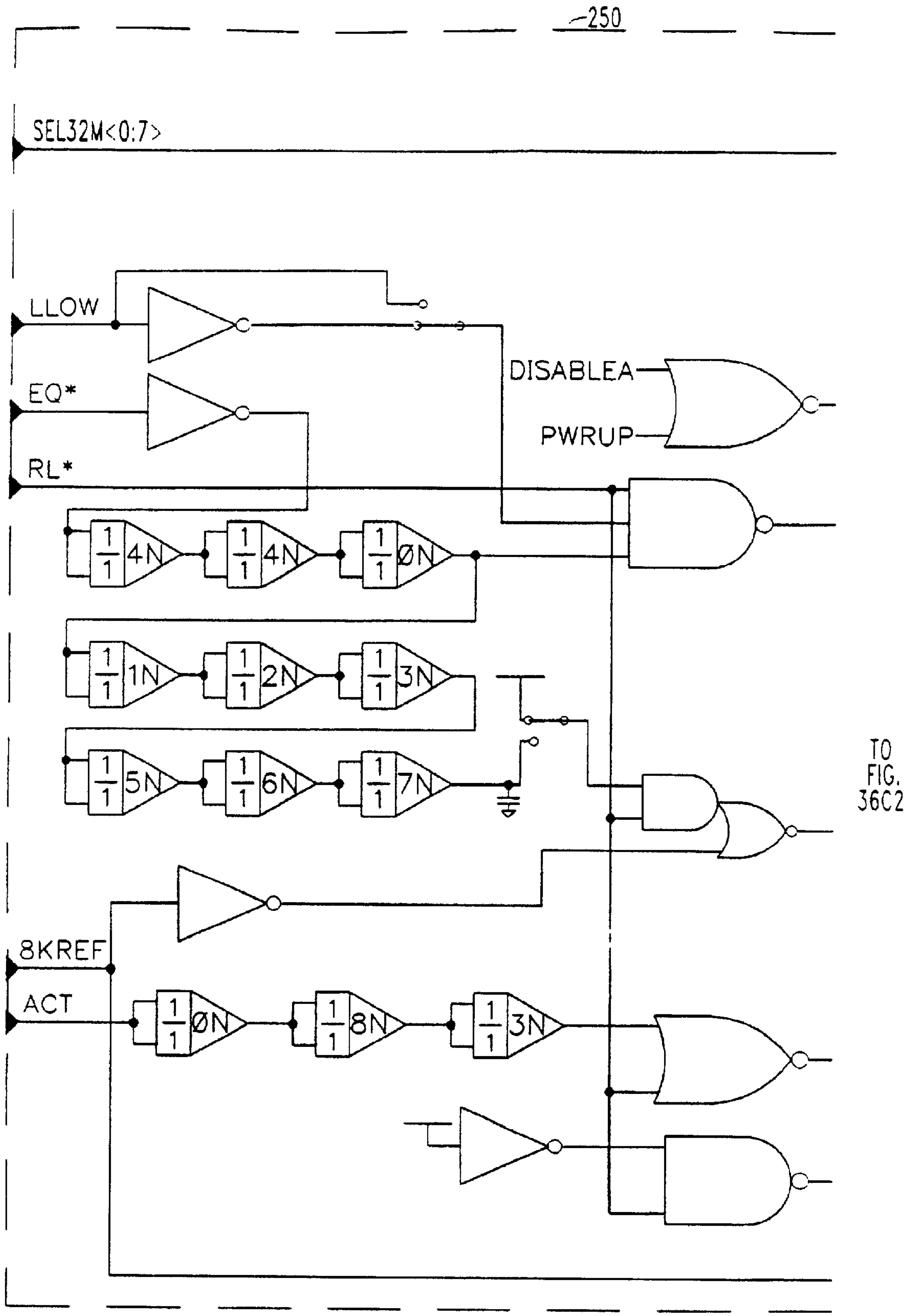
FIG. 36C1

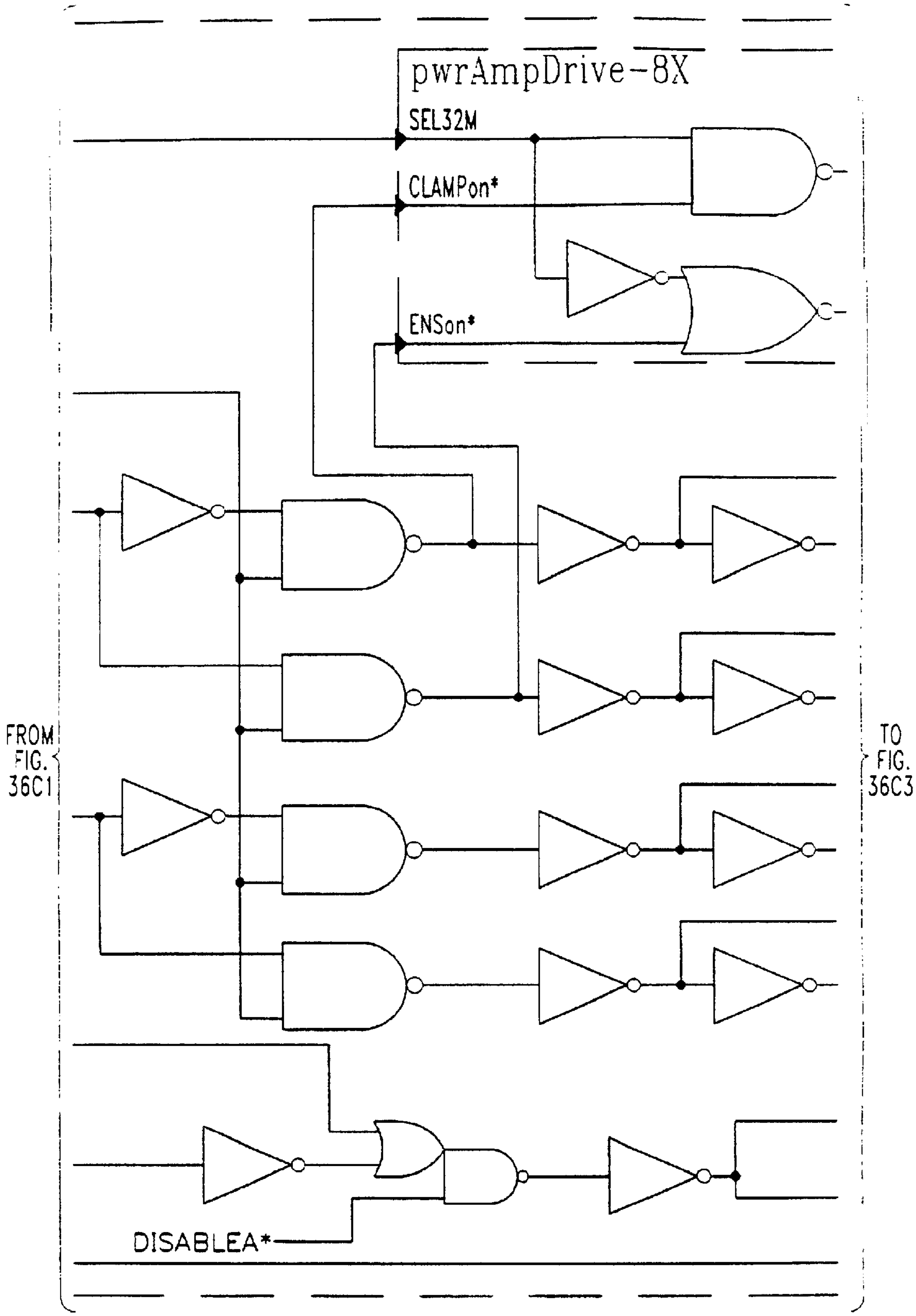
FIG. 36C2

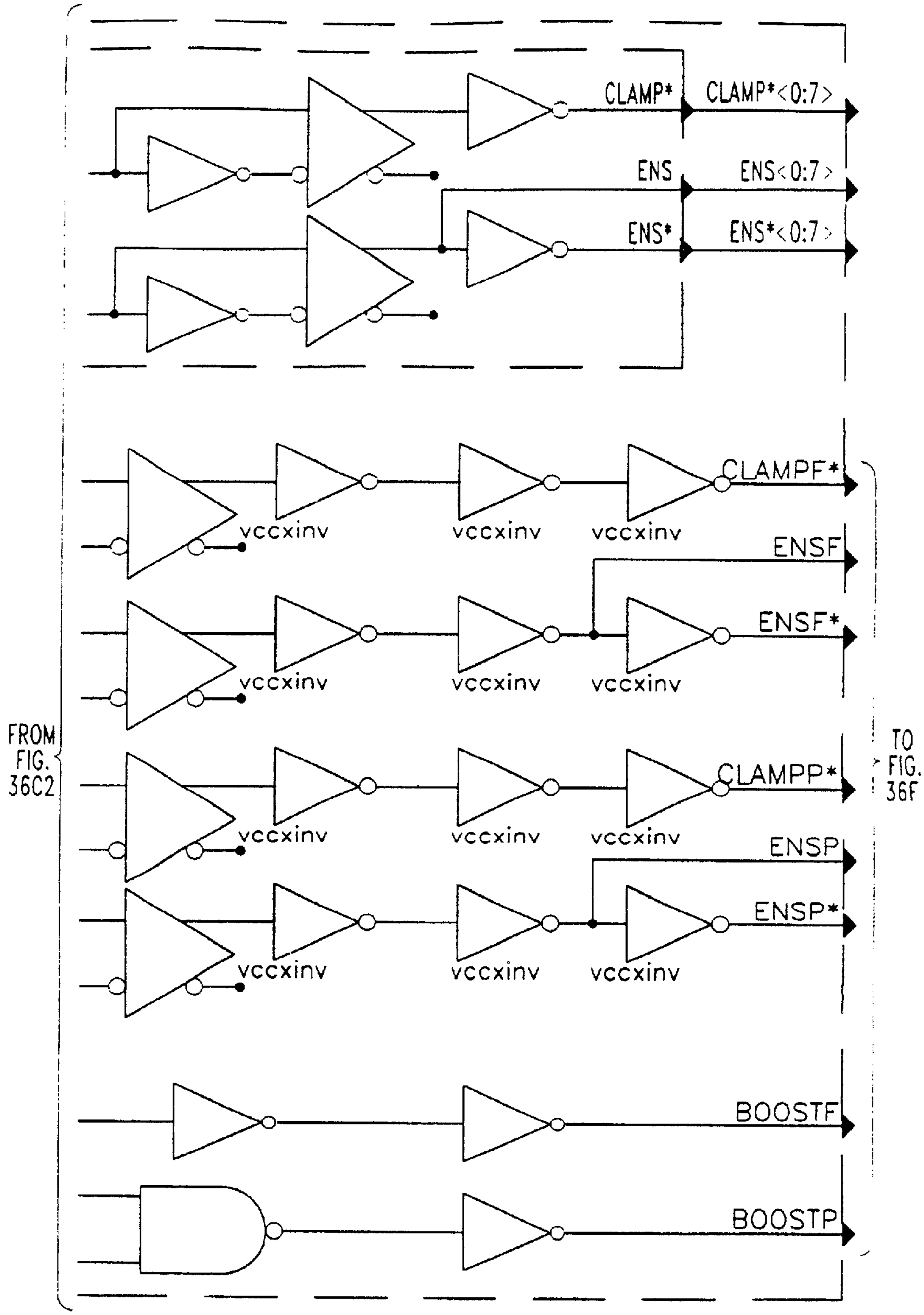
FIG. 36C3

| FIG. 97-1 | FIG. 97-2 |
|---|---|

NOTE THAT PWRRAS* WAITED FOR DVC20KR

256 MEG DYNAMIC RANDOM ACCESS MEMORY

This Application is a divisional application of U.S. application Ser. No. 09/620,606 filed Jul. 20, 2000, which is a divisional application of U.S. application Ser. No. 08/916,692 filed Aug. 22, 1997, which claims the benefit of provisional application 60/050,929 filed May 30, 1997.

BACKGROUND OF THE INVENTION

1. Field of the Invention

The present invention is directed to integrated circuit memory design and, more particularly, to dynamic random access memory (DRAM) designs.

2. Description of the Background

1. Introduction

Random access memories (RAMs) are used in a large number of electronic devices from computers to toys. Perhaps the most demanding applications for such devices are computer applications in which high density memory devices are required to operate at high speeds and low power. To meet the needs of varying applications, two basic types of RAM have been developed. The dynamic random access memory (DRAM) is, in its simplest form, a capacitor in combination with a transistor which acts as a switch. The combination is connected across a digitline and a predetermined voltage with a wordline used to control the state of the transistor. The digitline is used to write information to the capacitor or read information from the capacitor when the signal on the wordline renders the transistor conductive.

In contrast, a static random access memory (SRAM) is comprised of a more complicated circuit which may include a latch. The SRAM architecture also uses digitlines for carrying information to and reading information from each individual memory cell and wordlines to carry control signals.

There are a number of design tradeoffs between DRAM and SRAM devices. Dynamic devices must be periodically refreshed or the data stored will be lost. SRAM devices tend to have faster access times than similarly sized DRAM devices. SRAM devices tend to be more expensive than DRAM devices because the simplicity of the DRAM architecture allows for a much higher density memory to be constructed. For those reasons, SRAM devices tend to be used as cache memory whereas DRAM devices tend to be used to provide the bulk of the memory requirements. As a result, there is tremendous pressure on producers of DRAM devices to produce higher density devices in a cost effective manner.

2. DRAM Architecture

A DRAM chip is a sophisticated device which may be thought of as being comprised of two portions: the array, which is comprised of a plurality of individual memory cells for storing data, and the peripheral devices, which are all of the circuits needed to read information into and out of the array and support the other functions of the chip. The peripheral devices may be further divided into data path elements, address path elements, and all other circuits such as voltage regulators, voltage pumps, redundancy circuits, test logic, etc.

A. The Array

Turning first to the array, the topology of a modern DRAM array 1 is illustrated in FIG. 1. The array 1 is comprised of a plurality of cells 2 with each cell constructed in a similar manner. Each cell is comprised of a rectangular active area, which in FIG. 1 is a N+ active area. A dotted box

3 illustrates where one transistor/capacitor pair is fabricated while a dotted box 4 illustrates where a second transistor/capacitor pair is fabricated. A wordline WL1 runs through dotted box 3, and at least a portion of where that wordline overlays the N+ active area is where the gate of the transistor is formed. To the left of the wordline WL1 in dotted box 3, one terminal of the transistor is connected to a storage node 5 which forms the capacitor. The other terminal of the capacitor is connected to a cell plate. To the right of the wordline WL1, the other terminal of the transistor is connected to a digitline D2 at a digitline contact 6. The transistor/capacitor pair in dotted box 4 is a mirror image of the transistor/capacitor pair in dotted box 3. The transistor within dotted box 4 is connected to its own wordline WL2 while sharing the digitline contact 6 with the transistor in the dotted box 3.

The wordlines WL1 and WL2 may be constructed of polysilicon while the digitline may be constructed of polysilicon or metal. The capacitors may be formed with an oxide-nitride-oxide-dielectric between two polysilicon layers. In some processes, the wordline polysilicon is silicided to reduce the resistance which permits longer wordline segments without impacting speed.

The digitline pitch, which is the width of the digitline plus the space between digitlines, dictates the active area pitch and the capacitor pitch. Process engineers adjust the active area width and the resulting field oxide width to maximize transistor drive and minimize transistor-to-transistor leakage. In a similar manner, the wordline pitch dictates the space available for the digitline contact, transistor length, active area length, field poly width, and capacitor length. Each of those features is closely balanced by process engineers to maximize capacitance and yield and to minimize leakage.

B. The Data Path Elements

The data path is divided into the data read path and the data write path. The first element of the data read path, and the last element of the data write path, is the sense amplifier. The sense amplifier is actually a collection of circuits that pitch up to the digitlines of a DRAM array. That is, the physical layout of each circuit within the sense amplifier is constrained by the digitline pitch. For example, the sense amplifiers for a specific digitline pair are generally laid out within the space of four digitlines. One sense amplifier for every four digitlines is commonly referred to as quarter pitch or four pitch.

The circuits typically comprising the sense amplifier include isolation transistors, circuits for digitline equilibration and bias, one or more N-sense amplifiers, one or more P-sense amplifiers, and I/O transistors for connecting the digitlines to the I/O signal lines. Each of those circuits will be discussed.

Isolation transistors provide two functions. First, if the sense amplifiers are positioned between and connected to two arrays, they electrically isolate one of the two arrays. Second, the isolation transistors provide resistance between the sense amplifier and the highly capacitive digitlines, thereby stabilizing the sense amplifier and speeding up the sensing operation. The isolation transistors are responsive to a signal produced by an isolation driver. The isolation driver drives the isolation signal to the supply potential and then drives the signal to a pumped potential which is equal to the value of the charge on the digit lines plus the threshold voltage of the isolation transistors.

The purpose of the equilibration and bias circuits is to ensure that the digitlines are at the proper voltages to enable a read operation to be performed. The N-sense amplifiers and P-sense amplifiers work together to detect the signal voltage appearing on the digitlines in a read operation and to locally drive the digitlines in a write operation. Finally, the I/O transistors allow data to be transferred between digitlines and I/O signal lines.

After data is read from an mbit and latched by the sense amplifier, it propagates through the I/O transistors onto the I/O signal lines and into a DC sense amplifier. The I/O lines are equilibrated and biased to a voltage approaching the peripheral voltage Vcc. The DC sense amplifier is sometimes referred to as the data amplifier or read amplifier. The DC sense amplifier is a high speed, high gain, differential amplifier for amplifying very small read signals appearing on the I/O lines into full CMOS data signals input to an output data buffer. In most designs, the array sense amplifiers have very limited drive capability and are unable to drive the I/O lines quickly. Because the DC sense amplifier has a very high gain, it amplifies even the slightest separation in the I/O lines into full CMOS levels.

The read data path proceeds from the DC sense amplifier to the output buffers either directly or through data read multiplexers (muxes). Data read muxes are commonly used to accommodate multiple part configurations with a single design. For an ×16 part, each output buffer has access to only one data read line pair. For an ×8 part, the eight output buffers each have two pairs of data lines available thereby doubling the quantity of mbits accessible by each output. Similarly, for a ×4 part, the four output buffers have four pairs of datalines available, again doubling the quantity of mbits available for each output.

The final element in the read data path is the output buffer circuit. The output buffer circuit consists of an output latch and an output driver circuit. The output driver circuit typically uses a plurality of transistors to drive an output pad to a predetermined voltage, Vccx or ground, typically indicating a logic level 1 or logic level 0, respectively.

A typical DRAM data path is bidirectional, allowing data to be both read from and written to the array. Some circuits, however, are truly bidirectional, operating the same regardless of the direction of the data. An example of such bidirectional circuits is the sense amplifiers. Most of the circuits, however, are unidirectional, operating on data in only a read operation or a write operation. The DC sense amplifiers, data read muxes, and output buffer circuits are examples of unidirectional circuits. Therefore, to support data flow in both directions, unidirectional circuits must be provided in complementary pairs, one for reading and one for writing. The complementary circuits provided in the data write path are the data input buffers, data write muxes, and write driver circuits.

The data input buffers consist of both nMOS and pMOS transistors, basically forming a pair of cascaded inverters. Data write muxes, like data read muxes, are often used to extend the versatility of a design. While some DRAM designs connect the input buffer directly to the write driver circuits, most architectures place a block of data write muxes between the input buffers and the write drivers. The muxes allow a given DRAM design to support multiple configurations, such as ×4, ×8, and ×16 parts. For ×16 operation, each input buffer is muxed to only one set of data write lines. For ×8 operation, each input buffer is muxed to two sets of data write lines, doubling the quantity of mbits available to each input buffer. For ×4 operation, each input buffer is muxed to four sets of data writelines, again doubling the number of mbits available to the remaining four operable input buffers. As the quantity of input buffers is reduced, the amount of column address space is increased for the remaining buffers.

A given write driver is generally connected to only one set of I/O lines, unless multiple sets of I/O lines are fed by a single write driver via additional muxes. The write driver uses a tri-state output stage to connect to the I/O lines. Tri-state outputs are necessary because the I/O lines are used for both read and write operations. The write driver remains in a high impedance state unless the signal labeled "write" is high, indicating a write operation. The drive transistors are sized large enough to insure a quick, efficient, write operation.

The remaining element of the data write path is, as mentioned, the bidirectional sense amplifier which is connected directly to the array.

C. The Address Path Elements

Up to this point we have been discussing data paths. The movement of data into or out of a particular location within the array is performed under the control of address information. We next turn to a discussion of the address path elements.

Since the 4 Kb generation of DRAMs, DRAMs have used multiplexed addresses. Multiplexing in DRAMs is possible because DRAM operation is sequential. That is, column operations follow row operations. Thus, the column address is not needed until the sense amplifiers for an identified row have latched, and that does not occur until sometime after the wordline has fired. DRAMs operate at higher current levels with multiplexed addressing, because an entire page (row address) is opened with each row access. That disadvantage is overcome by the lower packaging costs associated with multiplexed addresses. Additionally, because of the presence of the column address strobe signal (CAS*), column operation is independent of row operation, enabling a page to remain open for multiple, high-speed, column accesses. That page mode type of operation improves system performance because column access time is much shorter than row access time. Page mode operation appears in more advanced forms, such as extended data out (EDO) and burst EDO (BEDO), providing even better system performance through a reduction in effective column access time.

The address path for a DRAM can be broken into two parts: the row address path and the column address path. The design of each path is dictated by a unique set of requirements. The address path, unlike the data path, is unidirectional. That is, address information flows only into the DRAM. The address path must achieve a high level of performance with minimal power and die area, just like every other aspect of DRAM design. Both paths are designed to minimize propagation delay and maximize DRAM performance.

The row address path encompasses all of the circuits from the address input pad to the wordline driver. Those circuits generally include the row address input buffers, CAS before RAS counter (CBR counter), predecode logic, array buffers, redundancy logic (treated separately hereinbelow), row decoders, and phase drivers.

The row address buffer consists of a standard input buffer and the additional circuits necessary to implement functions required for the row address path. The CBR counter consists of a single inverter and a pair of inverter latches coupled to a pair of complementary muxes to form a one bit counter. All of the CBR counters from each row address buffer are cascaded together to form a CBR ripple counter. By cycling through all possible row address combinations in a minimum of clock pulses, the CBR ripple counter provides a simple means of internally generating refresh addresses.

There are many types of predecode logic used for the row address path. Predecoded address lines may be formed by logically combining (AND) addresses as shown in Table 1.

TABLE 1

Predecoded address truth table

| RA<0> | RA<1> | PR01 (n) | PR01<0> | PR01<1> | PR01<2> | PR01<3> |
|---|---|---|---|---|---|---|
| 0 | 0 | 0 | 1 | 0 | 0 | 0 |
| 1 | 0 | 1 | 0 | 1 | 0 | 0 |
| 0 | 1 | 2 | 0 | 0 | 1 | 0 |
| 1 | 1 | 3 | 0 | 0 | 0 | 1 |

The remaining addresses are identically coded except for RA<12>, which is essentially a "don't care". Advantages to predecoded addresses include lower power due to fewer signals making transitions during address changes and higher efficiency because of the reduced number of transistors necessary to decode addresses. Predecoding is especially beneficial in redundancy circuits. Predecoded addresses are used throughout most DRAM designs today.

Array buffers drive the predecoded address signals into the row decoders. In general, the buffers are no more than cascaded inverters, but in some cases they may include static logic gates or level translators, depending upon the row decoder requirements.

Row decoders must pitch up to the mbit arrays. There are a variety of implementations, but however implemented, the row decoder essentially consists of two elements: a wordline driver and an address decoder tree. With respect to the wordline driver, there are three basic configurations: the NOR driver, the inverter (CMOS) driver, and the bootstrap driver. Just about any type of logic may be used for the address decoder tree. Static logic, dynamic logic such as precharge and evaluate logic, pass gate logic, or some combination thereof may be provided to decode the predecoded address signals. Additionally, the drivers and associated decode trees can be configured either as local row decodes for each array section or as global row decodes that drive a multitude of array sections.

The wordline driver in the row decoder causes the wordline to fire in response to a signal called PHASE. Essentially, the PHASE signal is the final address term to arrive at the wordline driver. Its timing is carefully determined by the control logic. PHASE cannot fire until the row addresses are set up in the decode tree. Normally, the timing of PHASE also includes enough time for the row redundancy circuits to evaluate the current address. The phase driver can be composed of standard static logic gates.

The column address path consists of the input buffers, address transition detection (ATD) circuits, predecode logic, redundancy logic (discussed below), and column decoders. The column address input buffers are similar in construction and operation to the row address input buffers. The ATD circuit detects any transition that occurs on an address pin to which the circuit is dedicated. ATD output signals from all of the column addresses are routed to an equilibration driver circuit. The equilibration driver circuit generates a set of equilibration signals for the DRAM. The first of these signals is Equilibrate I/O (EQIO) which is used in the arrays to force equilibration of the I/O lines. The second signal generated by the equilibration driver is called Equilibrate Sense Amps (EQSA). That signal is generated from address transitions occurring on all of the column addresses, including the least significant address.

The column addresses are fed into predecode logic which is very similar to the row address predecode logic. The address signals emanating from the predecode logic are buffered and distributed throughout the die to feed the column decoders.

The column decoders represent the final elements that must pitch up to the array mbits. Unlike row decoder implementation, though, column decoder implementation is simple and straightforward. Static logic gates may be used for both the decode tree elements and the driver output. Static logic is used primarily because of the nature of column addressing. Unlike row addressing, which occurs once per RAS* cycle with a modest precharge period until the next cycle, column addressing can occur multiple times per RAS* cycle. Each column is held open until a subsequent column appears. In a typical implementation, the address tree consists of combinations of NAND or NOR gates. The column decoder output driver is a simple CMOS inverter.

The row and column addressing scheme impacts the refresh rate for the DRAM. Normally, when refresh rates change for a DRAM, a higher order address is treated as a "don't care" address, thereby decreasing the row address space, but increasing the column address space. For example, a 16 Mb DRAM bonded as a 4 Mb ×4 part could be configured in several refresh rates: 1K, 2K, and 4K. Table 1 below shows how row and column addressing is related to those refresh rates for the 16 Mb example. In this example, the 2K refresh rate would be more popular because it has an equal number of row and column addresses, sometimes referred to as square addressing.

TABLE 2

Refresh rate versus row and column addresses

| Refresh Rate | Rows | Columns | Row Addresses | Column Addresses |
|---|---|---|---|---|
| 4K | 4096 | 1024 | 12 | 10 |
| 2K | 2048 | 2048 | 11 | 11 |
| 1K | 1024 | 4096 | 10 | 12 |

D. Other Circuits

Additional circuits are provided to enable various other features. For example, circuits to enable test modes are typically included in DRAM designs to extend test capabilities, speed component testing, or subject a part to conditions that are not seen during normal operation. Two examples are address compression and data compression which are two special test modes usually supported by the design of the data path. Compression test modes yield shorter test times by allowing data from multiple array locations to be tested and compressed on-chip, thereby reducing the effective memory size. The costs of any additional circuitry to implement test modes must be balanced against cost benefits derived from reductions in test time. It is also important that operation in test mode achieve 100% correlation to operation of non-test mode. Correlation is often difficult to achieve, however, because additional circuitry must be activated during compression, modifying the noise and power characteristics on the die.

Additional circuitry is added to the DRAM to provide redundancy. Redundancy has been used in DRAM designs since the 256 Kb generation to improve yield. Redundancy involves the creation of spare rows and columns which can be used as a substitute for normal rows and columns, respectively, which are found to be defective. Additional circuitry is provided to control the physical encoding which enables the substitution of a usable device for a defective device. The importance of redundancy has continued to increase as memory density and size have increased.

The concept of row redundancy involves replacing bad wordlines with good wordlines. The row to be repaired is not physically replaced, but rather it is logically replaced. In essence, whenever a row address is strobed into a DRAM by RAS*, the address is compared to the addresses of known bad rows. If the address comparison produces a match, then a replacement wordline is fired in place of the normal (bad) wordline. The replacement wordline can reside anywhere on the DRAM. Its location is not restricted to the array that contains the normal wordline, although architectural considerations may restrict its range. In general, the redundancy is considered local if the redundant wordline and normal wordline must always be on the same subarray.

Column redundancy is a second type of repair available in most DRAM designs. Recall that column accesses can occur multiple times per RAS* cycle. Each column is held open until a subsequent column appears. Because of that, circuits that are very different from those seen in the row redundancy are used to implement column redundancy.

The DRAM circuit also carries a number of circuits for providing the various voltages used throughout the circuit.

3. Design Considerations

U.S. patent application Ser. No. 08/460,234, entitled Single Deposition Layer Metal Dynamic Random Access Memory, filed 17 Aug. 1995 and assigned to the same assignee as the present invention is directed to a 16 Meg DRAM. U.S. patent application Ser. No. 08/420,943, entitled Dynamic Random Access Memory, filed 4 Jun. 1995 and assigned to the same assignee as the present invention is directed to a 64 Meg DRAM. As will be seen from a comparison of the two aforementioned patent applications, it is not a simple matter to quadruple the size of a DRAM. Quadrupling the size of a 64 Meg DRAM to a 256 Meg DRAM poses a substantial number of problems for the design engineer. For example, to standardize the part so that 256 Meg DRAMs from different manufacturers can be interchanged, a standard pin configuration has been established. The location of the pins places constraints on the design engineer with respect to where circuits may be laid out on the die. Thus, the entire layout of the chip must be reengineered so as to minimize wire runs, eliminate hot spots, simplify the architecture, etc.

Another problem faced by the design engineer in designing a 256 Meg DRAM is the design of the array itself. Using prior art array architectures does not provide sufficient space for all of the components which must pitch up to the array.

Another problem involves the design of the data path. The data path between the cells and the output pads must be as short as possible so as to minimize line lengths to speed up part operation while at the same time present a design which can be manufactured using existing processes and machines.

Another problem faced by the design engineer involves the issue of redundancy. A 256 Meg DRAM requires the fabrication of millions of individual devices, and millions of contacts and vias to enable those devices to be interconnected. With such a large number of components and interconnections, even a very small failure rate results in a certain number of defects per die. Accordingly, it is necessary to design redundancy schemes to compensate for such failures. However, without practical experience in manufacturing the part and learning what failures are likely to occur, it is difficult to predict the type and amount of redundancy which must be provided.

Another problem involves latch-up in the isolation driver circuit when the pumped potential is driven to ground. Latch-up occurs when parasitic components give rise to the establishment of low-resistance paths between the supply potential and ground. A large amount of current flows along the low-resistance paths and device failure may result.

Designing the on-chip test capability also presents problems. Test modes, as opposed to normal operating modest are used to test memory integrated circuits. Because of the limited number of pins available and the large number of components which must be tested, without some type of test compression architecture, the time which each DRAM would have to spend in a test fixture would be so long as to be commercially unreasonable. It is known to use test modes to reduce the amount of time required to test the memory integrated circuit, as well as to ensure that the memory integrated circuit meets or exceeds performance requirements. Putting a memory integrated circuit into a test mode is described in U.S. Pat. No. 5,155,704, entitled “Memory Integrated Circuit Test mode Switching” to Walther et al. However, because the test mode operates internal to the memory, it is difficult to determine whether the memory integrated circuit successfully completed one or more test modes. Therefore, a need exists for providing a solution to verify successful or unsuccessful execution of a test mode. Furthermore, it would be desirable that such a solution have minimal impact with respect to additional circuitry. Certain test modes, such as the all row high test mode, must be rethought with respect to a part as large as a 256 Meg chip because the current required for such a test would destroy power transistors servicing the array.

Providing power for a chip as large as a 256 Meg DRAM also presents its own set of unique problems. Refresh rates may cause the power needed to vary greatly. Providing voltage pumps and generators of sufficient size to provide the necessary power may result in noise and other undesirable side effects when maximum power is not required. Additionally, reconfiguring the DRAM to achieve a usable part in the event of component failure may result in voltage pumps and generators ill sized for the smaller part.

Even something as basic as powering up the device must be rethought in the context of such a large and complicated device as a 256 Meg DRAM. Prior art timing circuits use an RC circuit to wait a predetermined period of time and then blindly bring up the various voltage pumps and generators. Such systems do not receive feedback and, therefore, are not responsive to problems during power up. Also, to work reliably, such systems are conservative in the event some voltage pumps or generators operated more slowly than others. As a result, in most cases, the power up sequence was more time consuming than it needed to be. In a device as complicated as a 256 Meg DRAM, it is necessary to ensure that the device powers up in a manner that permits the device to be properly operated in a minimum amount of time.

All of the foregoing problems are superimposed upon the problems which every memory design engineer faces such as satisfying the parameters set for the memory, e.g., access time, power consumption, etc., while at the same time laying out each and every one of millions of components and interconnections in a manner so as to maximize yield and minimize defects. Thus, the need exists for a 256 Meg DRAM which overcomes the foregoing problems.

SUMMARY OF THE INVENTION

The present invention is directed to a 256 Meg DRAM, although those of ordinary skill in the art will recognize that the circuits and architecture disclosed herein may be used in memory devices of other sizes or even other types of circuits.

The present invention is directed to a memory device comprised of a triple polysilicon, double metal main array of 256 Meg. The main array is divided into four array quadrants each of 64 Meg. Each of the array quadrants is broken up into two 32 Meg array blocks. Thus, there are eight 32 Meg array blocks in total. Each of the 32 Meg array blocks consists of 128 256 k bit subarrays. Thus, there are 1,024 256 k bit subarrays in total. Each 32 Meg array block features sense amp strips with single p-sense amps and boosted wordline voltage Vccp isolation transistors. Local row decode drivers are used for wordline driving and to provide "streets" for dataline routing to the circuits outside of the array. The I/O lines which route through the sense amps extend across two subarray blocks. That permits a 50% reduction in the number of data muxes required in the gap cells. The data muxes are carefully programmed to support the firing of two rows per 32 Meg block without data contention on the data lines. Additionally, the architecture of the present invention routes the redundant wordline enable signal though the sense amp in metal two to ensure quick deselect of the normal row. The normal phase lines are rematched to appropriate redundant wordline drivers for efficient reuse of signals.

Also, the data paths for reading information into and writing information out of the array have been designed to minimize the length of the data path and increase overall operational speed. In particular, the output buffers in the read data path include a self-timed path to ensure that the holding transistor connected between the boosted voltage Vccp and a boot capacitor is turned off before the boot capacitor is unbooted. That modification ensures that charge is not removed from the Vccp source when turning off a logic "1" level.

The power busing scheme of the present invention is based upon central distribution of voltages from the pads area. On-chip voltage supplies are distributed throughout the center pads area for generation of both peripheral power and array power. The array voltage is generated in the center of the design for distribution to the arrays from a central web. Bias and boosted voltages are generated on either side of the regulator producing the array voltage for distribution throughout the tier logic. The web surrounds each 32 Meg array block for efficient, low-resistant distribution. The 32 Meg arrays feature fully gridded power distribution for better IR and electromigration performance.

Redundancy schemes have been built into the design of the present invention to enable global as well as local repair.

The present invention includes a method and apparatus for providing contemporaneously generated (status) information or programmed information. In particular, address information may be used as a test key. A detect circuit, in electrical communication with decoding circuits, receives an enable signal which activates the detection of a non-standard or access voltage. By non-standard or access voltage it is meant that a voltage outside of the logic level range (e.g., transistor-transistor logic) is used for test logic. The decoding circuit uses the address information as a vector to access a selected type or types of information. With such a vector, a bank, having information stored therein, may be selected from a plurality of banks, and a bit or bits within the selected bank may be accessed. Depending on the test mode selected, either programmed information or status information will be accessed. The decoding circuits and the detect circuit are in electrical communication with a select circuit for selecting between test mode operation and standard memory operation (e.g., a memory read operation).

The power and voltage requirements of a 256 Meg DRAM prevent entering the all row high test in the manner used in other, smaller DRAMs. To reduce the current requirements, in the present invention only subsets of the rows are brought high at a time. The timing of those subsets of rows is handled by cycling CAS. The CAS before RAS (CBR) counter, or another counter, may be used to determine which subset of rows is brought high on each CAS cycle. Various test compression features are also designed into the architecture.

The present invention also includes a powerup sequence circuit to ensure that a powerup sequence occurs in the right order. Inputs to the sequence circuit are the current levels of the voltage pumps, the voltage generator, the voltage regulator, and other circuitry important to correctly powerup the part. The logic to control the sequence circuit may be constructed using analog circuitry and level detectors to ensure a predictable response at low voltages. The circuitry may also handle power glitches both during and after initial powerup.

The 32 Meg array blocks comprising the main array can each be shut down if the quantity of failures or the extent of the failures exceed the array block's repair capability. That shutdown is both logical and physical. The physical shutdown includes removing power such as the peripheral voltage Vcc, the digitline bias voltage DVC2, and the wordline bias voltage Vccp. The switches which disconnect power from the block must, in some designs, be placed ahead of the decoupling capacitors for that block. Therefore, the total amount of decoupling capacitance available on the die is reduced with each array block that is disabled. Because the voltage regulator's stability can in large part be dependant upon the amount of decoupling capacitance available, it is important that as 32 Meg array blocks are disabled, a corresponding voltage regulator section be similarly disabled. The voltage regulator of the present invention has a total of twelve power amplifiers. For eight of the twelve, one of the eight is associated with one of the eight array blocks. The four remaining power amplifiers are associated with decoupling capacitors not effected by the array switches. Furthermore, because the total load current is reduced with each 32 Meg array block that is disconnected, the need for the additional power amplifiers is also reduced.

The present invention also incorporates address remapping to ensure contiguous address space for the partial die. That design realizes a partial array by reducing the address space rather than eliminating DQs.

The present invention also includes a unique on-chip voltage regulator. The power amplifiers of the voltage regulator have a closed loop gain of 1.5. Each amplifier has a boost circuit which increases the amplifier's slew rate by increasing the differential pair bias current. The design includes additional amplifiers that are specialized to operate when the pumps fire and a very low Icc standby amplifier. The design allows for multiple refresh operations by enabling additional amplifiers as needed.

The present invention also includes a tri-region voltage reference which utilizes a current related to the externally supplied voltage Vccx in conjunction with an adjustable (trimmable) pseudo diode stack to generate a stable low voltage reference.

The present invention also includes a unique design of a Vccp voltage pump which is configurable for various refresh options. The 256 Meg chip requires 6.5 mA of Iccp current in the 8 k refresh mode and over 12.8 mA in the 4 k refresh mode. That much variation in load current is best managed by bringing more pump sections into operation for the 4 k refresh mode. Accordingly, the design of the Vccp voltage pump of the present invention uses three pump circuits for 8 k and six pump circuits for 4 k refresh mode. The use of six pump circuits for the 8 k mode is unacceptable from a noise standpoint and actually produces excessive Vccp ripple when the pumps are so lightly loaded.

The present invention also includes a unique DVC2 cellplate/digitline bias generator with an output status sensor. The powerup sequence circuit previously described requires that each power supply be monitored as to its status when powering up. The DVC2 generator constructed according to the teachings of the present invention allows its status to be determined through the use of both voltage and current sensing. The voltage sensing is a window detector which determines if the output voltage is one Vt above ground Vss and one Vt below the array voltage Vcca. The current sensing is based upon measuring changes in the output current as a function of time. If the output current reaches a stable steady state level, the current sensor indicates a steady state condition. Additionally, a DC current monitor is present which determines if the steady state current exceeds a preset threshold. The output of the DC current monitor can either be used in the powerup sequence or to identify row to column or cellplate to digitline shorts in the arrays. Following completion of the powerup sequence, the sensor output status is disabled.

The present invention also includes devices to support partial array power down of the isolation driver circuit. The devices ensure that no current paths are produced when the voltage Vccp, which is used to control the isolation transistors, is driven to ground and, thus, latch-up is avoided. Also, the devices ensure that all components in the isolation driver that are connected to the voltage Vccp are disabled when the driver is disabled.

The architecture and circuits of the present invention represent a substantial advance over the art. For example, the array architecture represents an improvement for several reasons. One, the data is routed directly to the peripheral circuits which shortens the data path and speeds part operation. Second, doubling the I/O line length simplifies gap cell layout and provides the framework for 4 k operation, i.e., two rows of the 32 Meg block. Third, sending the Red signal through the sense amps provides for faster operation, and when combined with PHASE signal remapping, a more efficient design is achieved.

The improved output buffer used in the data path of the present invention lowers Iccp current when the buffer turns off a logic "1" level.

The unique power busing layout of the present invention efficiently uses die size. Central distribution of array power is well suited to the 256 Meg DRAM design. Alternatives in which regulators are spread around the die require that the external voltage Vccx be routed extensively around the die. That results in inefficiencies and requires a larger die.

Other advantages that flow from the architecture and circuits of the present invention include the following. The generation of status information allows us to confirm that the port is still in the desired test mode at the end of a test mode cycle and allows us to check every possible test mode. Combining this with fuse ID information reduces the area penalty. During the all row high test mode, the timing of the rows can be controlled better using the CAS cycle. Also, the number of row subsets that can be brought high can be greater than four. The powerup sequence circuit provides for more foolproof operation of the DRAM. The powerup sequence circuit also handles power glitches both during powerup and during normal operation. The disabling of 32 Meg array blocks together with their corresponding voltage regulator section, while maintaining a proper ratio of output stages to decoupling capacitance, ensures voltage regulator stability despite changes in part configuration stemming from partial array implementation. The on-chip voltage regulator provides low standby current, improved operating characteristics over the entire operating range, and better flexibility. The adjustable, tri-region voltage reference produces a voltage in a manner that ensures that the output amplifiers (which have gain) will operate linearly over the entire voltage range. Furthermore, moving the gain to the output amplifiers improves common mode range and overall voltage characteristics. Also, the use of pMOS diodes creates the desired burn-in characteristics. The variable capacity voltage pump circuit, in which capacity is brought on line only when needed, keeps operating current to the level needed depending upon the refresh mode, and also lowers noise level in the 8 k refresh mode. The cellplate/digitline bias generator allows the determination of the DVC2 status in support of the powerup sequence circuit. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

256 Meg DRAM Architecture (See Section II)

Figure 2:
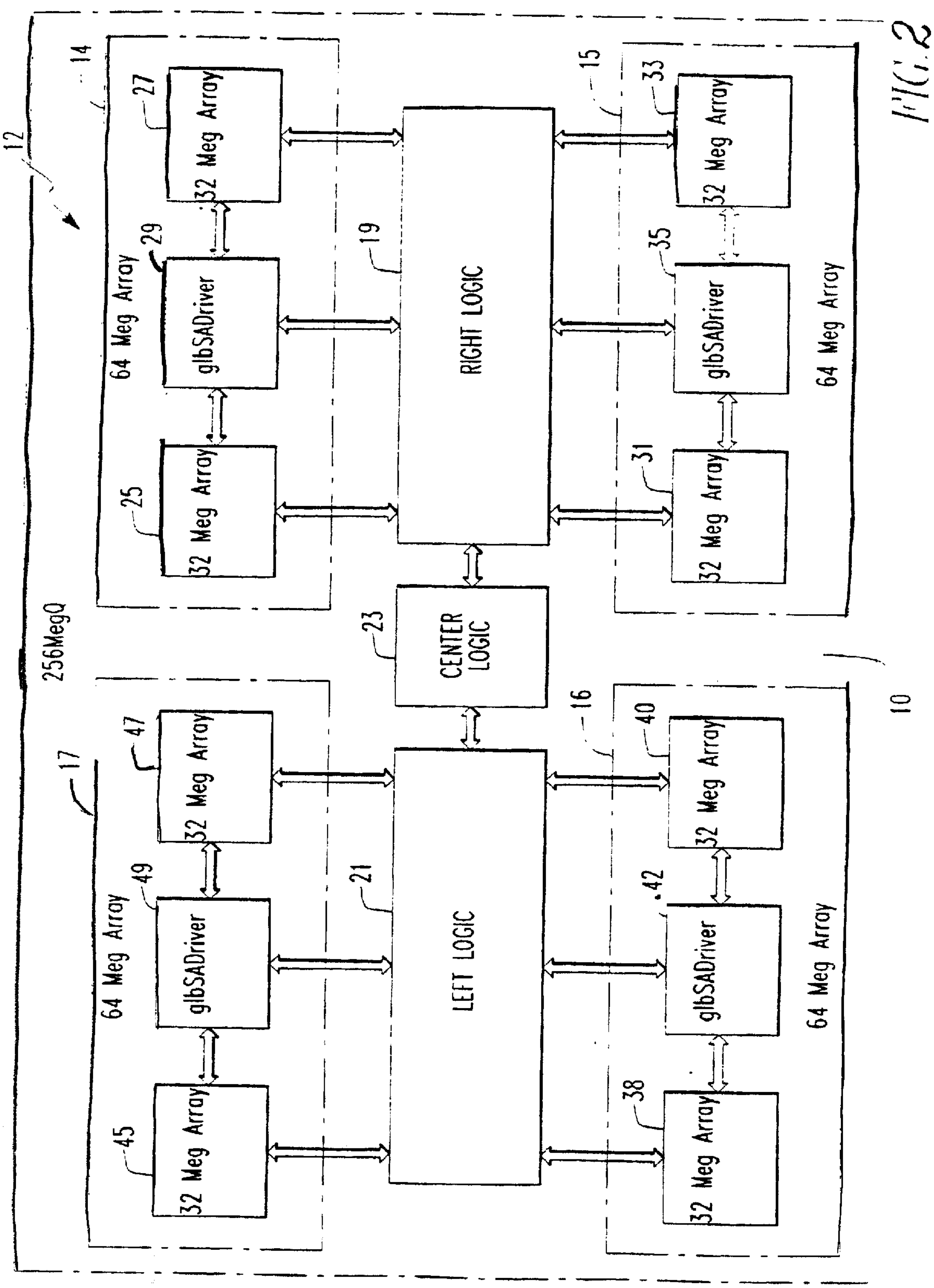

FIG. 2 is a block diagram illustrating a 256 Meg DRAM constructed according to the teachings of the present invention;

FIGS. 3A–3E illustrate one of the four 64 Meg arrays which comprise the 256 Meg DRAM found in FIG. 2;

Array Architecture (See Section III)

Figure 4:
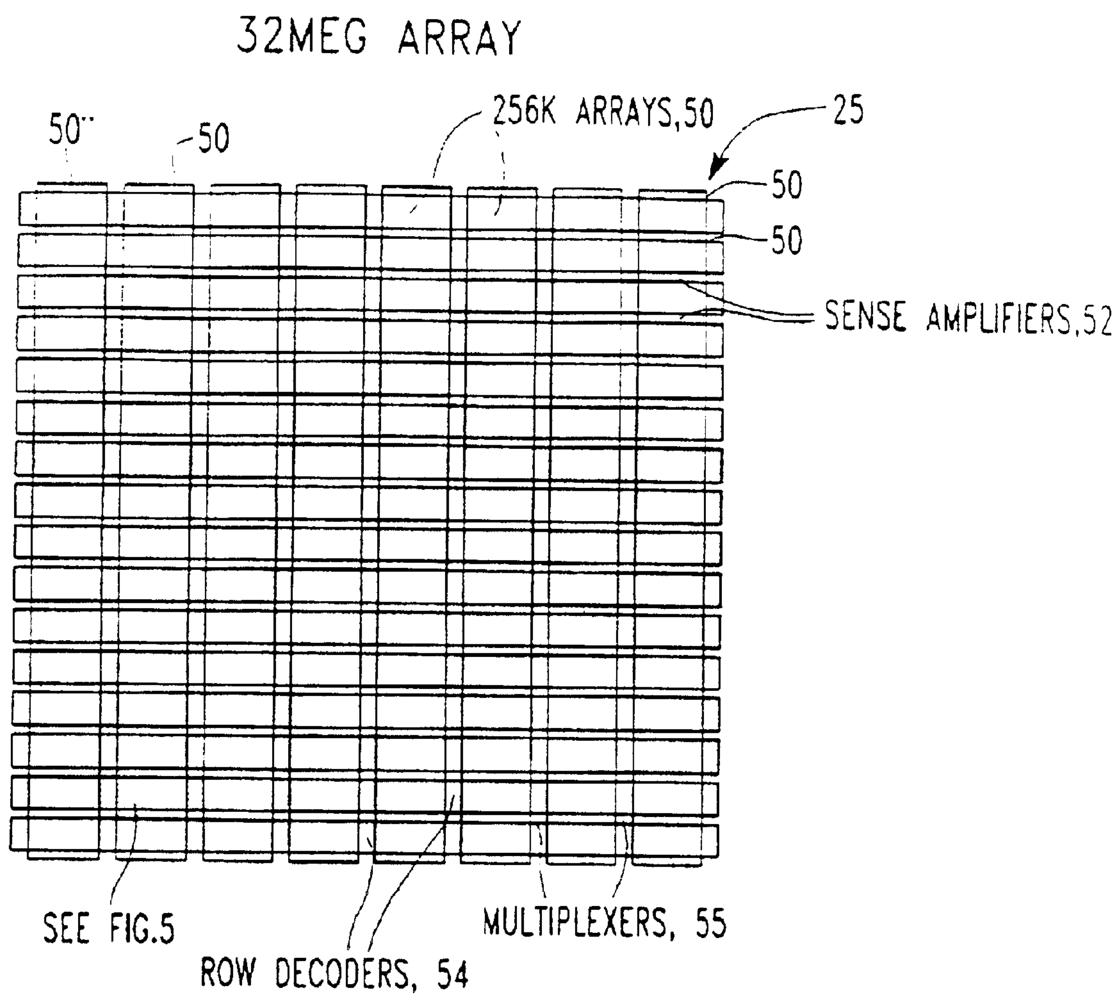
Figure 5:
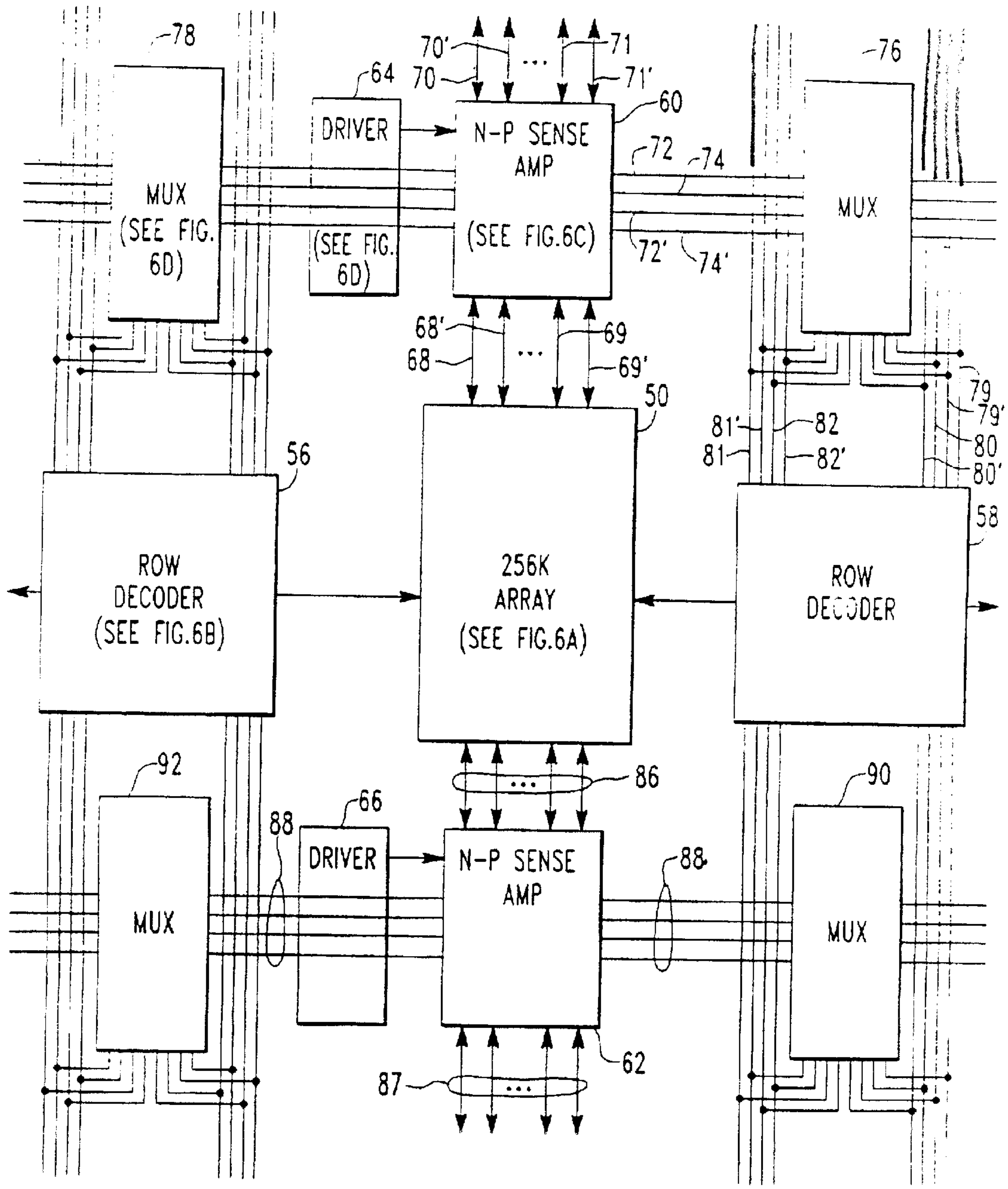
Figure 6A:
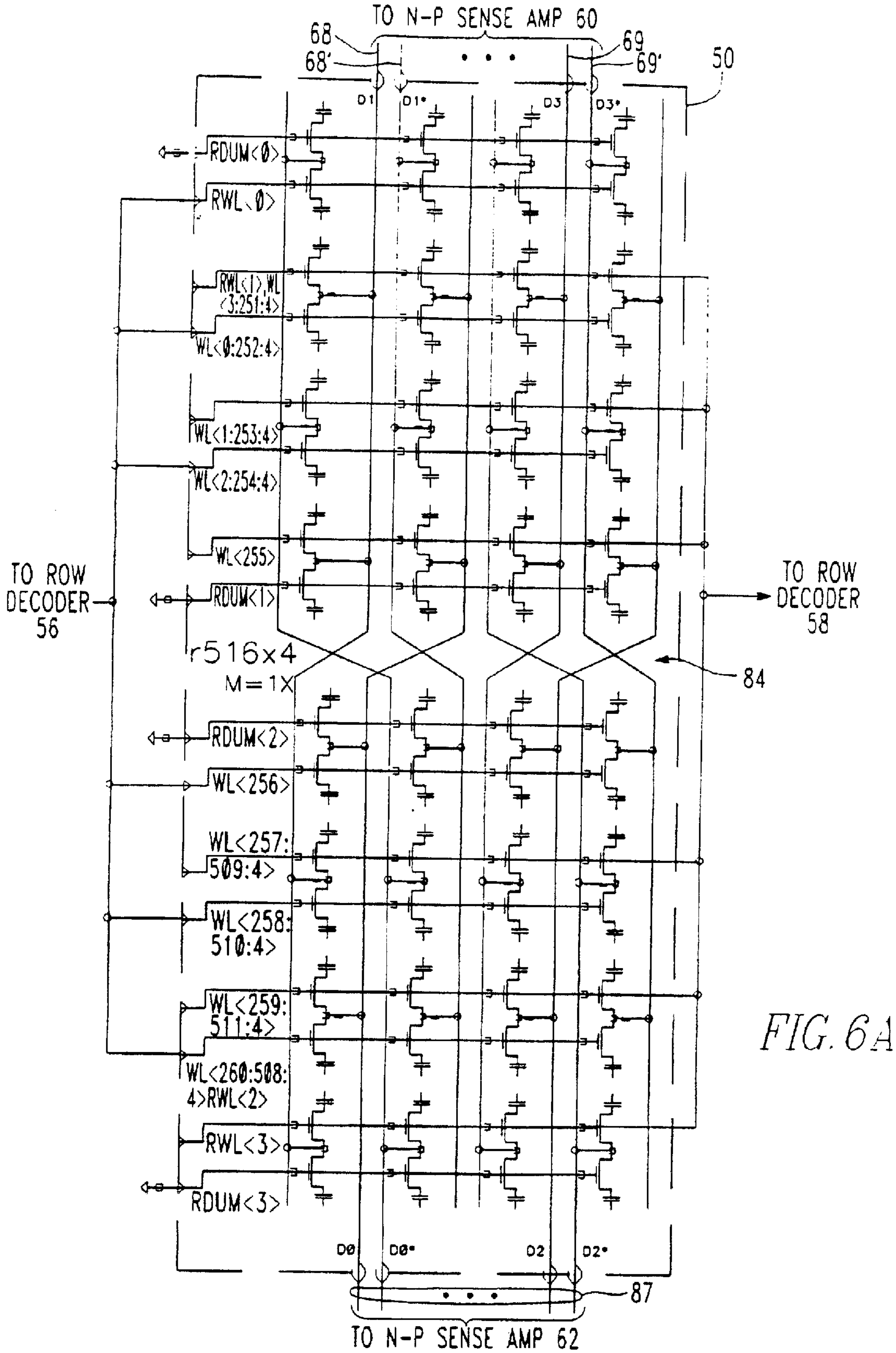
Figure 6B:
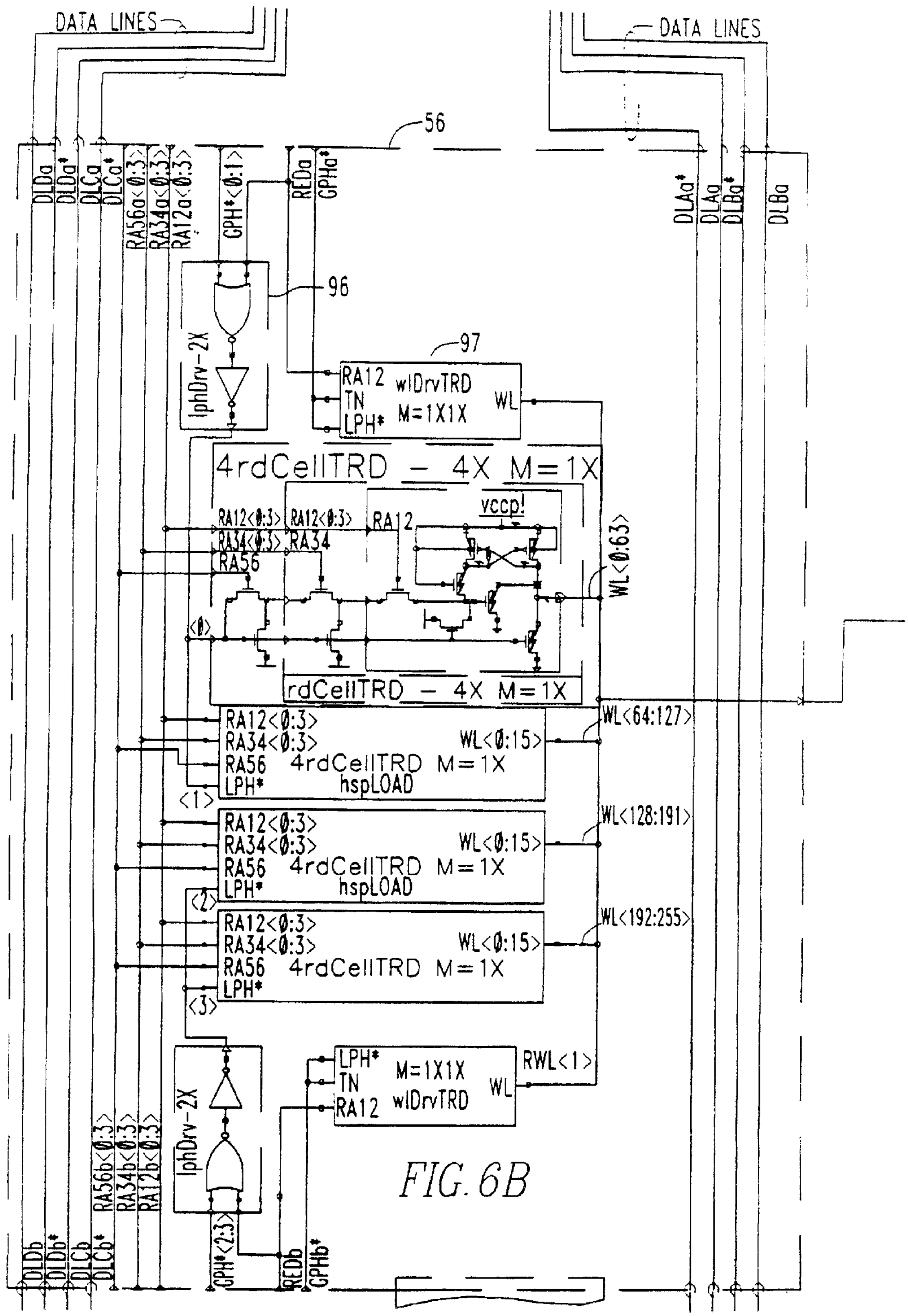
Figure 6C:
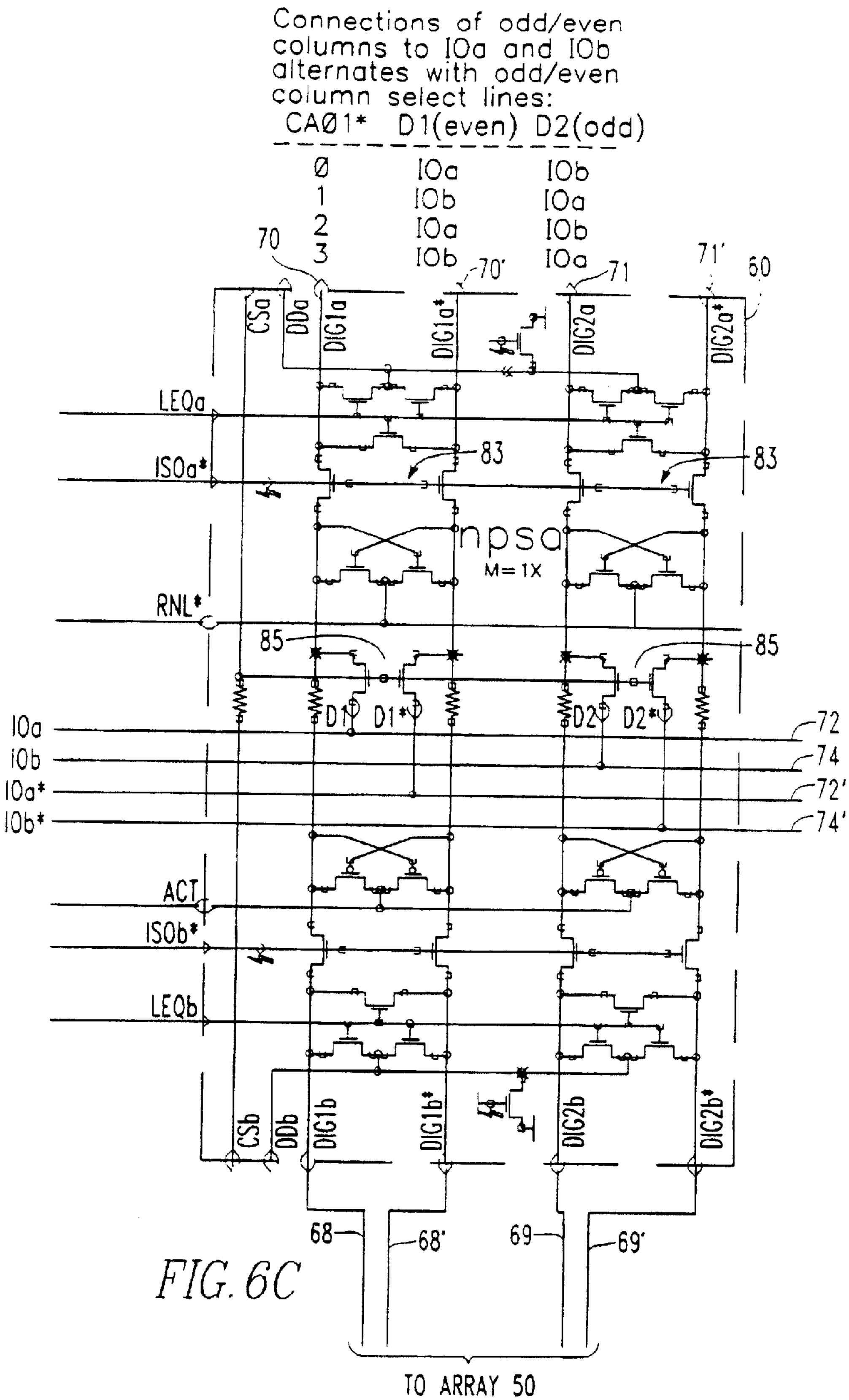
Figure 6D:
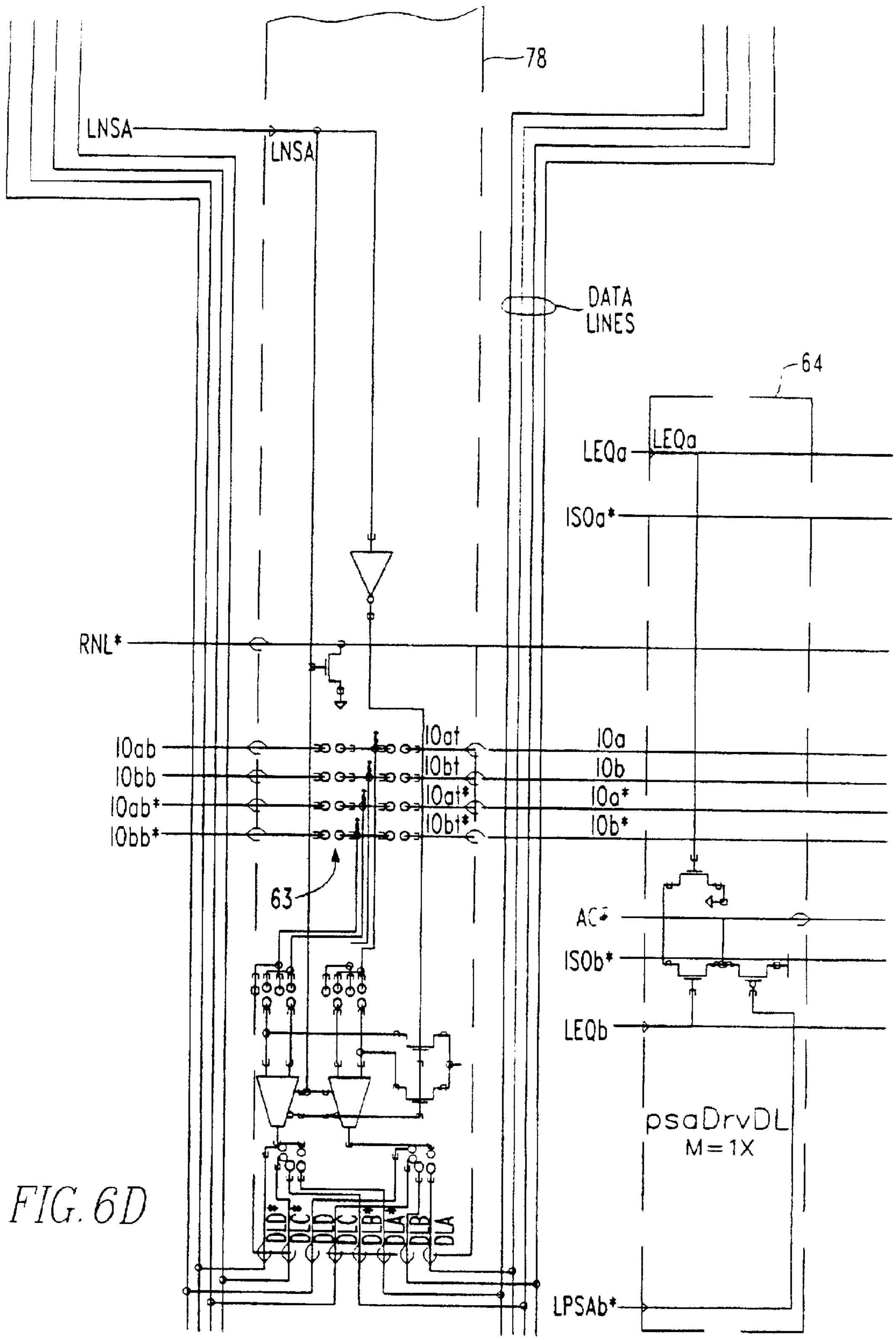

FIG. 4 is a block diagram illustrating the 8×16 array of individual 256 k arrays which make up one of the 32 Meg array blocks;

FIG. 5 is a block diagram of one 256 k array with associated sense amps and row decoders;

FIG. 6A illustrates the details of the 256 k array shown in FIG. 5;

FIG. 6B illustrates the details of one of the row decoders shown in FIG. 5;

FIG. 6C illustrates the details; of one of the sense amps shown in FIG. 5;

FIG. 6D illustrates the details of one of the array multiplexers and one of the sense amp drivers shown in FIG. 5;

Data and Test Paths (See Section IV)

Figure 7:
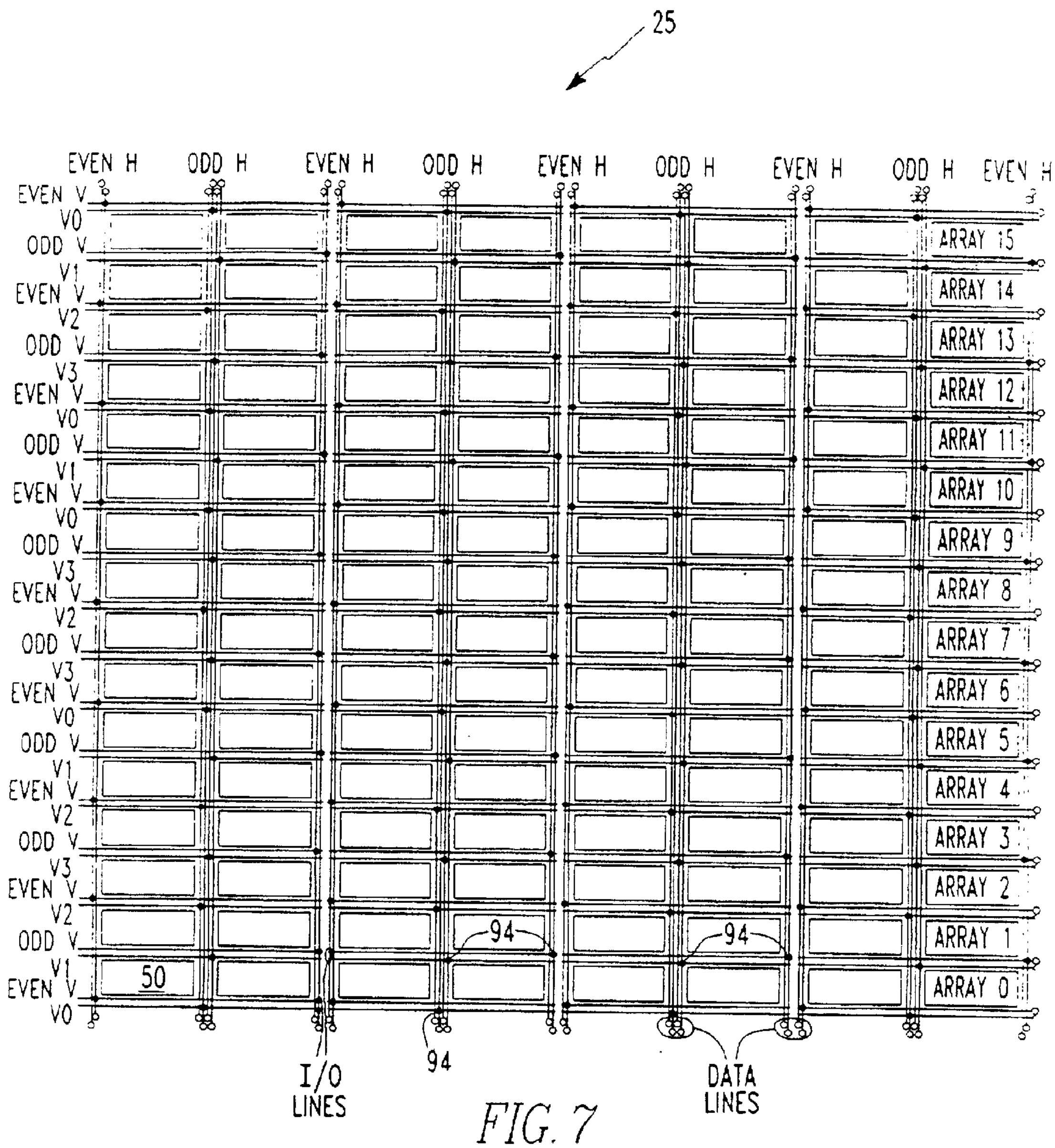
Figure 8:
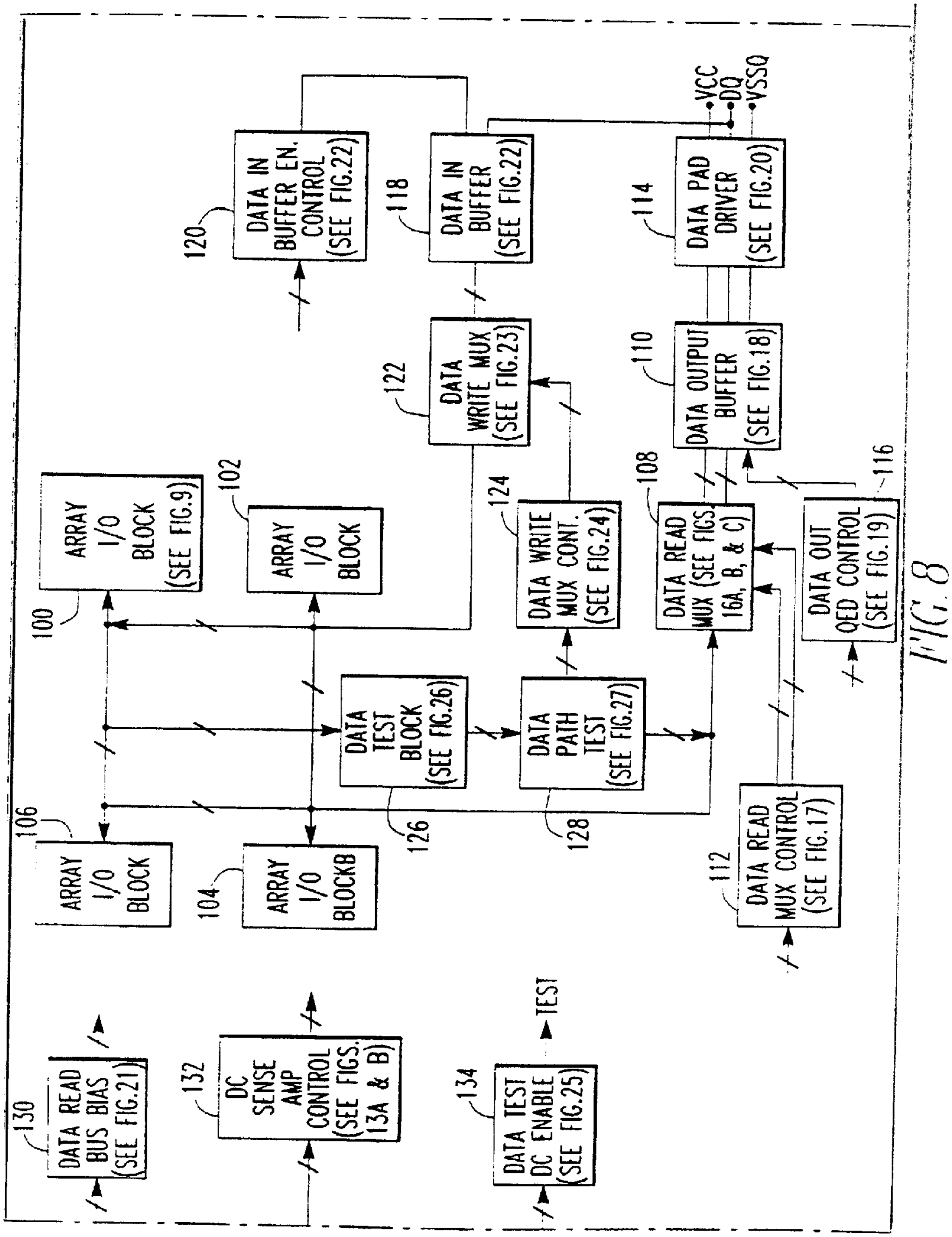
Figure 9:
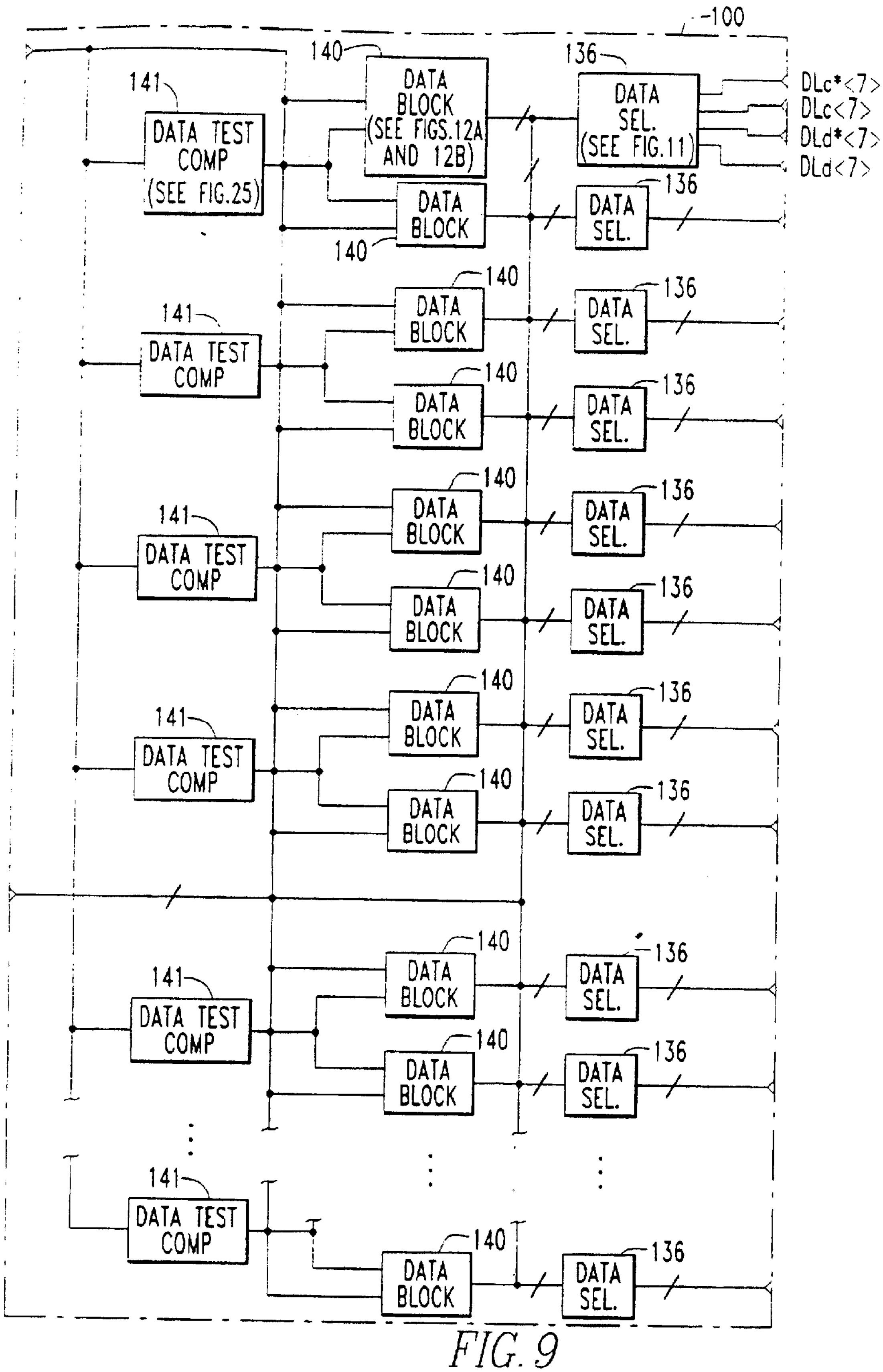
Figures 1, 11:
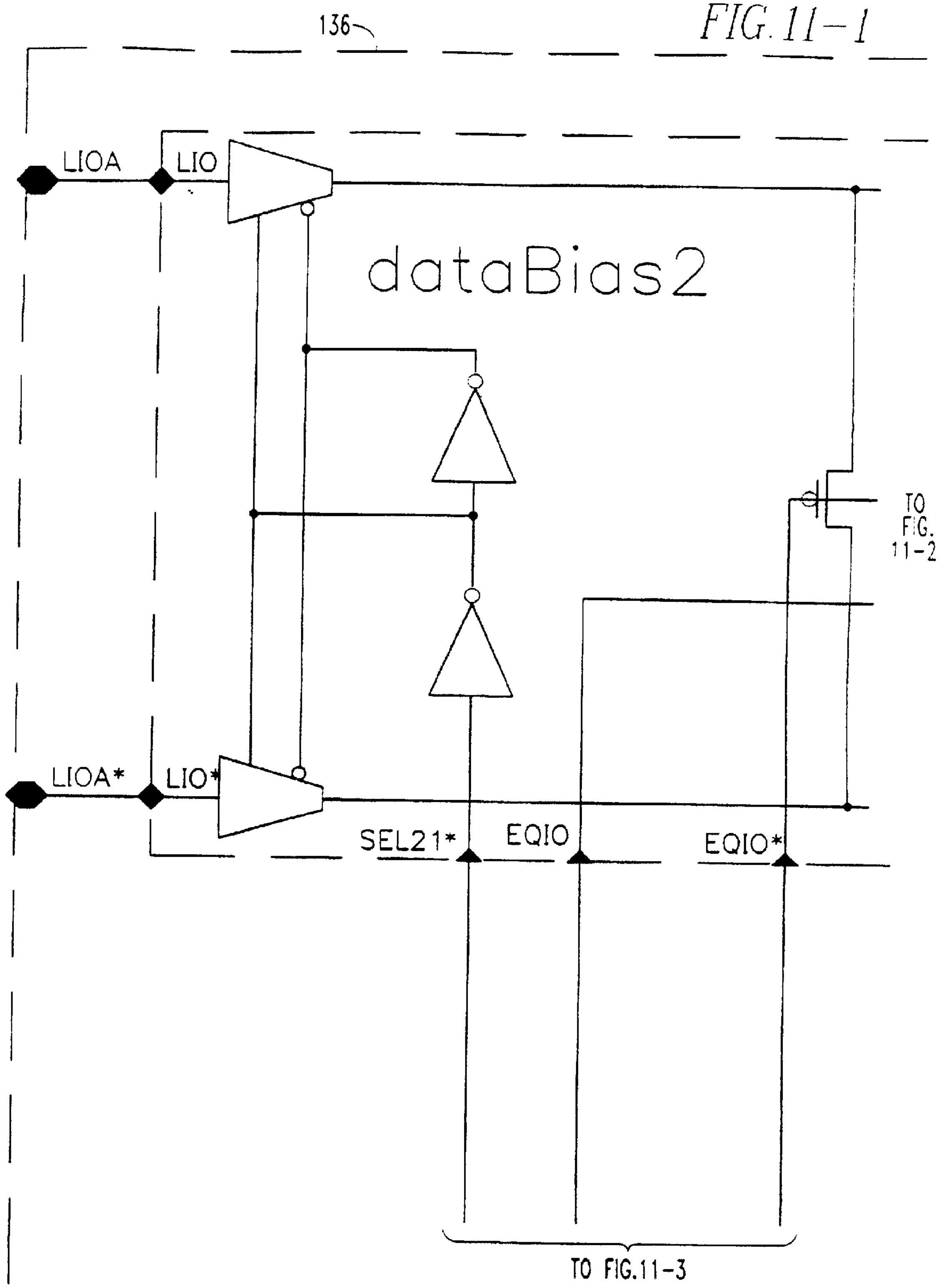
Figures 2, 11:
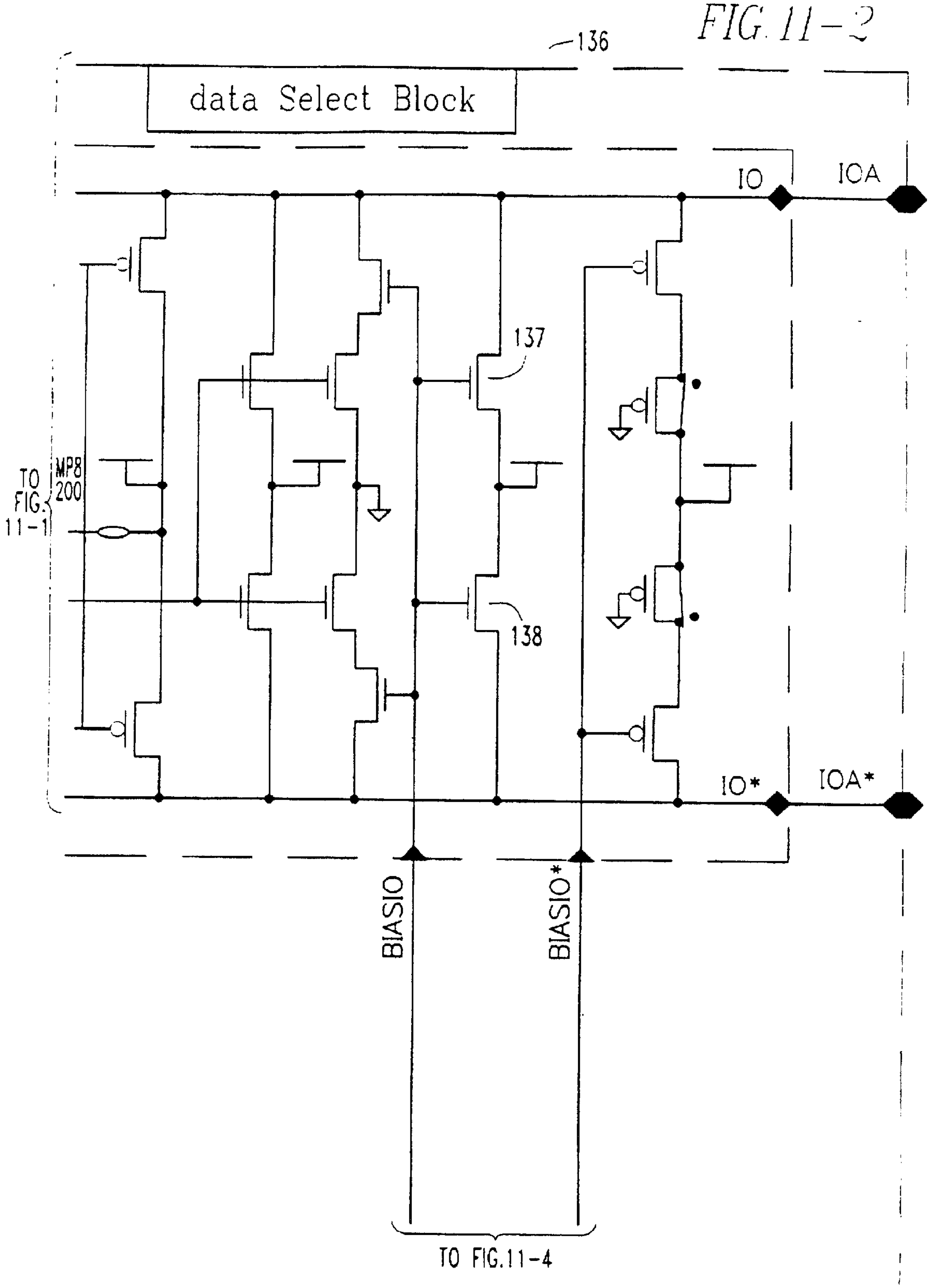
Figures 3, 11:
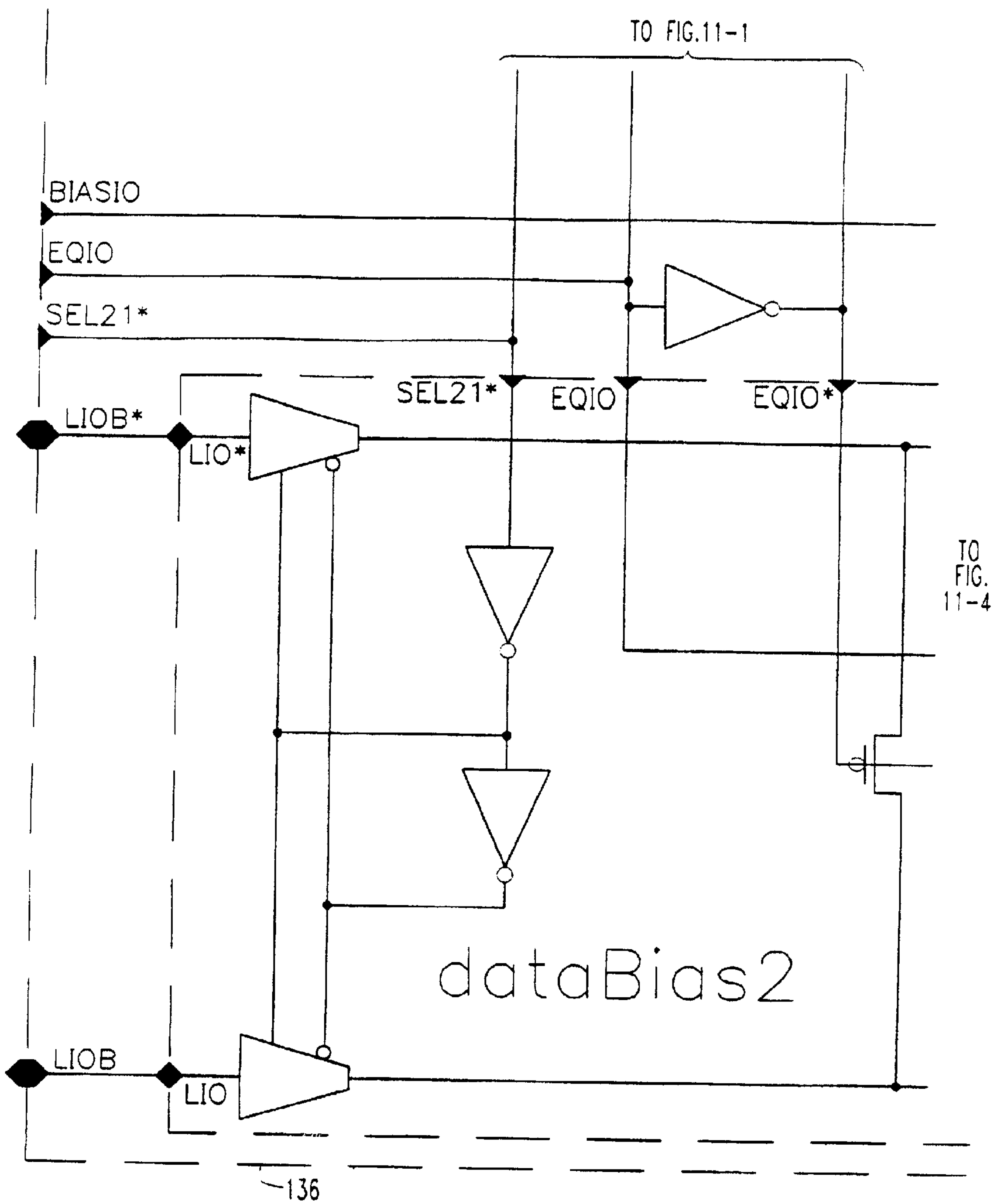
Figures 4, 11:
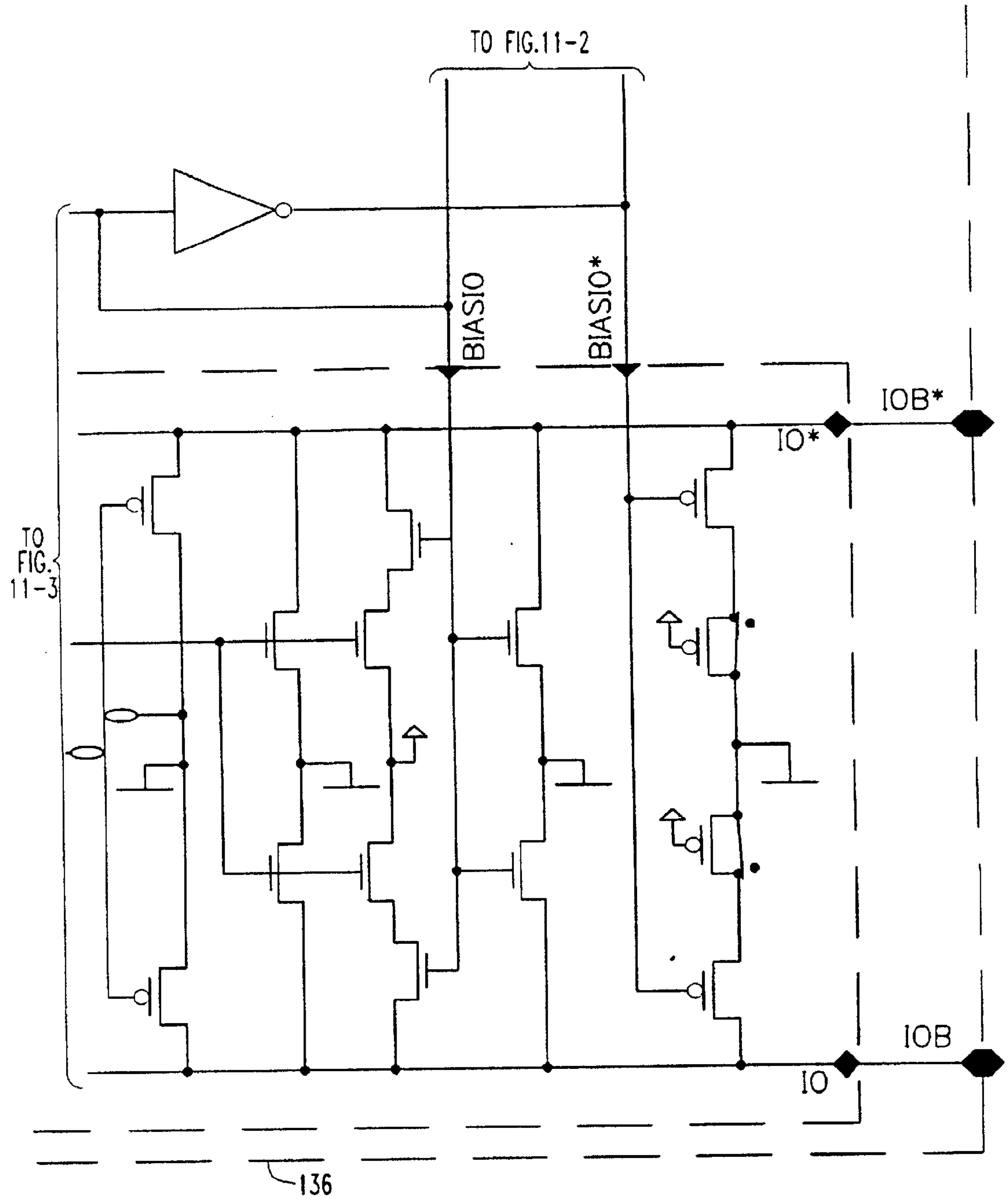
Figure 13A:
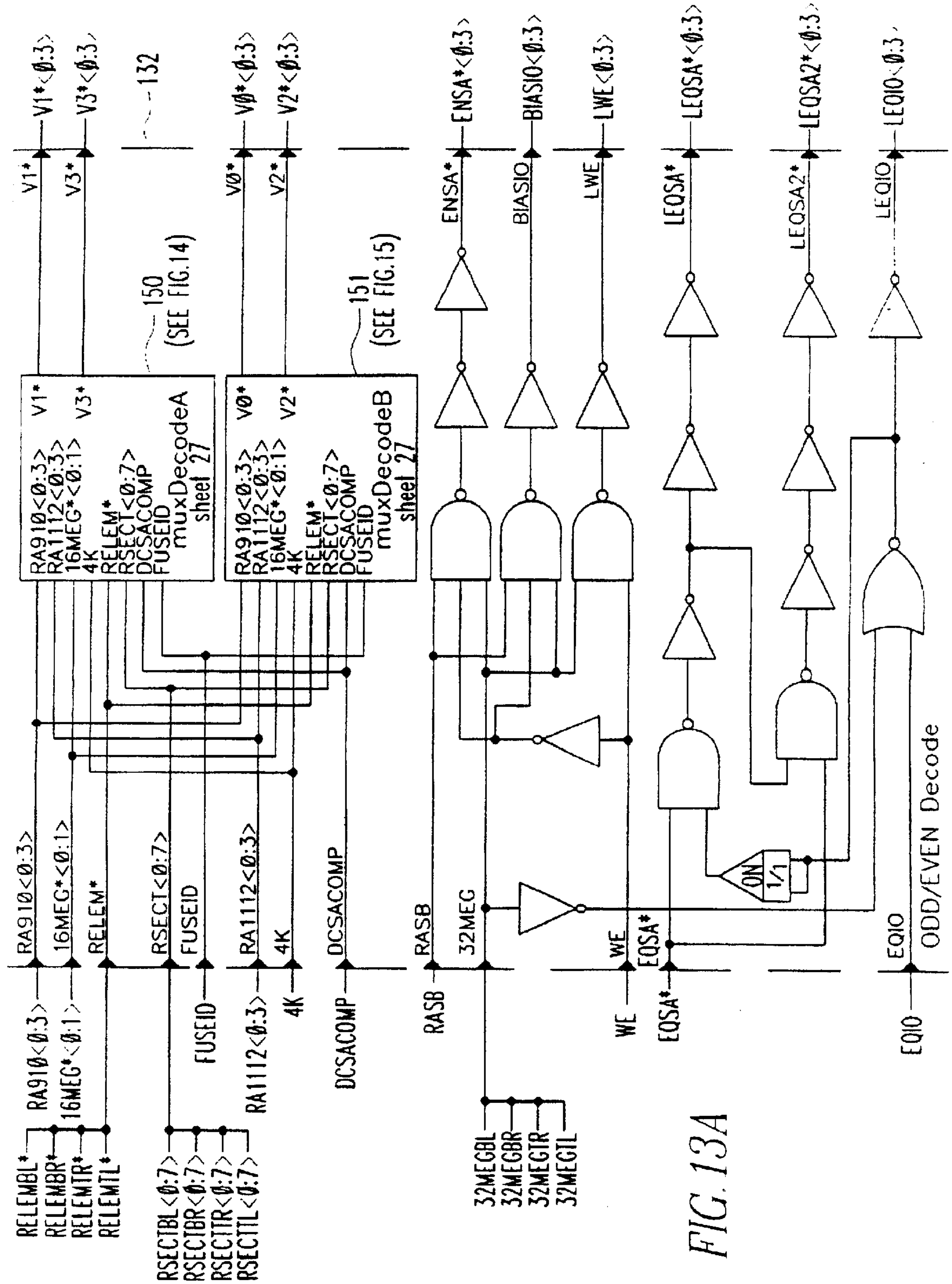
Figure 13B:
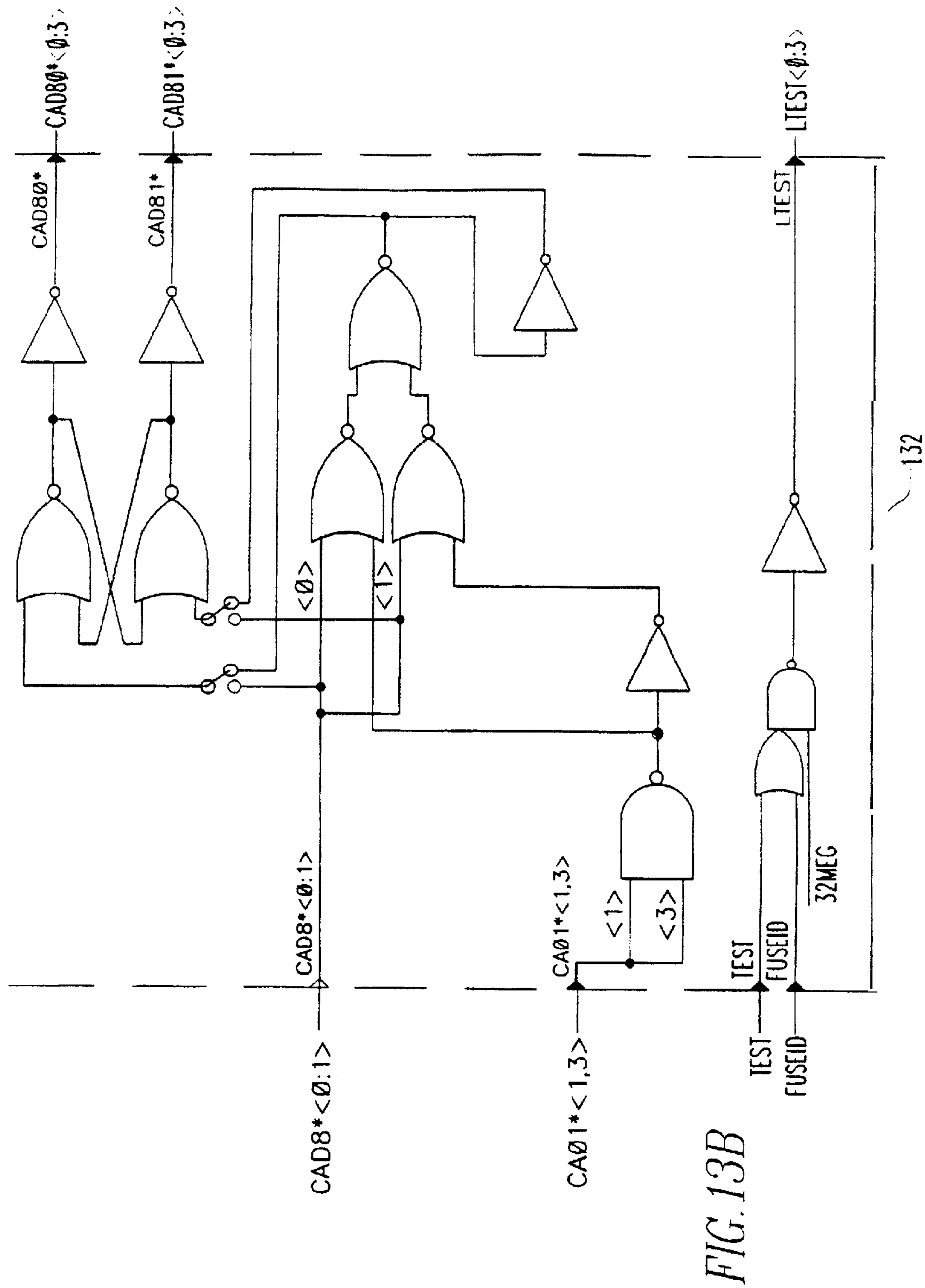
Figure 14:
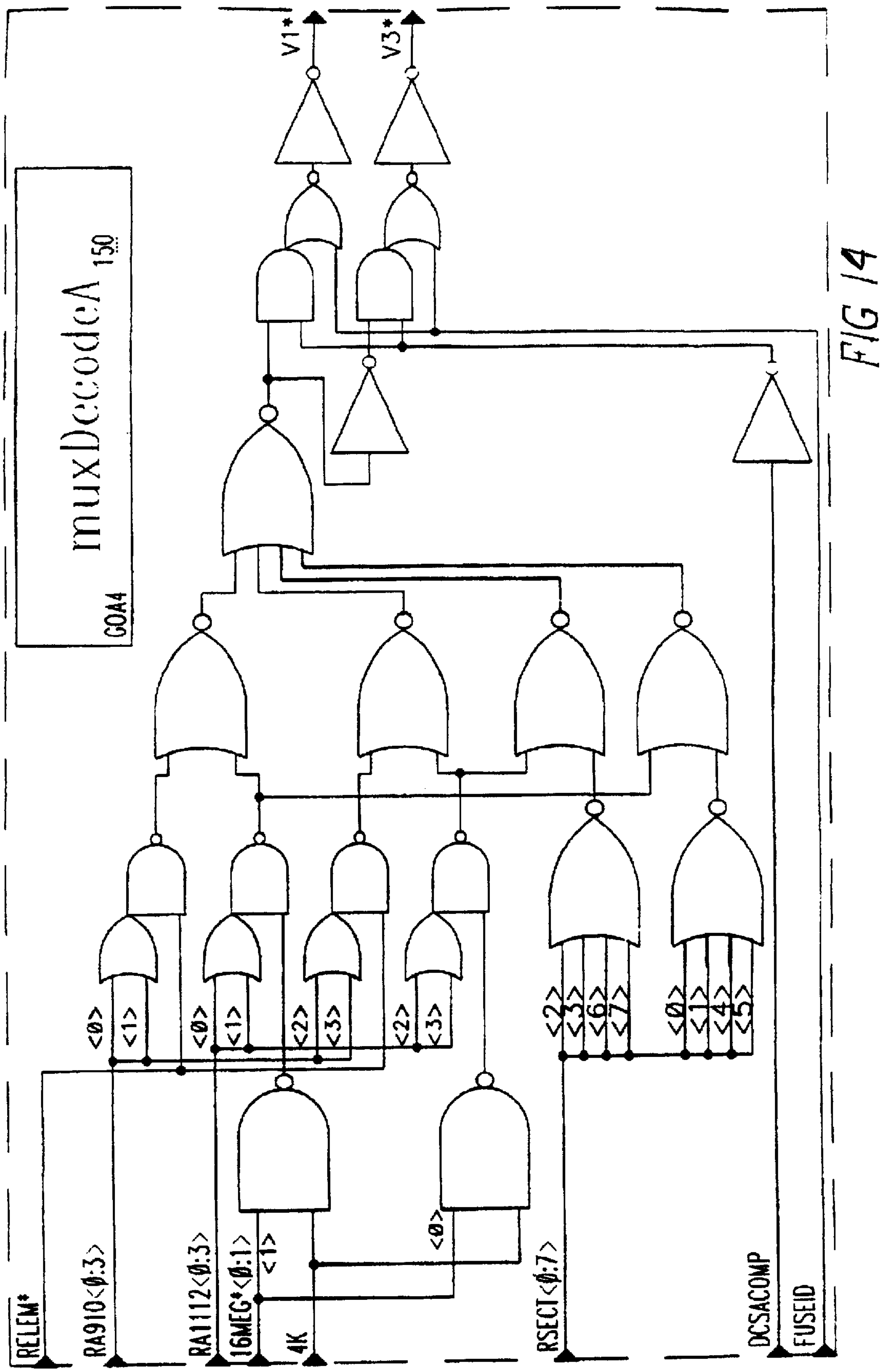
Figure 15:
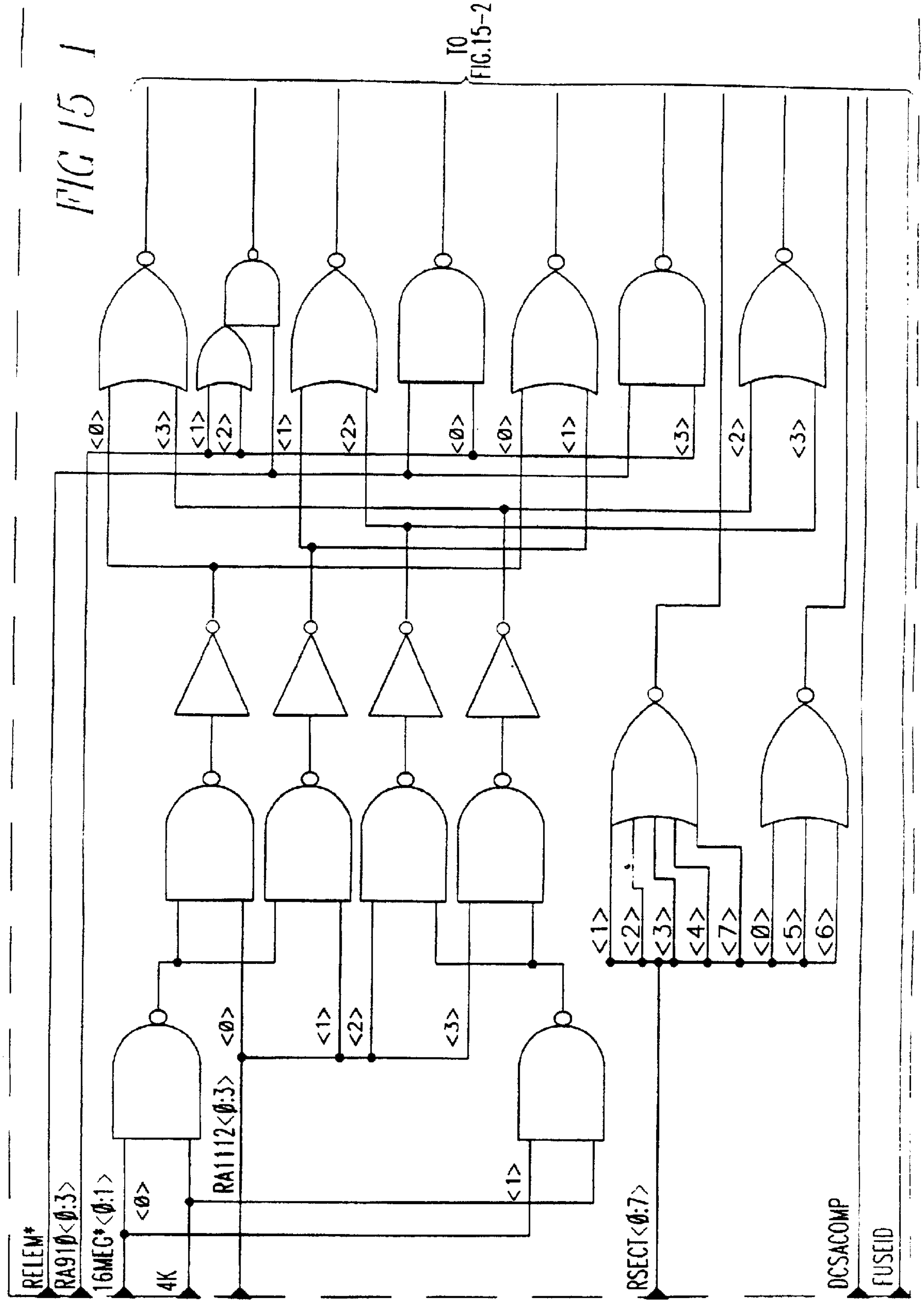
Figures 2, 15:
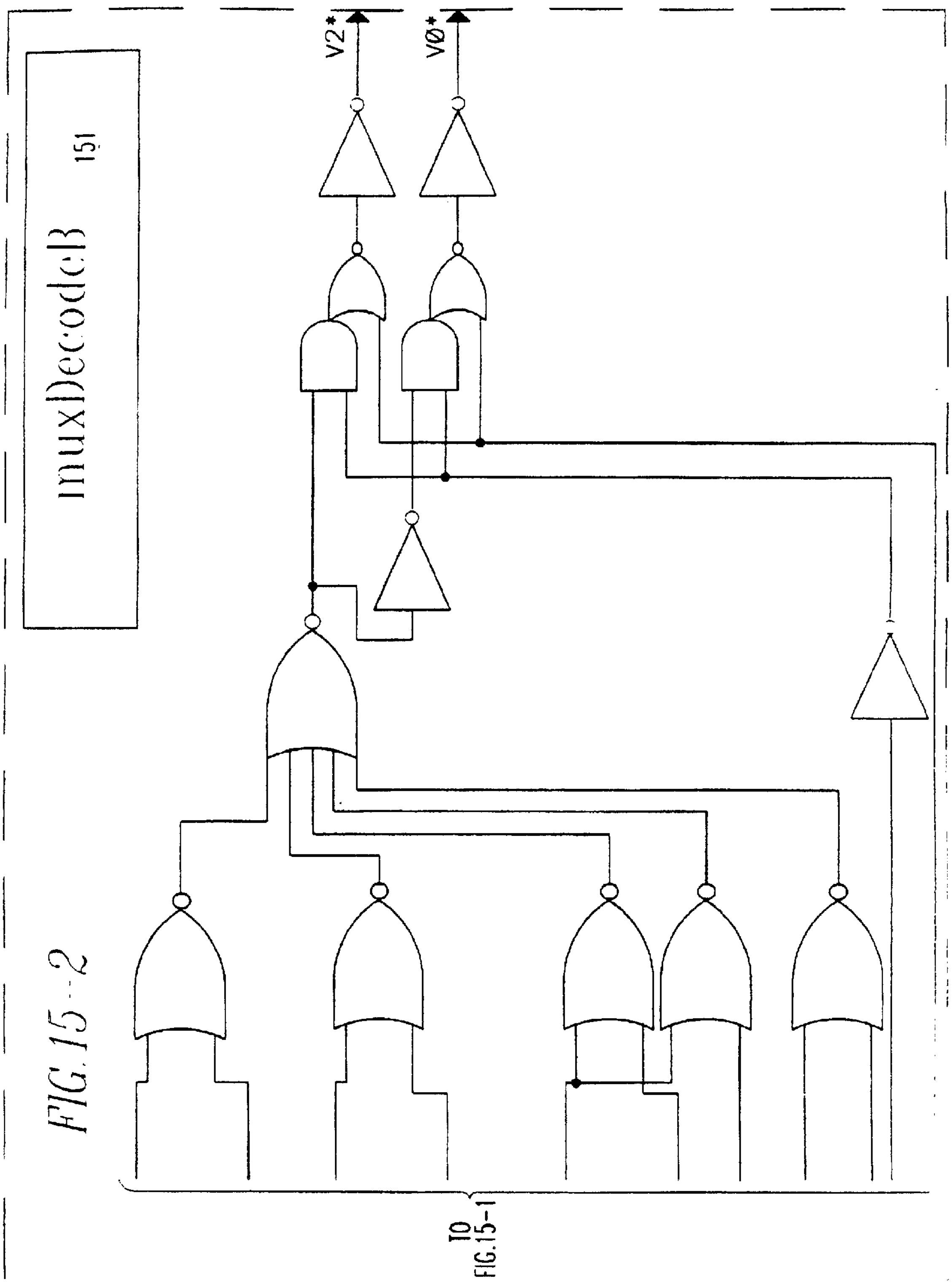
Figure 16A:
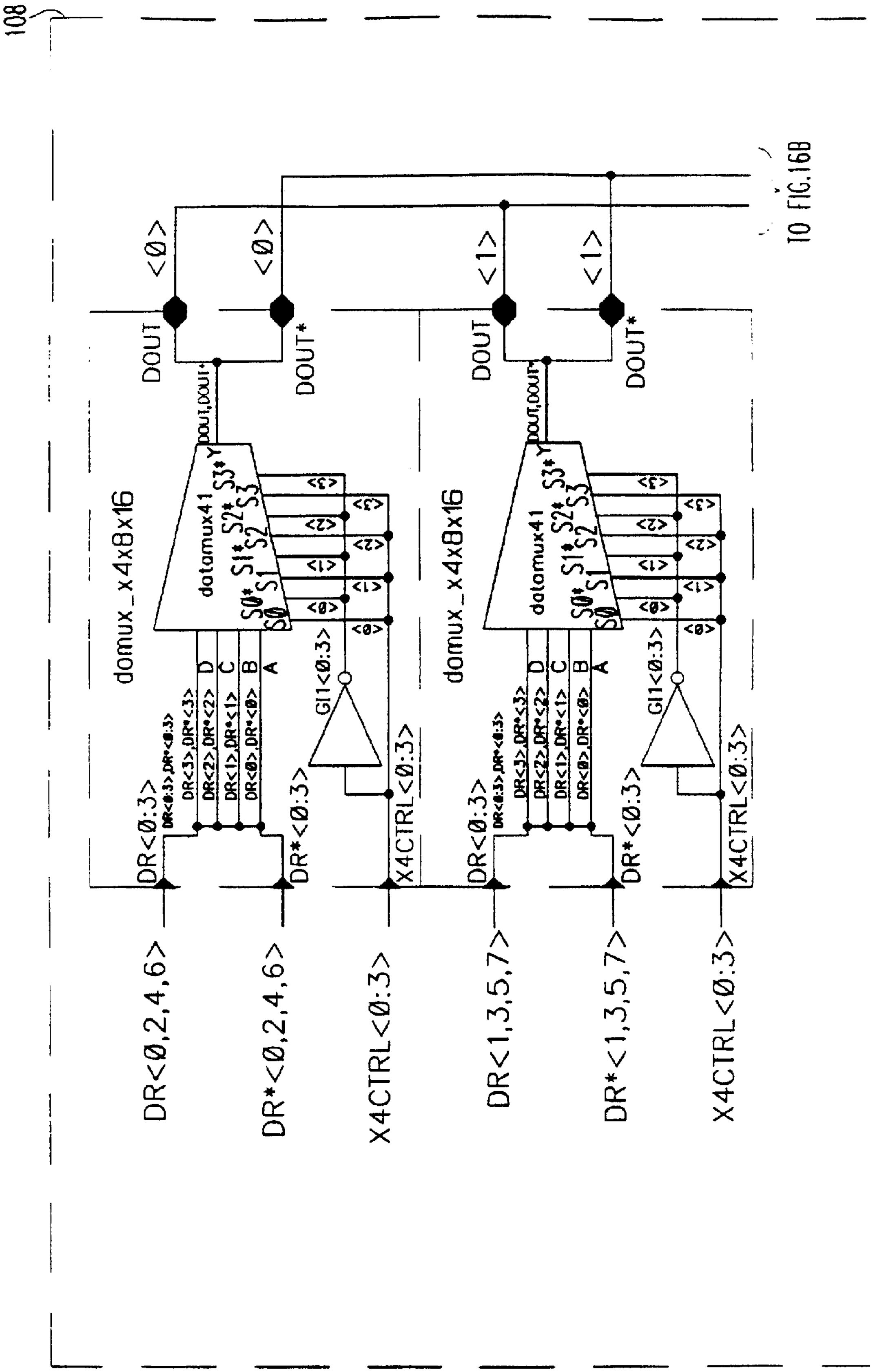
Figure 16B:
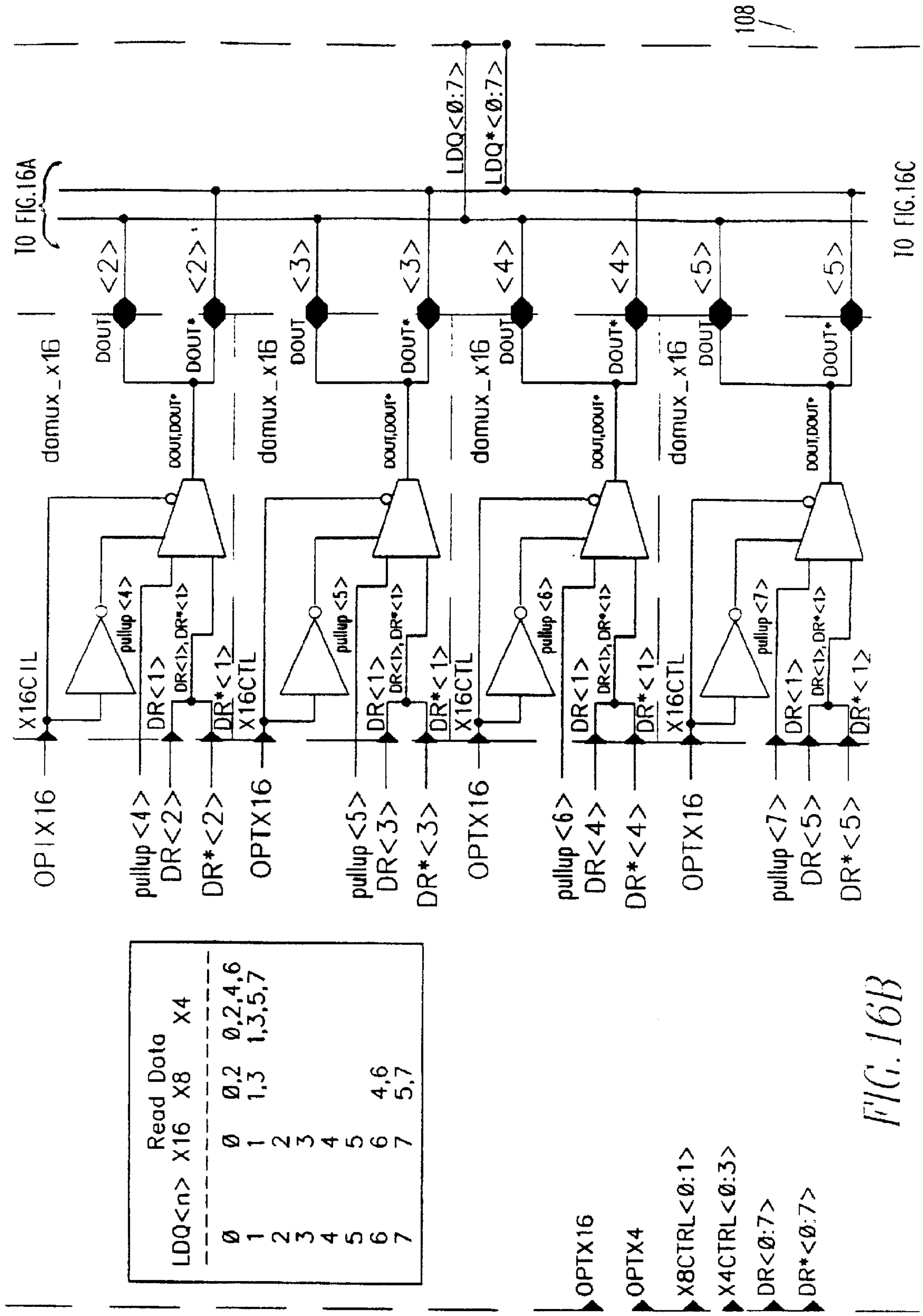
Figure 16C:
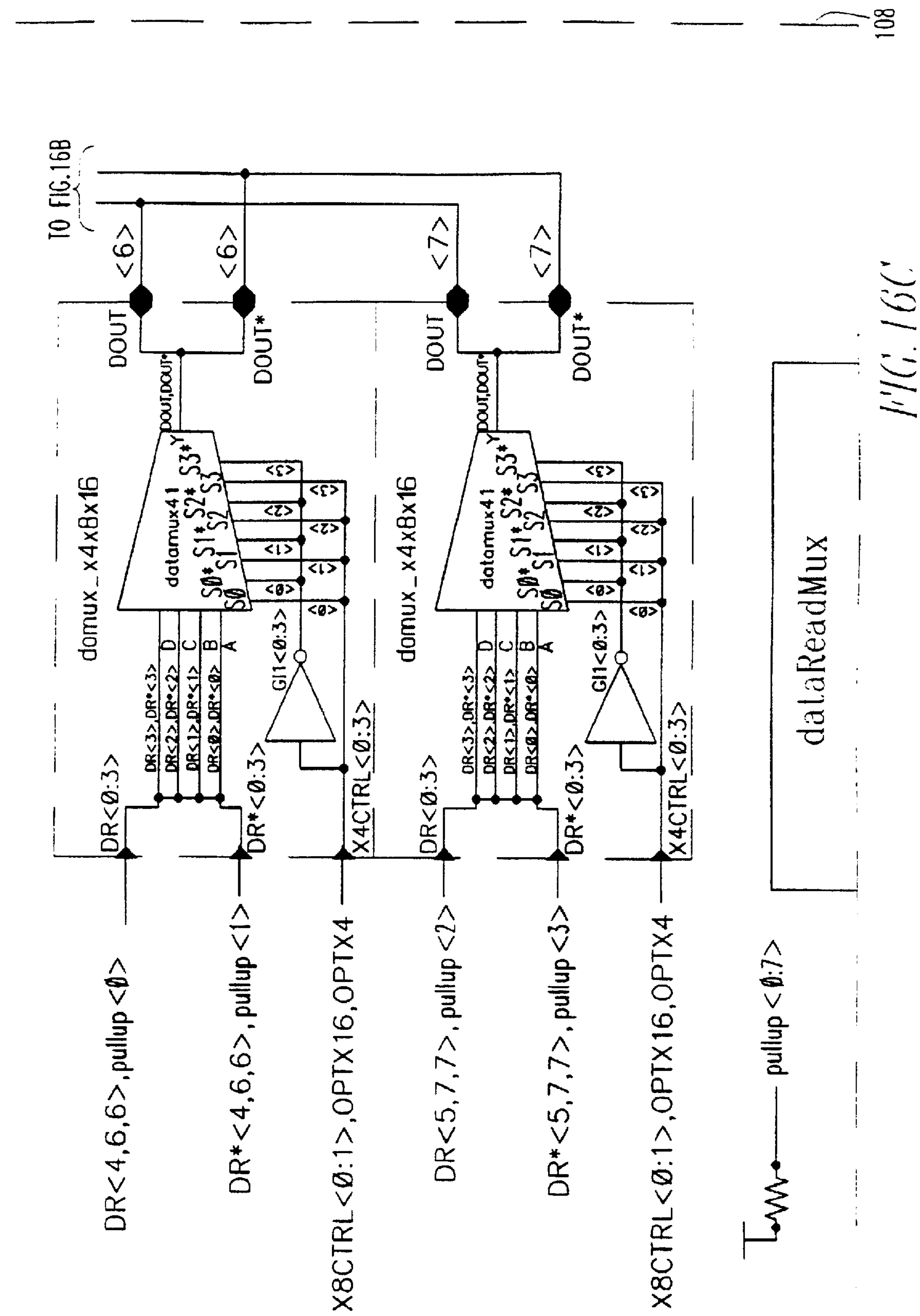
Figure 17:
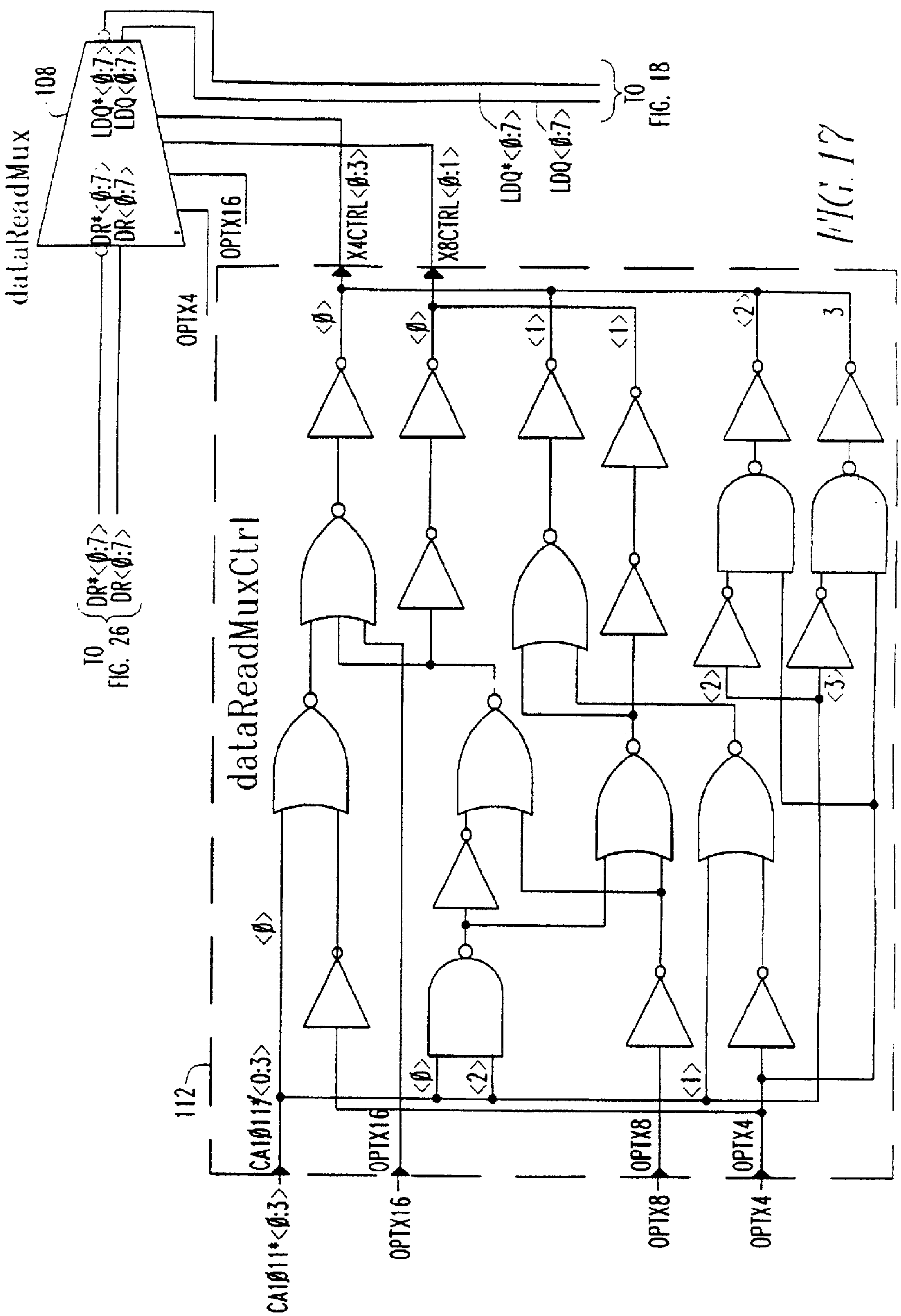
Figures 1, 18:
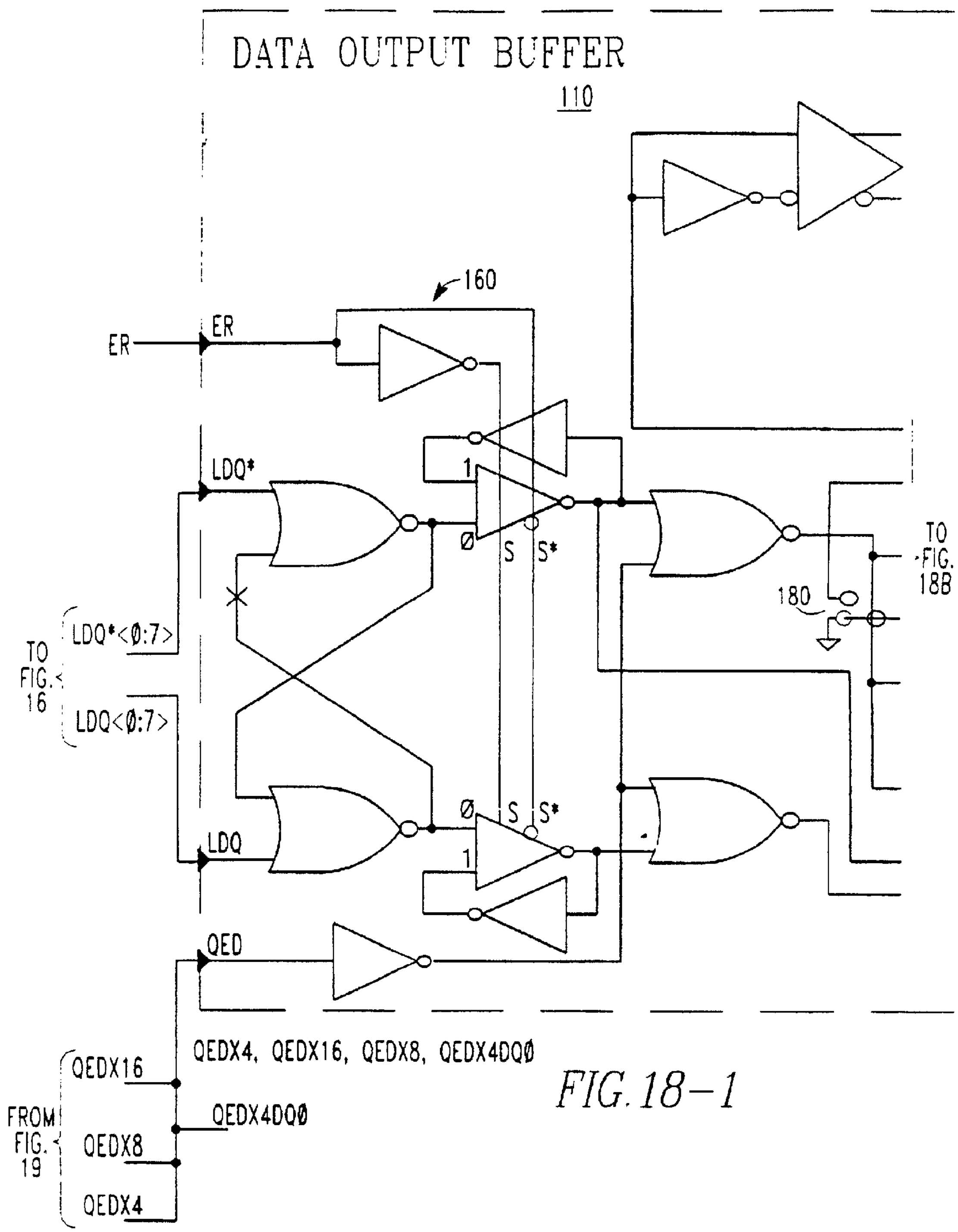
Figures 2, 18:
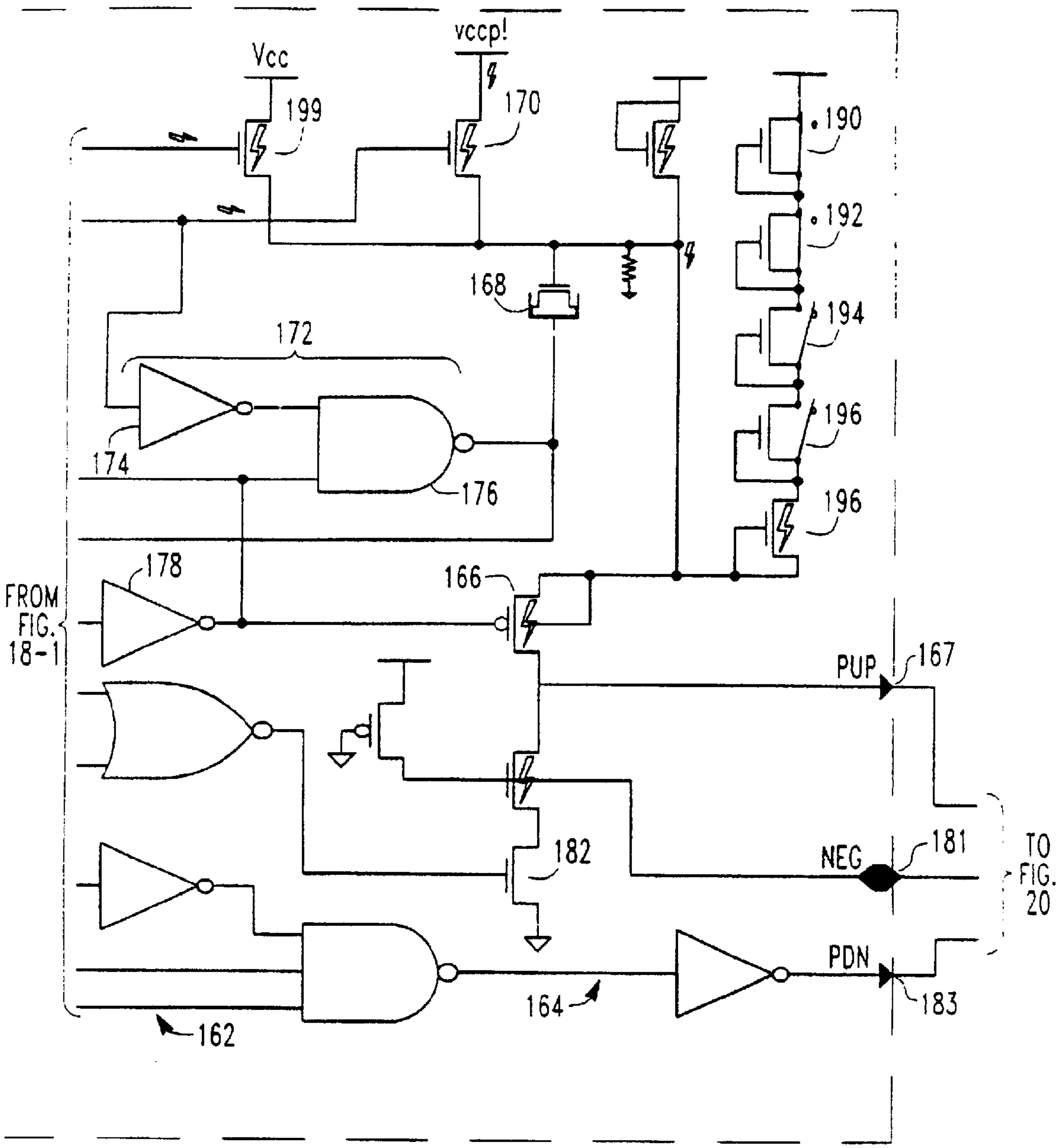
Figure 19:
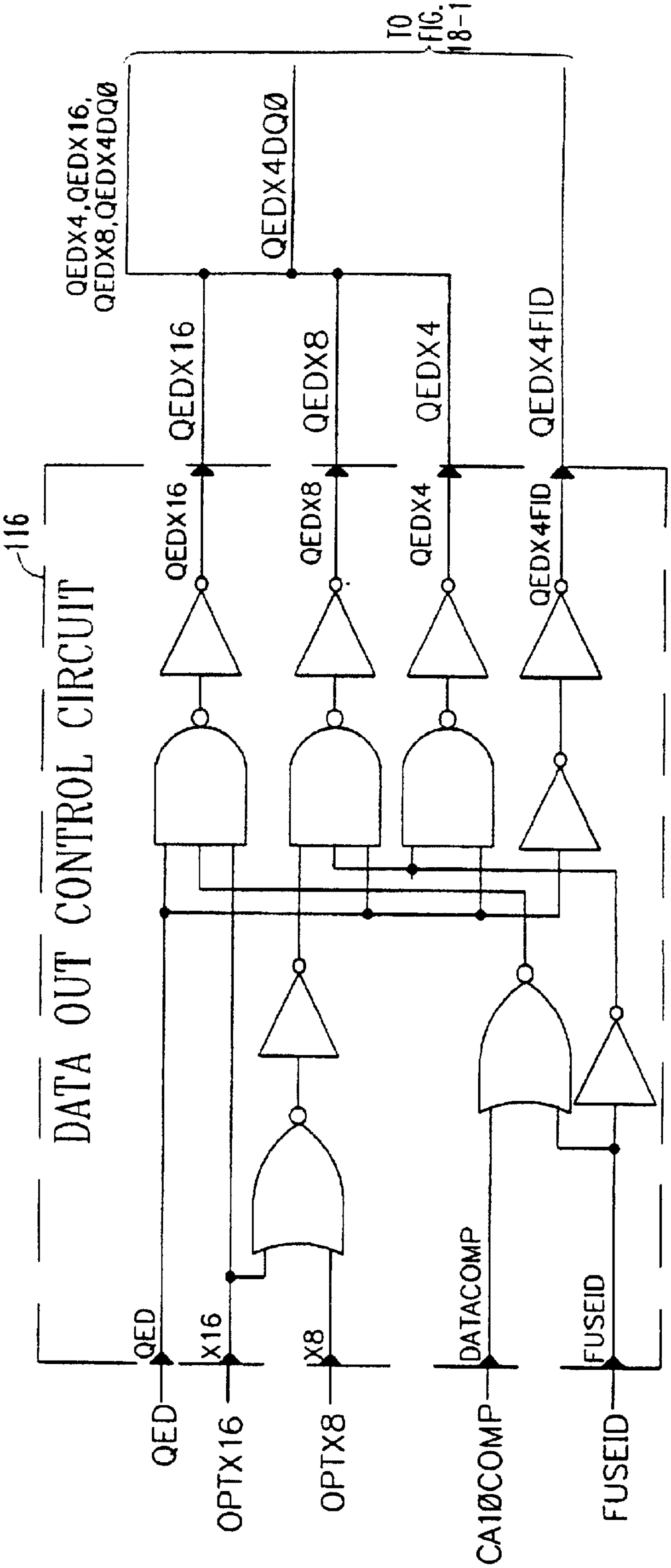
Figure 20:
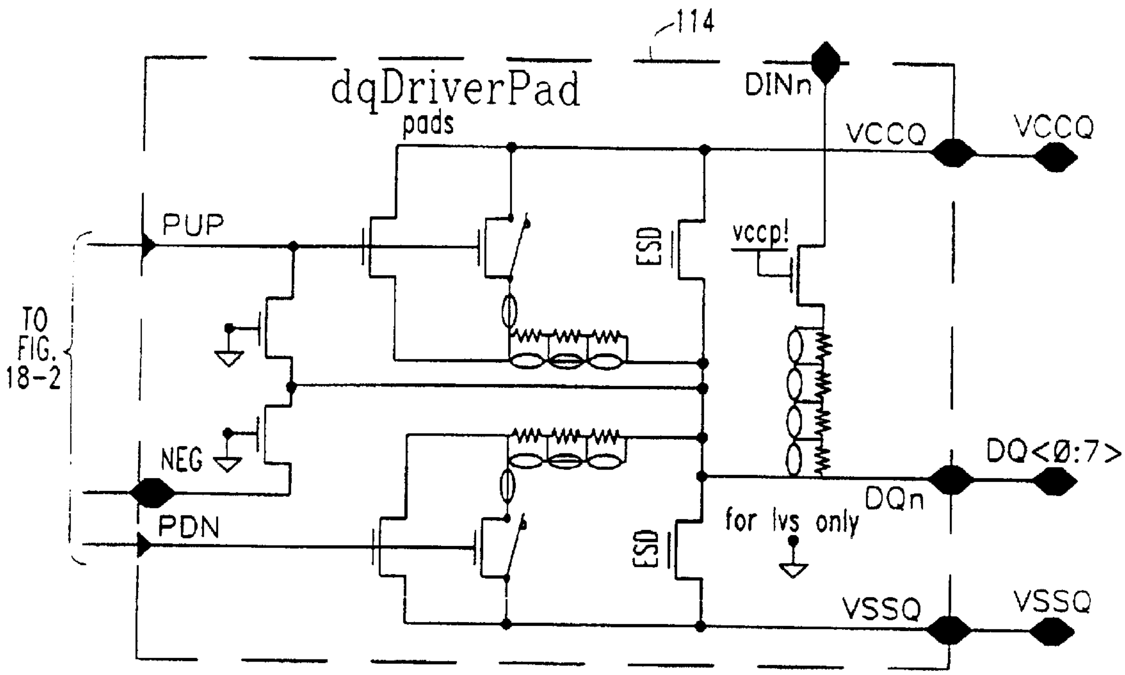
Figure 21:
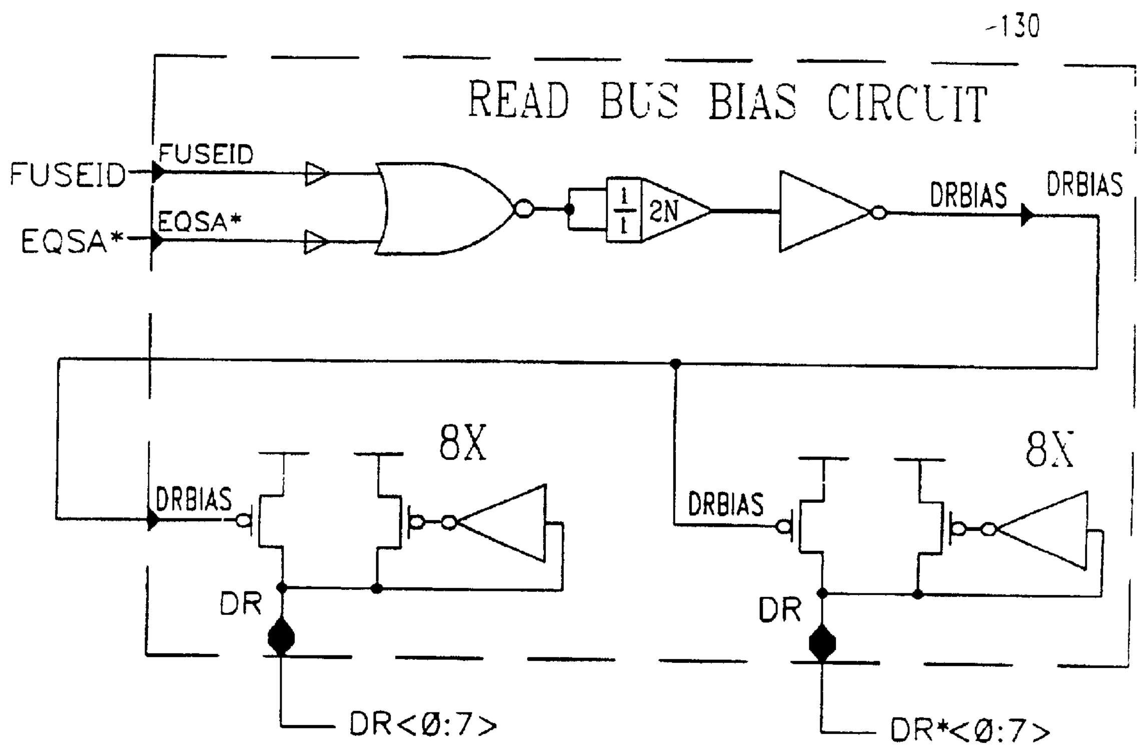
Figure 22:
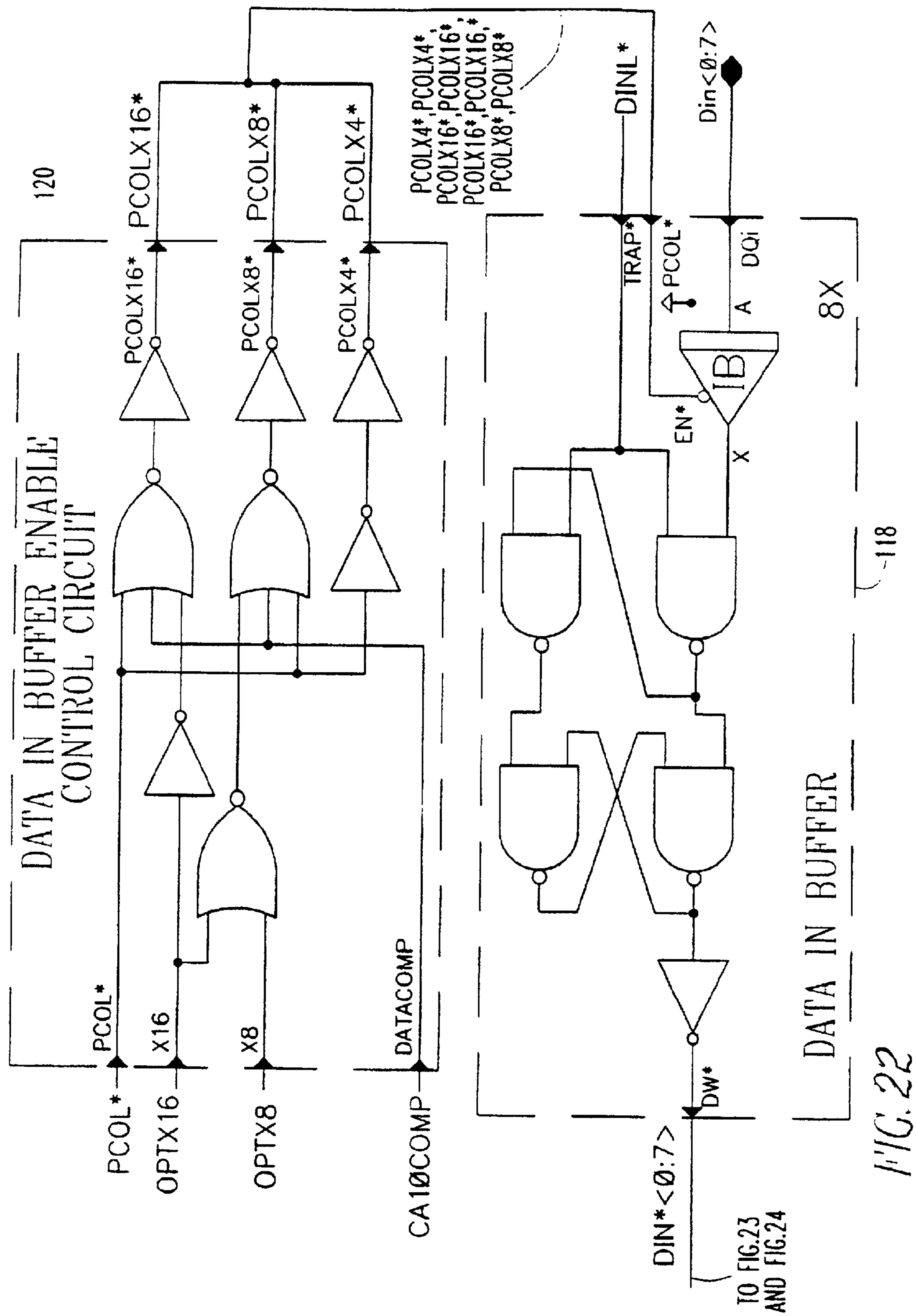
Figures 1, 23:
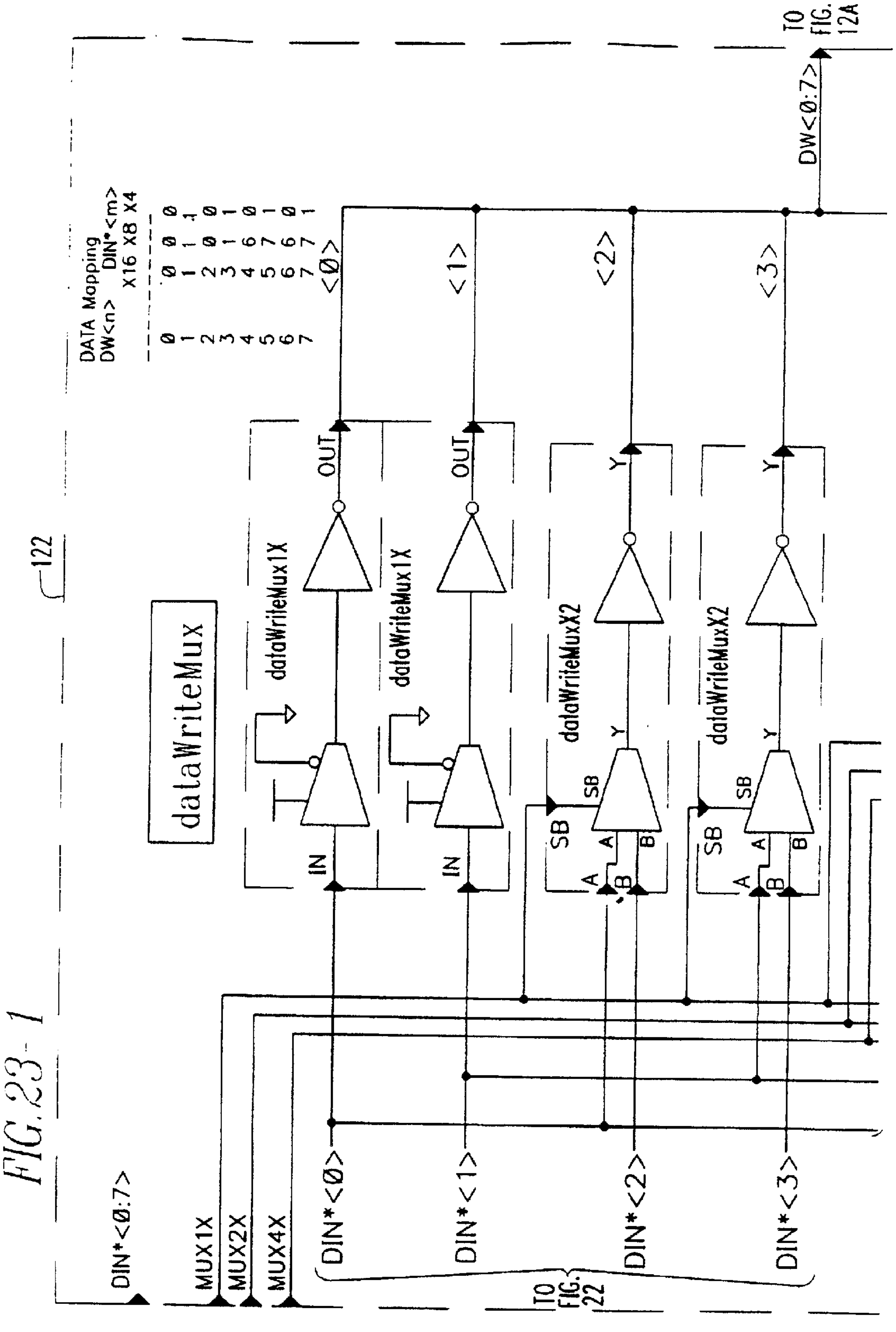
Figures 2, 23:
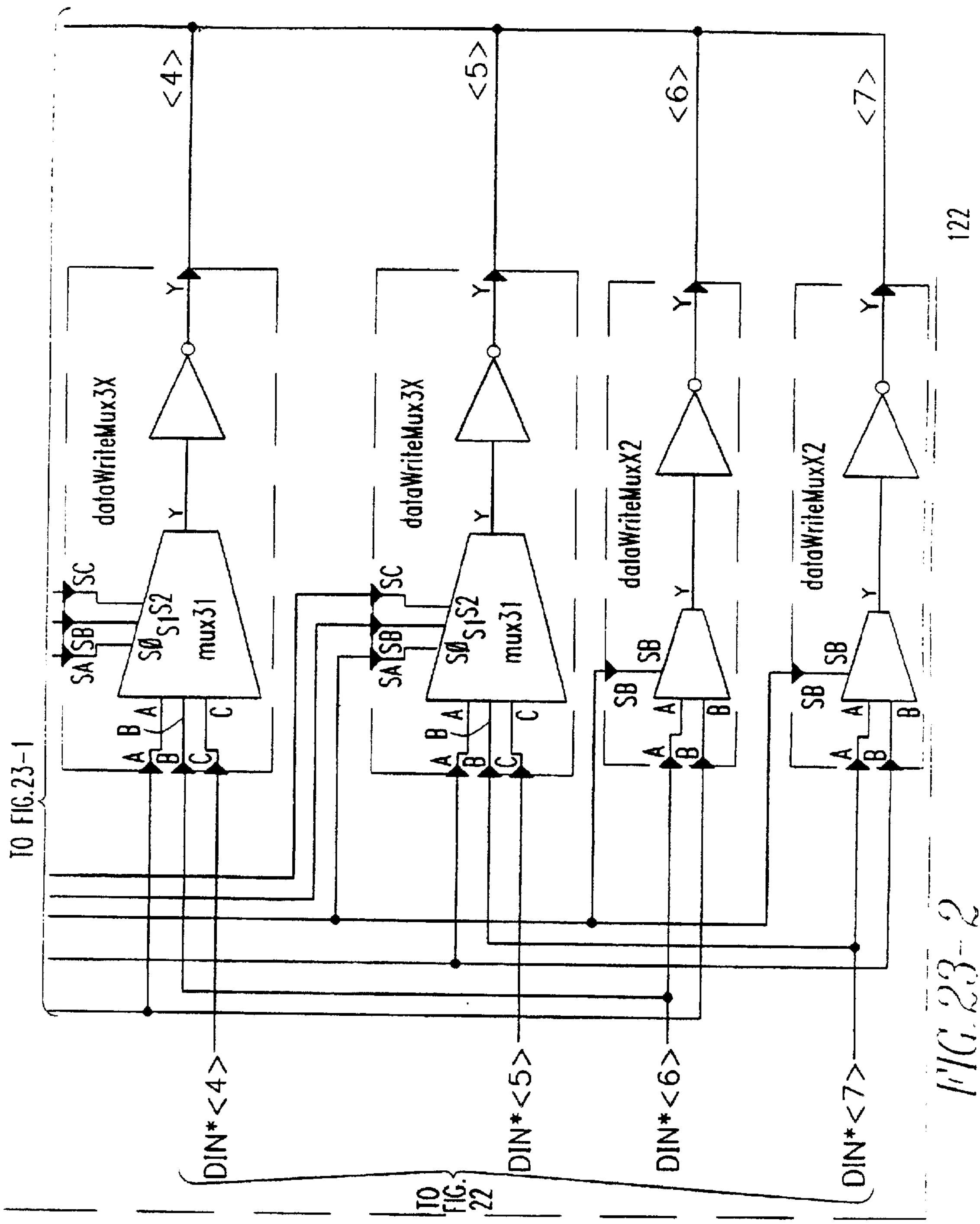
Figure 24:
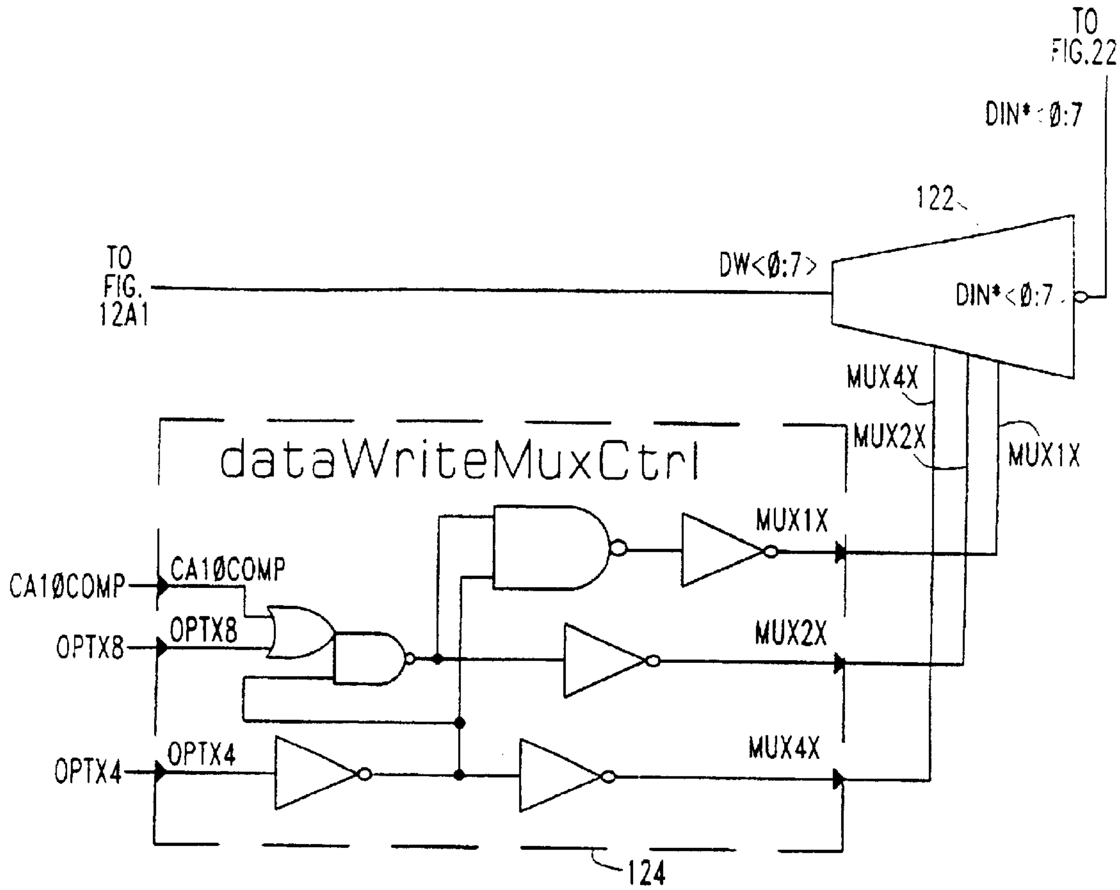
Figure 25:
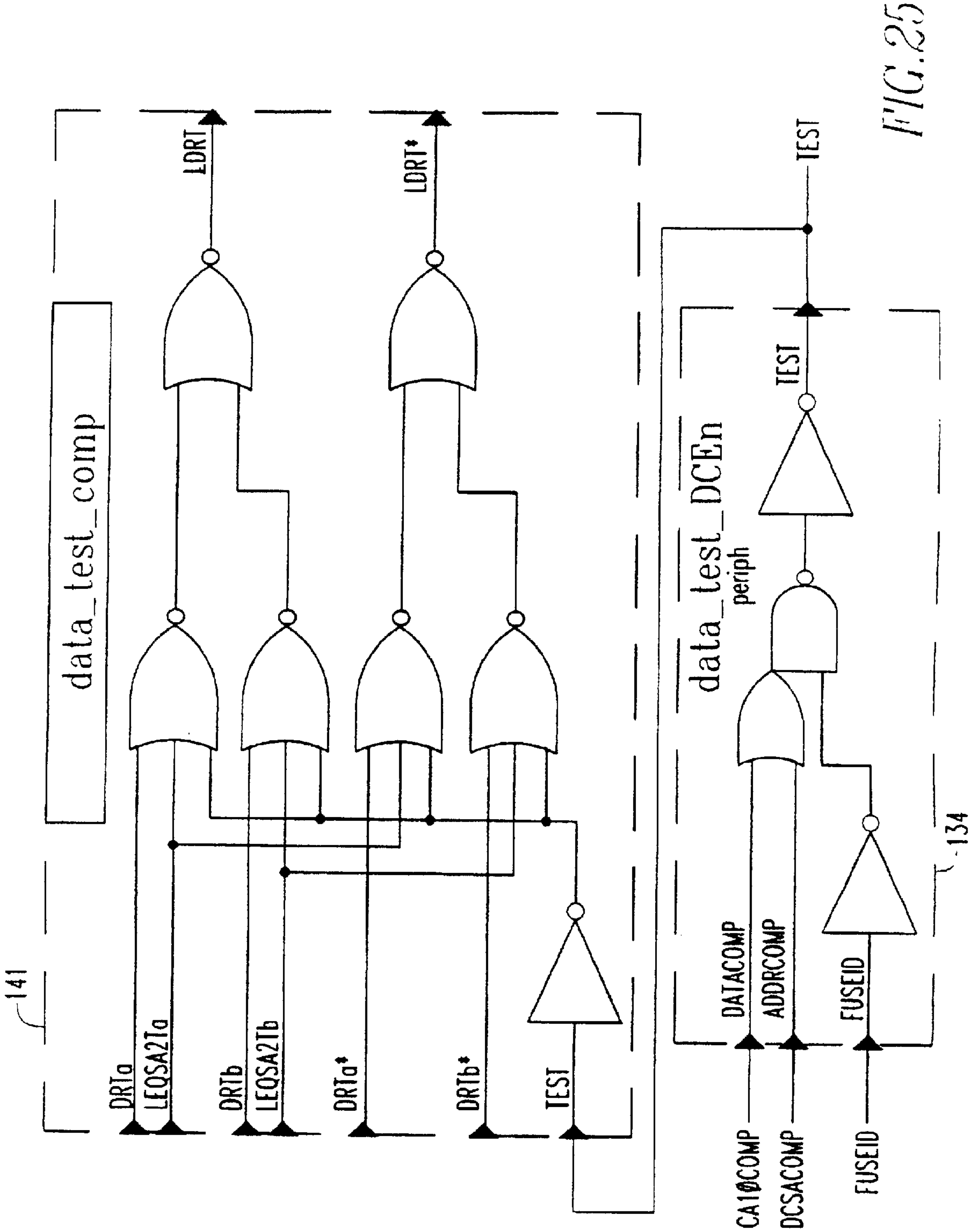
Figures 1, 26:
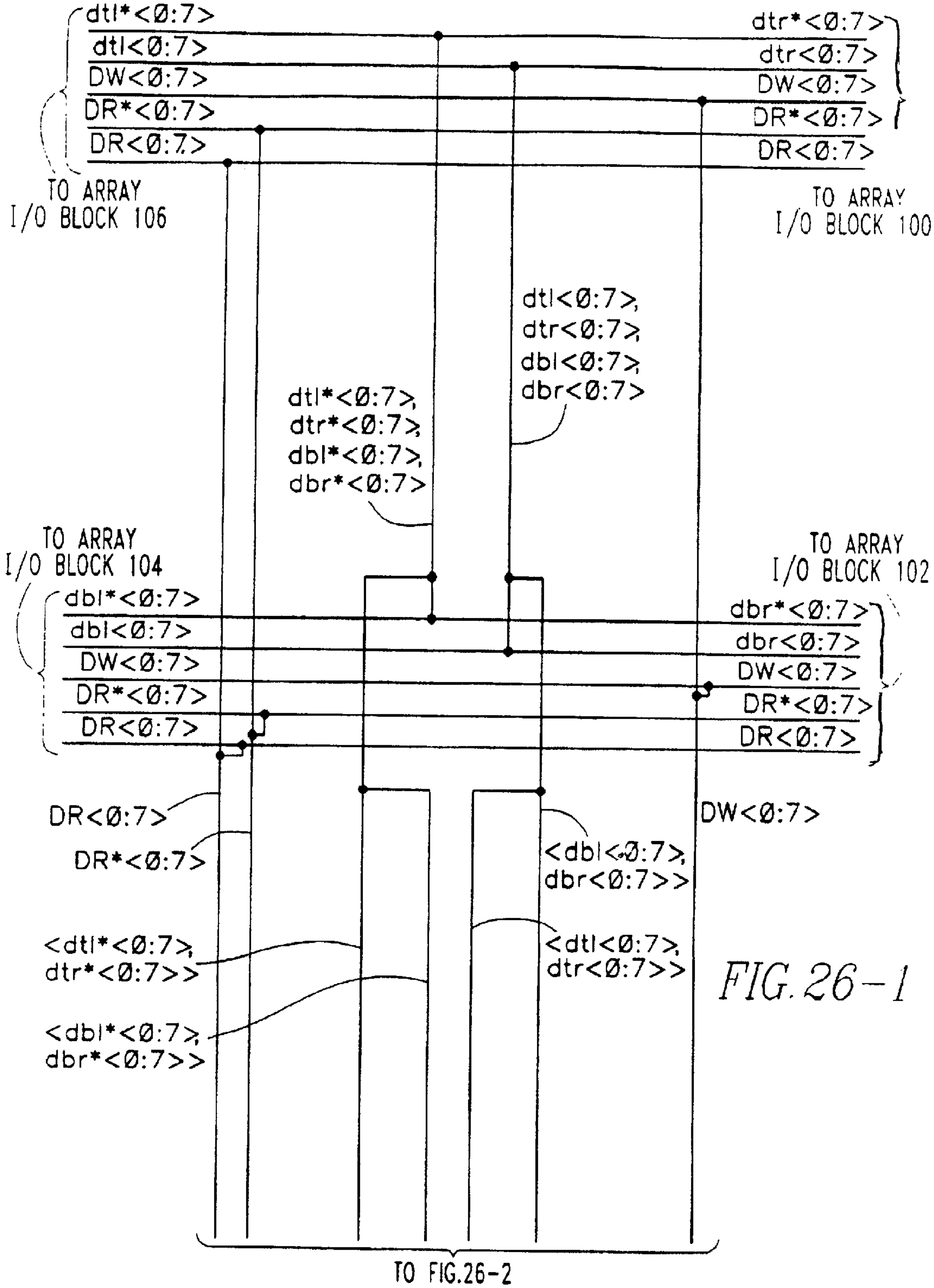
Figures 2, 26:
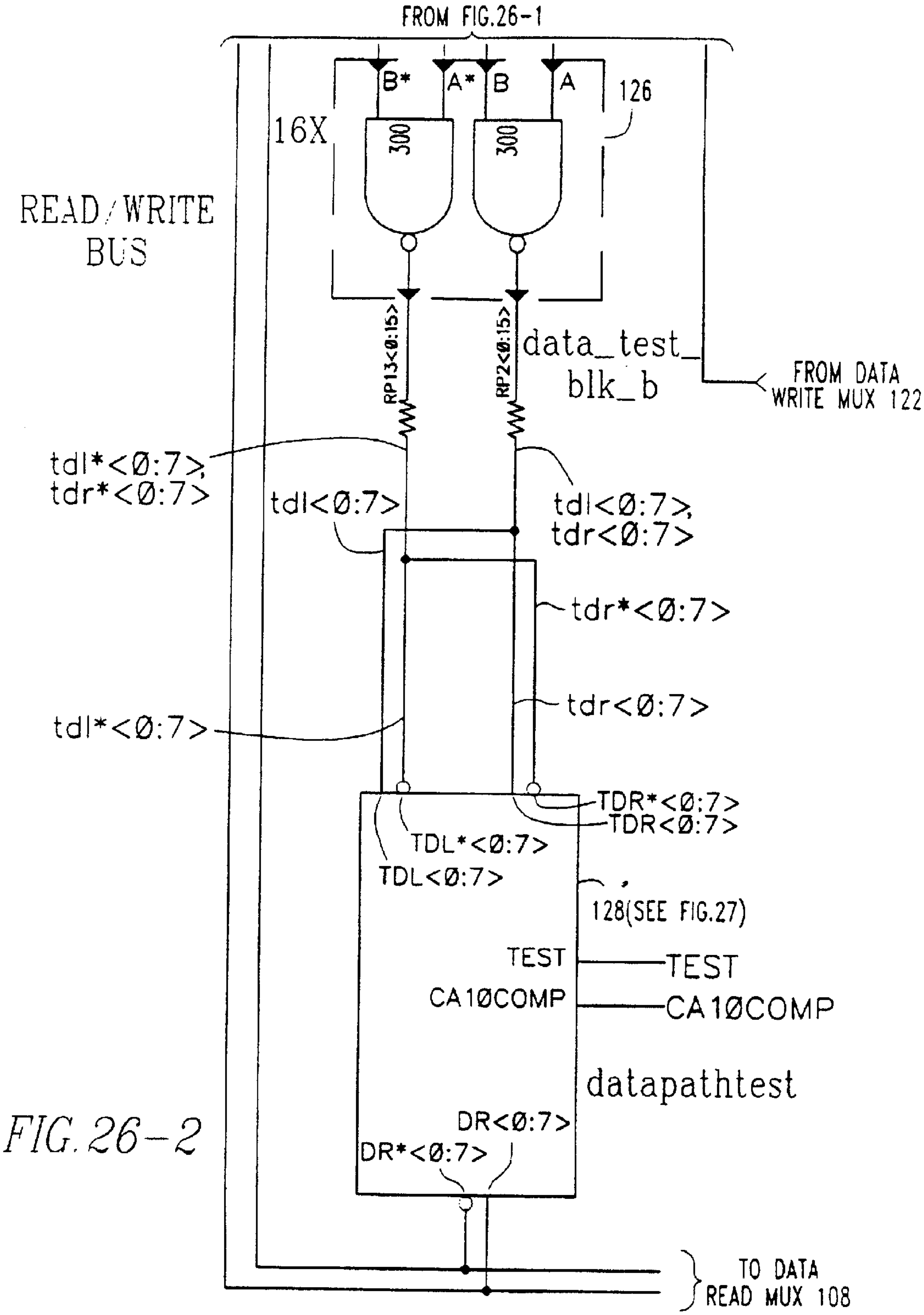
Figures 1, 27:
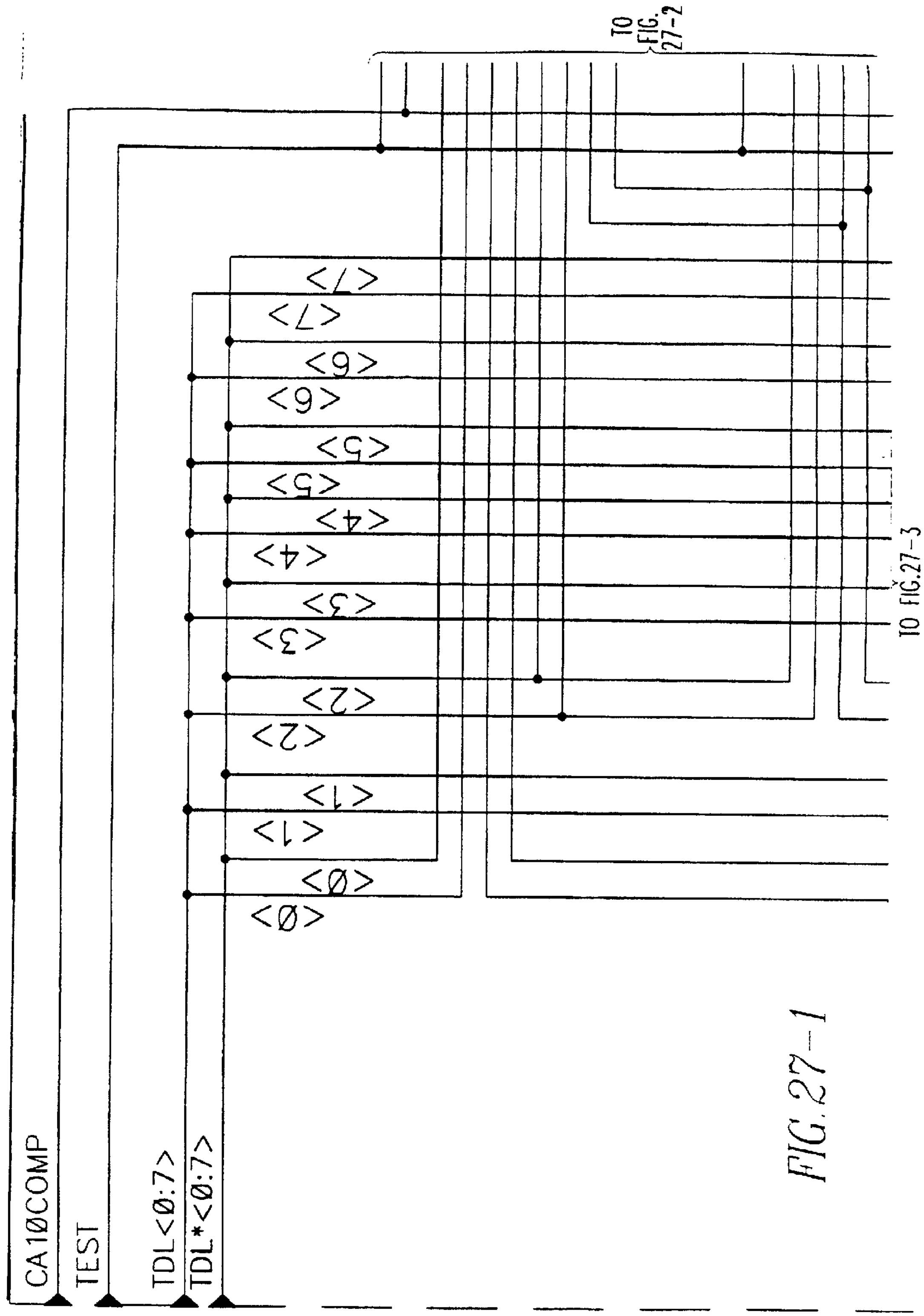
Figures 2, 27:
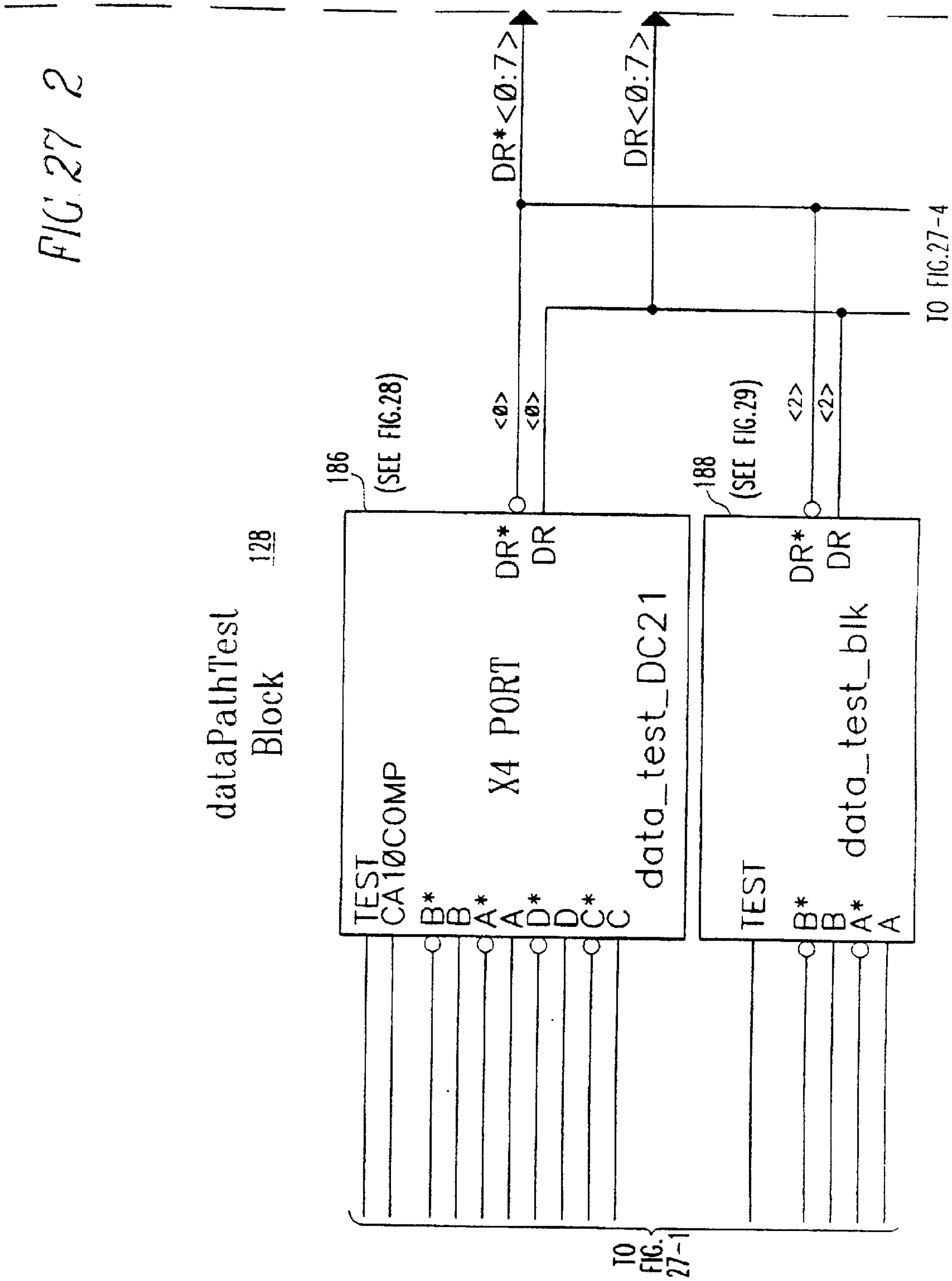
Figures 3, 27:
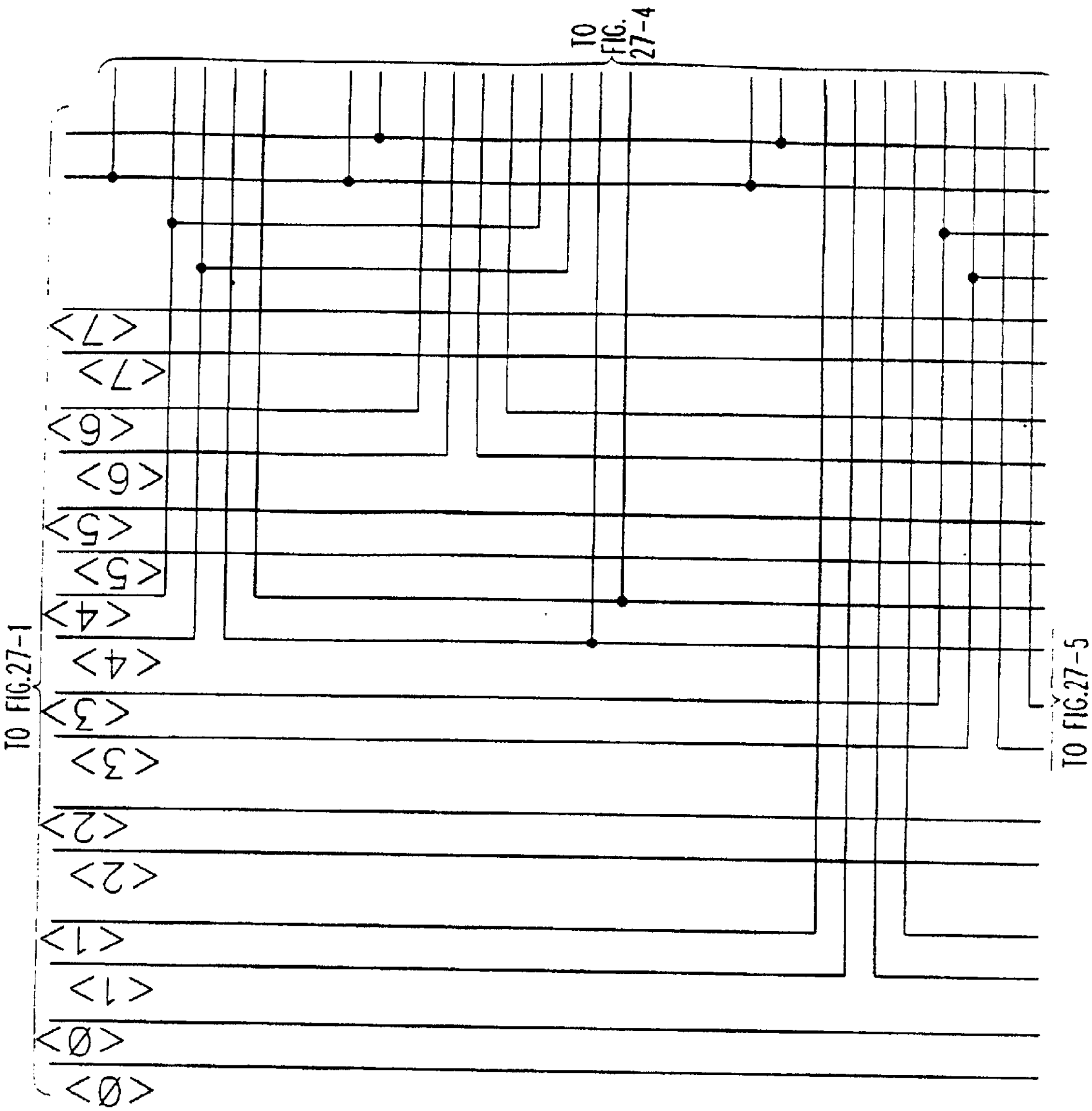
Figures 4, 27:
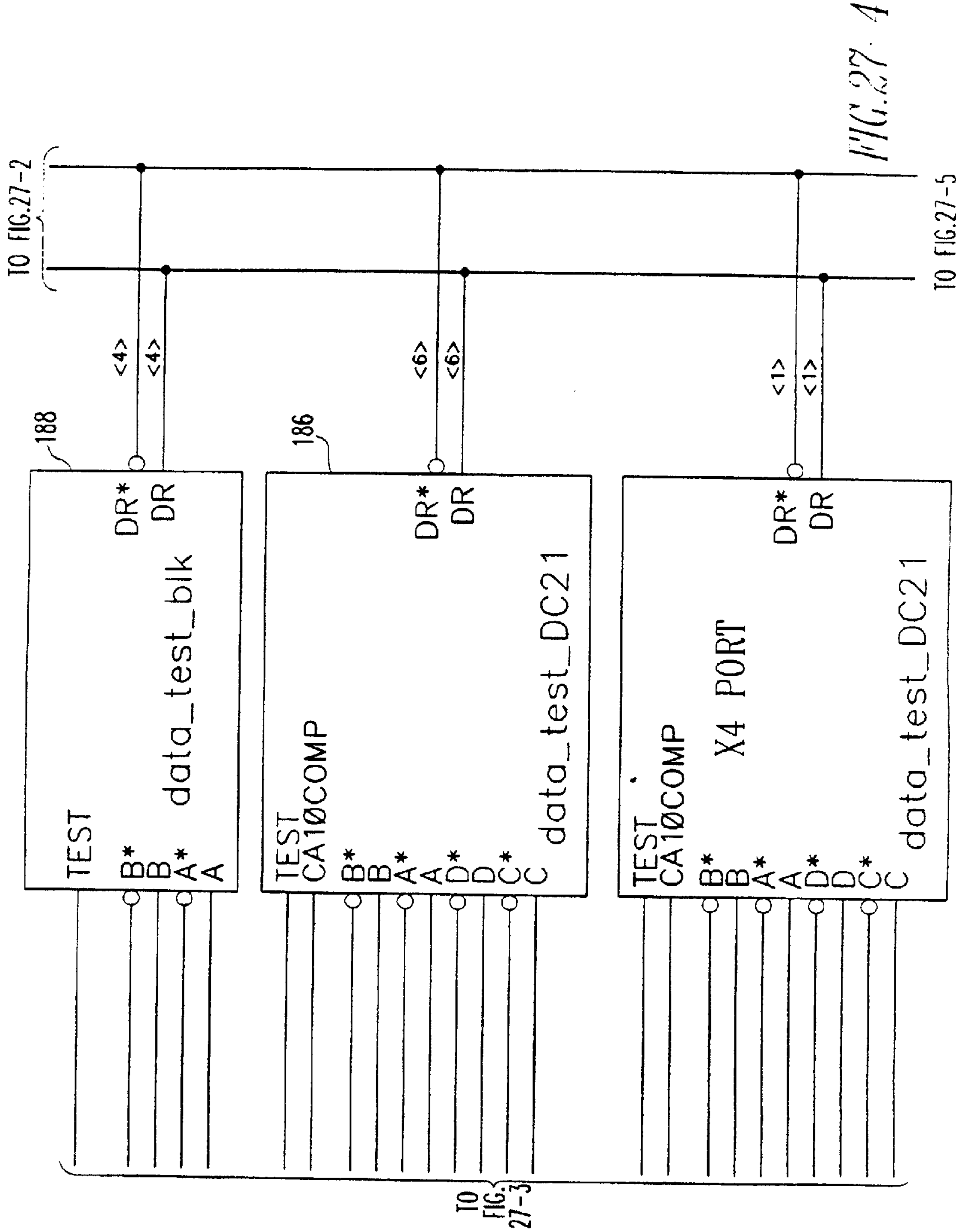
Figures 5, 27:
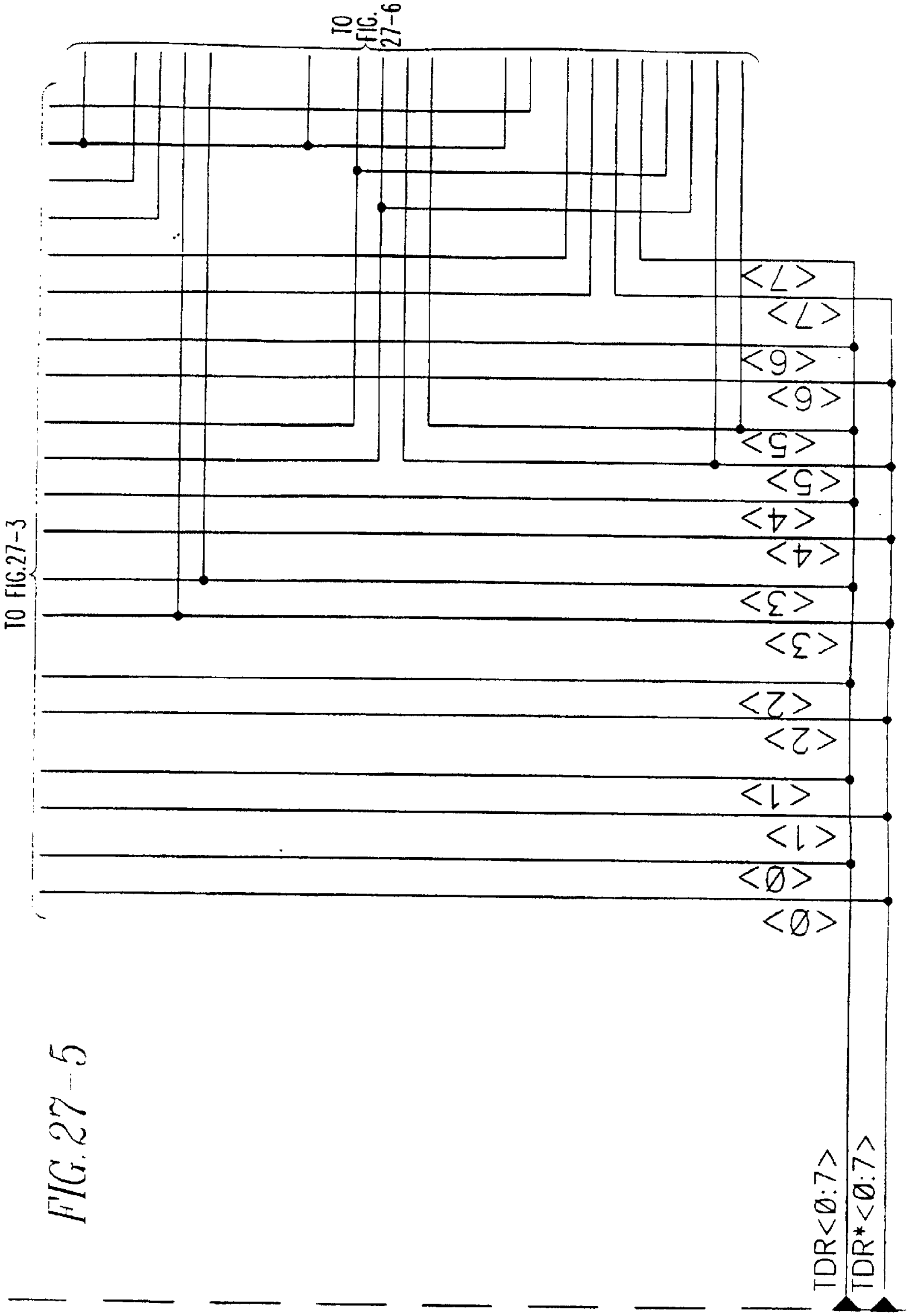
Figures 6, 27:
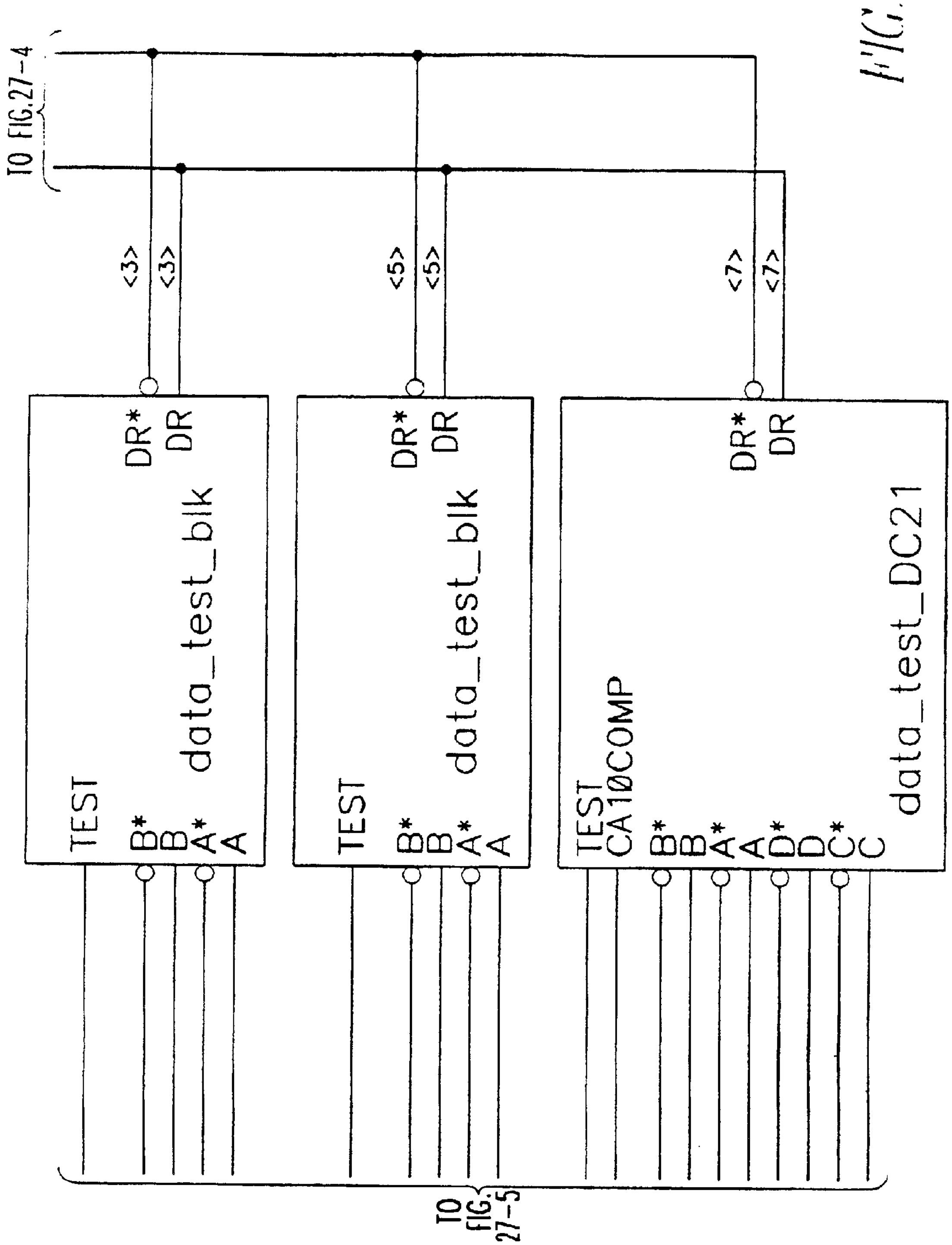
Figures 1, 28:
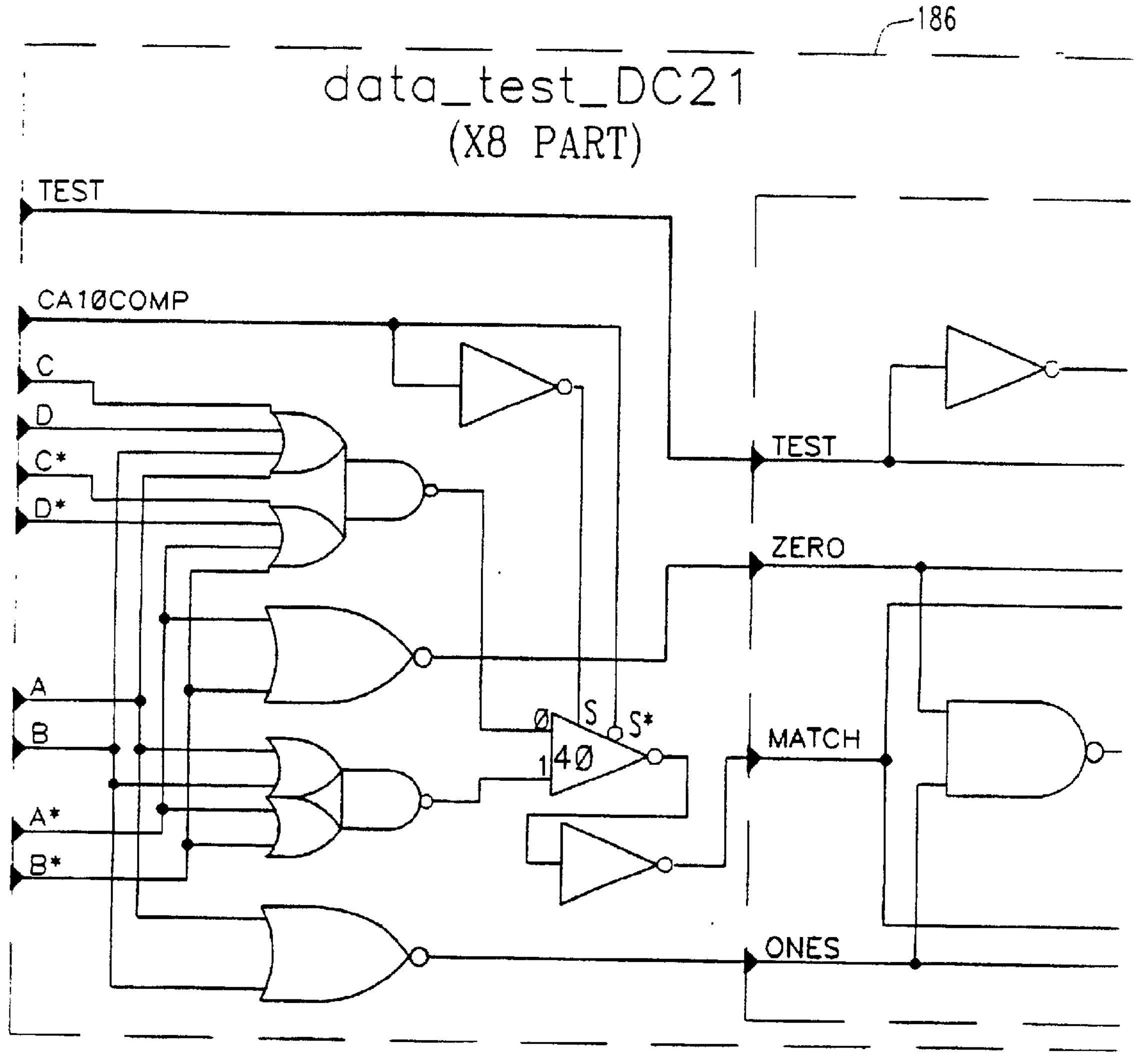
Figures 2, 28:
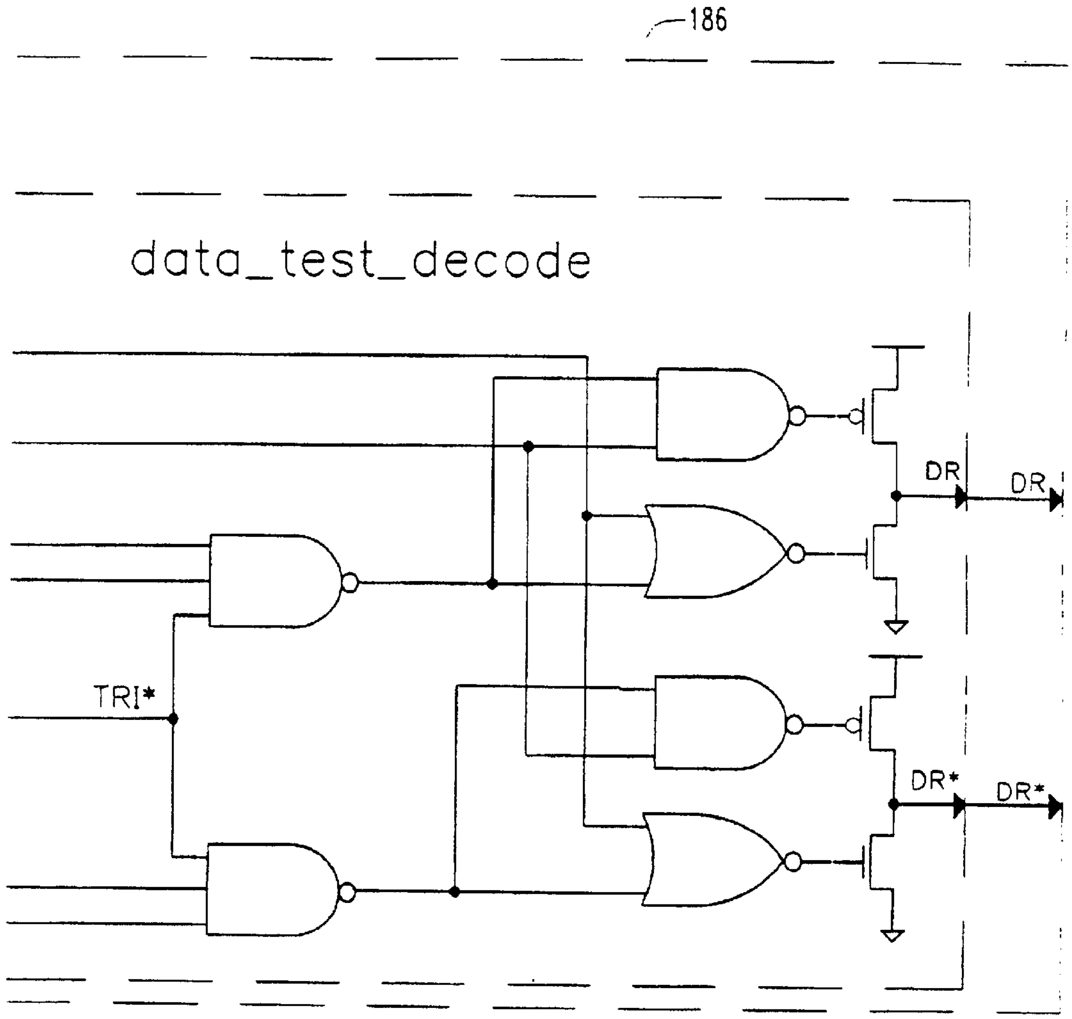
Figures 1, 29:
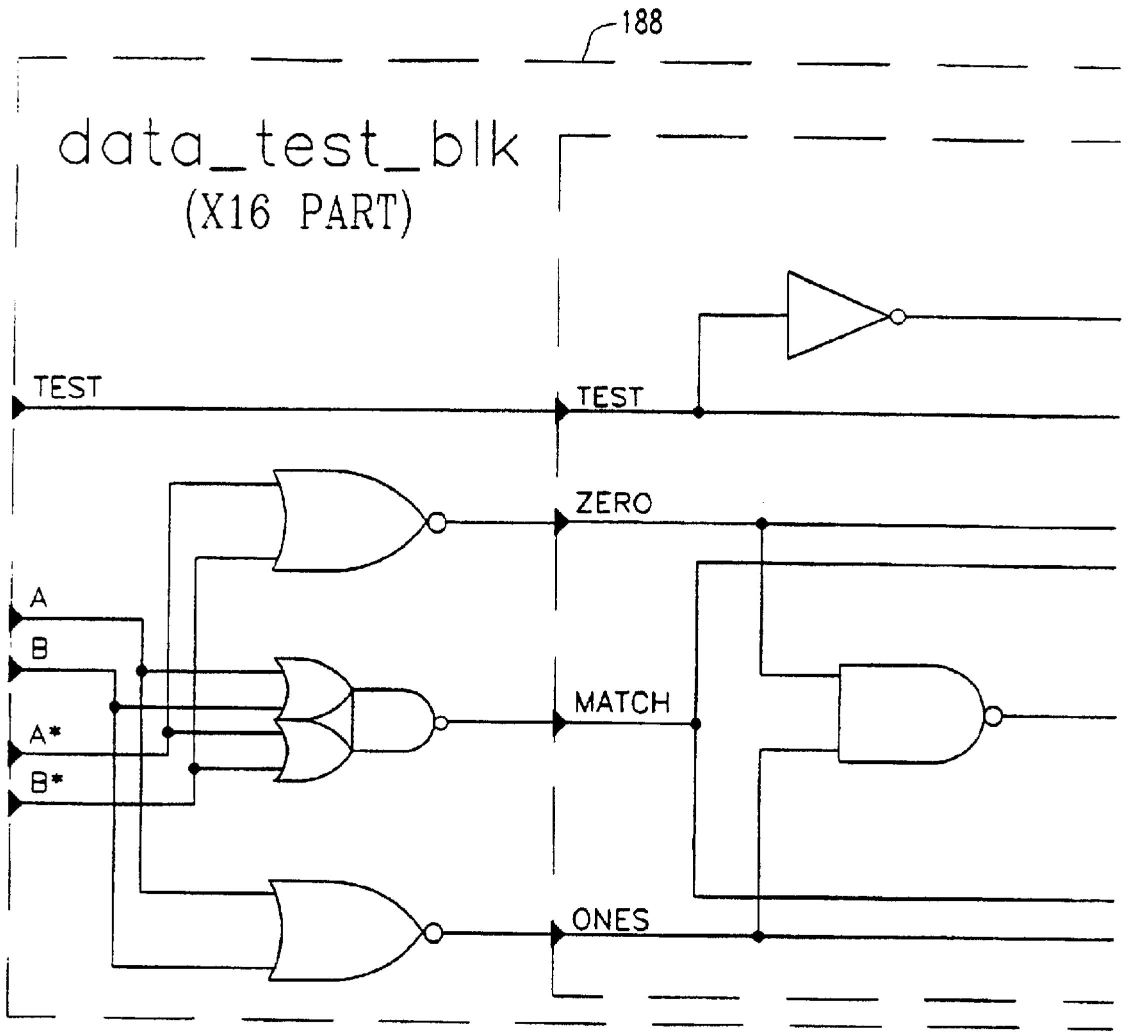
Figures 2, 29:
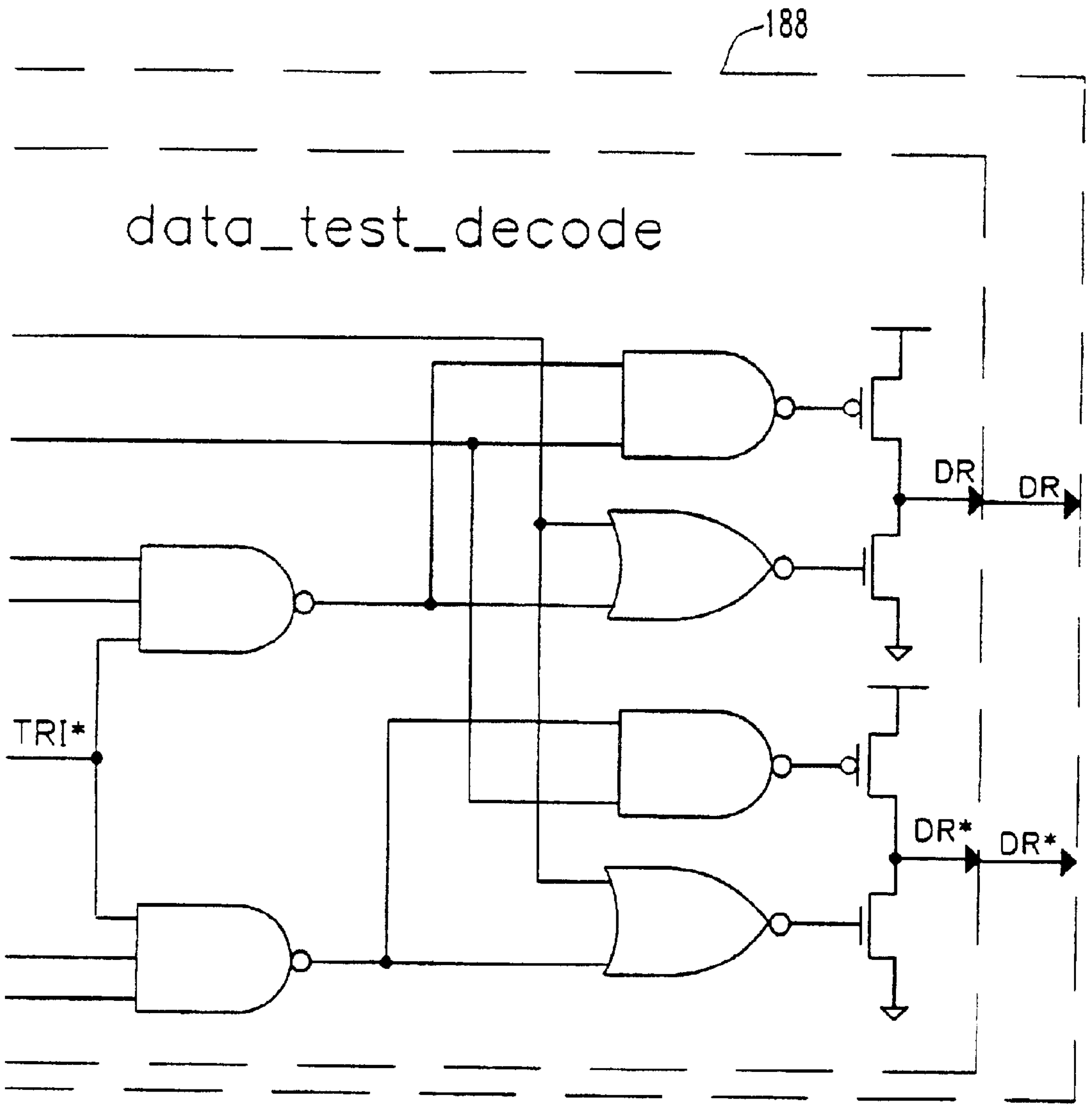

FIG. 7 is a diagram illustrating the connections made by the data multiplexers within one of the 32 Meg array blocks;

FIG. 8 is a block diagram illustrating the data read path from the array I/O block to the data pad driver and the data write path from the data in buffer back to the array I/O blocks;

FIG. 9 is a block diagram illustrating the array I/O block found in FIG. 8;

FIGS. 10A through 10D illustrate the connection details of the array I/O block shown in FIG. 9;

FIG. 11 illustrates the details of the data select blocks found in FIG. 9;

FIGS. 12A and 12B illustrate the details of the data blocks found in FIG. 9;

FIGS. 13A and 13B illustrate the details of a dc sense amp control used in conjunction with the dc sense amps found in the data blocks;

FIG. 14 illustrates the details of the mux decode A circuit shown in FIG. 13A;

FIG. 15 illustrates the details of the mux decode B circuit shown in FIG. 13A;

FIGS. 16A, 16B, and 16C illustrate the details of the data read mux shown in FIG. 8;

FIG. 17 illustrates the details of the data read mux control circuit shown in FIG. 8;

FIG. 18 illustrates the details of the data output buffer shown in FIG. 8;

FIG. 19 illustrates the details of the data out control circuit shown in FIG. 8;

FIG. 20 illustrates the details of the data pad driver shown in FIG. 8;

FIG. 21 illustrates the details of the data read bus bias circuit shown in FIG. 8;

FIG. 22 illustrates the details of the data in buffer and data in buffer enable shown in FIG. 8;

FIG. 23 illustrates the details of the data write mux shown in FIG. 8;

FIG. 24 illustrates the details of the data write mux control shown in FIG. 8;

FIG. 25 illustrates the details of the data test comp. circuit shown in FIG. 9;

FIG. 26 illustrates the details of the data test block b shown in FIG. 8;

FIG. 27 illustrates the data path test block shown in FIGS. 8 and 26;

FIG. 28 illustrates the details of the data test DC 21 circuits shown in FIG. 27;

FIG. 29 illustrates the details of the data test blocks shown in FIG. 27;

Product Configuration and Exemplary Design Specifications (See Section V)

Figures 1, 30:
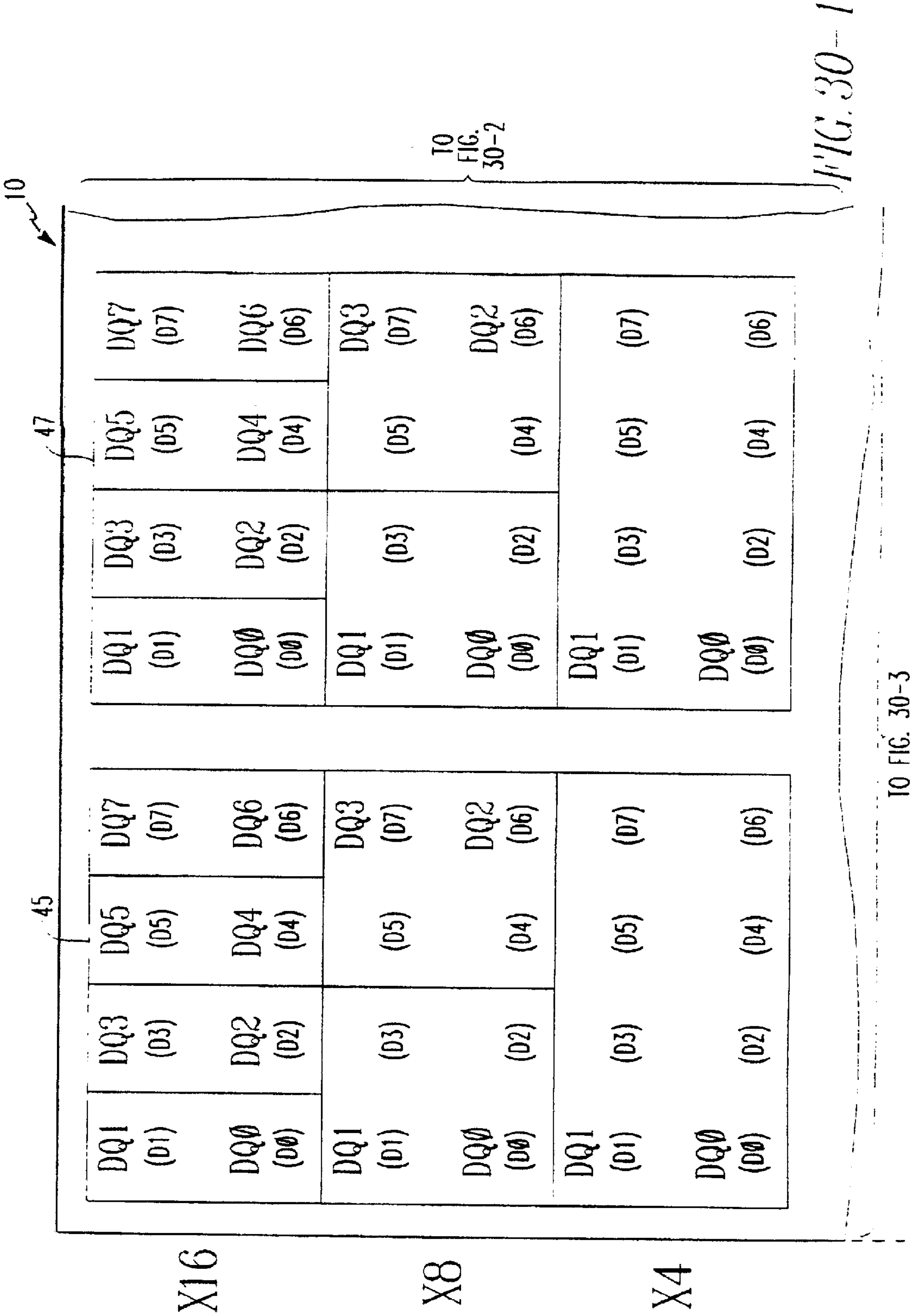
Figures 2, 30:
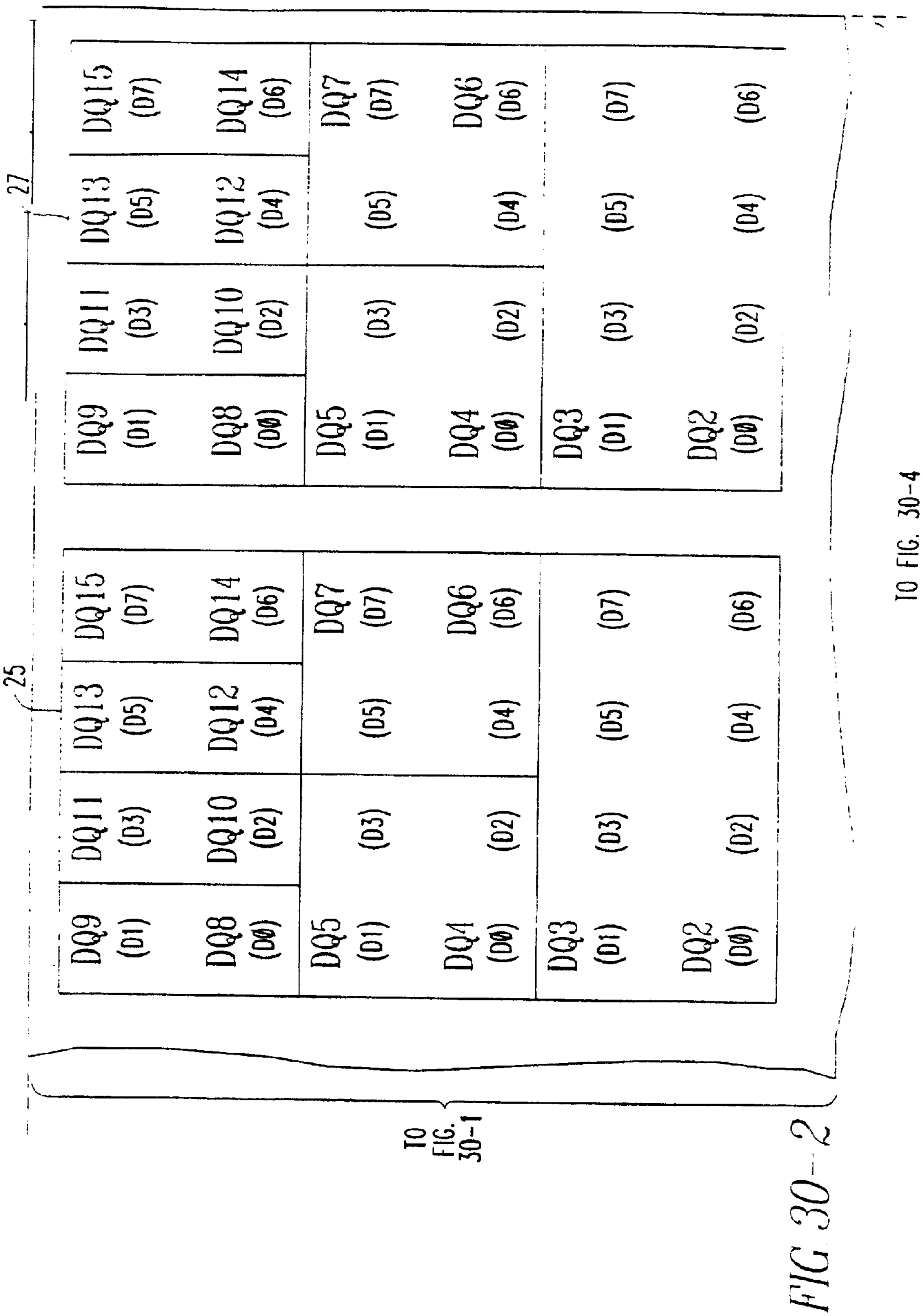
Figures 3, 30:
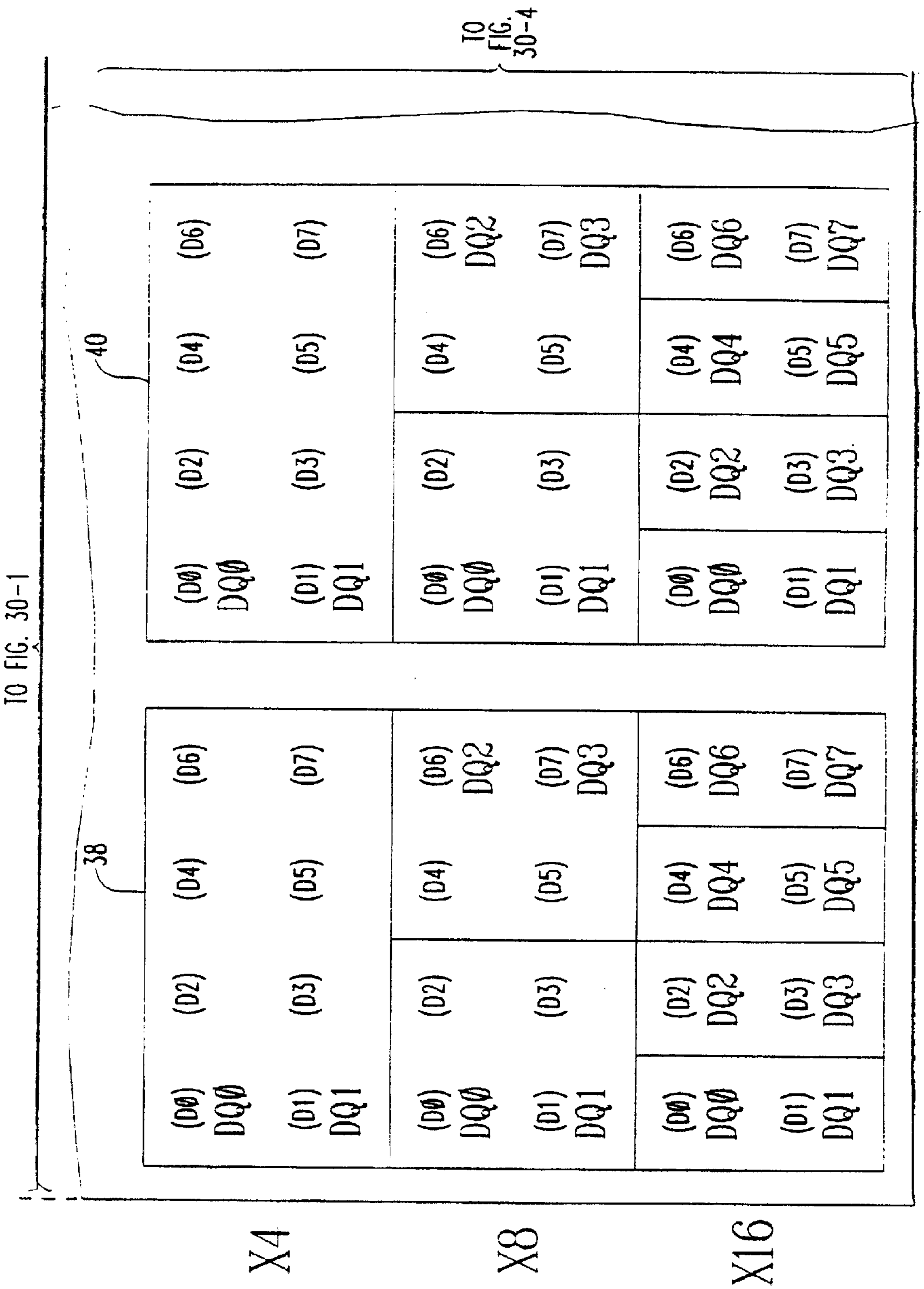
Figures 4, 30:
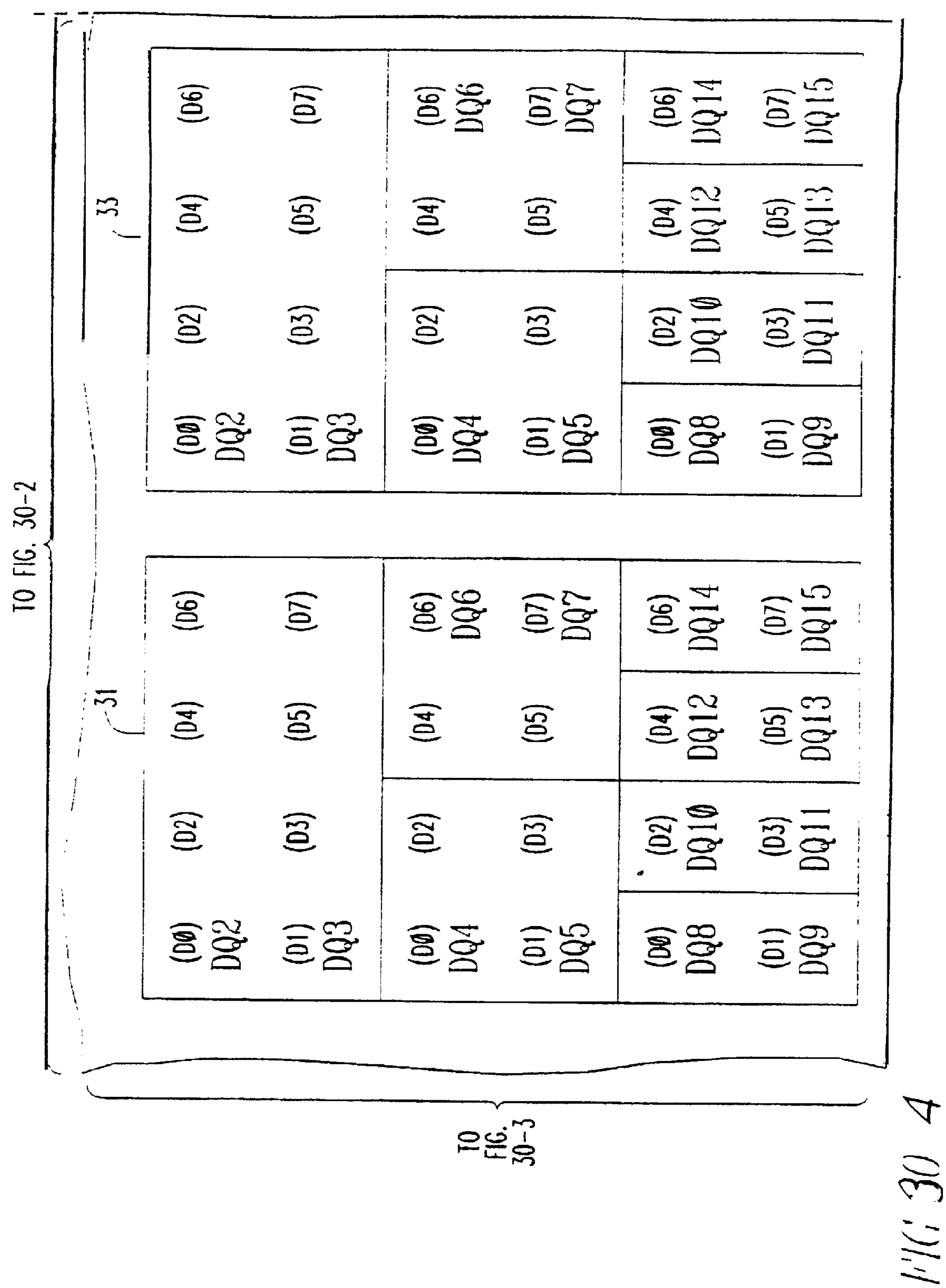

FIG. 30 illustrates the mapping of the address bits to the 256 Meg array;

FIGS. 31A, 31B, and 31C are a bonding diagram illustrating the pin assignments for a ×4, ×8, and ×16 part;

FIG. 32A illustrates a column address map for the 256 Meg memory device of the present invention;

FIG. 32B illustrates a row address map for a 64 Meg quadrant;

Bus Architecture (See Section VI)

FIGS. 33A, 33B, and 33C are a diagram illustrating the primary power bus layout;

FIGS. 33D and E are a diagram illustrating the approximate positions of the pads, the 32 Meg arrays, and the voltage supplies;

FIGS. 34A, 34B, and 34C are a diagram illustrating the pads connected to the power buses;

Voltage Supplies (See Section VII)

Figure 35:
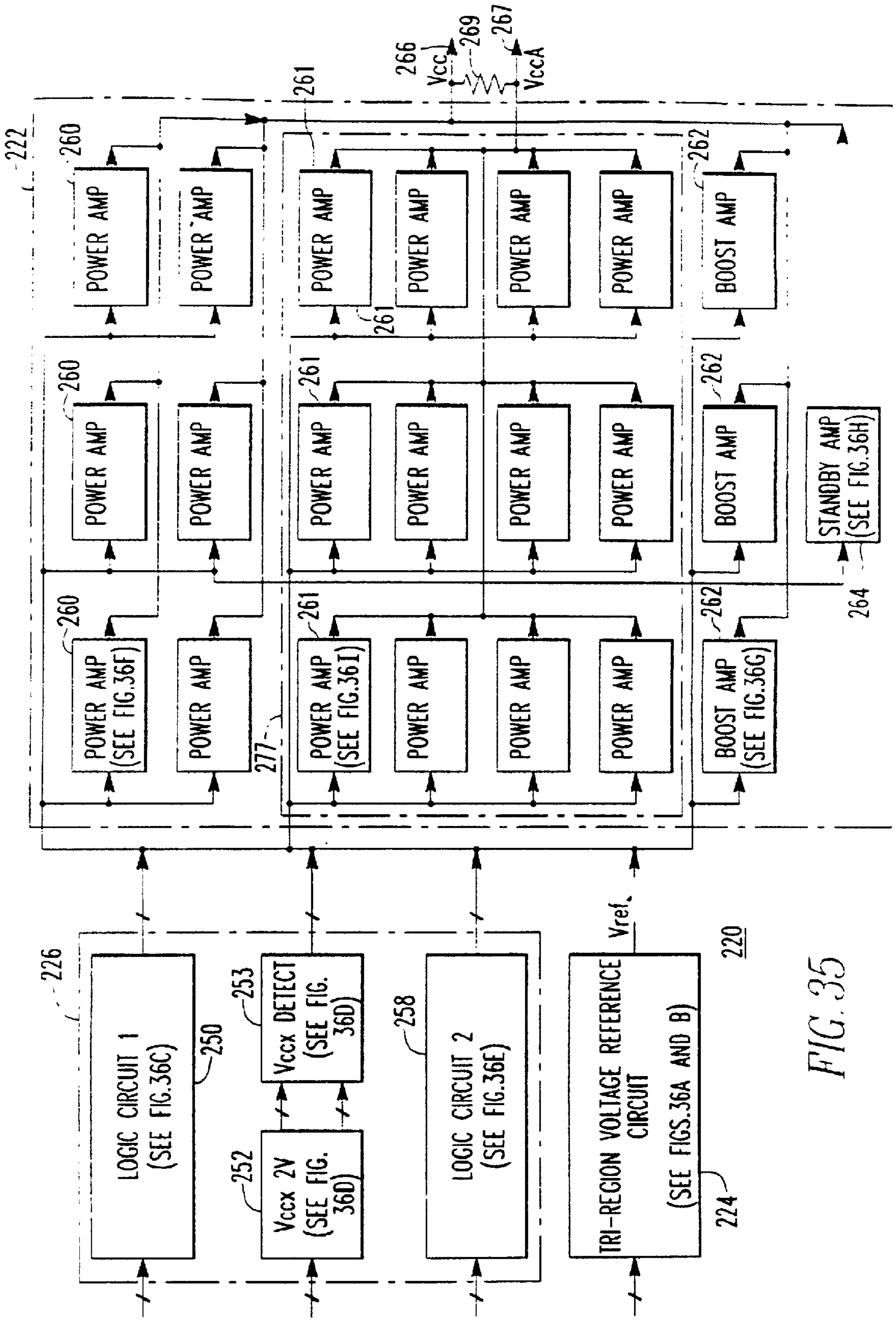
Figure 36B:
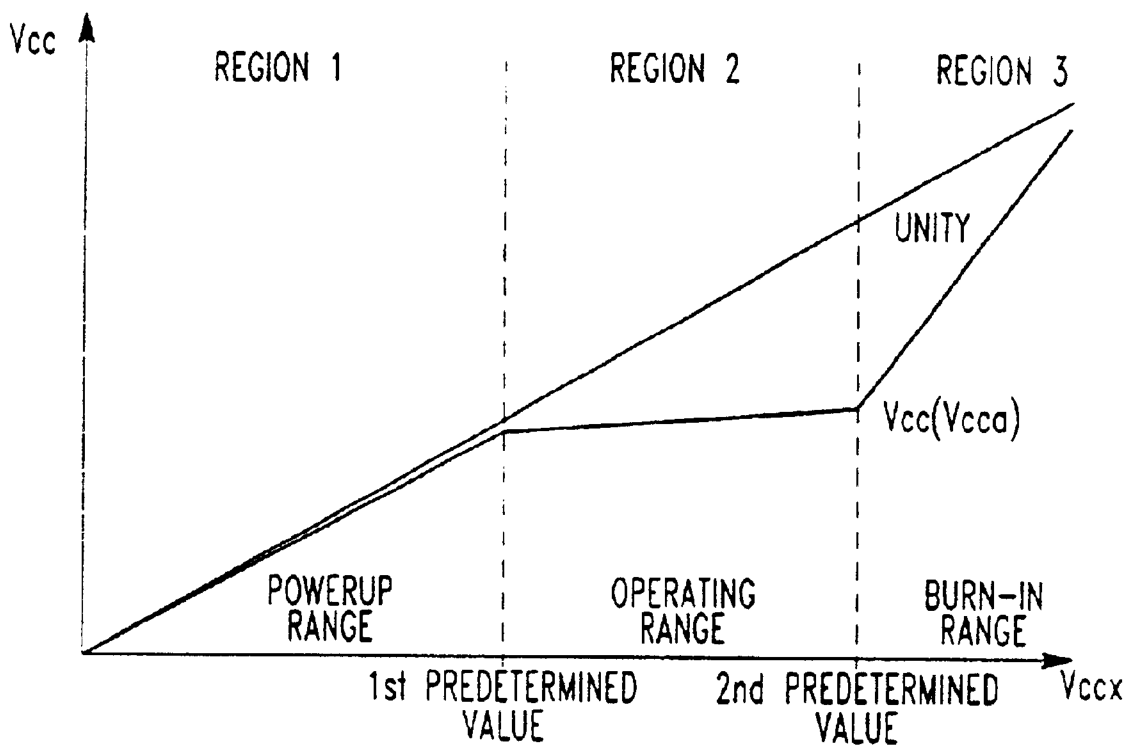
Figure 36D:
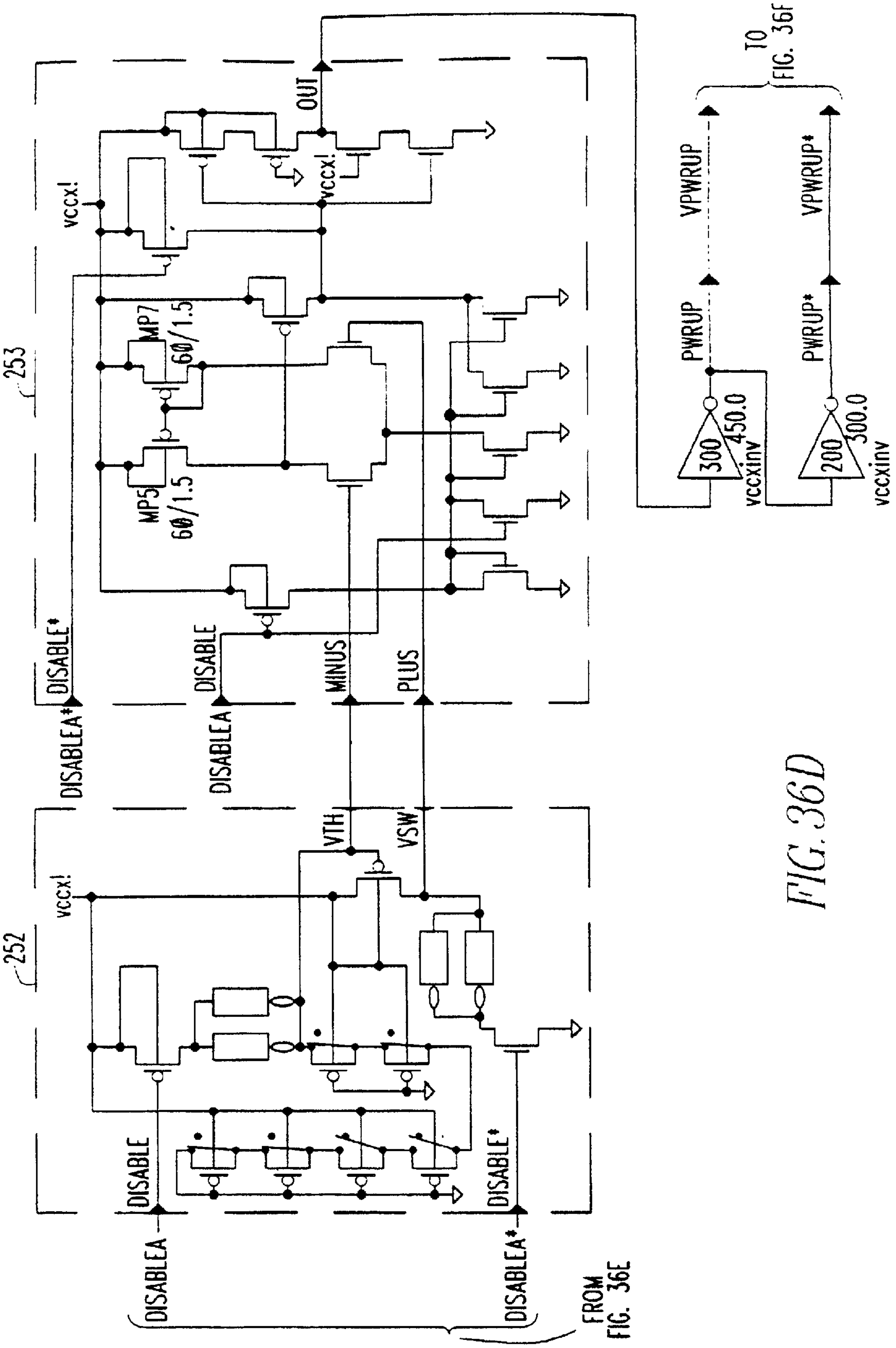
Figure 36E:
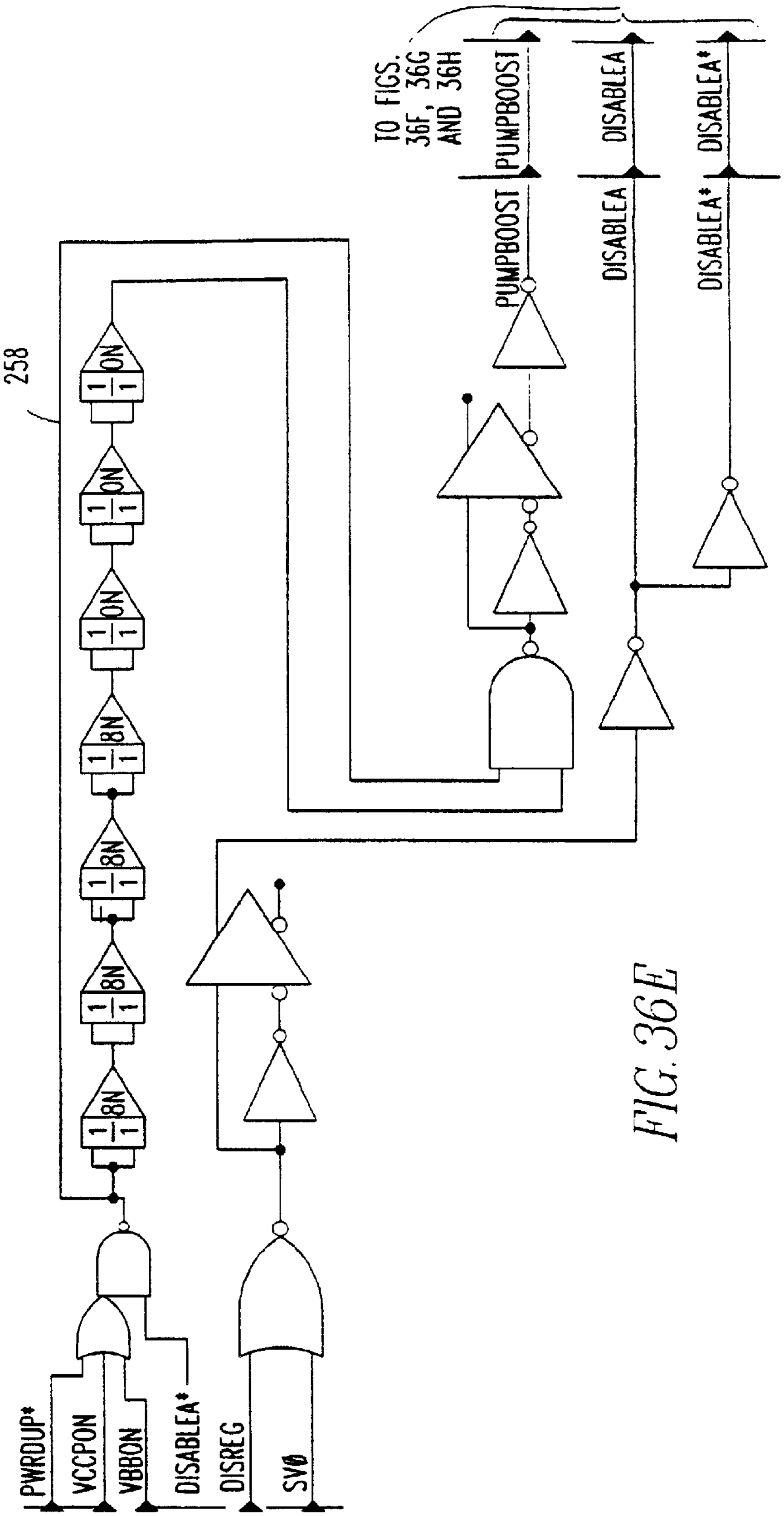
Figure 36F:
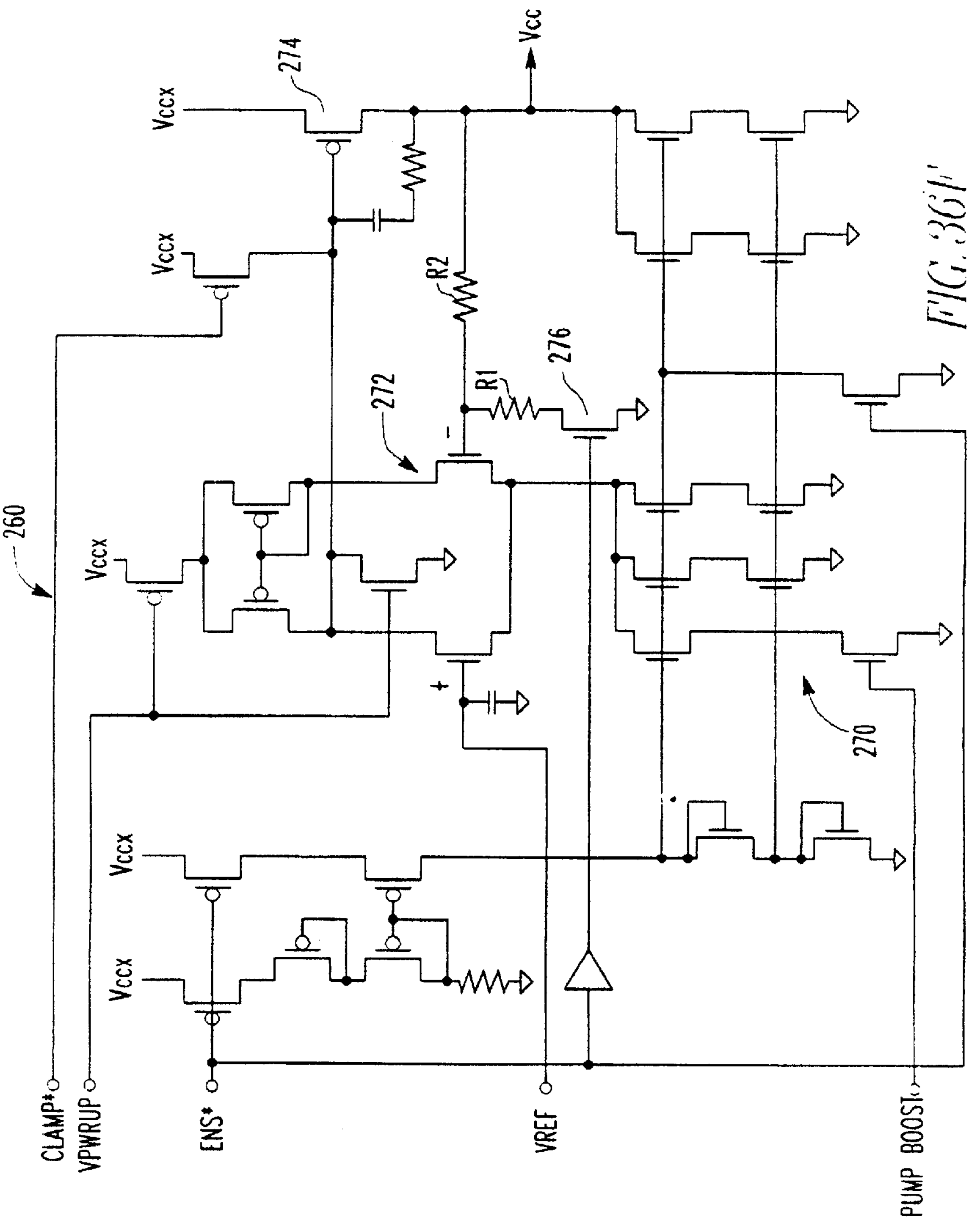
Figure 36G:
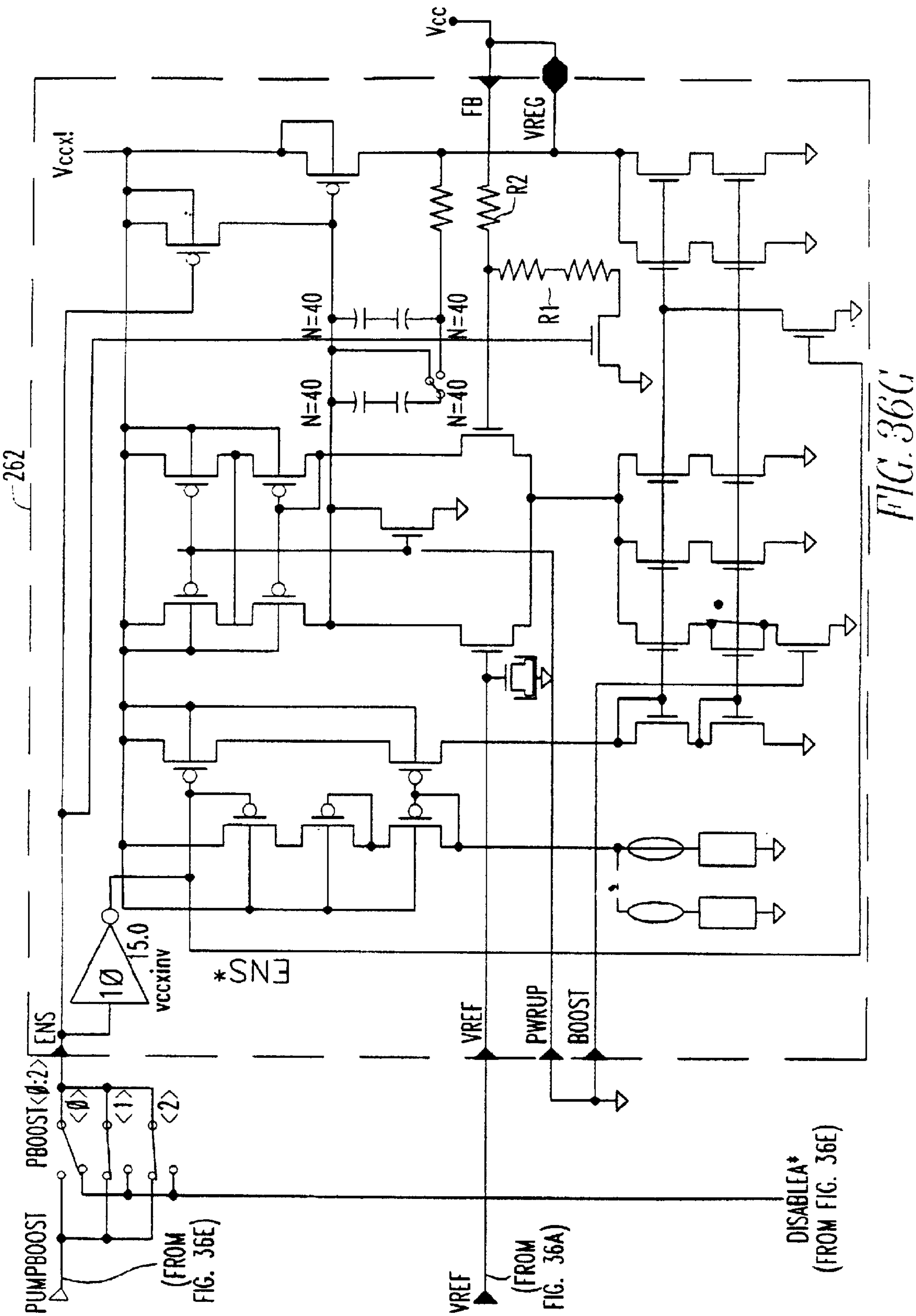
Figure 36H:
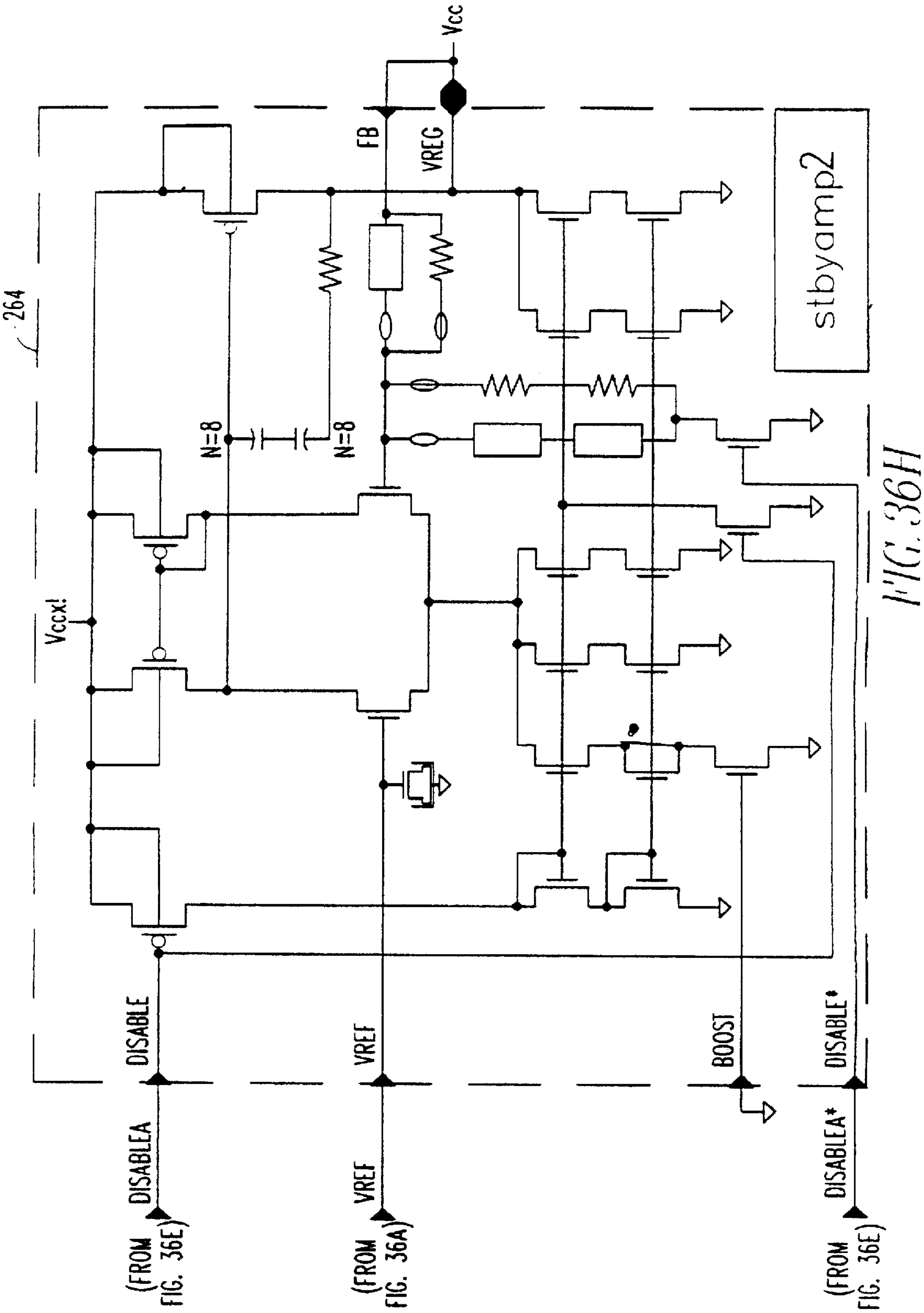
Figure 36I:
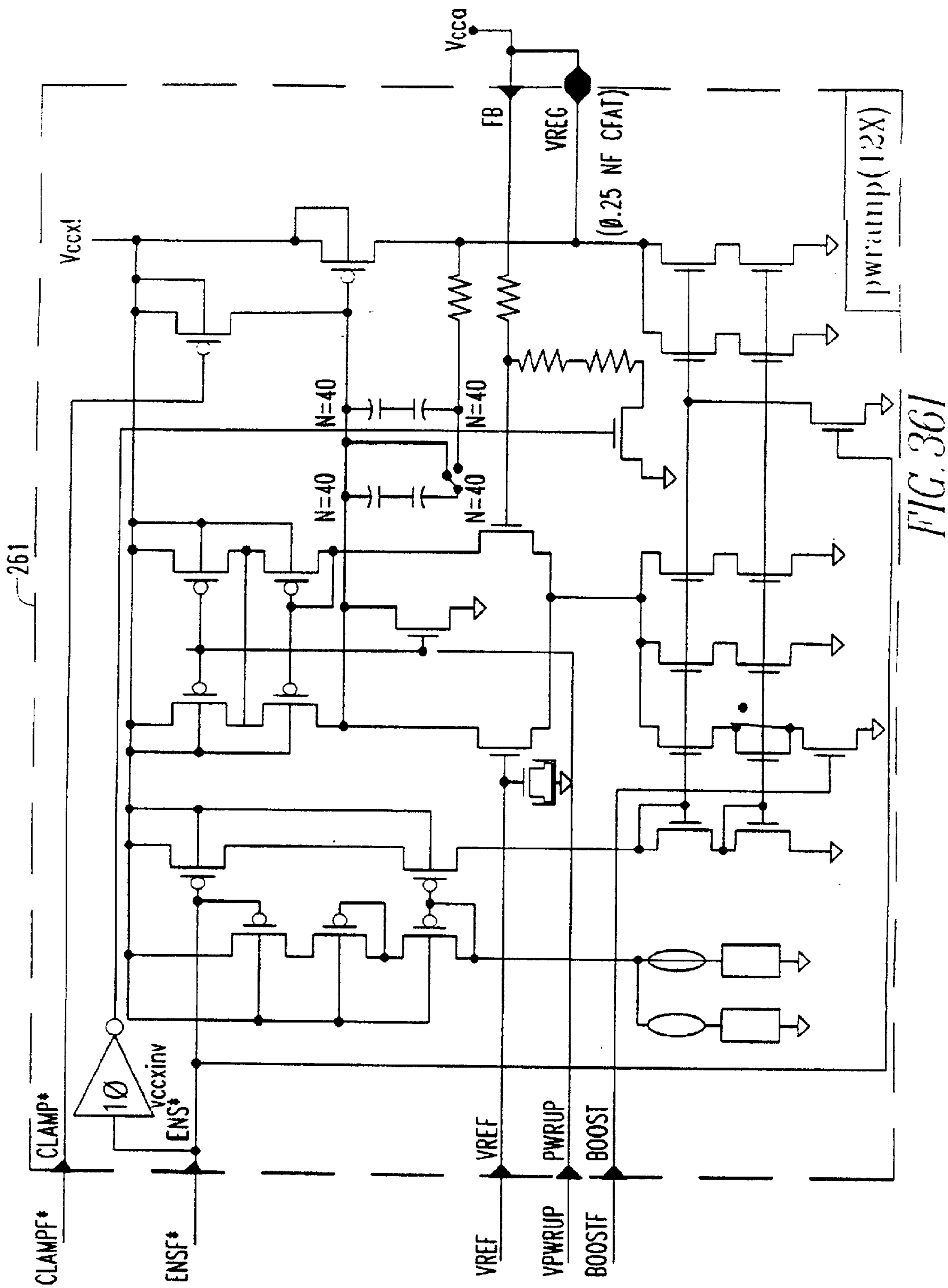
Figure 37:
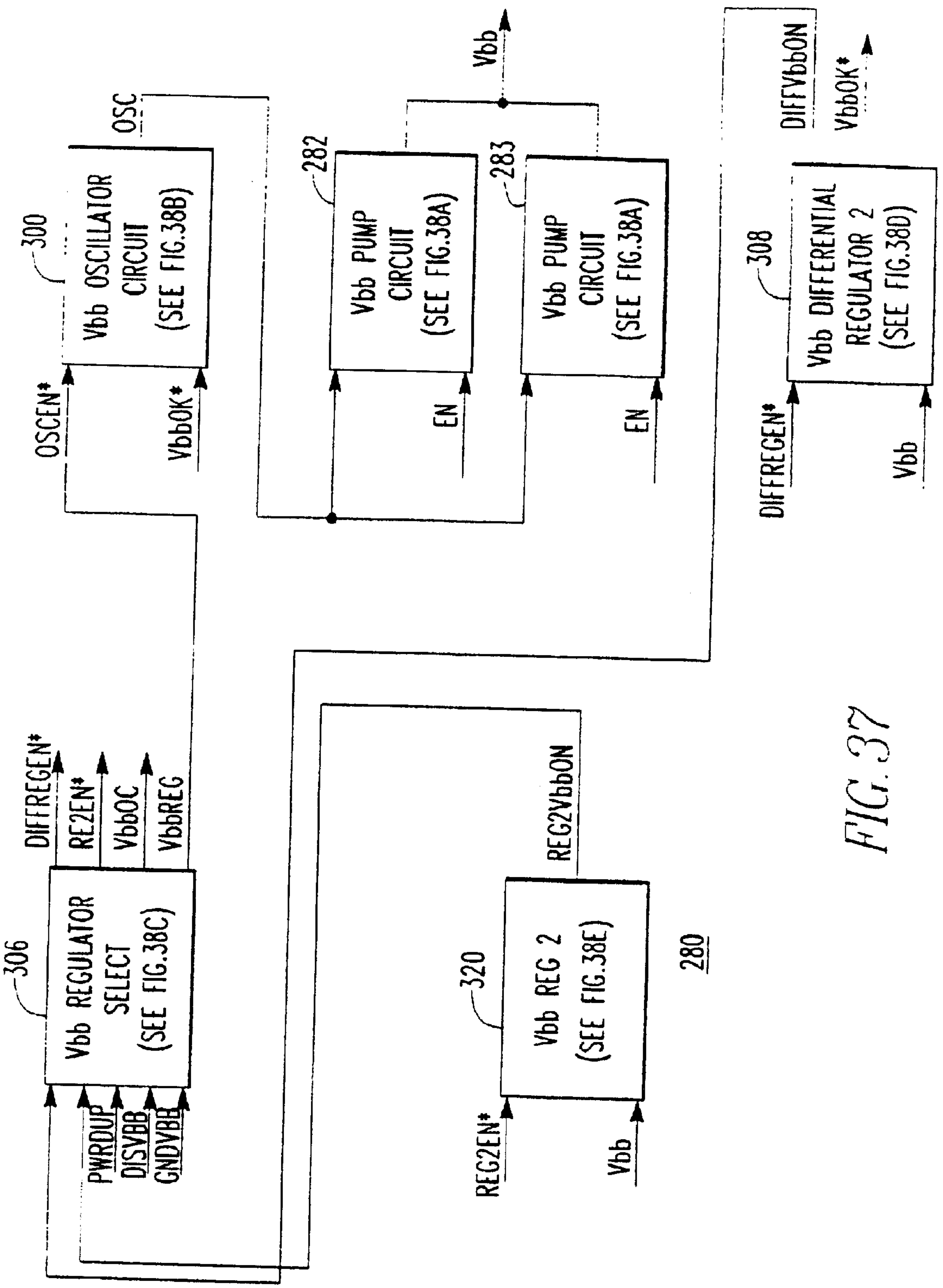
Figure 38A:
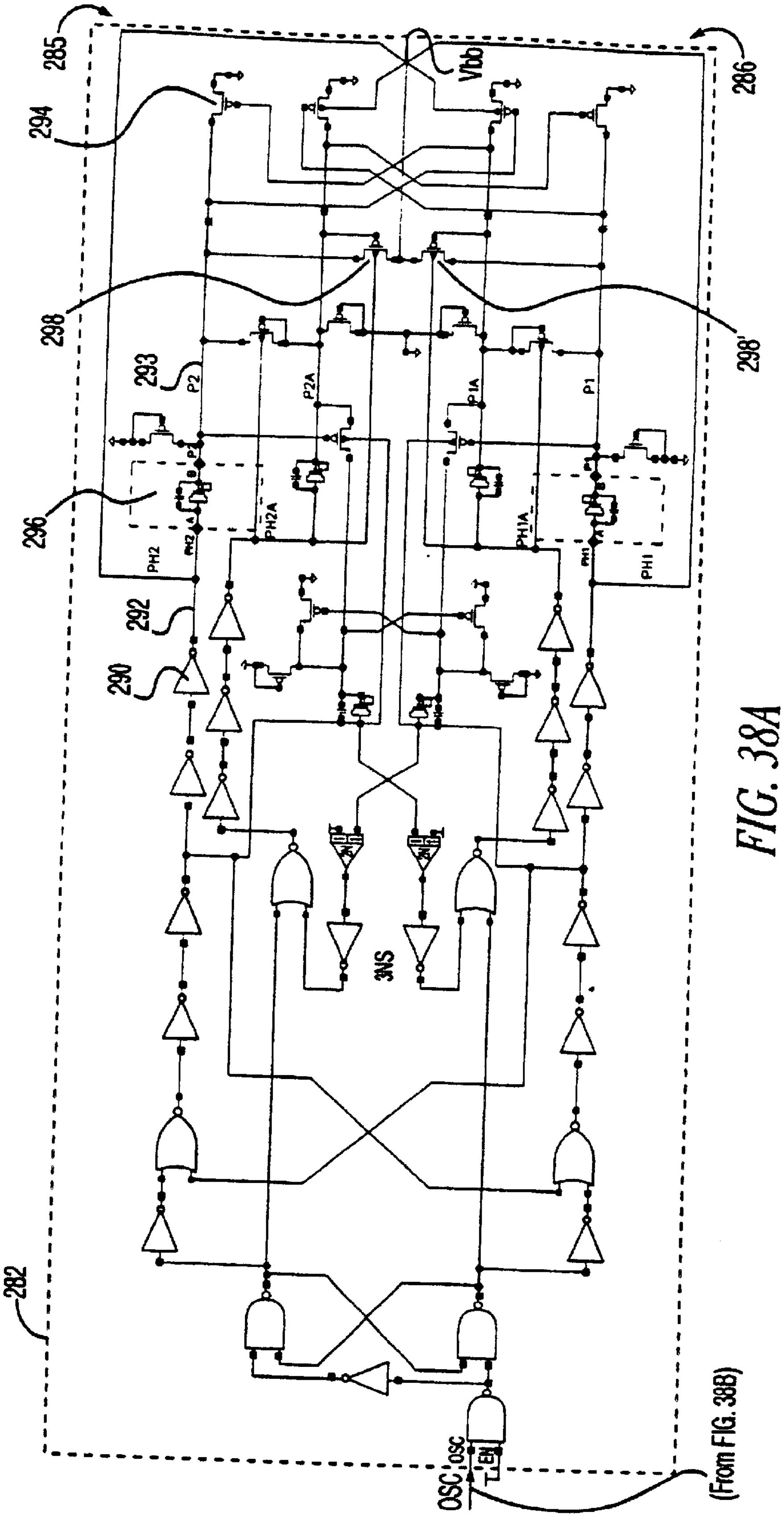
Figure 38B:
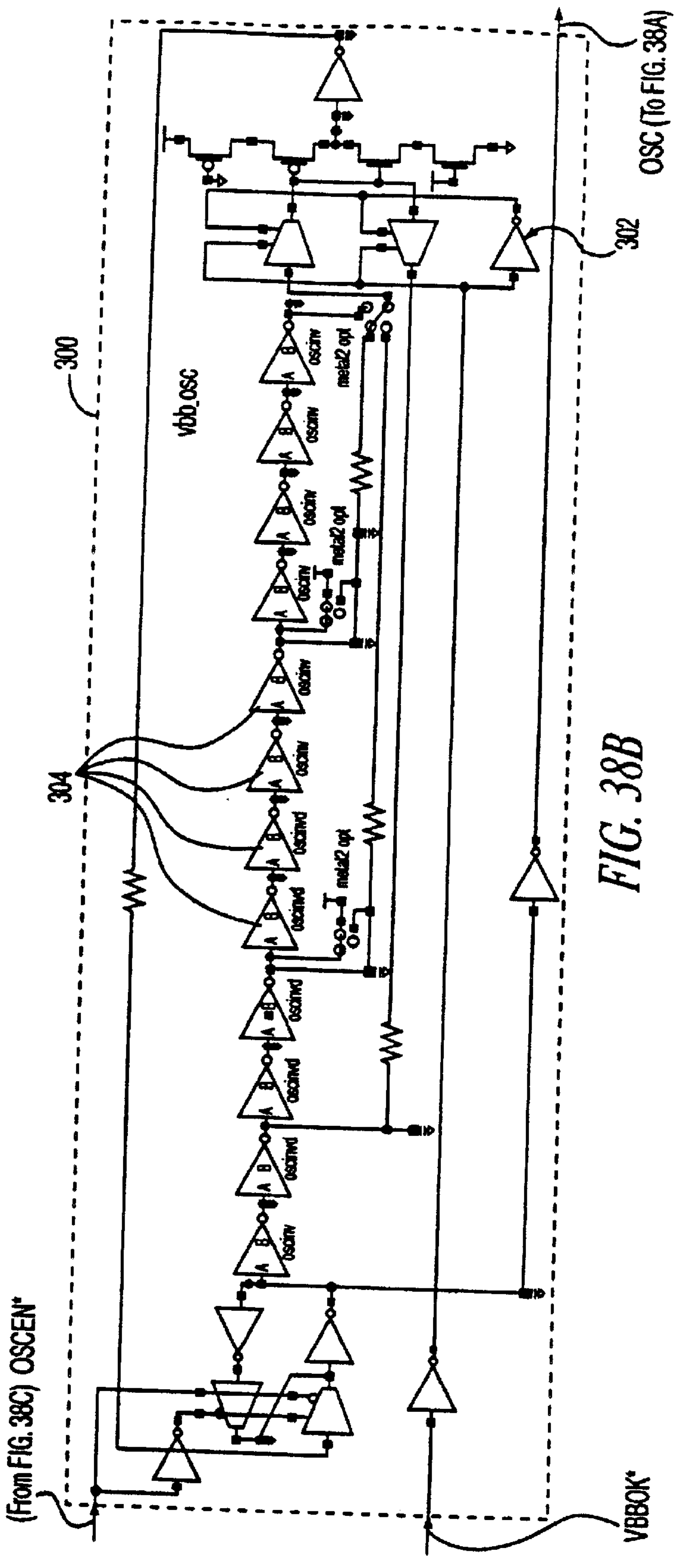
Figure 38C:
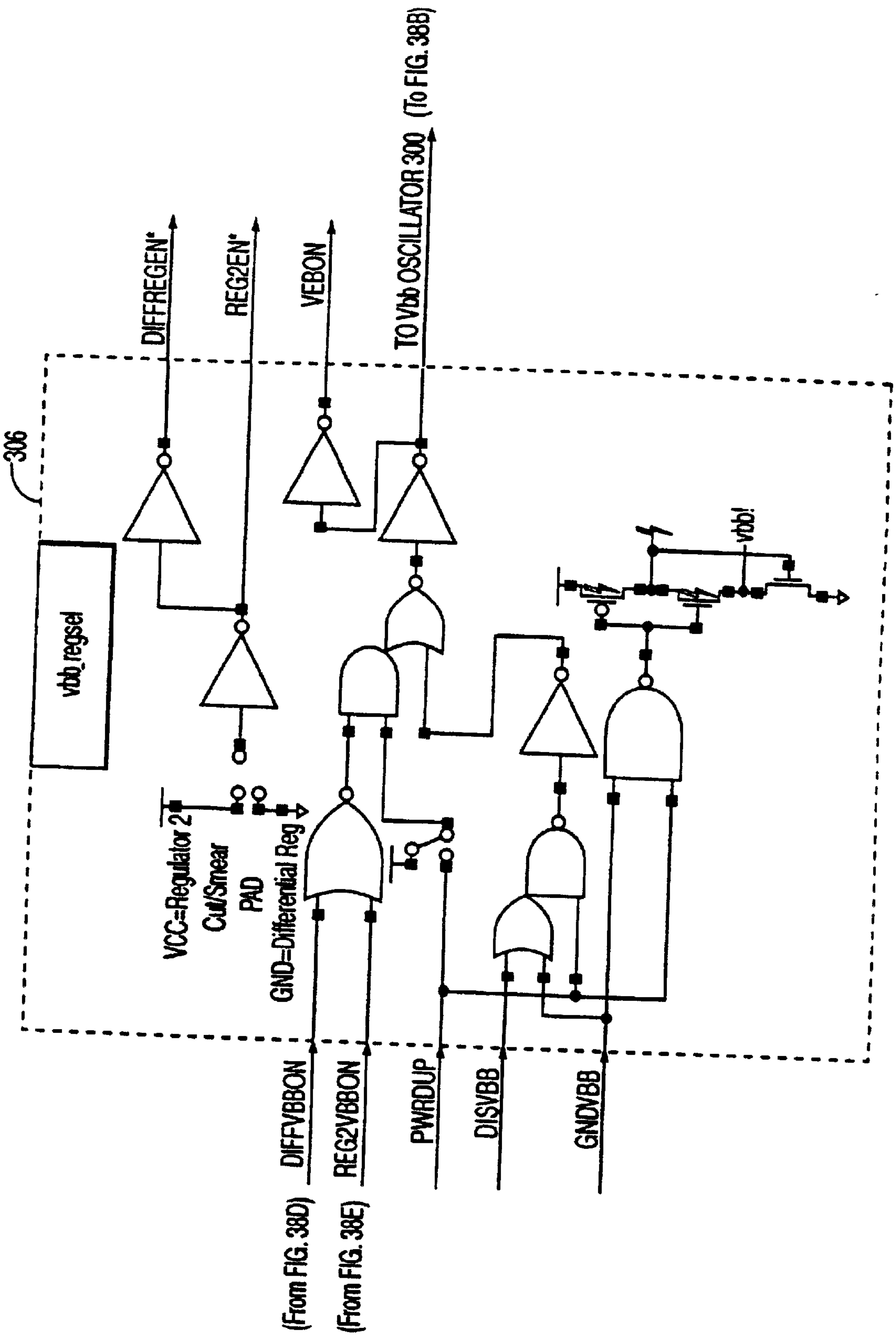
Figure 38D:
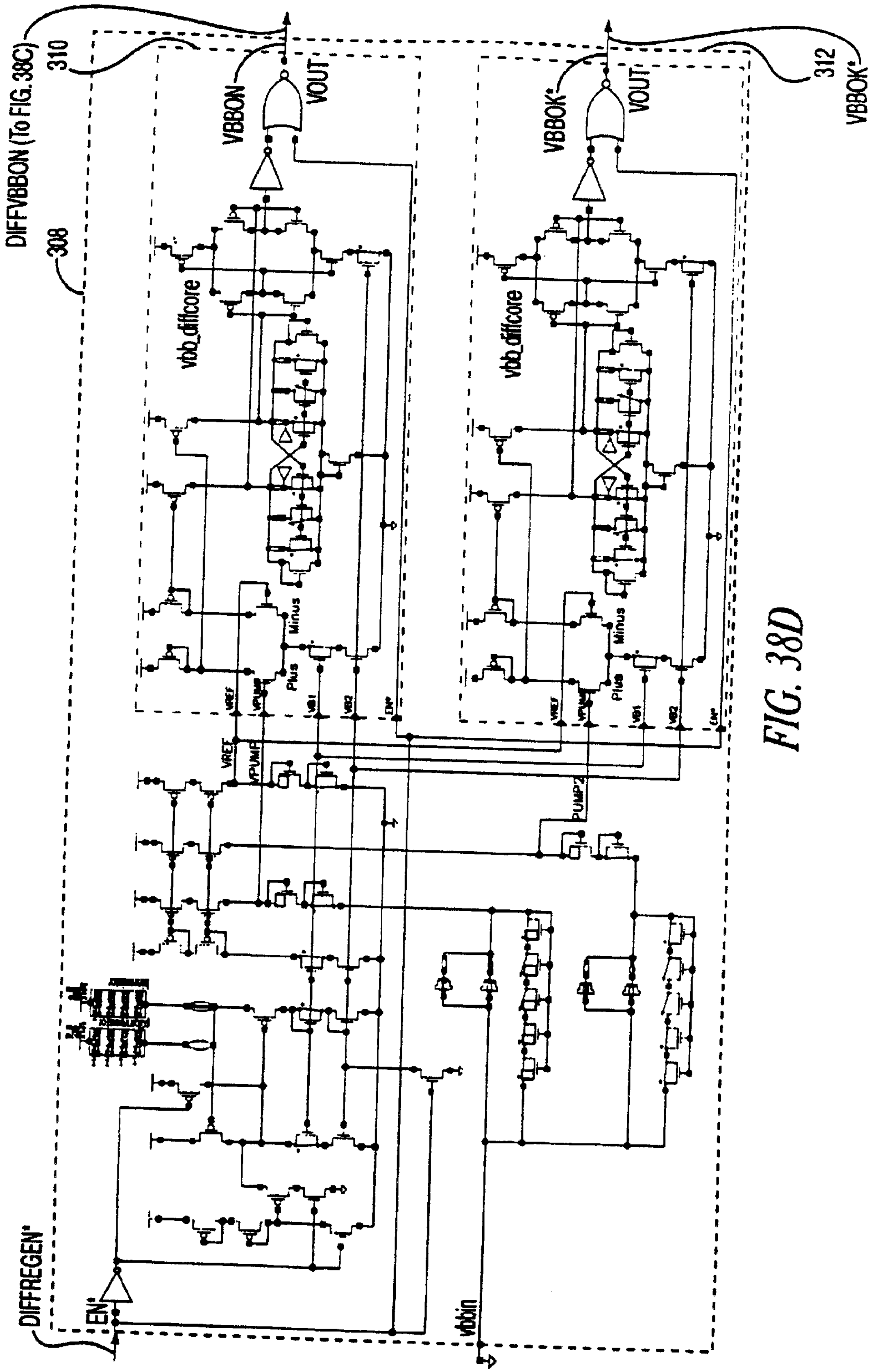
Figure 38E:
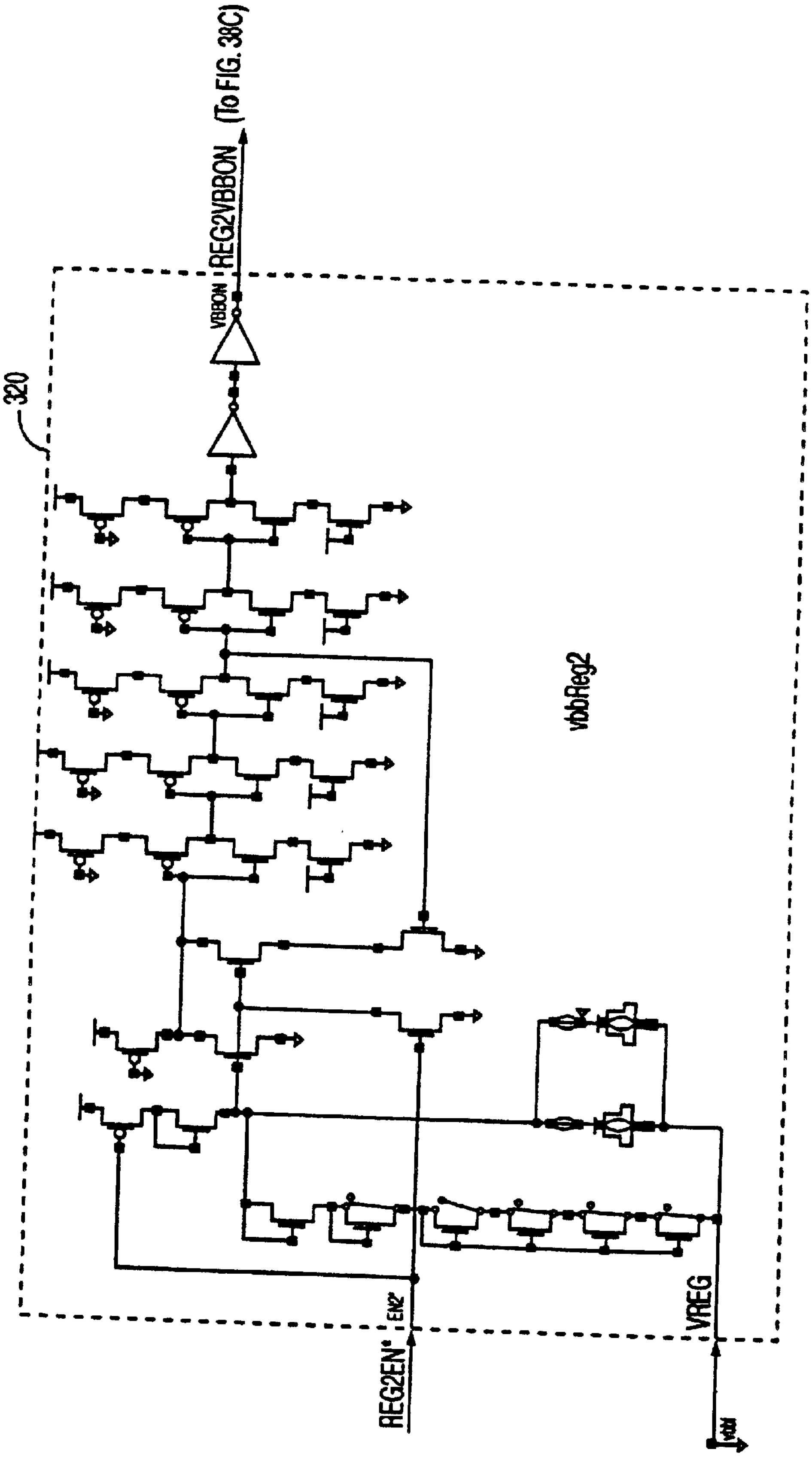
Figure 39:
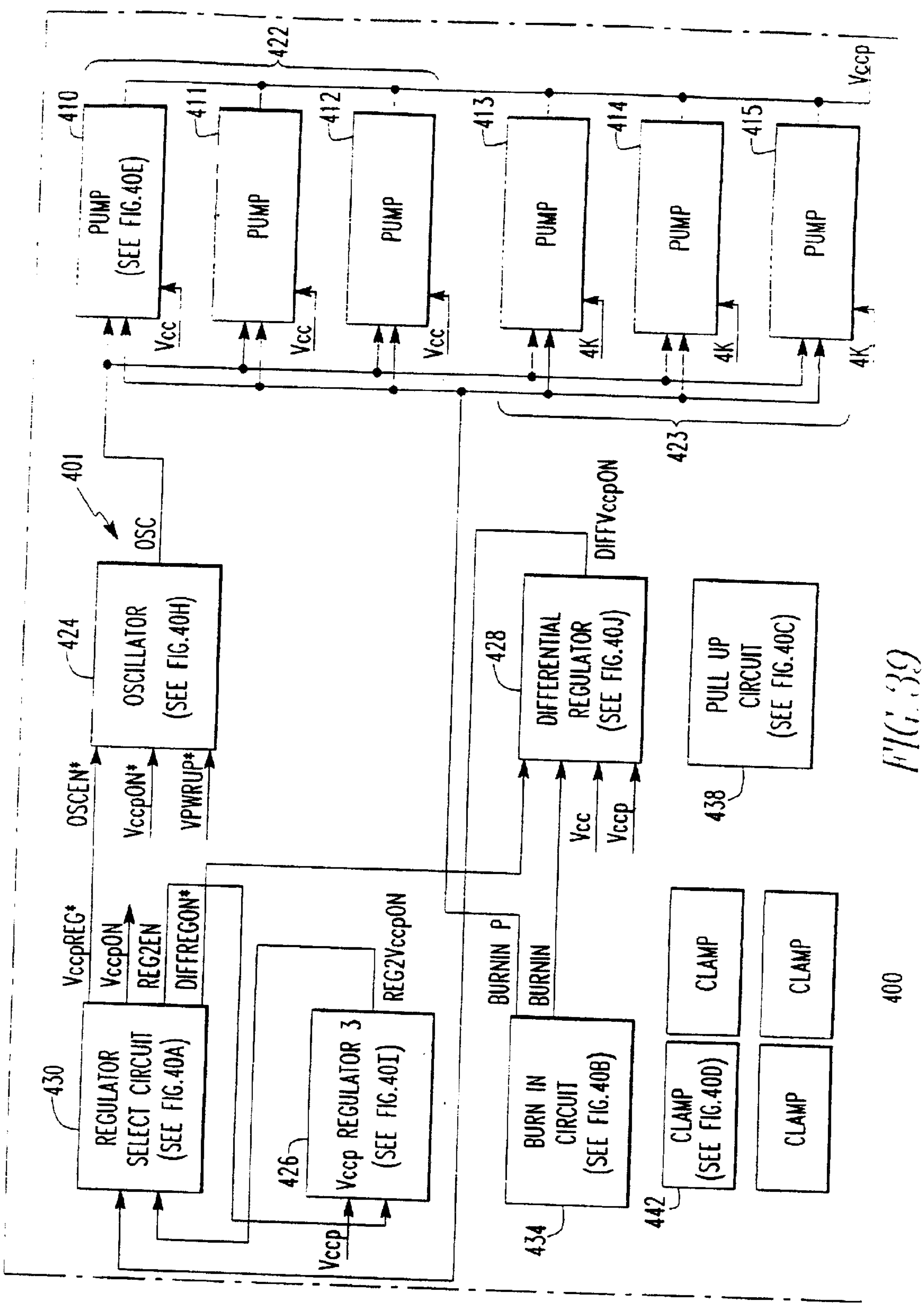
Figure 40A:
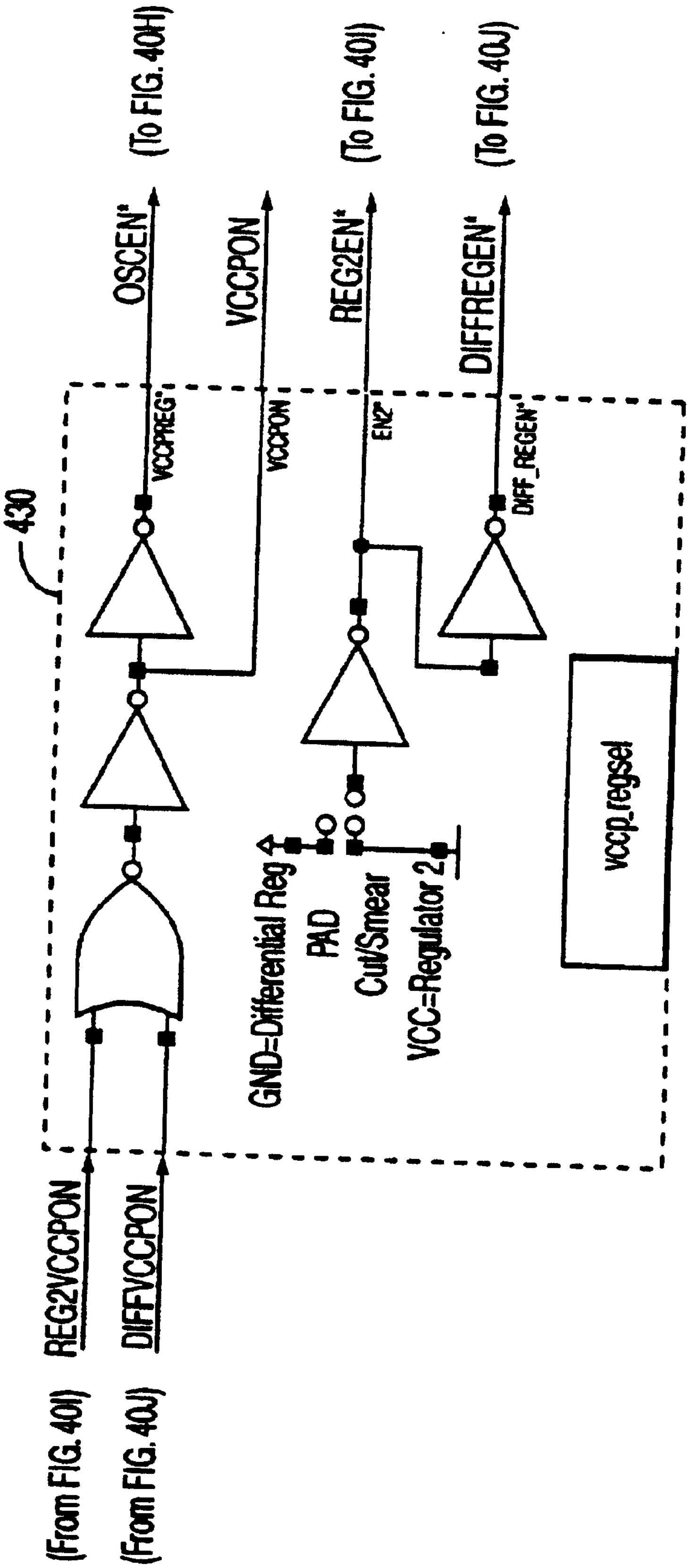
Figure 40B:
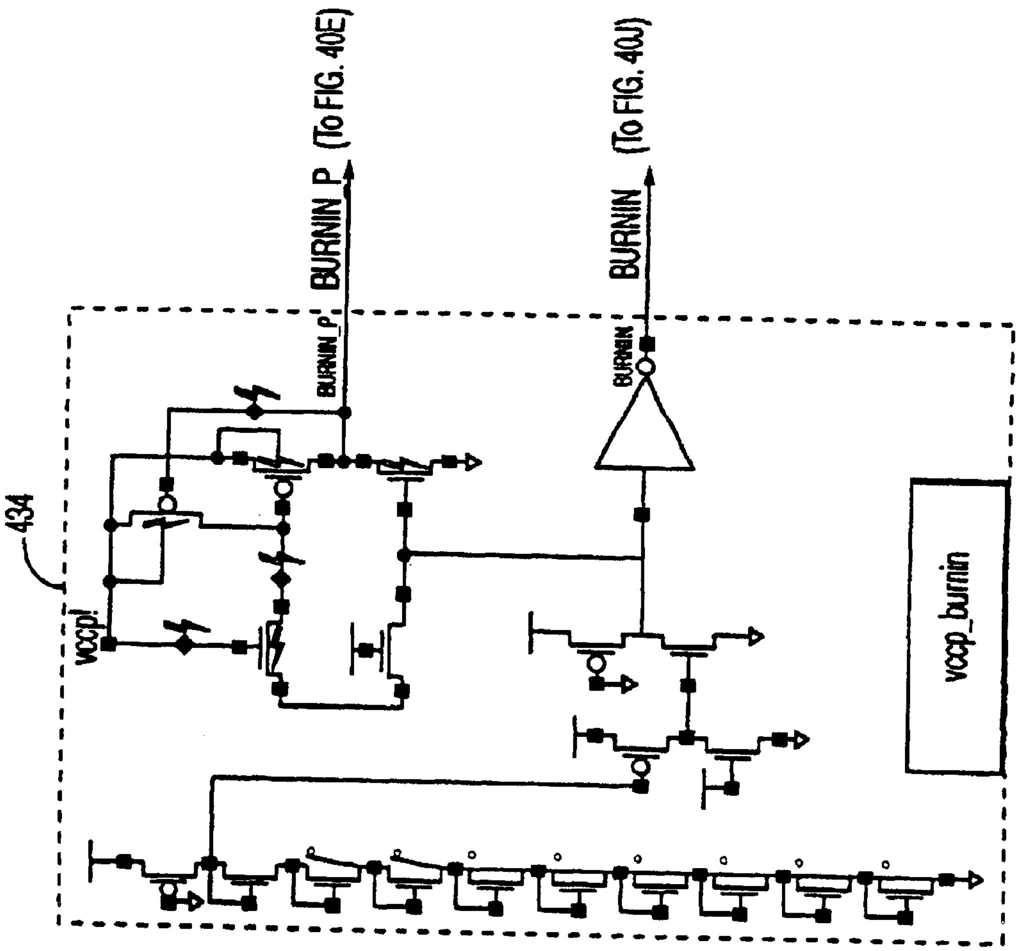
Figure 40C:
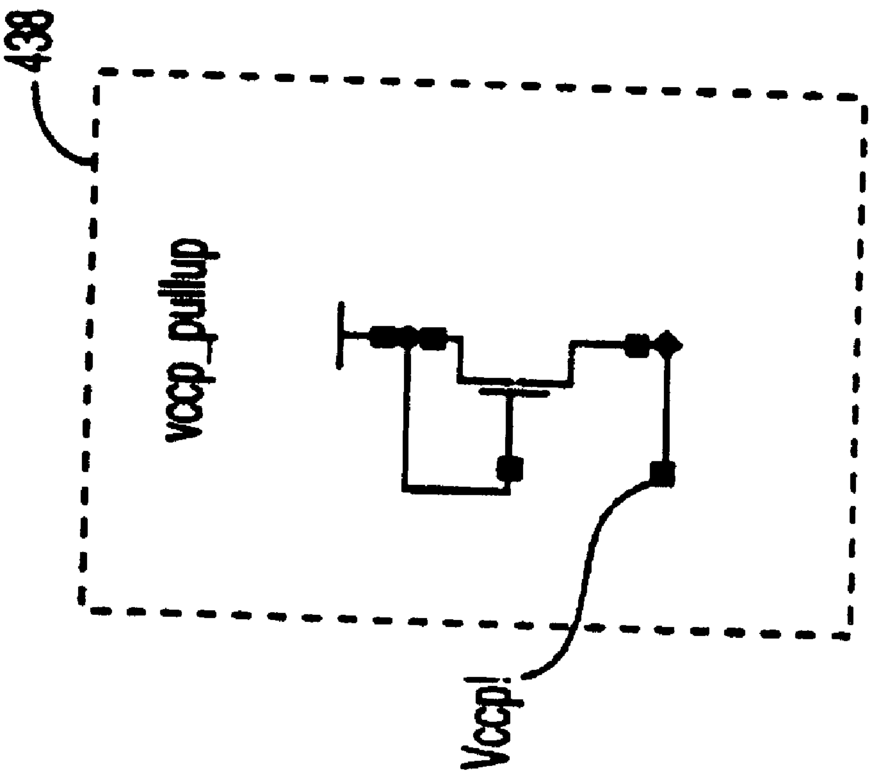
Figure 40D:
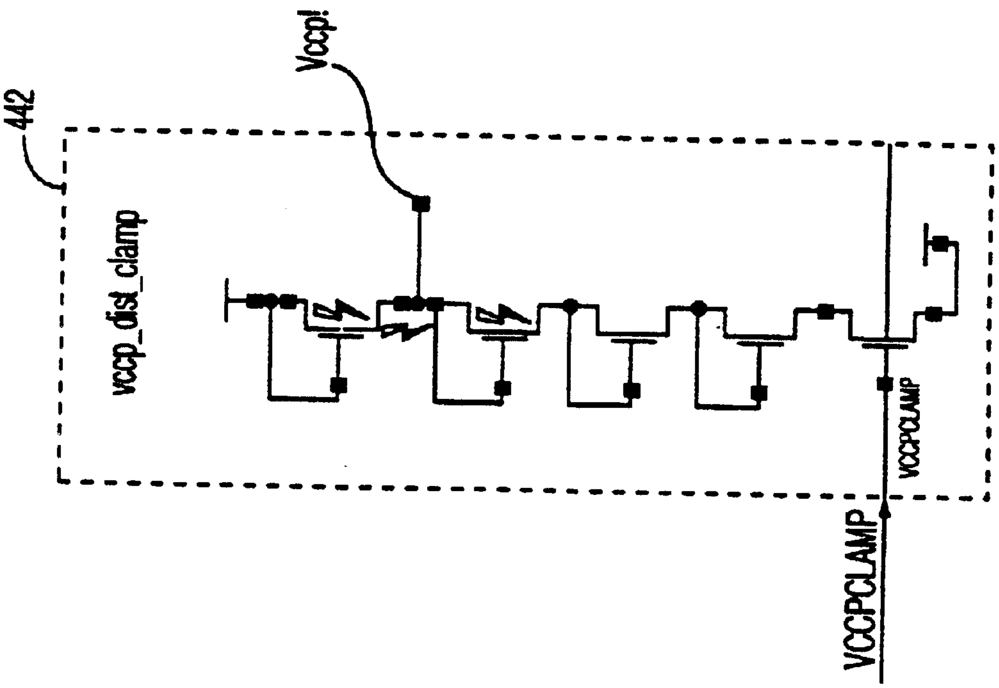
Figure 40E:
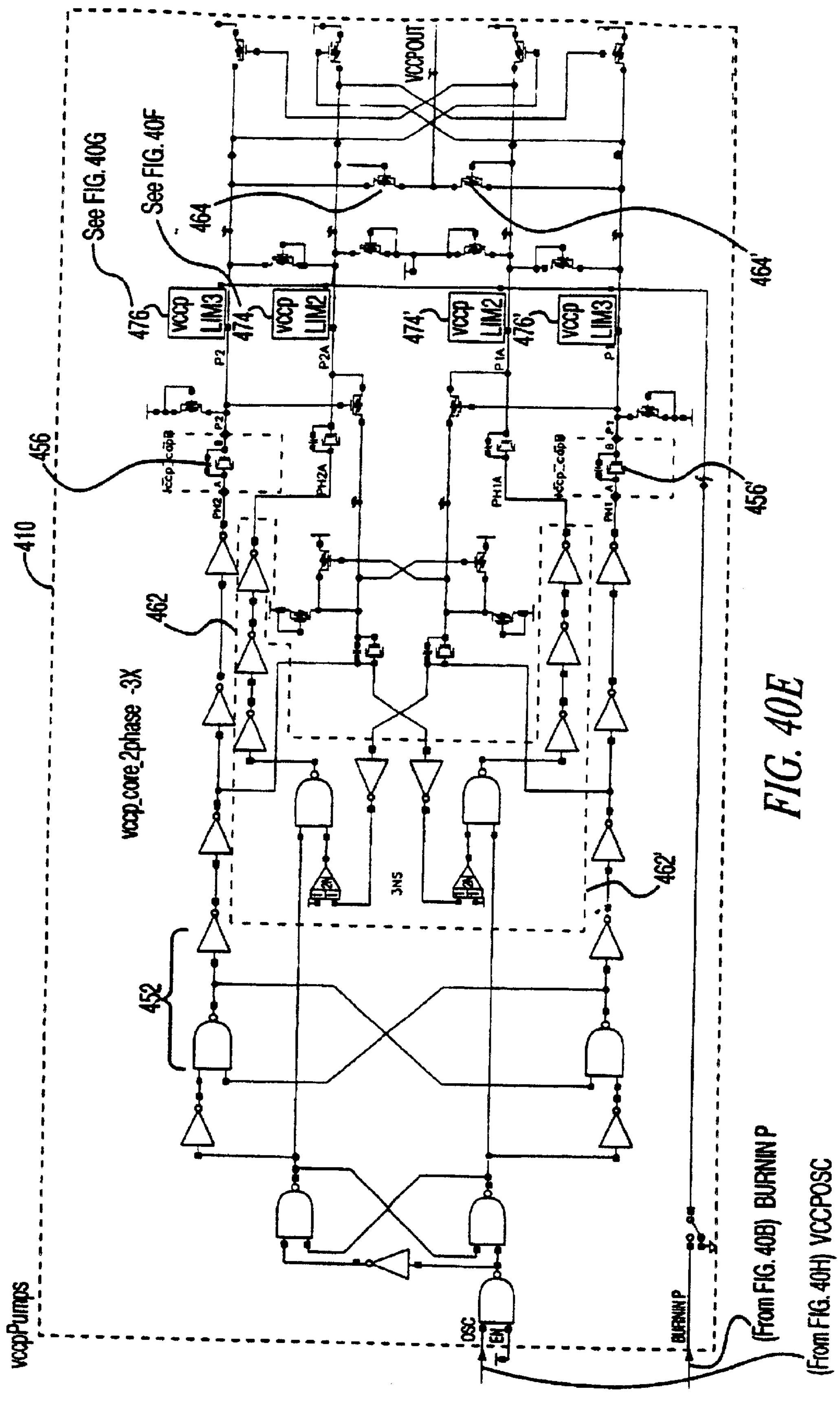
Figure 40F:
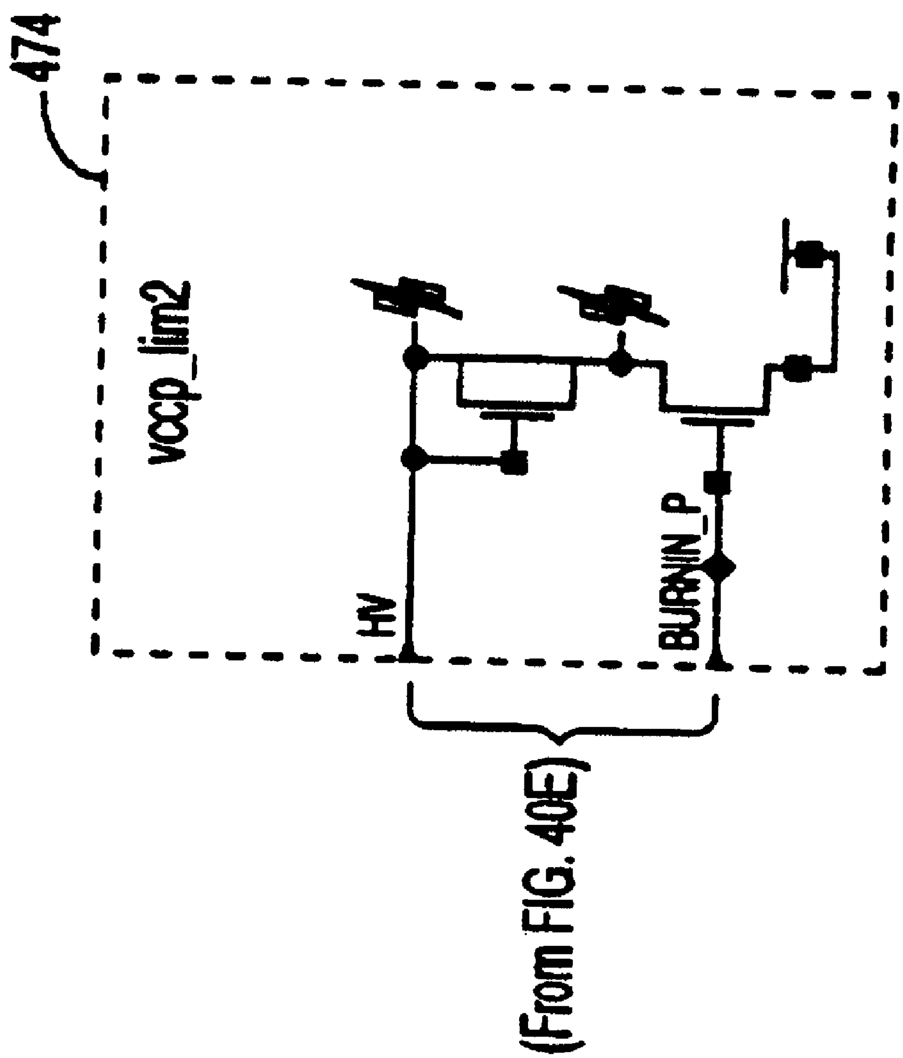
Figure 40G:
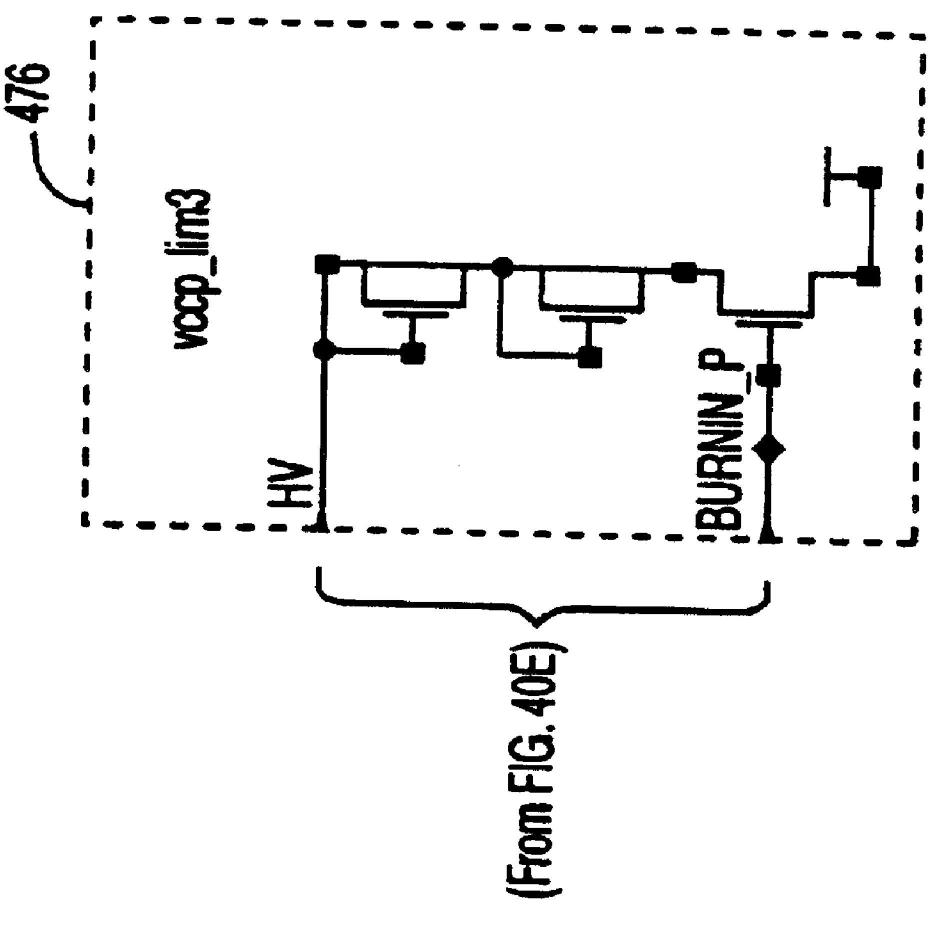
Figure 40H:
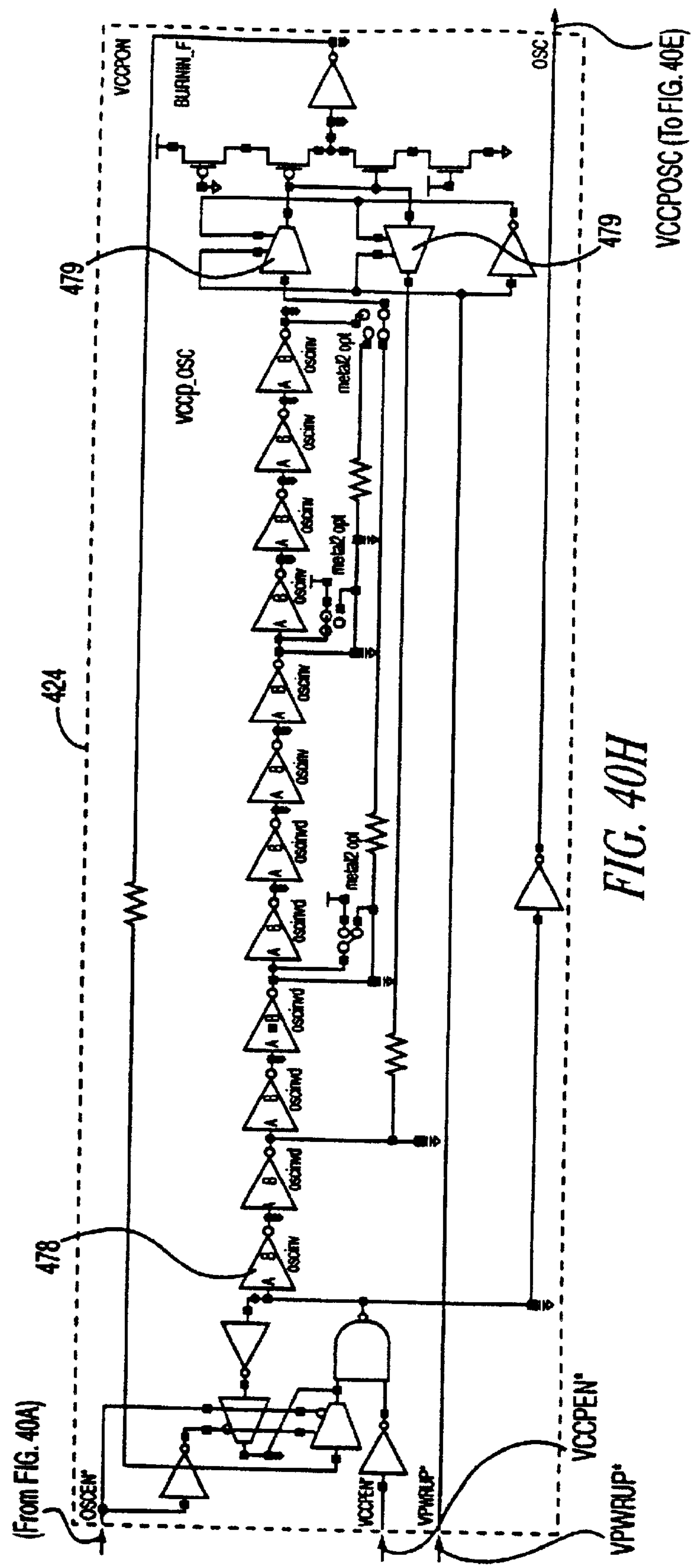
Figure 40I:
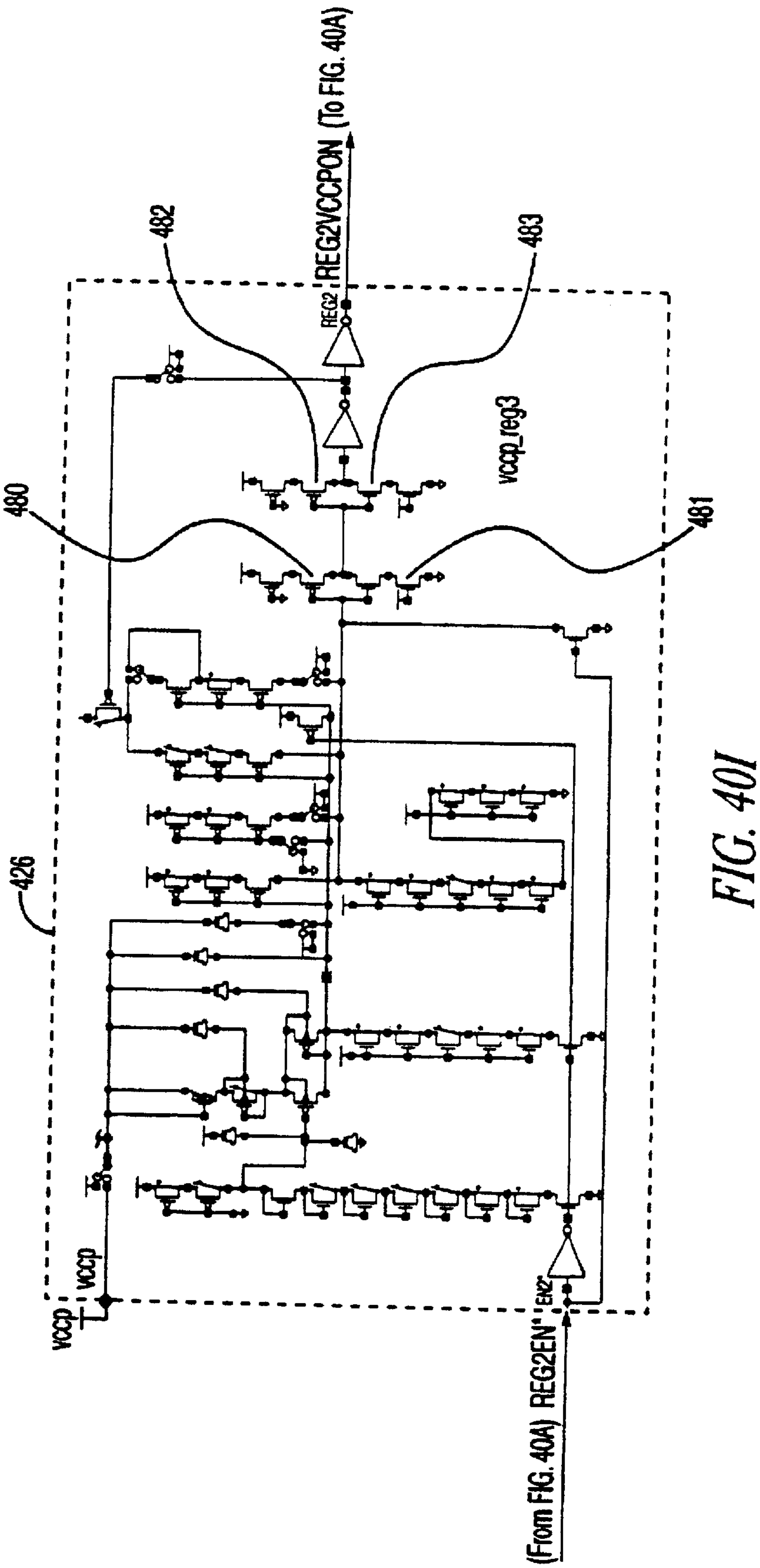
Figure 40J:
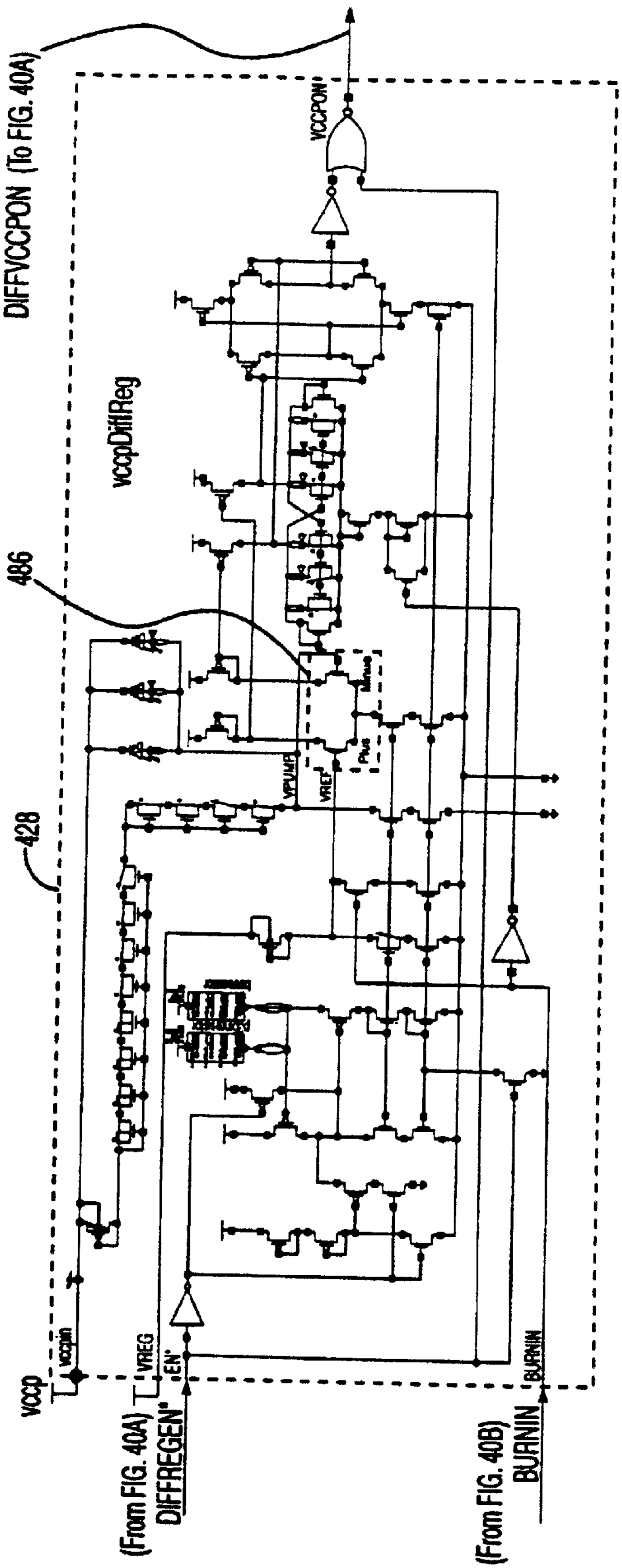
Figure 41:
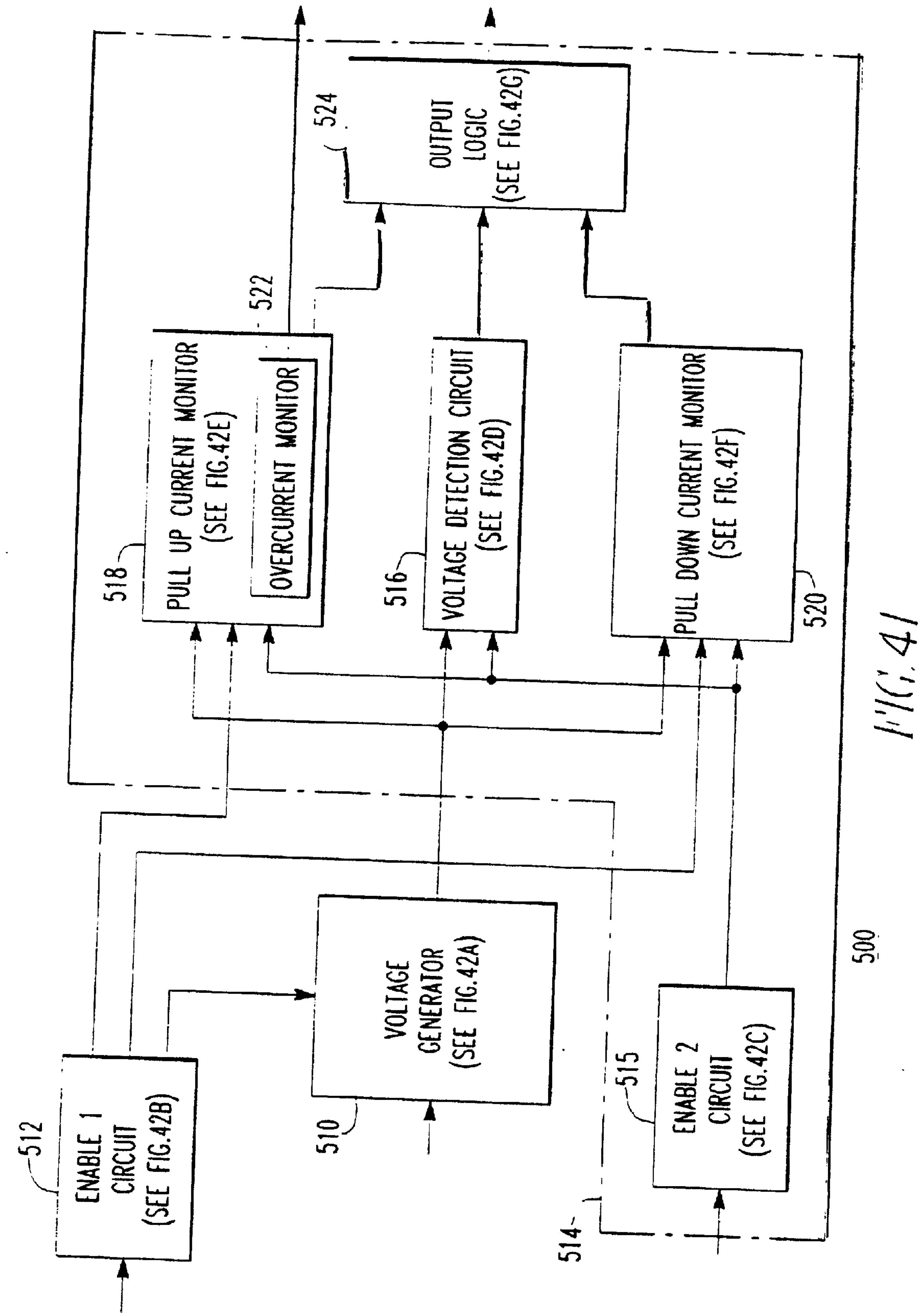
Figure 42A:
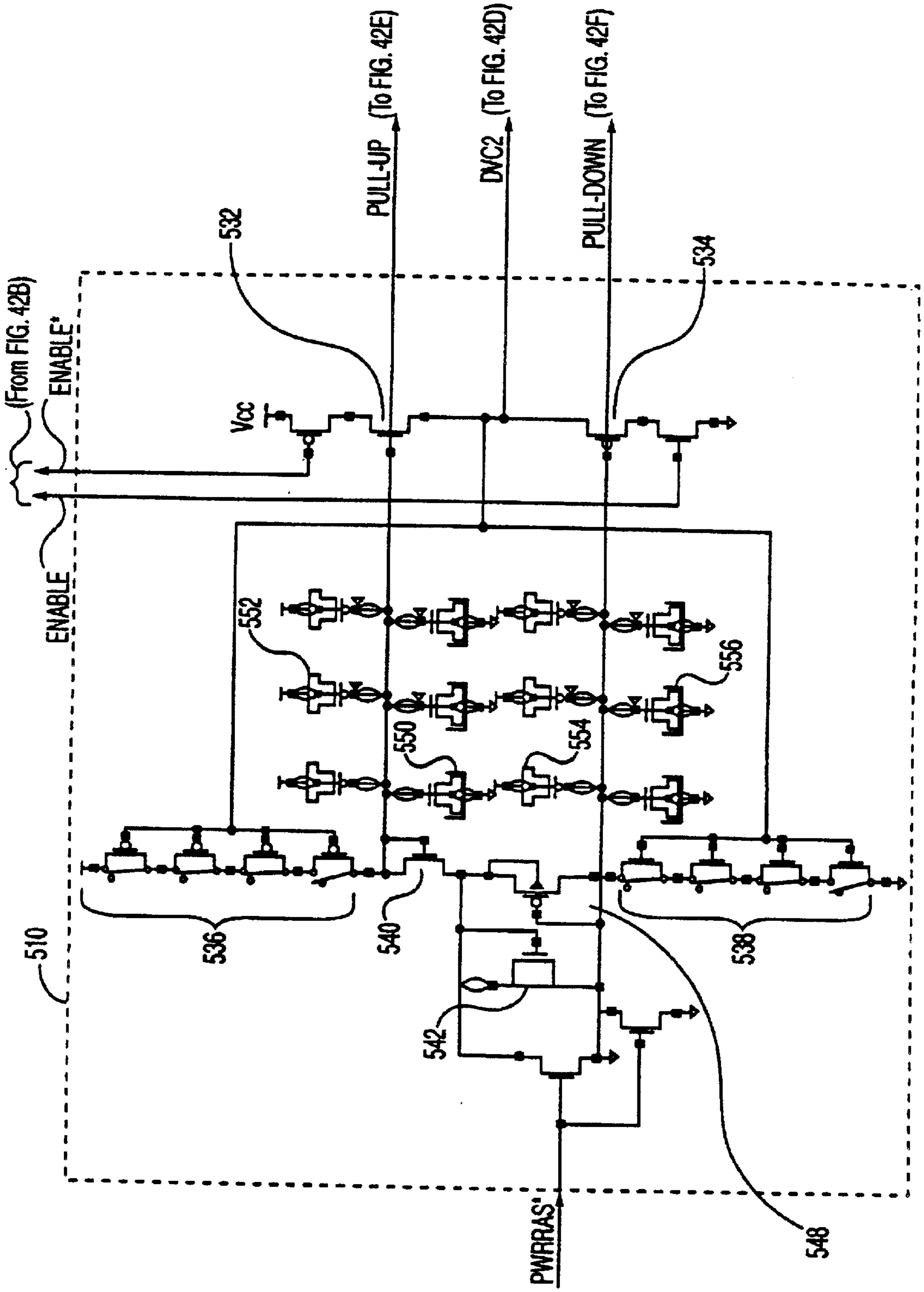
Figure 42B:
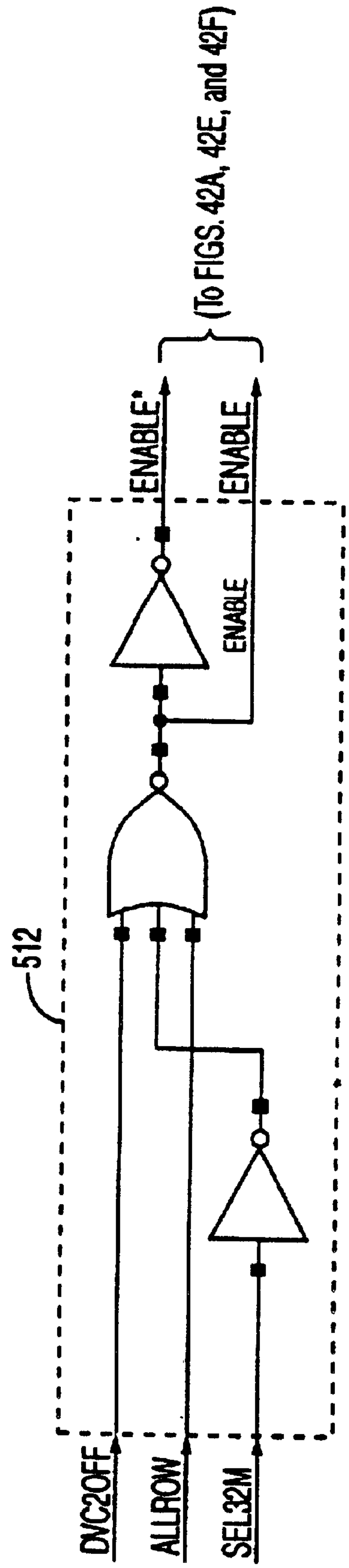
Figure 42C:
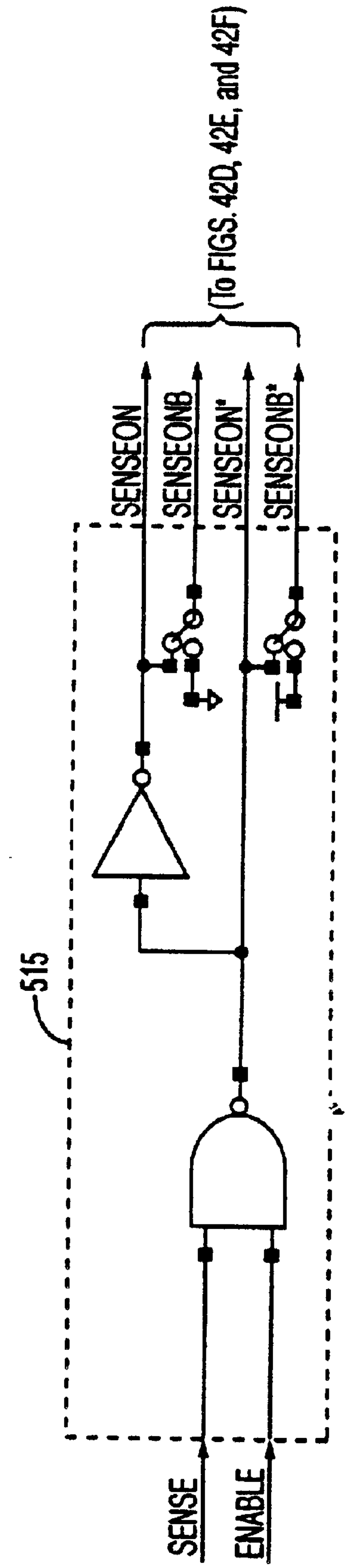
Figure 42D:
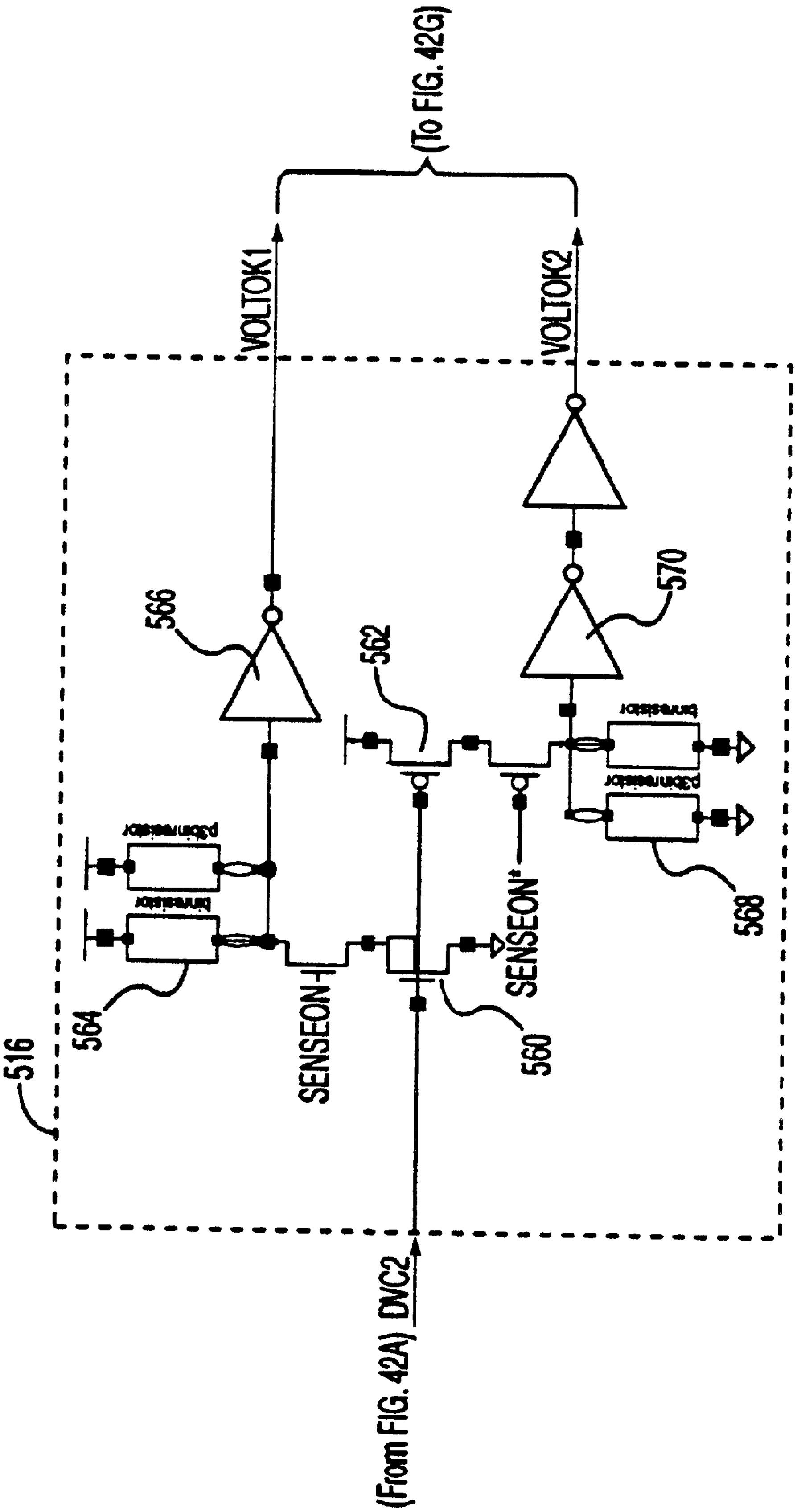
Figure 42E:
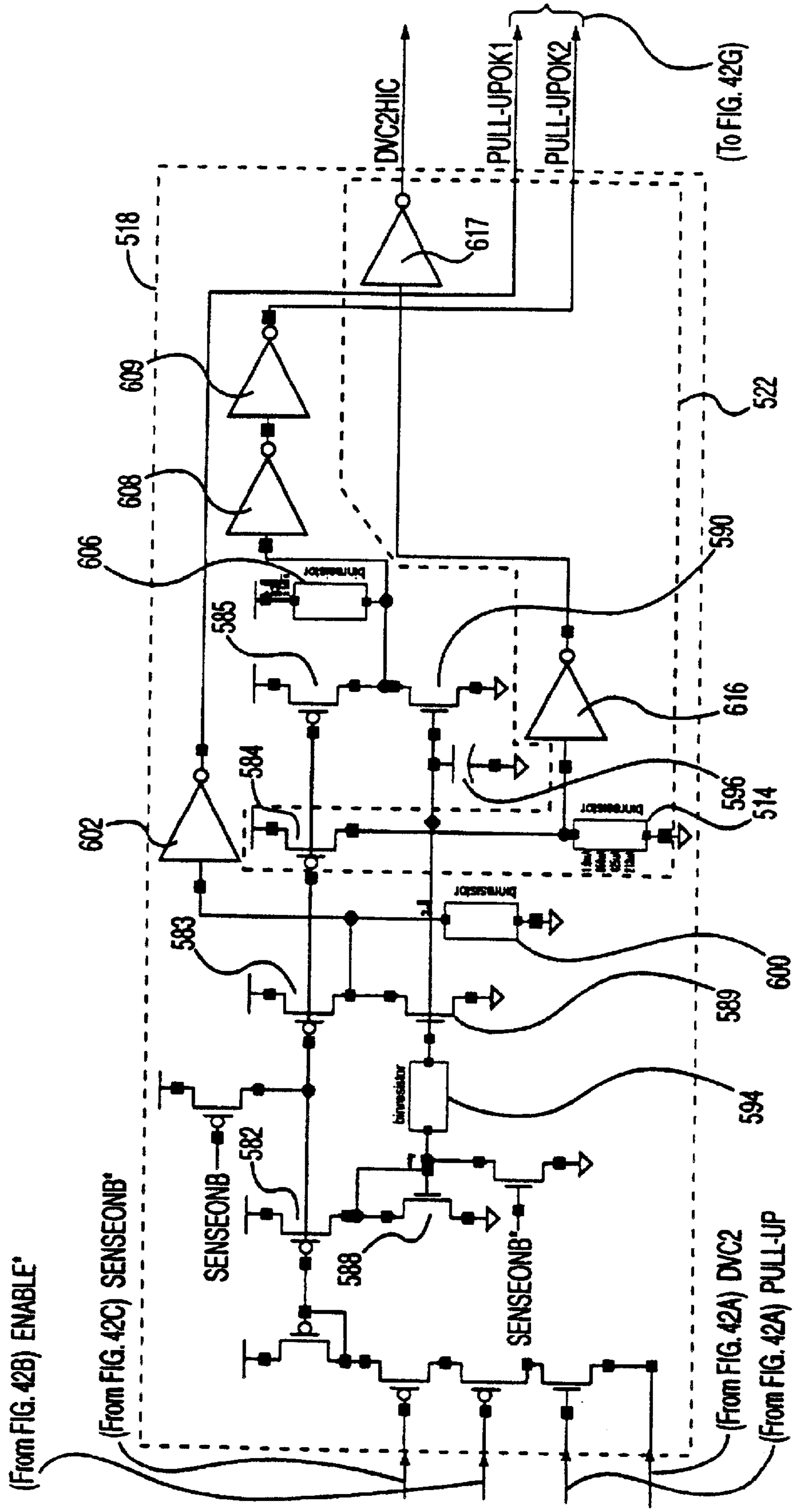
Figure 42F:
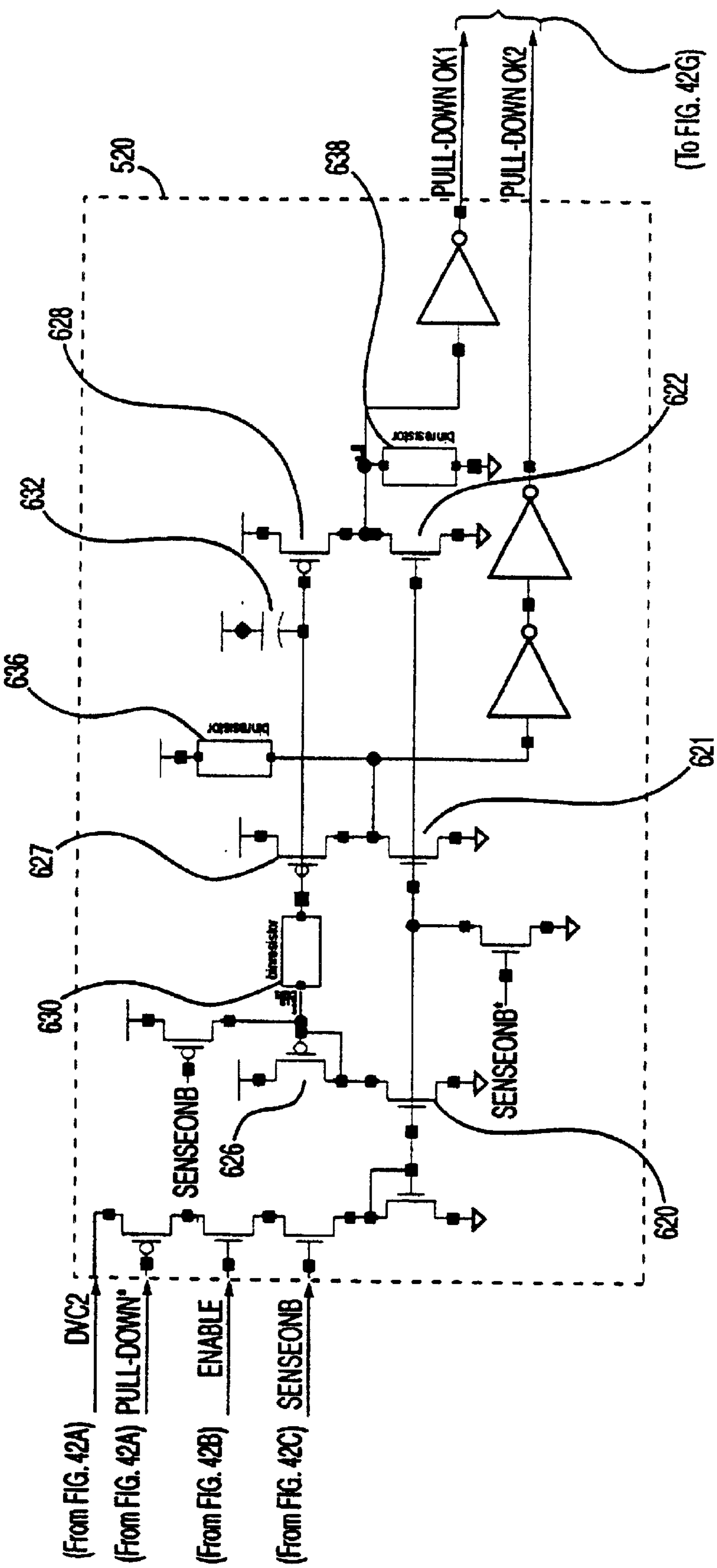
Figure 42G:
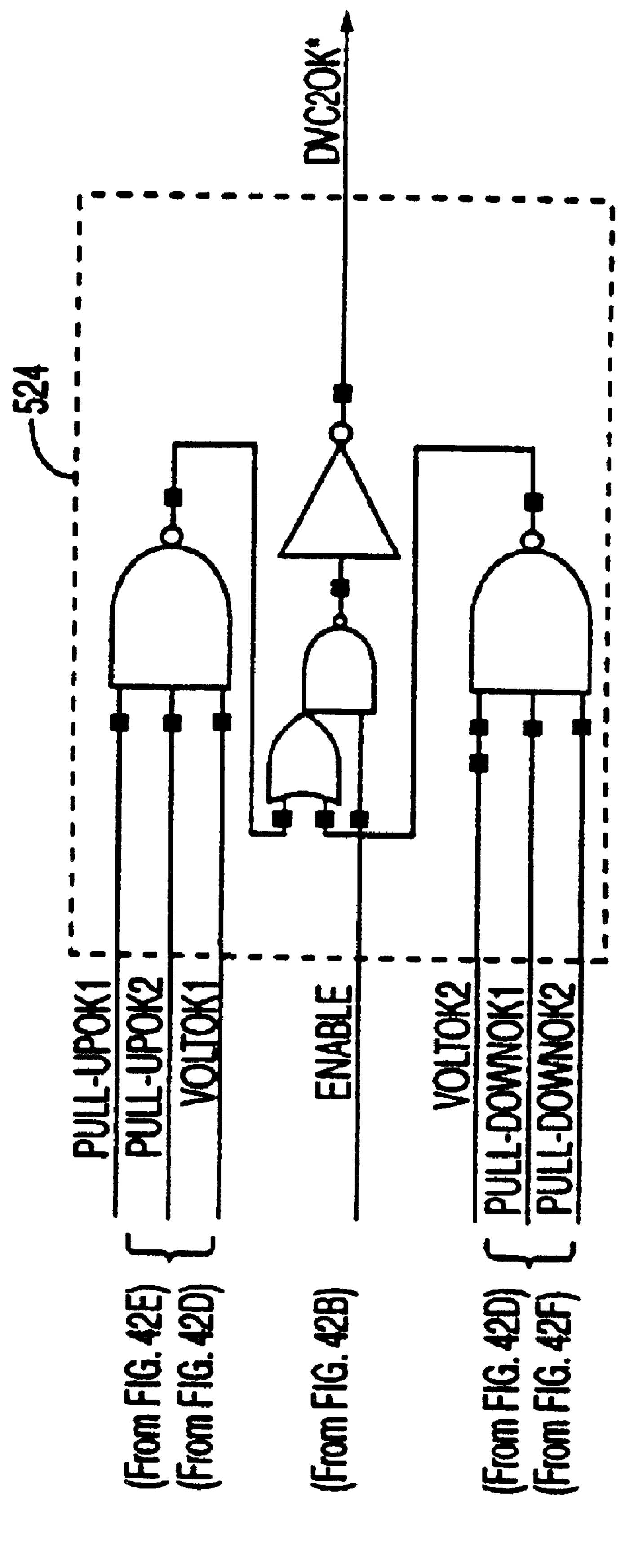

FIG. 35 is block diagram illustrating the voltage regulator which may be used to produce the peripheral voltage Vcc and the array voltage Vcca;

FIG. 36A illustrates the details of the tri-region voltage reference circuit shown in FIG. 35;

FIG. 36B is a graph of the relationship between the peripheral voltage Vcc and the externally supplied voltage Vccx; FIG. 36C illustrates the details of the logic circuit 1 shown in FIG. 35;

FIG. 36D illustrates the details of the Vccx detect circuits shown in FIG. 35;

FIG. 36E illustrates the details of the logic circuit 2 shown in FIG. 35;

FIG. 36F illustrates the details of the power amplifiers shown in FIG. 35;

FIG. 36G illustrates the details of the boost amplifiers shown in FIG. 35;

FIG. 36H illustrates the details of the standby amplifier shown in FIG. 35;

FIG. 36I illustrates the details of the power amplifiers in the group of twelve power amplifiers illustrated in FIG. 35;

FIG. 37 is a block diagram illustrating the voltage pump which may be used to produce a voltage Vbb used as a back bias for the die;

FIG. 38A illustrates the details of the pump circuits shown in FIG. 37;

FIG. 38B illustrates the details of the Vbb oscillator circuit shown in FIG. 37;

FIG. 38C illustrates the details of the Vbb reg select shown in FIG. 37;

FIG. 38D illustrates the details of the Vbb differential regulator 2 circuit shown in FIG. 37;

FIG. 38E illustrates the details of the Vbb regulator 2 circuit shown in FIG. 37;

FIG. 39 is a block diagram illustrating the Vcc pump which may be used to produce the boosted voltage Vccp for the wordline drivers;

FIG. 40A illustrates the details of the Vccp regulator select circuit shown in FIG. 39;

FIG. 40B illustrates the details of the Vccp burnin circuit shown in FIG. 39;

FIG. 40C illustrates the details of the Vccp pullup circuit shown in FIG. 39;

FIG. 40D illustrates the details of the Vccp clamps shown in FIG. 39;

FIG. 40E illustrates the details of the Vccp pump circuits shown in FIG. 39;

FIG. 40F illustrates the details of the Vccp Lim2 circuits shown in FIG. 40E;

FIG. 40G illustrates the details of the Vccp Lim3 circuits shown in FIG. 40E;

FIG. 40H illustrates the details of the Vccp oscillator shown in FIG. 39;

FIG. 40I illustrates the details of the Vccp regulator 3 circuit shown in FIG. 39;

FIG. 40J illustrates the details of the Vccp differential regulator circuit shown in FIG. 39;

FIG. 41 is a block diagram illustrating the DVC2 generator which may be used to produce bias voltages for the digitlines (DVC2) and the cellplate (AVC2);

FIG. 42A illustrates the details of the voltage generator shown in FIG. 41;

FIG. 42B illustrates the details of the enable 1 circuit shown in FIG. 41;

FIG. 42C illustrates the details of the enable 2 circuit shown in FIG. 41;

FIG. 42D illustrates the details of the voltage detection circuit shown in FIG. 41;

FIG. 42E illustrates the details of the pullup current monitor shown in FIG. 41;

FIG. 42F illustrates the details of the pulldown current monitor shown in FIG. 41;

FIG. 42G illustrates the details of the output logic shown in FIG. 41;

Center Logic (See Section VIII)

Figure 43:
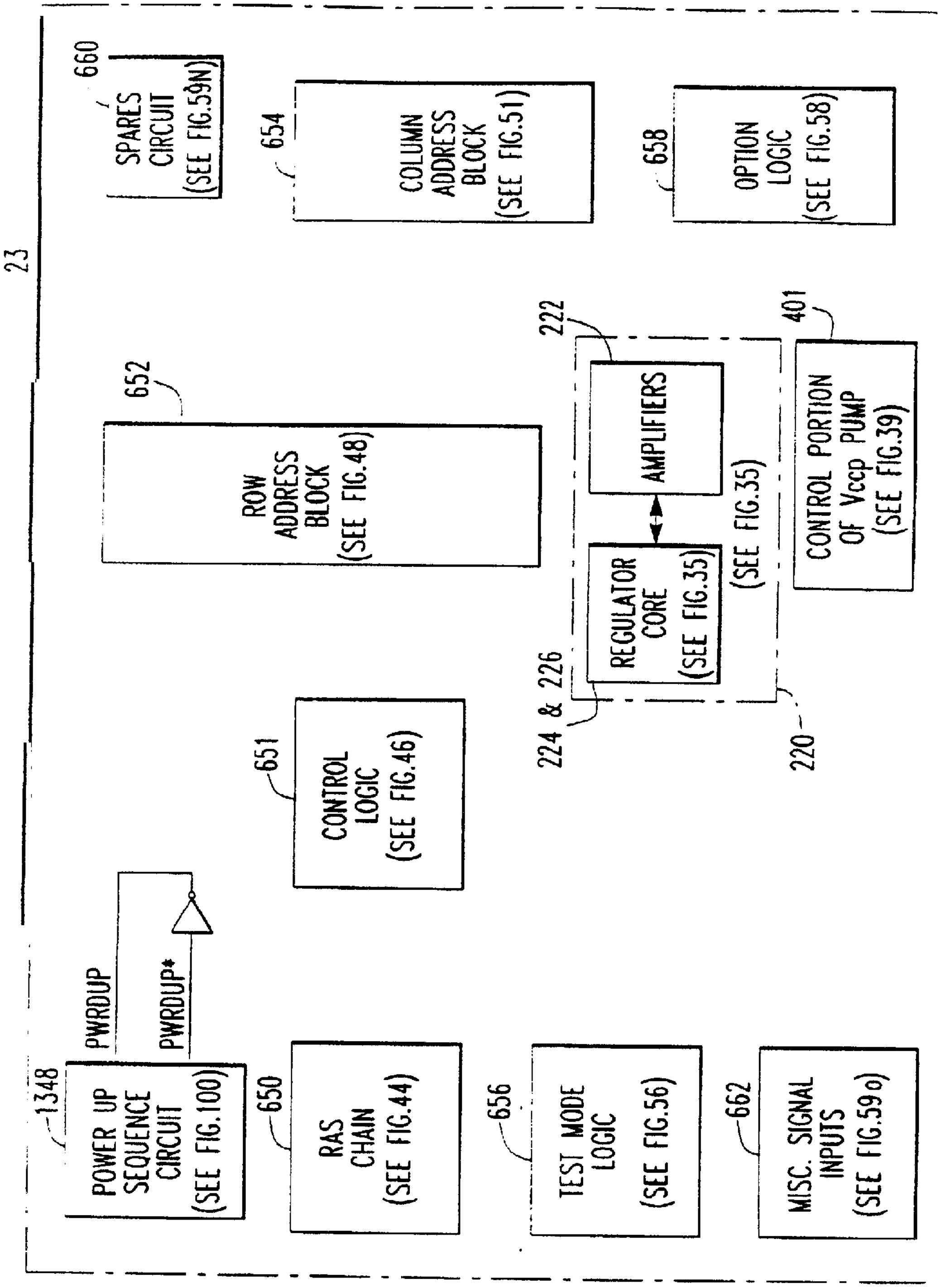
Figure 44:
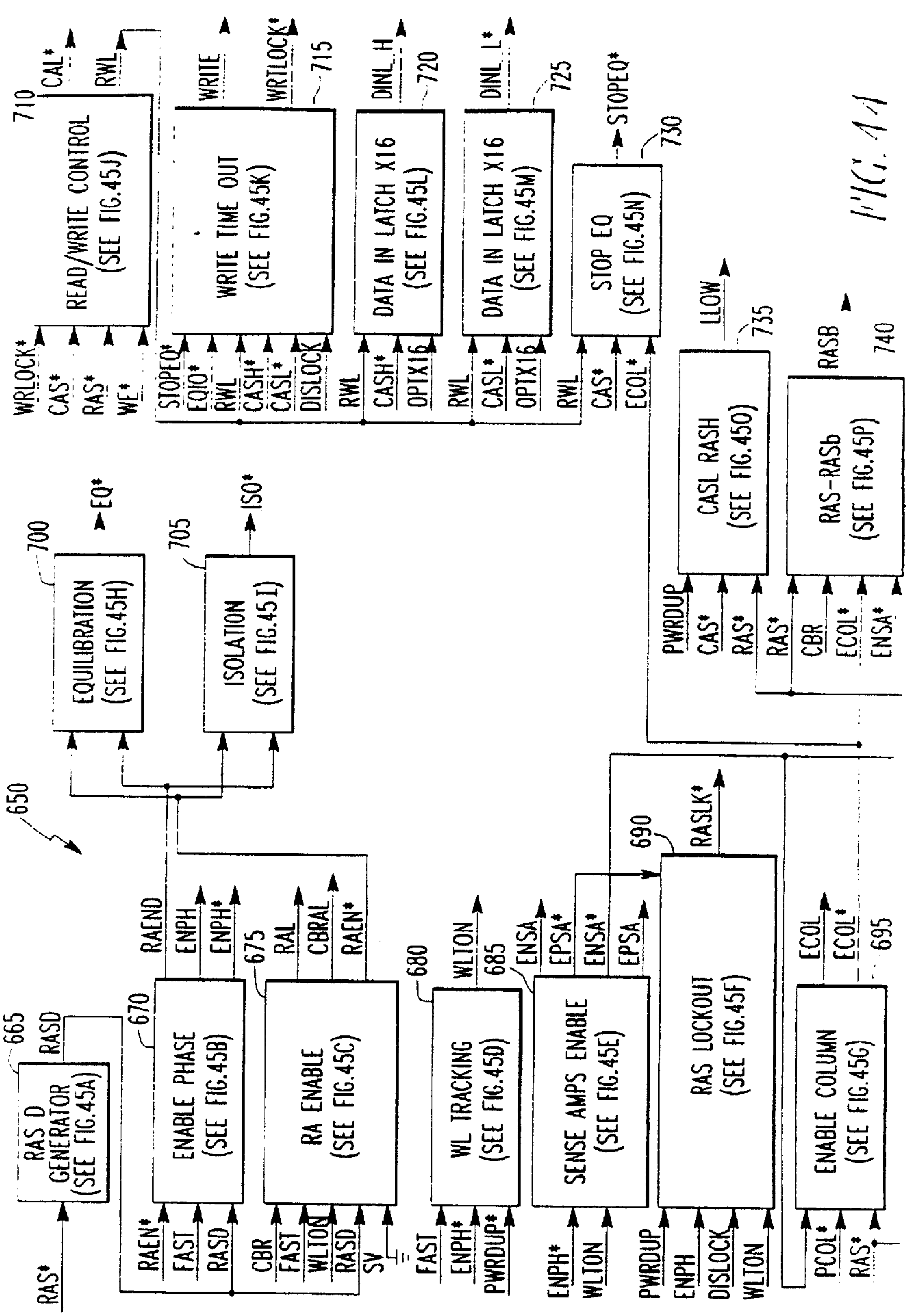
Figure 45A:
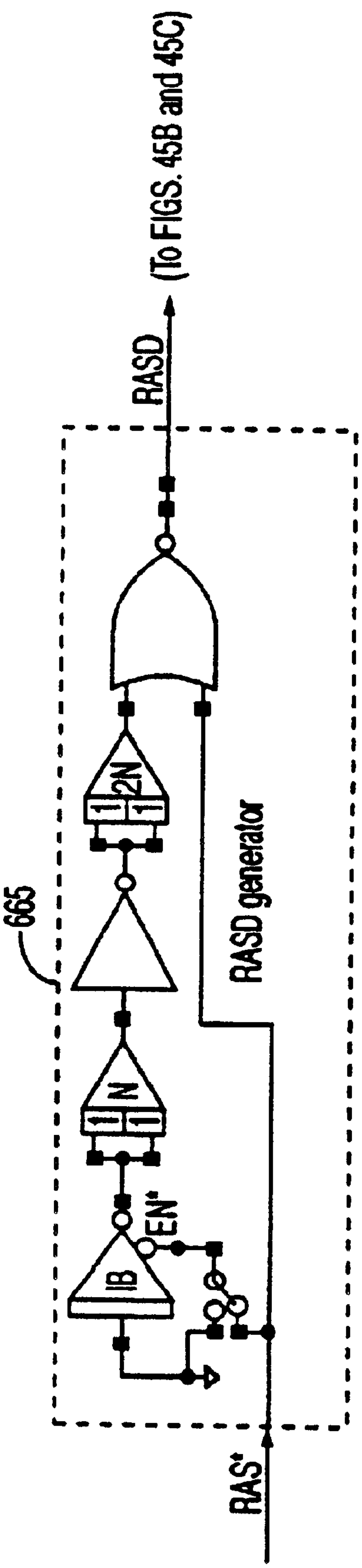
Figure 45B:
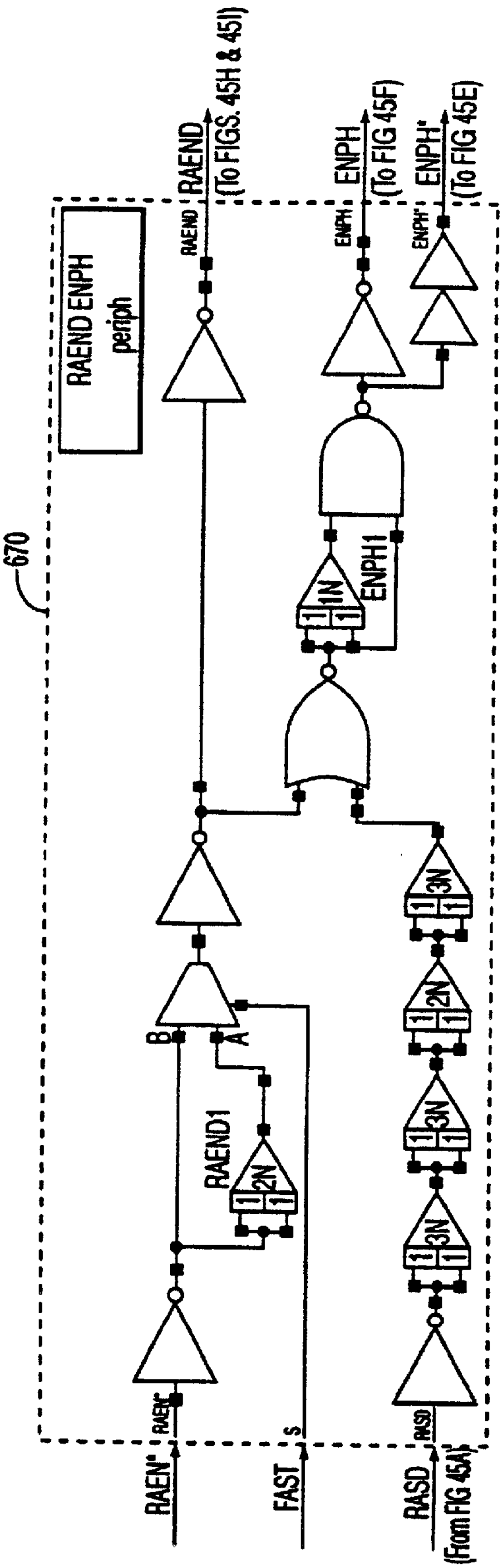
Figure 45C:
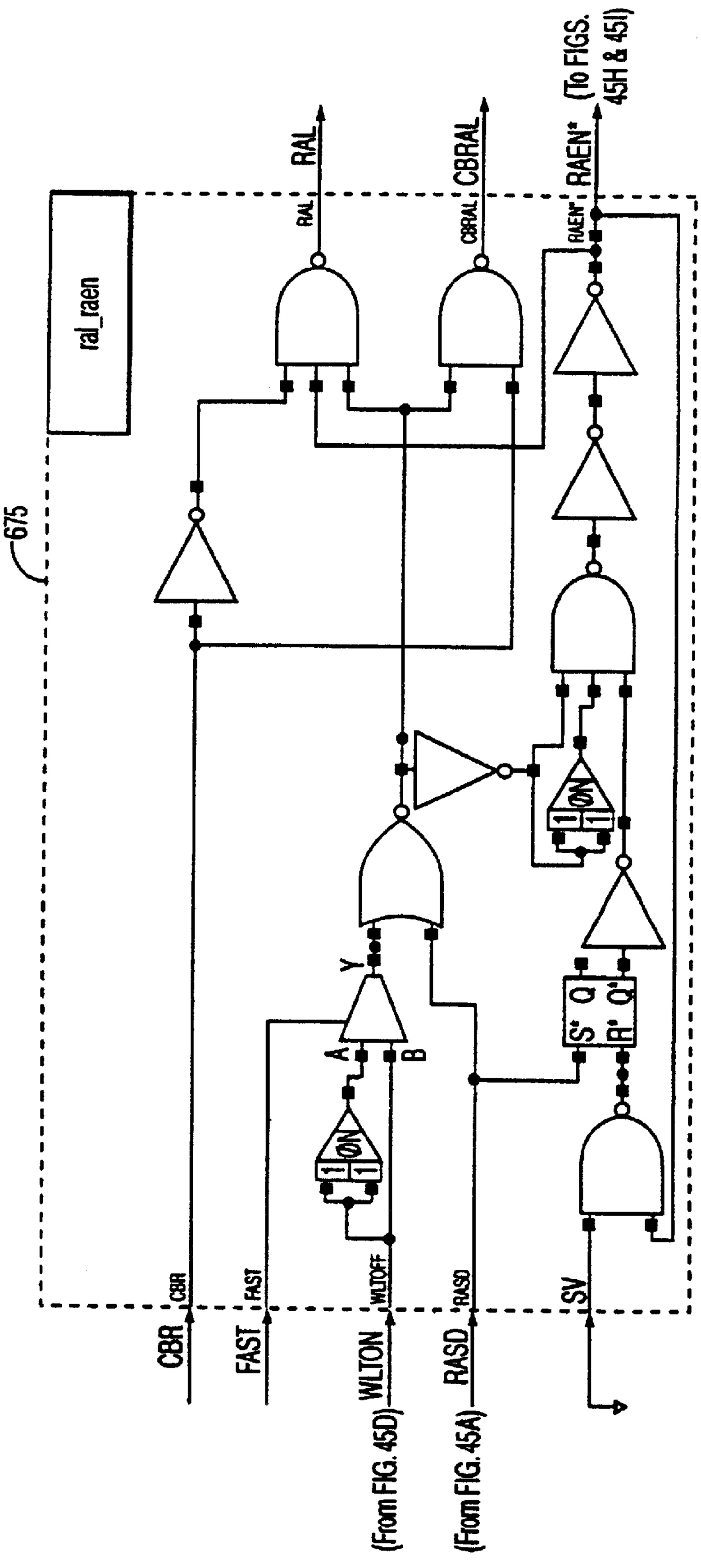
Figure 45D:
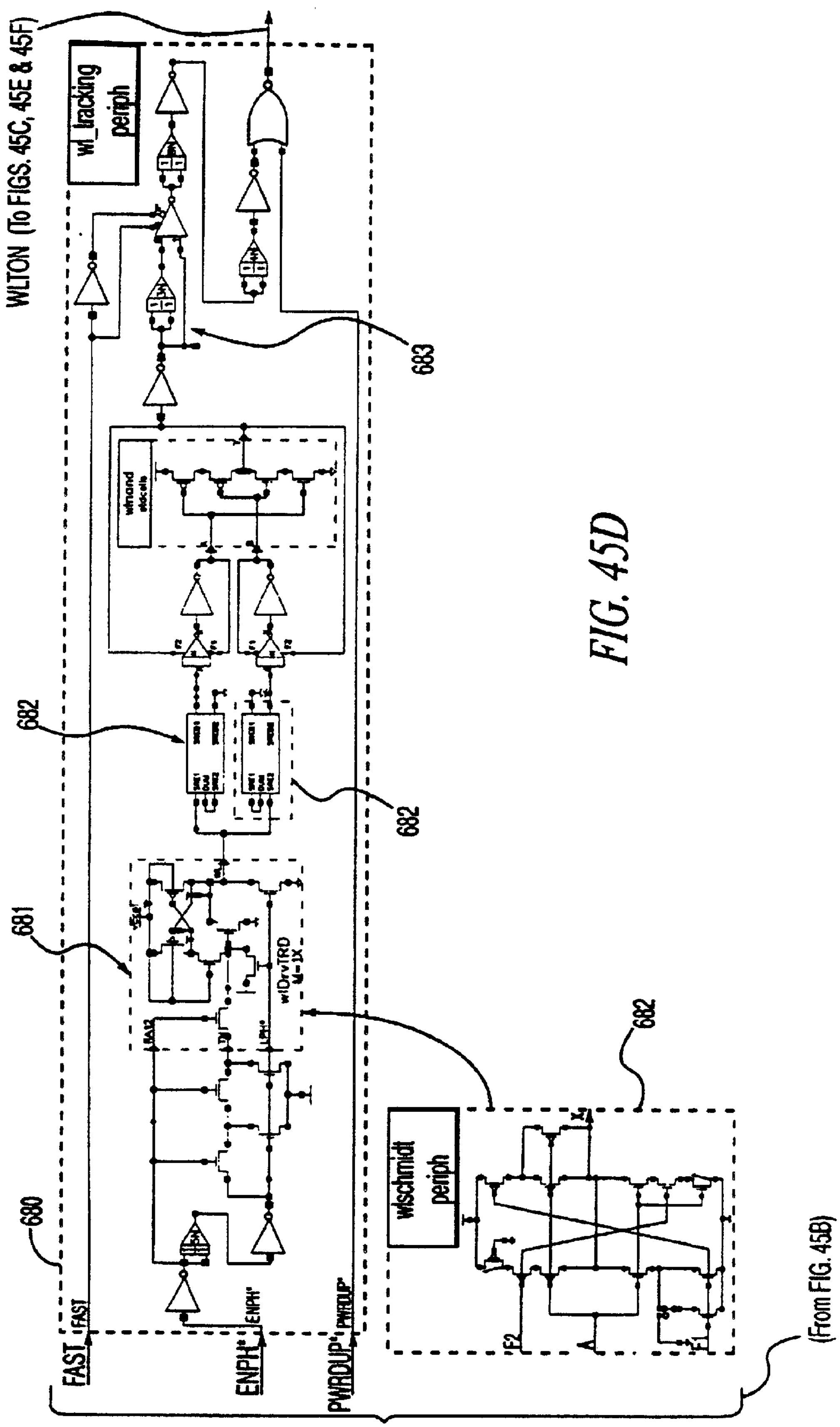
Figure 45E:
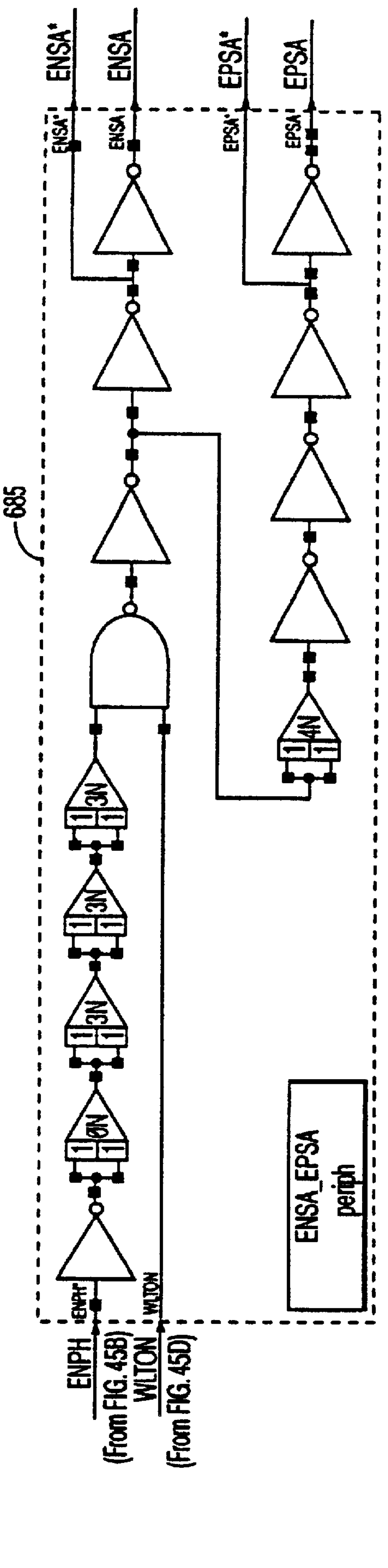
Figure 45F:
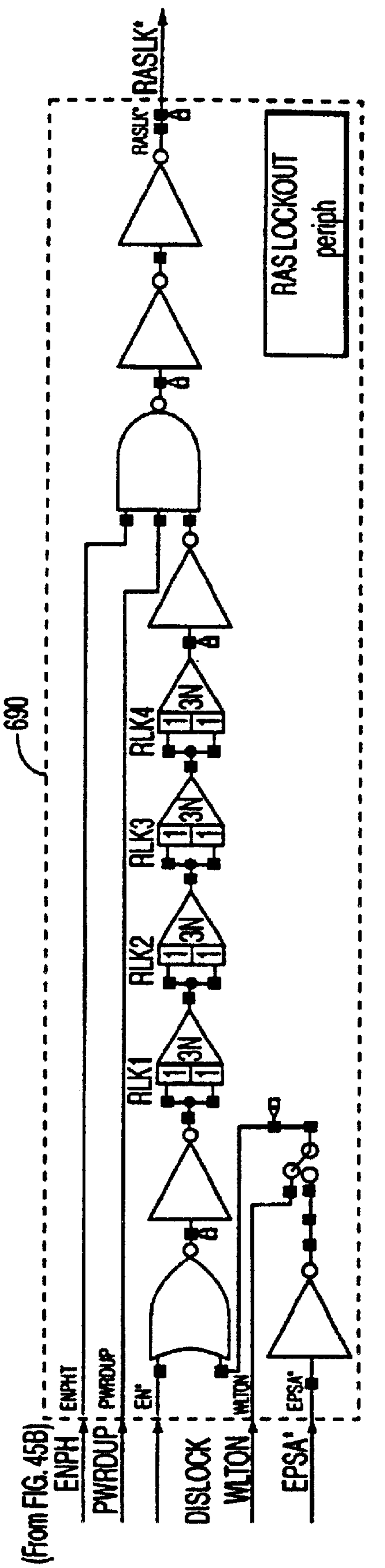
Figure 45G:
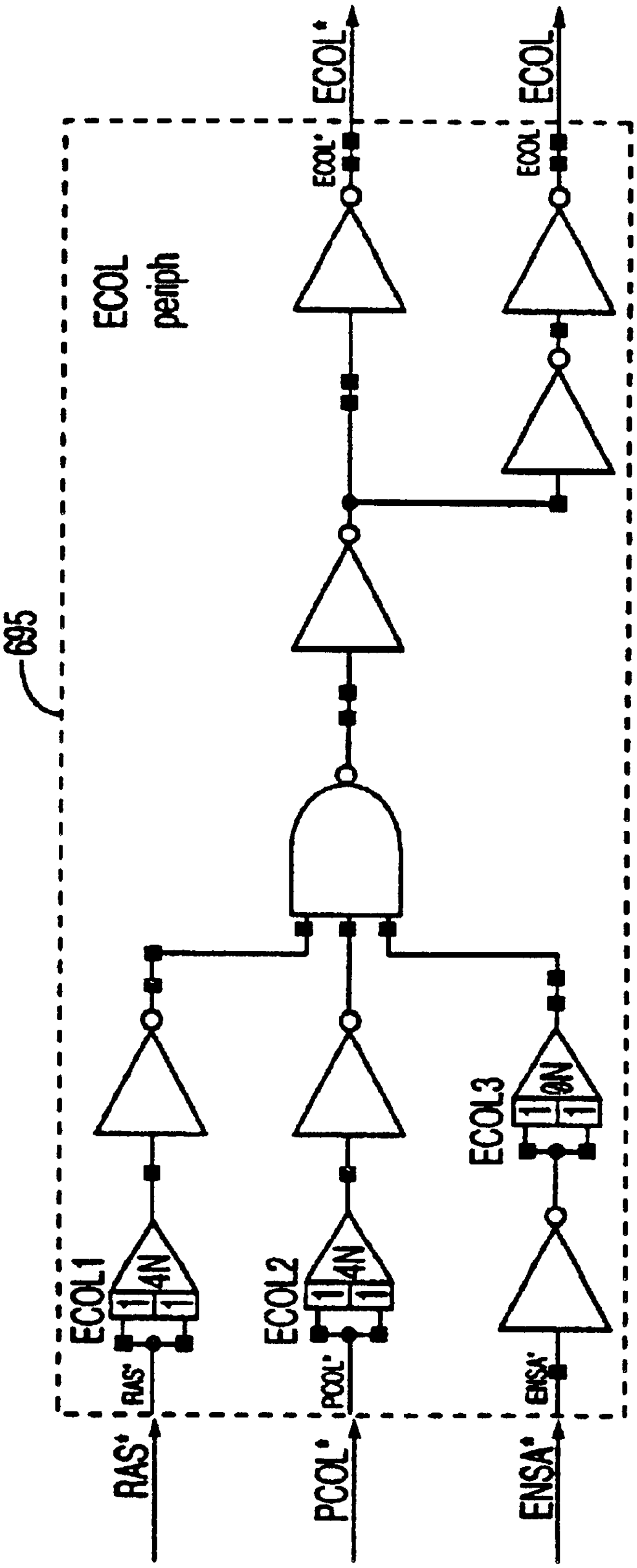
Figure 45H:
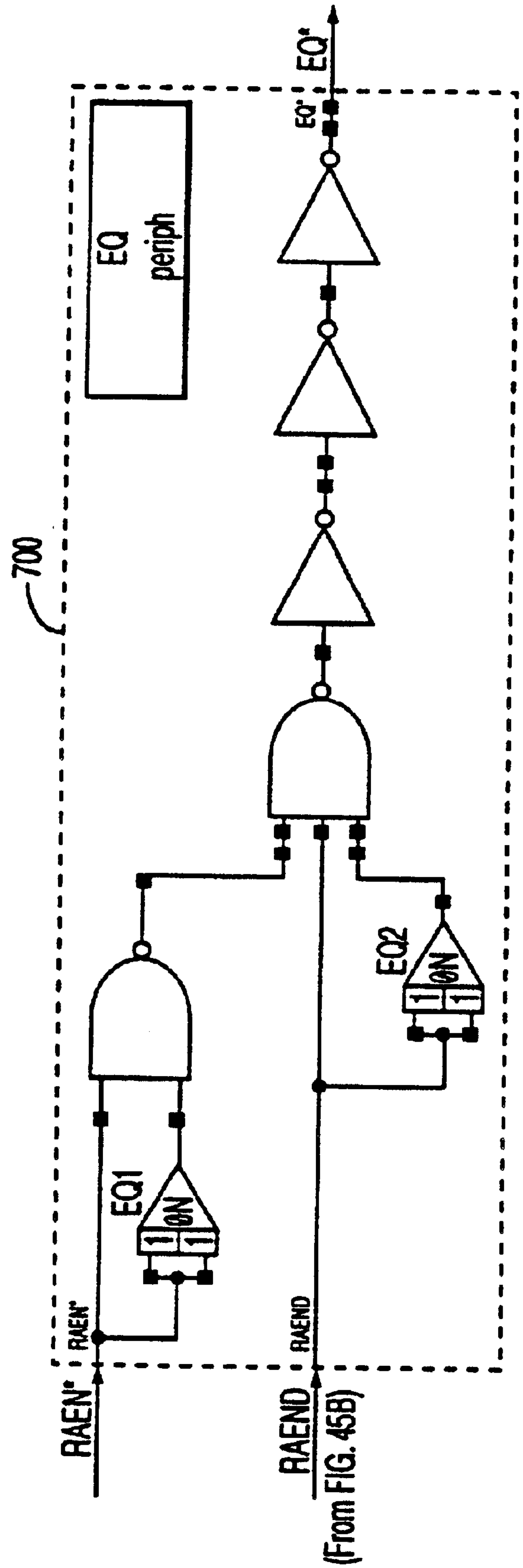
Figure 45I:
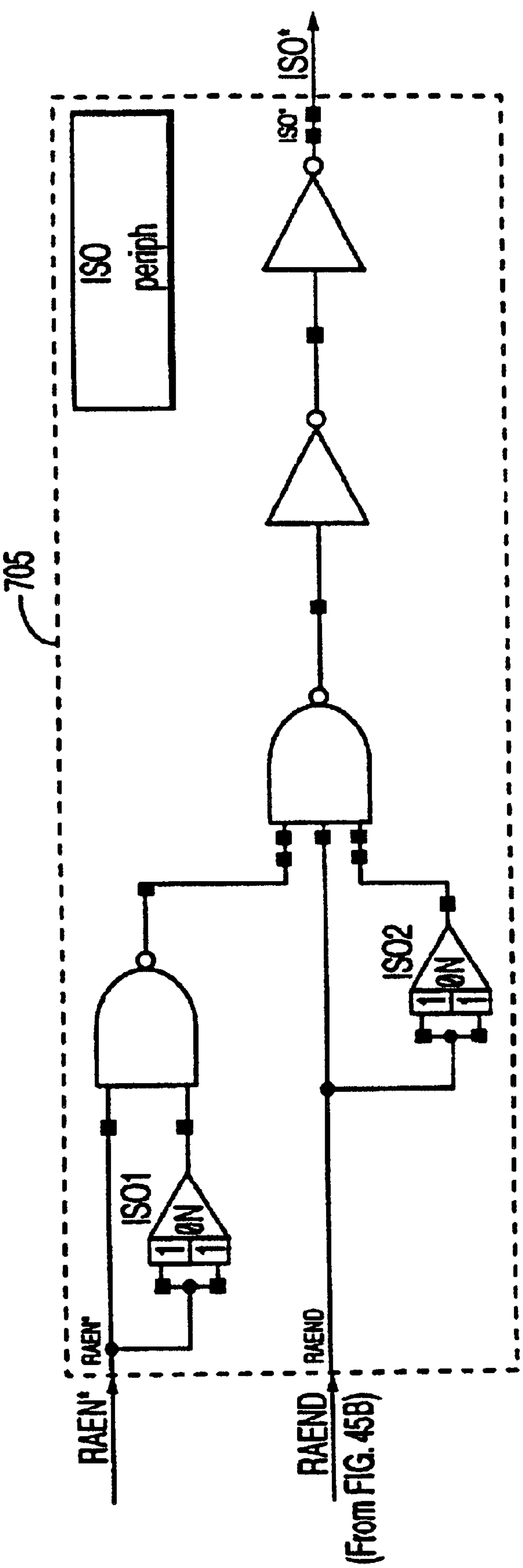
Figure 45J:
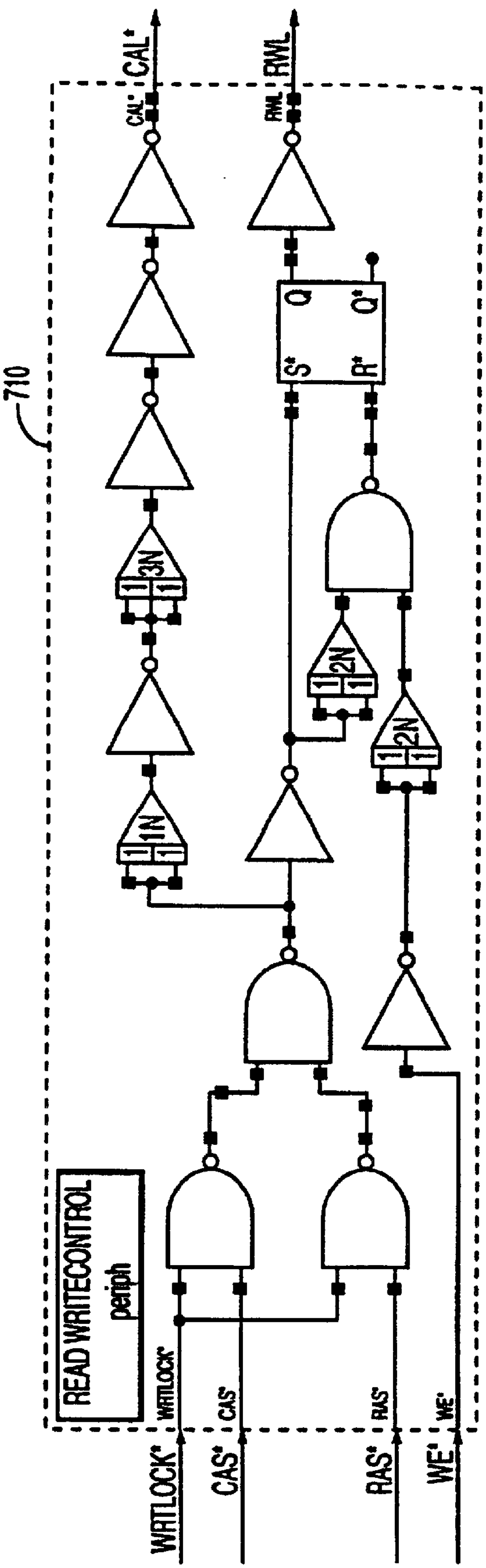
Figure 45K:
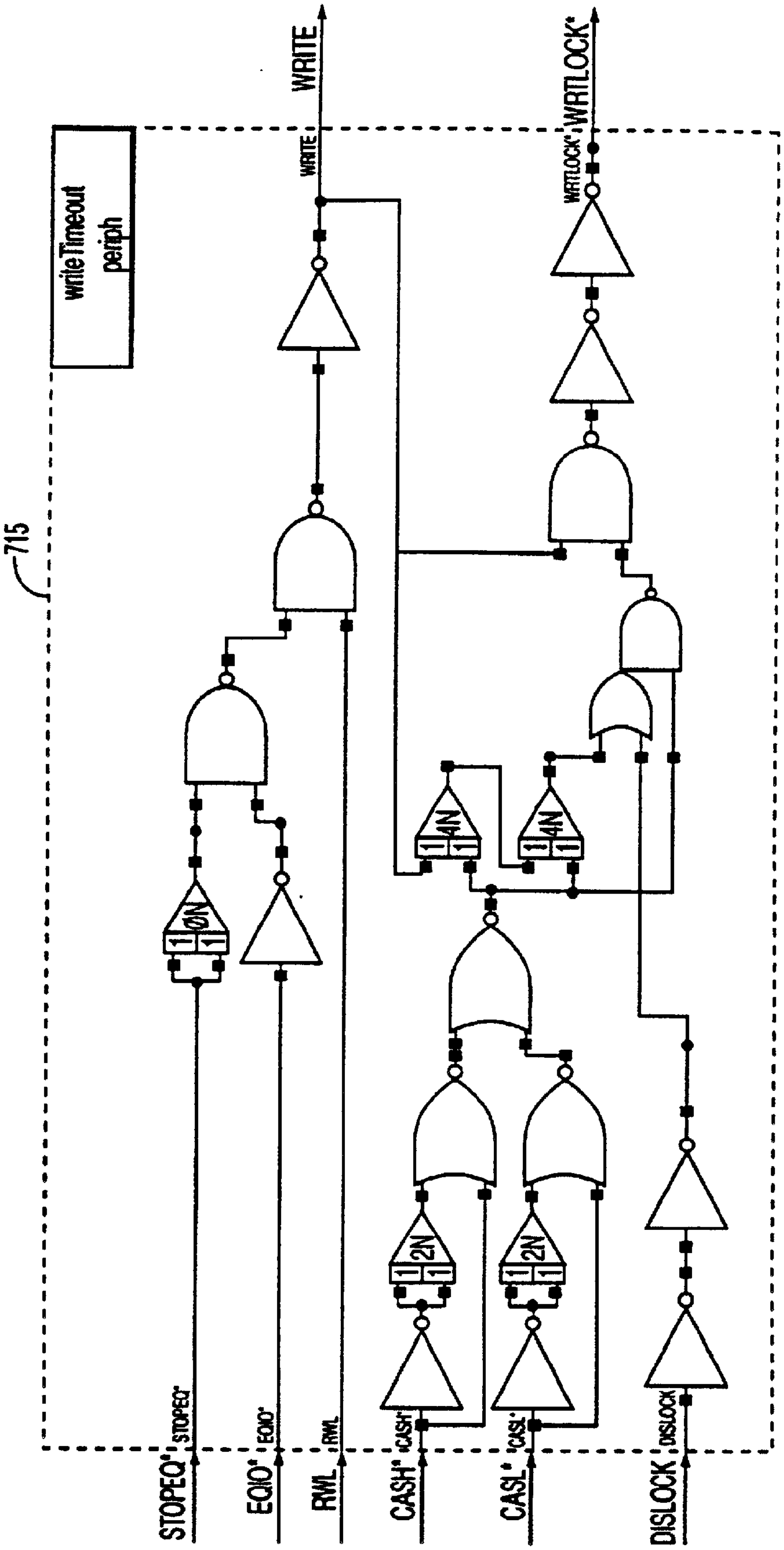
Figure 45L:
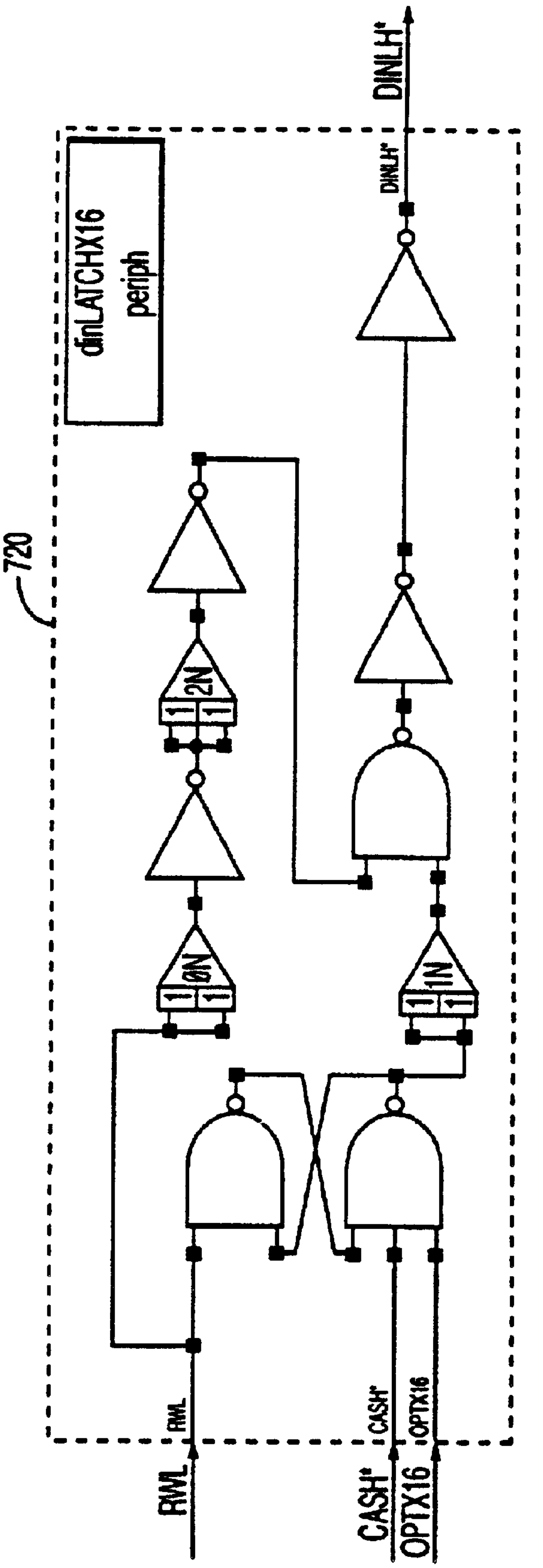
Figure 45M:
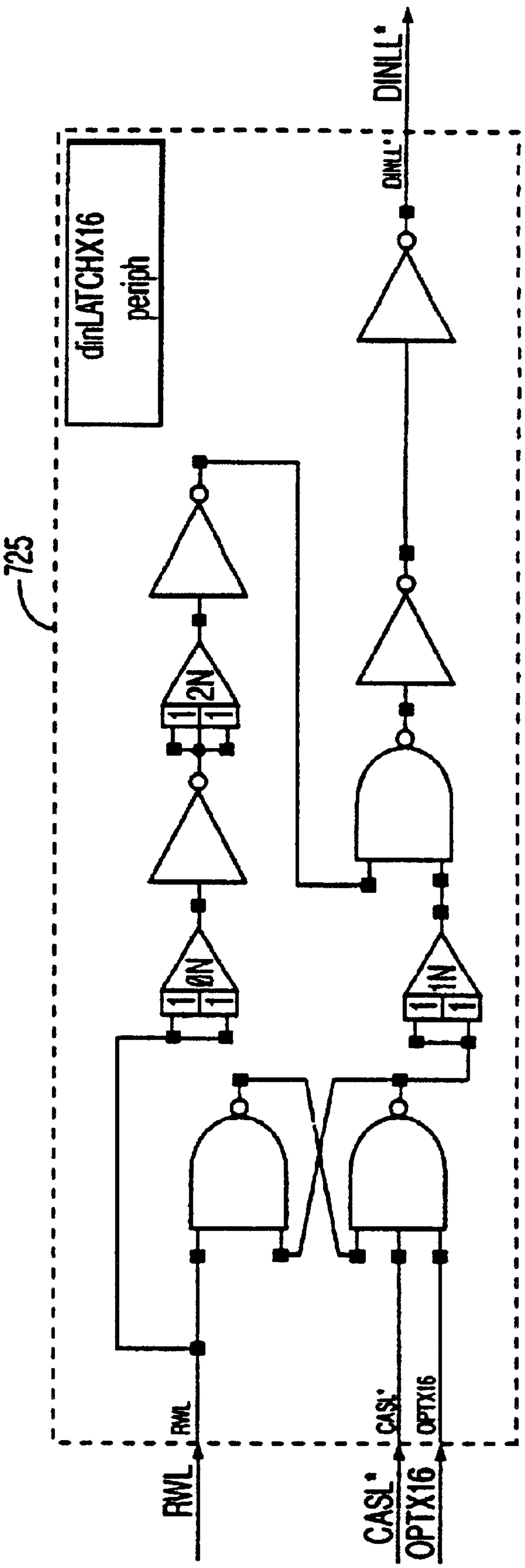
Figure 45N:
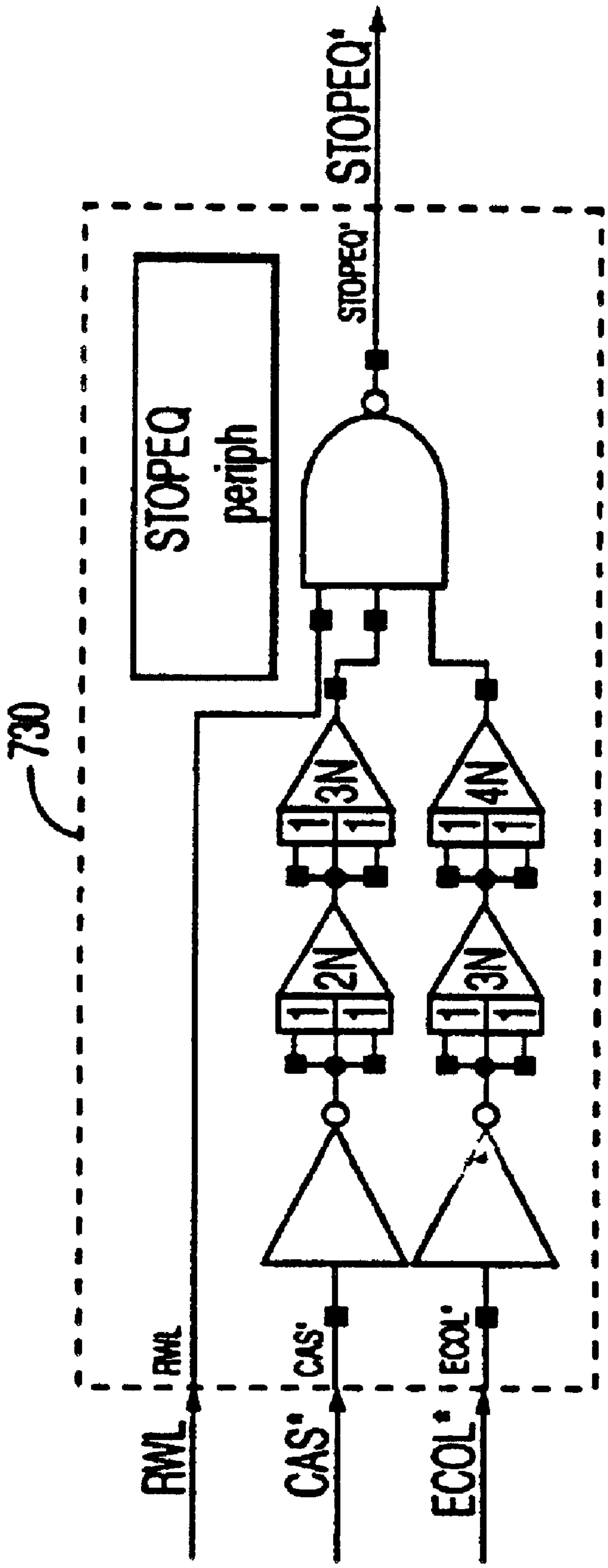
Figure 45P:
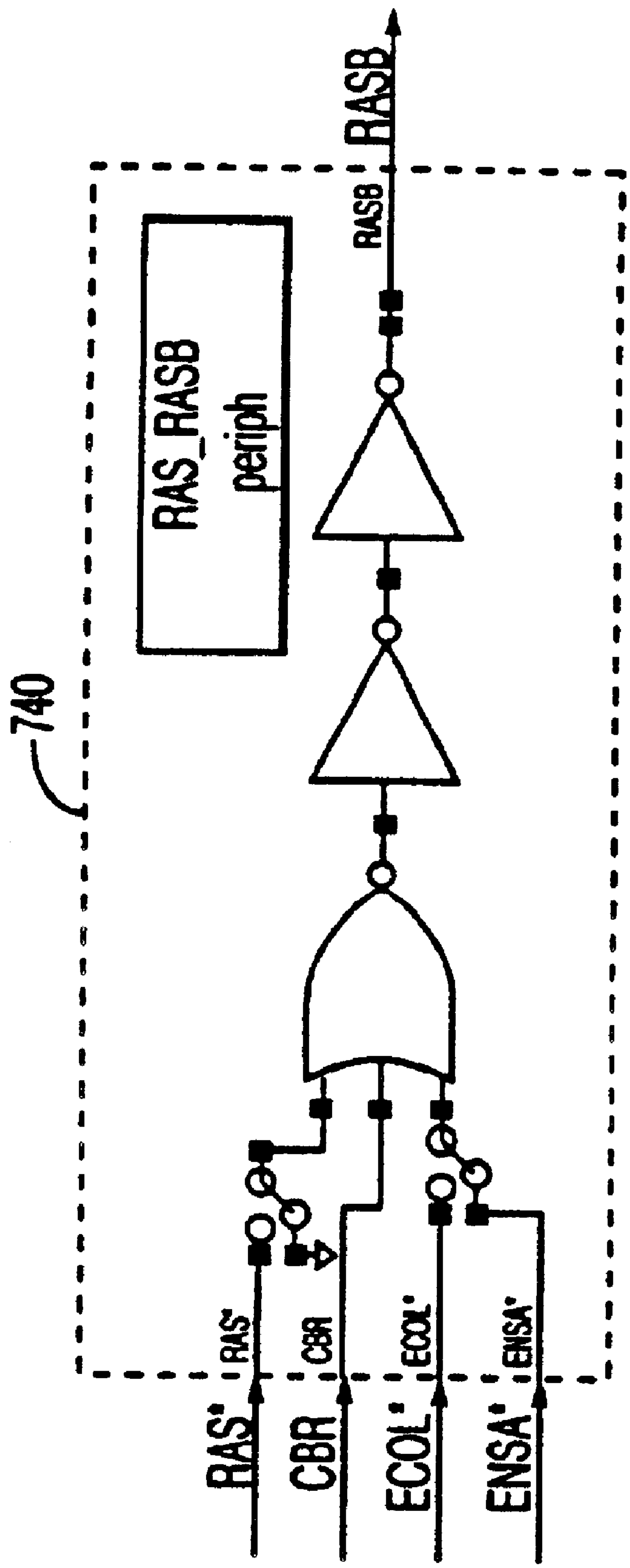
Figure 46:
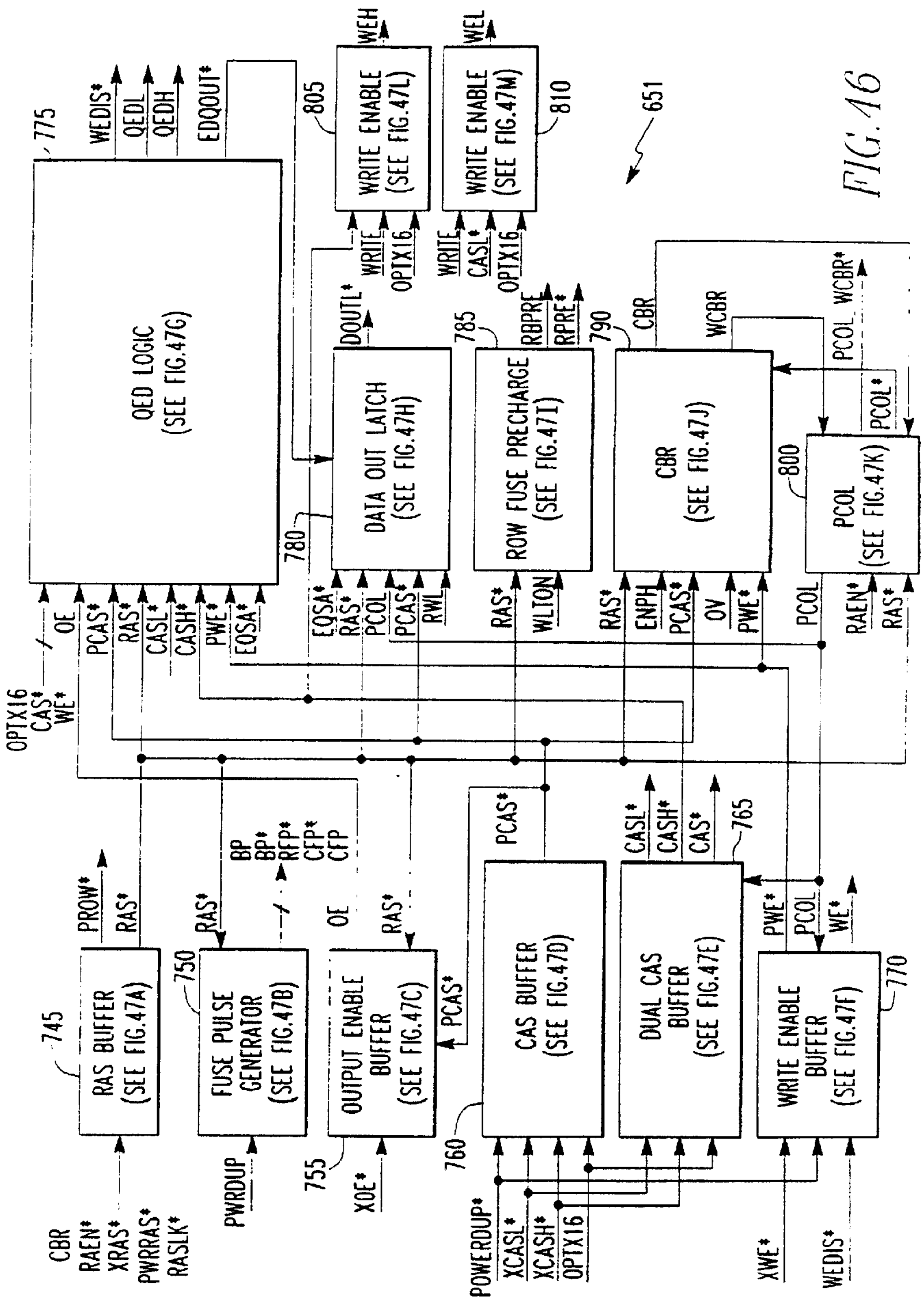
Figure 47A:
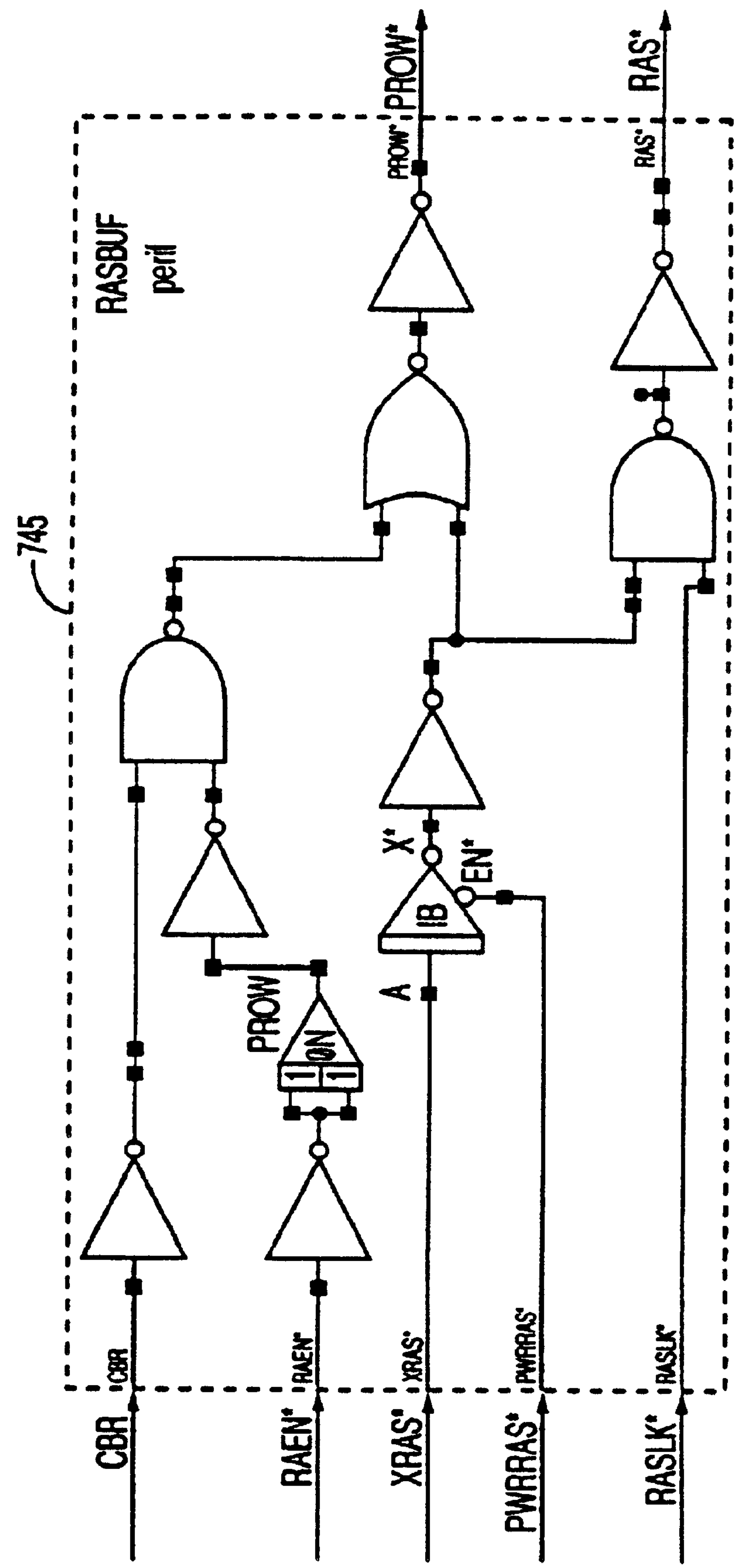
Figure 47B:
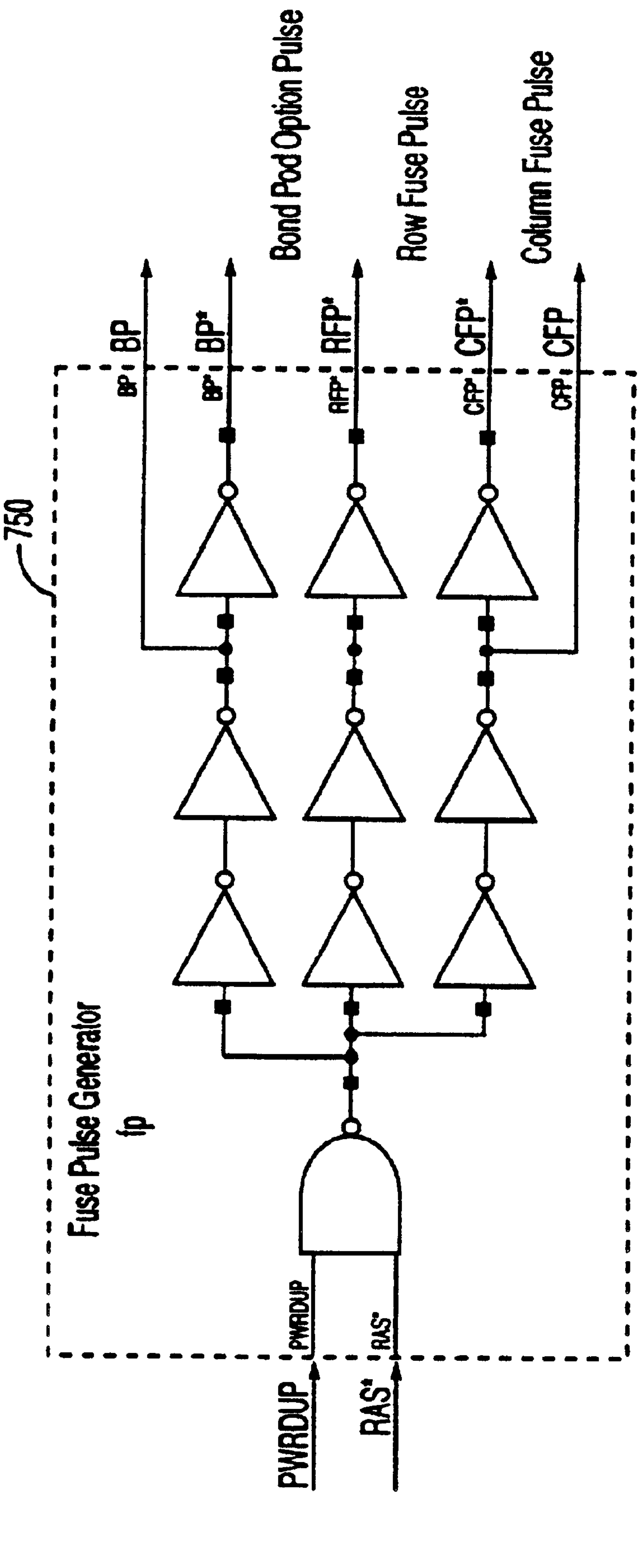
Figure 47C:
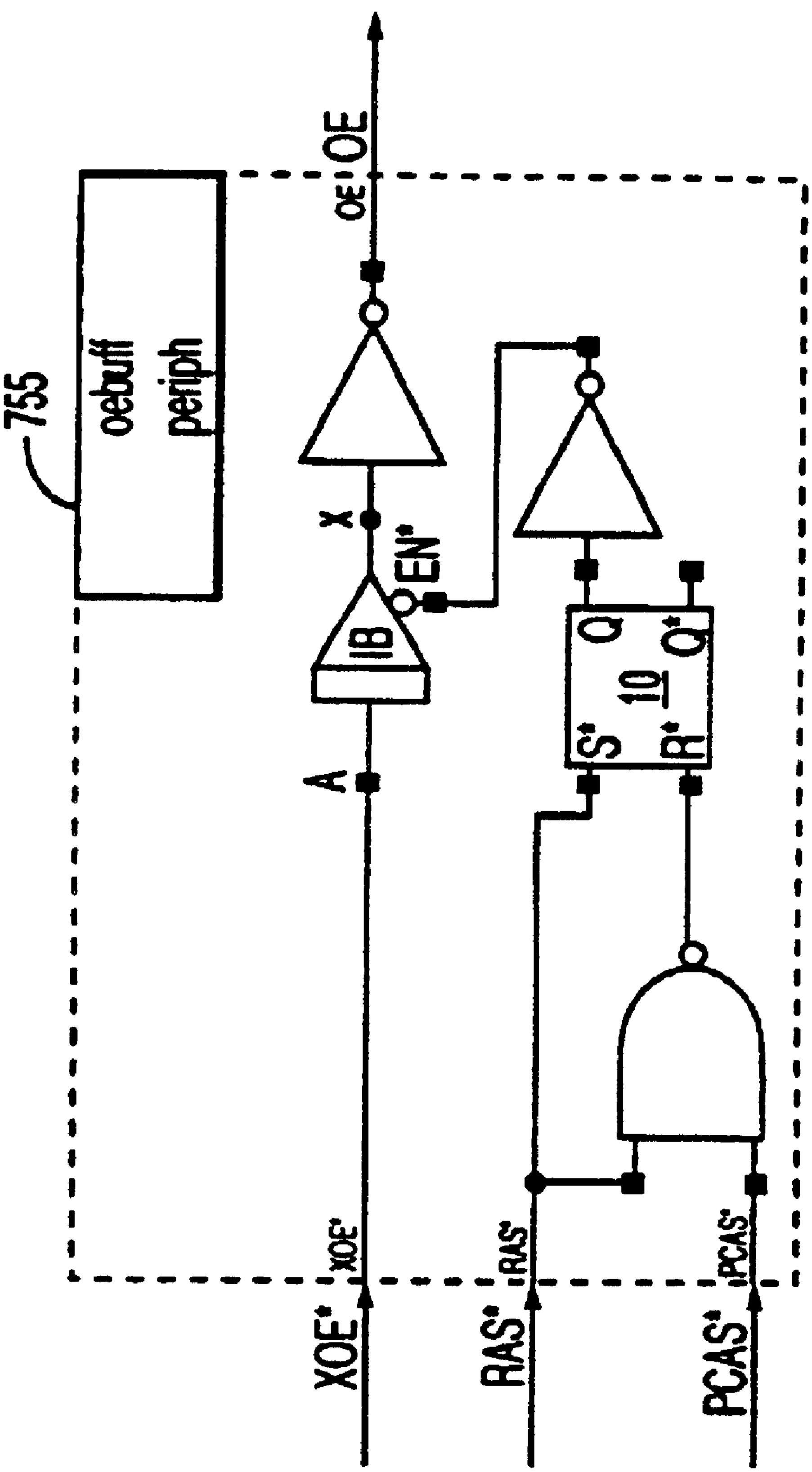
Figure 47D:
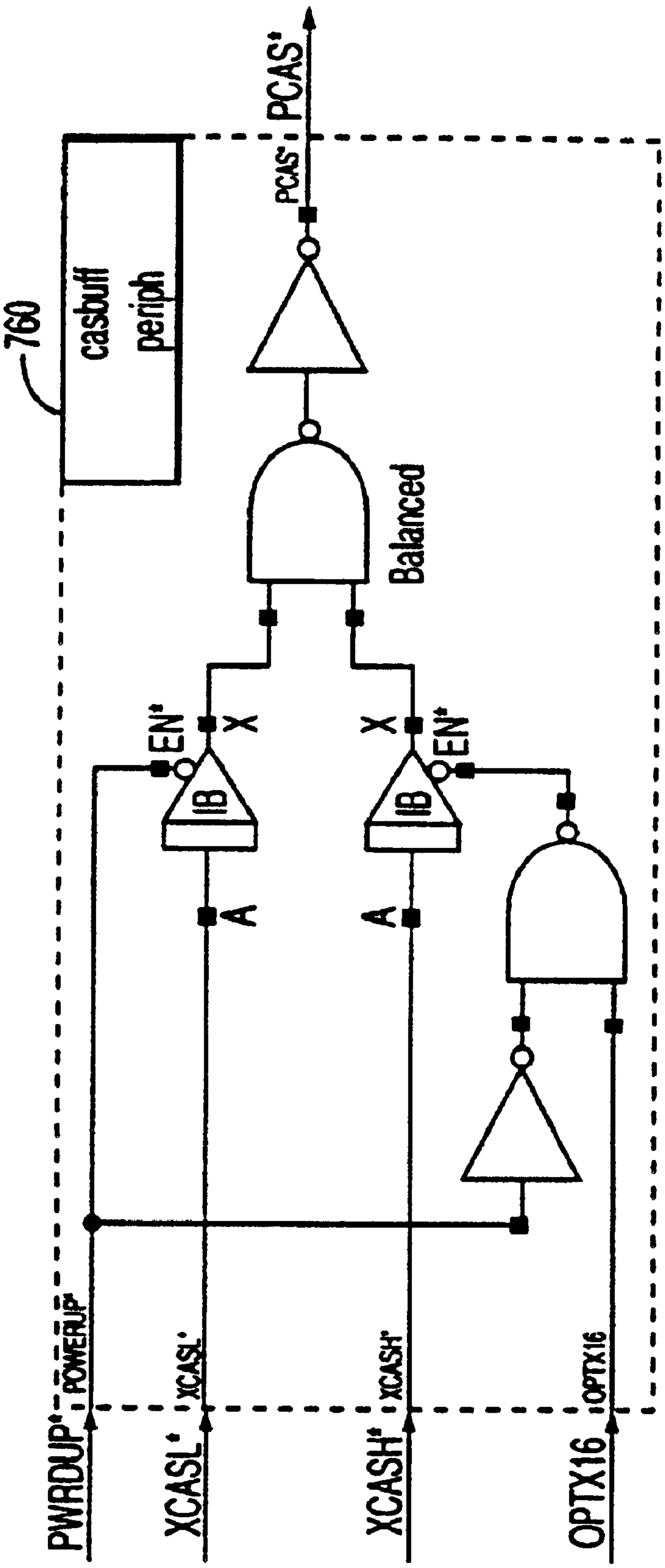
Figure 47E:
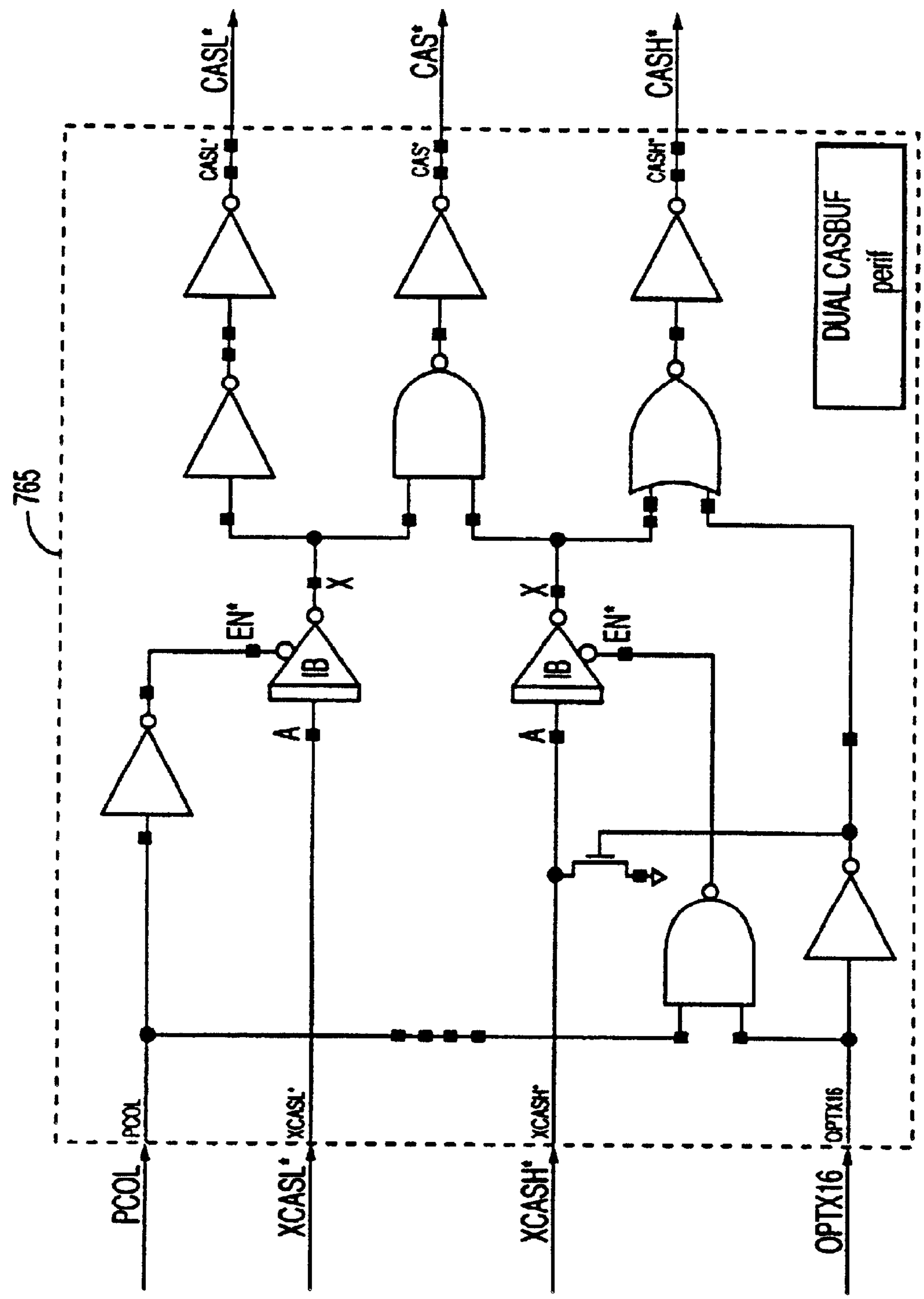
Figure 47F:
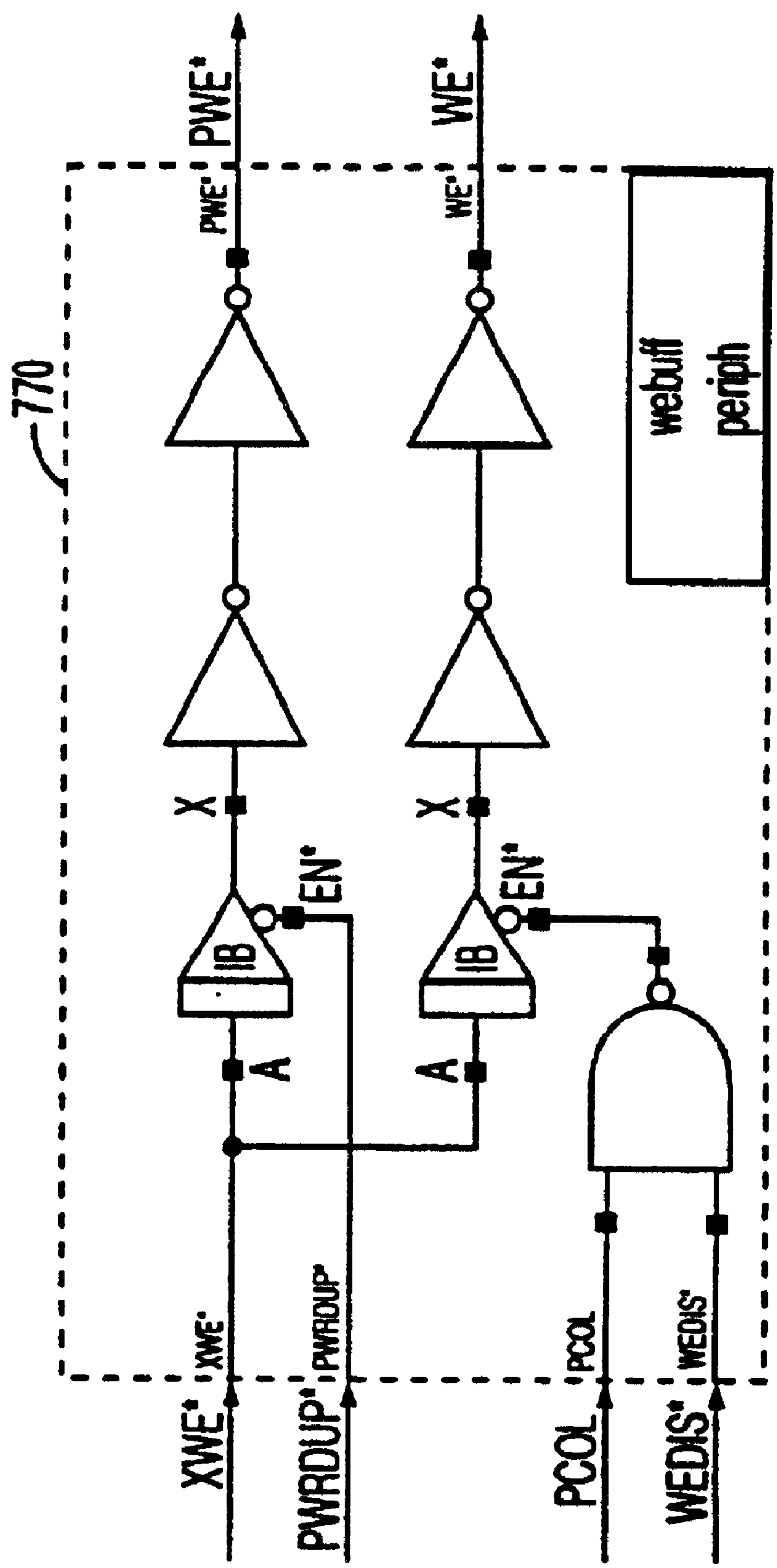
Figure 47G:
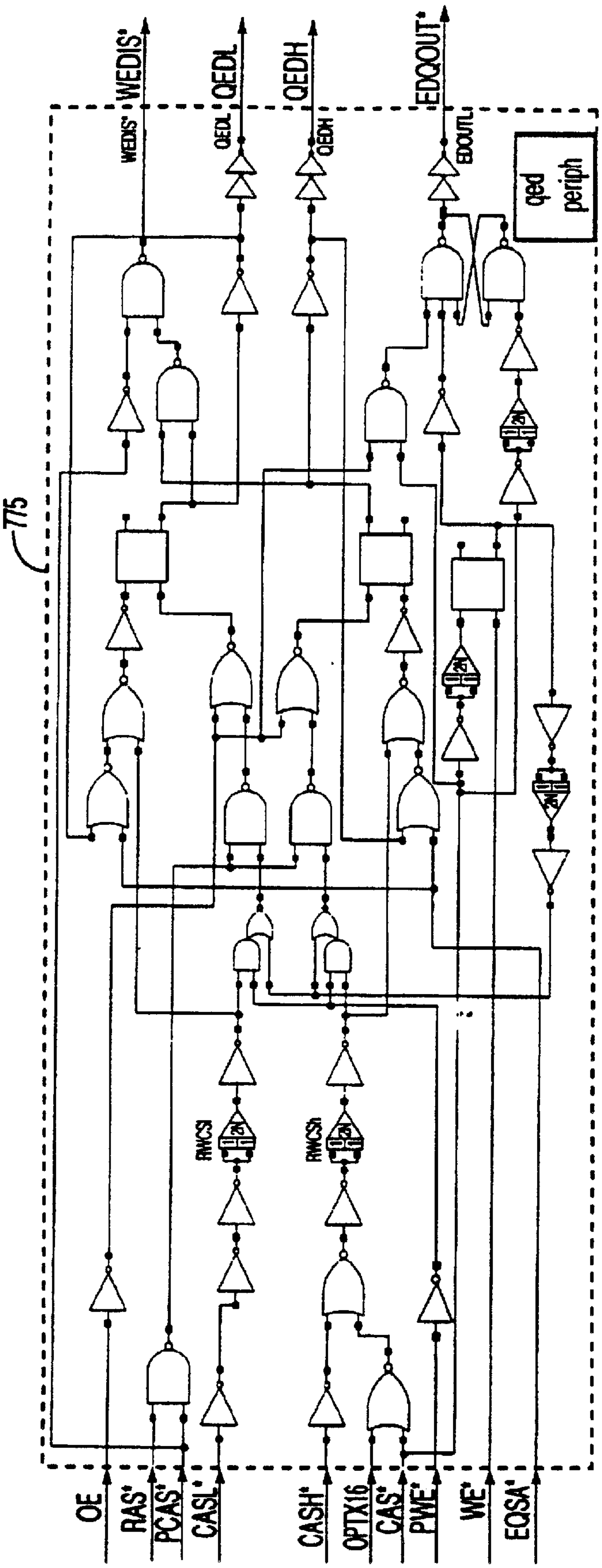
Figure 47H:
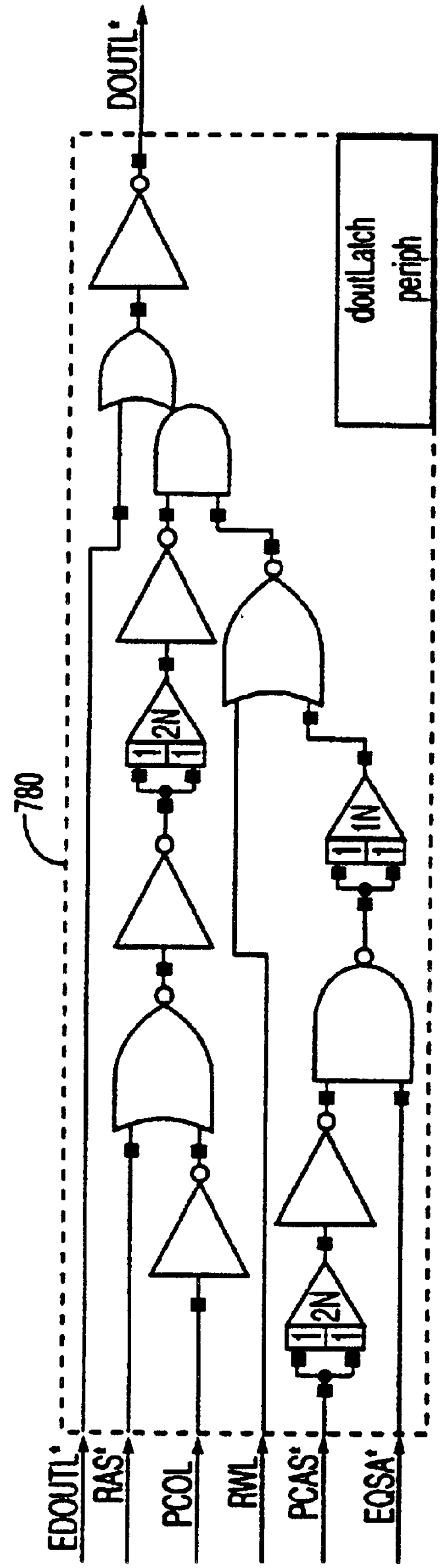
Figure 47I:
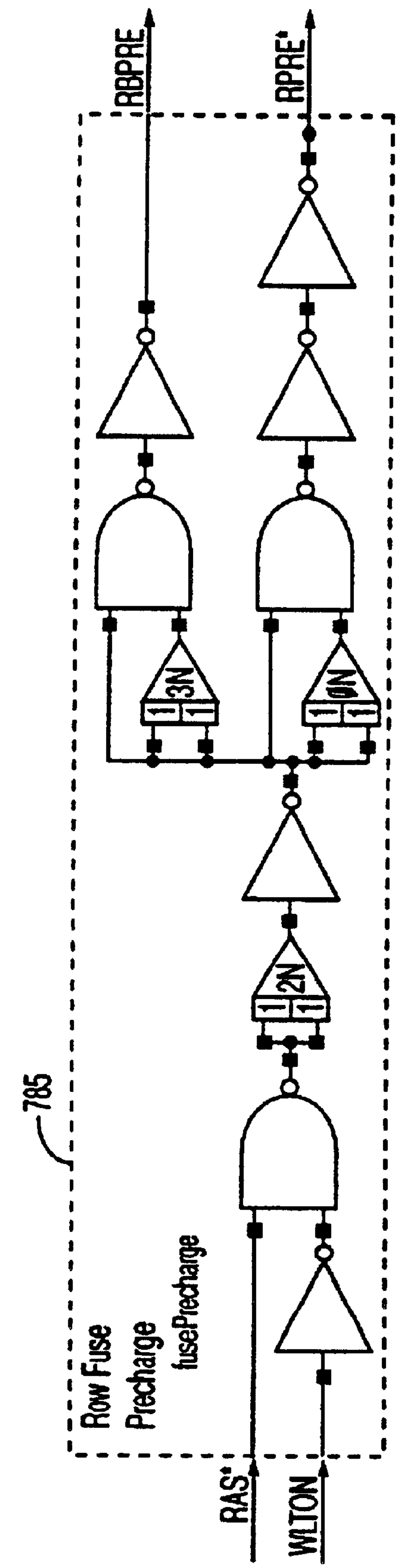
Figure 47J:
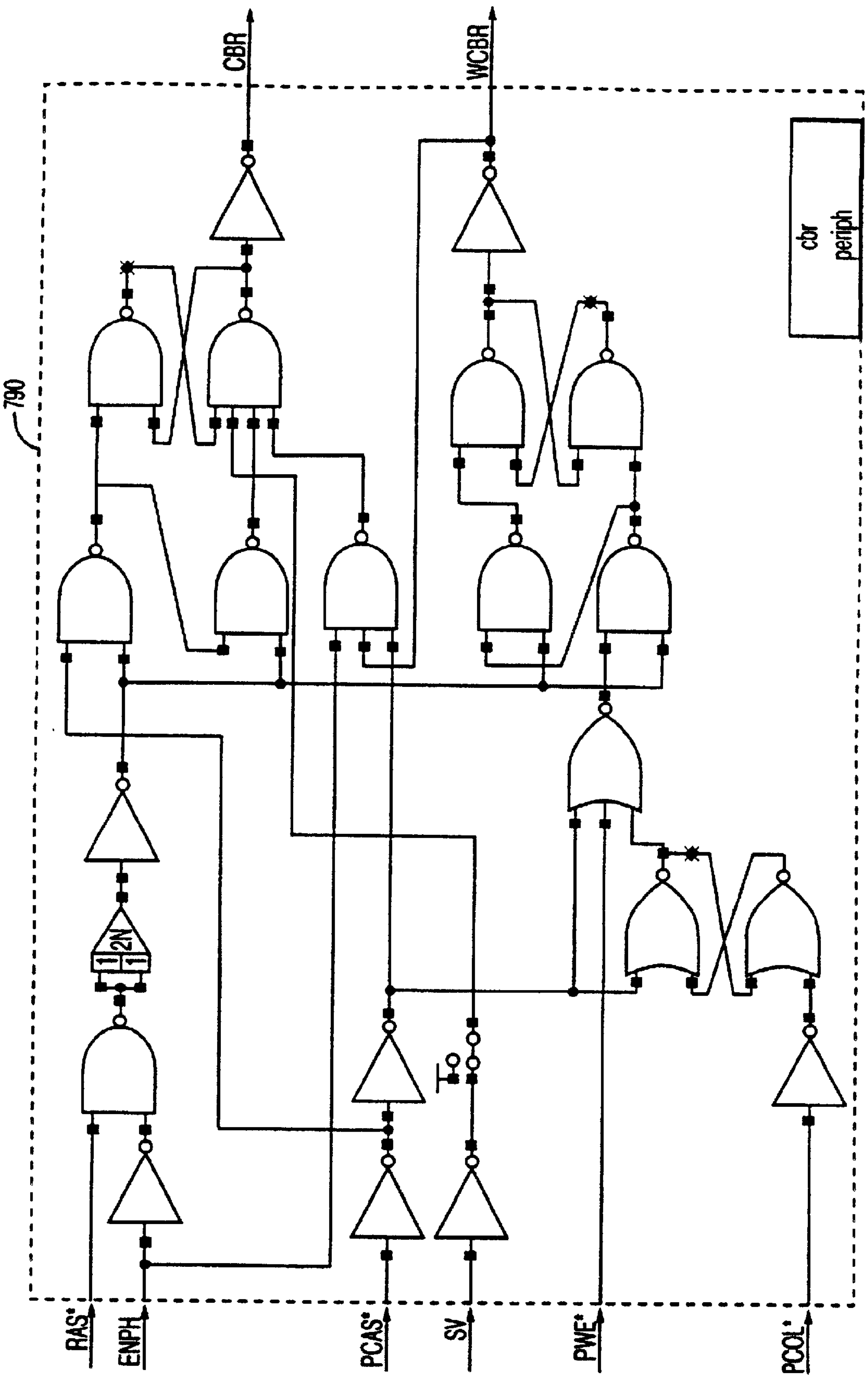
Figure 47K:
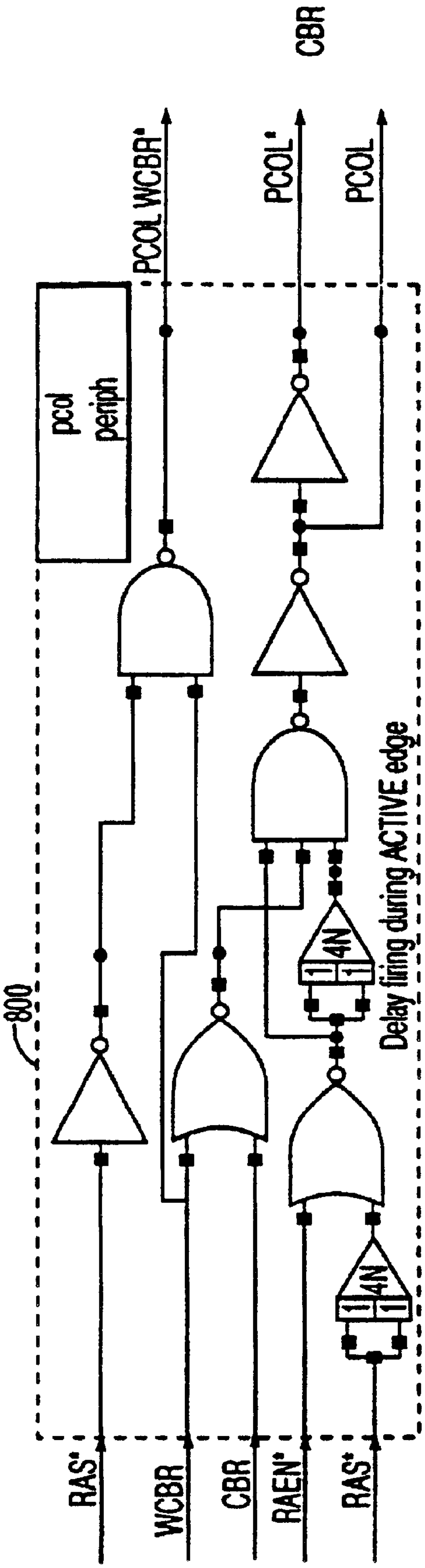
Figure 47L:
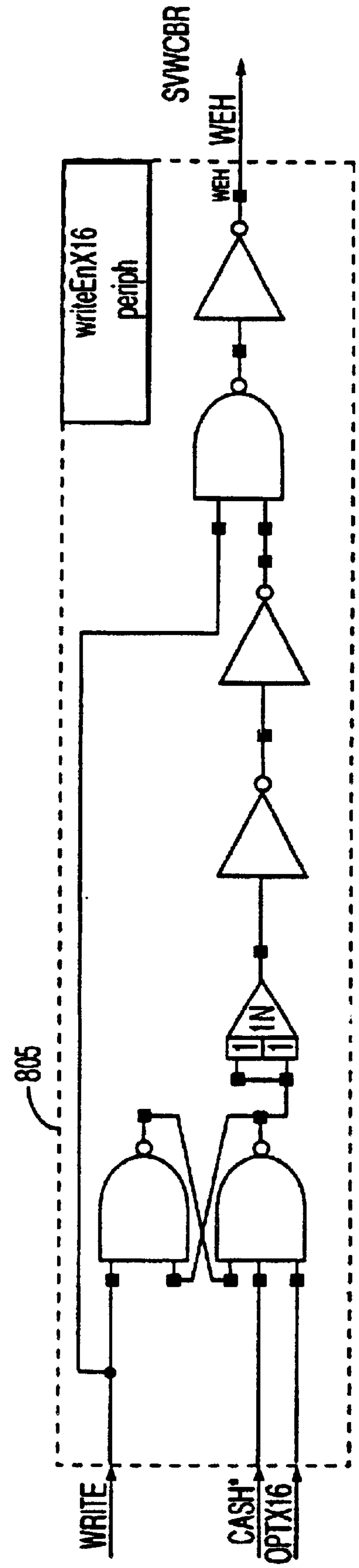
Figure 47M:
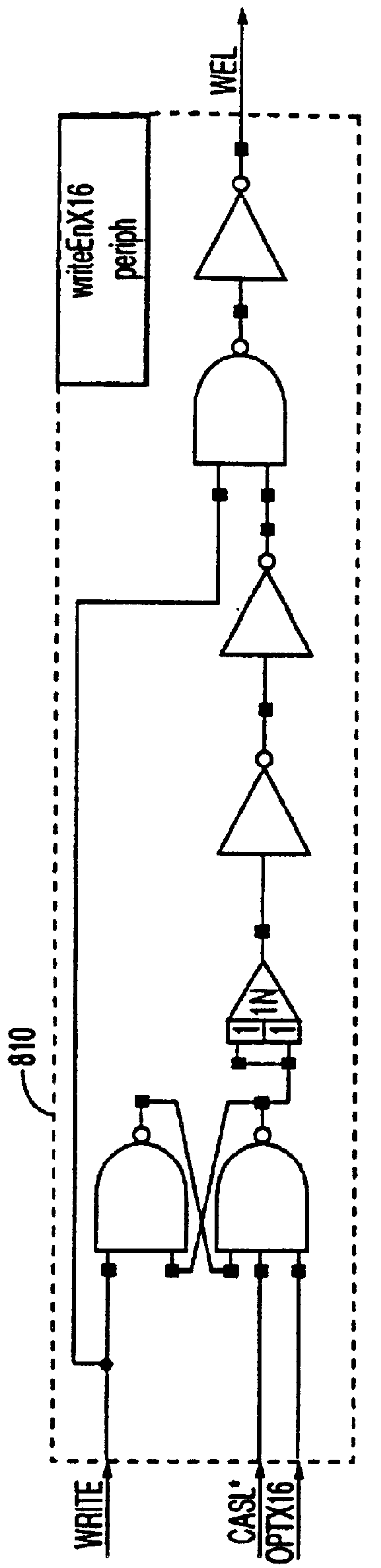
Figure 48A:
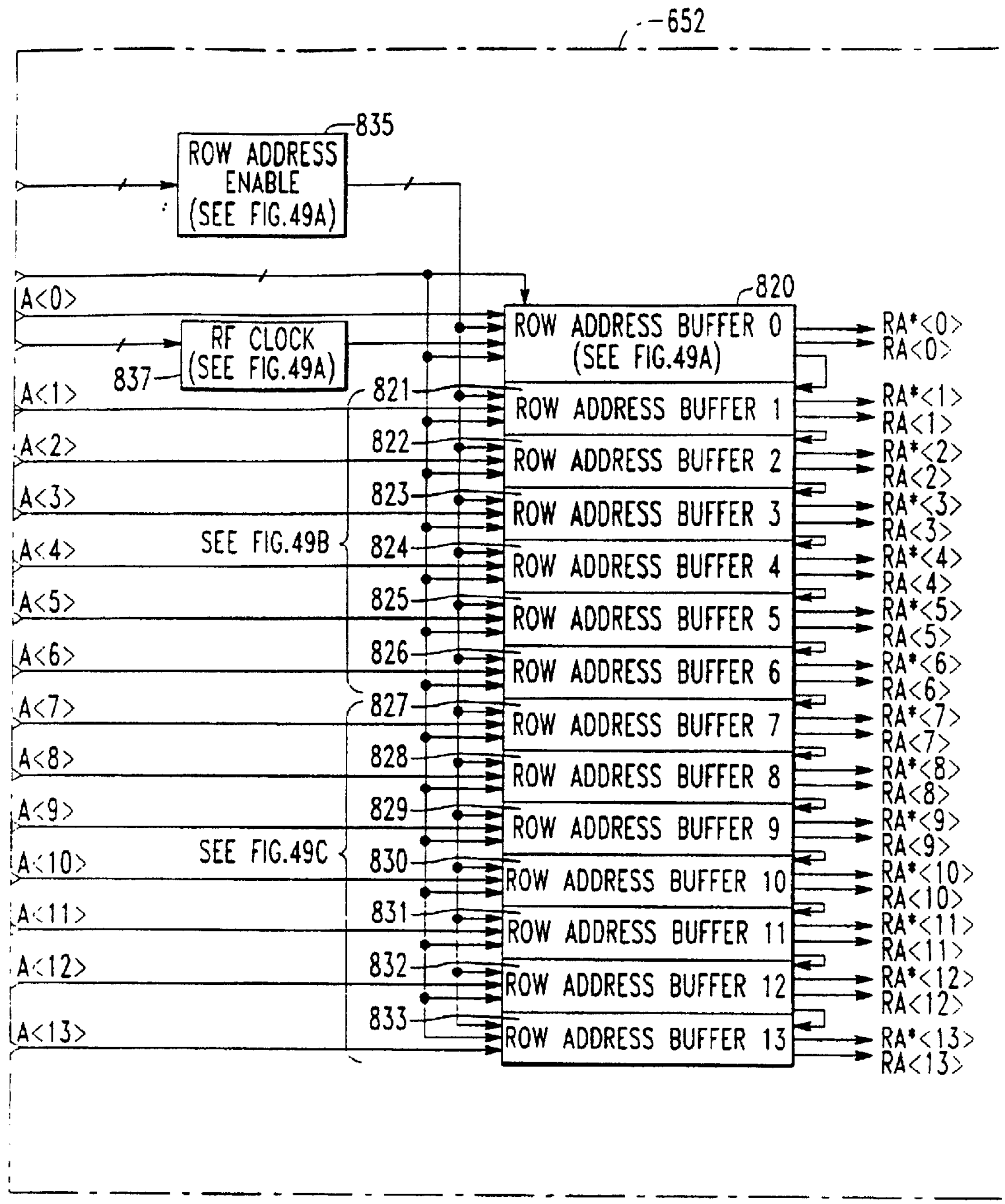
Figure 48B:
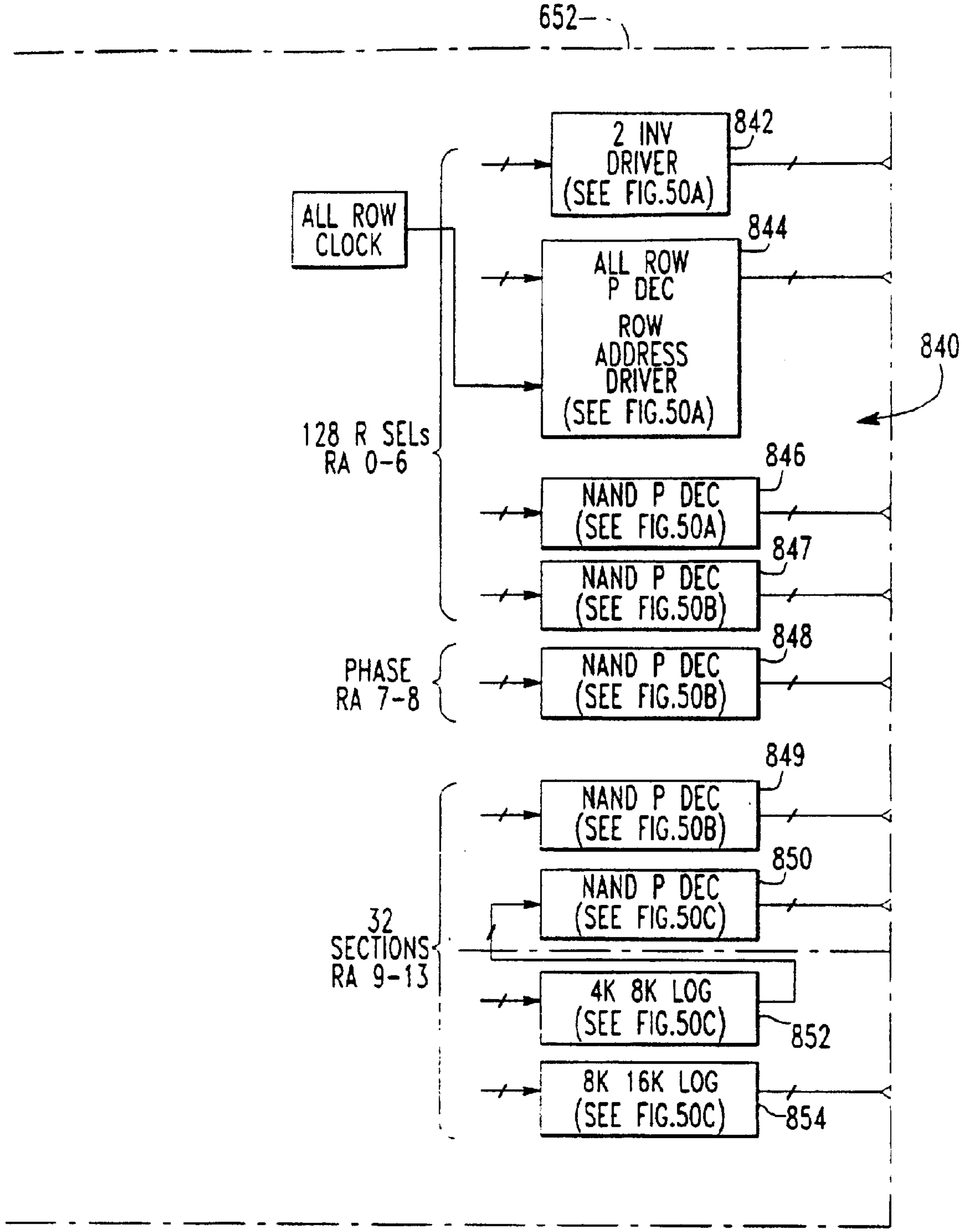
Figure 49A:
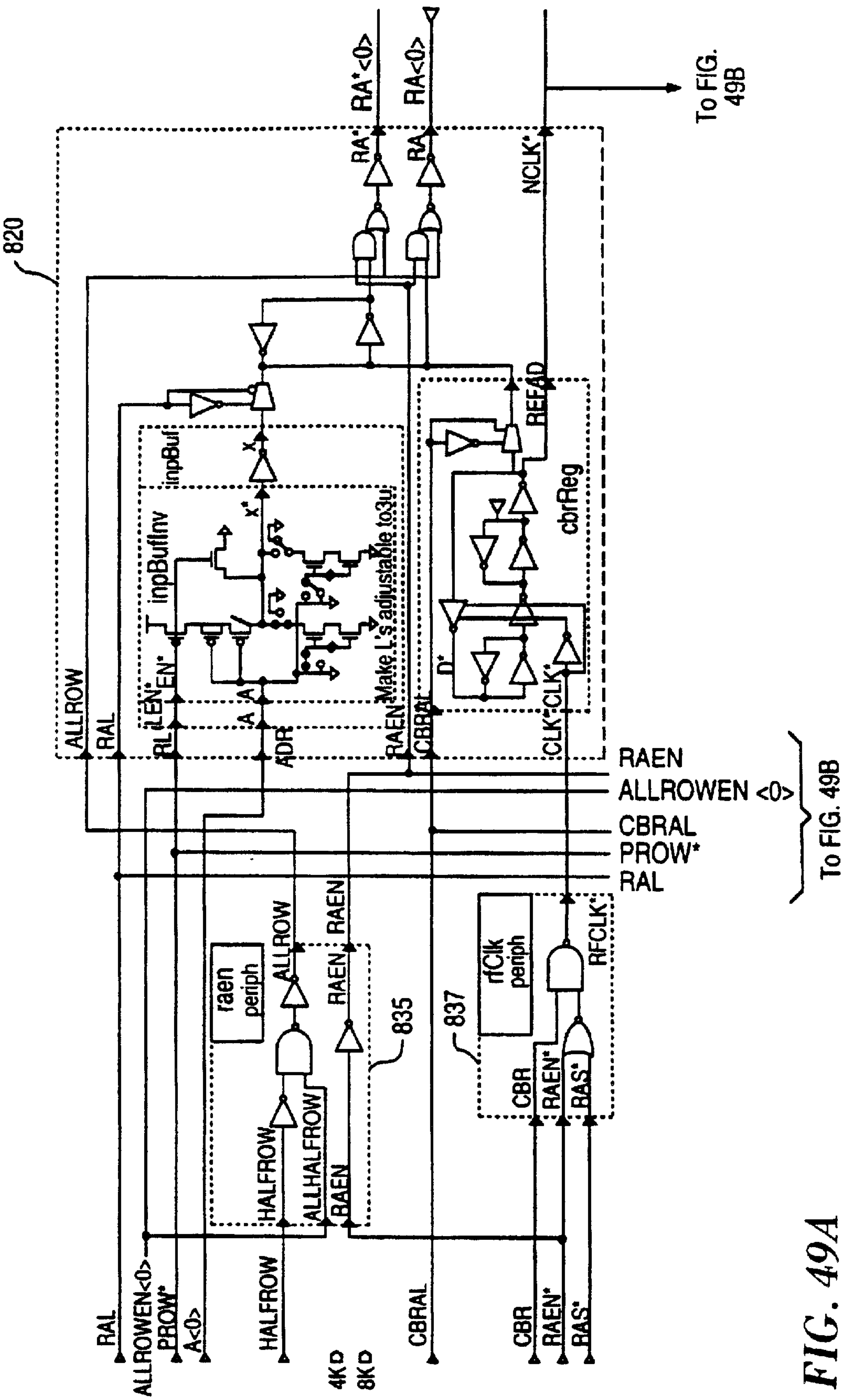
Figure 49B:
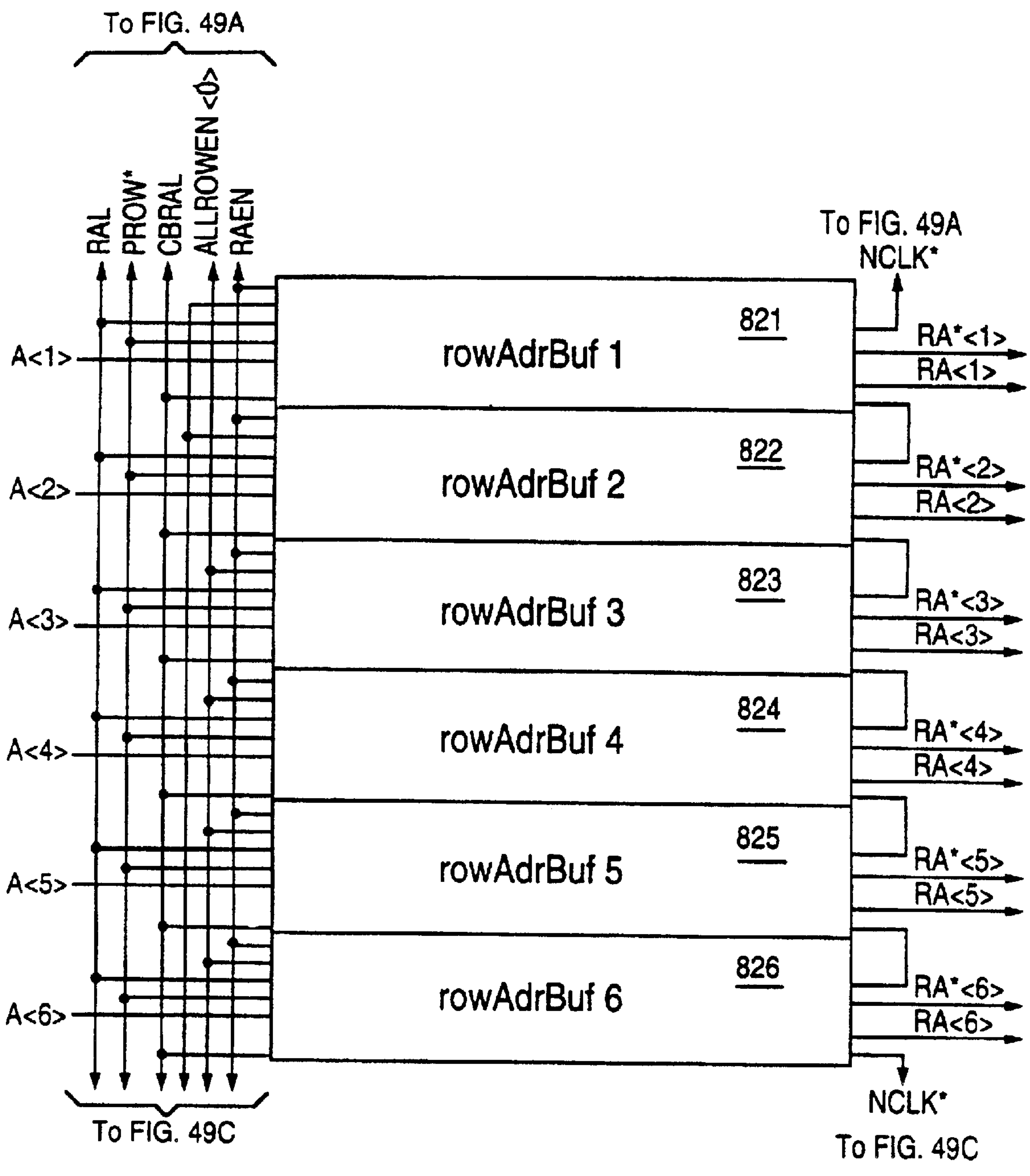
Figure 49C:
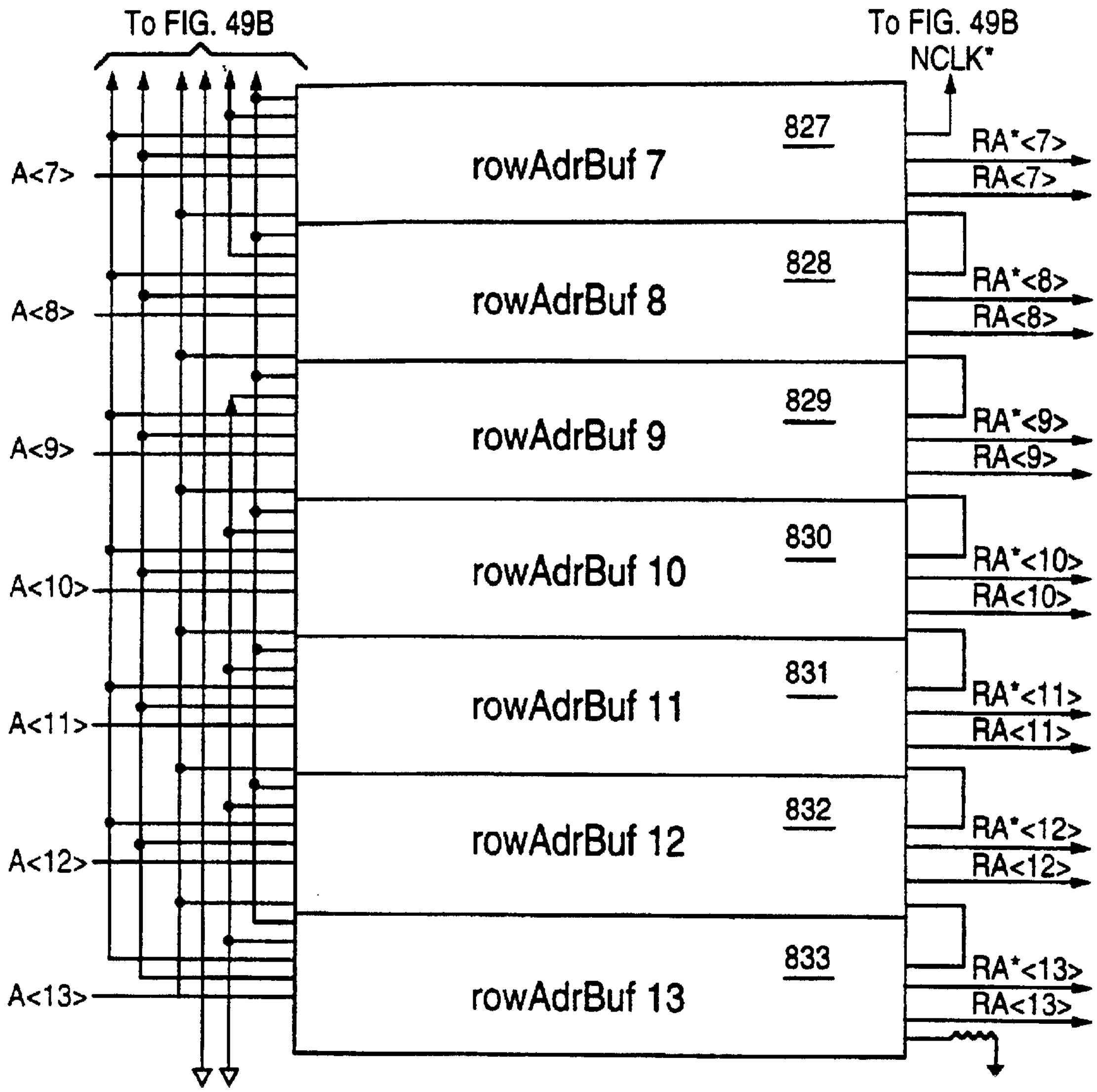
Figure 50A:
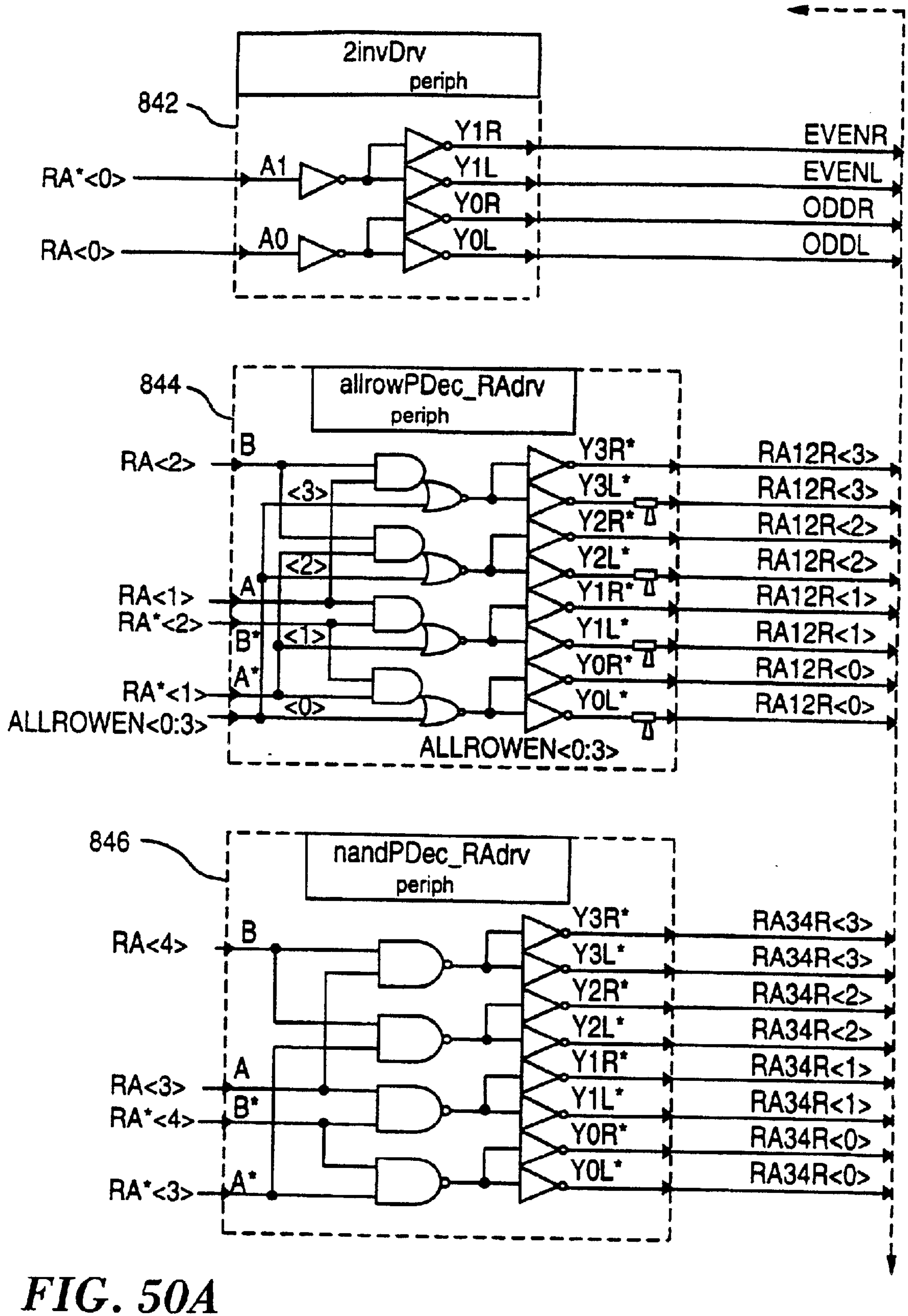
Figure 50B:
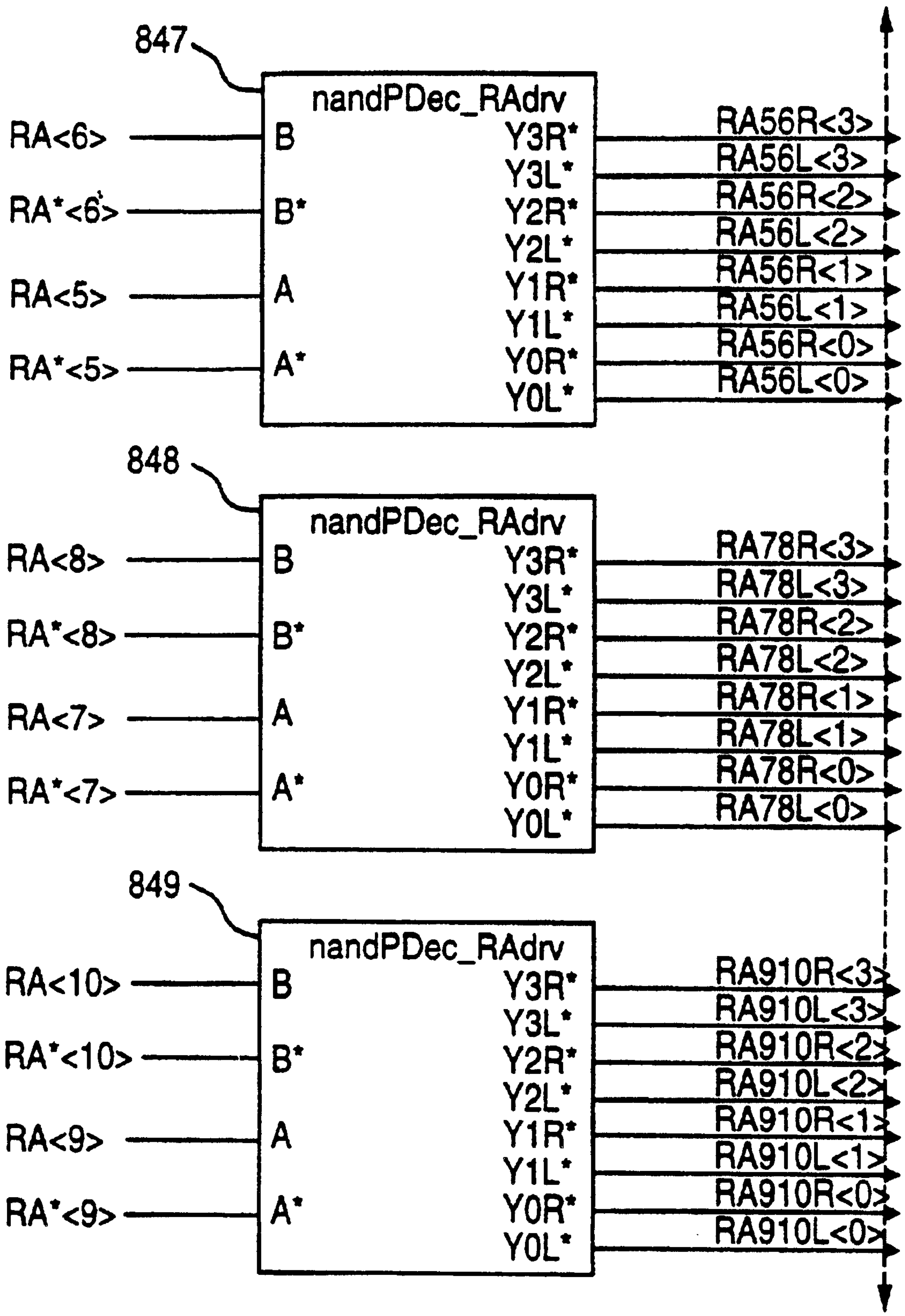
Figure 50C:
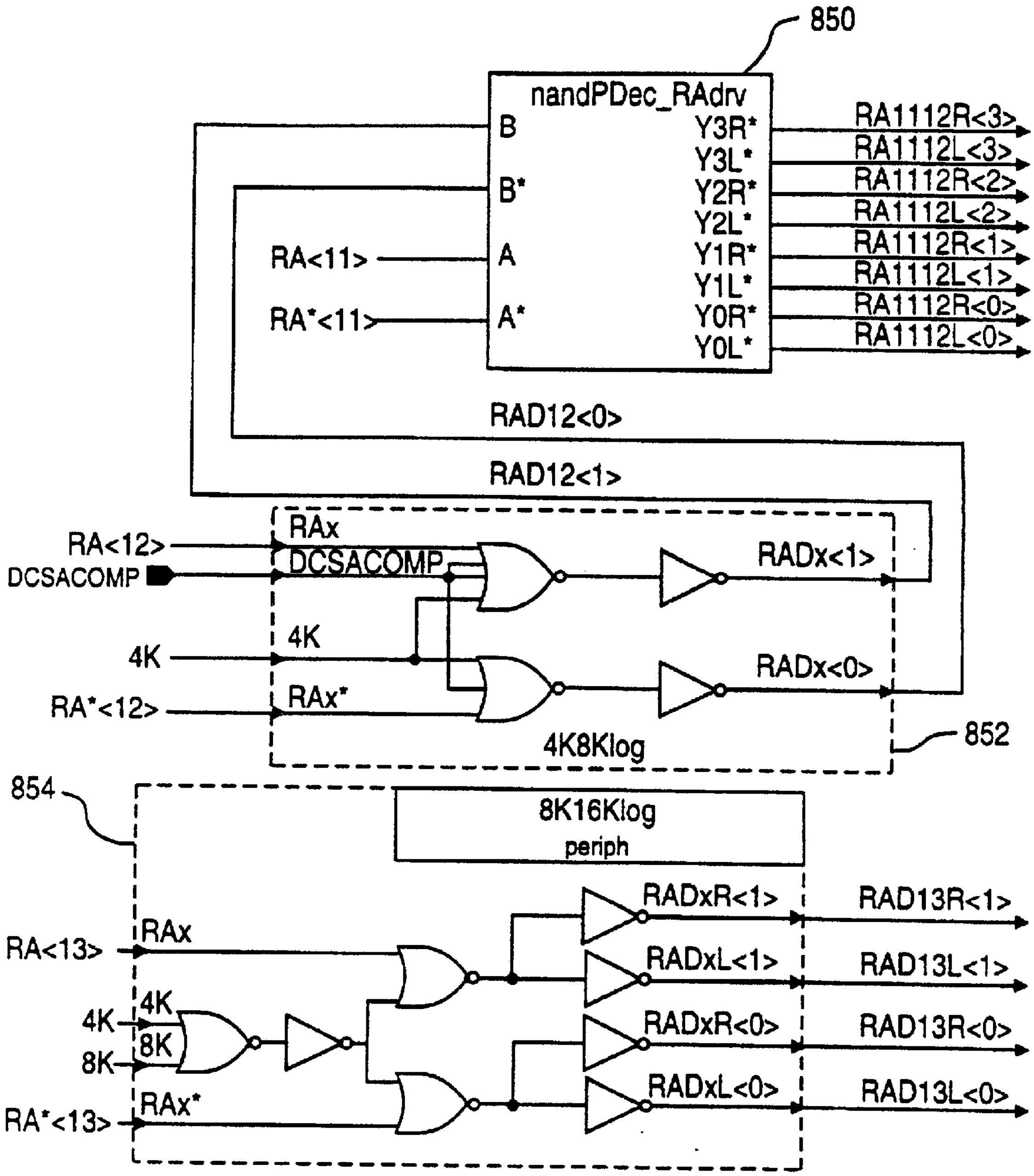
Figure 51A:
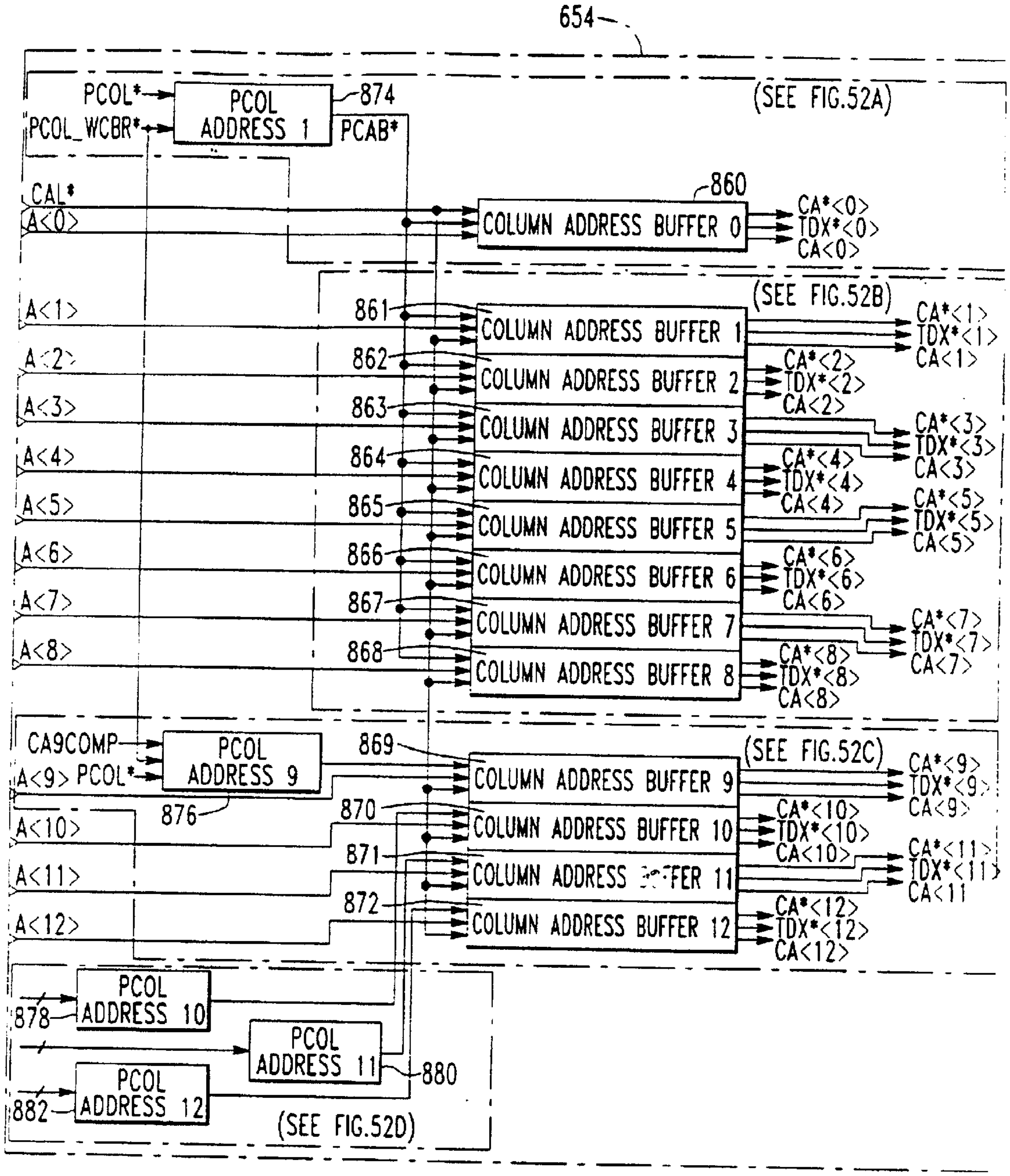
Figure 51B:
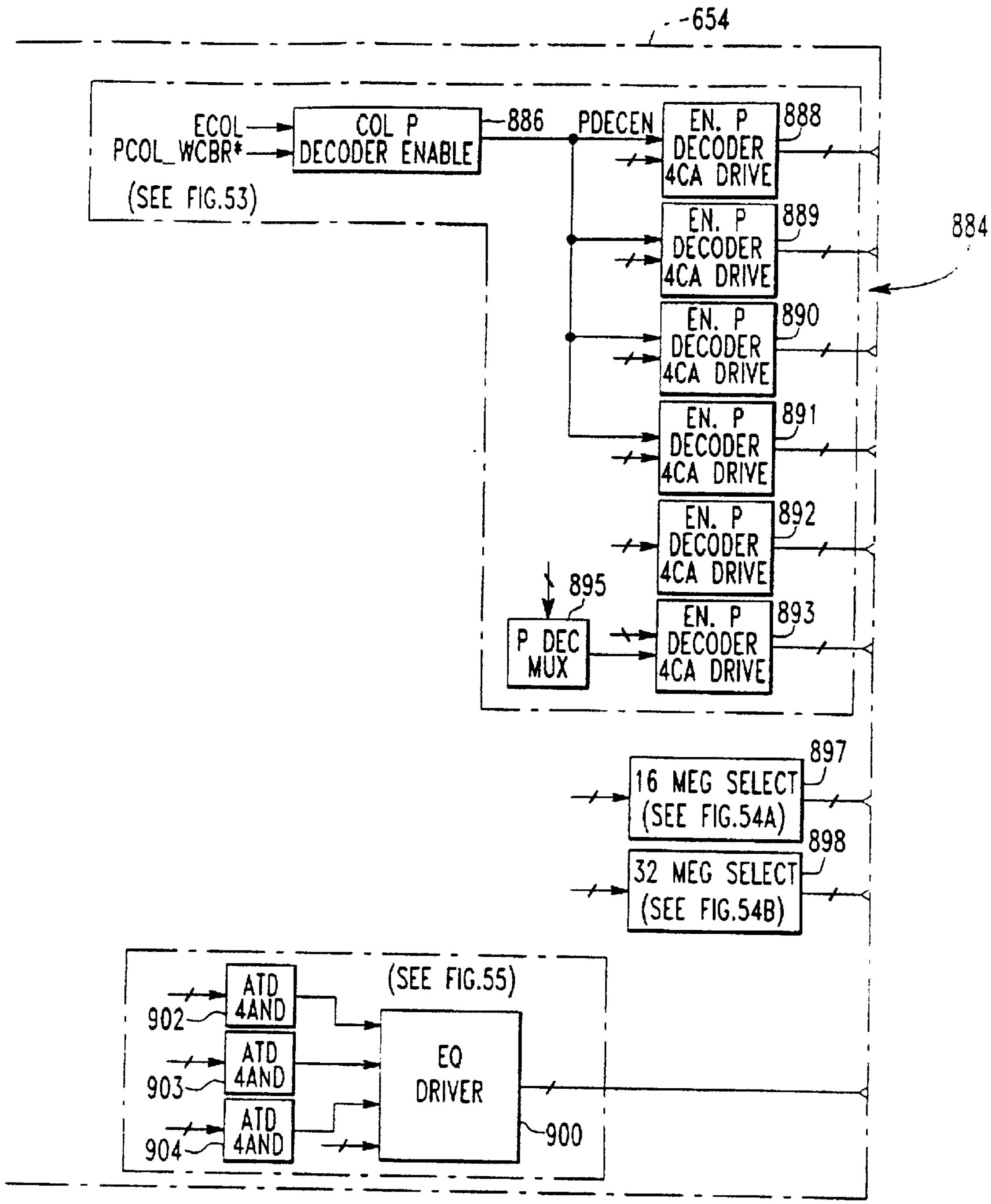
Figures 1, 53:
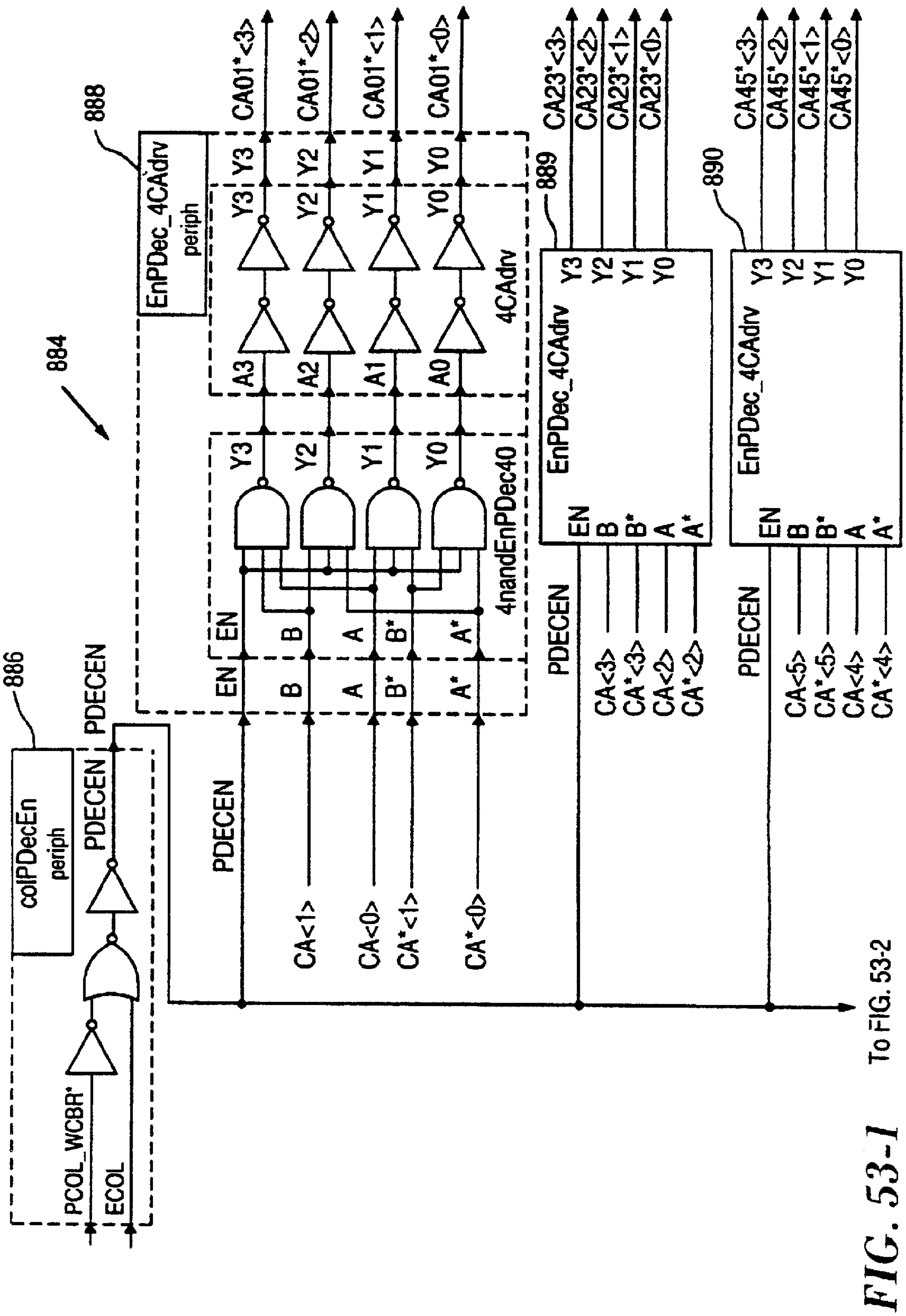
Figures 2, 53:
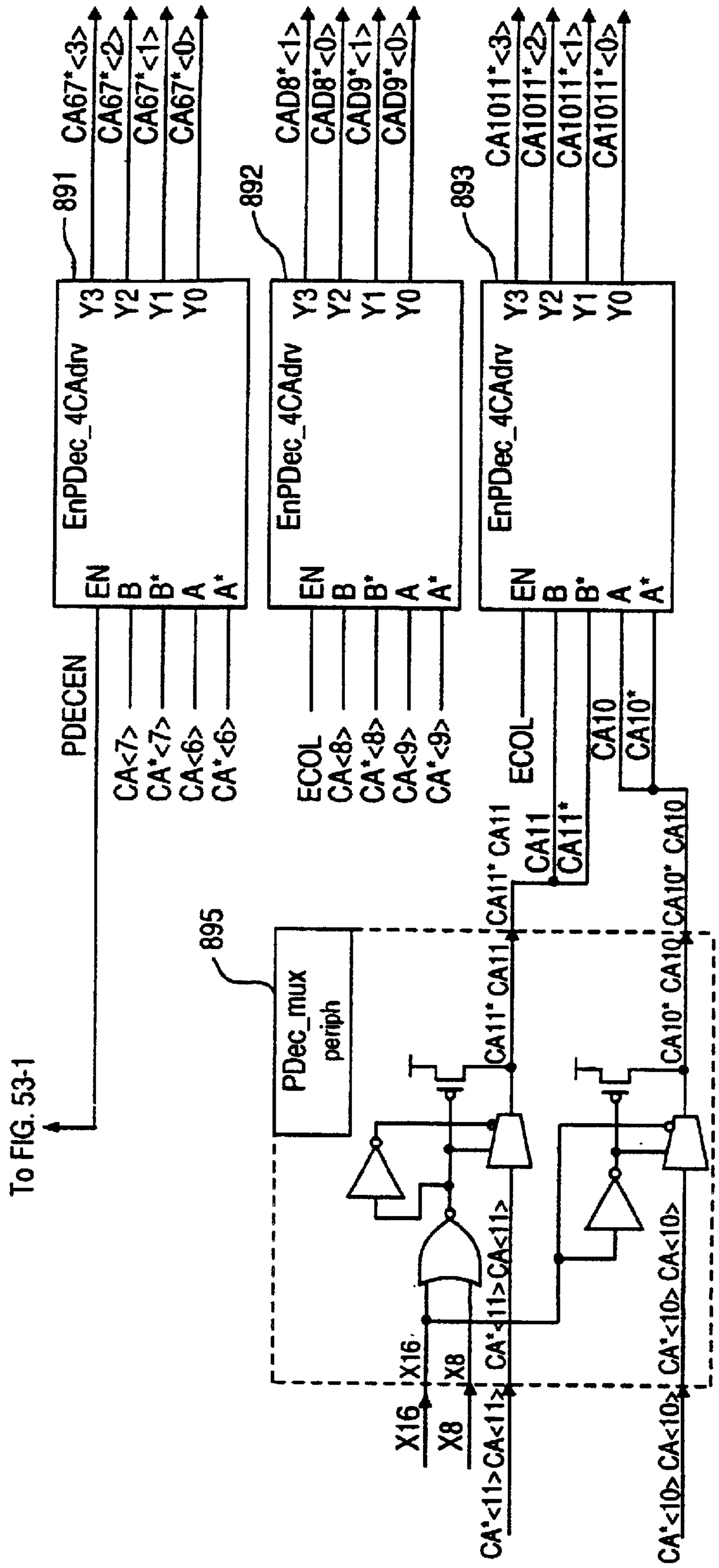
Figure 54A:
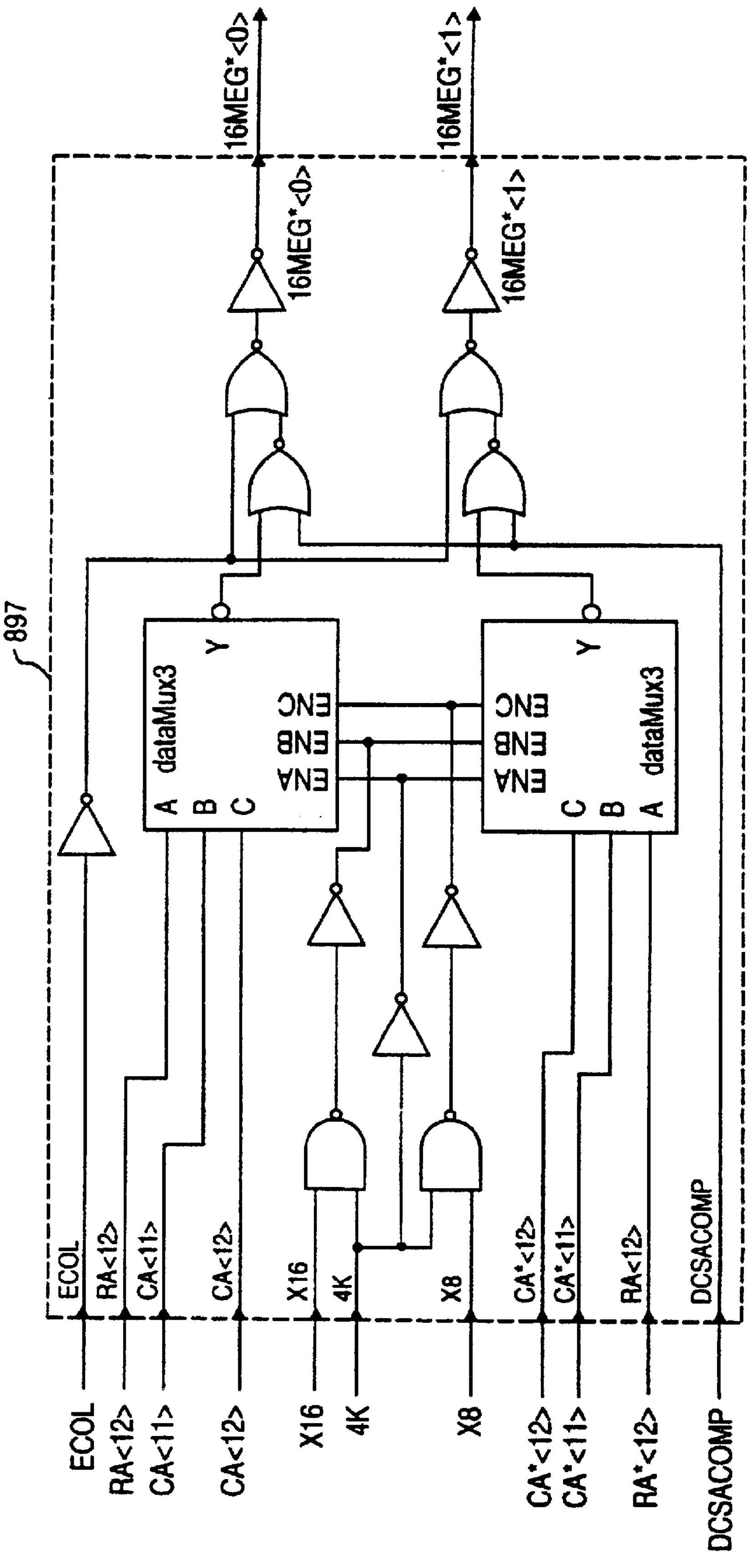
Figure 54B:
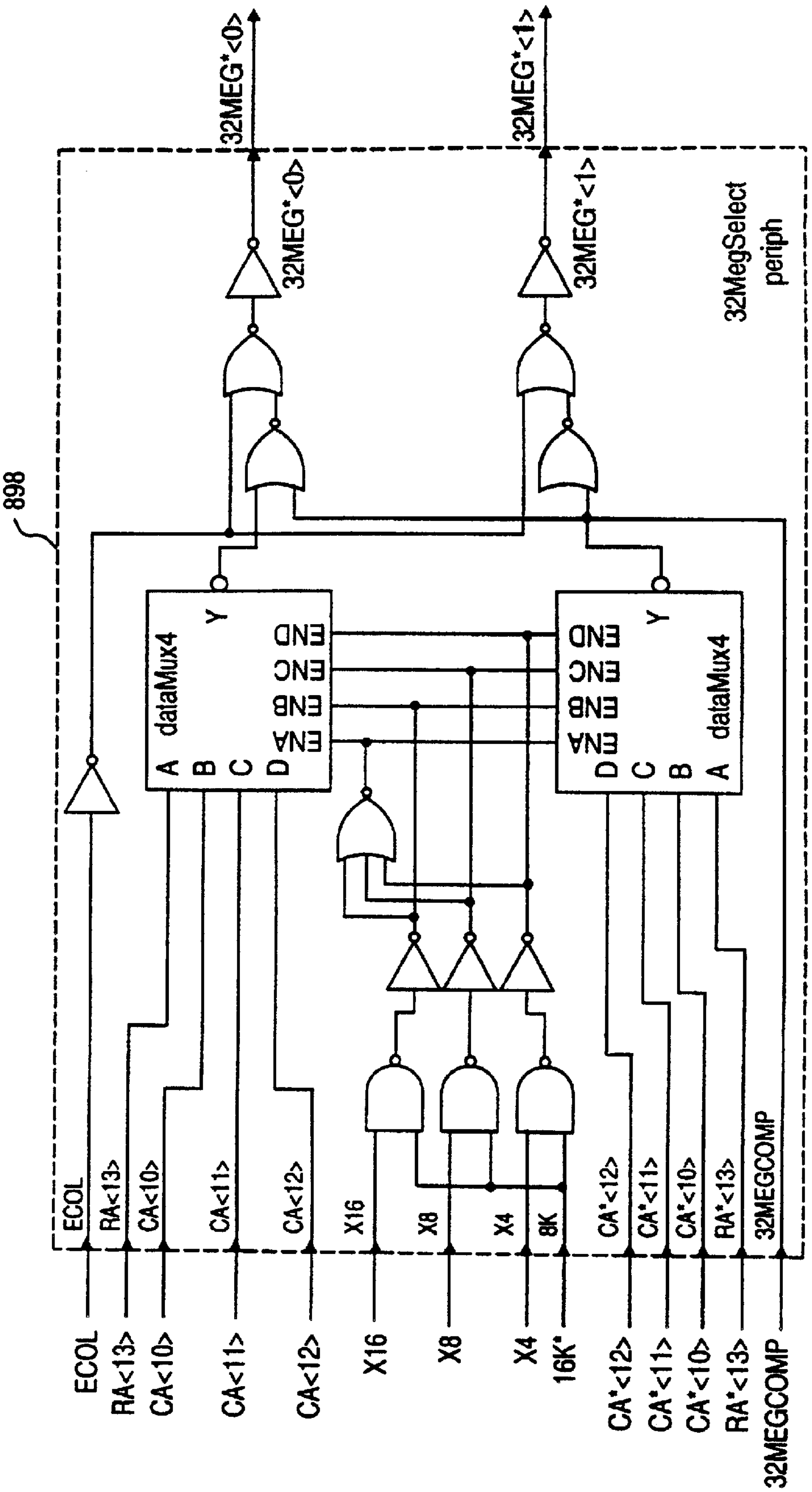
Figure 55:
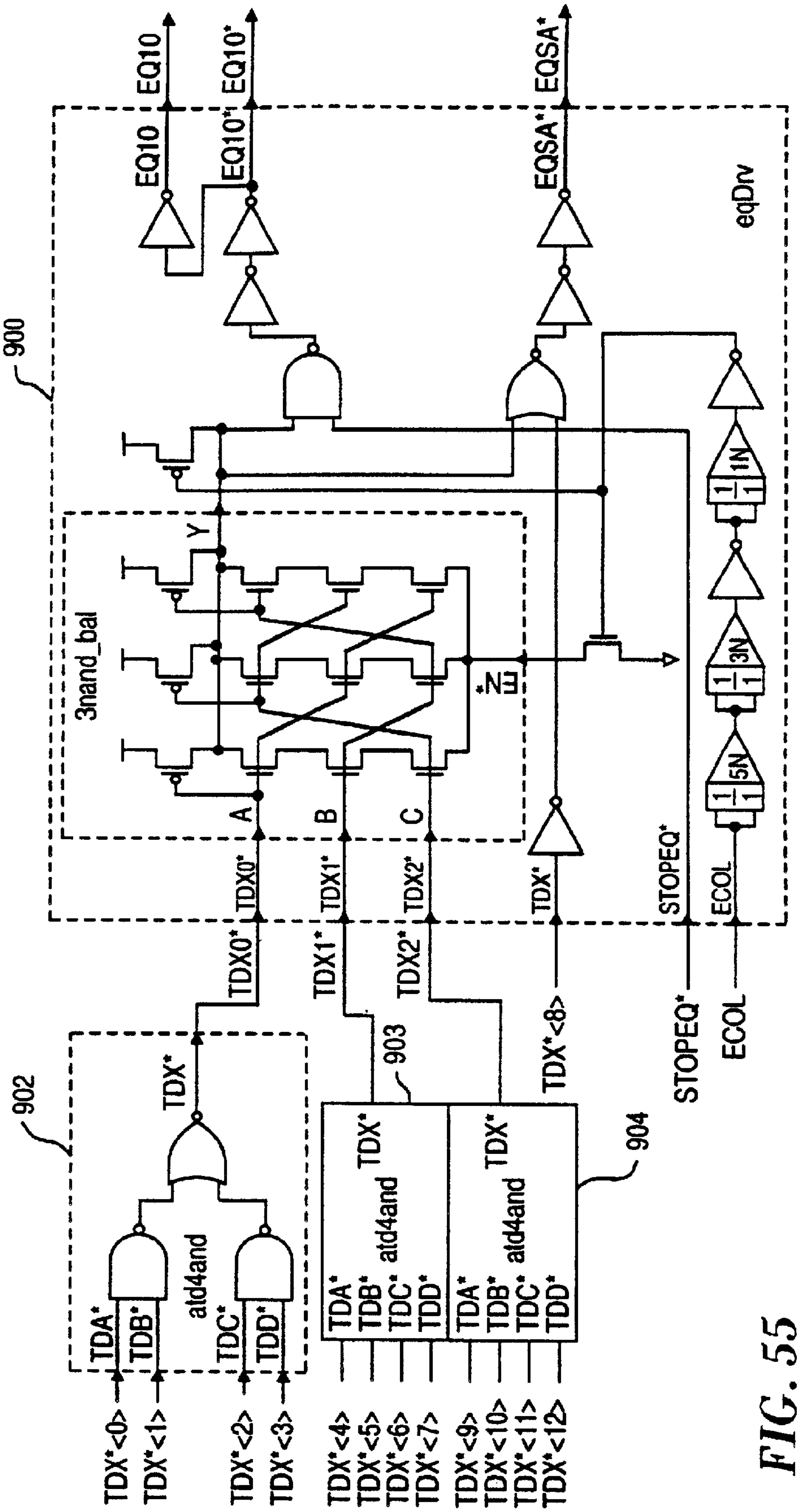
Figure 56:
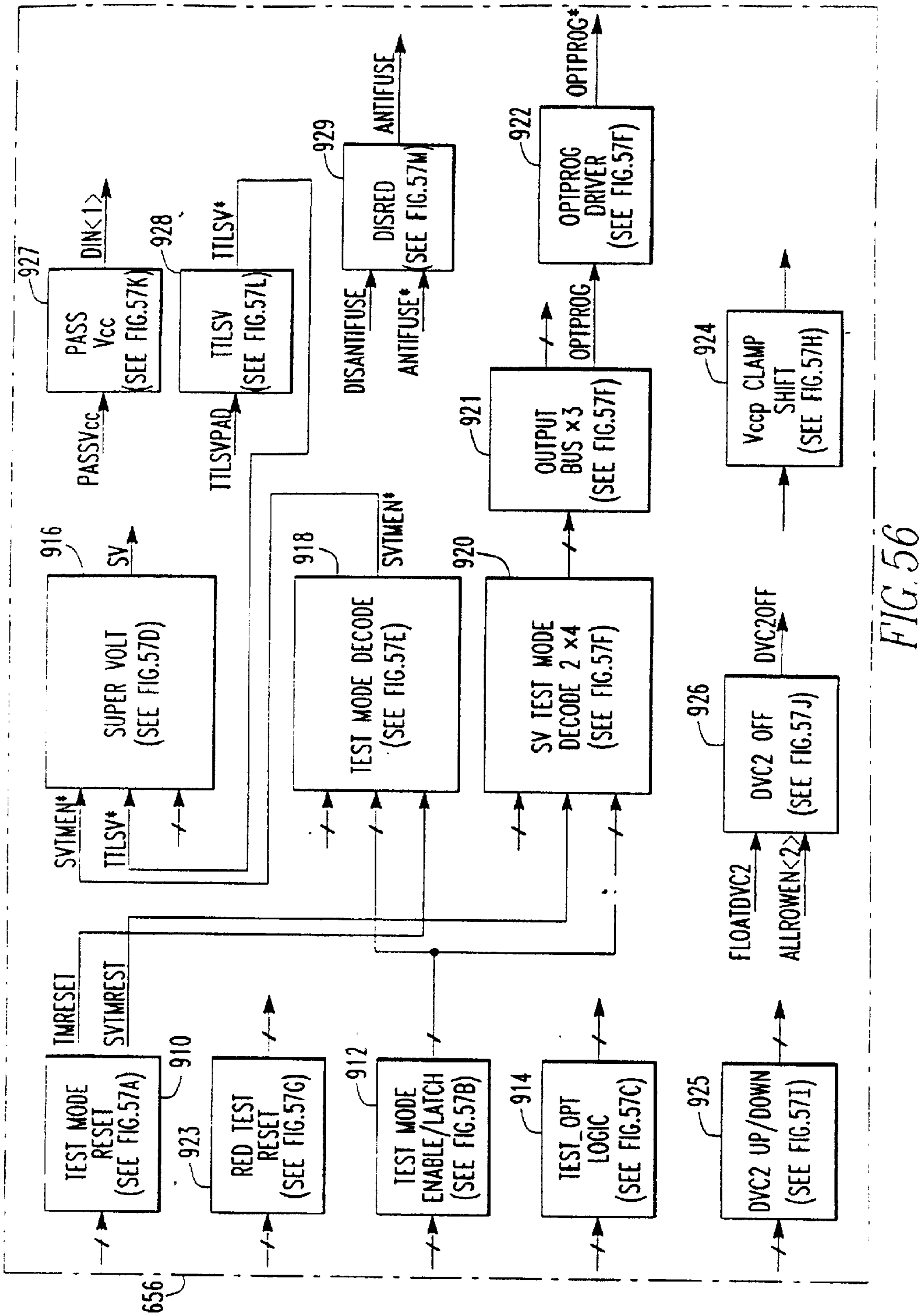
Figure 57A:
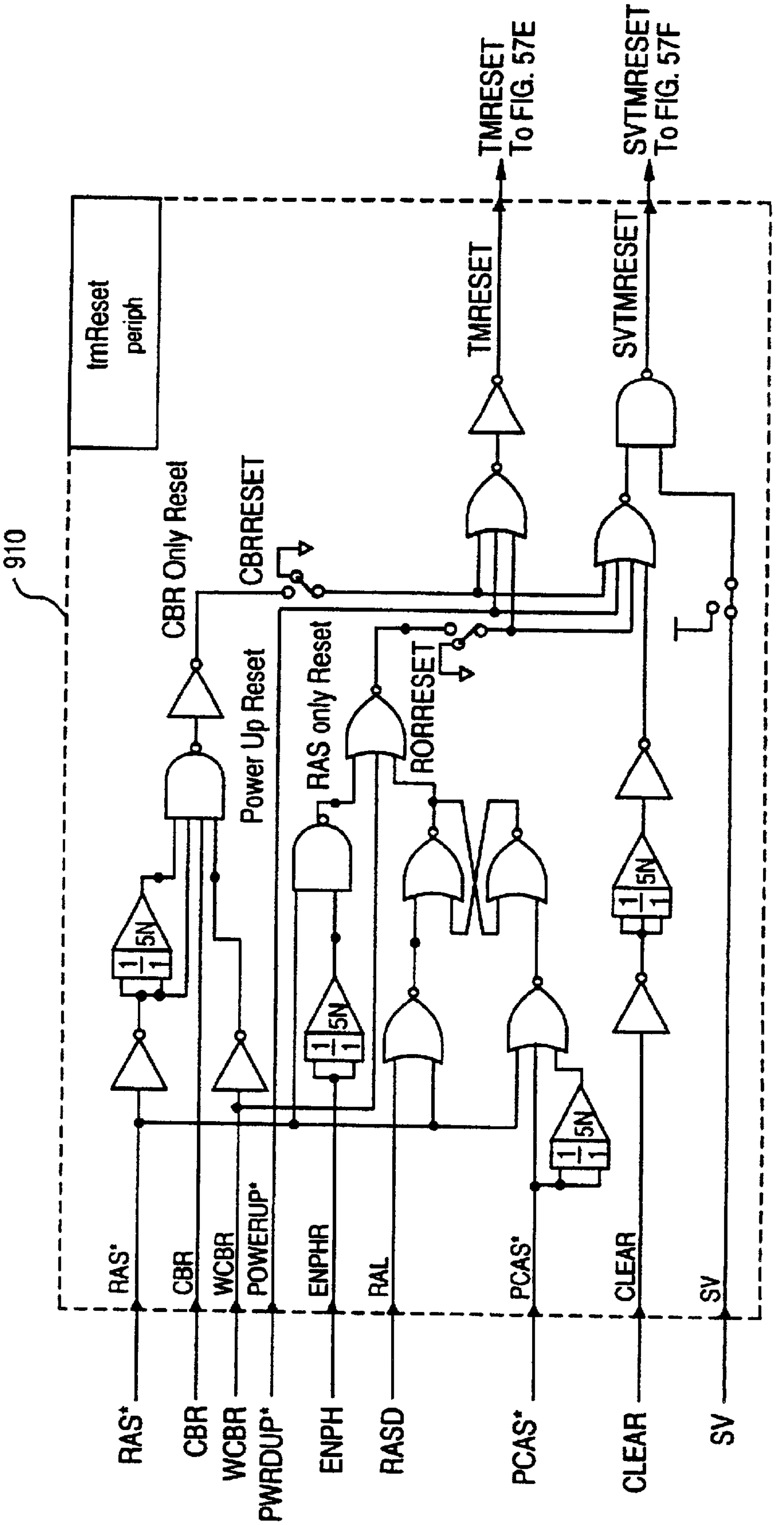
Figure 57B:
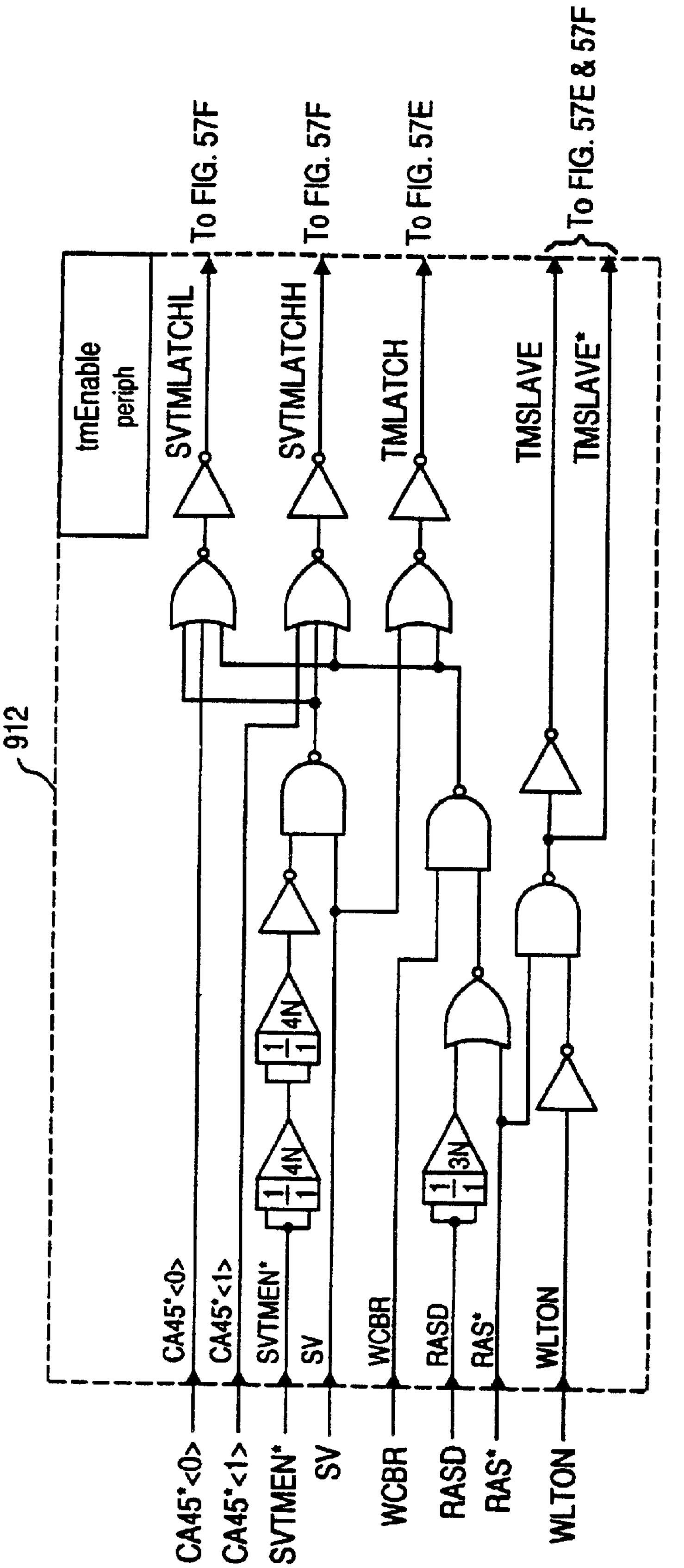
Figure 57C:
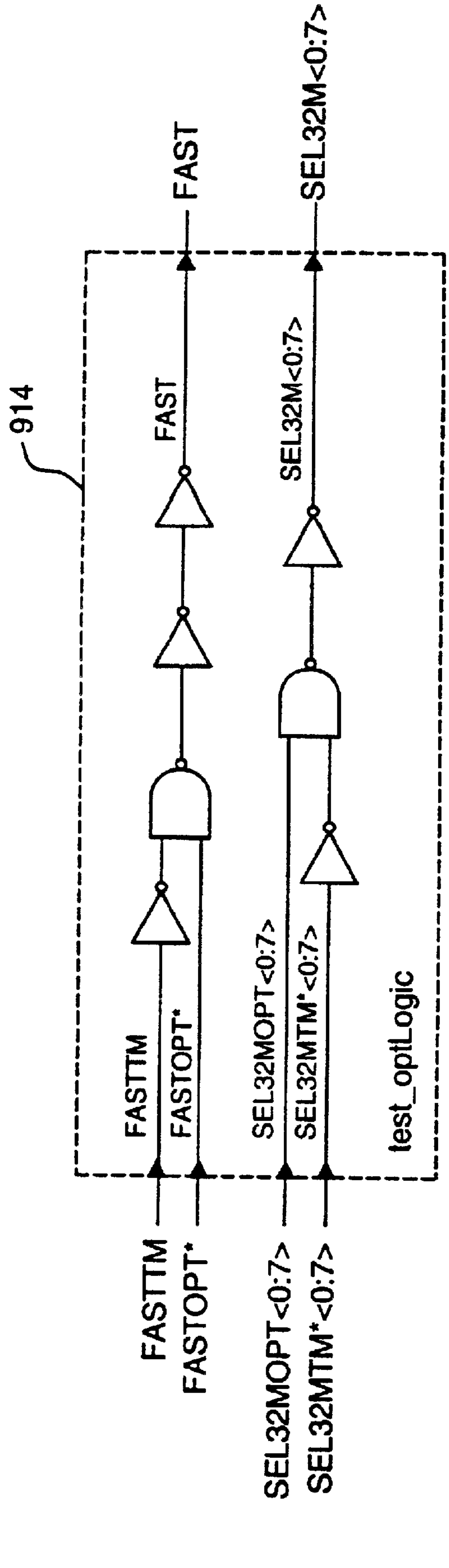
Figure 57D:
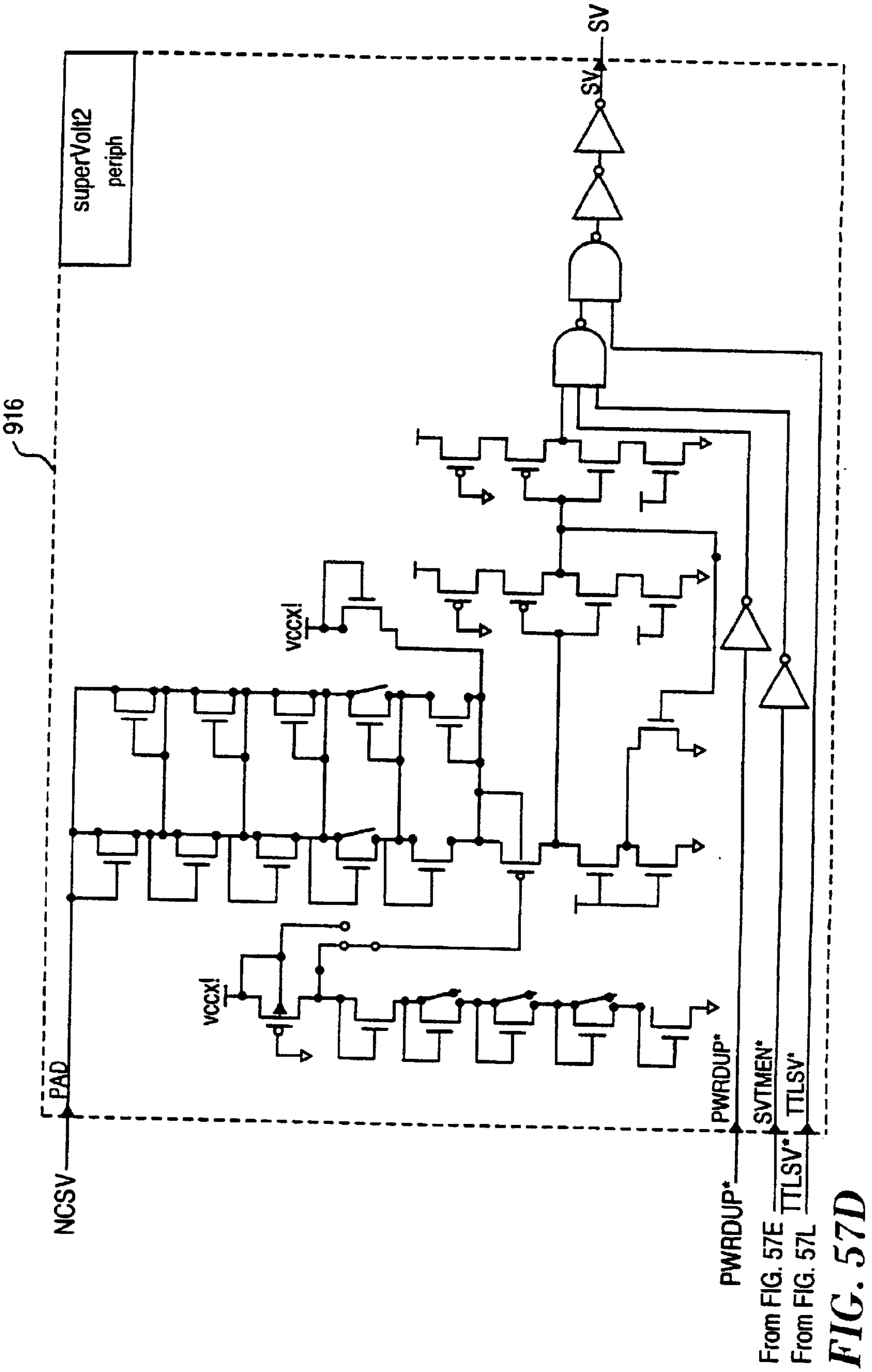
Figure 57E:
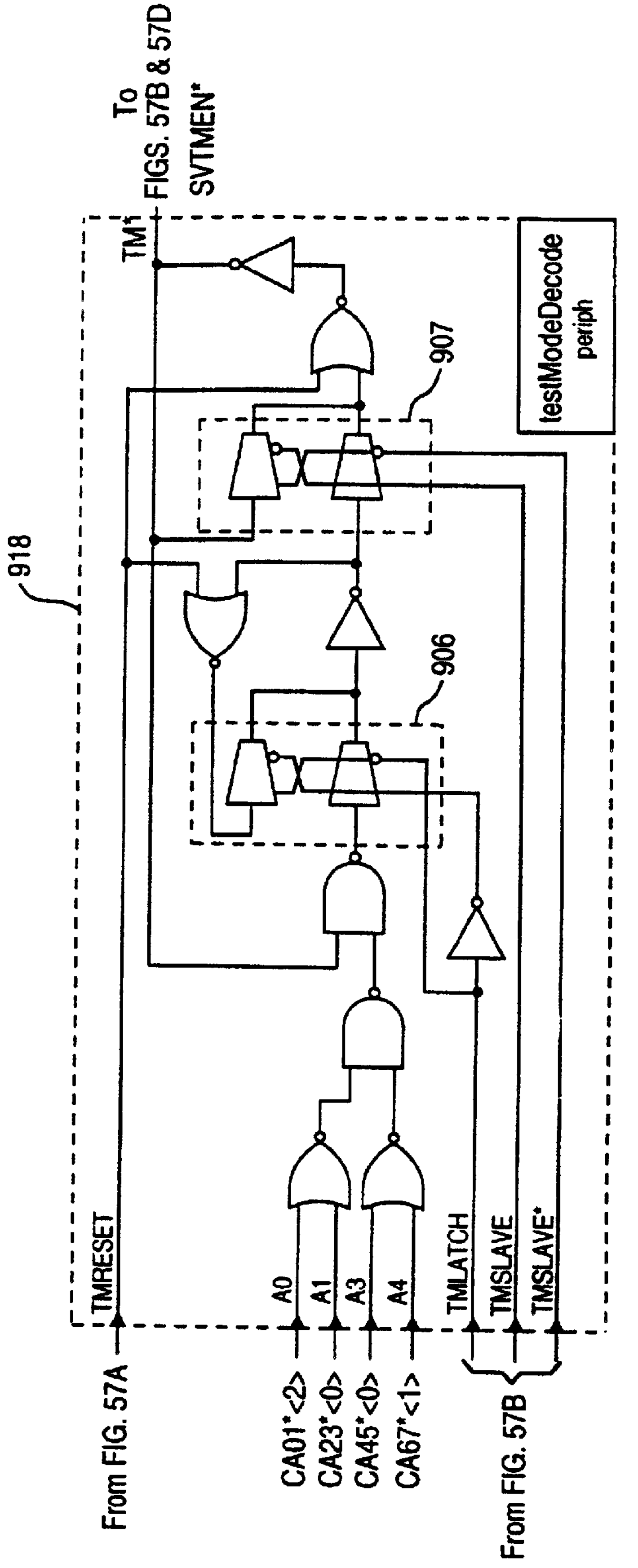
Figures 1, 57F:
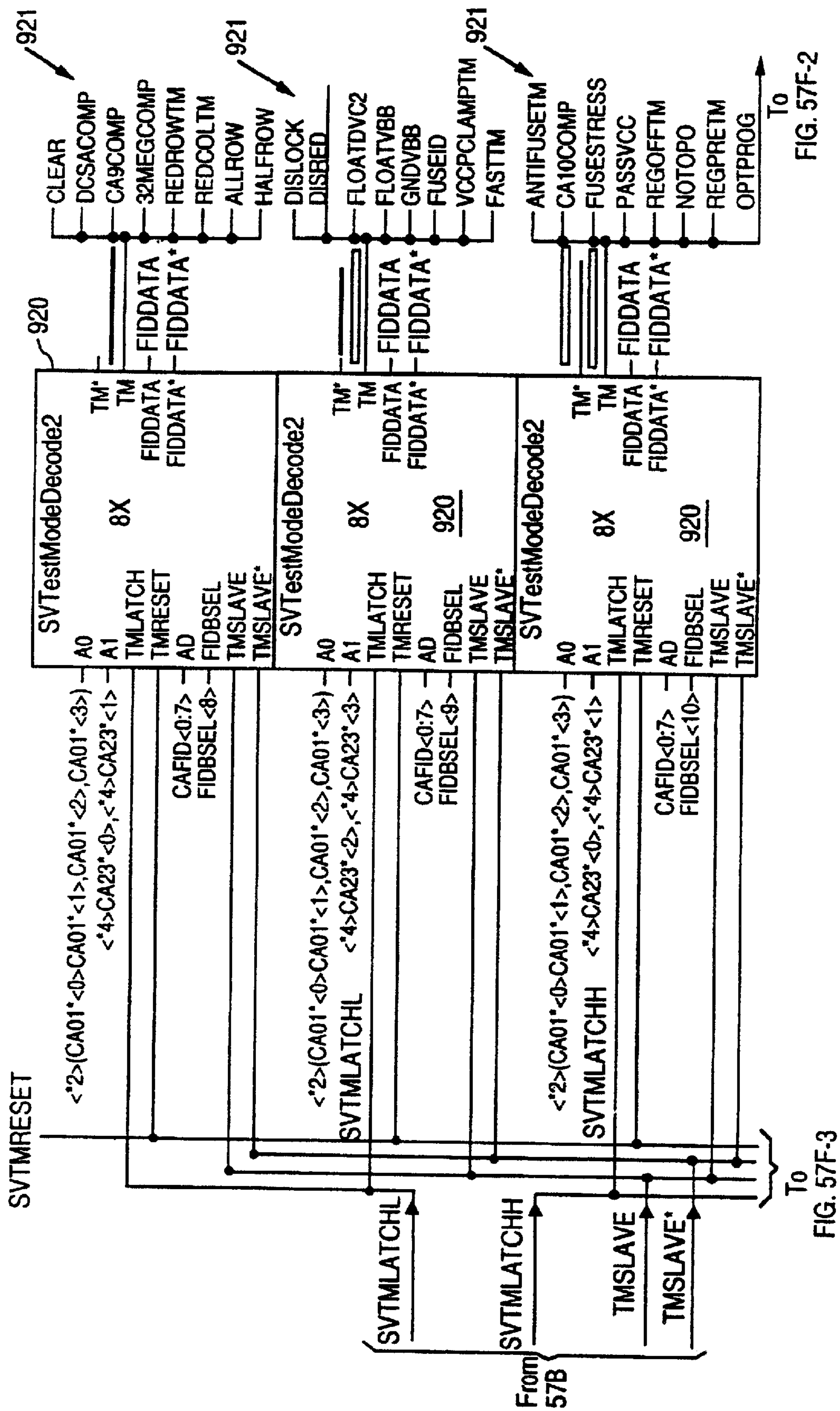
Figures 2, 57F:
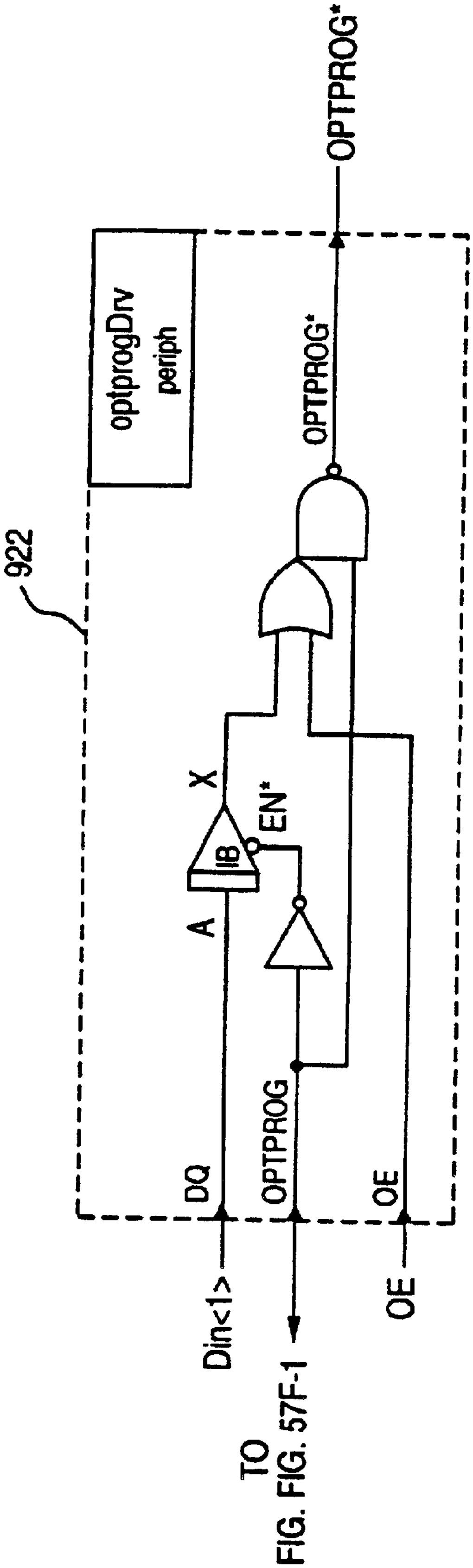
Figures 3, 57F:
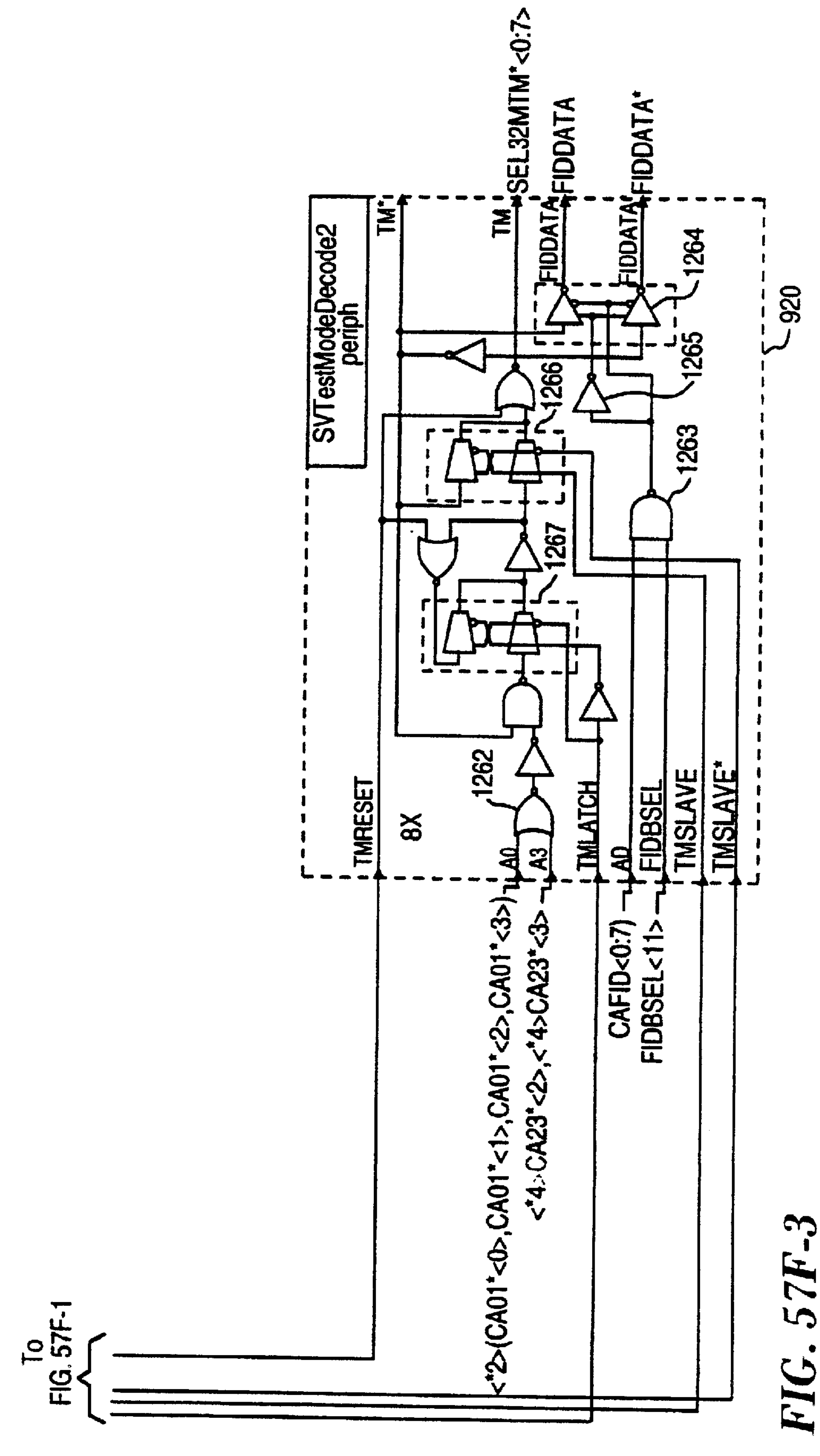
Figure 57G:
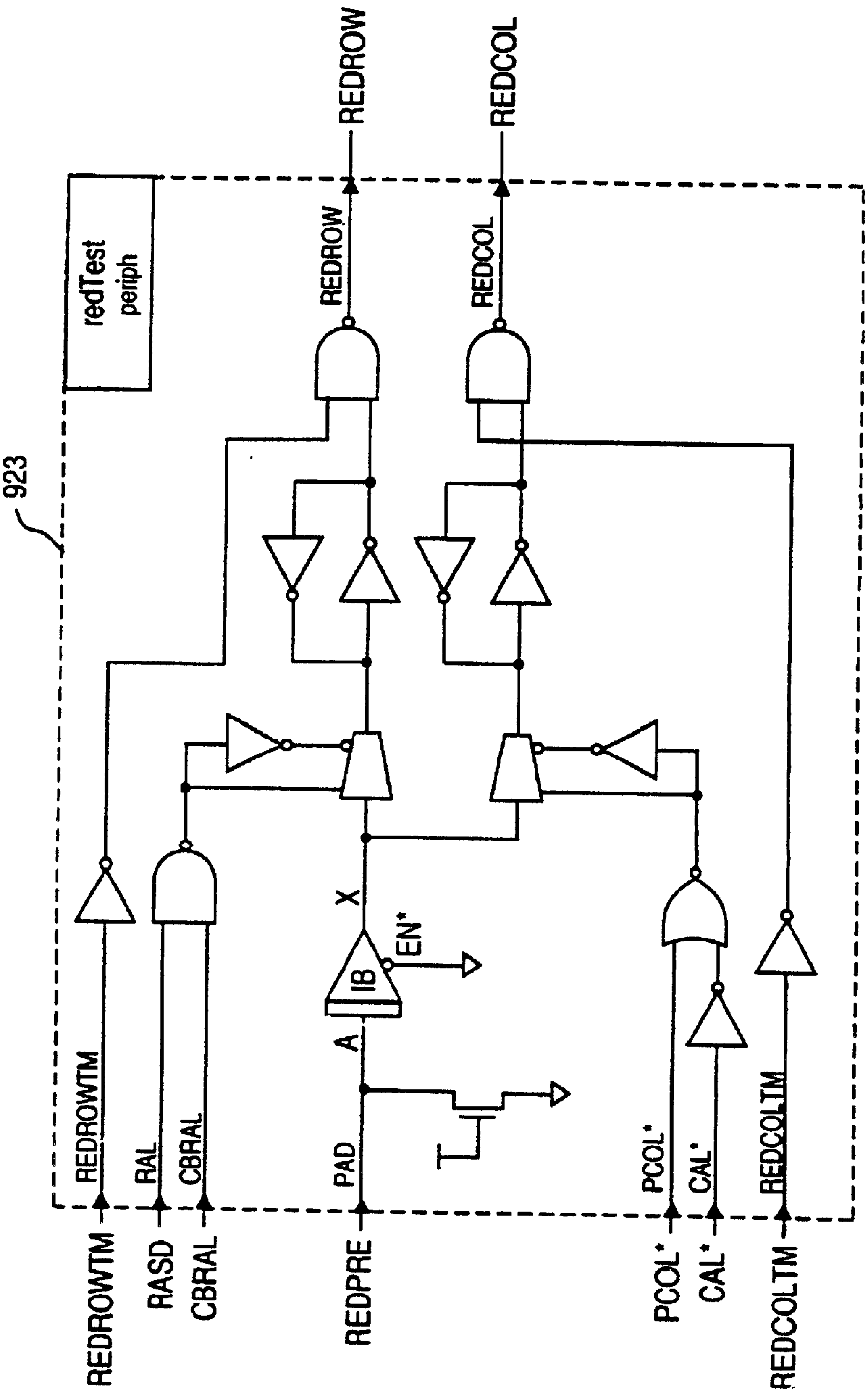
Figure 57H:
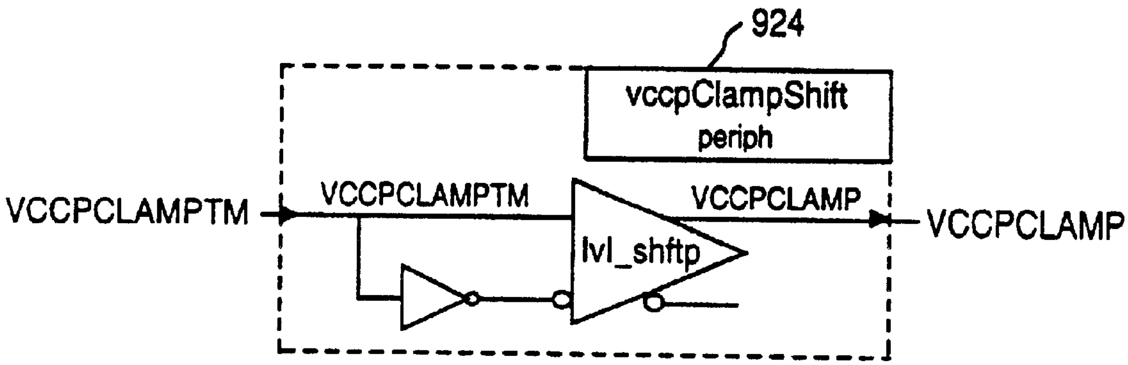
Figure 57I:
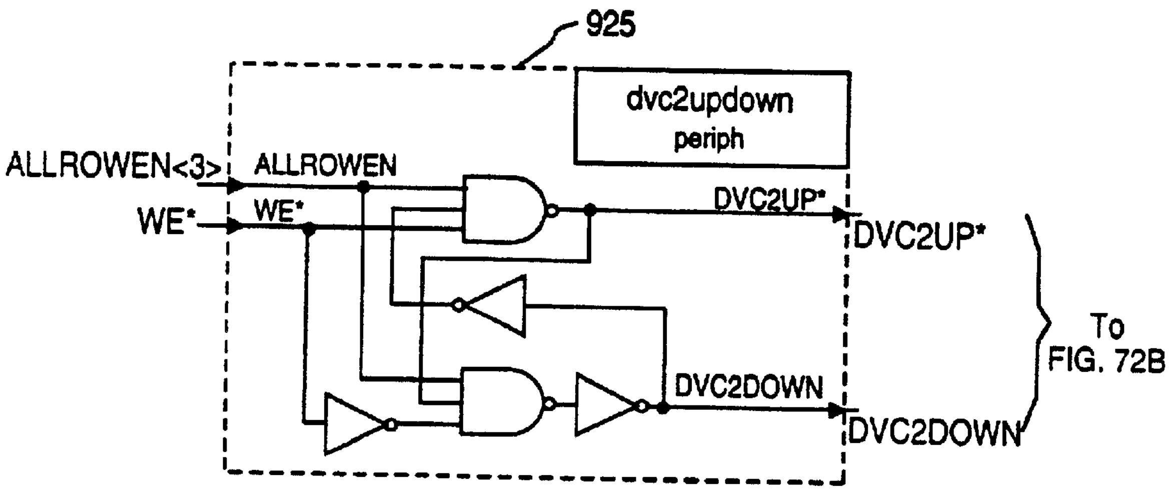
Figure 57J:
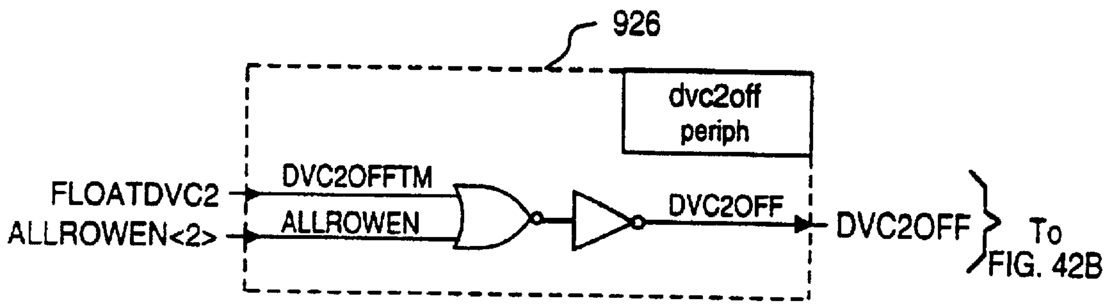
Figure 57K:
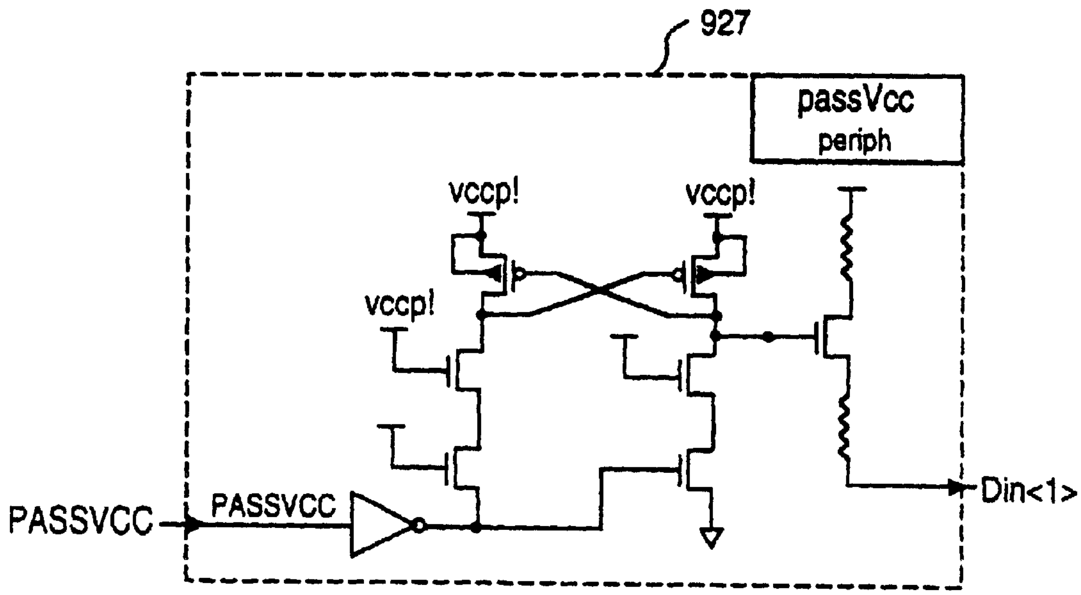
Figure 57L:
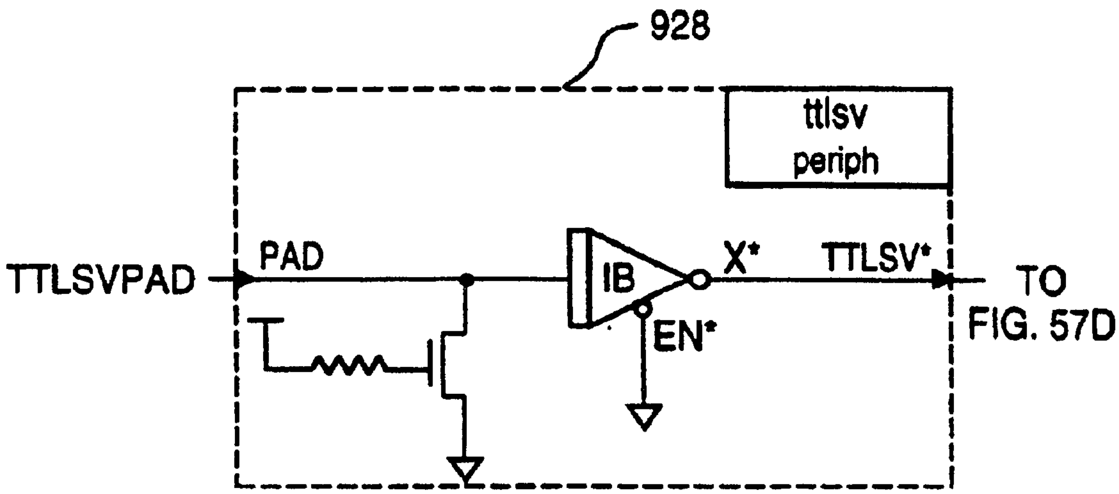
Figure 57M:
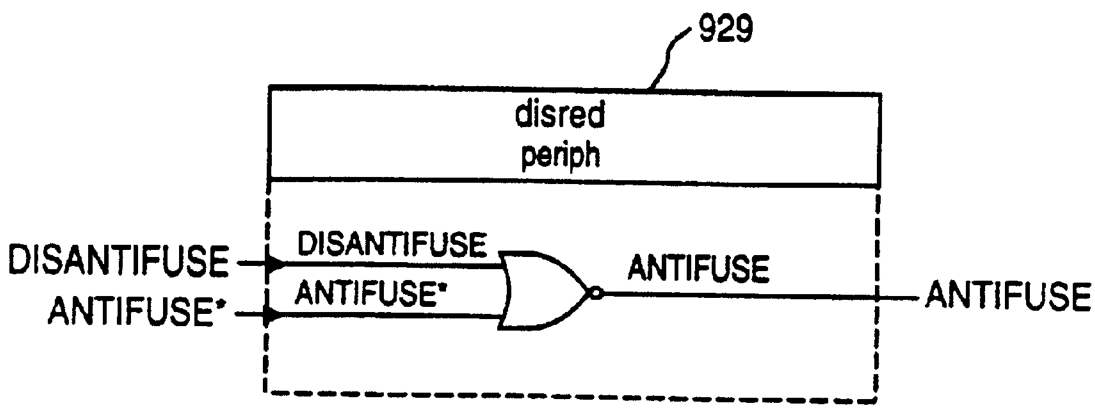
Figure 58A:
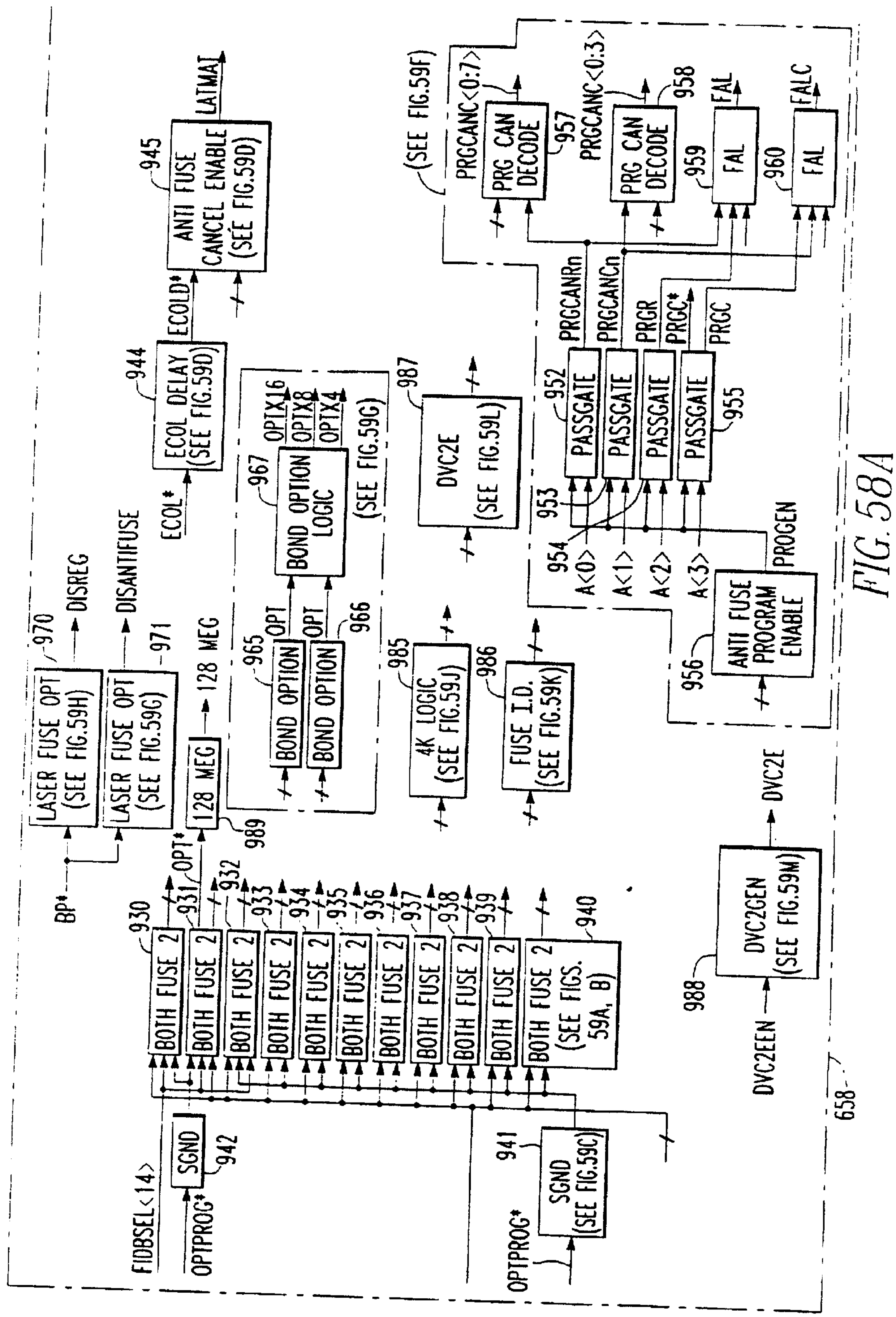
Figure 58B:
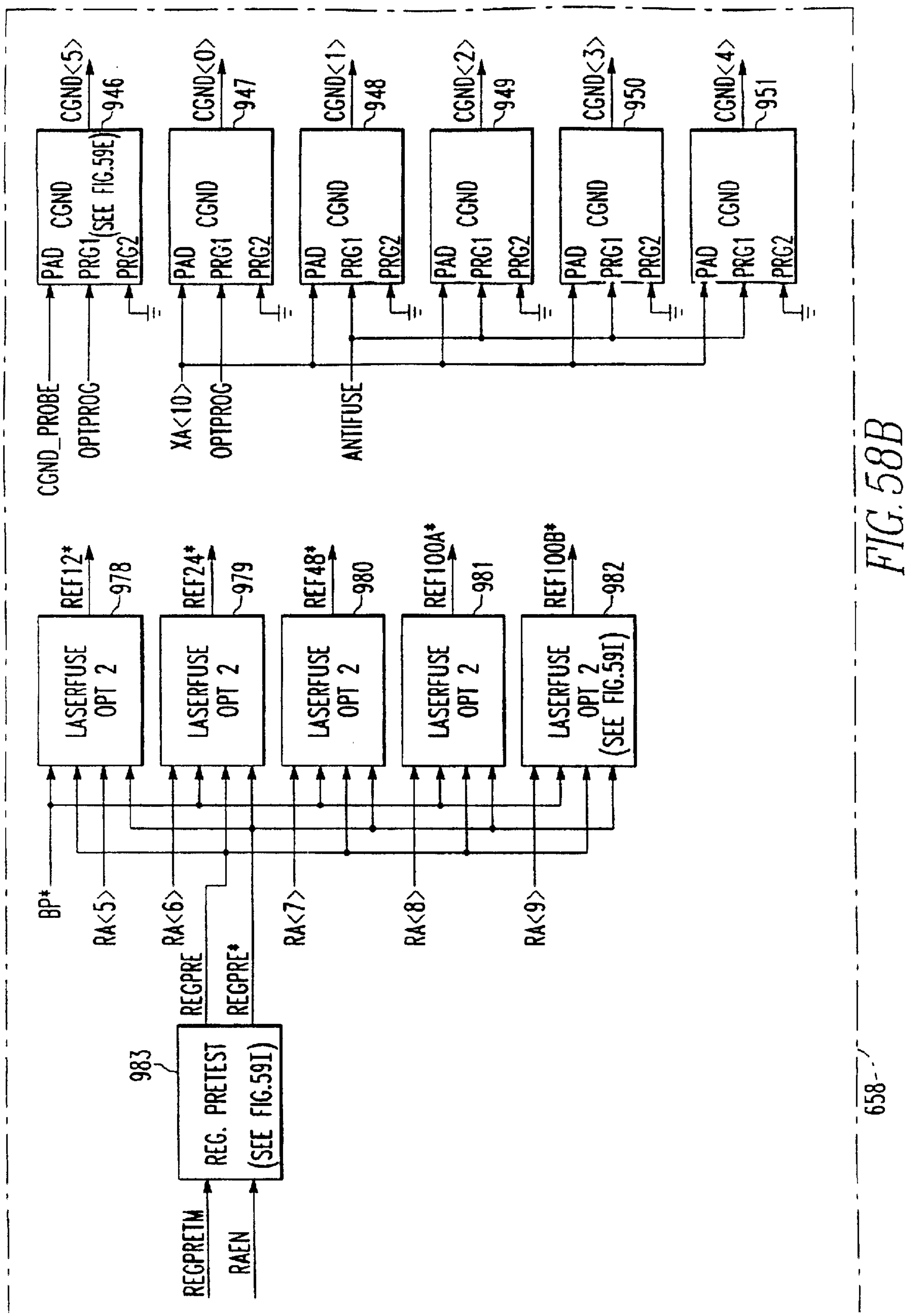
Figure 59A:
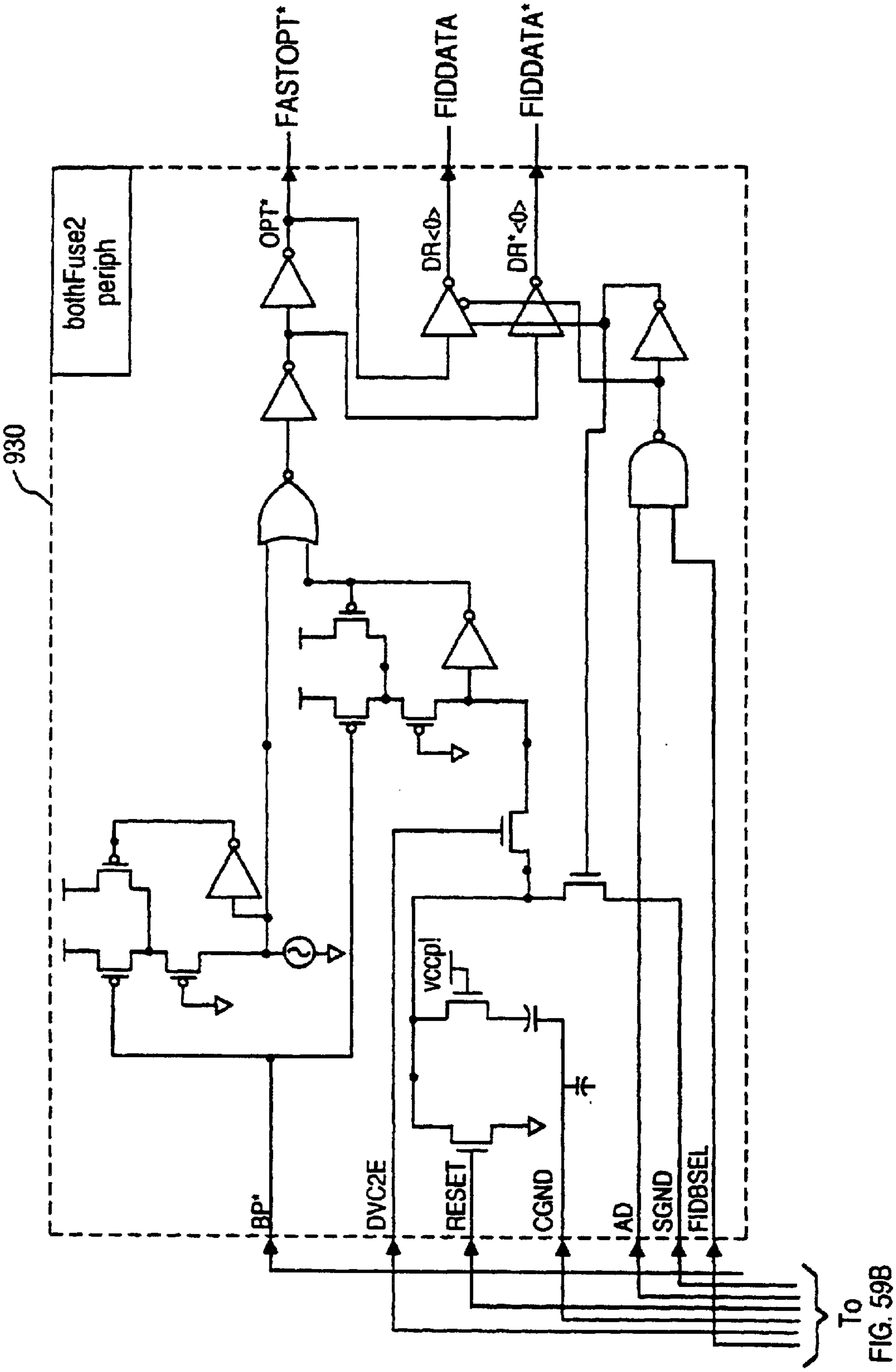
Figures 1, 59B:
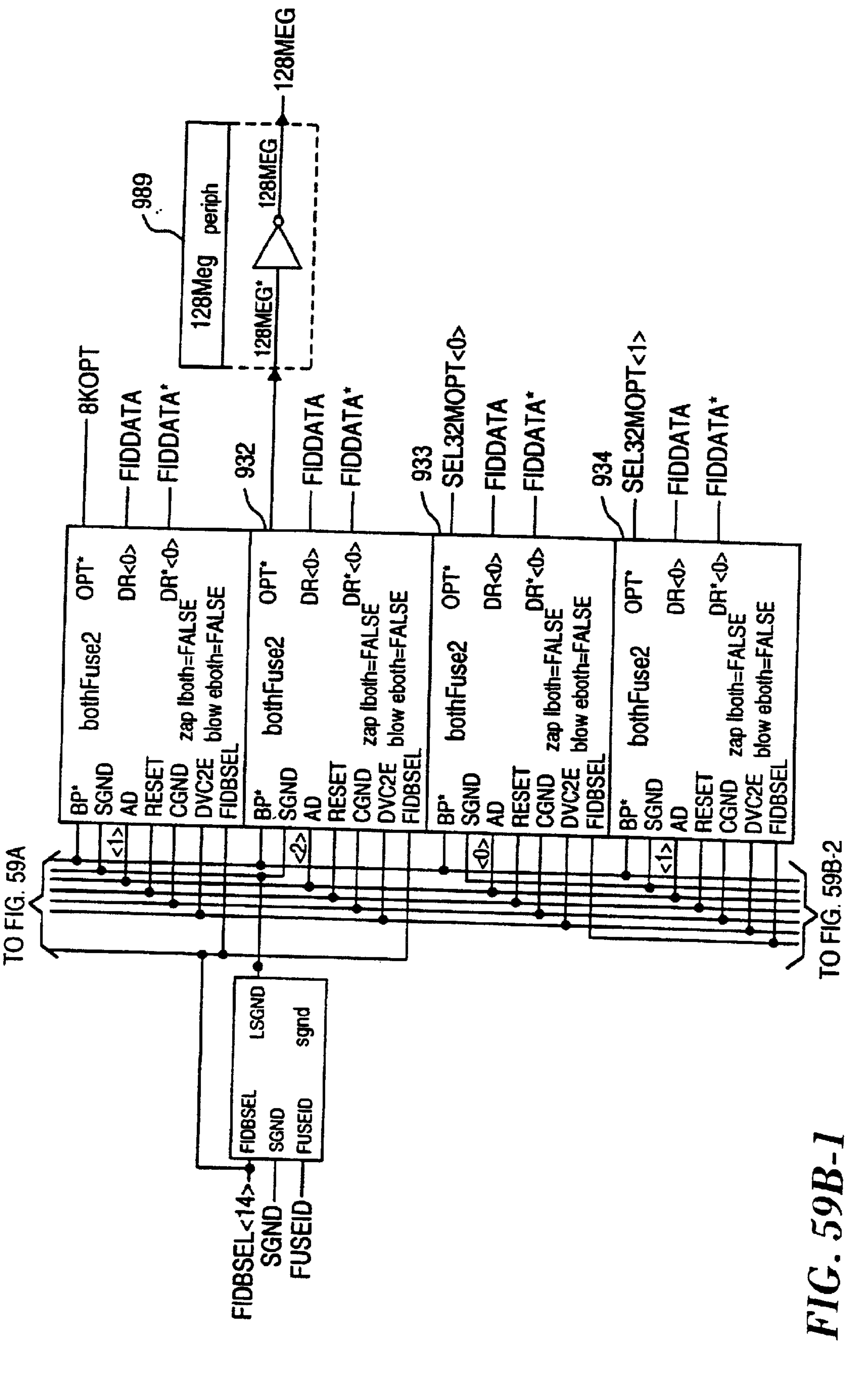
Figures 2, 59B:
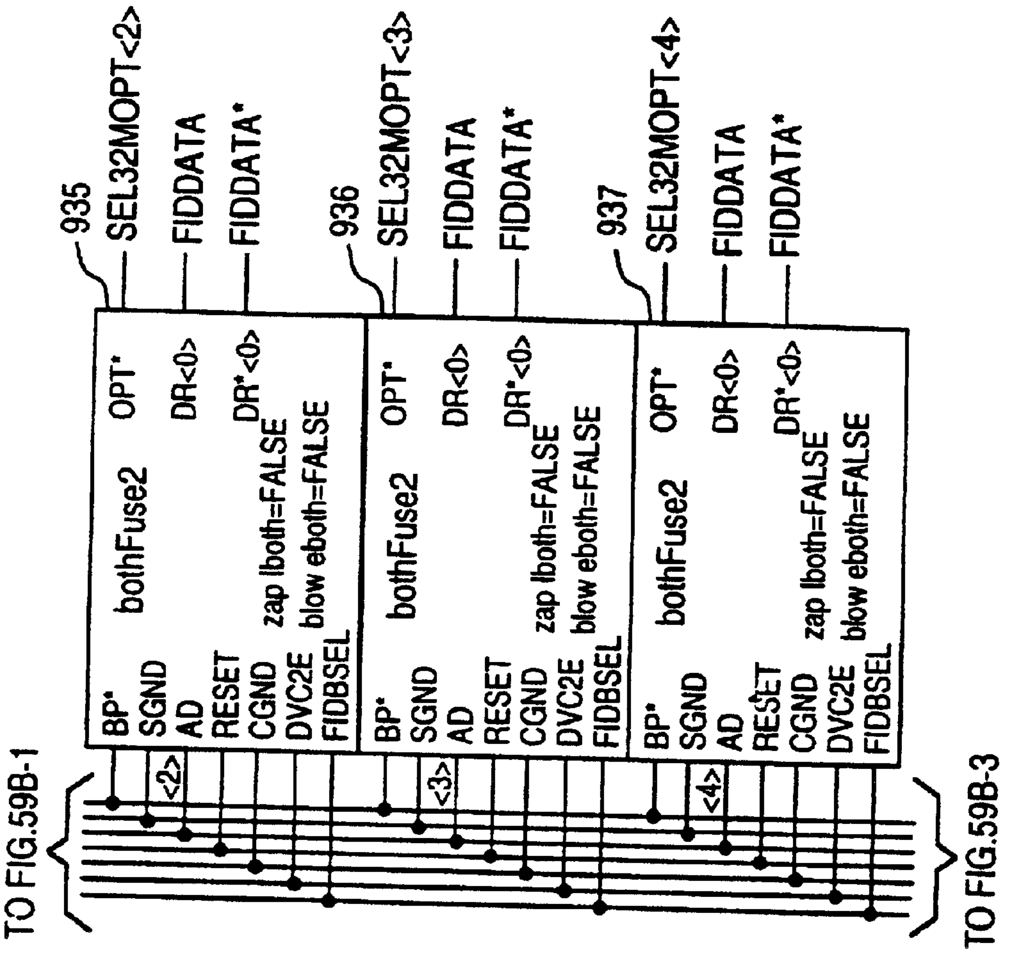
Figures 3, 59B:
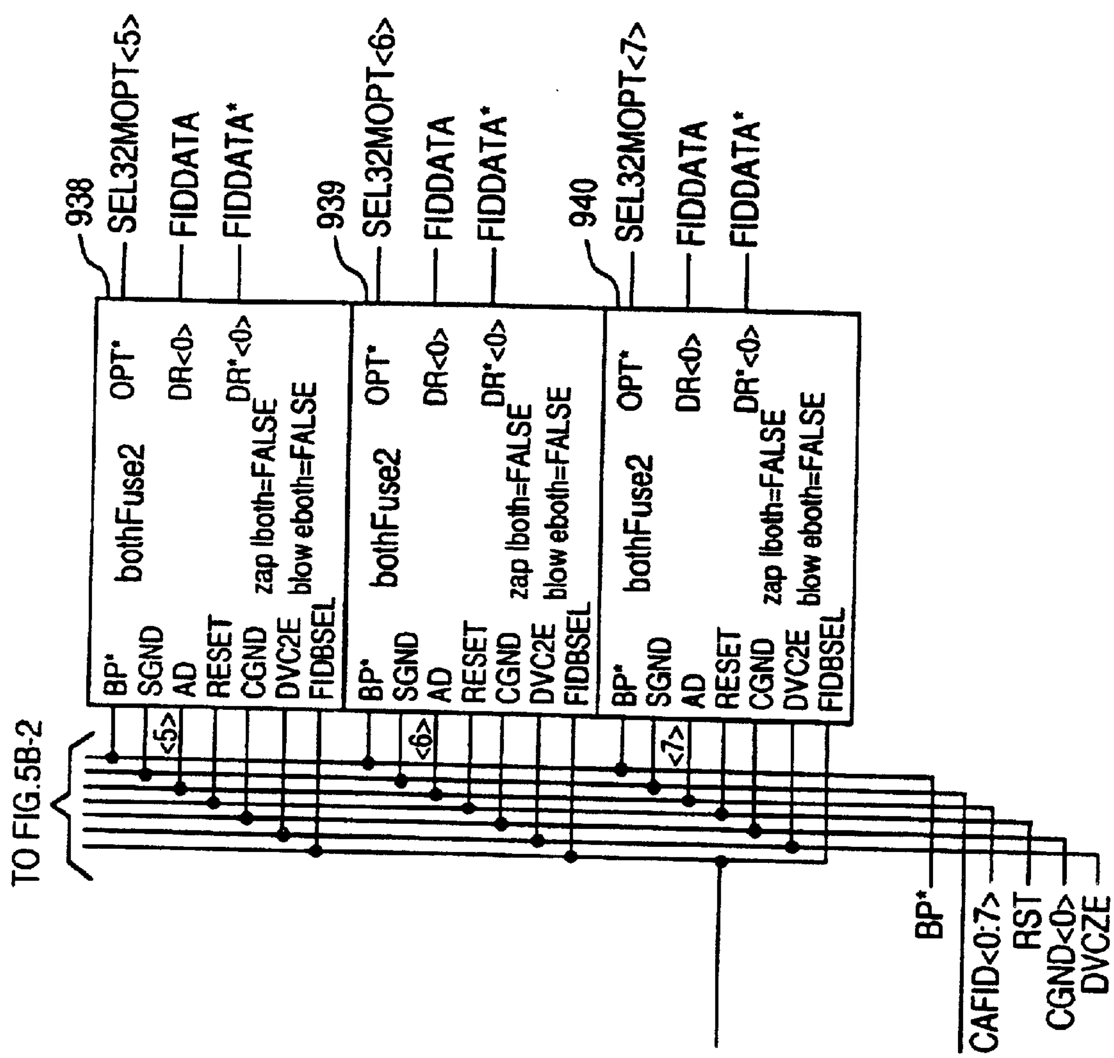
Figure 59C:
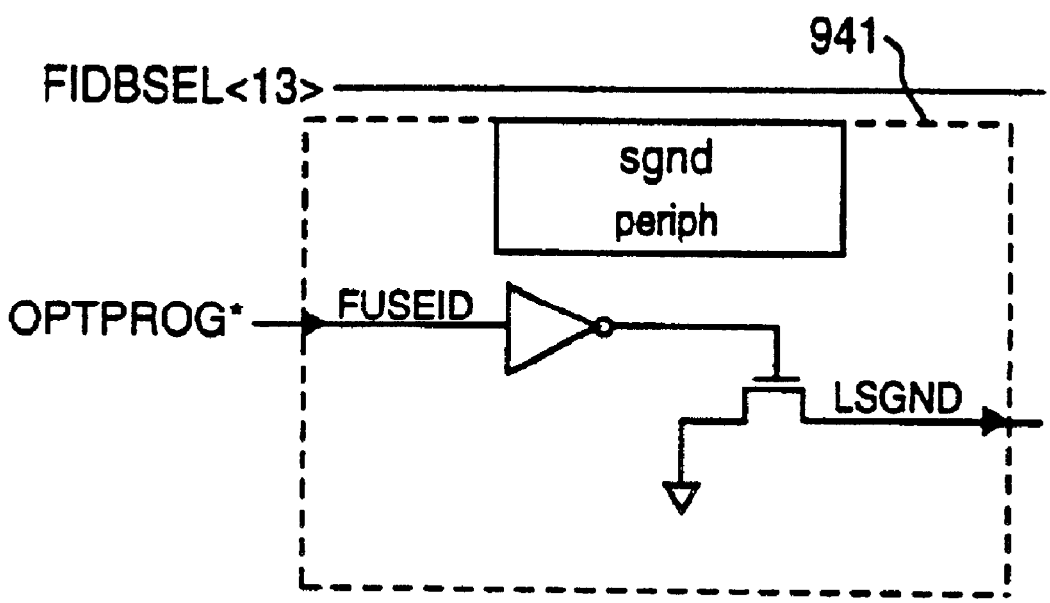
Figure 59D:
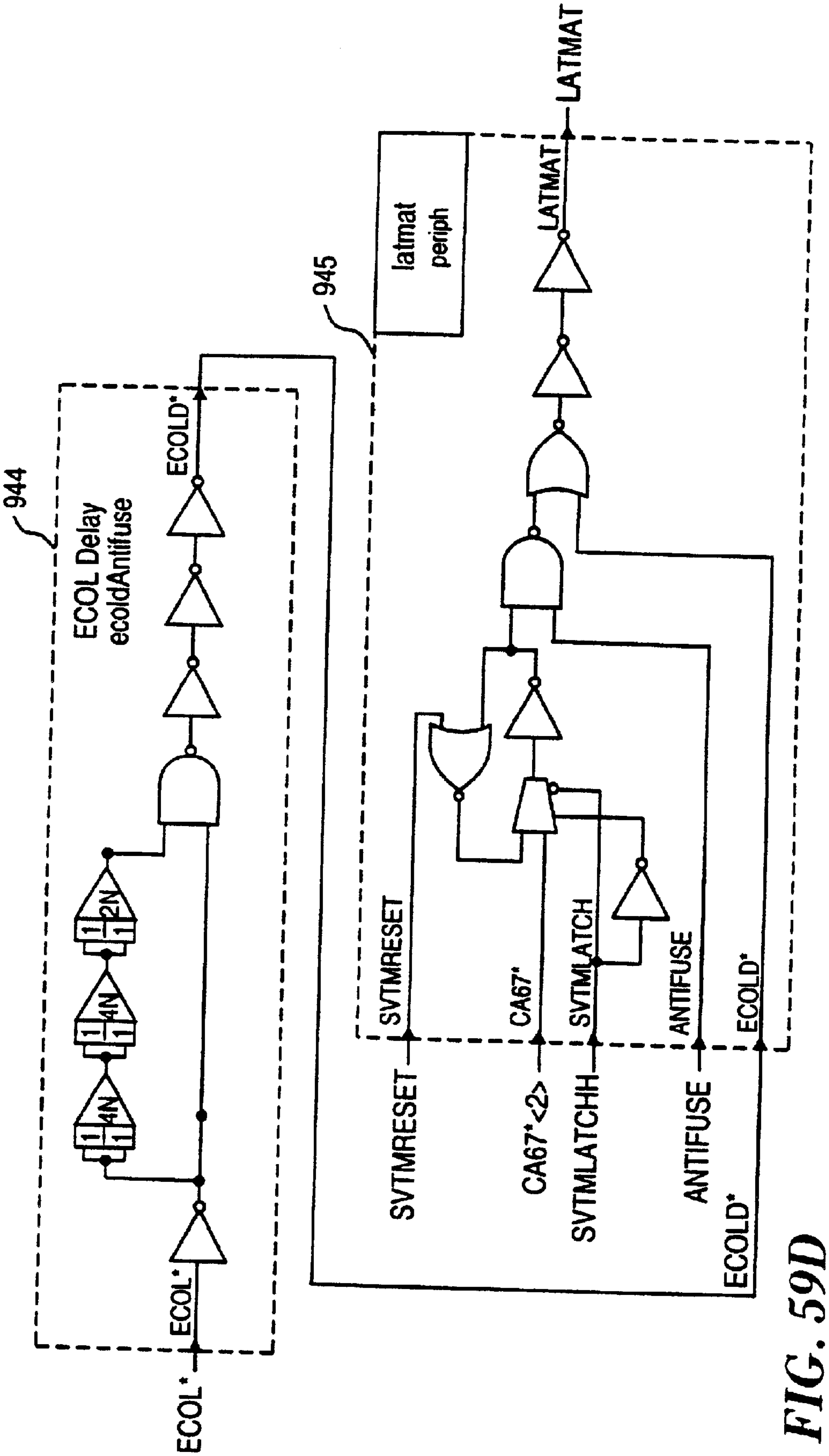
Figure 59E:
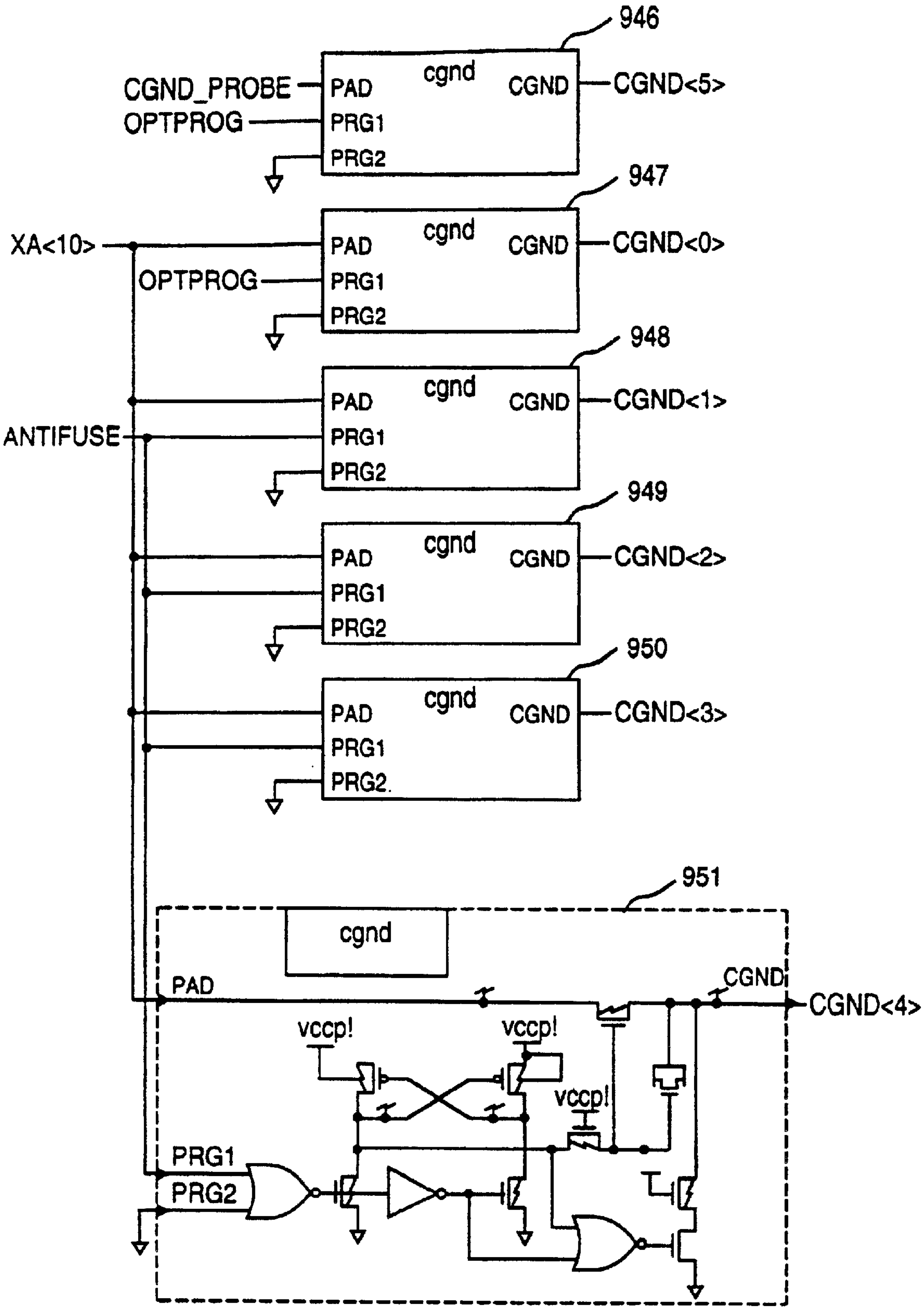
Figures 1, 59F:
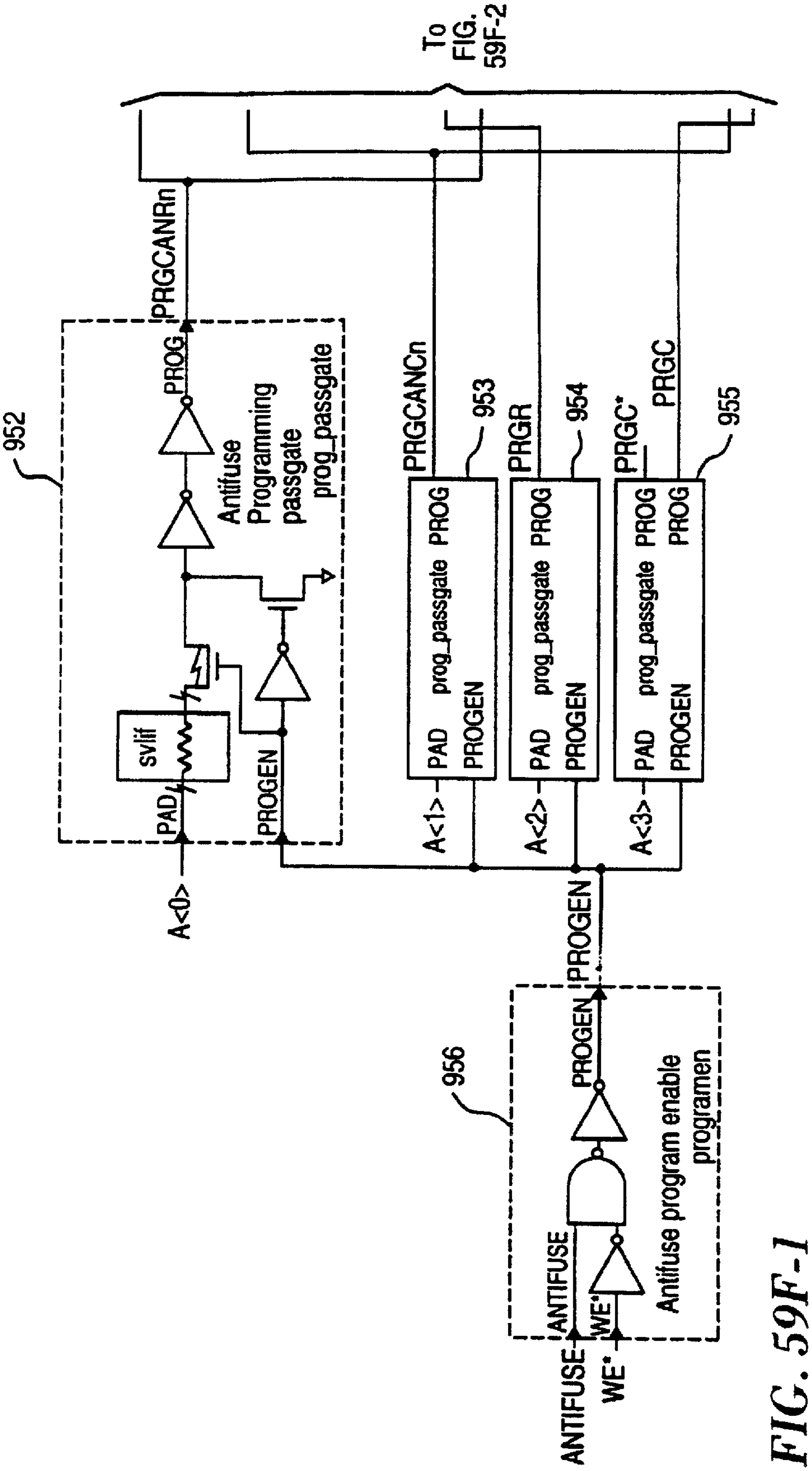
Figures 2, 59F:
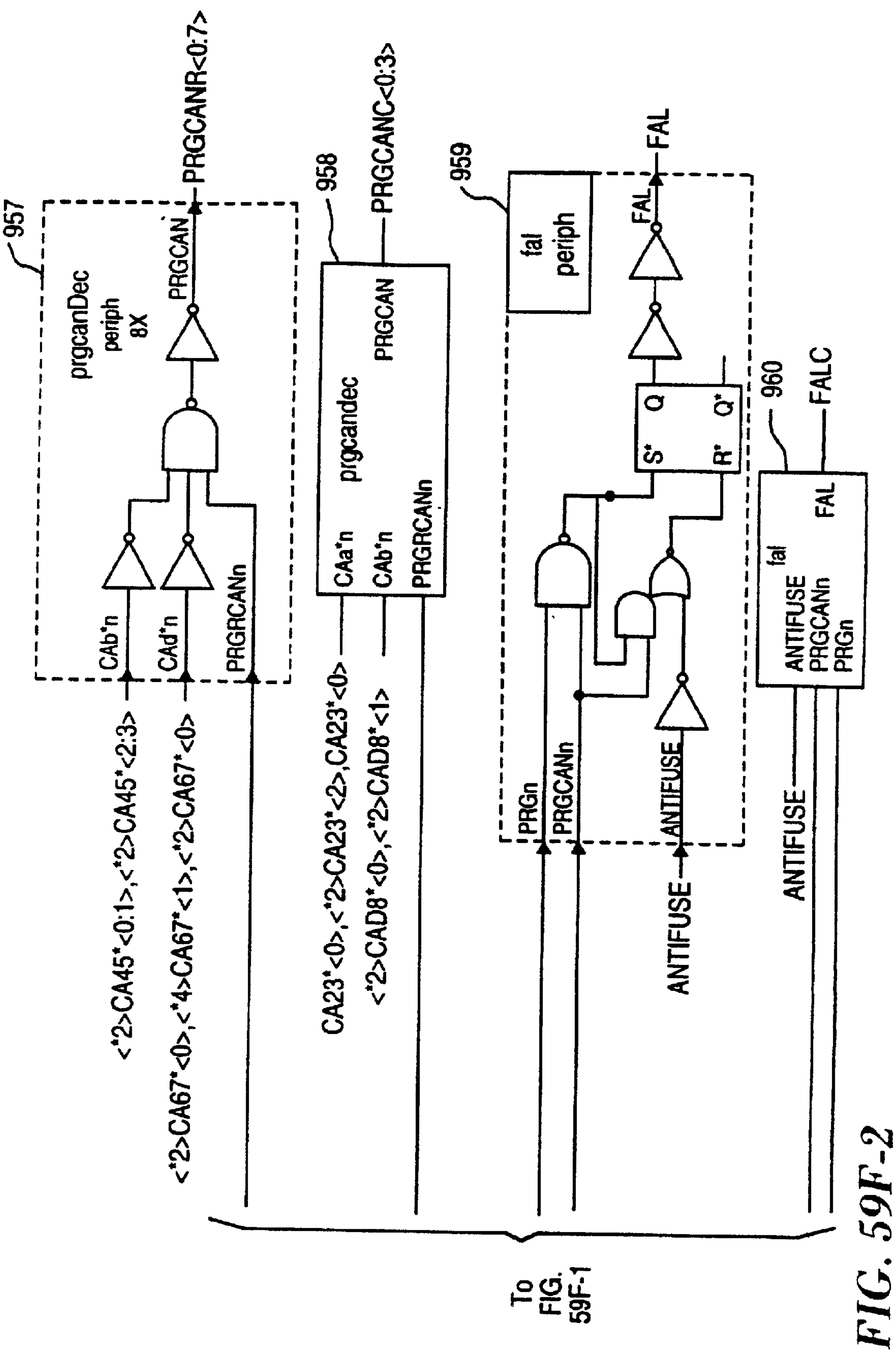
Figure 59G:
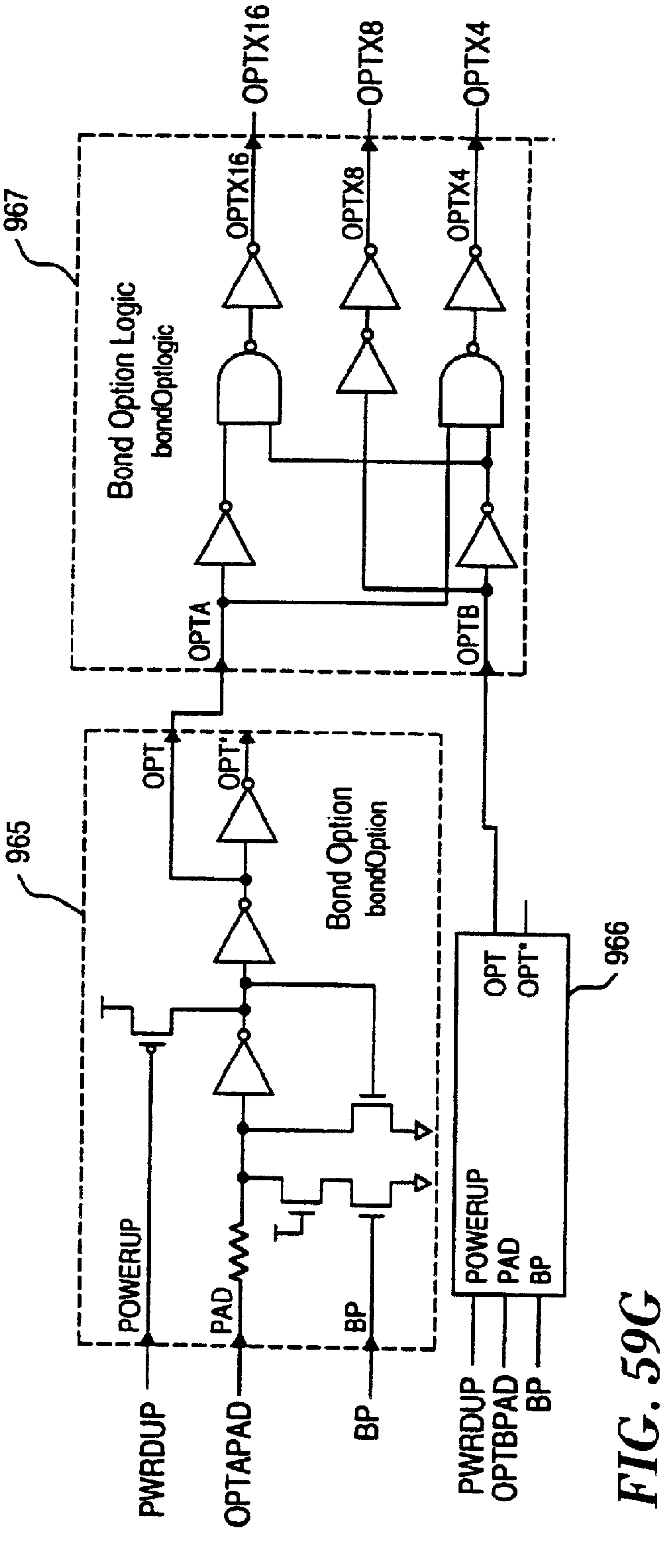
Figure 59H:
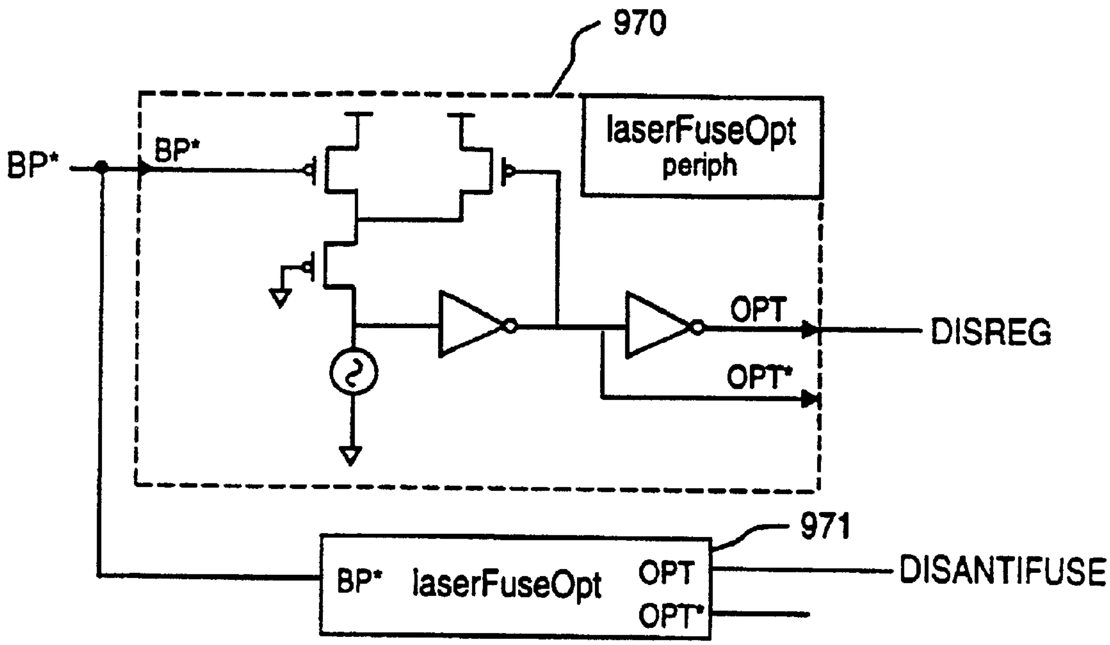
Figure 59I:
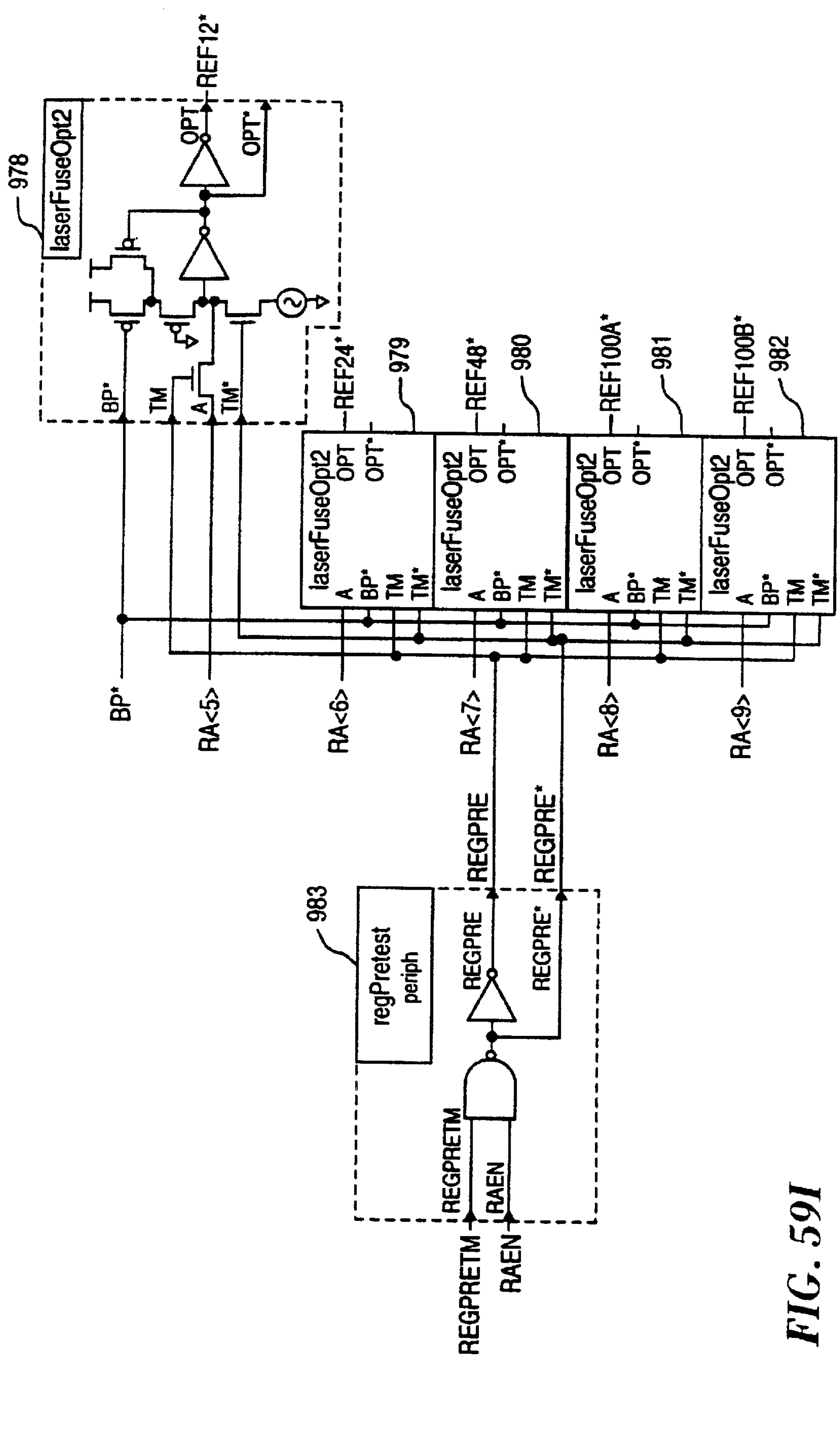
Figure 59J:
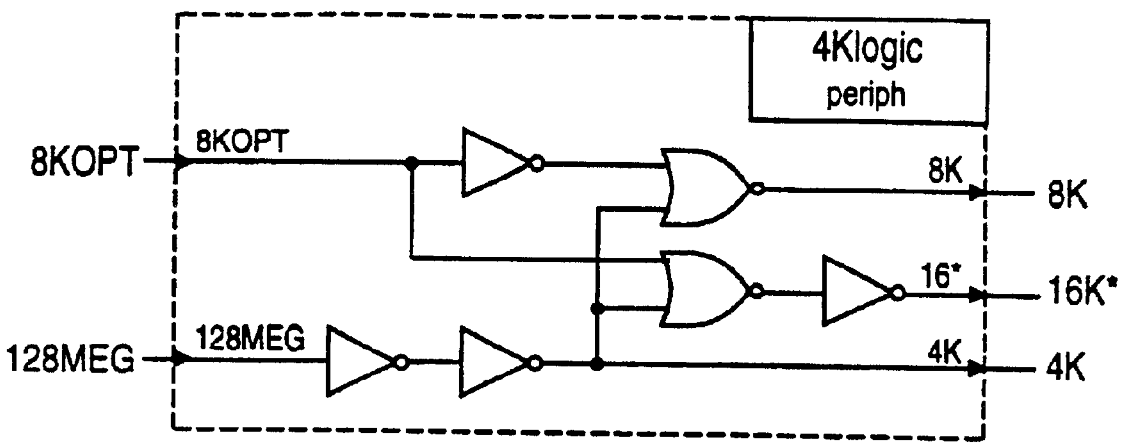
Figures 1, 59K:
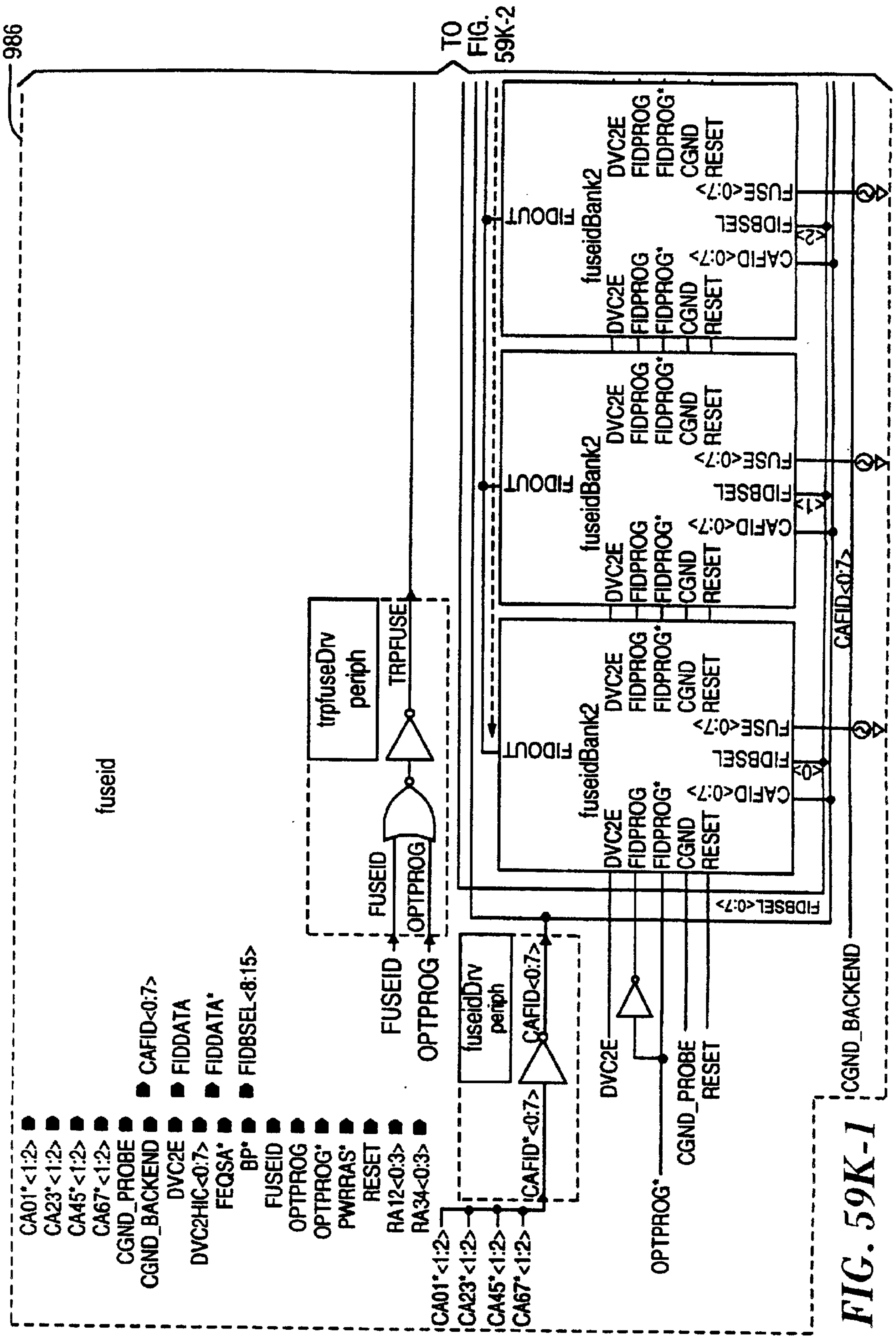
Figures 2, 59K:
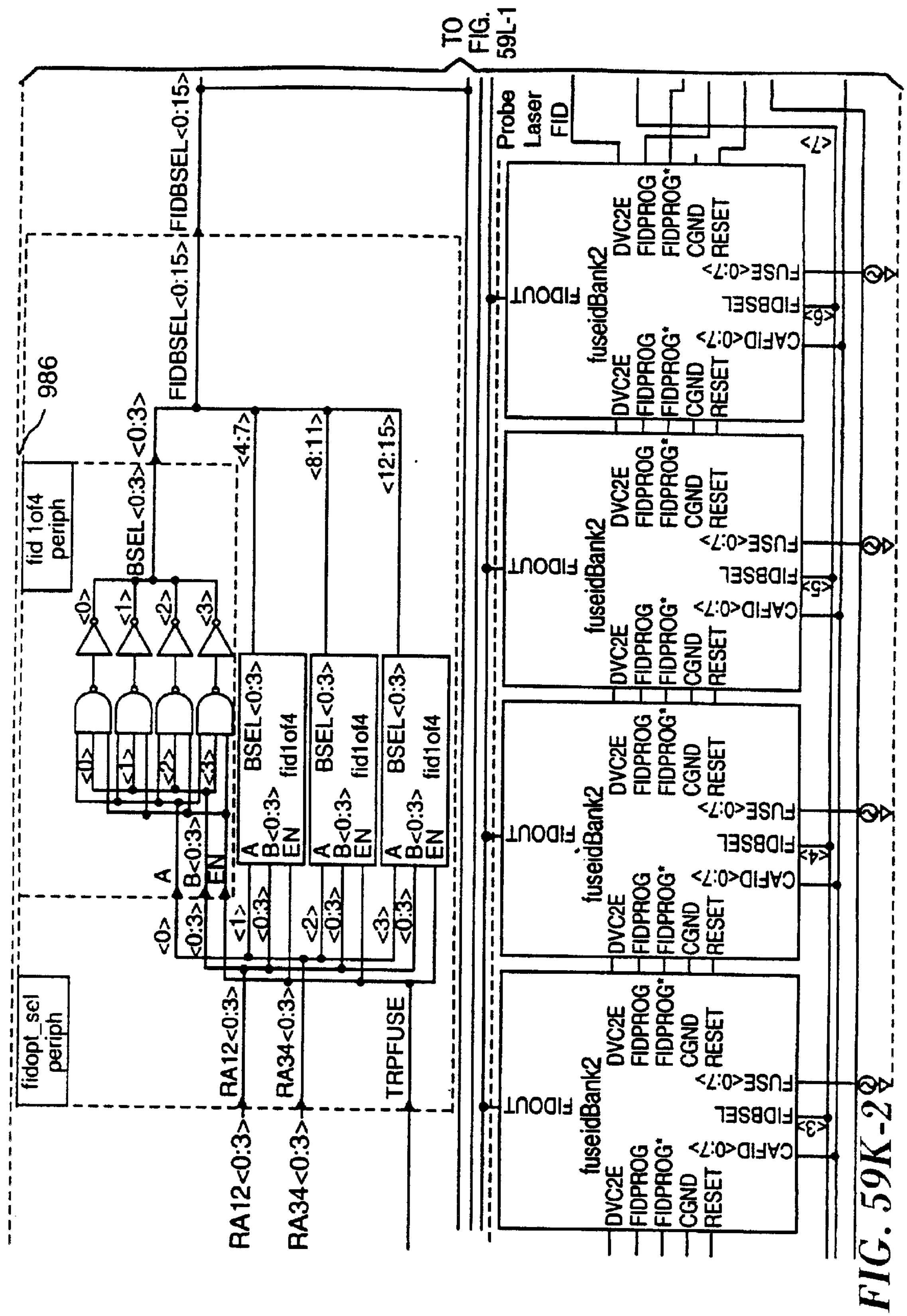
Figures 1, 59L:
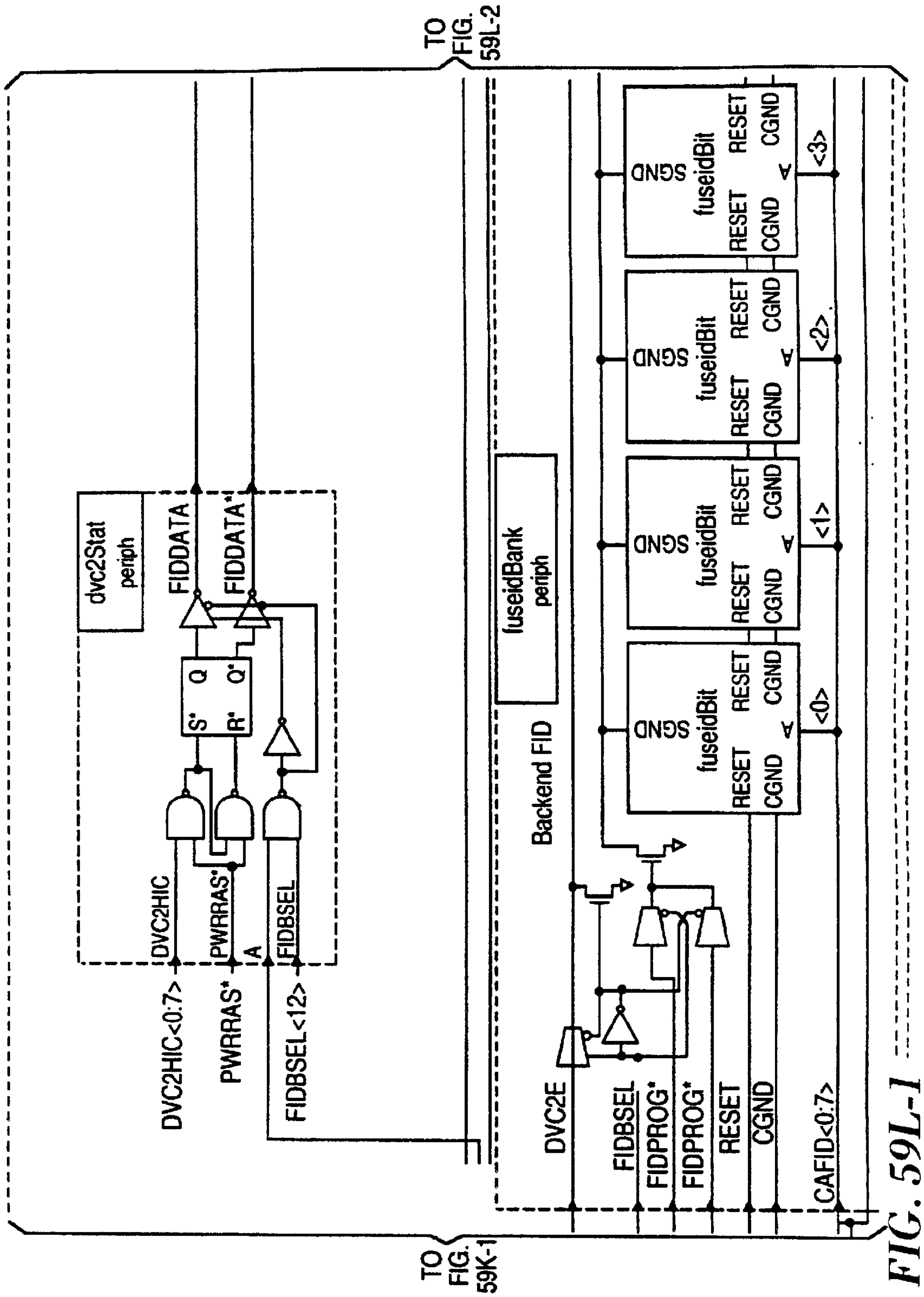
Figures 2, 59L:
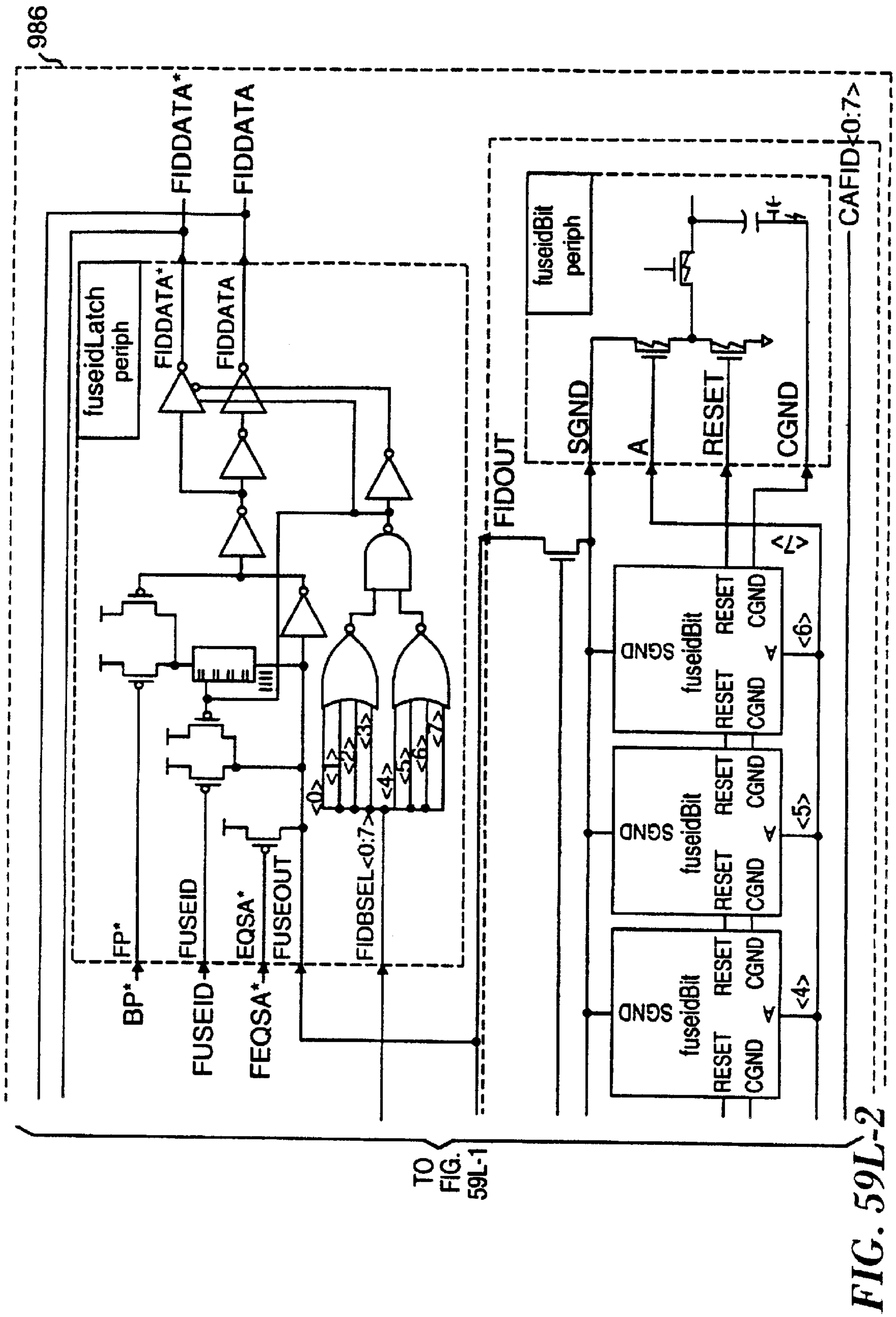
Figure 59M:
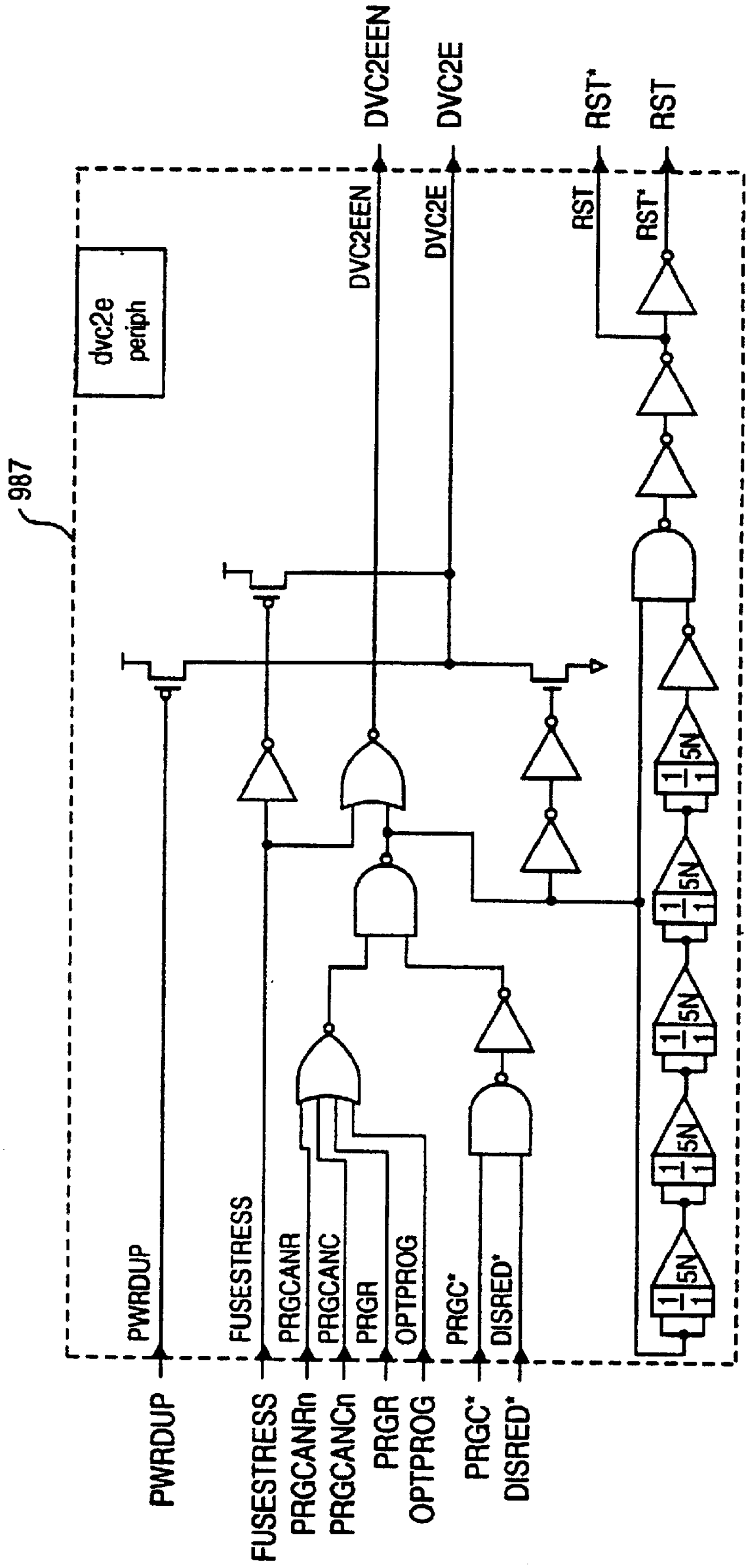
Figure 59N:
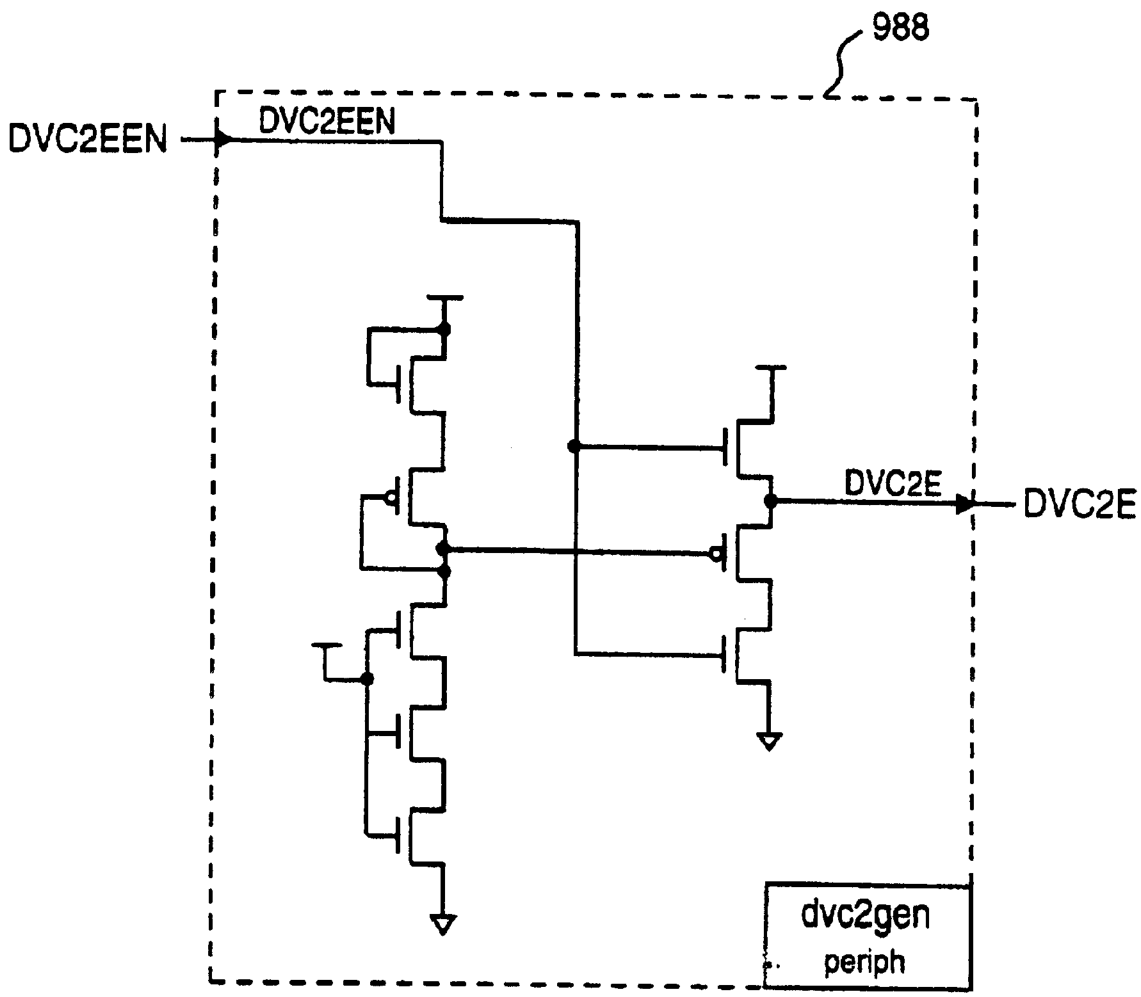
Figure 590:
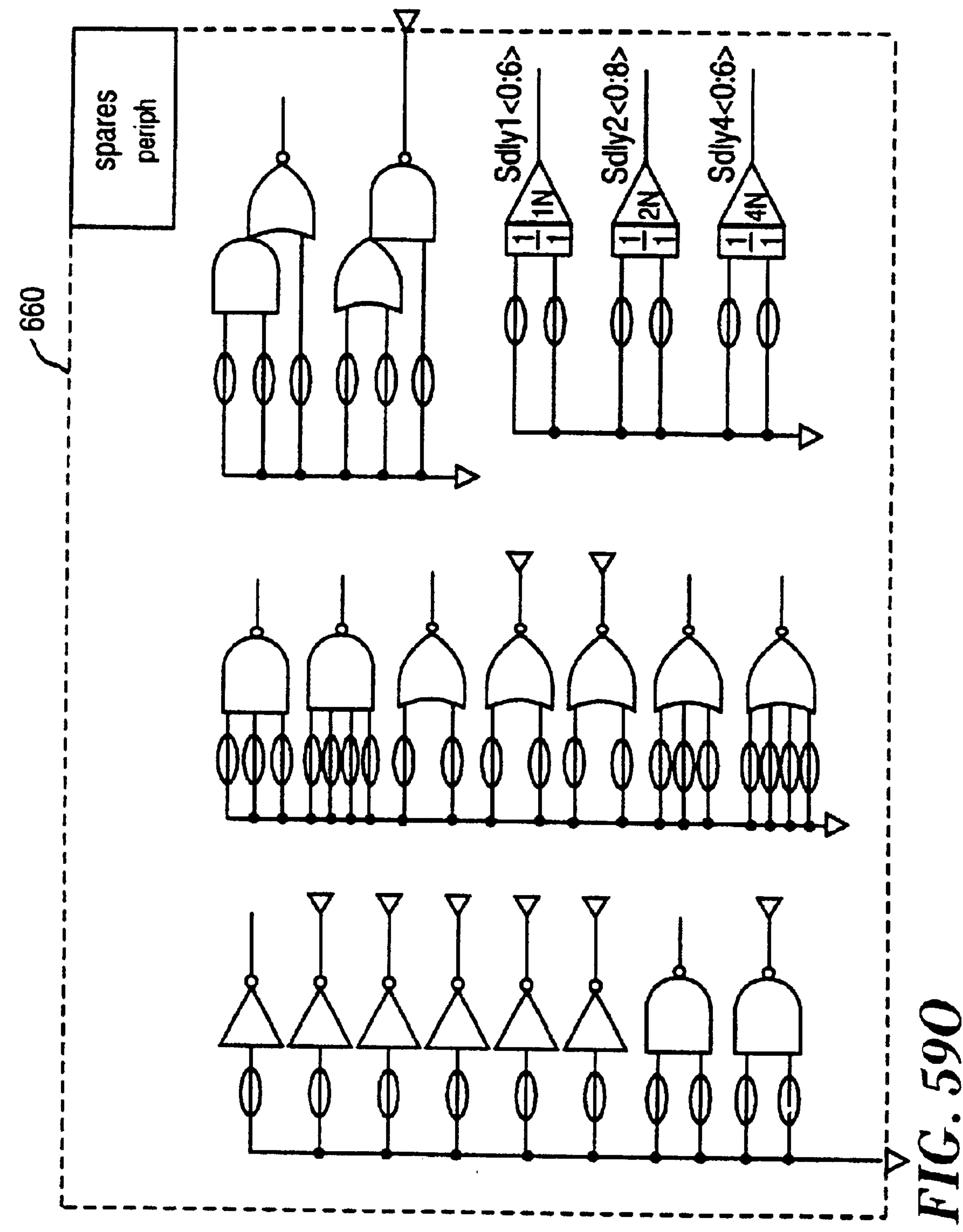
Figure 59P:
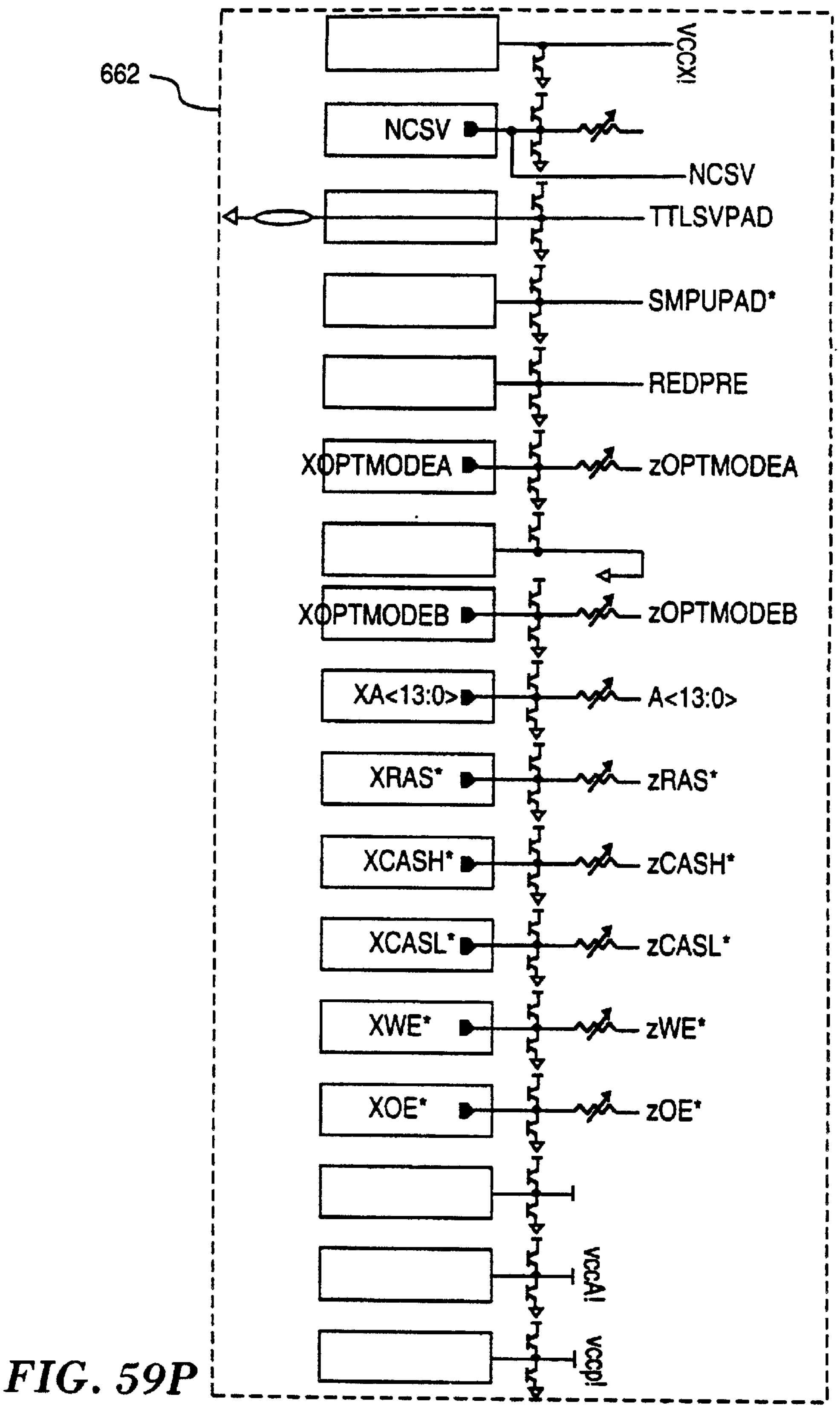

FIG. 43 is a block diagram illustrating the center logic of FIG. 2;

FIG. 44 is a block diagram illustrating the RAS chain circuit shown in FIG. 43;

FIG. 45A illustrates the details of the RAS D generator circuit shown in FIG. 44;

FIG. 45B illustrates the details of the enable phase circuit shown in FIG. 44;

FIG. 45C illustrates the details of the ra enable circuit shown in FIG. 44;

FIG. 45D illustrates the details of the wl tracking circuit shown in FIG. 44;

FIG. 45E illustrates the details of the sense amps enable circuit shown in FIG. 44;

FIG. 45F illustrates the details of the RAS lockout circuit shown in FIG. 44;

FIG. 45G illustrates the details of the enable column circuit shown in FIG. 44;

FIG. 45H illustrates the details of the equilibration circuit shown in FIG. 44;

FIG. 45I illustrates the details of the isolation circuit shown in FIG. 44;

FIG. 45J illustrates the details of the read/write control circuit shown in FIG. 44;

FIG. 45K illustrates the details of the write timeout circuit shown in FIG. 44;

FIG. 45L illustrates the details of the data in latch (high) circuit shown in FIG. 44;

FIG. 45M illustrates the details of the data in latch (low) circuit shown in FIG. 44;

FIG. 45N illustrates the details of the stop equilibration circuit shown in FIG. 44;

FIG. 45O illustrates the details of the CAS L RAS H circuit shown in FIG. 44;

FIG. 45P illustrates the details of the RAS-RASB circuit shown in FIG. 44;

FIG. 46 is a block diagram illustrating the control logic shown in FIG. 43;

FIG. 47A illustrates the details of the RAS buffer circuit shown in FIG. 46;

FIG. 47B illustrates the details of the fuse pulse generator circuit shown in FIG. 46;

FIG. 47C illustrates the details of the output enable buffer circuit shown in FIG. 46;

FIG. 47D illustrates the details of the CAS buffer circuit shown in FIG. 46;

FIG. 47E illustrates the details of the dual CAS buffer circuit shown in FIG. 46;

FIG. 47F illustrates the details of the write enable buffer circuit shown in FIG. 46;

FIG. 47G illustrates the details of the QED logic circuit shown in FIG. 46;

FIG. 47H illustrates the details of the data out latch shown in FIG. 46;

FIG. 47I illustrates the details of the row fuse precharge circuit shown in FIG. 46;

FIG. 47J illustrates the details of the CBR circuit shown in FIG. 46;

FIG. 47K illustrates the details of the pcol circuit shown in FIG. 46;

FIG. 47L illustrates the details of the write enable circuit (high) shown in FIG. 46;

FIG. 47M illustrates the details of the write enable circuit (low) shown in FIG. 46;

FIGS. 48A and B are a block diagram illustrating the row address block shown in FIG. 43;

FIGS. 49A, 49B, and 49C illustrate the details of the row address buffers of FIG. 48A;

FIGS. 50A, 50B, and 50C illustrate the details of the drivers and NAND P decoders of FIG. 48B;

FIGS. 51A and 51B are a block diagram illustrating the column address block shown in FIG. 43;

FIGS. 52A, 52B, 52C, and 52D illustrate the details of the column address buffers and input circuits therefor of FIG. 51A;

FIG. 53 illustrates the details of the column predecoders of FIG. 51B;

FIGS. 54A and 54B illustrate the details of the 16 Meg and 32 Meg select circuits, respectively, of FIG. 51B;

FIG. 55 illustrates the details of the eq driver circuit of FIG. 51B;

FIG. 56 is a block diagram illustrating the test mode logic of FIG. 43;

FIG. 57A illustrates the details of the test mode reset circuit shown in FIG. 56;

FIG. 57B illustrates the details of the test mode enable latch circuit shown in FIG. 56;

FIG. 57C illustrates the details of the test option logic circuit shown in FIG. 56;

FIG. 57D illustrates the details of the supervolt circuit shown in FIG. 56;

FIG. 57E illustrates the details of the test mode decode circuit shown in FIG. 56;

FIG. 57F illustrates the details of the SV test mode decode 2 circuits and associated buses and the optprog driver circuit shown in FIG. 56;

FIG. 57G illustrates the details of the redundant test reset circuit shown in FIG. 56;

FIG. 57H illustrates the details of the Vccp clamp shift circuit shown in FIG. 56;

FIG. 57I illustrates the details of the DVC2 up/down circuit shown in FIG. 56;

FIG. 57J illustrates the details of the DVC2 OFF circuit shown in FIG. 56;

FIG. 57K illustrates the details of the pass Vcc circuit shown in FIG. 56;

FIG. 57L illustrates the details of the TTLSV circuit shown in FIG. 56;

FIG. 57M illustrates the details of the disred circuit shown in FIG. 56;

FIGS. 58A and 58B are a block diagram illustrating the option logic of FIG. 43;

FIGS. 59A and 59B illustrate the details of the both fuse2 circuits shown in FIG. 58A;

FIG. 59C illustrates the details of one of the SGND circuits shown in FIG. 58A;

FIG. 59D illustrates the ecol delay circuit and the antifuse cancel enable circuit of FIG. 58A;

FIG. 59E illustrates the CGND circuits of FIG. 58B;

FIG. 59F illustrates the antifuse program enable, passgate, and related circuits of FIG. 58A;

FIG. 59G illustrates the bond option circuits and bond option logic of FIG. 58A;

FIG. 59H illustrates the laser fuse option circuits of FIG. 58B;

FIG. 59I illustrates the laser fuse opt 2 circuits and the reg pretest circuit of FIG. 58B;

FIG. 59J illustrates the 4 k logic circuit of FIG. 58A;

FIGS. 59K and 59L illustrate the fuse ID circuit of FIG. 58A;

FIG. 59M illustrates the DVC2E circuit of FIG. 58A;

FIG. 59N illustrates the DVC2GEN circuit of FIG. 58A;

FIG. 59O illustrates the spares circuit shown in FIG. 43;

FIG. 59P illustrates the miscellaneous signal input circuit shown in FIG. 43;

Global Sense Amp Drivers (See Section IX)

Figure 3A:
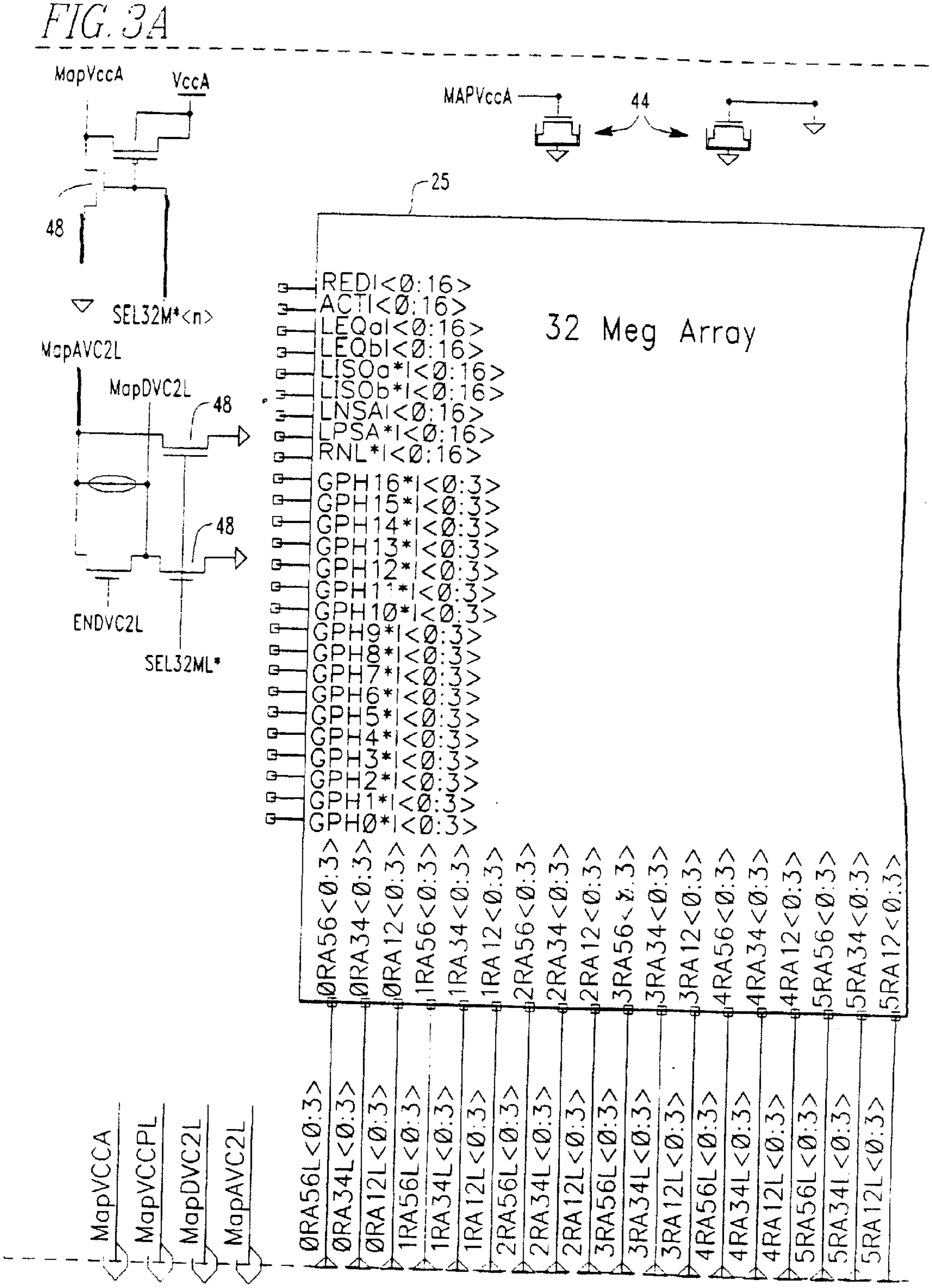
Figure 3B:
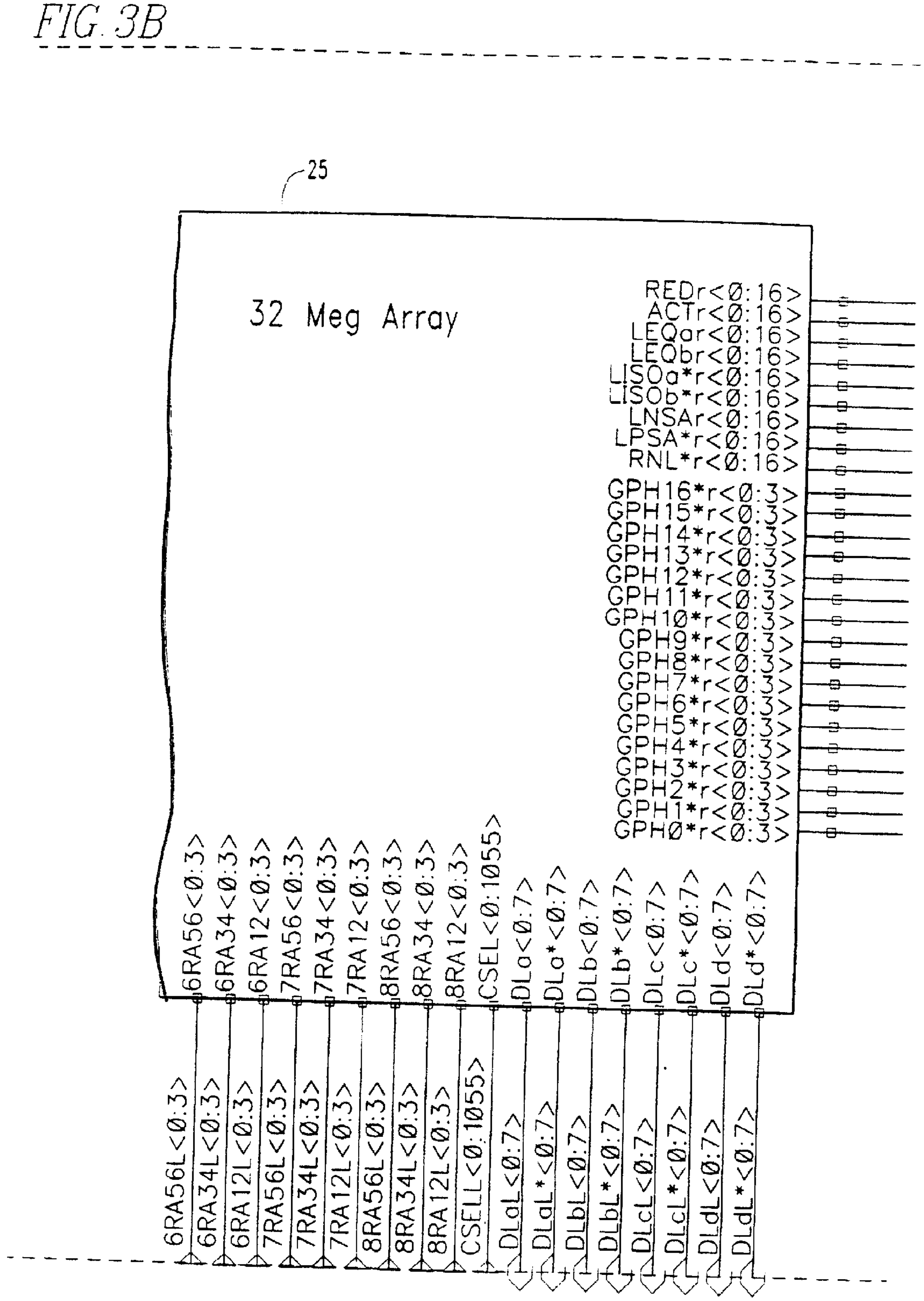
Figure 3C:
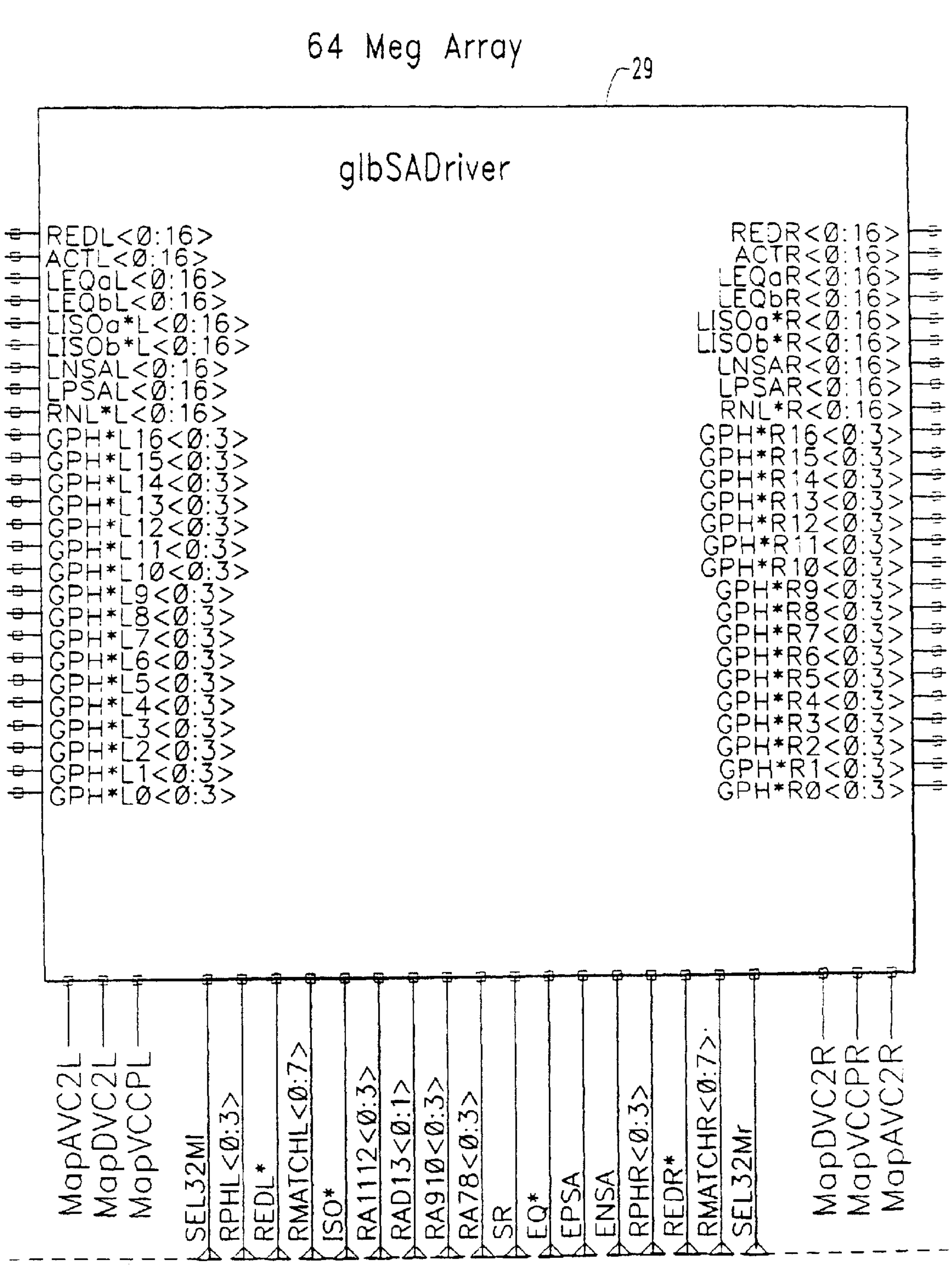
Figure 3D:
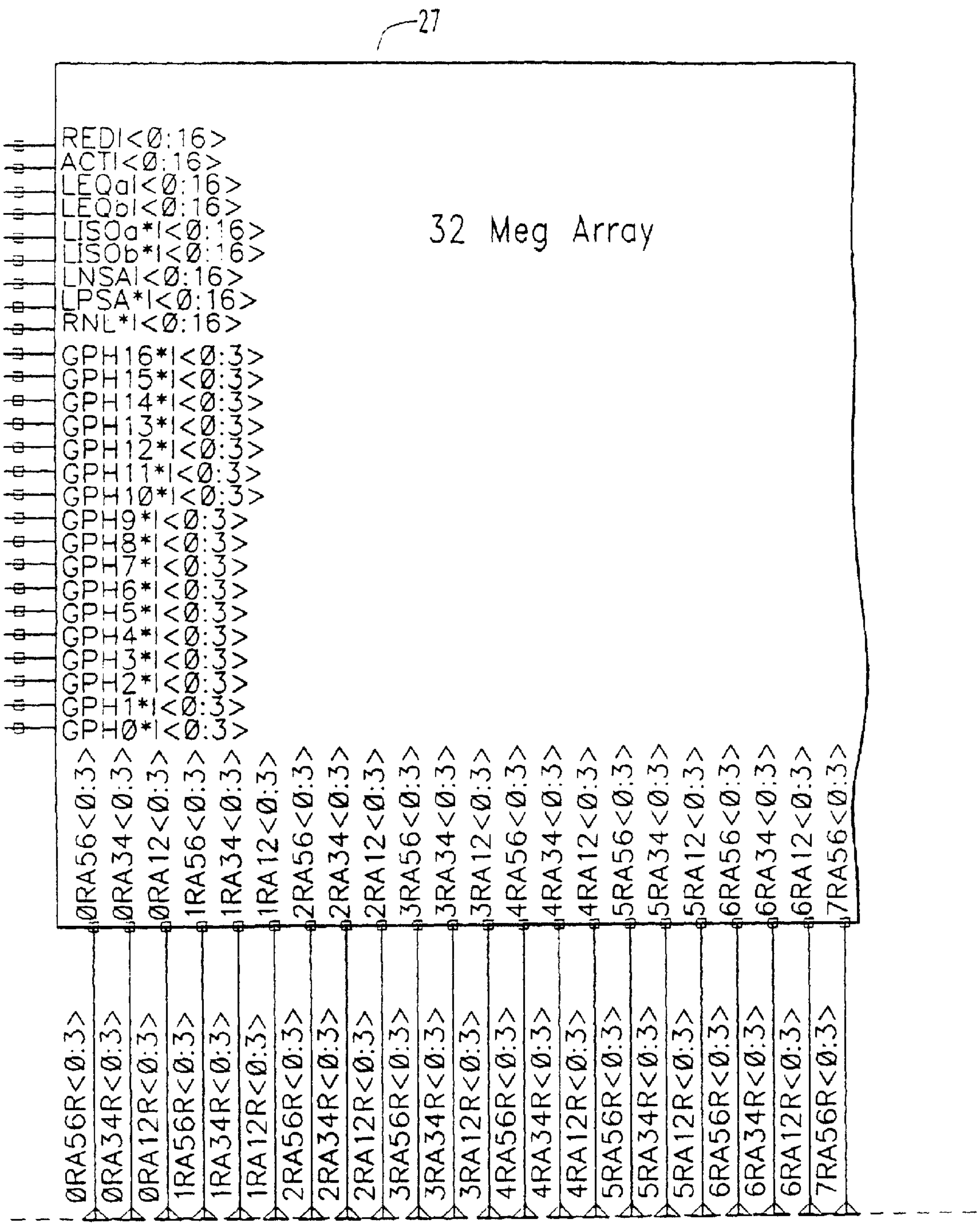
Figure 3E:
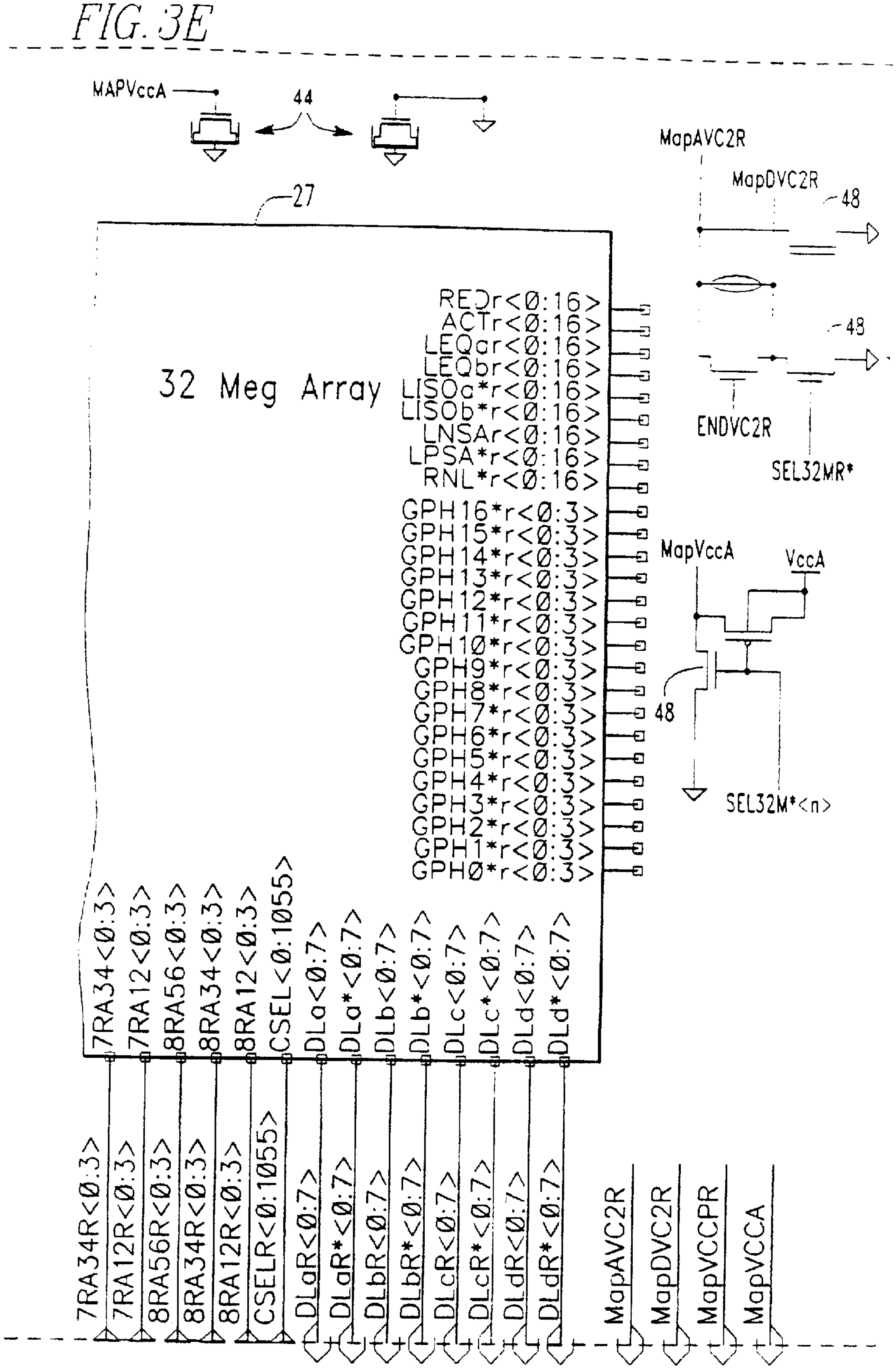
Figure 60:
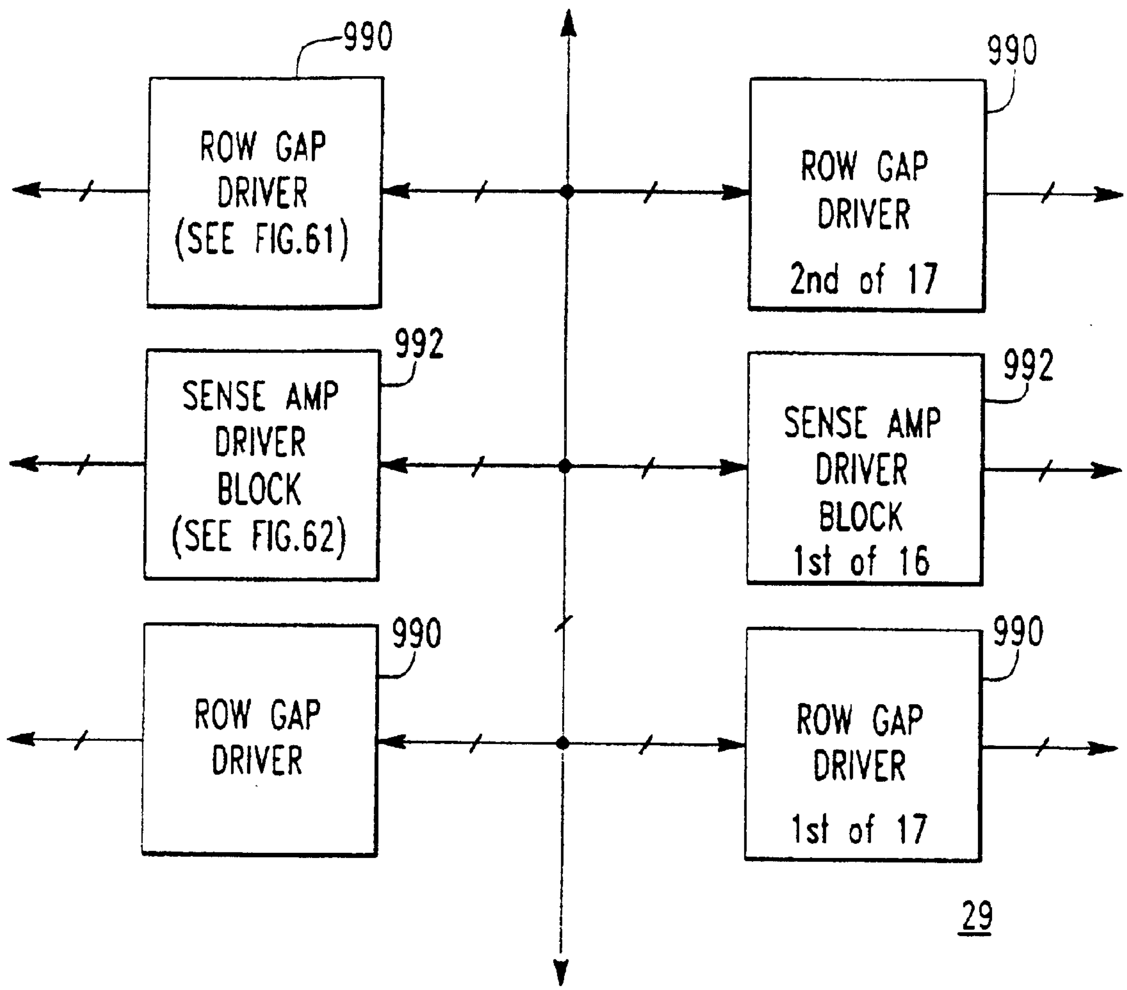
Figure 61:
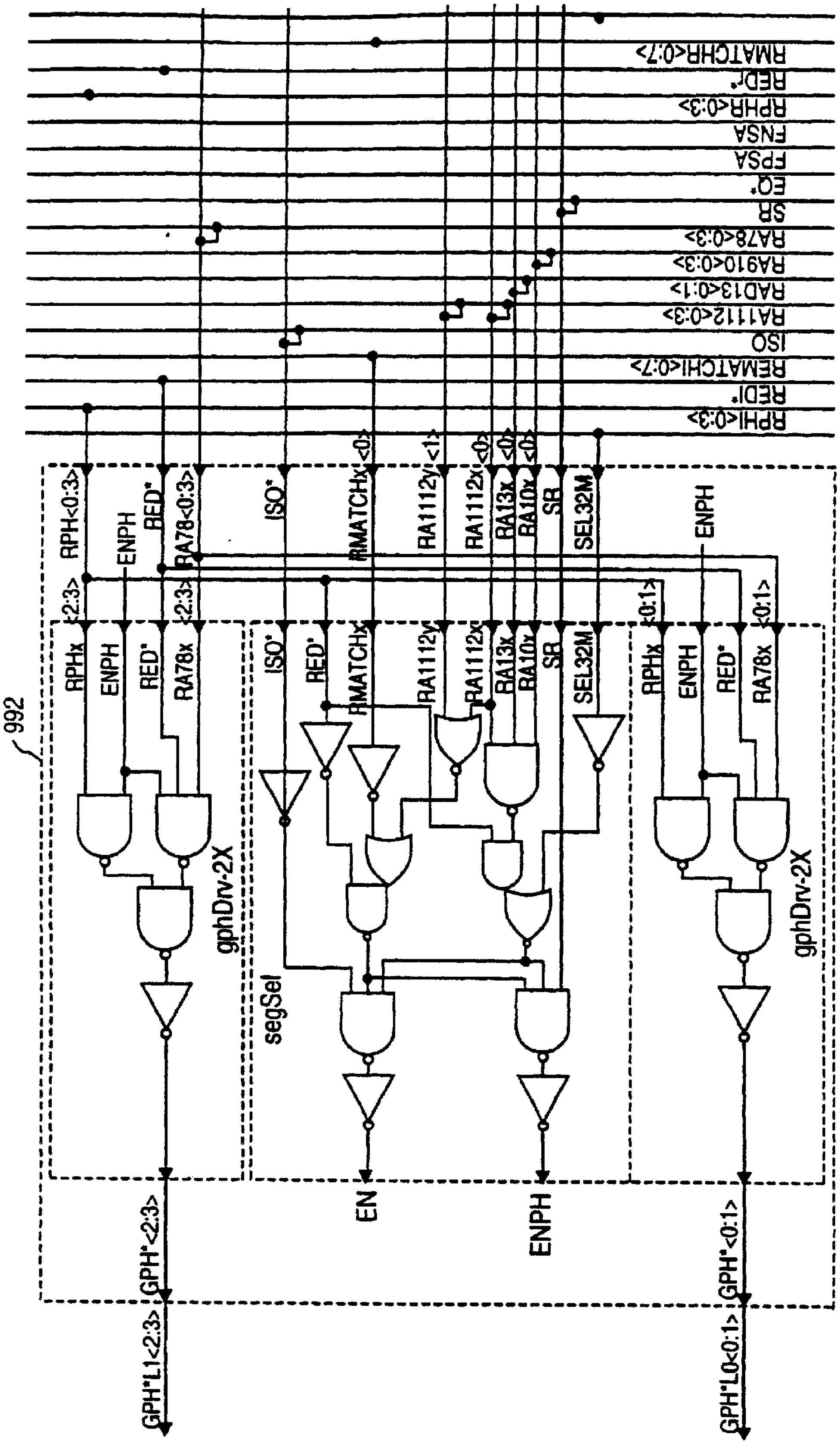
Figure 62:
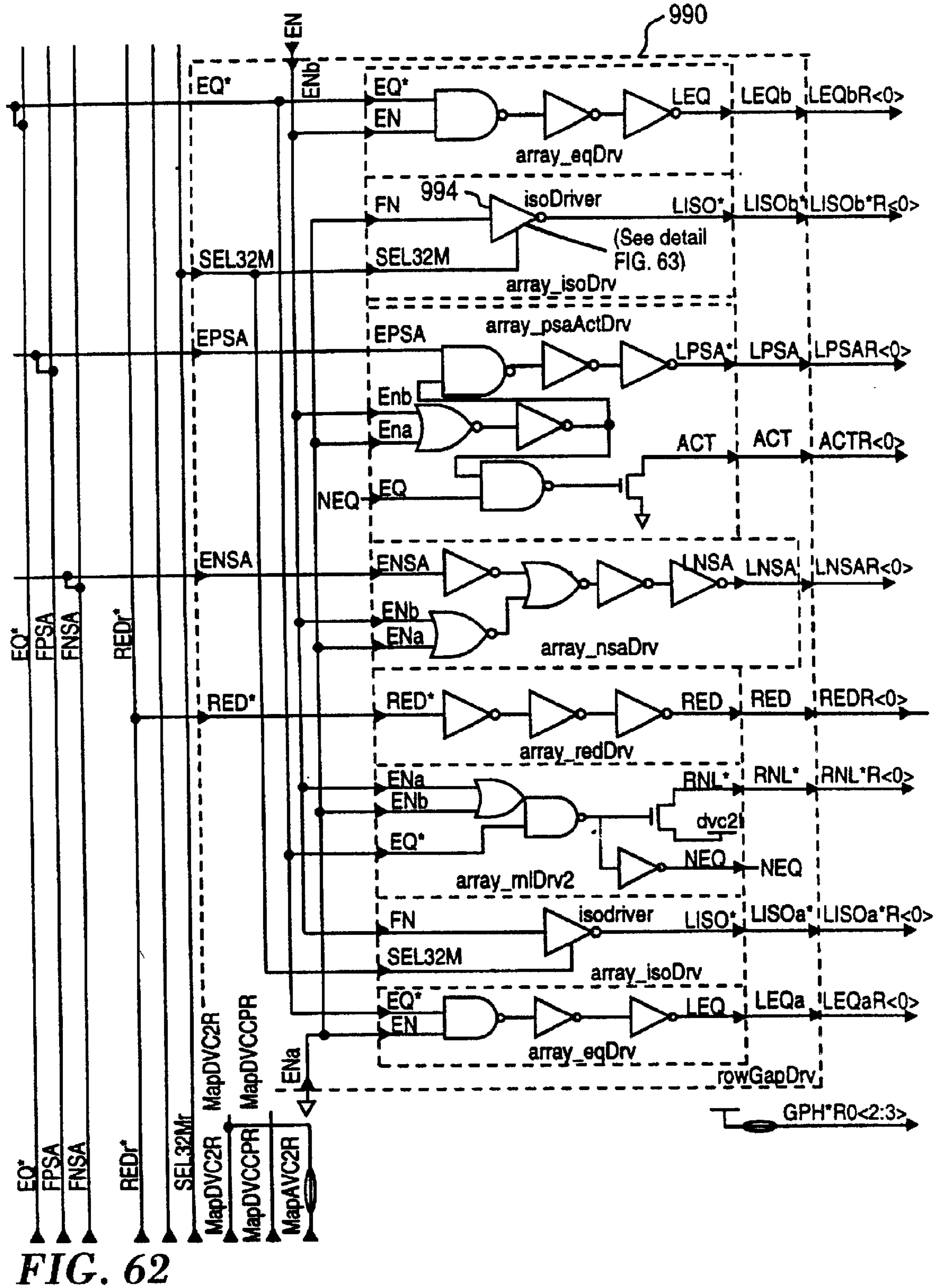
Figure 63:
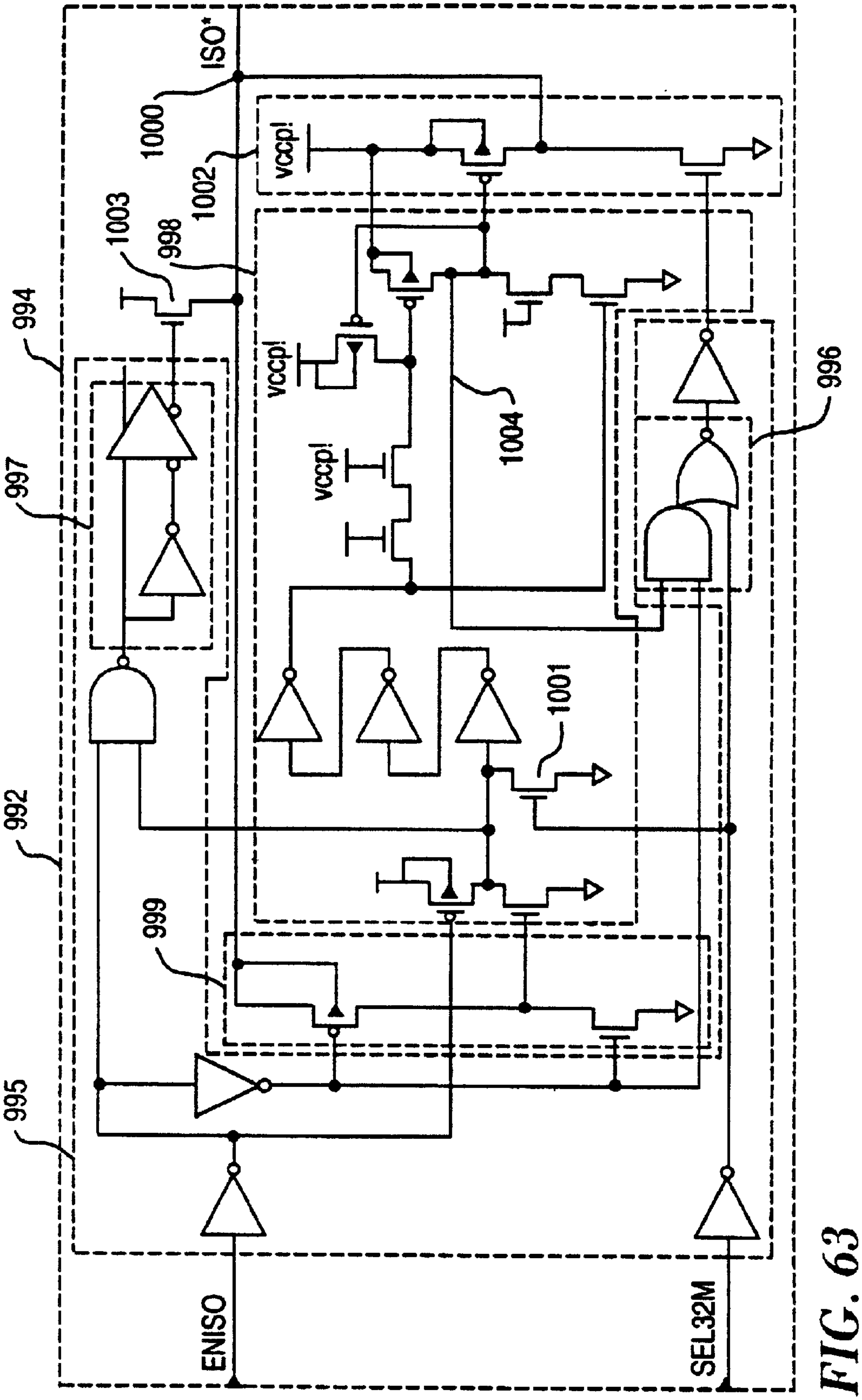

FIG. 60 is a block diagram illustrating the global sense amplifier driver show in FIG. 3C;

FIG. 61 is an electrical schematic illustrating one of the sense amplifier driver blocks of FIG. 60;

FIG. 62 is an electrical schematic illustrating one of the row gap drivers of FIG. 60;

FIG. 63 is an electrical schematic illustrating the isolation driver of FIG. 62;

Right and Left Logic (See Section X)

Figure 64A:
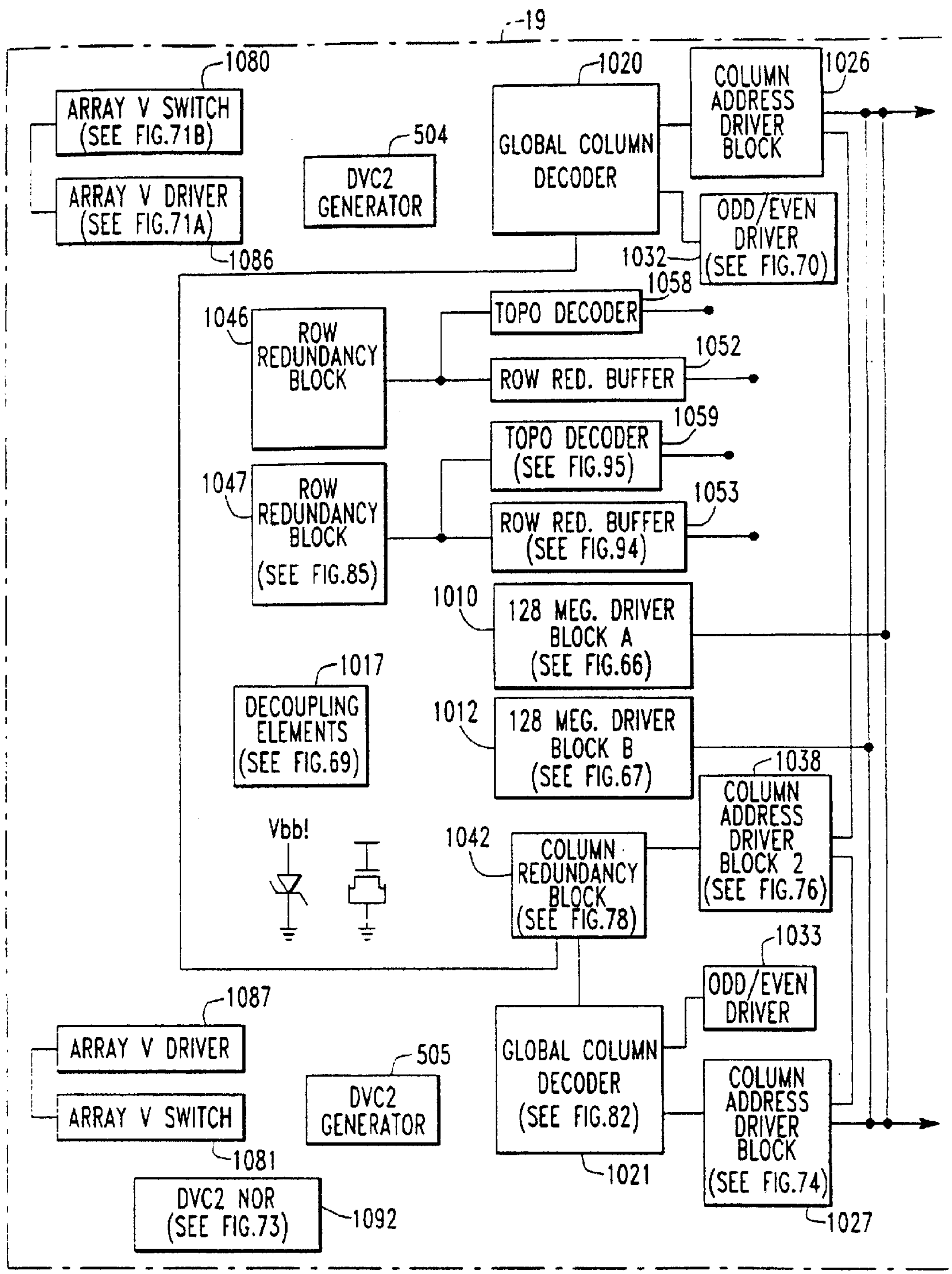
Figure 64B:
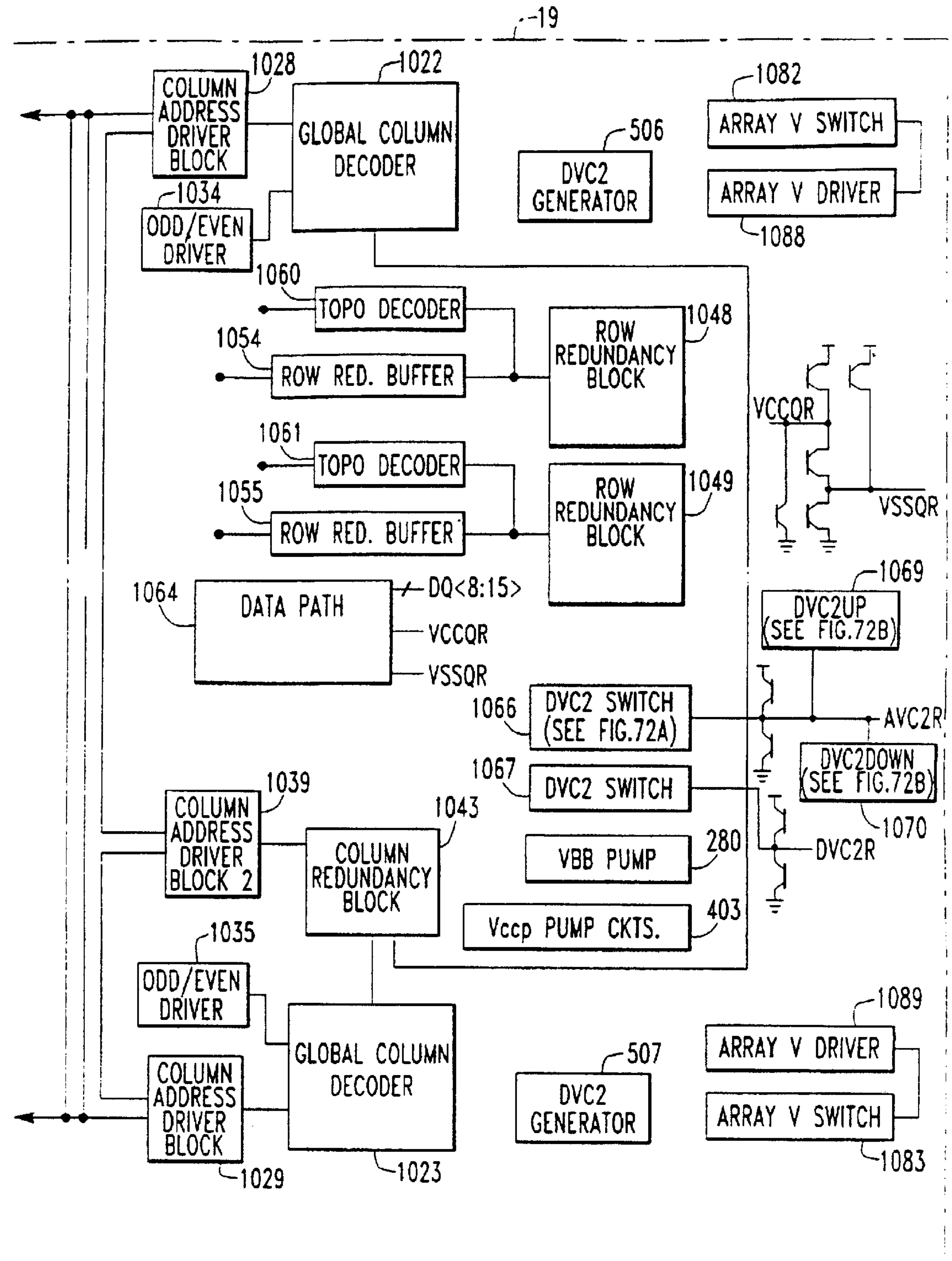
Figure 65A:
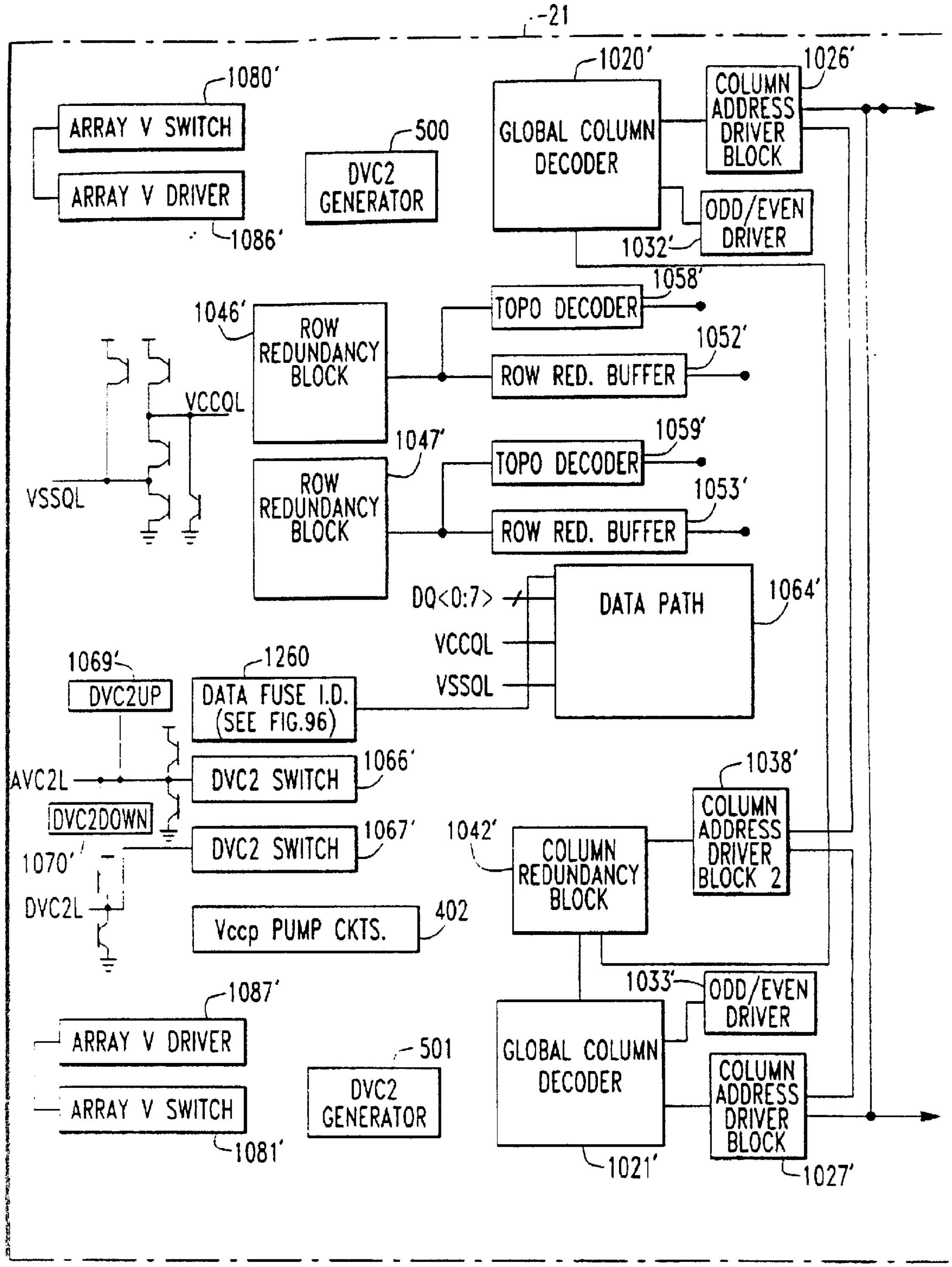
Figure 65B:
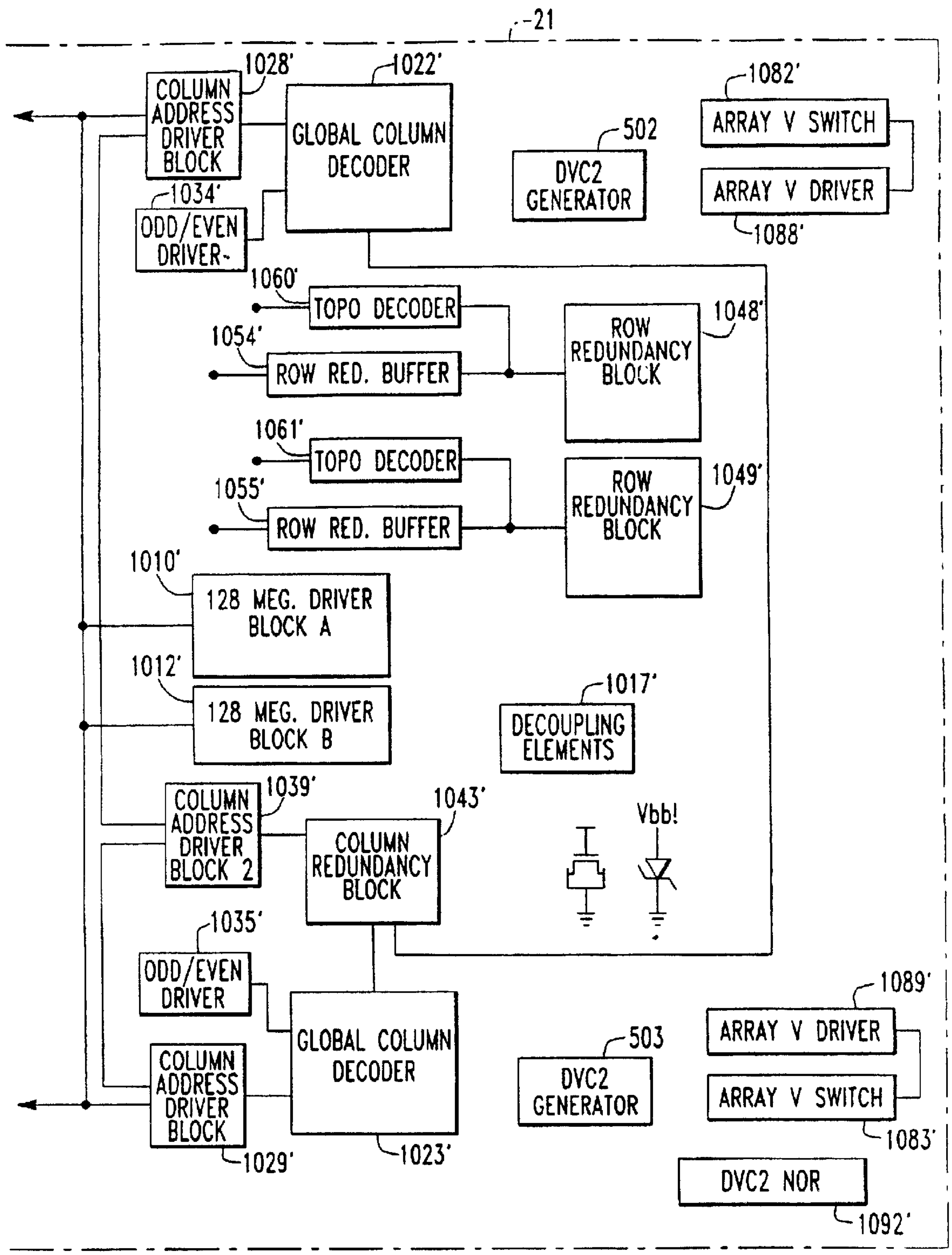
Figure 66:
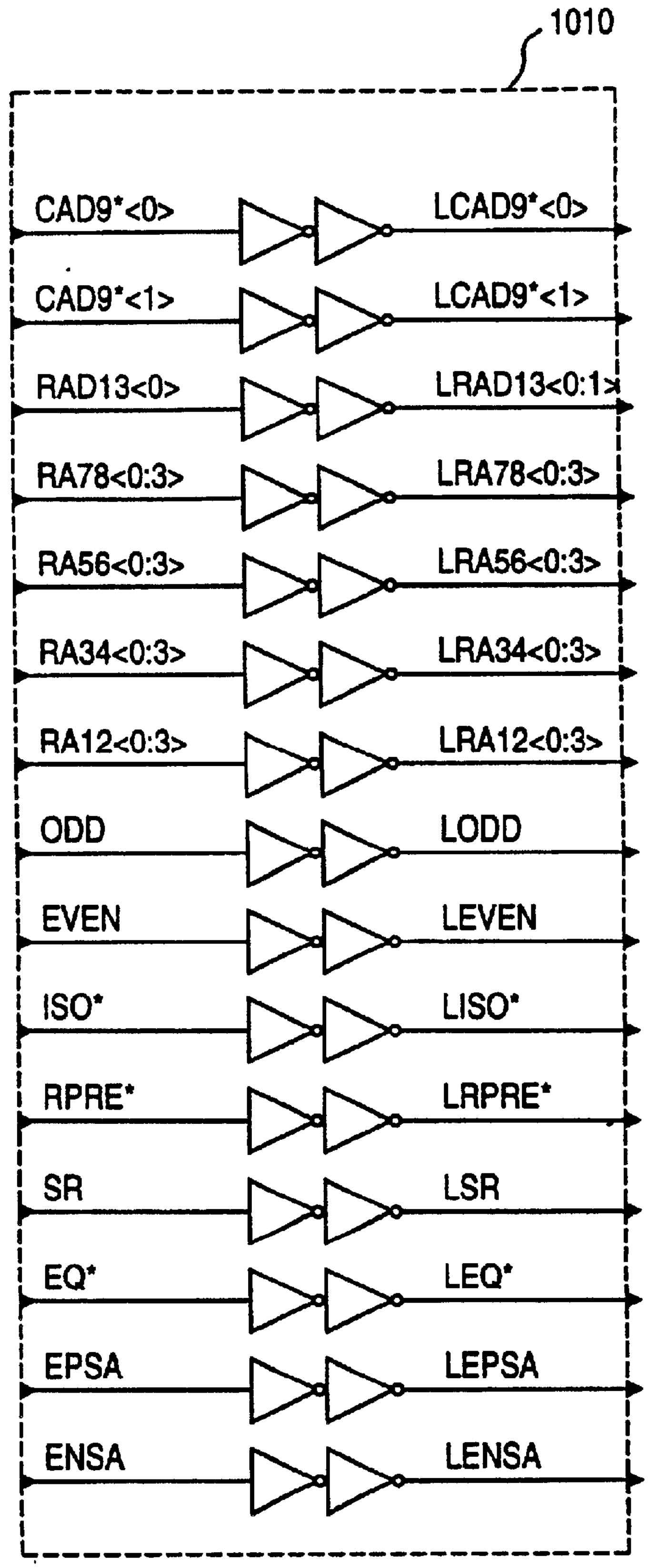
Figure 67:
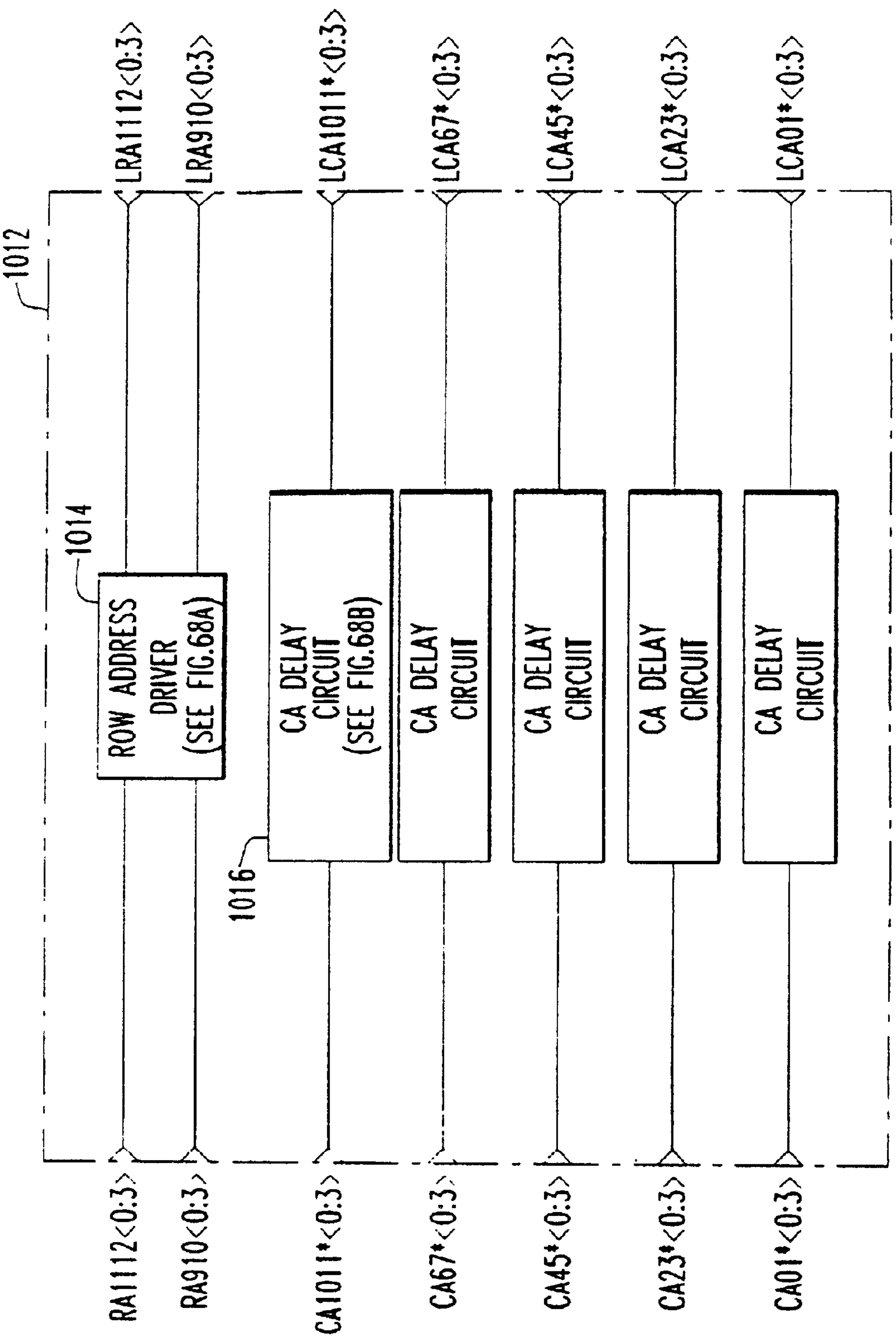
Figure 68A:
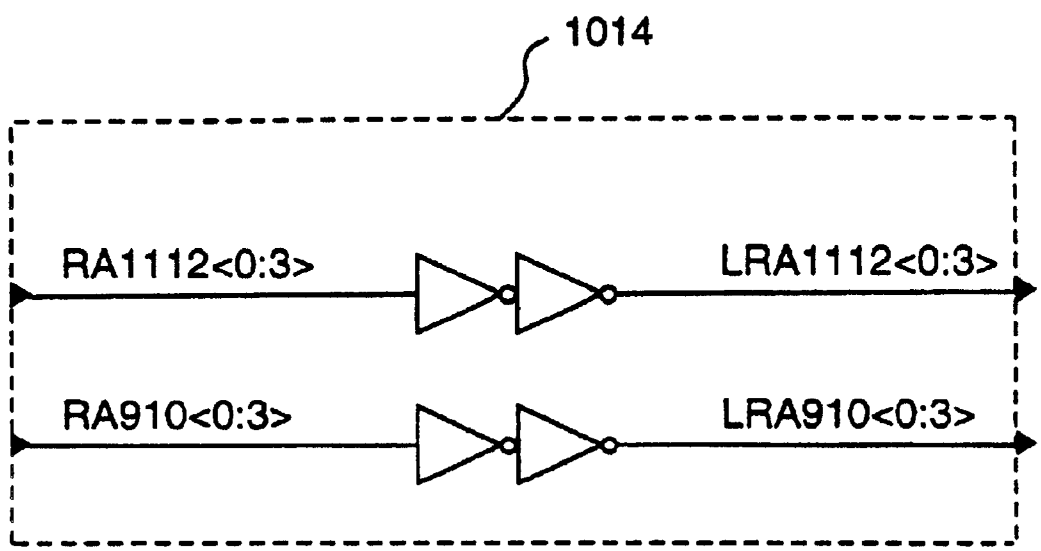
Figure 68B:
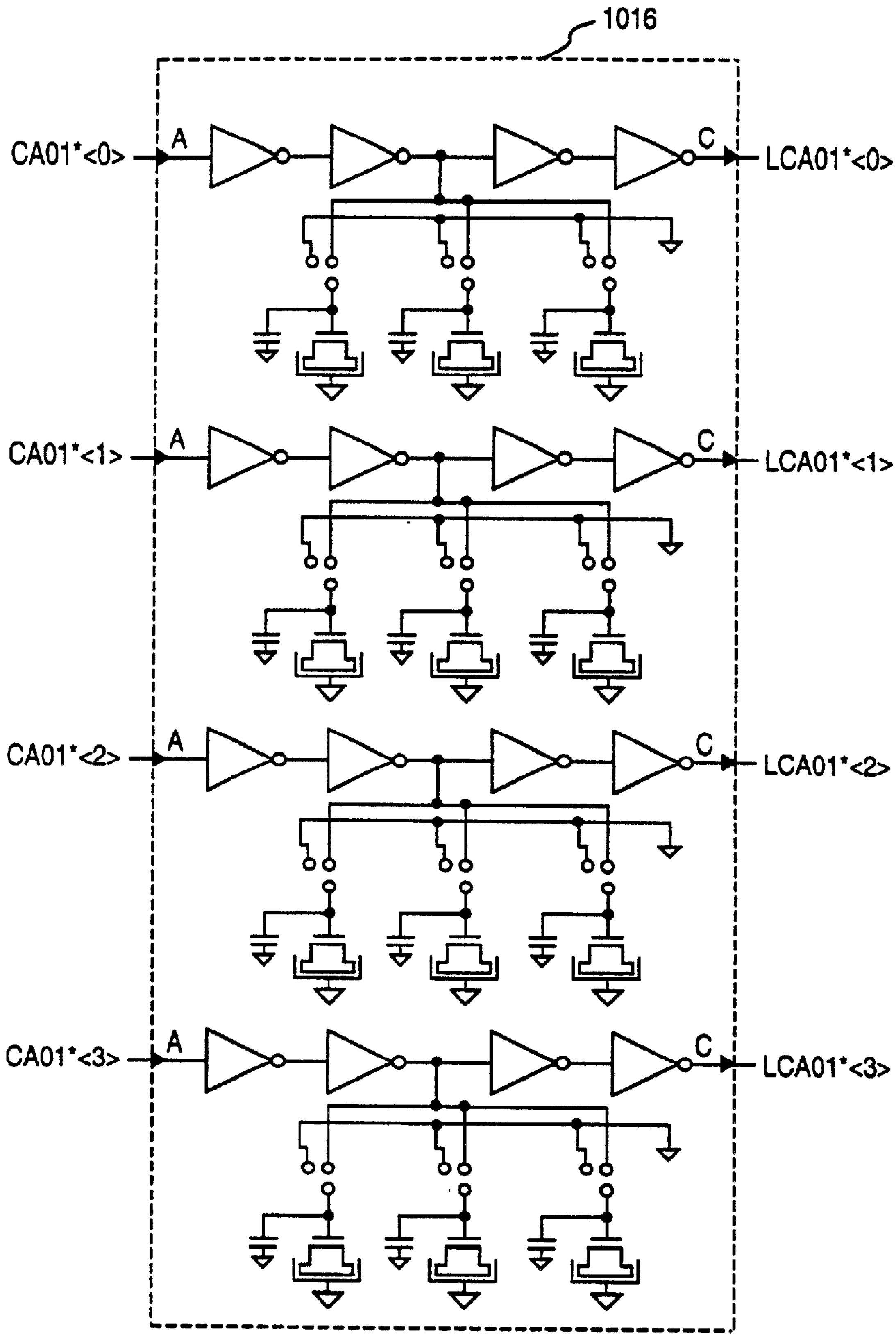
Figure 69:
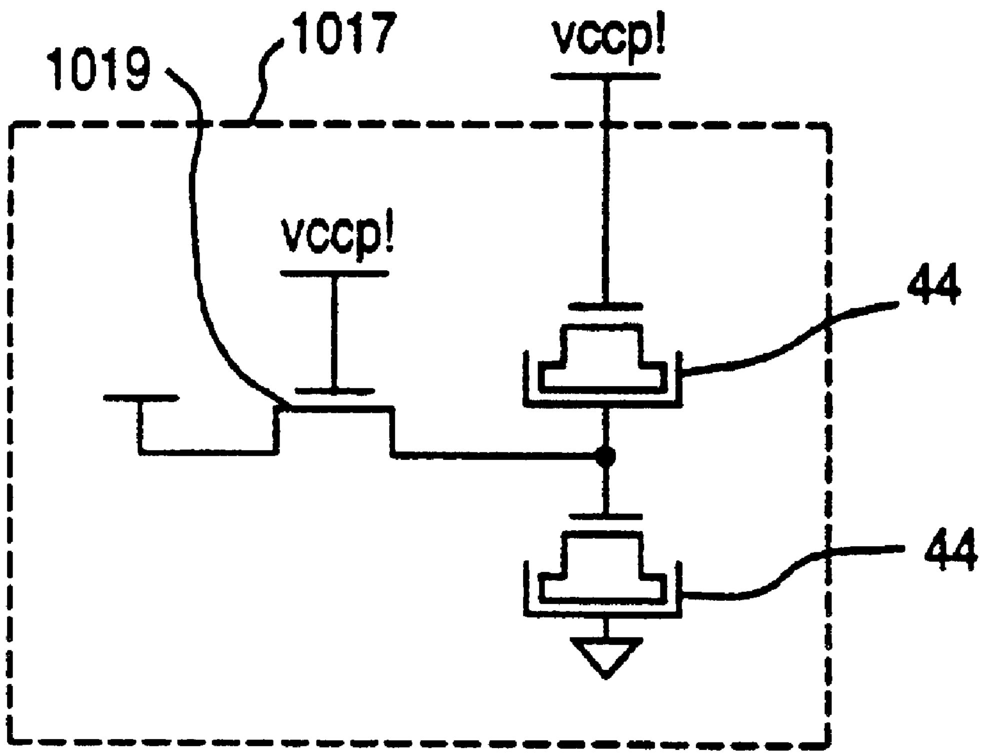
Figure 70:
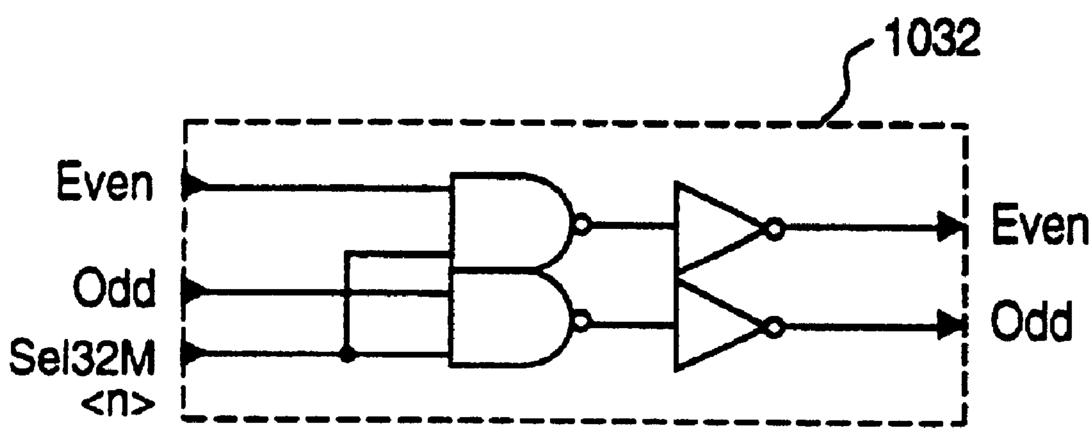
Figure 71A:
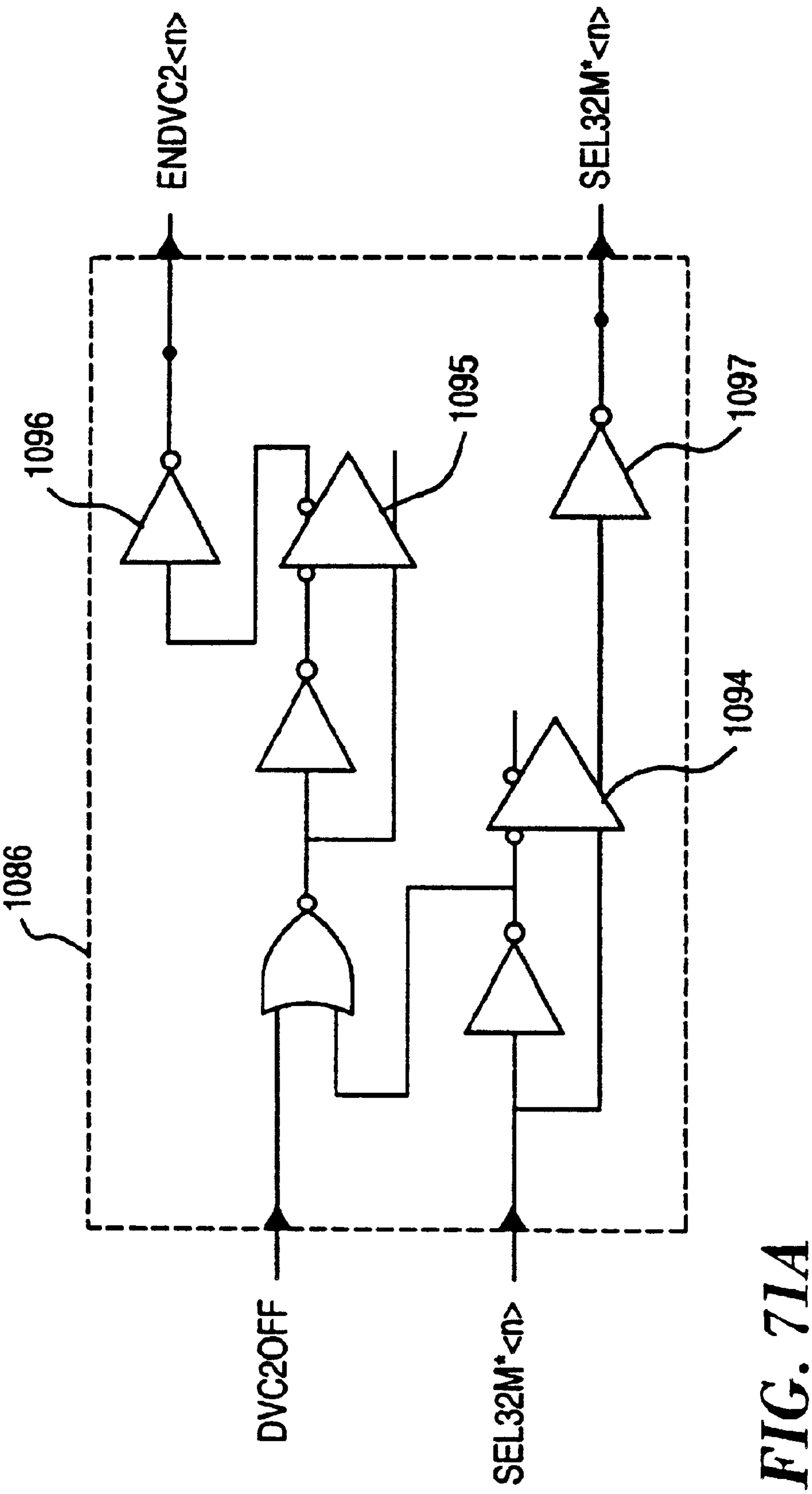
Figure 71B:
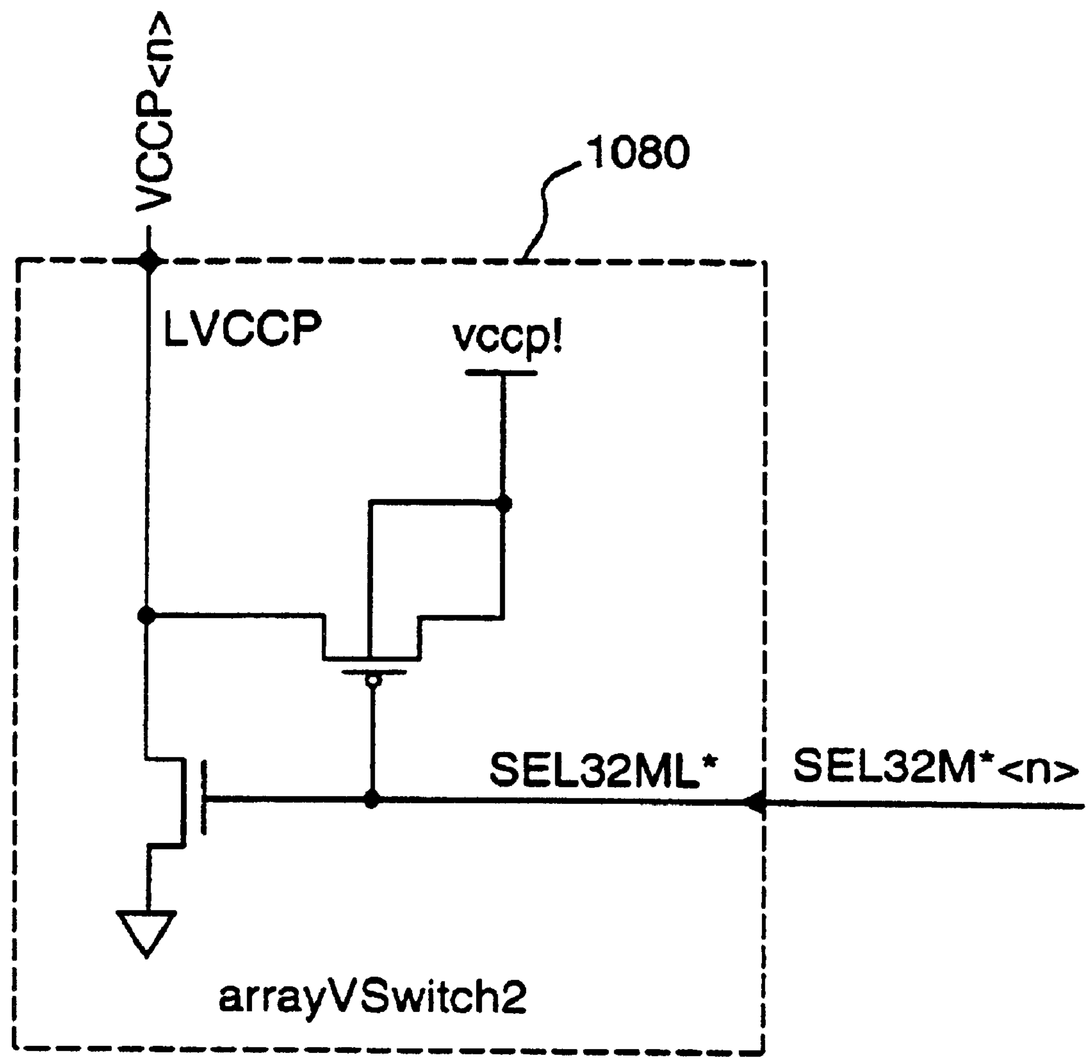
Figure 72A:
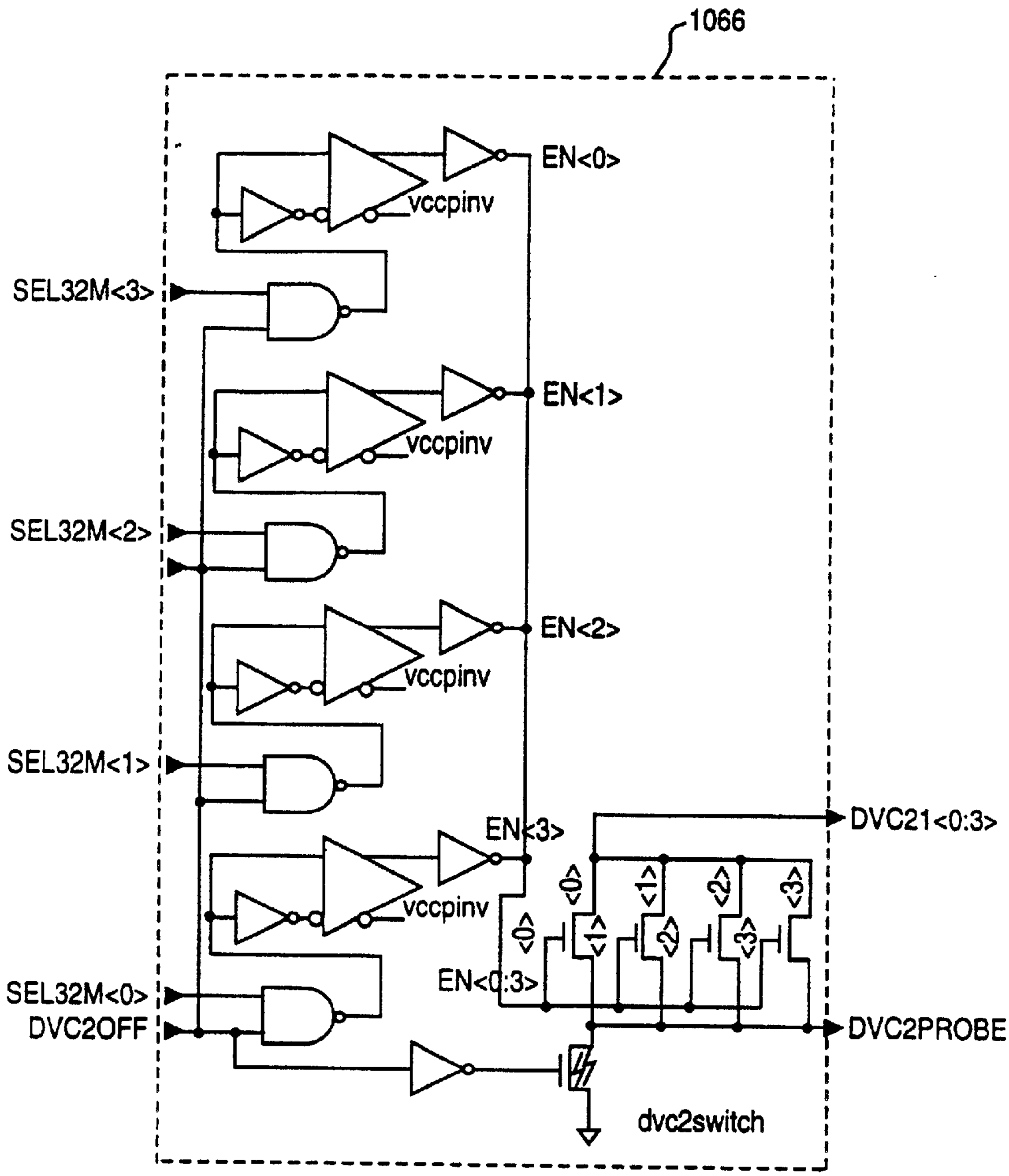
Figure 72B:
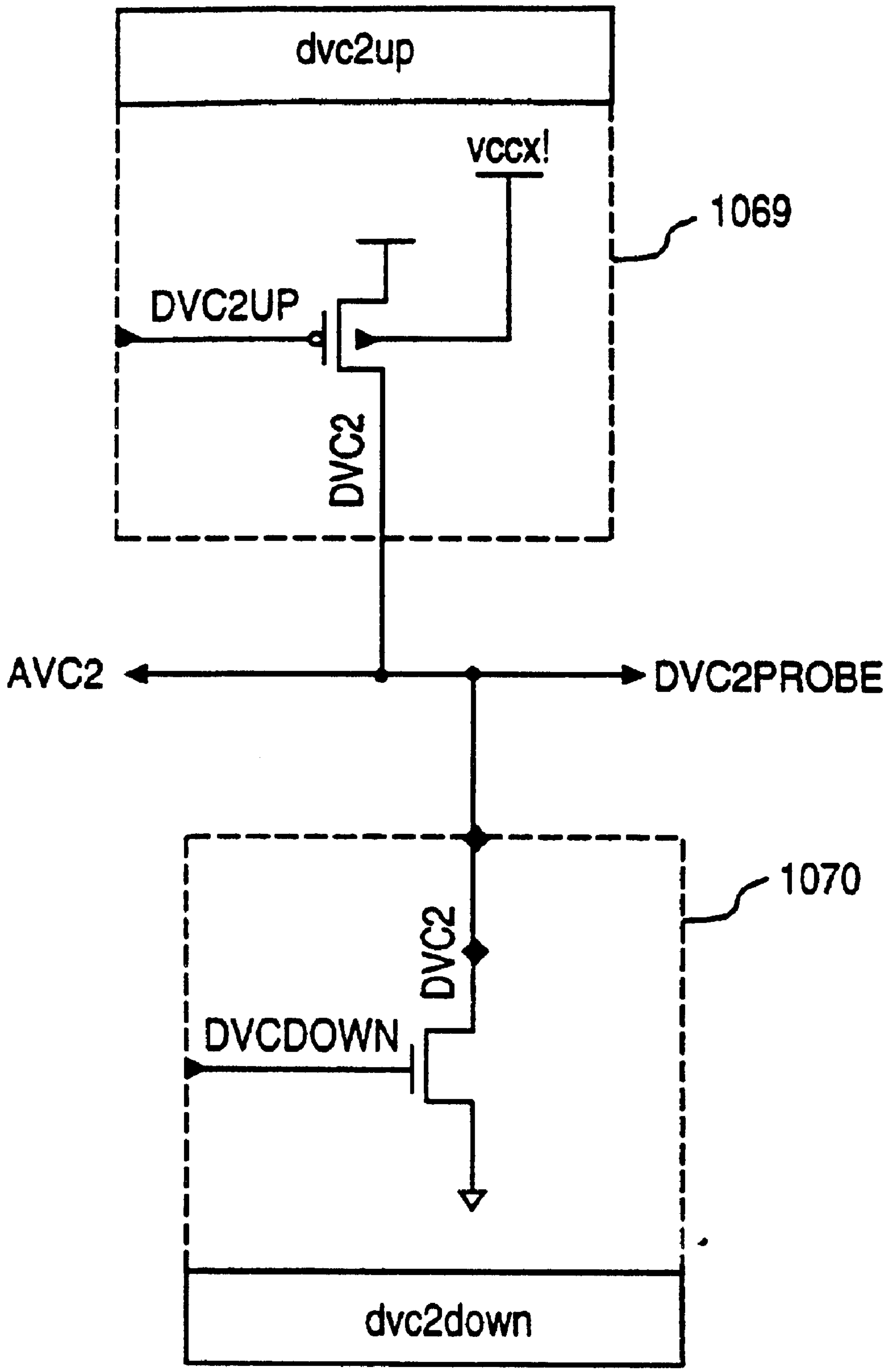
Figure 73:
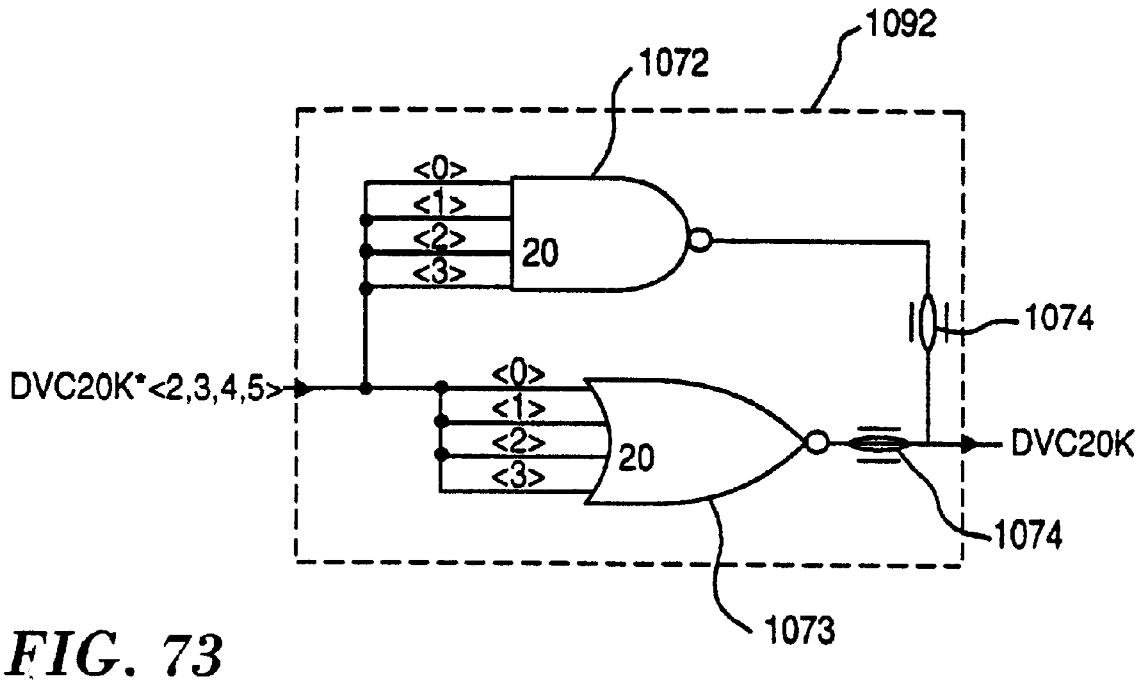
Figure 74:
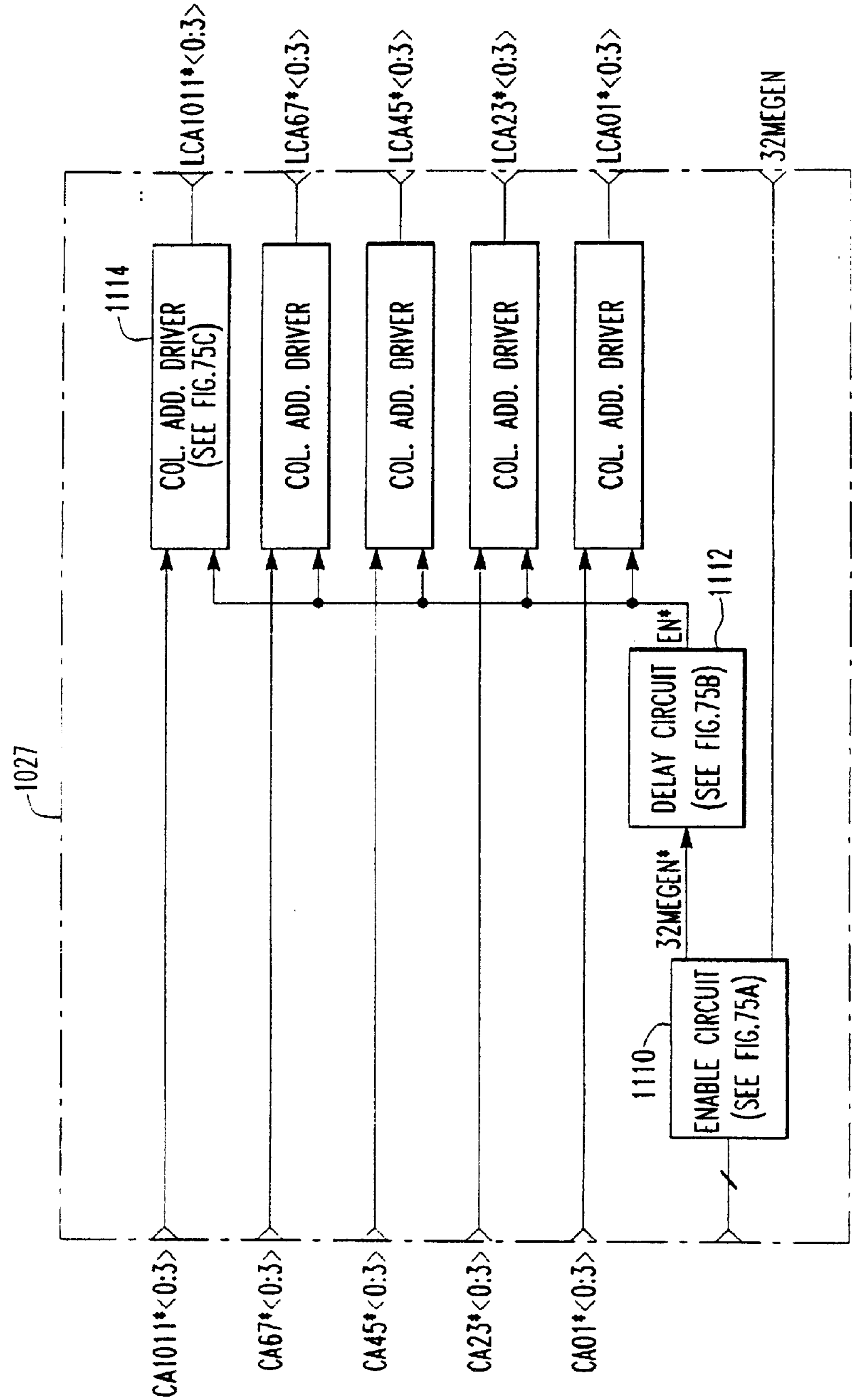
Figure 75A:
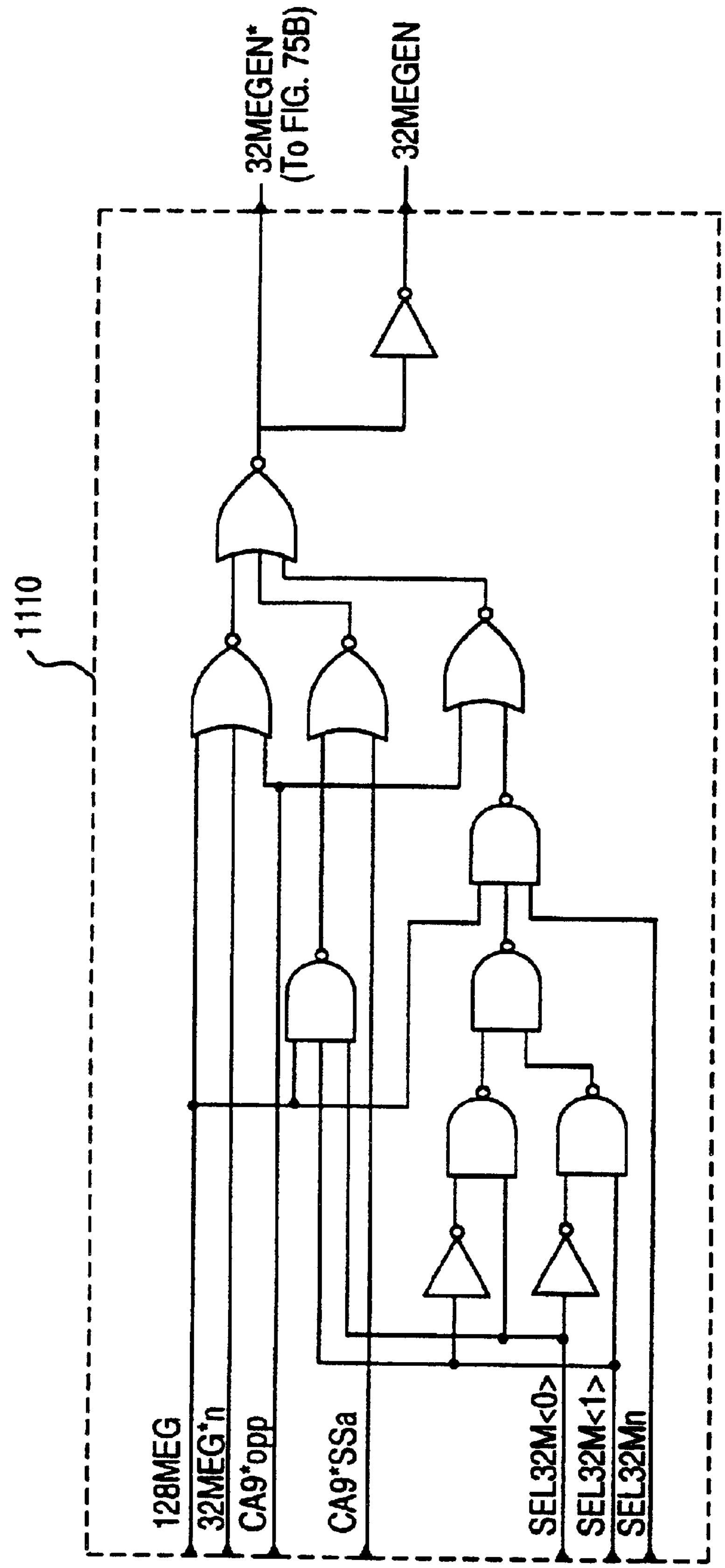
Figure 75B:
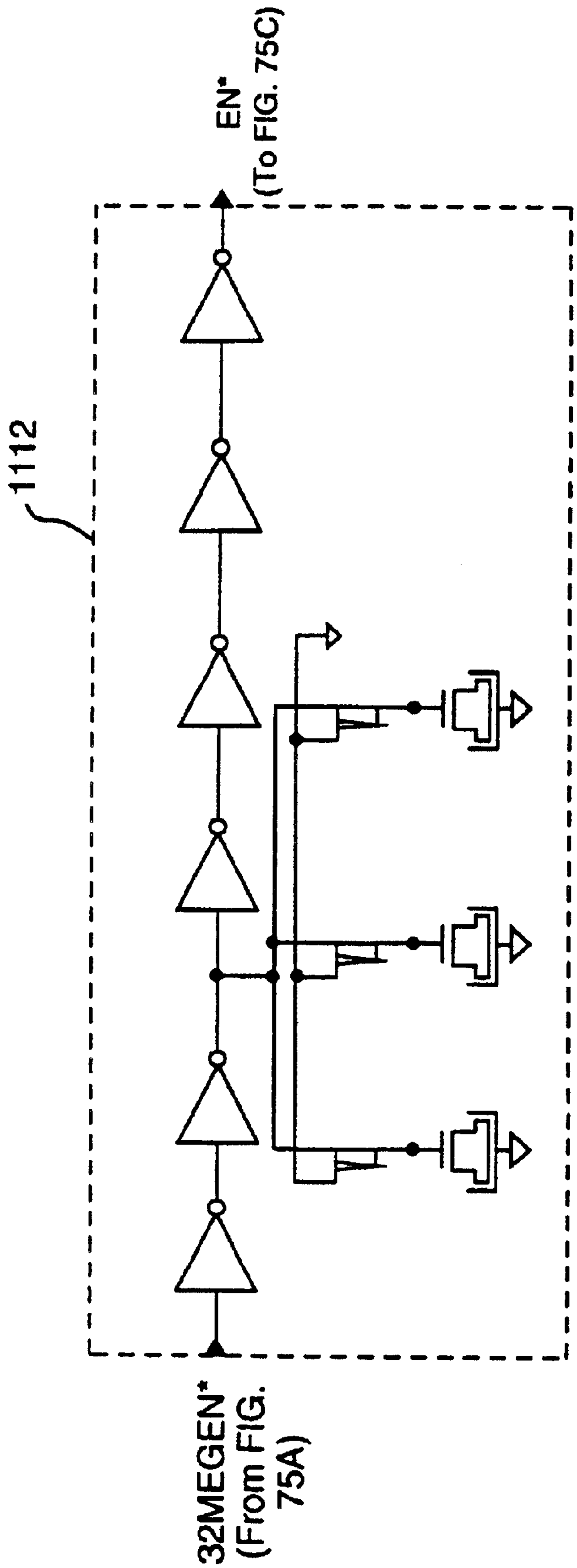
Figure 75C:
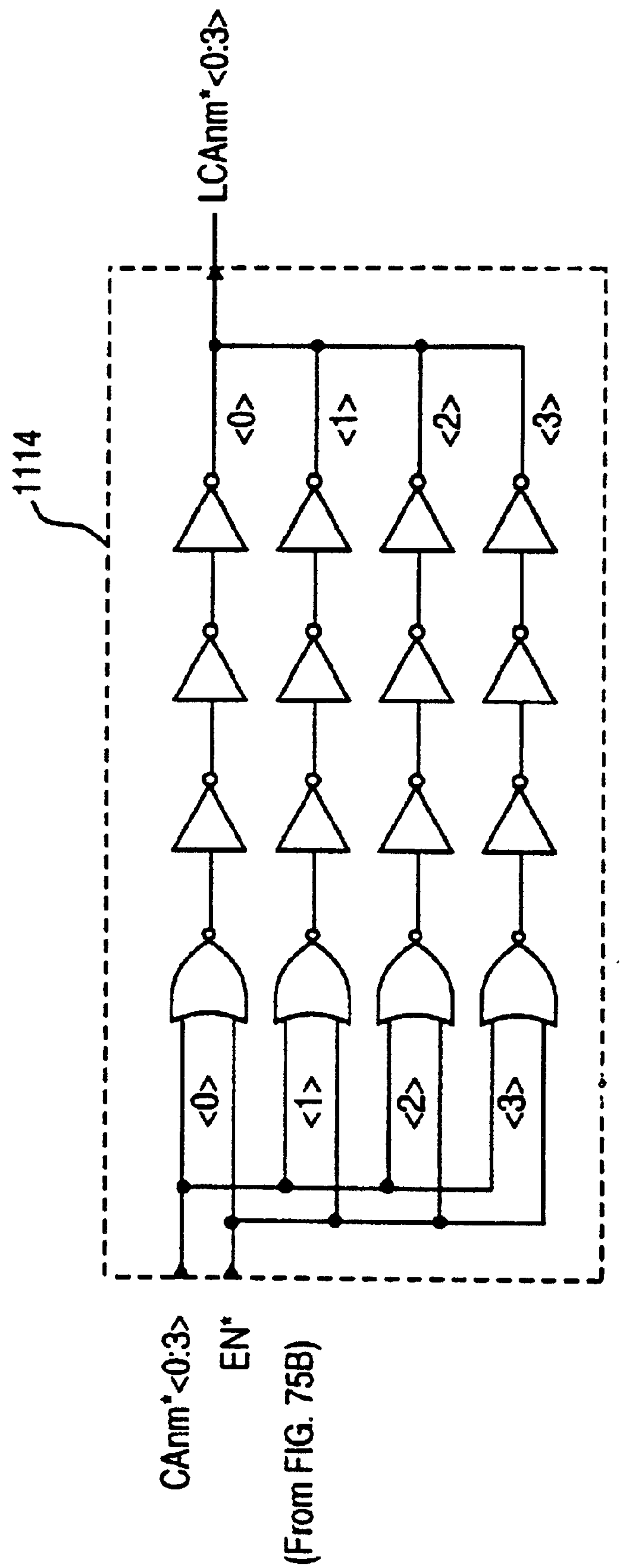
Figure 76:
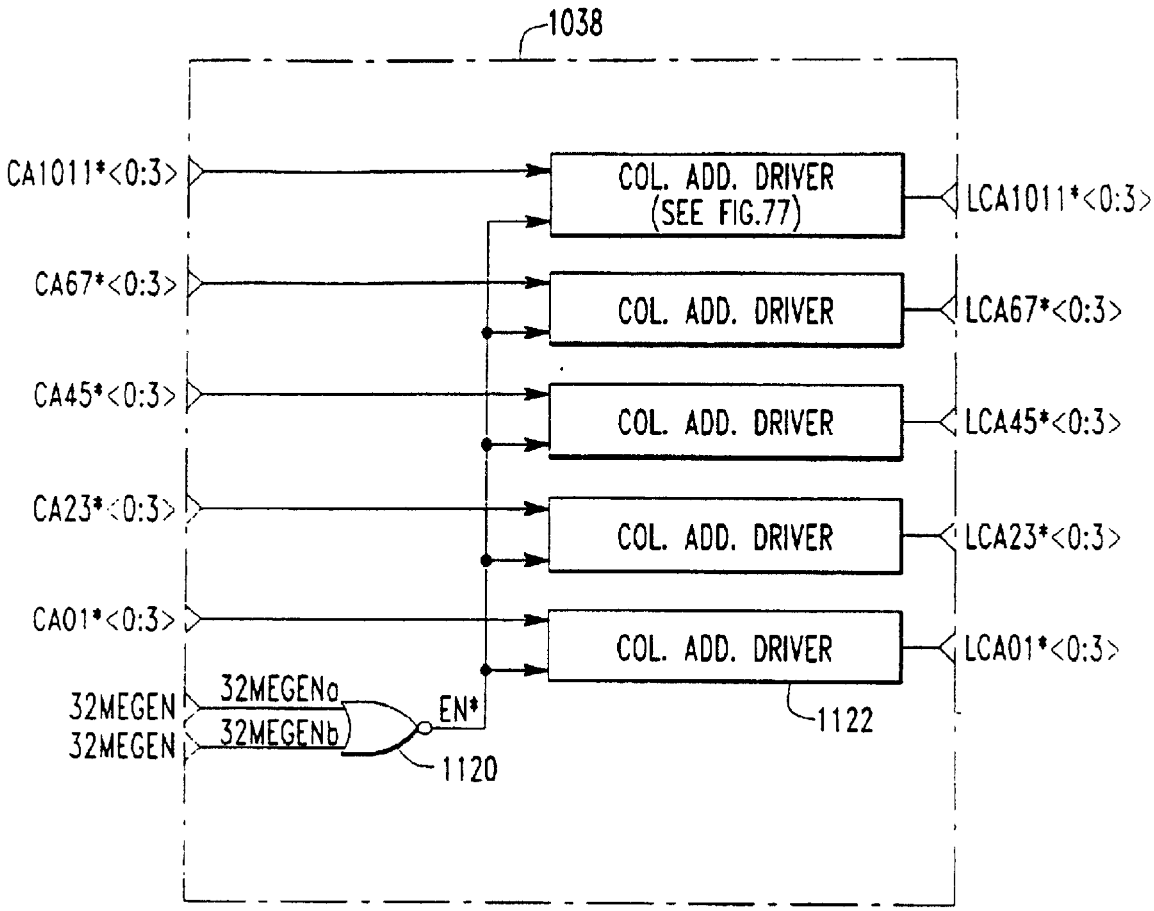
Figure 77:
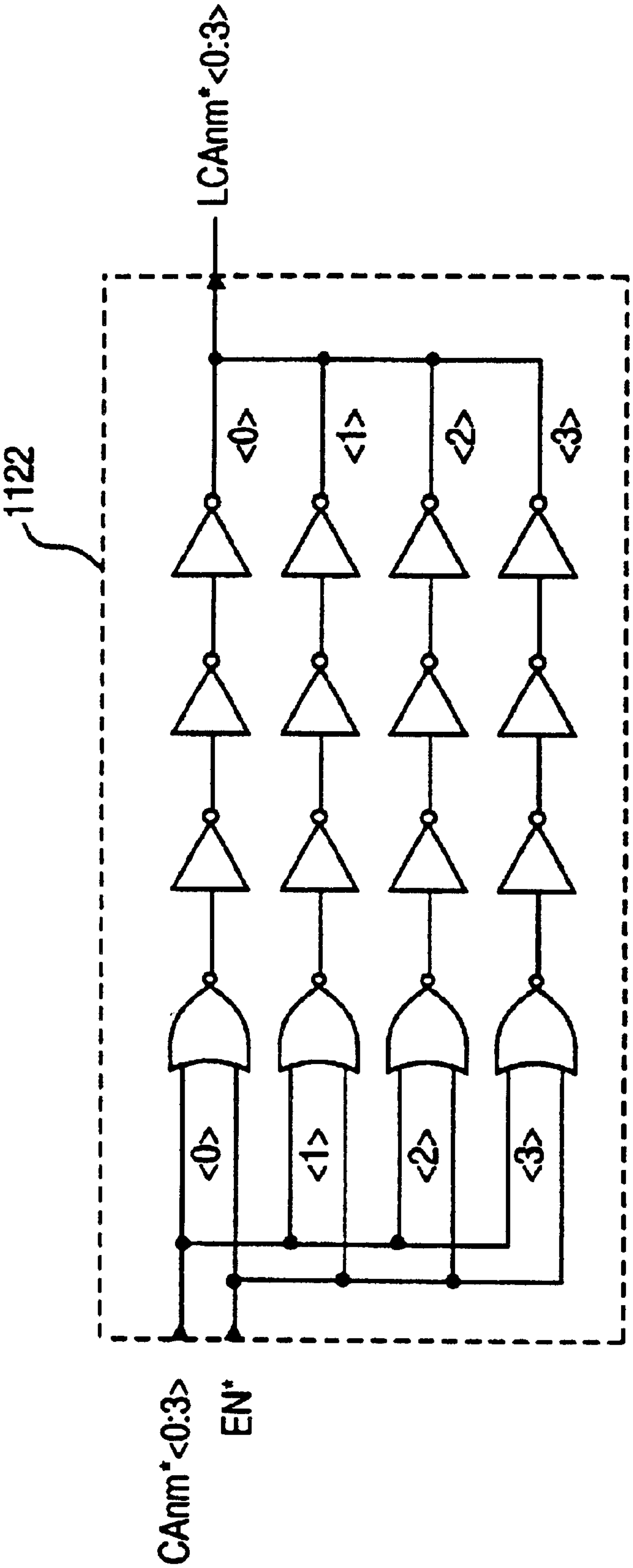
Figure 78:
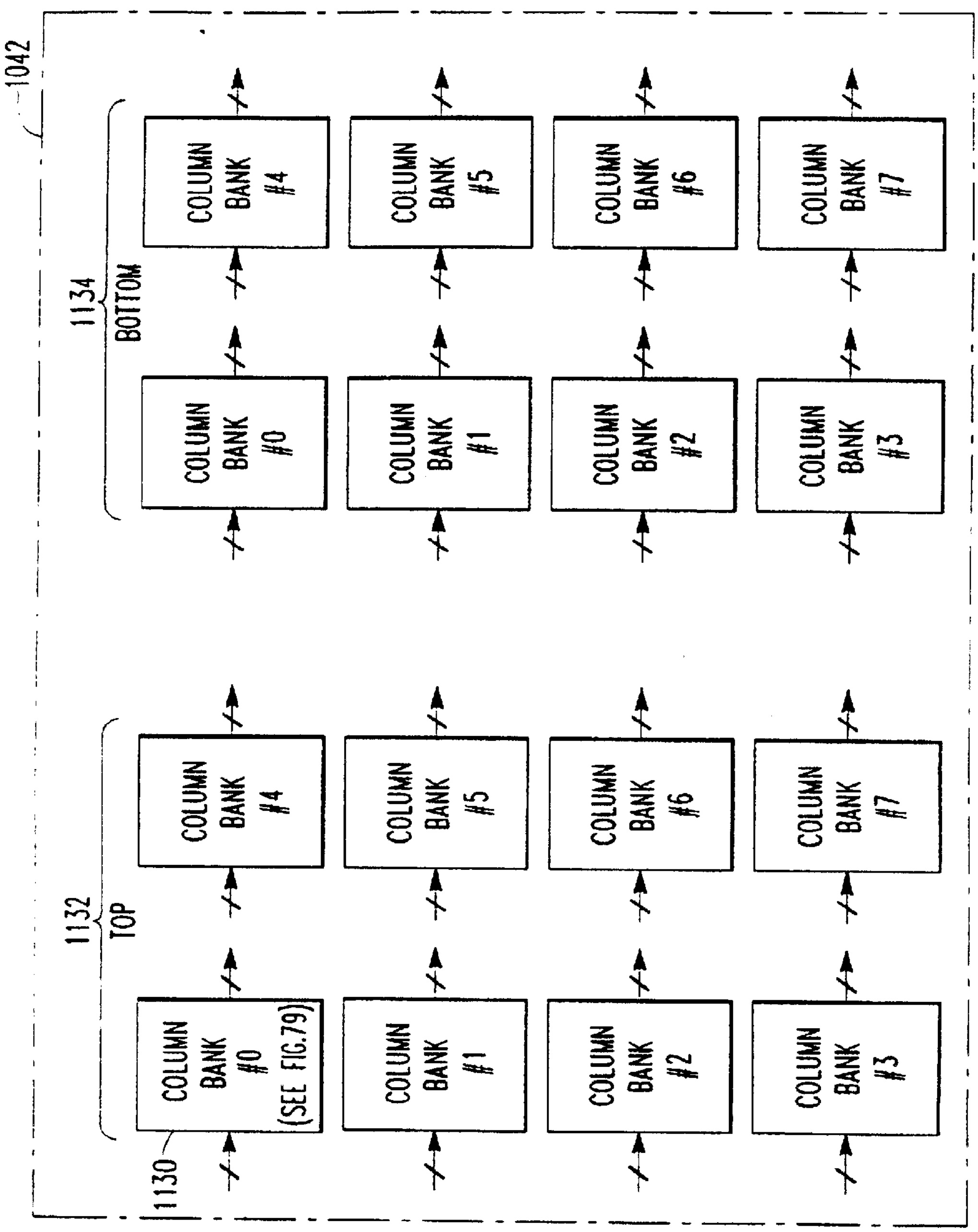
Figure 79:
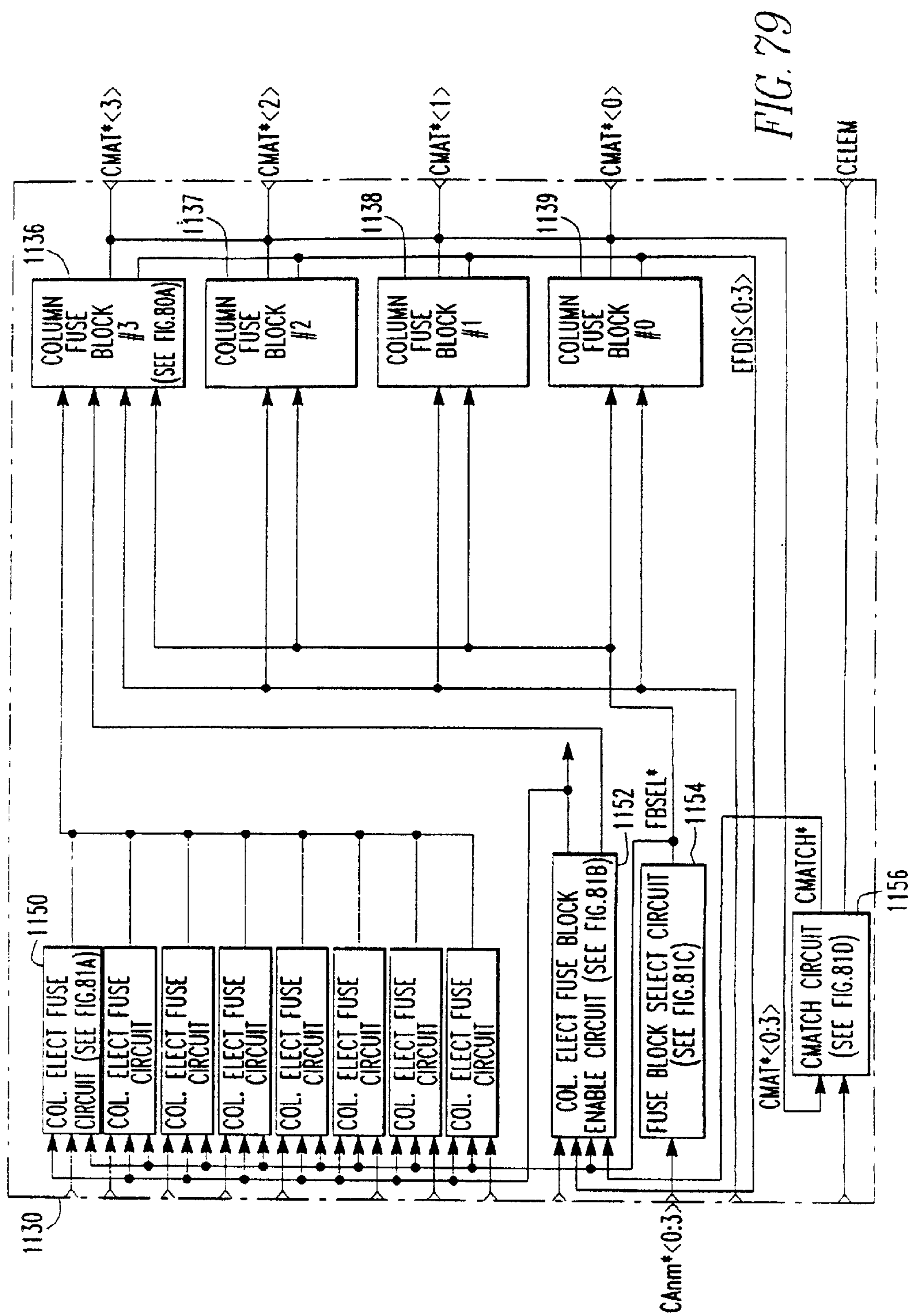
Figure 80A:
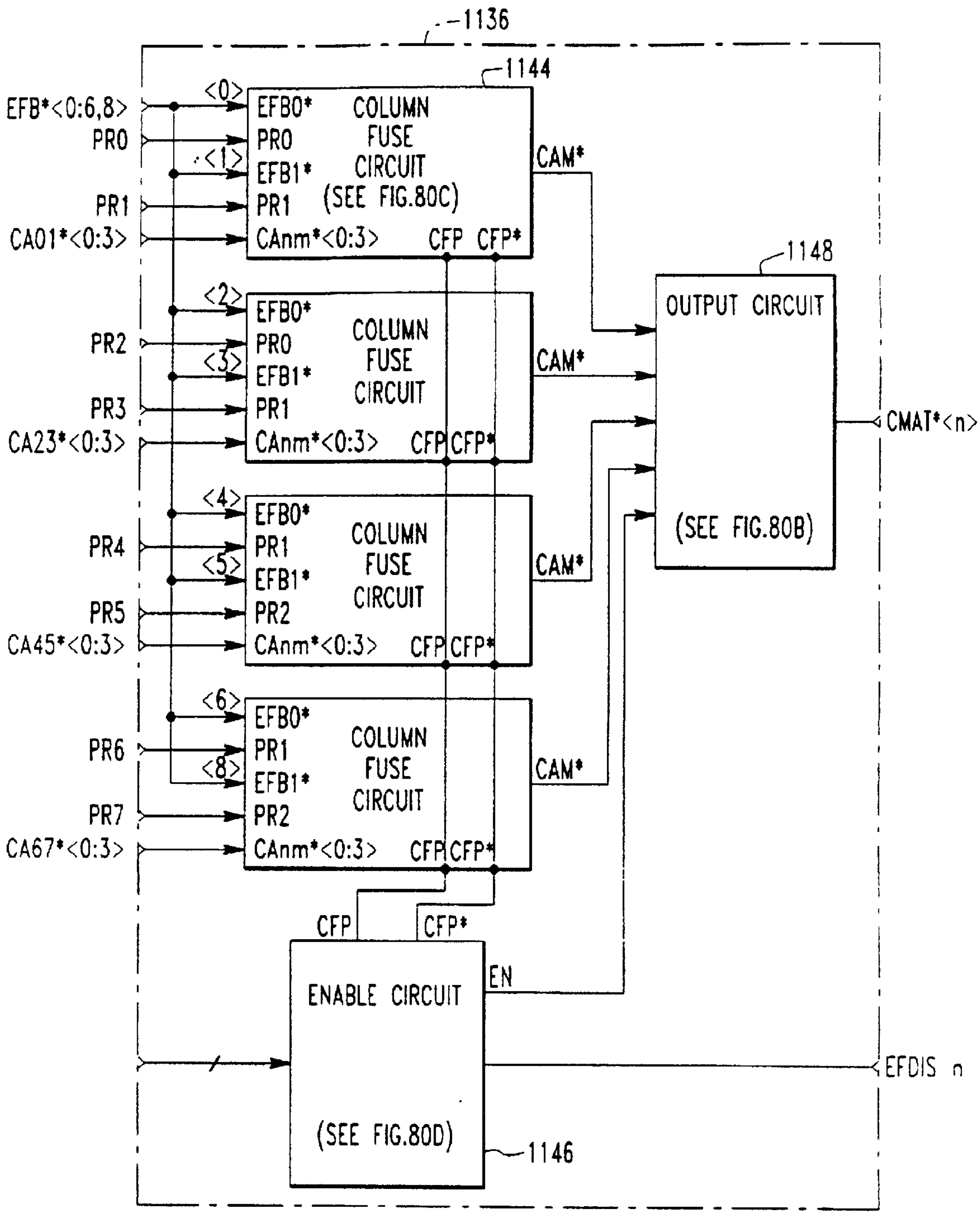
Figure 80B:
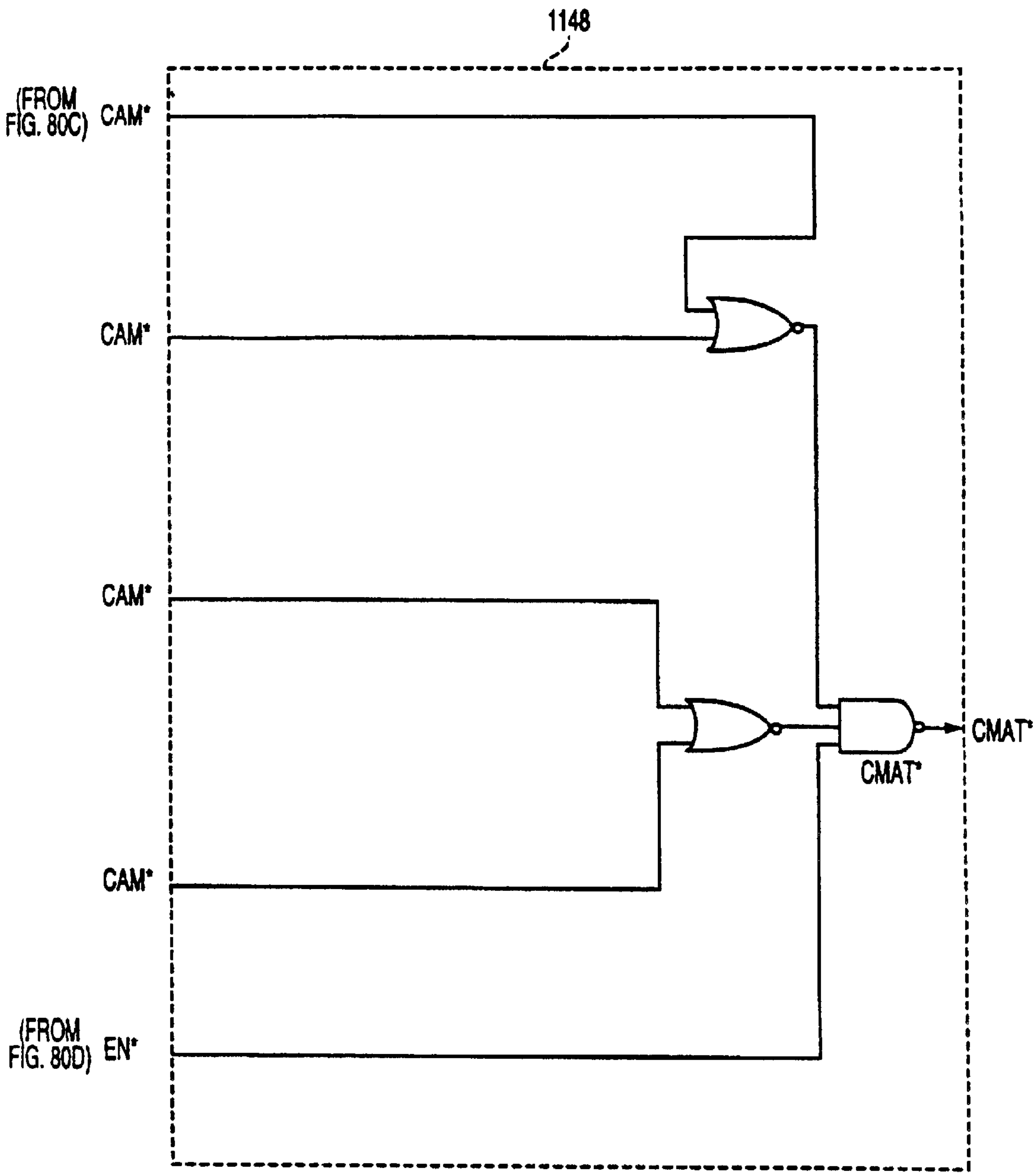
Figure 80C:
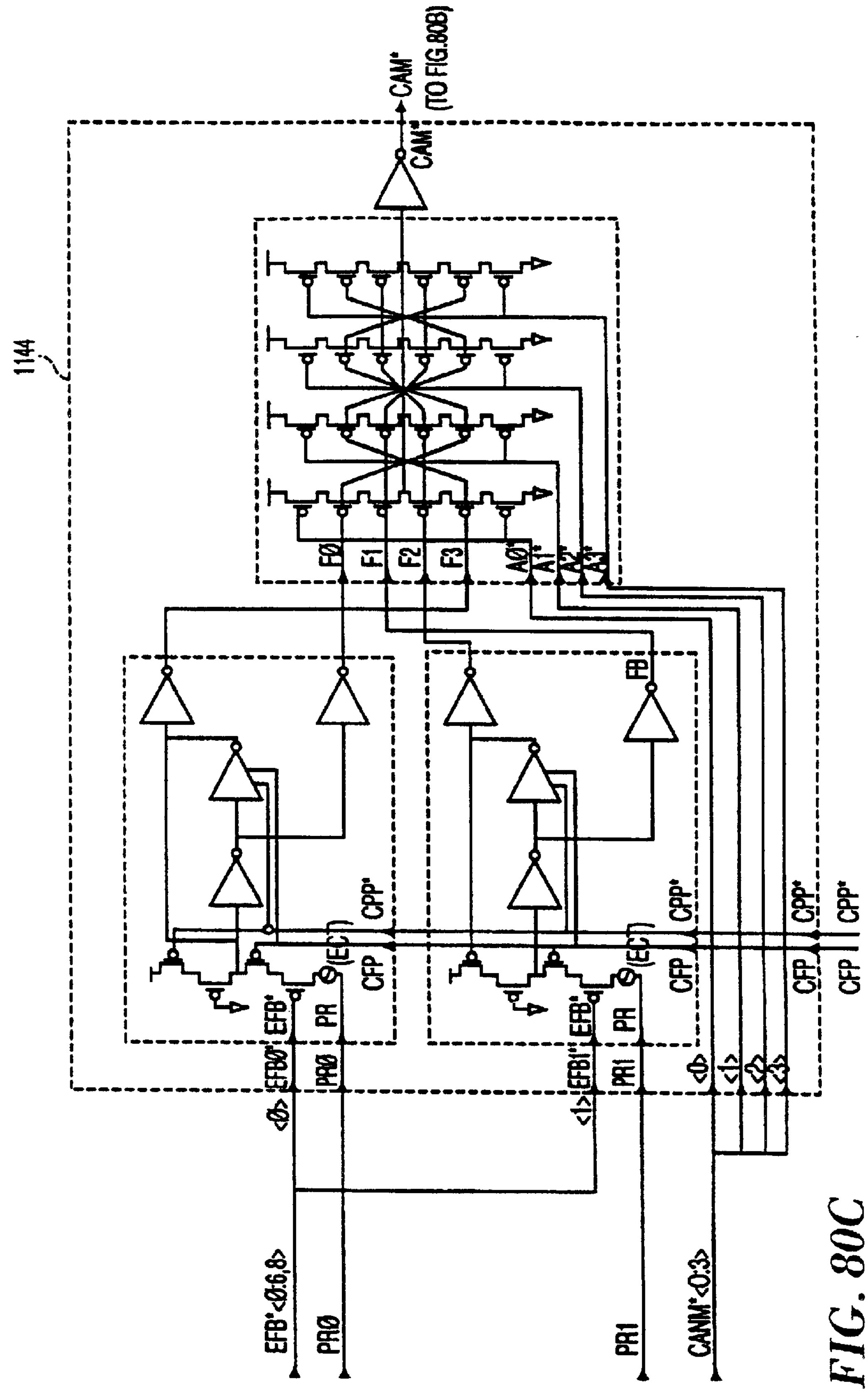
Figure 80D:
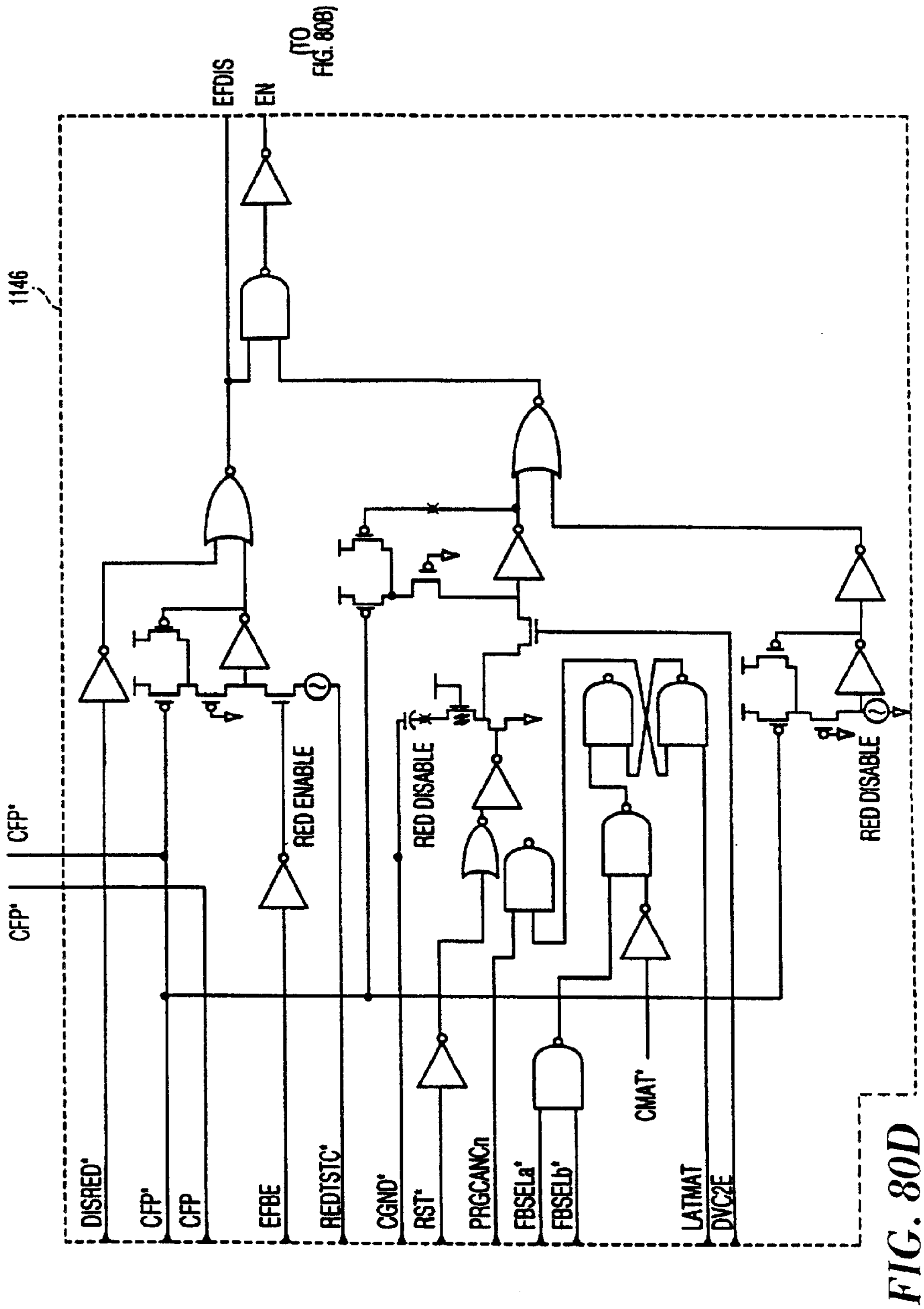
Figure 81A:
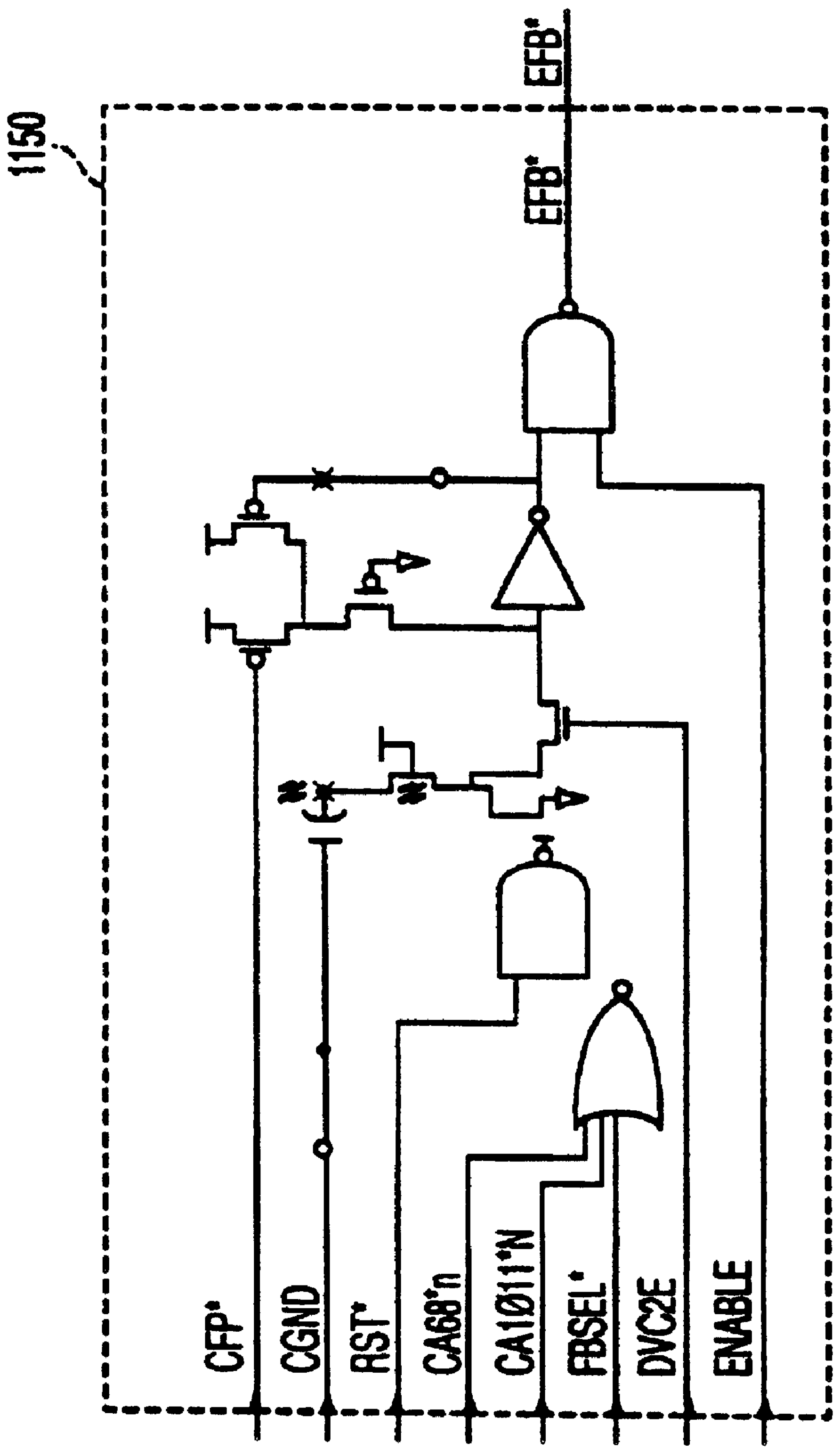
Figure 81B:
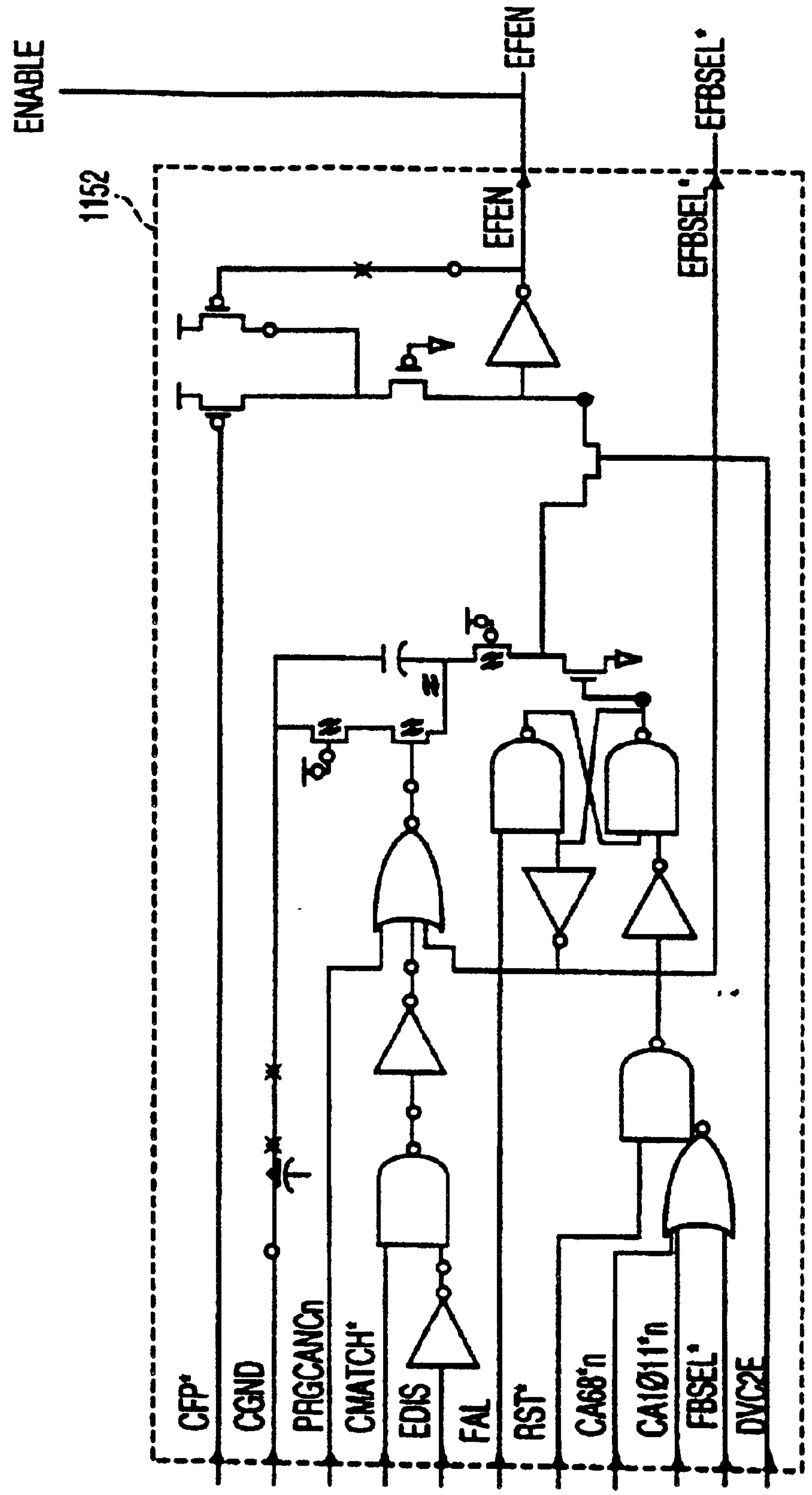
Figure 81C:
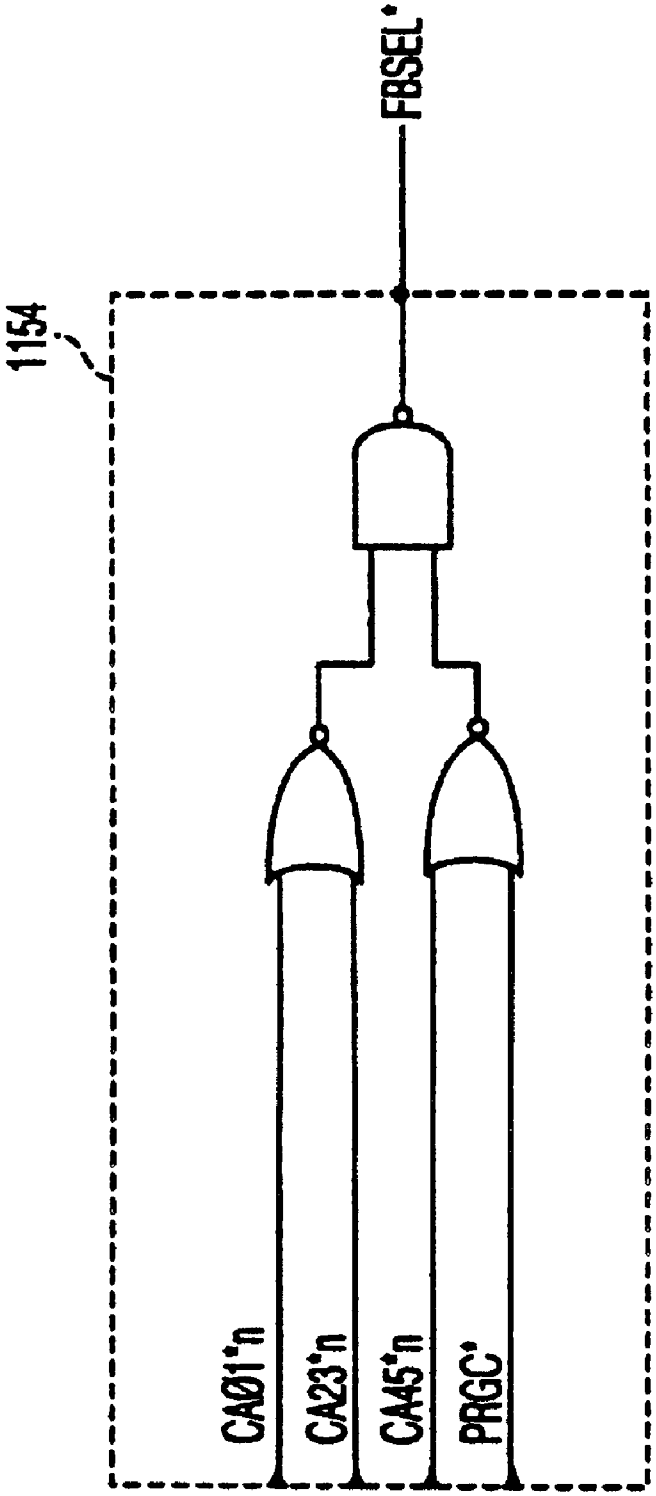
Figure 81D:
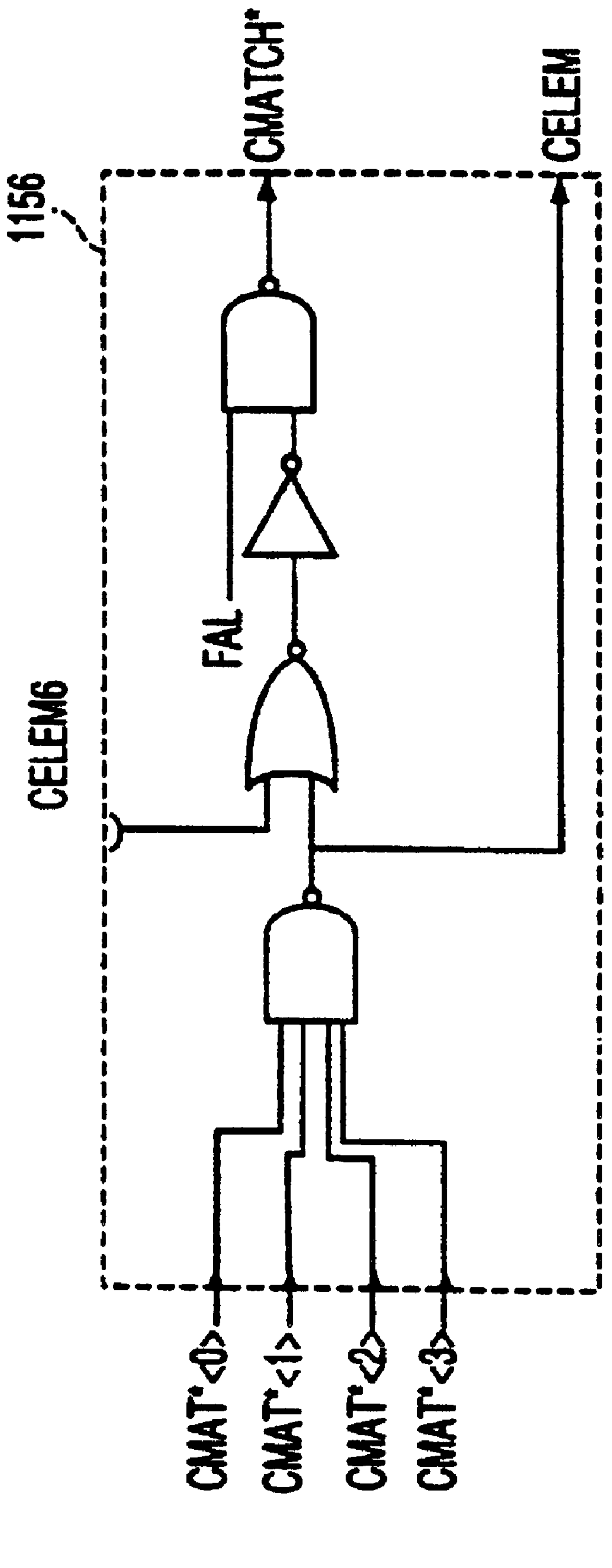
Figure 82:
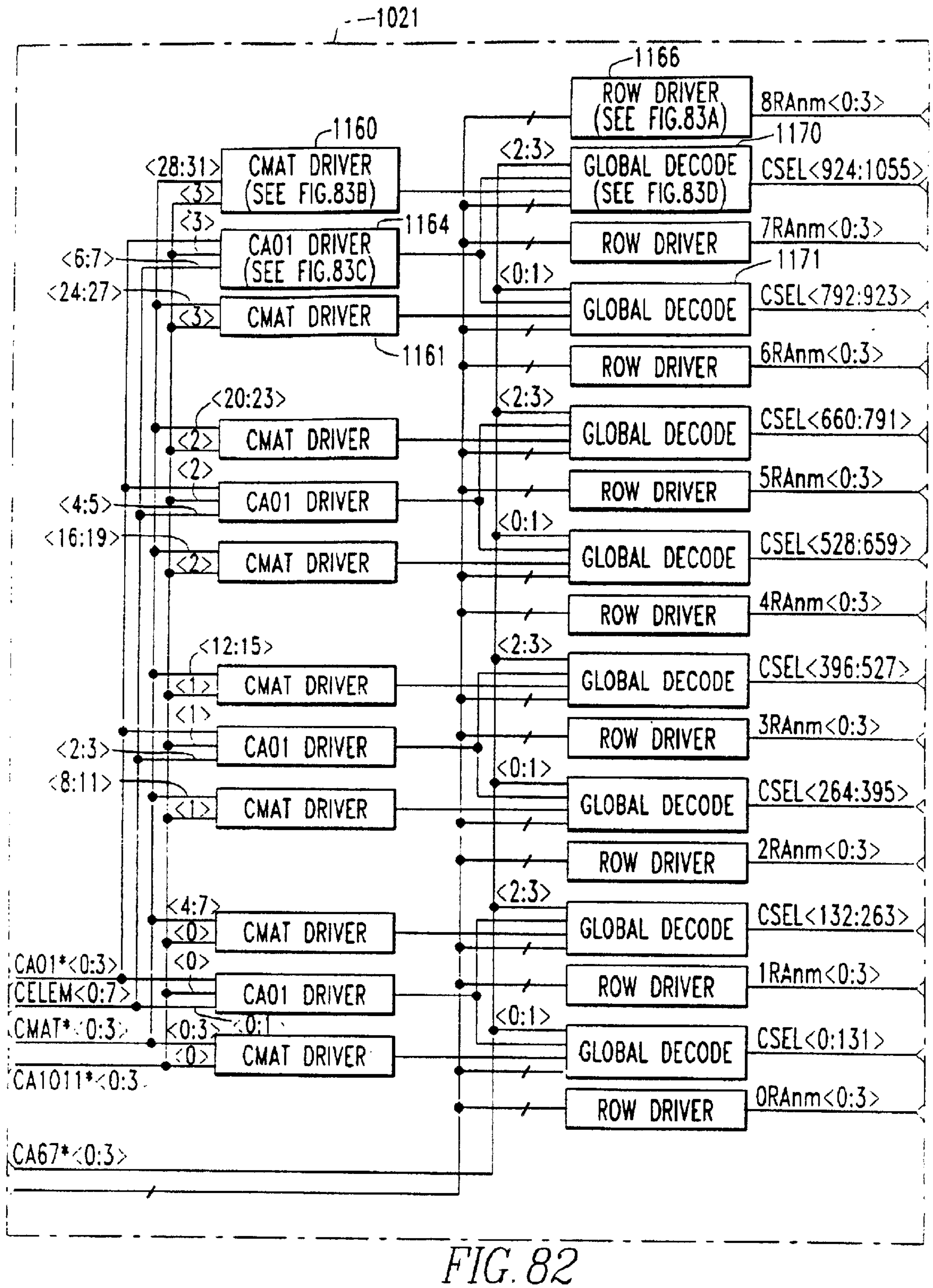
Figure 83A:
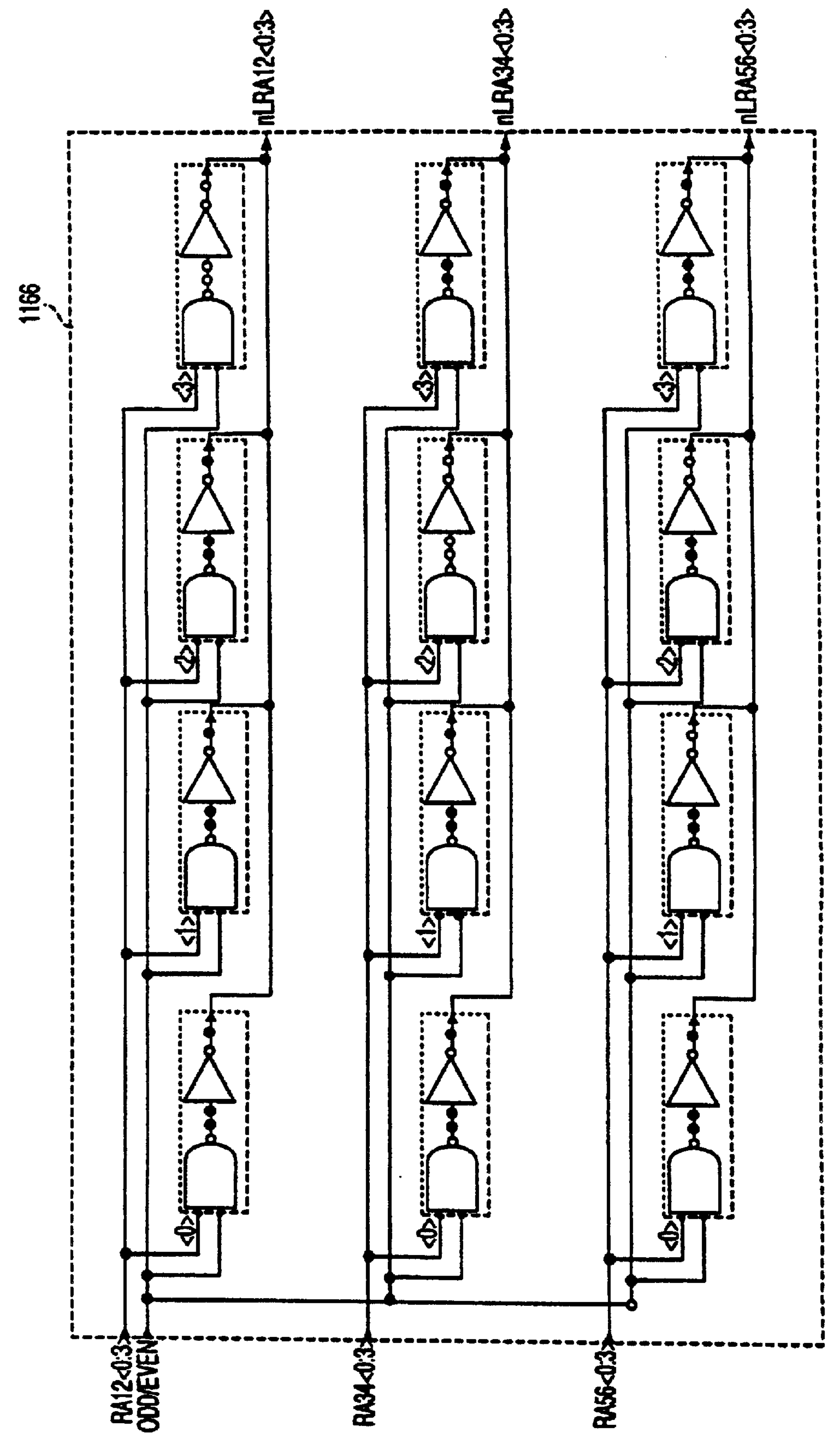
Figure 83B:
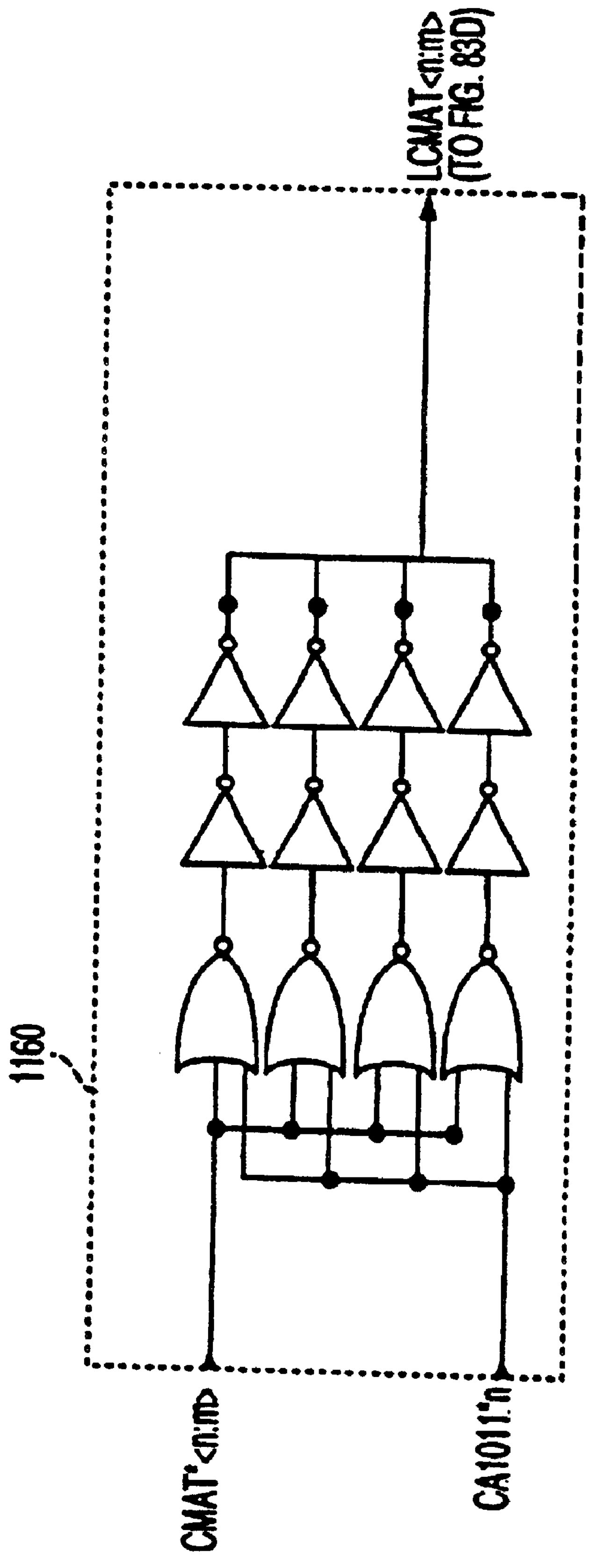
Figure 83C:
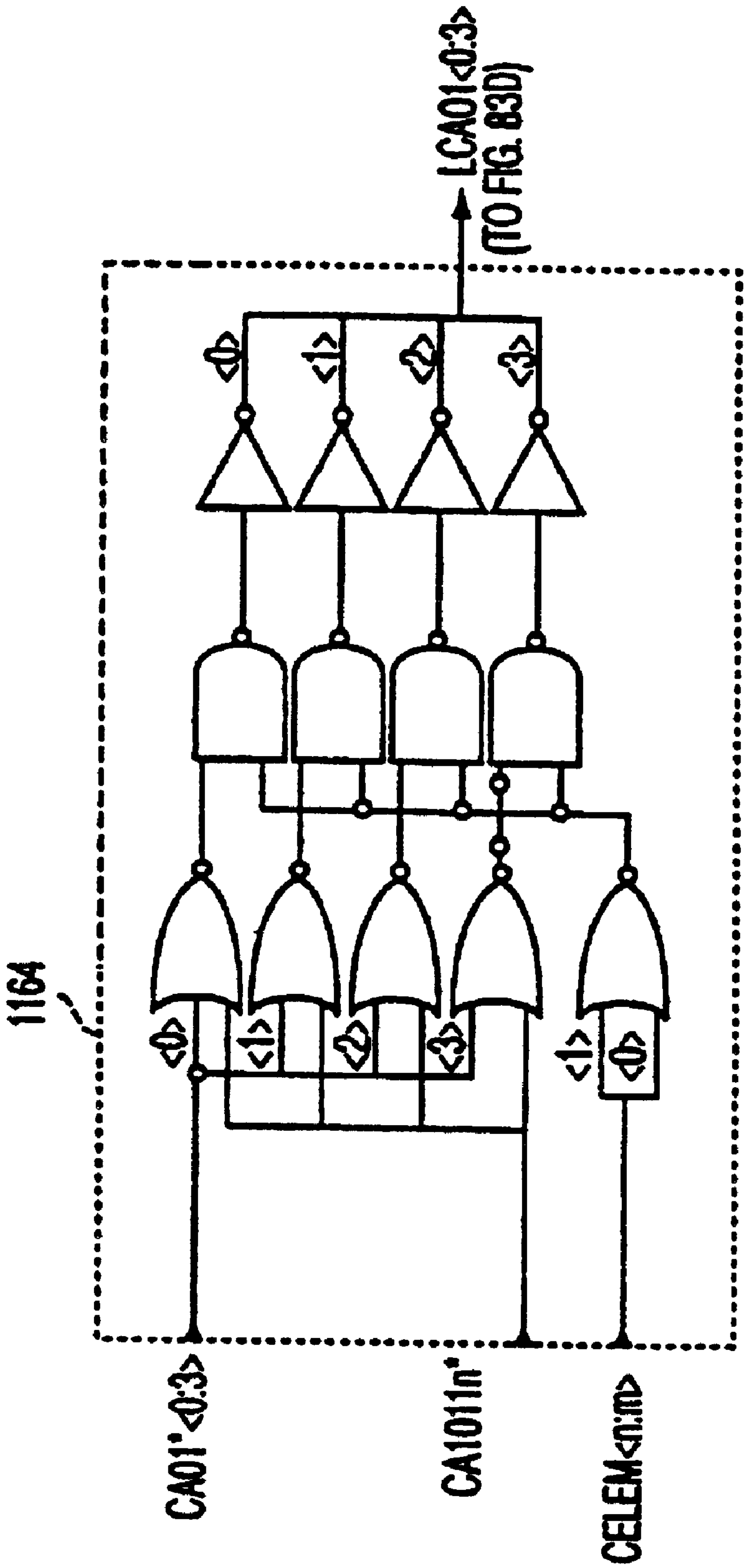
Figure 83D:
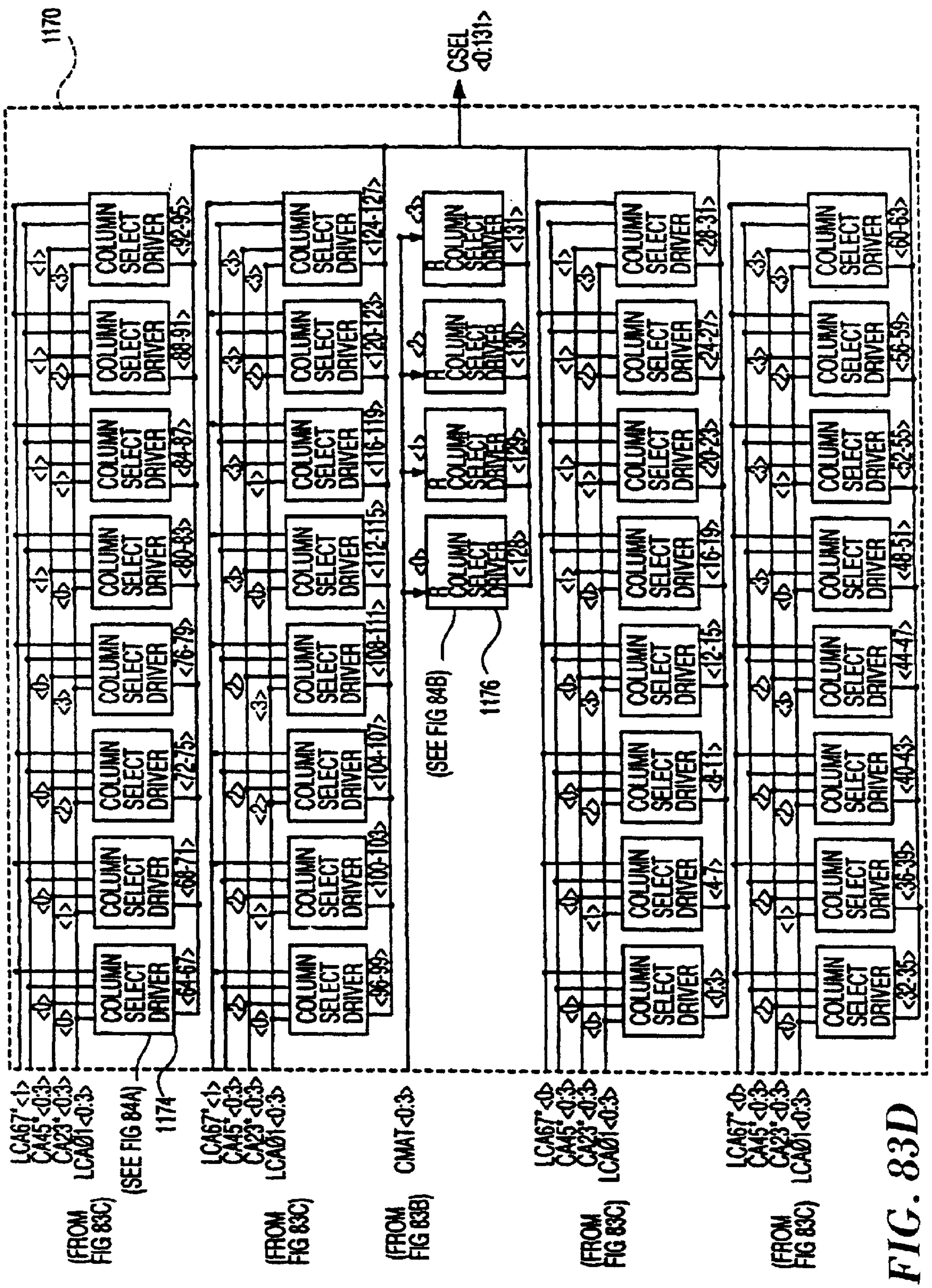
Figure 84A:
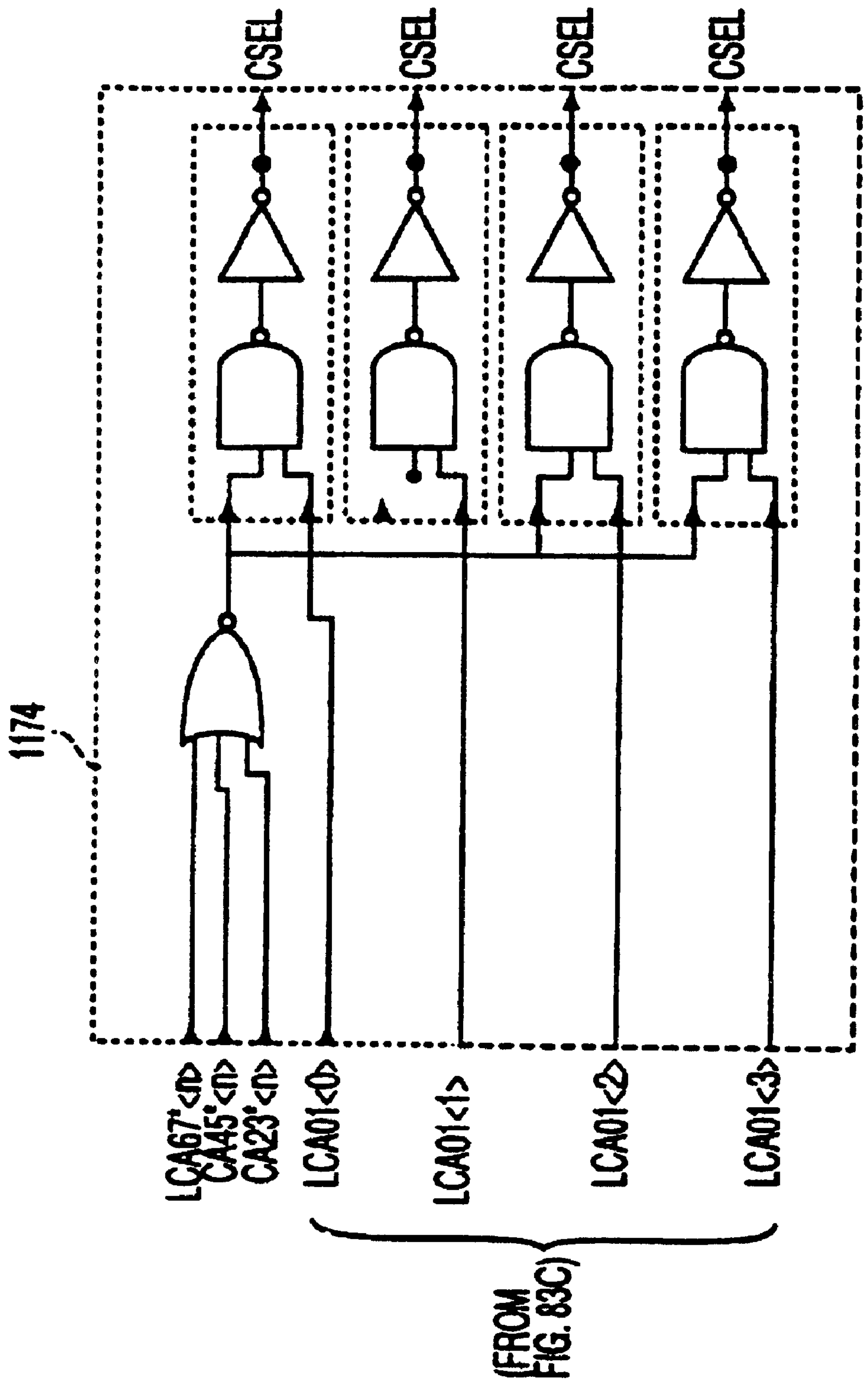
Figure 84B:
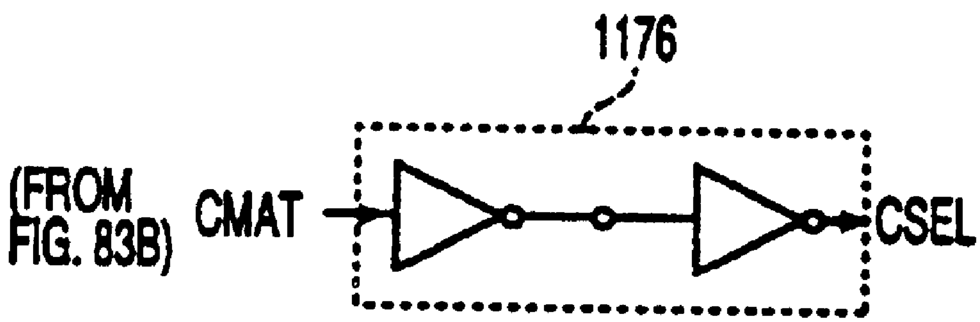
Figure 85:
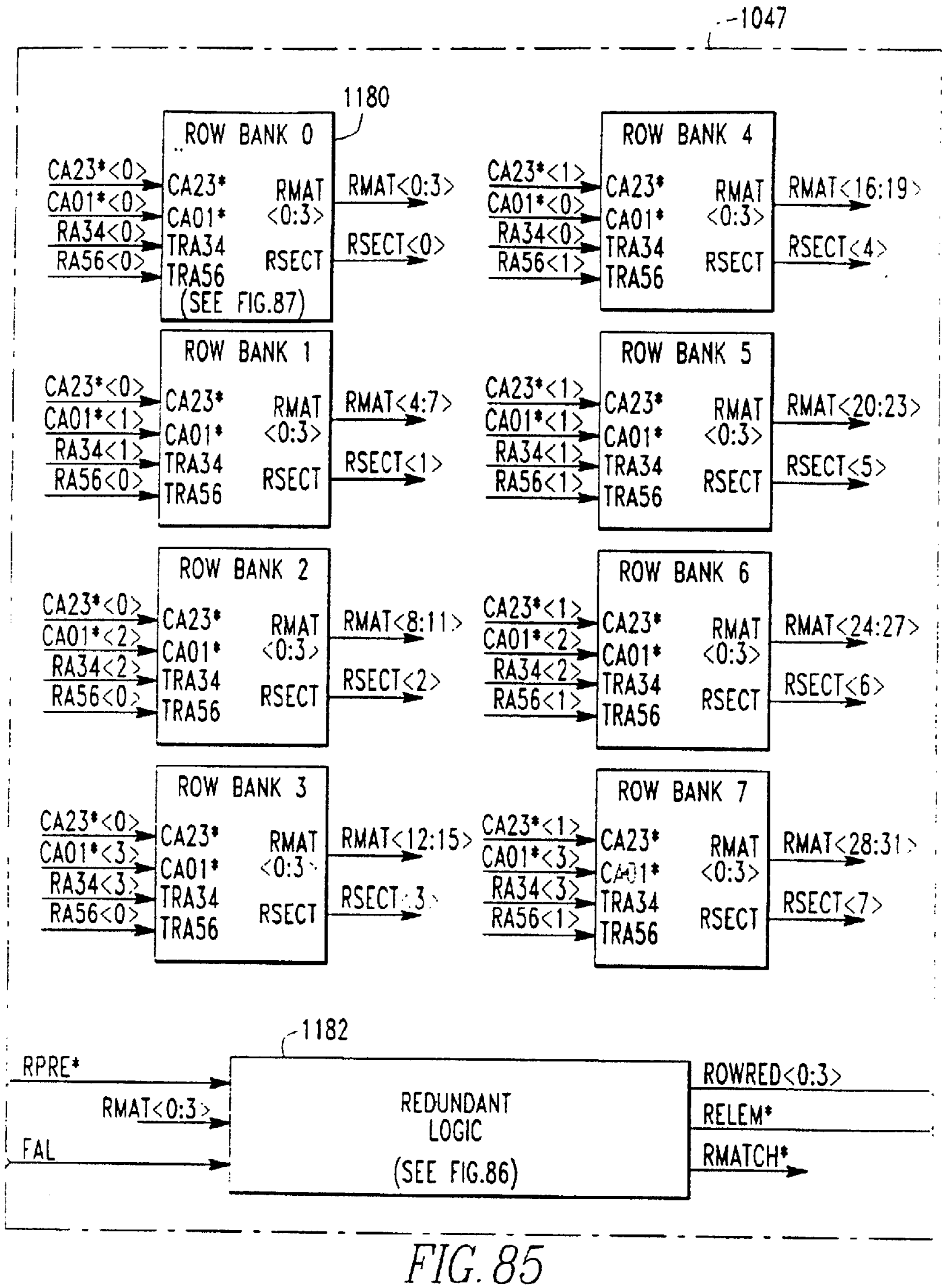
Figure 86:
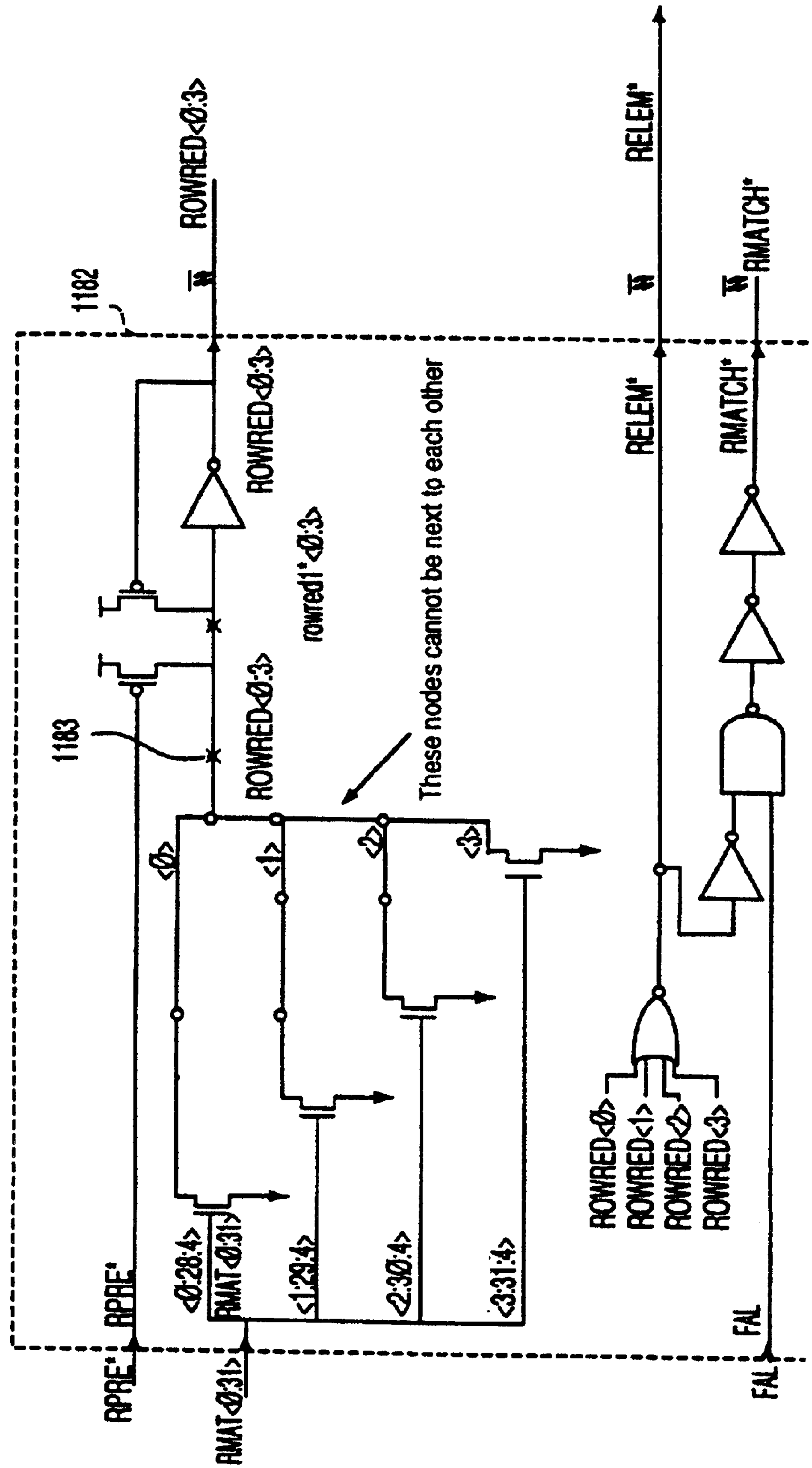
Figure 87:
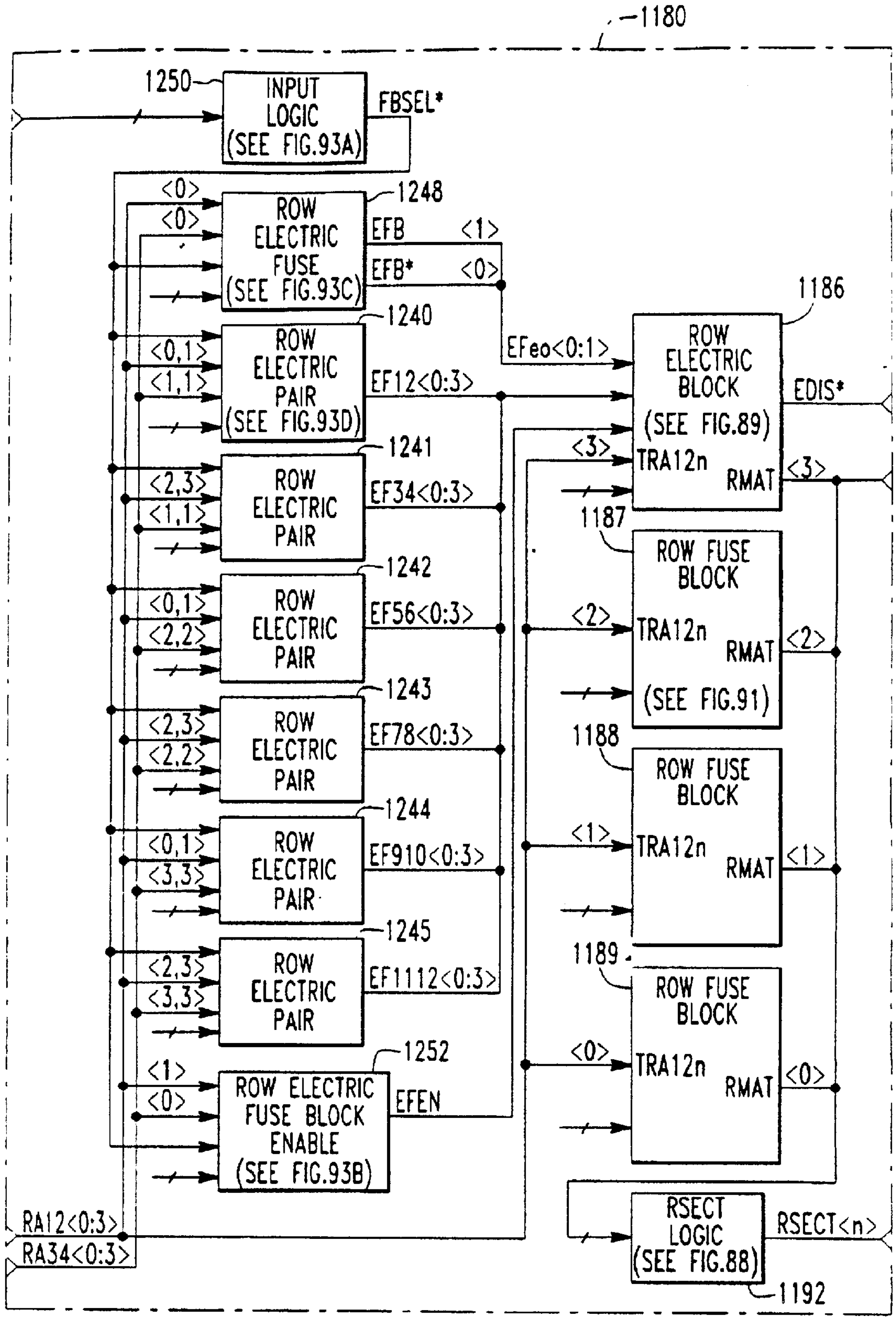
Figure 88:
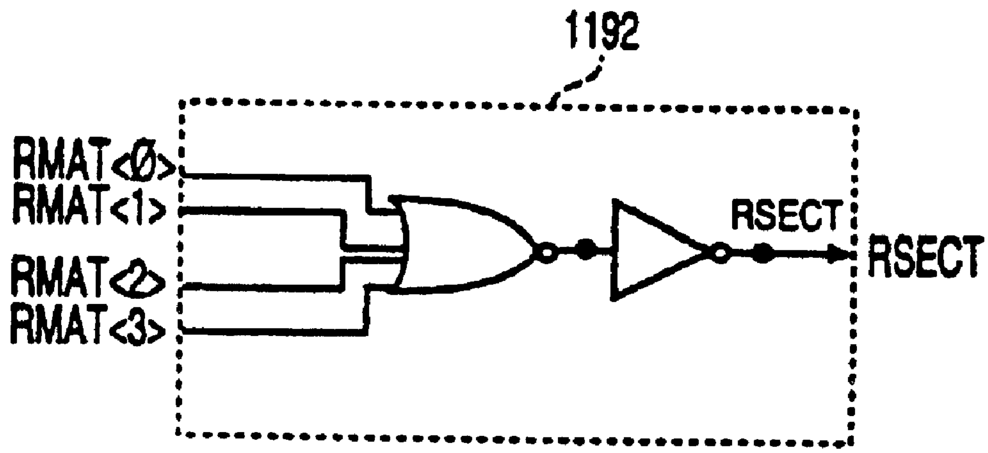
Figure 89:
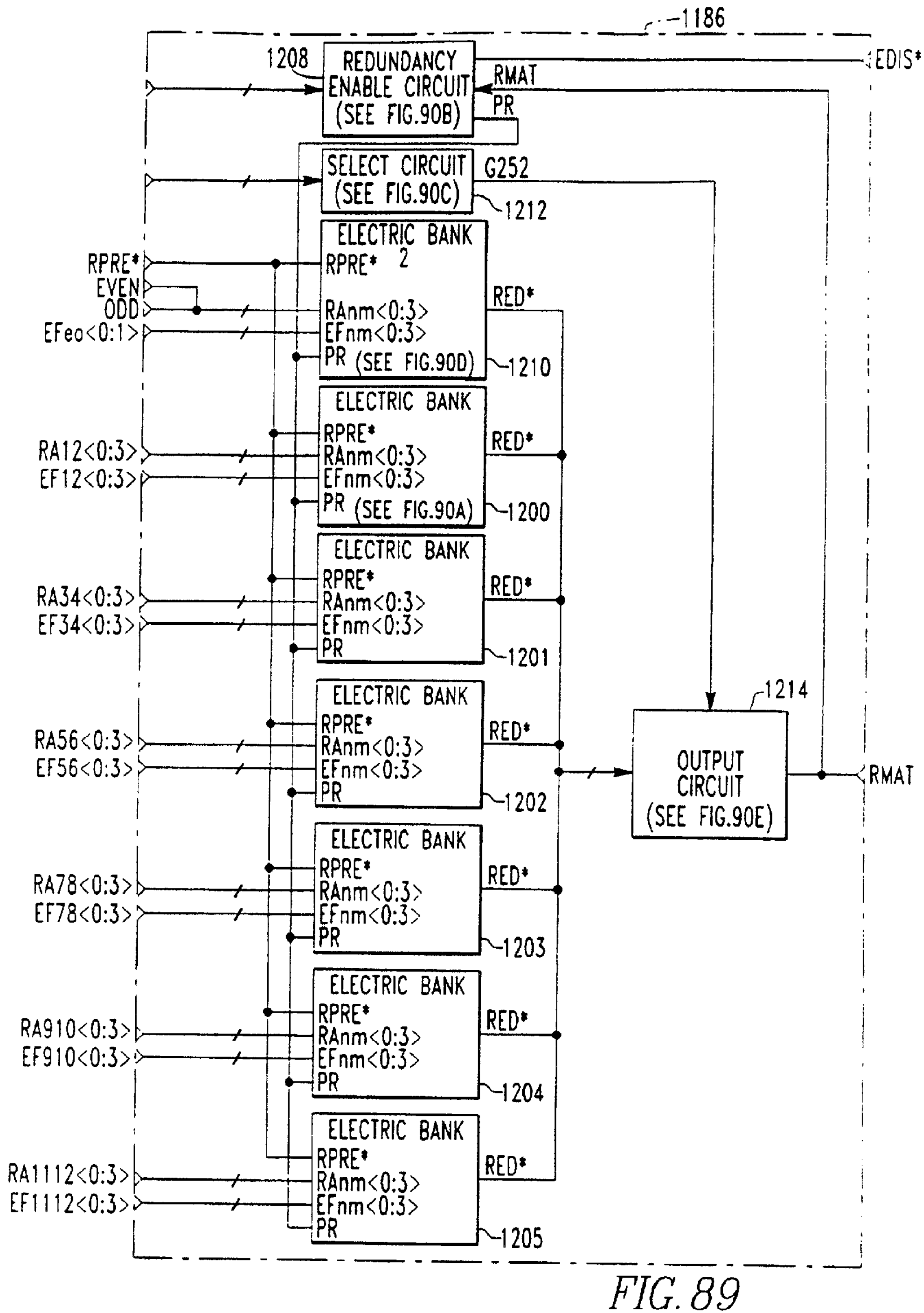
Figure 90A:
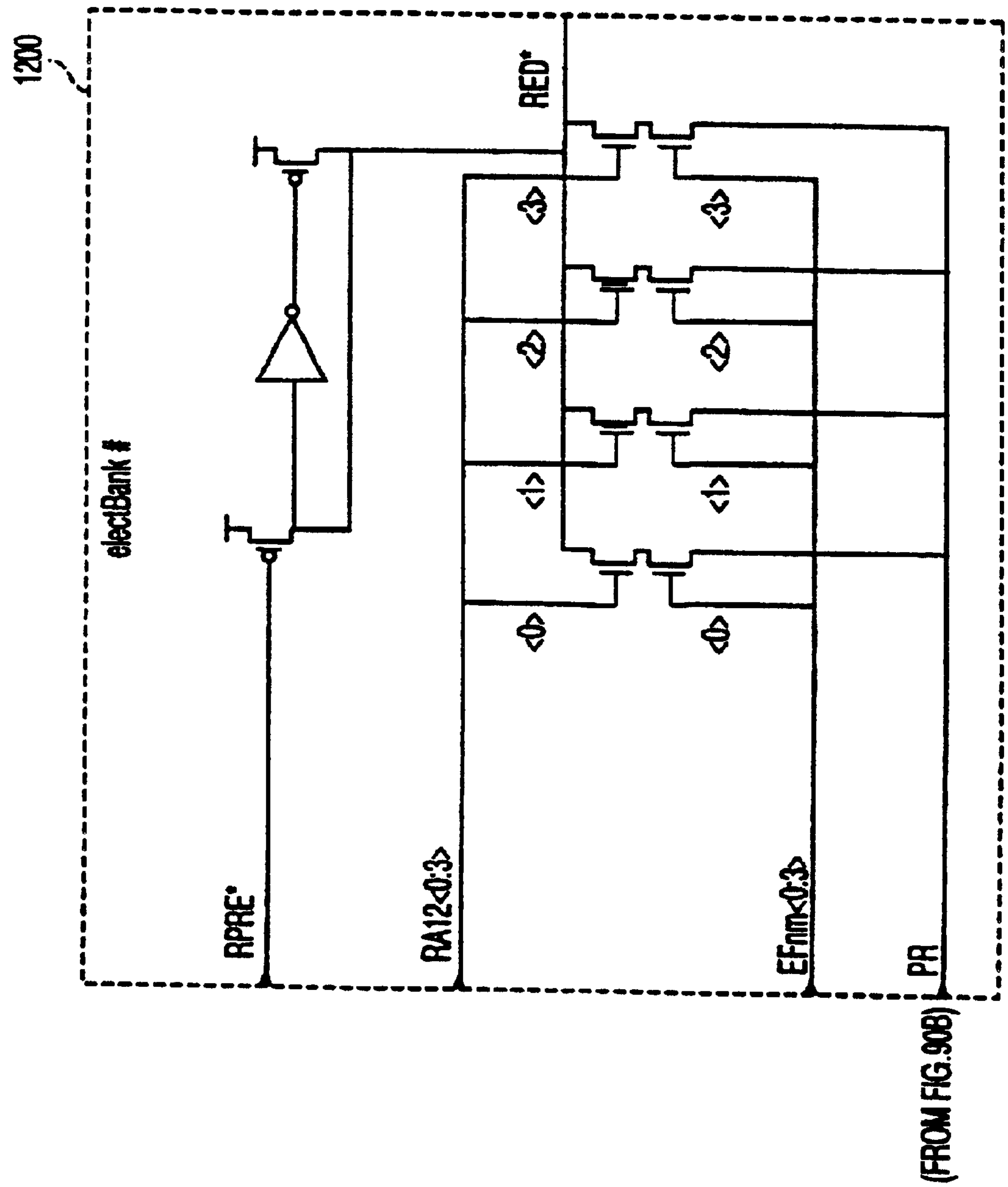
Figure 90B:
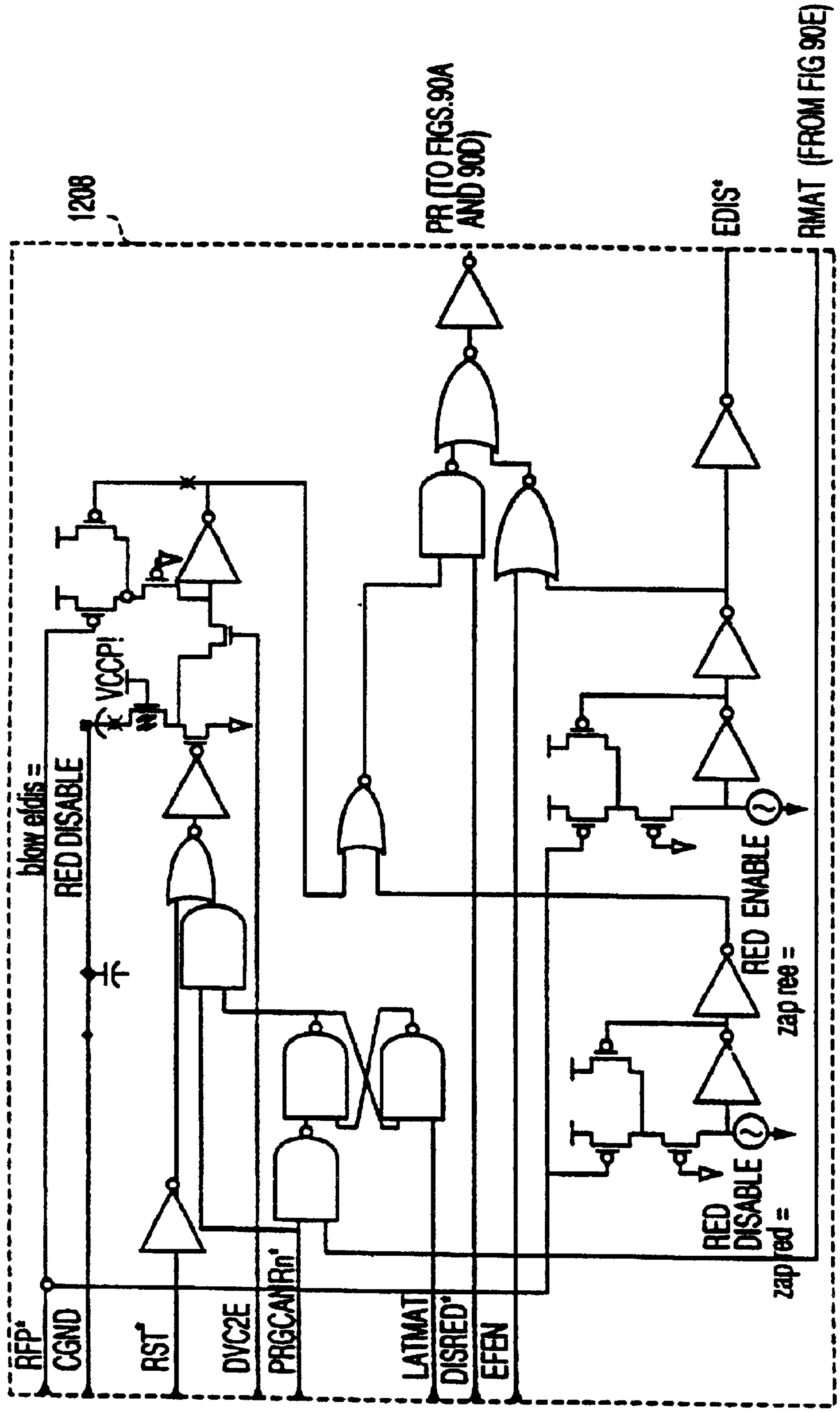
Figure 90C:
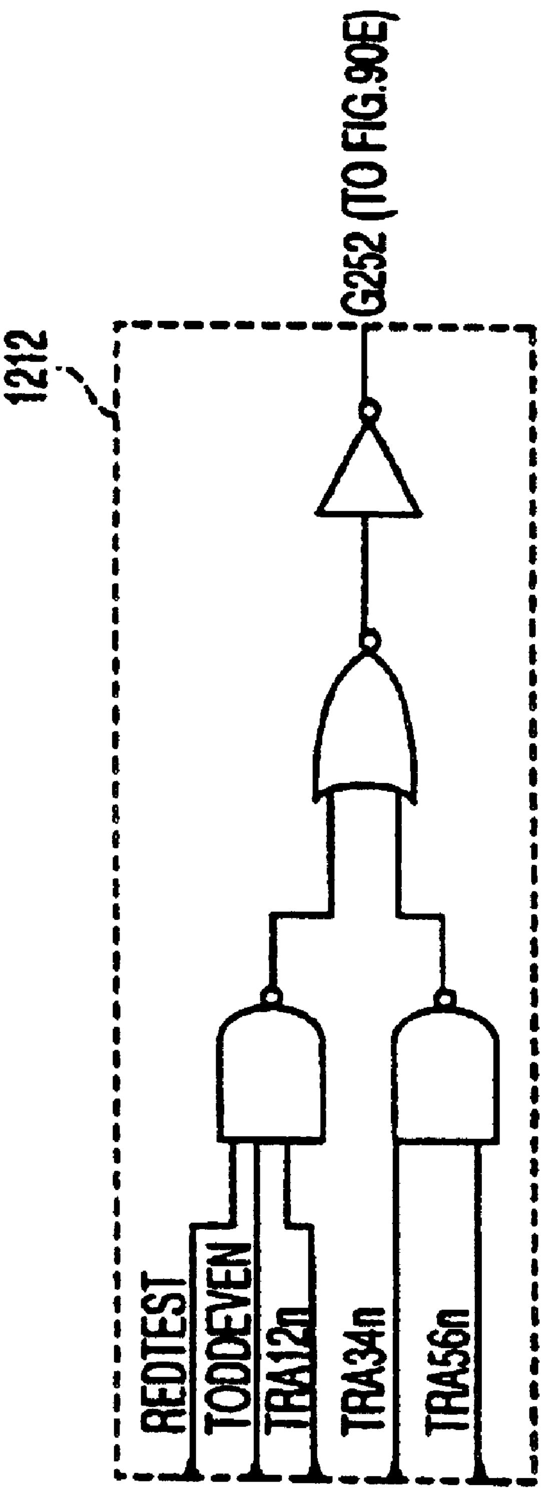
Figure 90D:
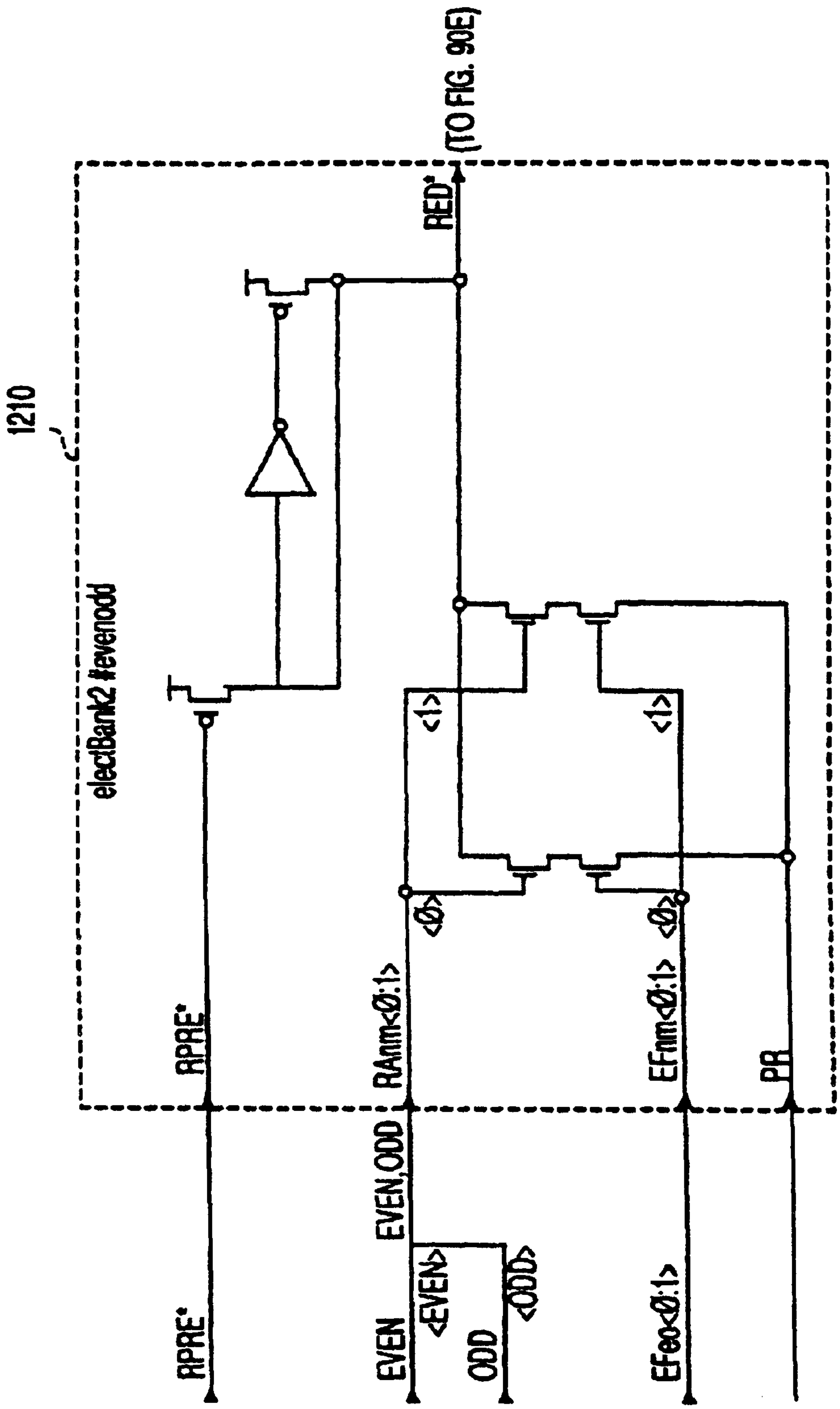
Figure 90E:
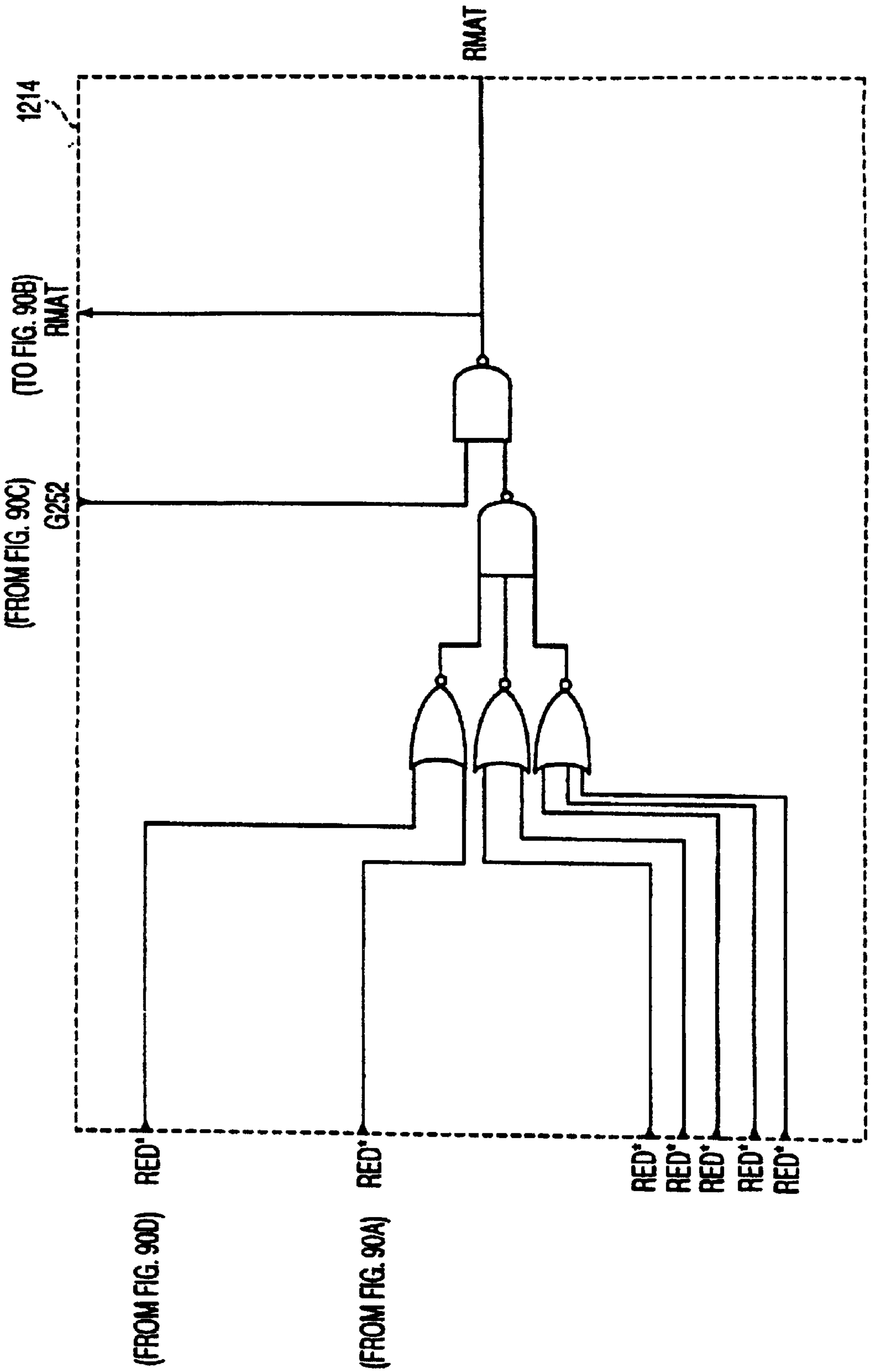
Figure 91:
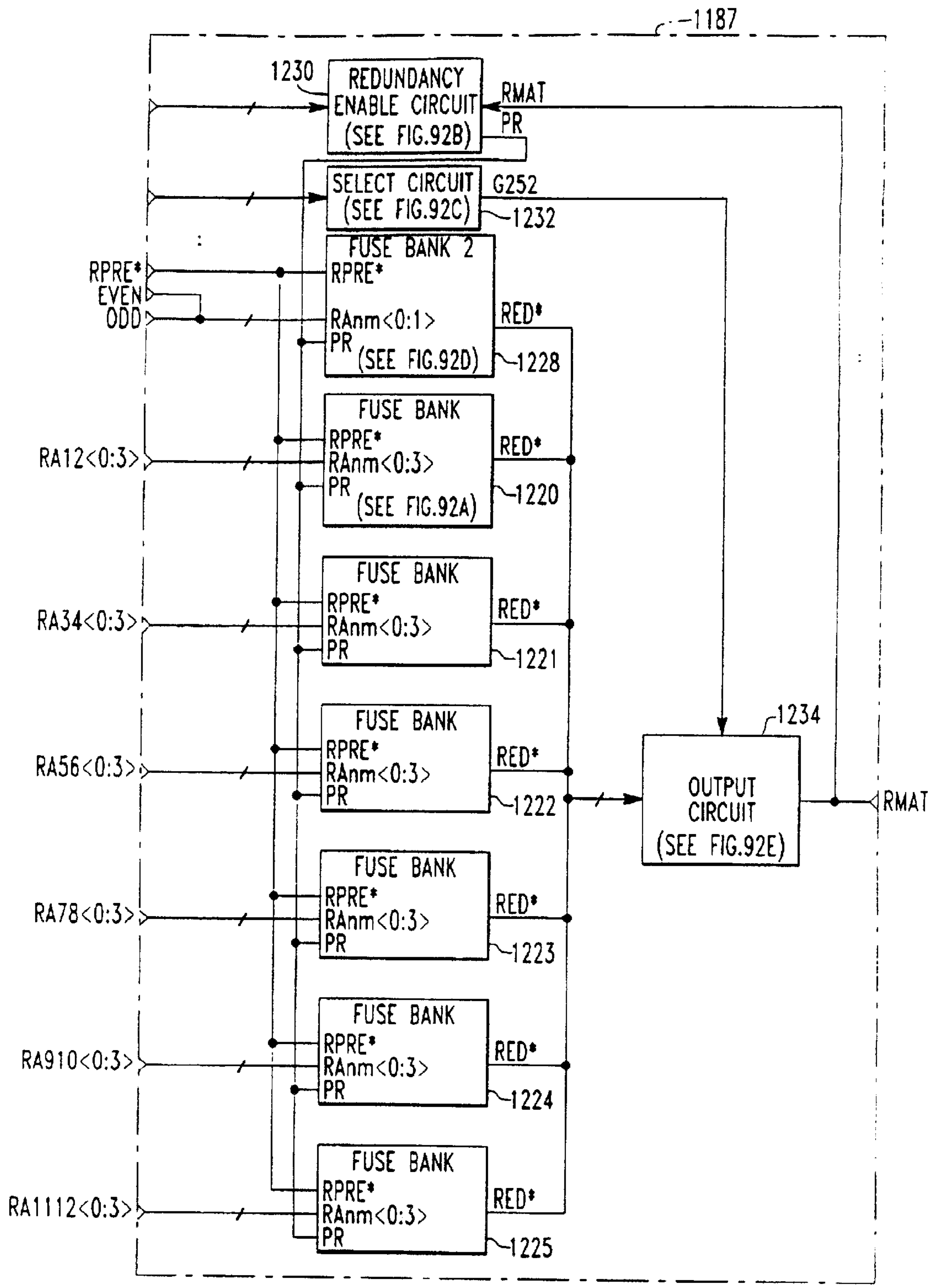
Figure 92A:
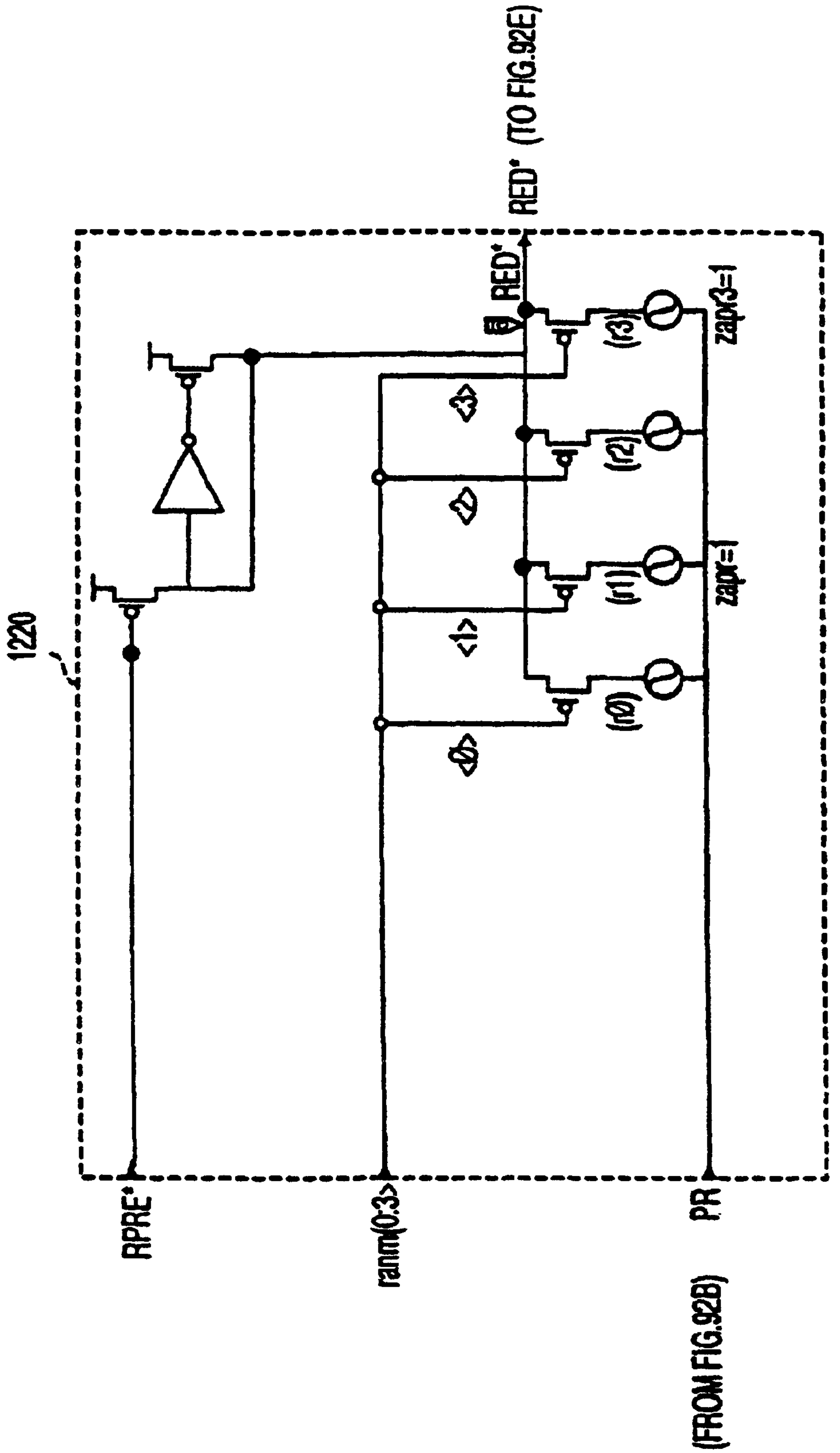
Figure 92B:
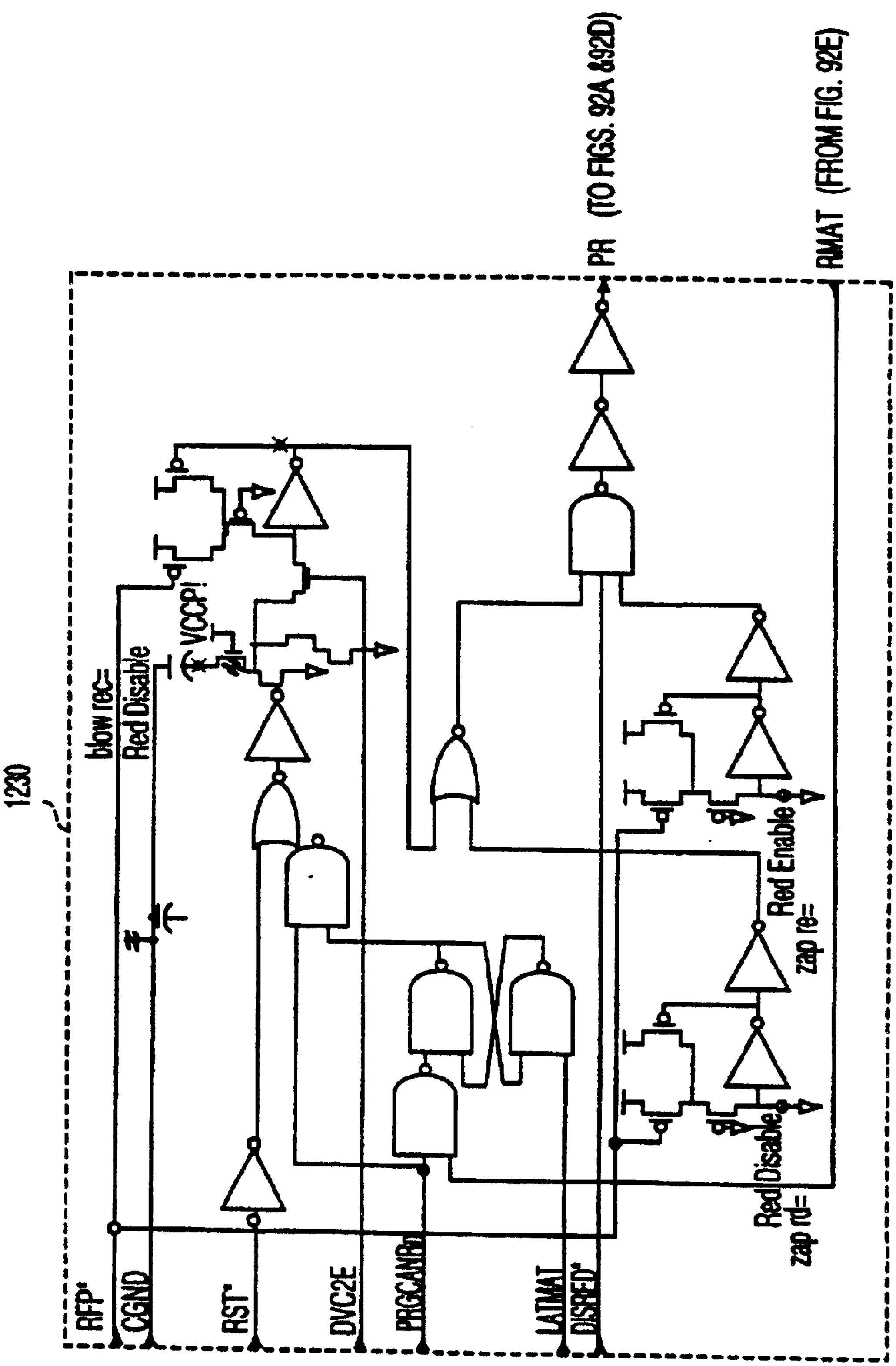
Figure 92C:
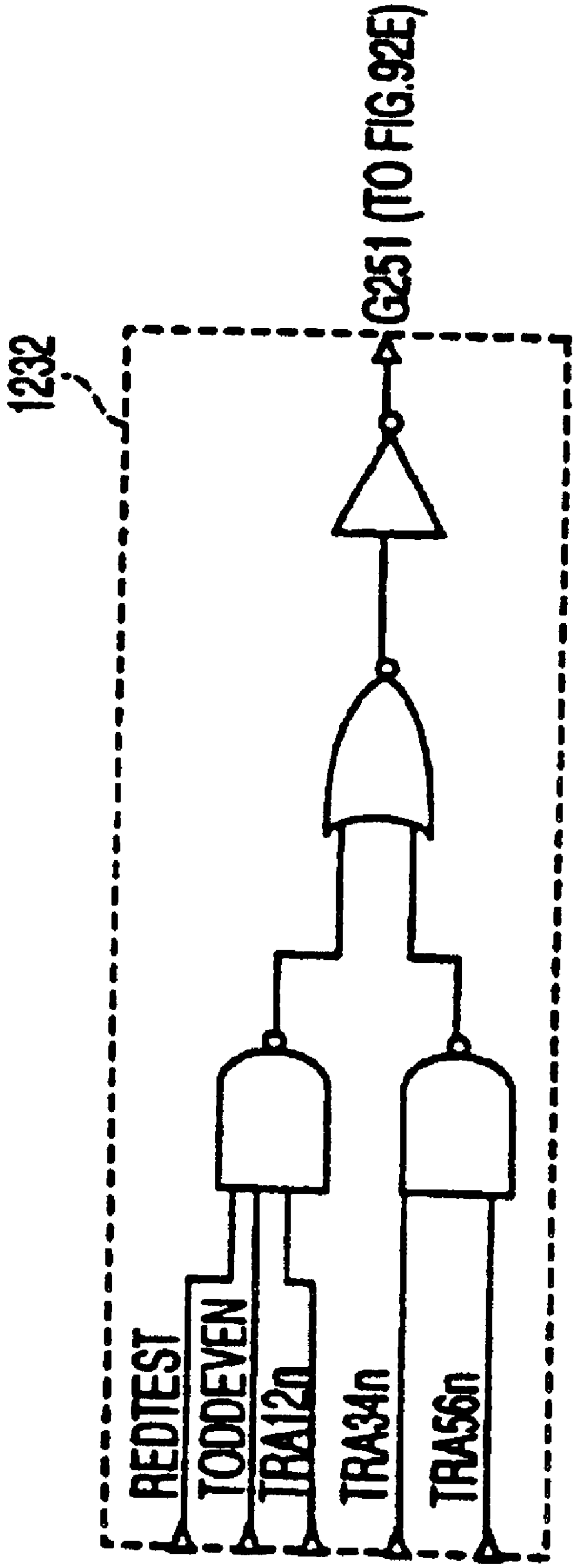
Figure 92D:
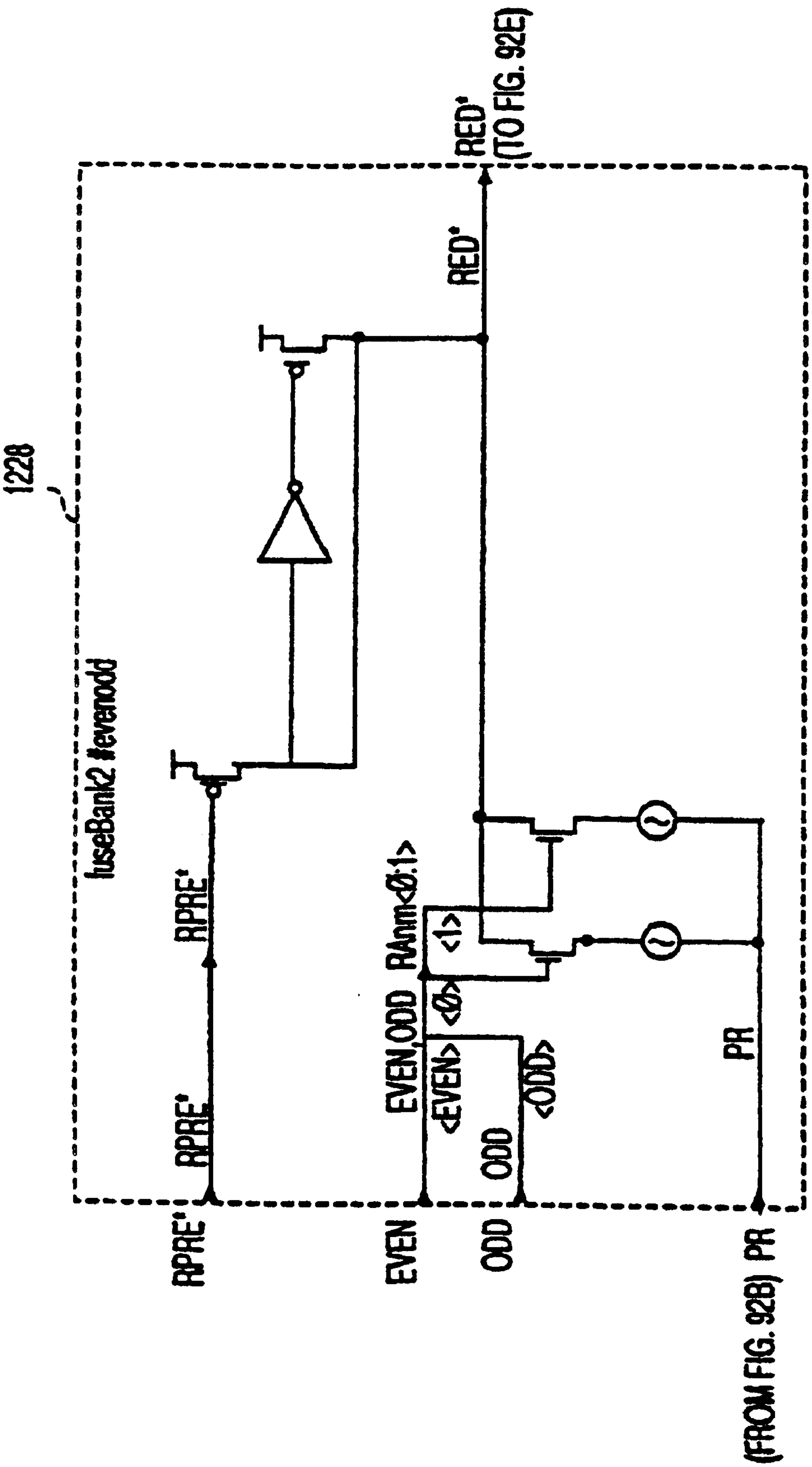
Figure 92E:
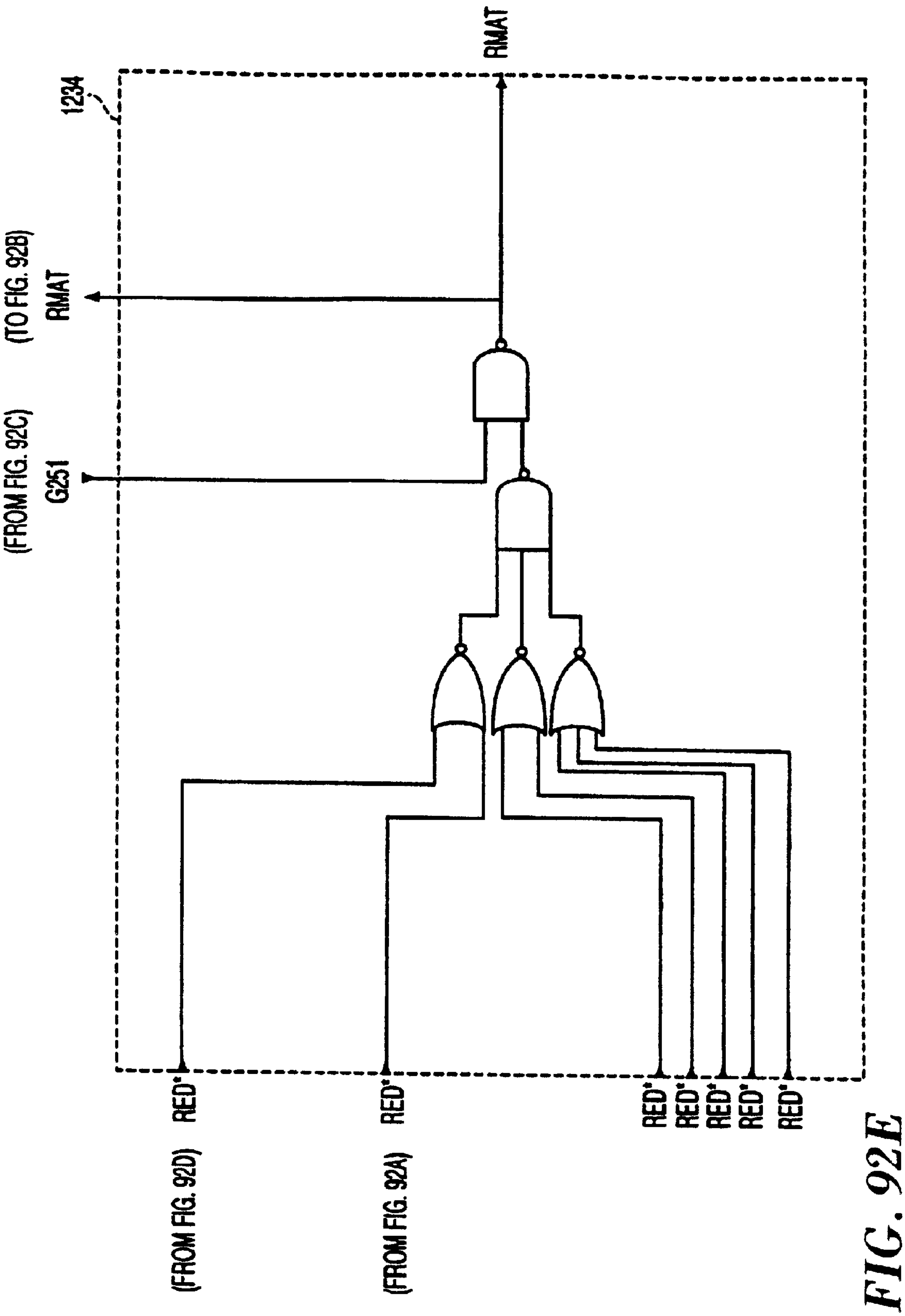
Figure 93A:
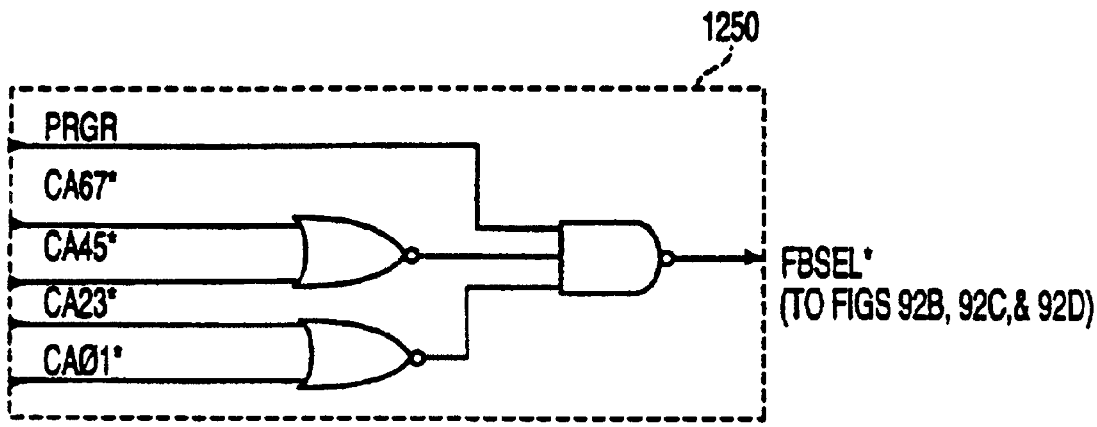
Figure 93B:
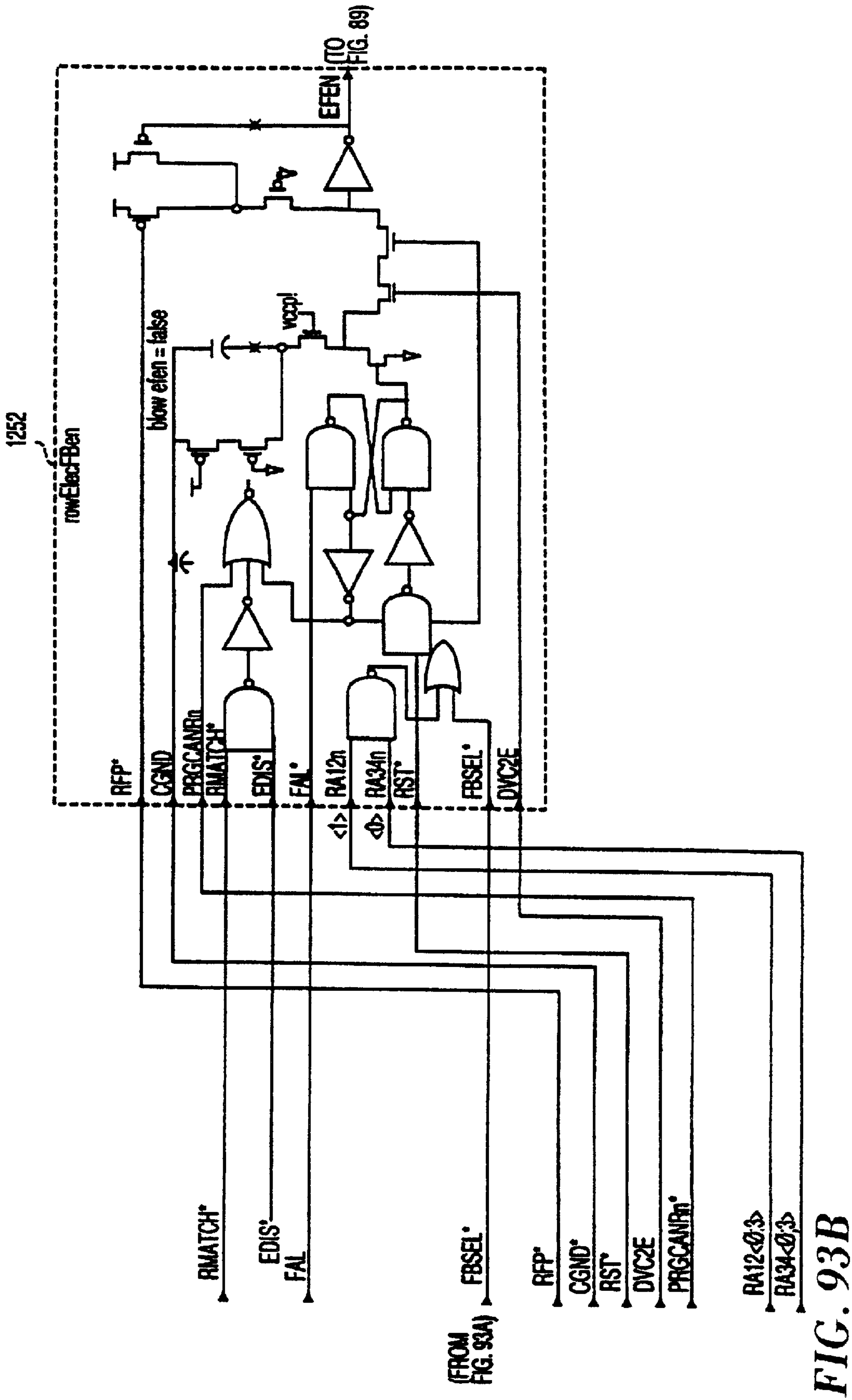
Figure 93C:
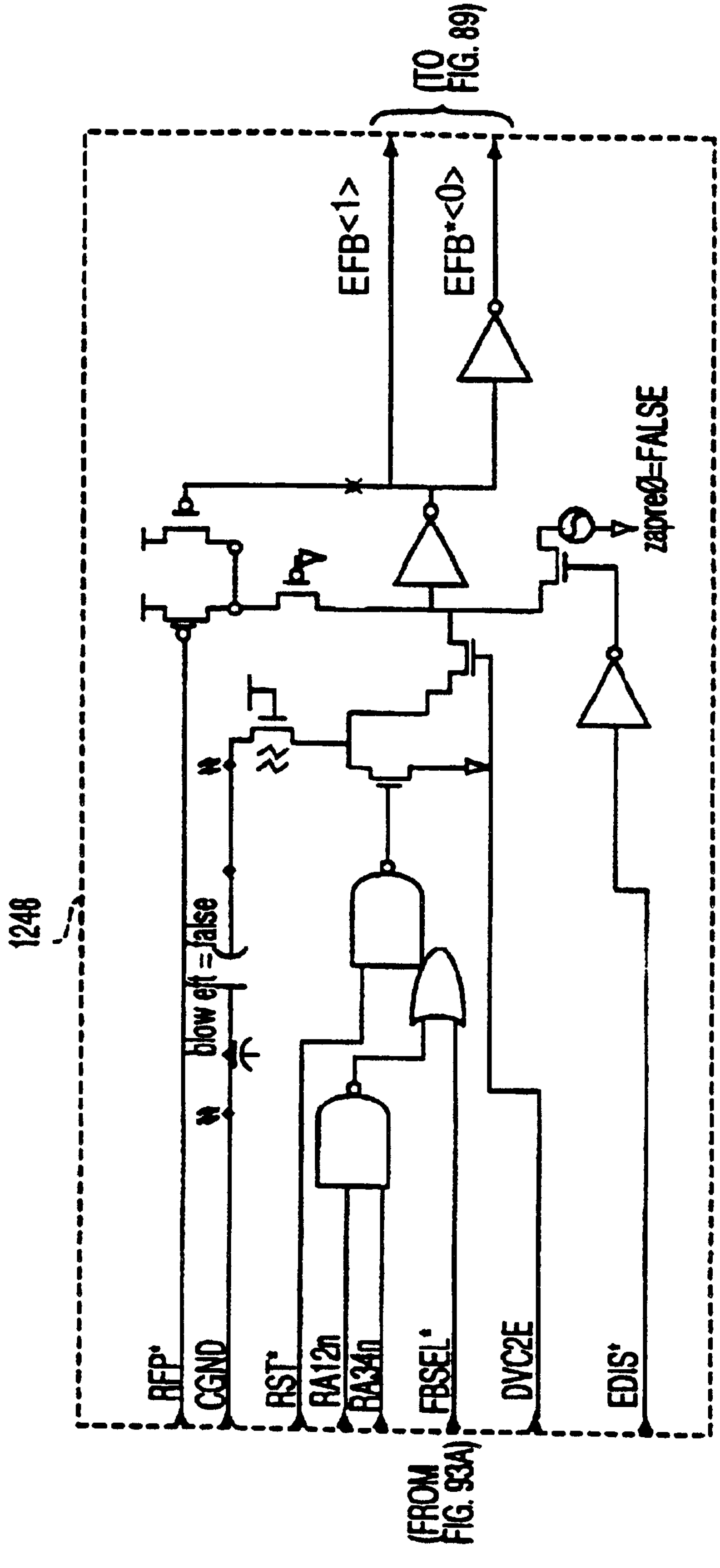
Figure 93D:
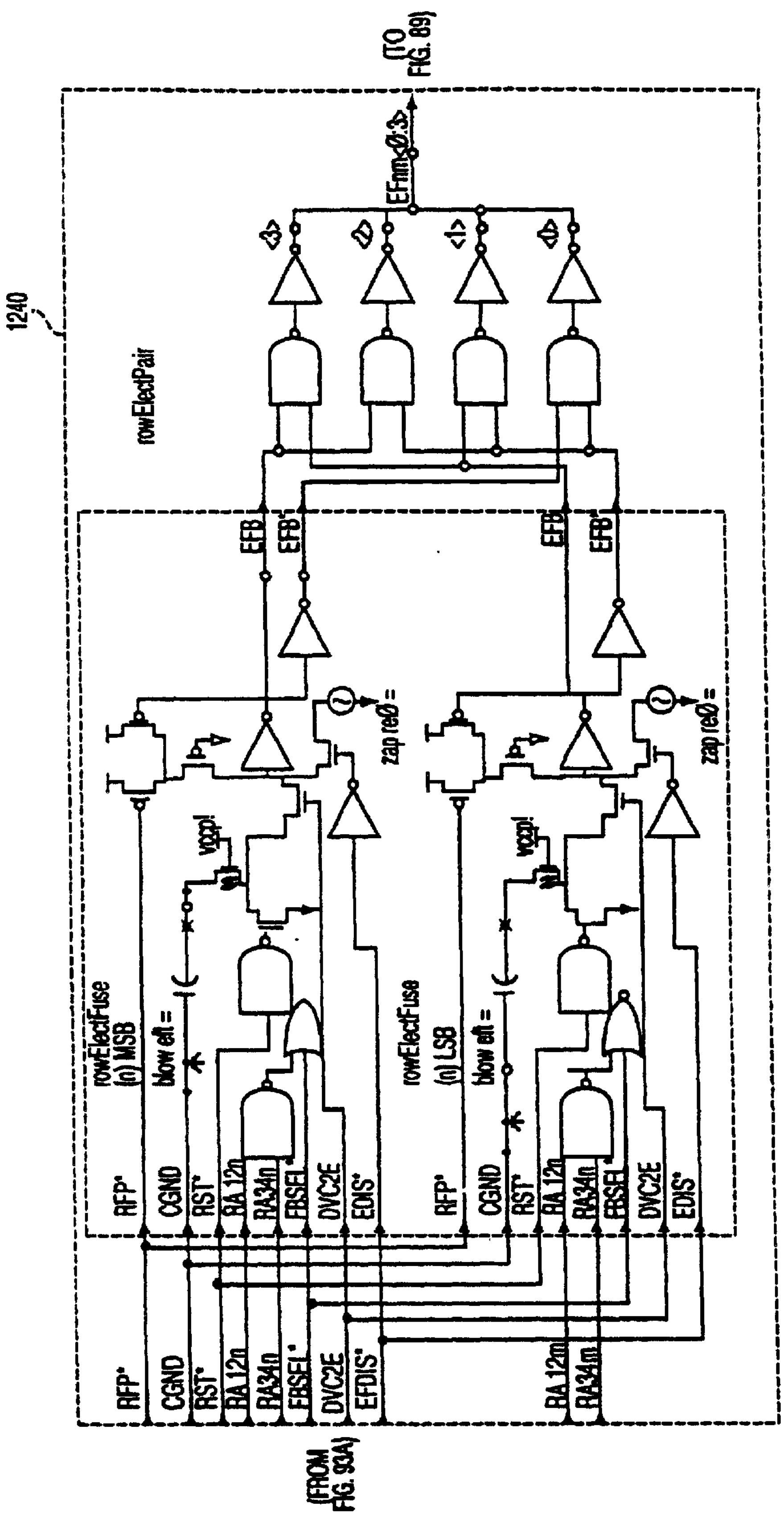
Figure 94:
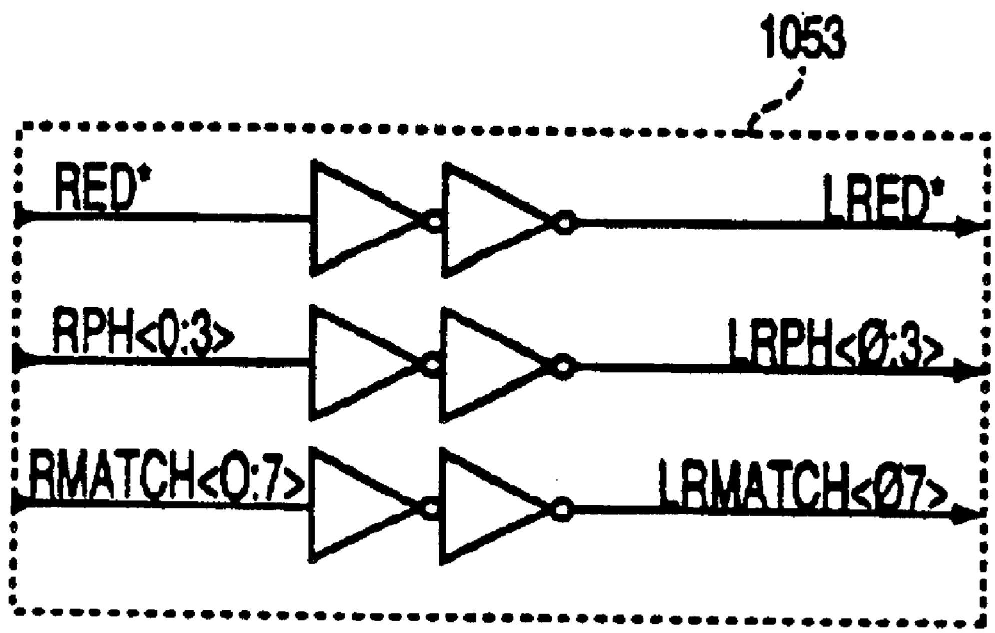
Figure 95:
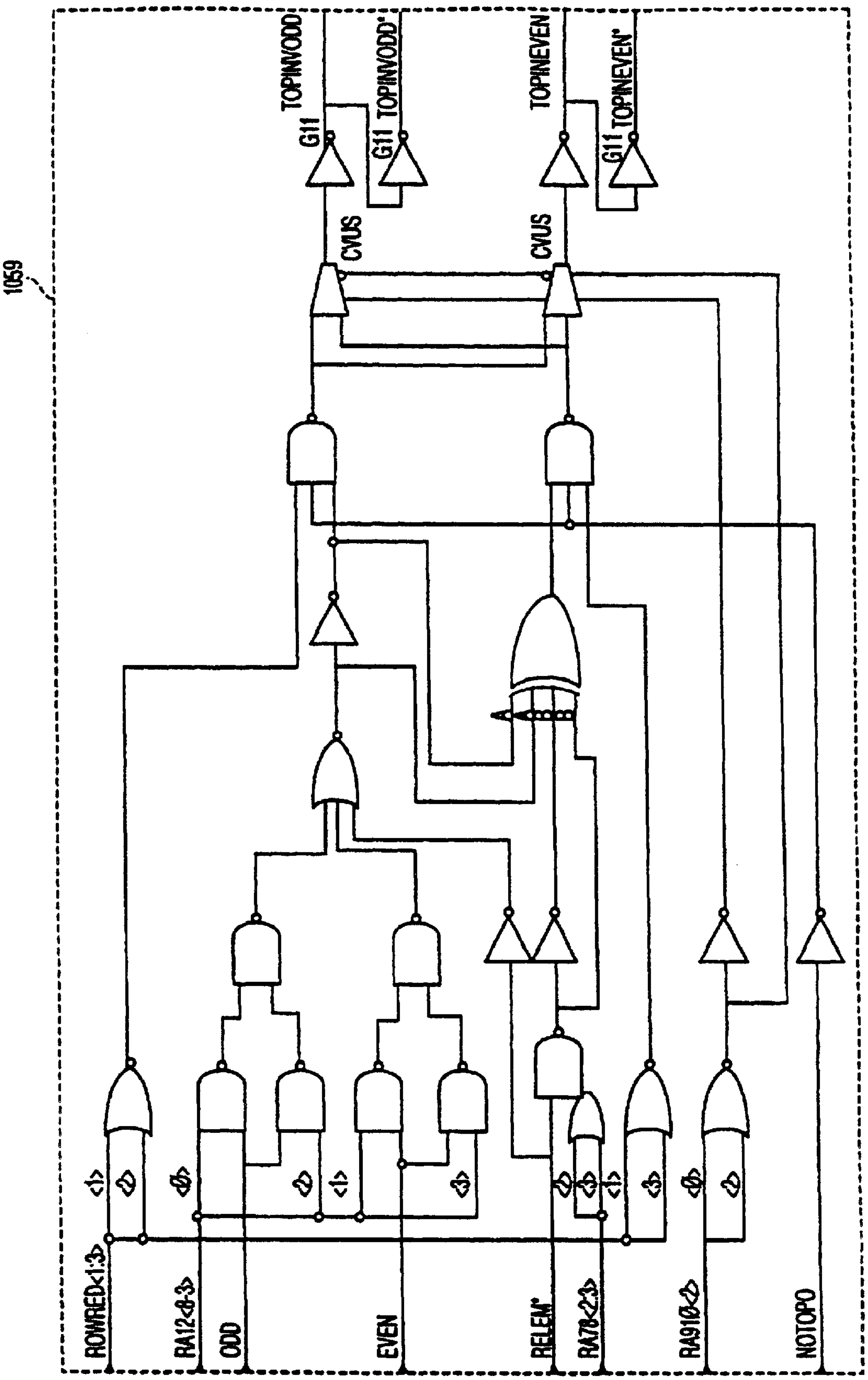
Figure 96:
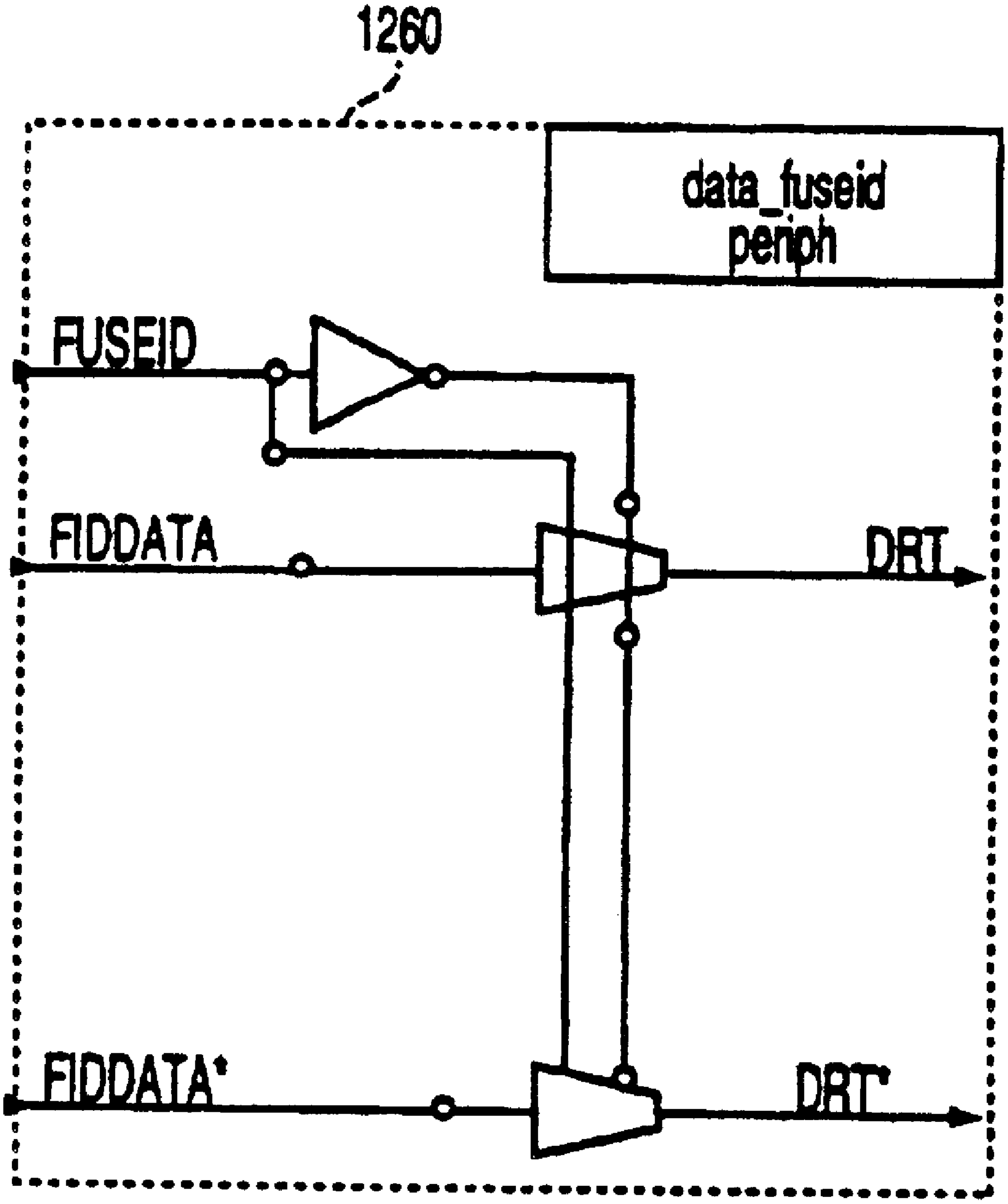

FIG. 64A is a block diagram illustrating the left side of the right logic of FIG. 2;

FIG. 64B is a block diagram illustrating the right side of the right logic of FIG. 2;

FIG. 65A is a block diagram illustrating the left side of the left logic of FIG. 2;

FIG. 65B is a block diagram illustrating the right side of the left logic of FIG. 2;

FIG. 66 illustrates the detail of the 128 Meg driver blocks A found in the right and left logic circuits of FIGS. 64A and 65B;

FIG. 67 is a block diagram illustrating the 128 Meg driver blocks B found in the right and left logic circuits of FIGS. 64A and 65B;

FIG. 68A illustrates the details of the row address driver illustrated in FIG. 67;

FIG. 68B illustrates the details of the column address delay circuits illustrated in FIG. 67;

FIG. 69 illustrates the details of the decoupling elements found in the right and left logic circuits of FIGS. 64A and 65B; FIG. 70 illustrates the detail of the odd/even drivers found in the right and left logic circuits of FIGS. 64A, 64B, 65A, and 65B;

FIG. 71A illustrates the details of the array V drivers found in the right and left logic circuits of FIGS. 64A, 64B, 65A, and 65B;

FIG. 71B illustrates the details of the array V switches found in the right and left logic circuits of FIGS. 64A, 64B, 65A, and 65B;

FIG. 72A illustrates the details of the DVC2 switches found in the right and left logic circuits of FIGS. 64B and 65A;

FIG. 72B illustrates the details of the DVC2 Up/Down circuits found in the right and left logic circuits of FIGS. 64B and 65A;

FIG. 73 illustrates the details of the DVC2 nor circuit found in the right and left logic circuits of FIGS. 64A and 65B;

FIG. 74 is a block diagram illustrating the column address driver blocks found in the right and left logic circuits of FIGS. 64A, 64B, 65A, and 65B;

FIG. 75A illustrates the details of the enable circuit found in FIG. 74;

FIG. 75B illustrates the details of the delay circuit found in FIG. 74;

FIG. 75C illustrates the details of the column address drivers found in FIG. 74;

FIG. 76 is a block diagram illustrating the column address driver blocks 2 found in the right and left logic circuits of FIGS. 64A, 64B, 65A, and 65B;

FIG. 77 illustrates the details of the column address drivers found in FIG. 76;

FIG. 78 is a block diagram illustrating the column redundancy blocks found in the right and left logic circuits of FIGS. 64A, 64B, 65A, and 65B;

FIG. 79 illustrates the details of the column banks shown in FIG. 78;

FIG. 80A is a block diagram illustrating the column fuse circuits shown in FIG. 79;

FIG. 80B illustrates the details; of the output circuit shown in FIG. 80A;

FIG. 80C illustrates the details of the column fuse circuits shown in FIG. 80A;

FIG. 80D illustrates the details of the enable circuit shown in FIG. 80A;

FIG. 81A illustrates the details of the column electric fuse circuits illustrated in FIG. 79;

FIG. 81B illustrates the details of the column electric fuse block enable circuit illustrated in FIG. 79;

FIG. 81C illustrates the details of the fuse block select circuit illustrated in FIG. 79;

FIG. 81D illustrates the details of the CMATCH circuit illustrated in FIG. 79;

FIG. 82 is a block diagram of the global column decoders found in the right and left logic circuits of FIGS. 64A, 64B, 65A, and 65B;

FIG. 83A illustrates the details of the row driver blocks shown in FIG. 82;

FIG. 83B illustrates the details of the column decode CMAT drivers shown in FIG. 82;

FIG. 83C illustrates the details of the column decode CA01 drivers shown in FIG. 82;

FIG. 83D illustrates the details of the global column decode sections shown in FIG. 82;

FIG. 84A illustrates the details of the column select drivers shown in FIG. 83D;

FIG. 84B illustrates the details of the R column select drivers shown in FIG. 83D;

FIG. 85 is a block diagram illustrating the row redundancy blocks found in the right and left logic circuits of FIGS. 64A, 64B, 65A, and 65B;

FIG. 86 illustrates the redundant logic illustrated in the block diagram of FIG. 85;

FIG. 87 illustrates the details of the row banks shown in FIG. 85;

FIG. 88 illustrates the details of the rsect logic shown in FIG. 87;

FIG. 89 is a block diagram illustrating the row electric block illustrated in FIG. 87;

FIG. 90A illustrates the details of the electric banks shown in FIG. 89;

FIG. 90B illustrates the details of the redundancy enable circuit shown in FIG. 89;

FIG. 90C illustrates the details of the select circuit shown in FIG. 89;

FIG. 90D illustrates the details of the electric bank 2 shown in FIG. 89;

FIG. 90E illustrates the details of the output circuit shown in FIG. 89;

FIG. 91 is a block diagram illustrating the row fuse blocks shown in FIG. 87;

FIG. 92A illustrates the details of the fuse banks shown in FIG. 91;

FIG. 92B illustrates the details of the redundancy enable circuit shown in FIG. 91;

FIG. 92C illustrates the details of the select circuit shown in FIG. 91;

FIG. 92D illustrates the details of the fuse bank 2 shown in FIG. 91;

FIG. 92E illustrates the details of the output circuit shown in FIG. 91;

FIG. 93A illustrates the details of the input logic shown in the block diagram of FIG. 87;

FIG. 93B illustrates the details of the row electric fuse block enable circuit shown in the block diagram of FIG. 87;

FIG. 93C illustrates the details of the row electric fuse shown in the block diagram of FIG. 87;

FIG. 93D illustrates the details of the row electric pairs shown in the block diagram of FIG. 87;

FIG. 94 illustrates the details of the row redundancy buffers found in the right and left logic circuits of FIGS. 64A, 64B, 65A, and 65B;

FIG. 95 illustrates the details of the topo decoders found in the right and left logic circuits of FIGS. 64A, 64B, 65A, and 65B;

FIG. 96 illustrates the details of the data fuse id found in the left logic circuit of FIG. 65A;

Miscellaneous Figures (See Section XI)

Figures 1, 97:
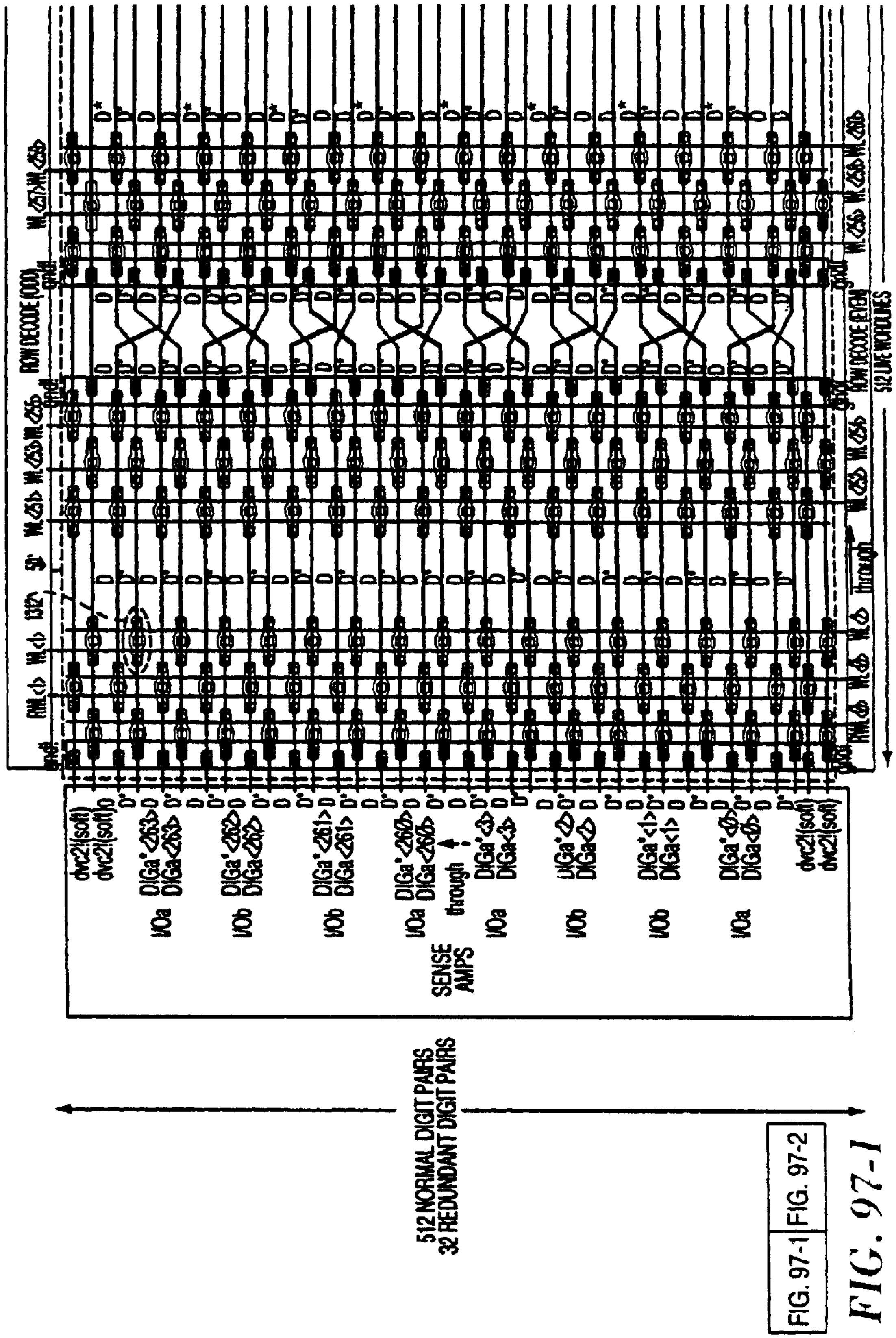
Figures 2, 97:
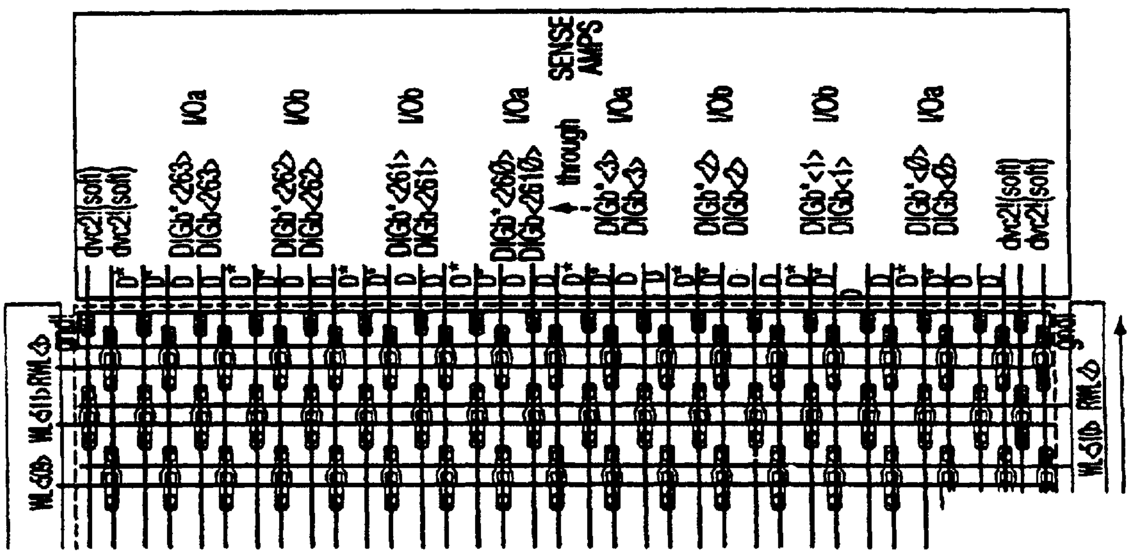
Figure 98:
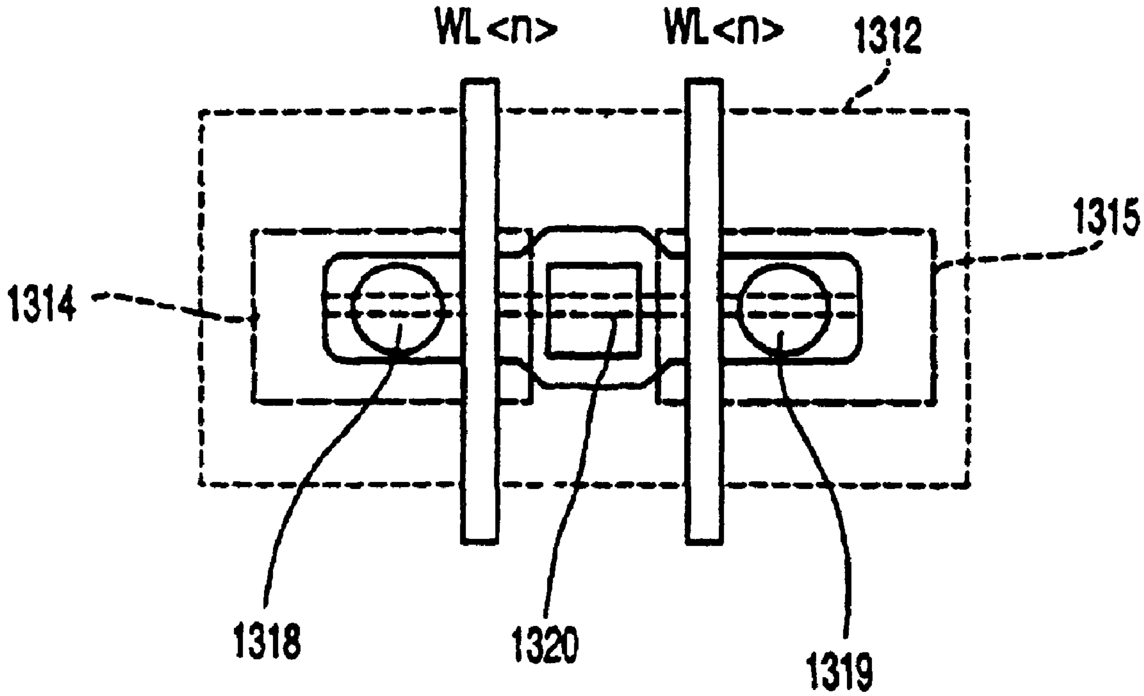
Figure 99:
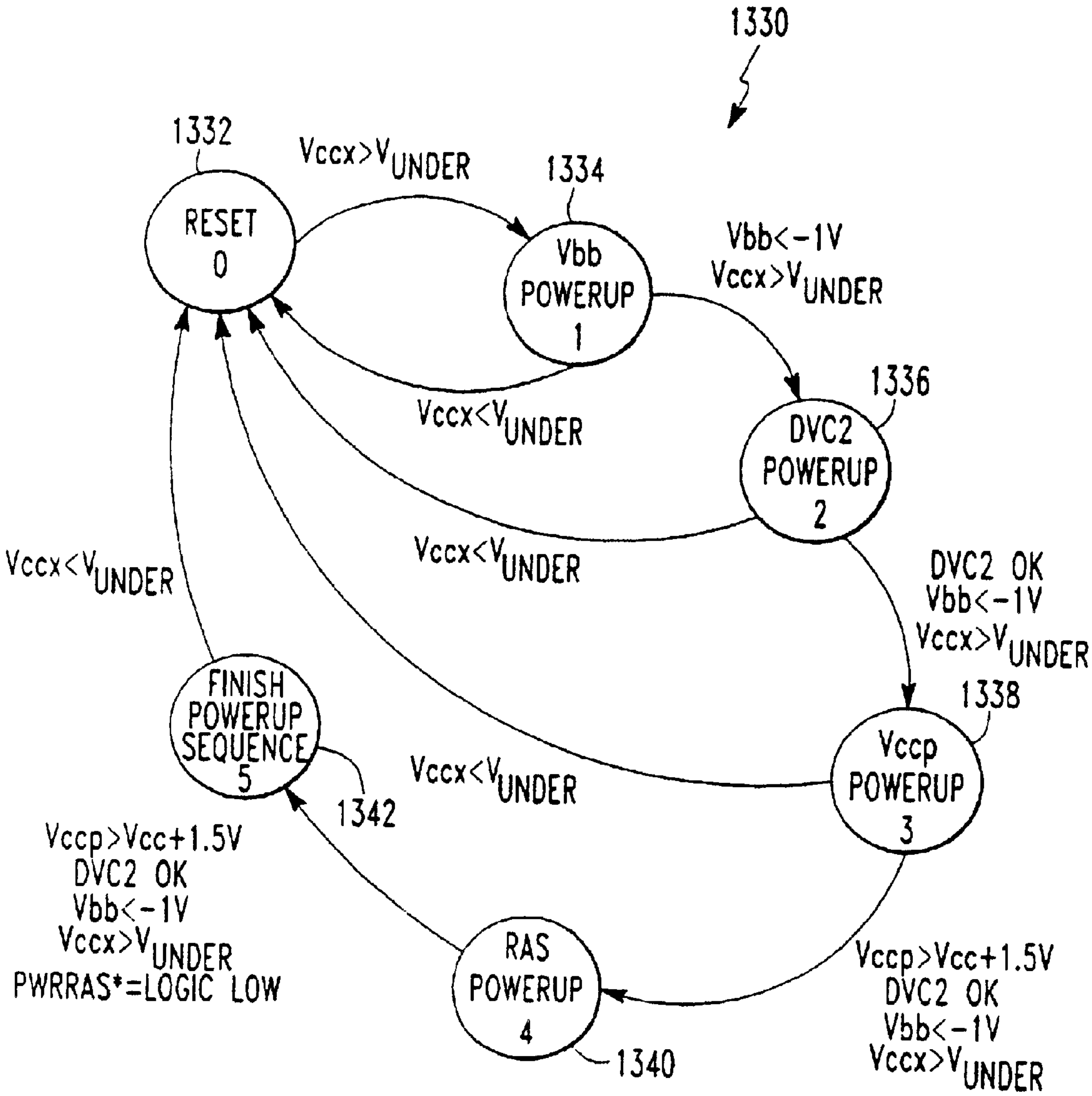
Figure 100:
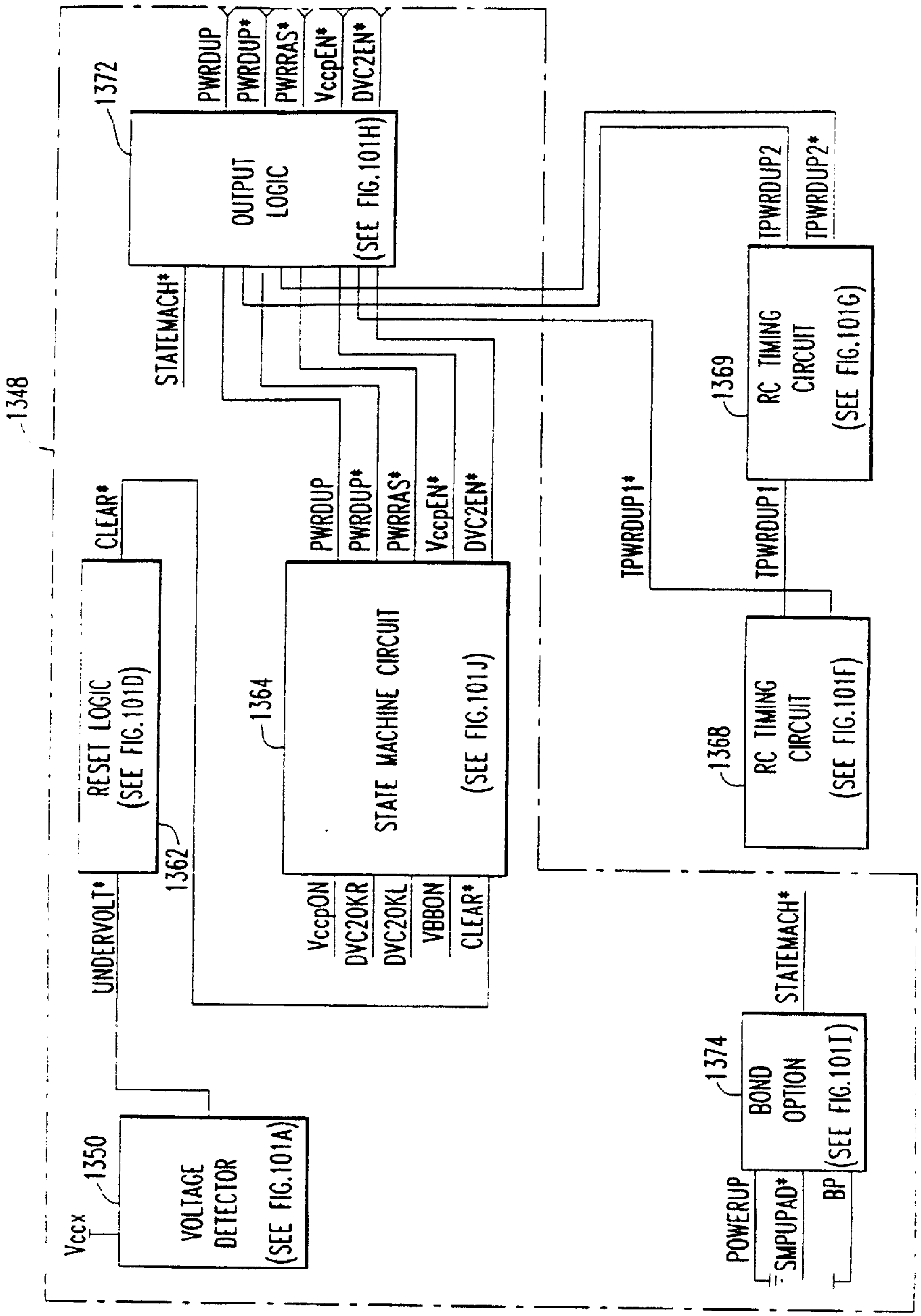
Figure 101A:
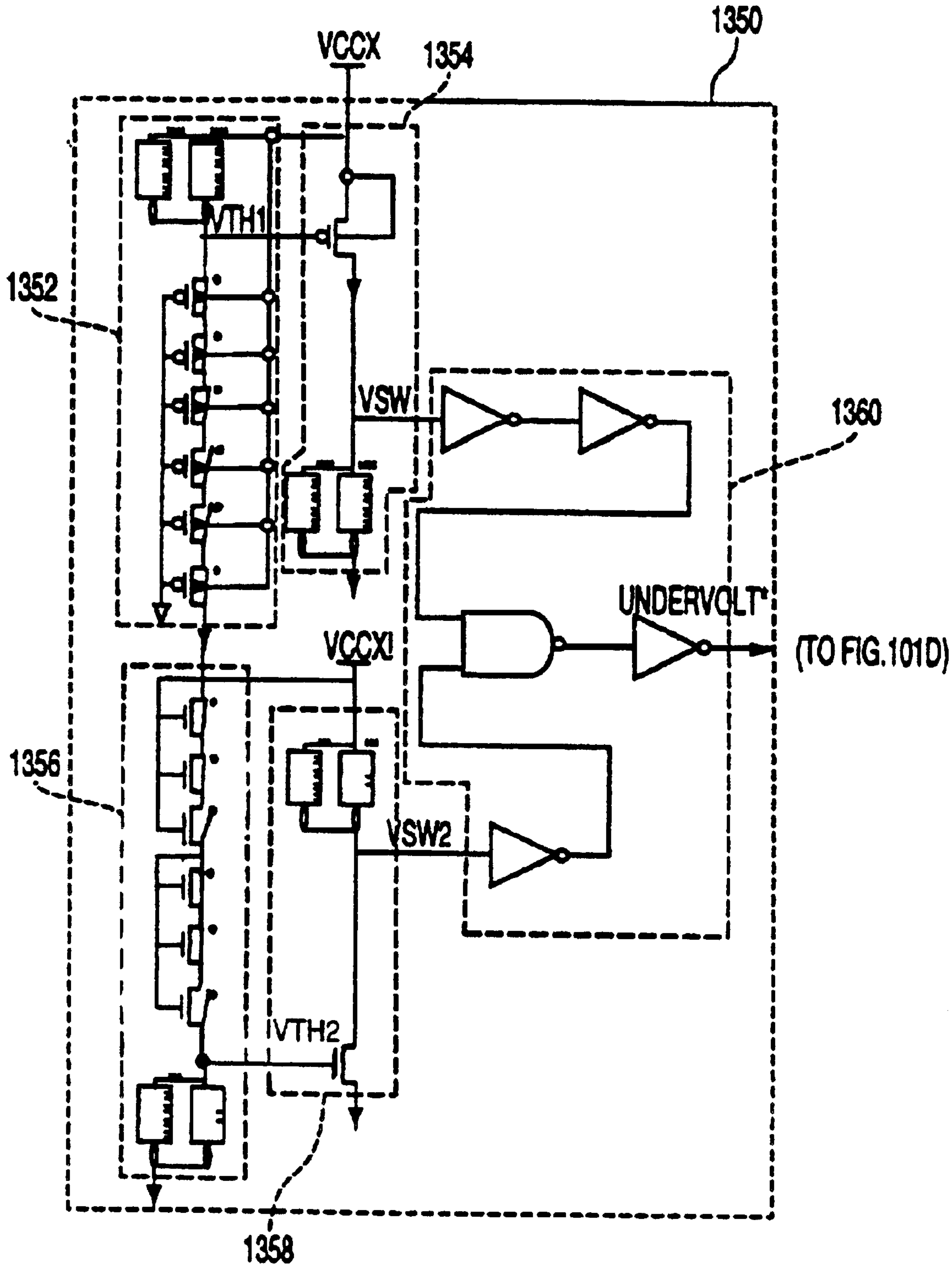
Figure 101B:
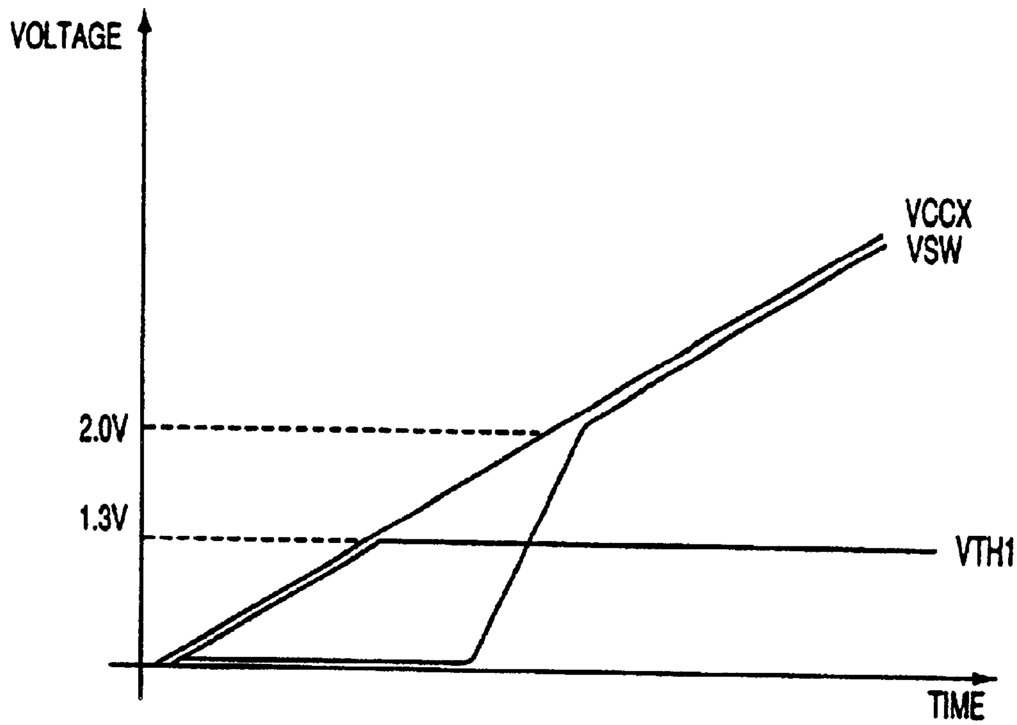
Figure 101C:
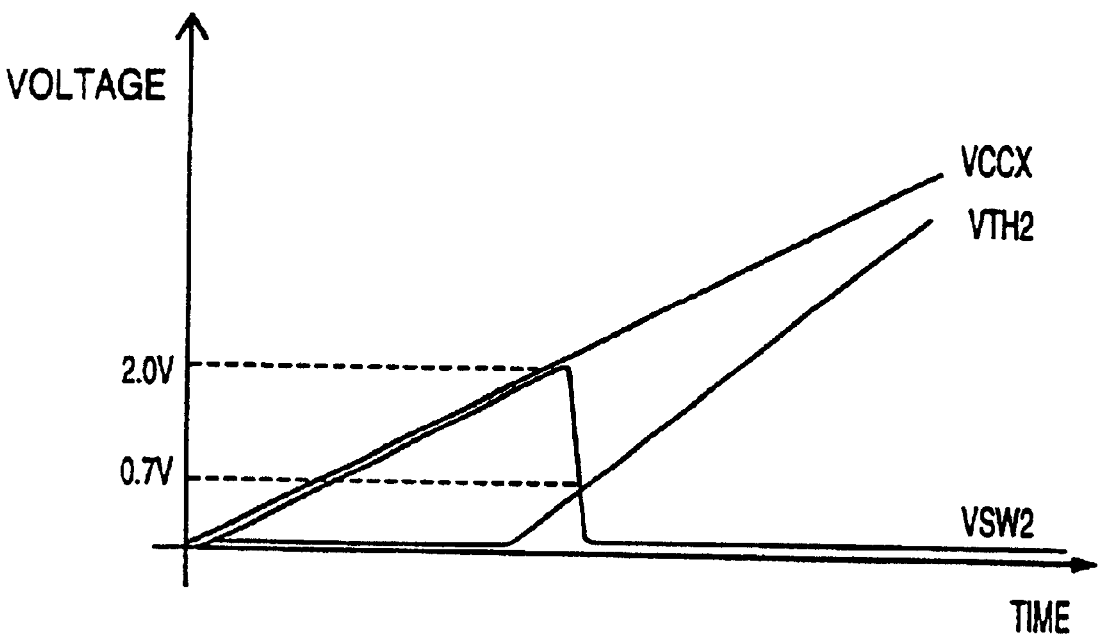
Figure 101D:
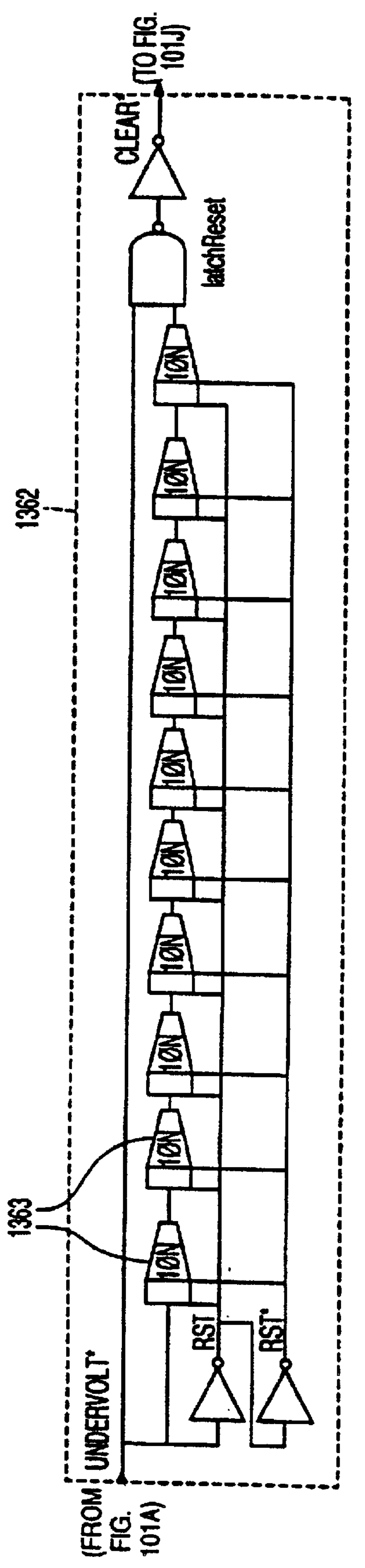
Figure 101E:
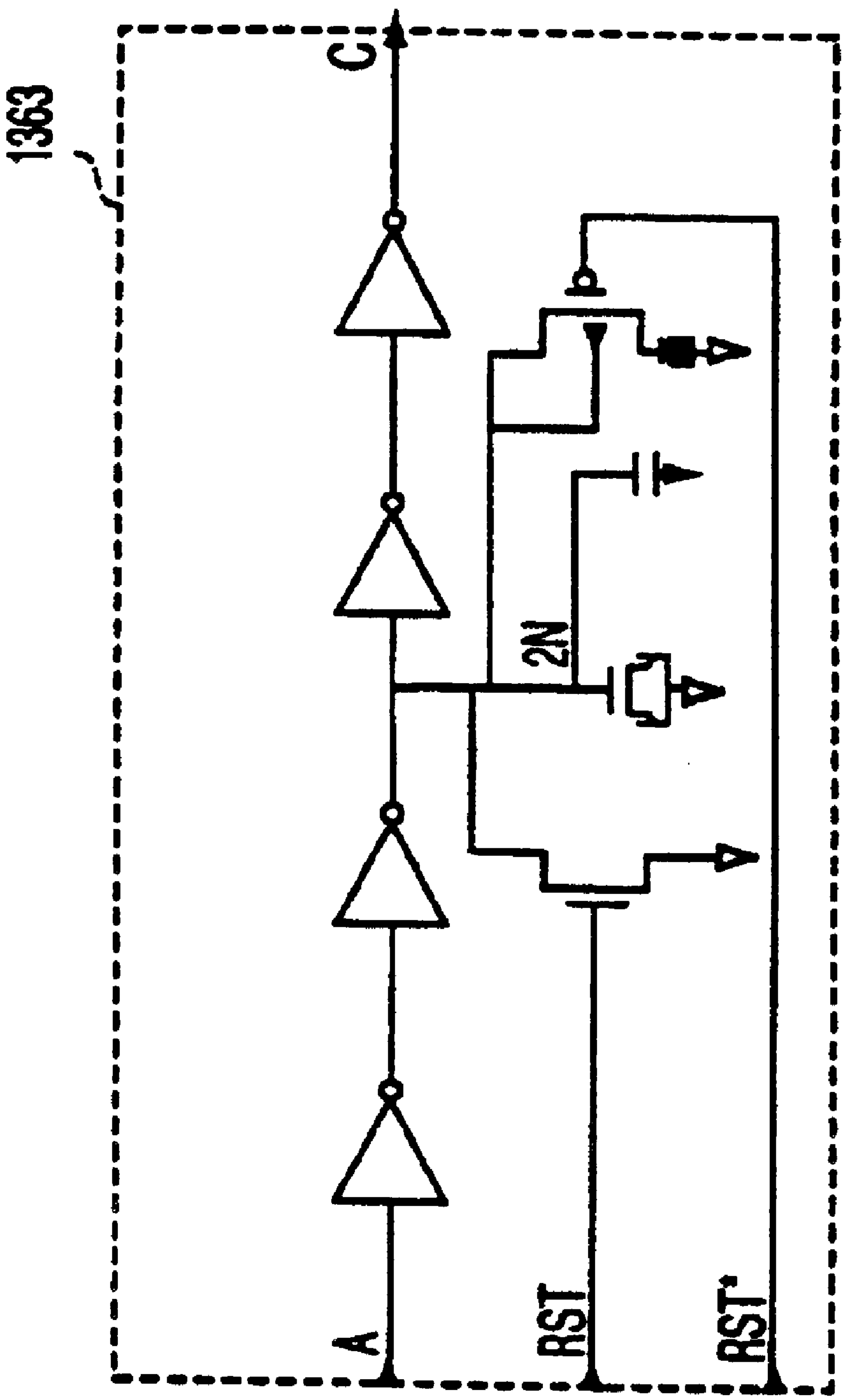
Figure 101F:
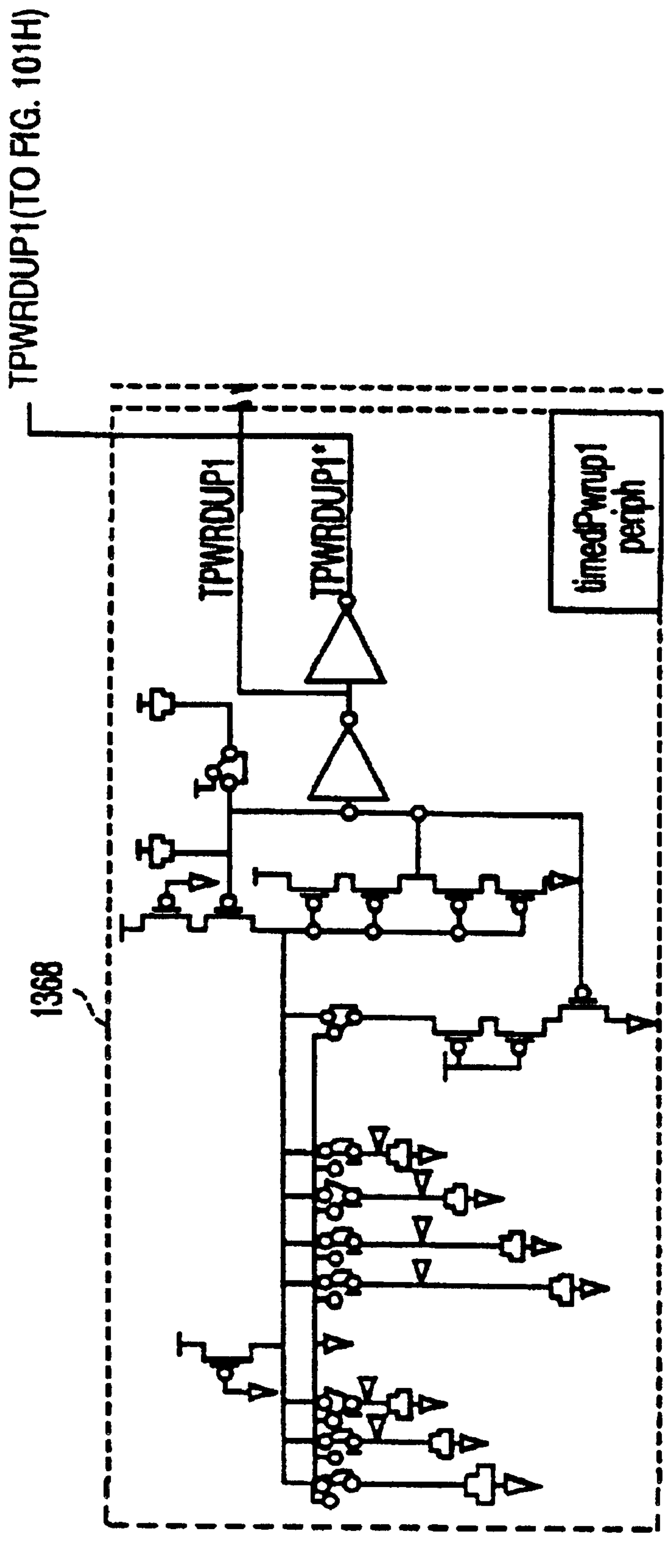
Figure 101G:
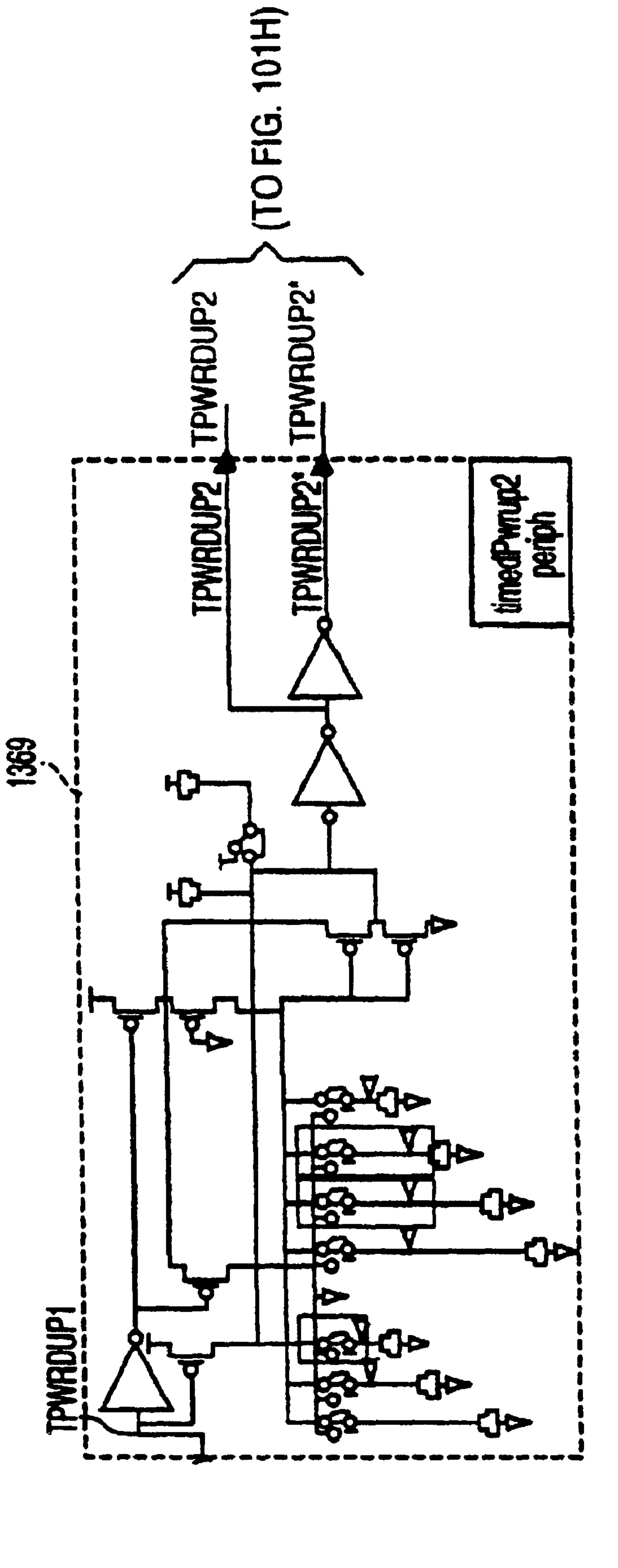
Figure 101H:
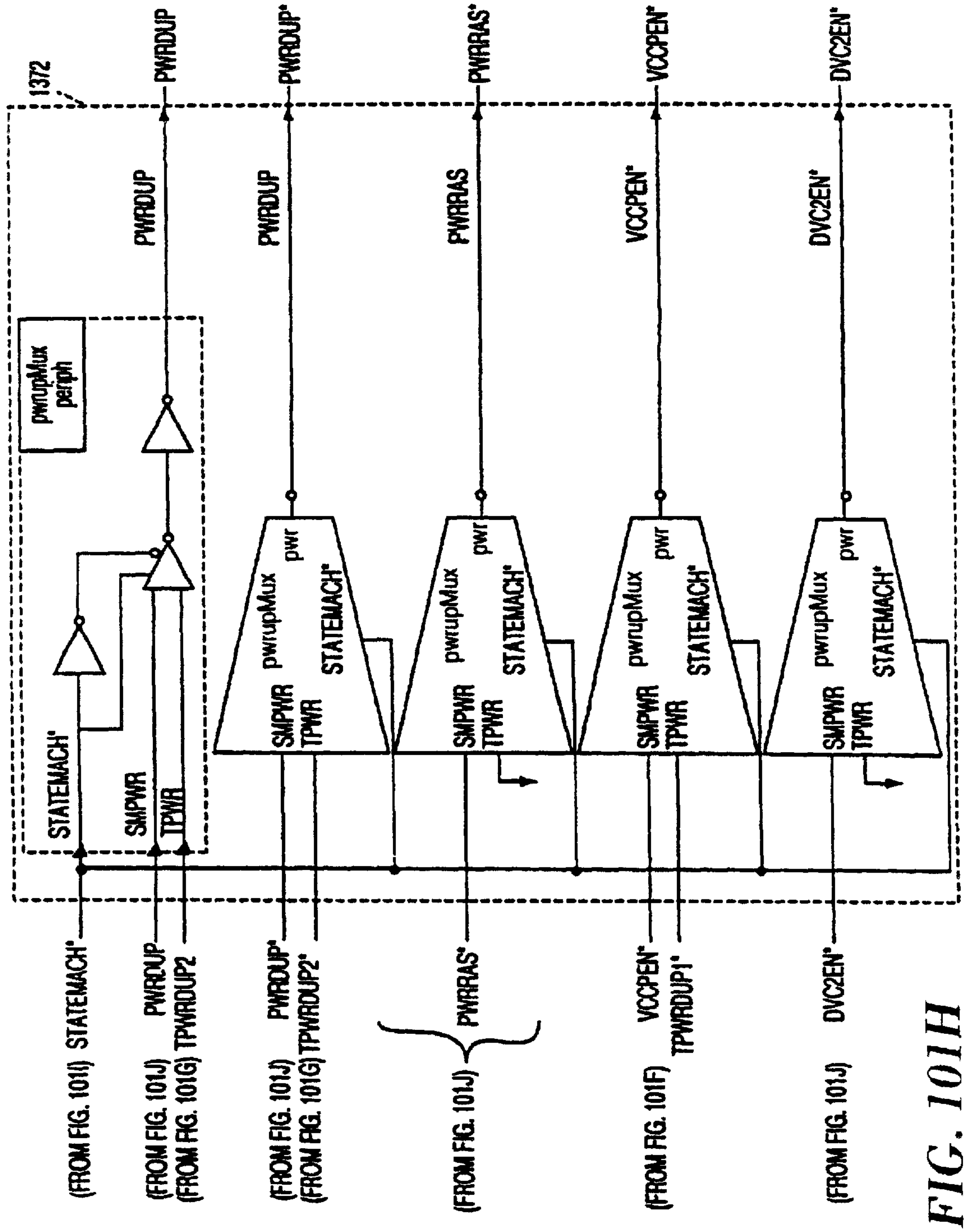
Figure 101I:
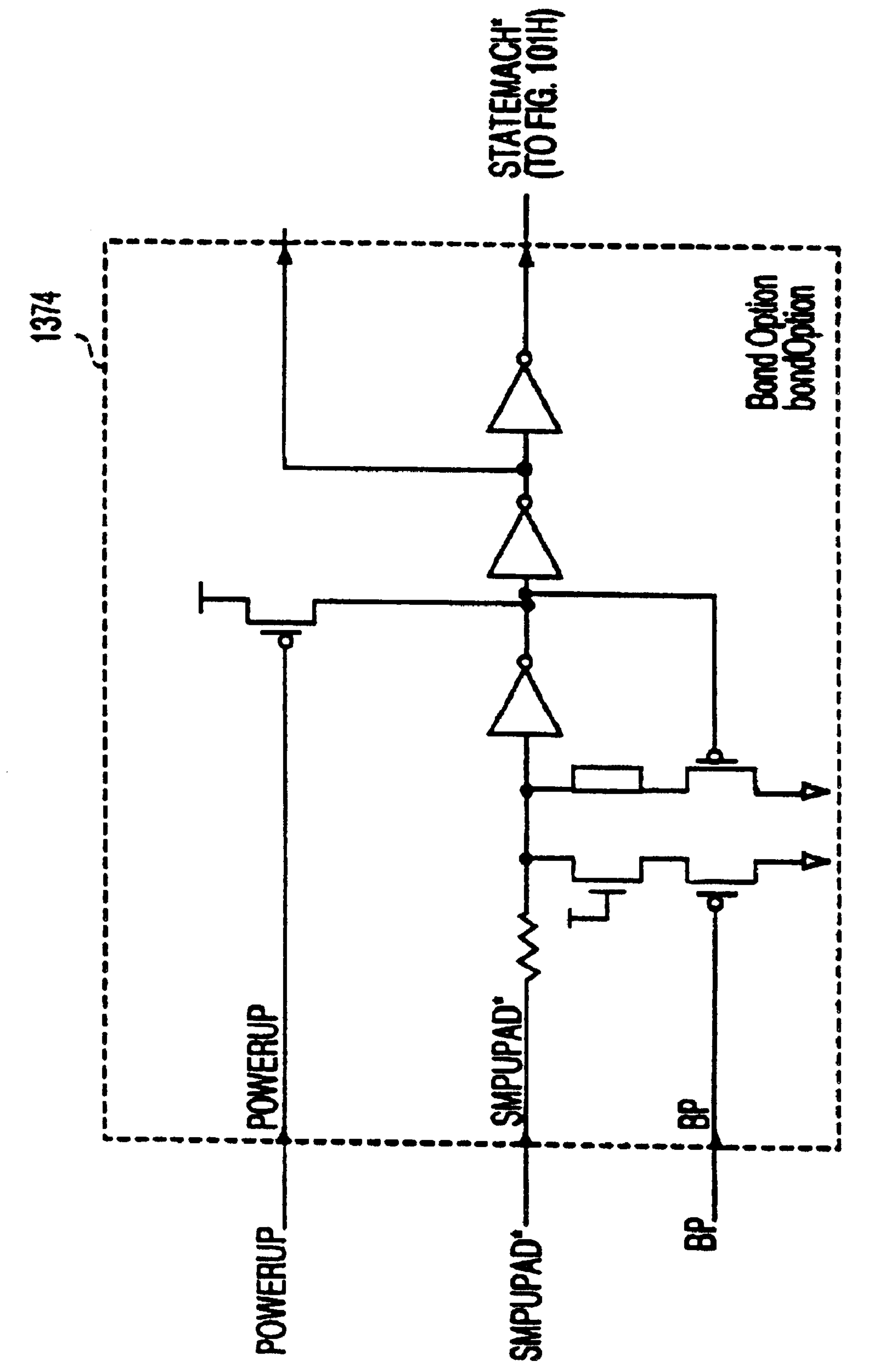
Figure 101J:
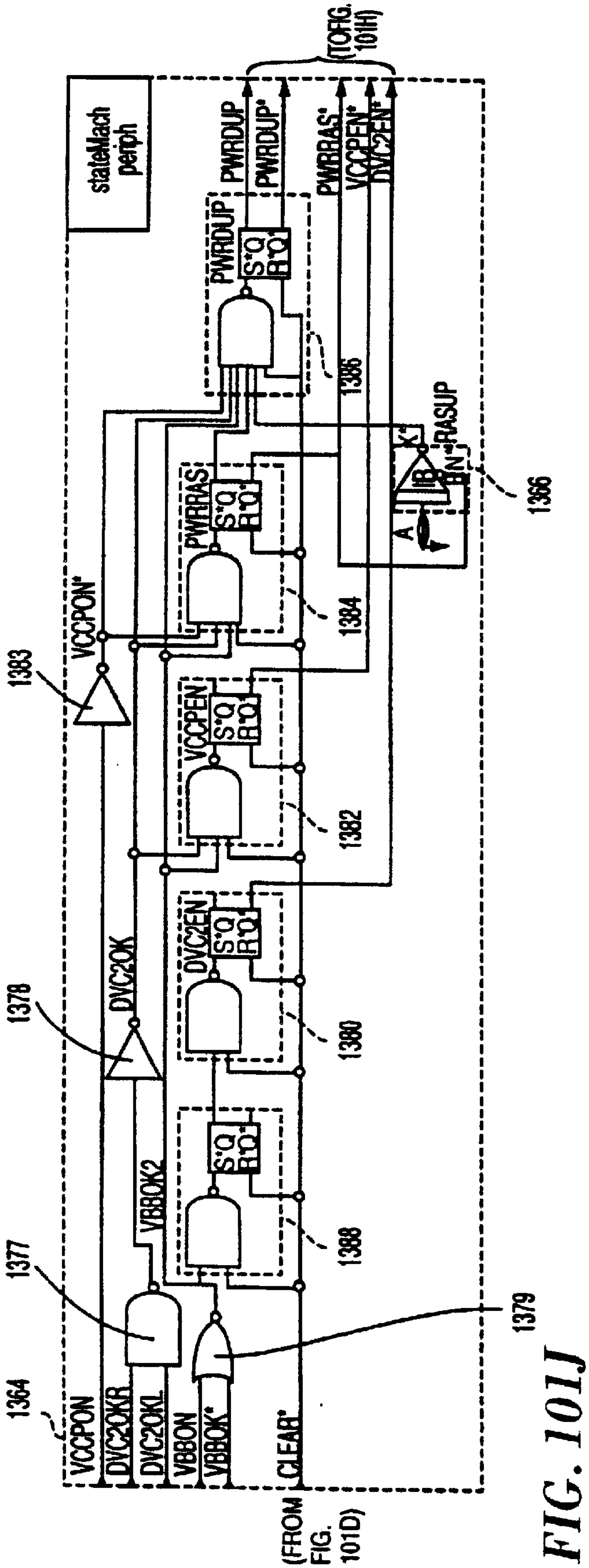
Figure 102A:
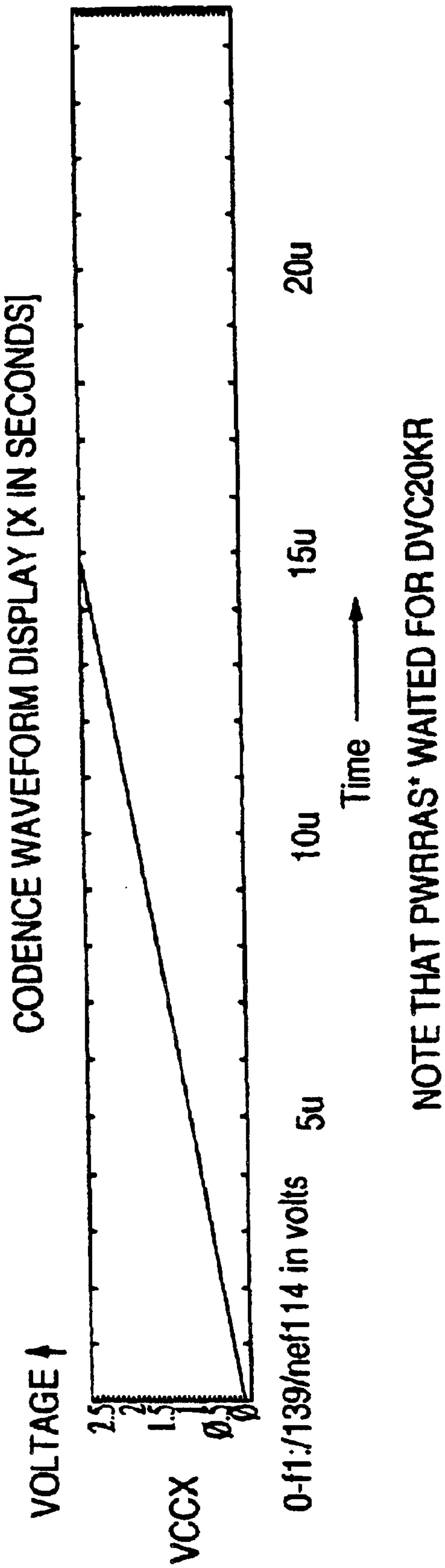
Figure 102B:
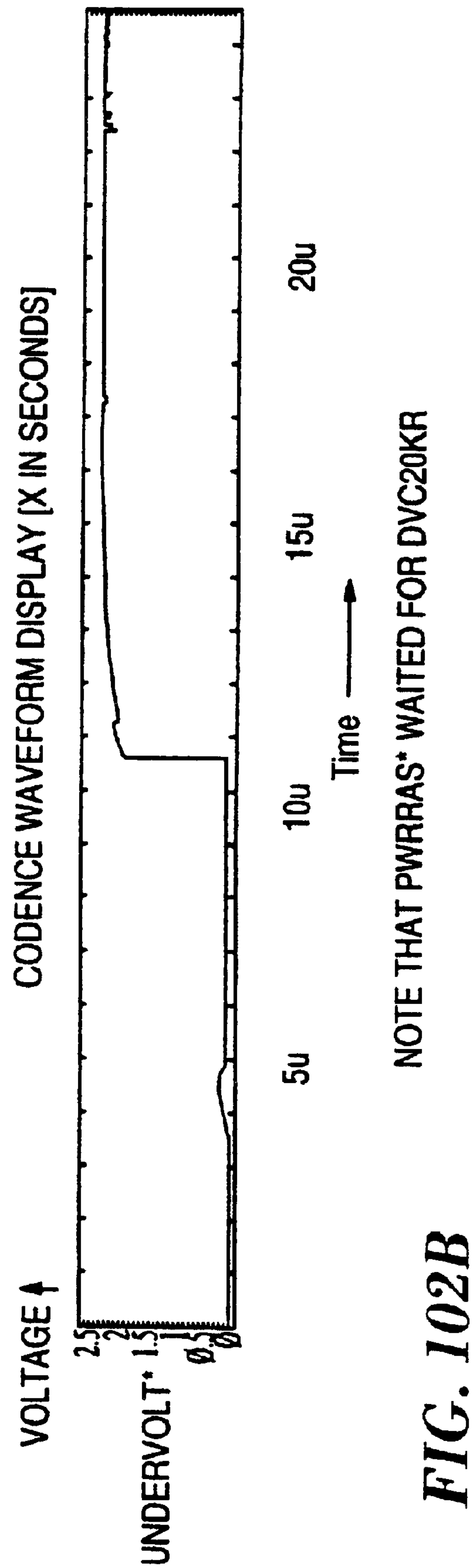
Figure 102C:
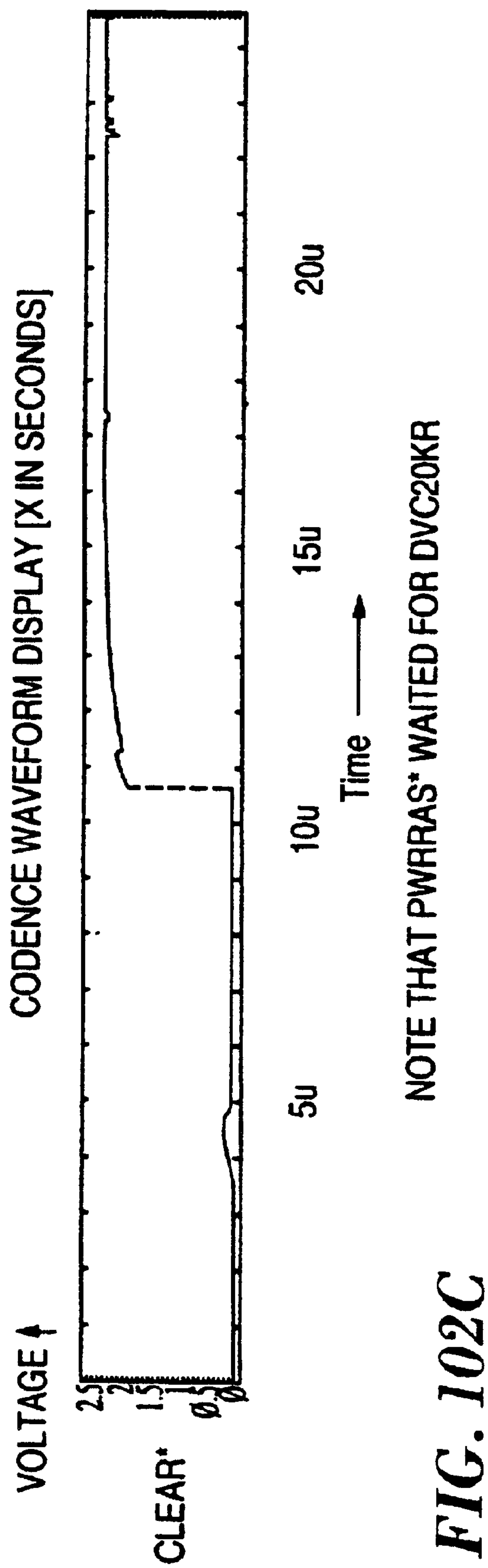
Figure 102D:
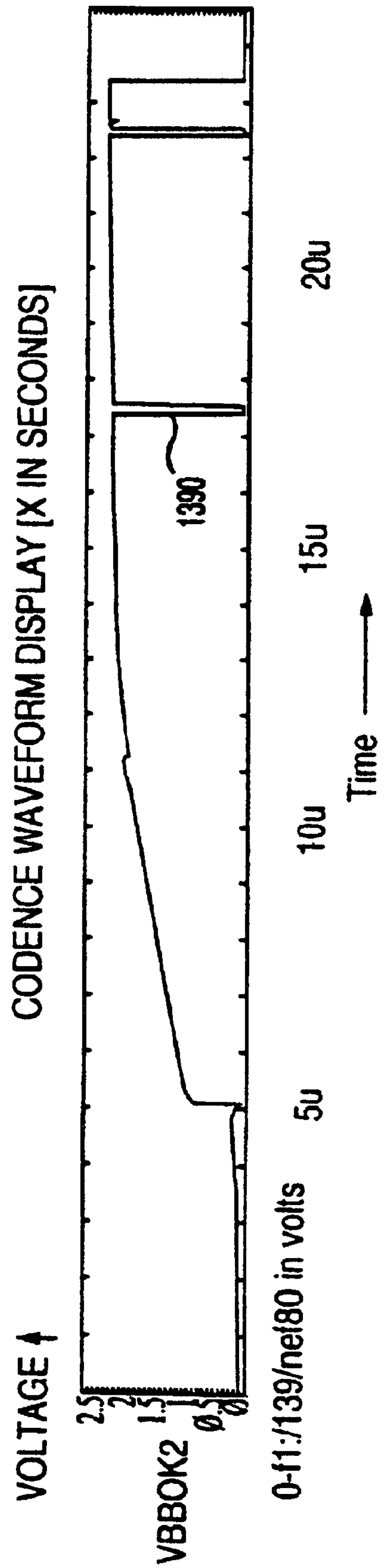
Figure 102E:
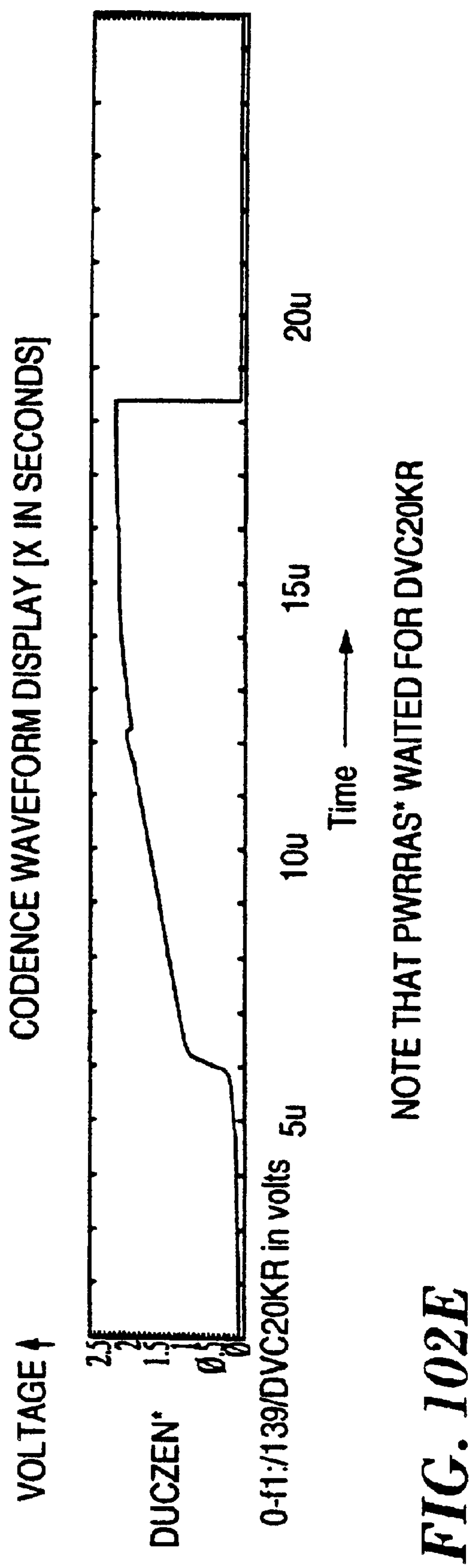
Figure 102F:
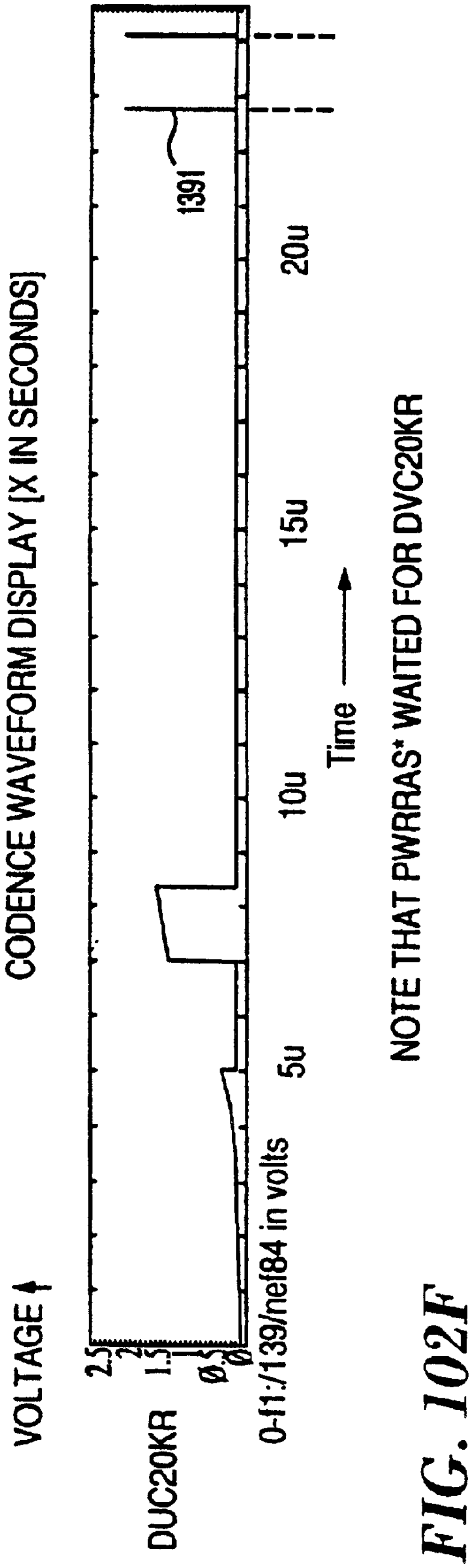
Figure 102G:
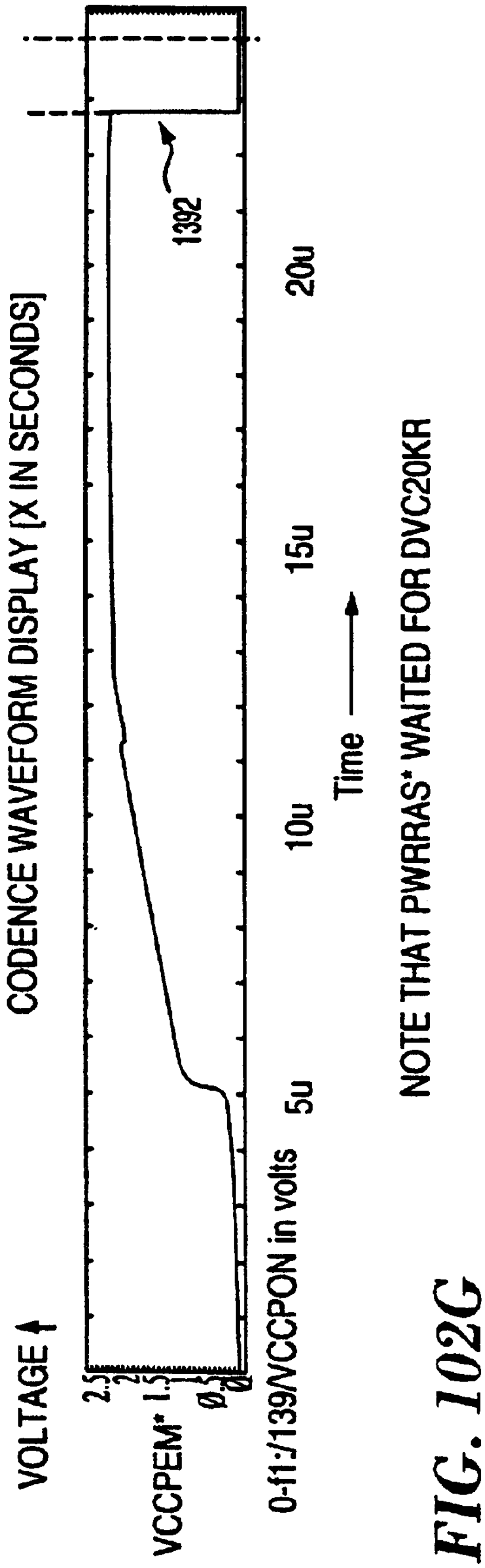
Figure 102H:
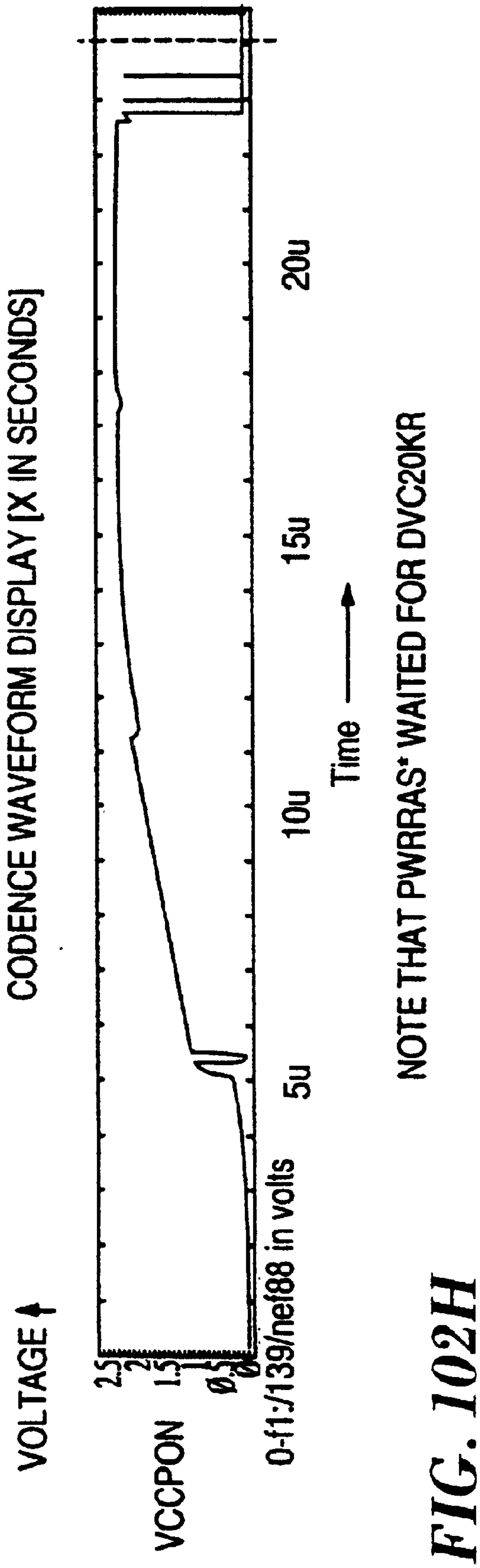
Figure 102I:
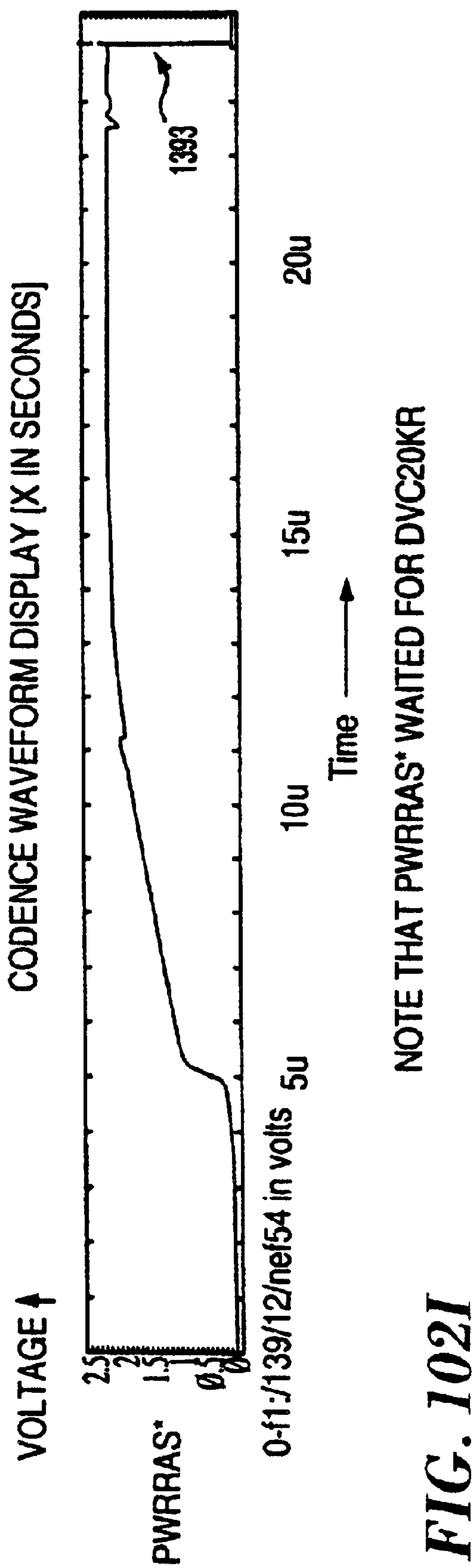
Figure 102J:
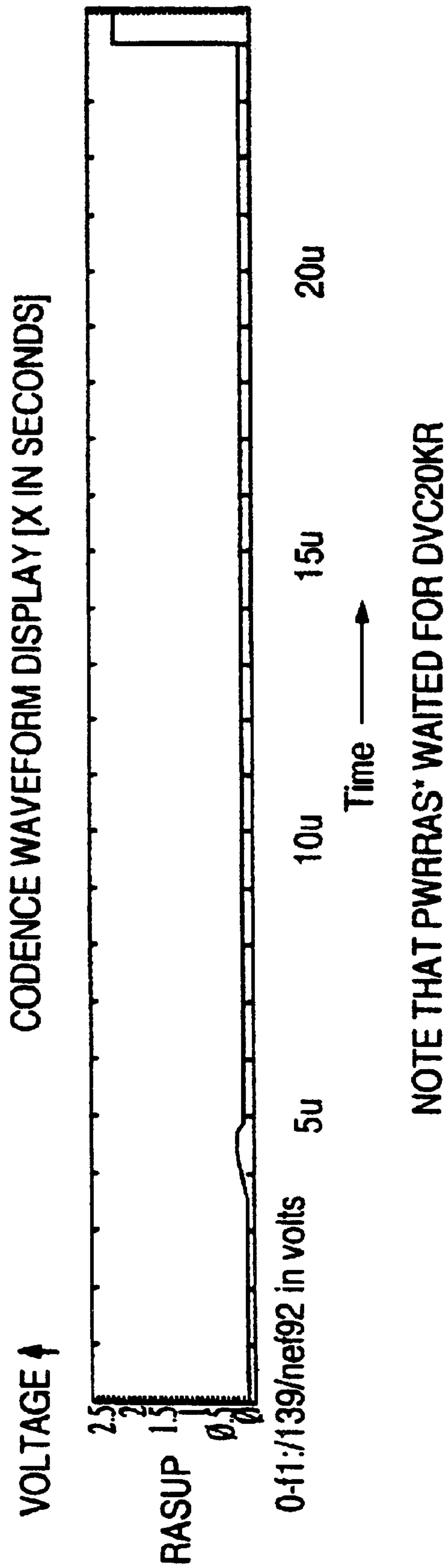
Figure 102K:
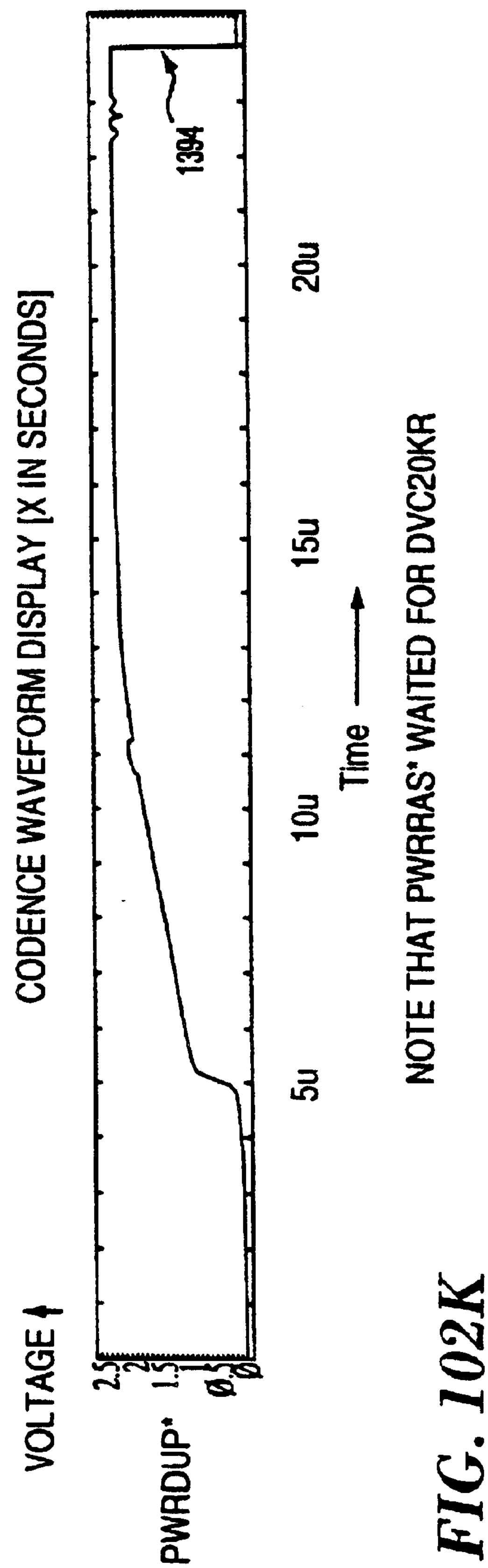
Figure 103:
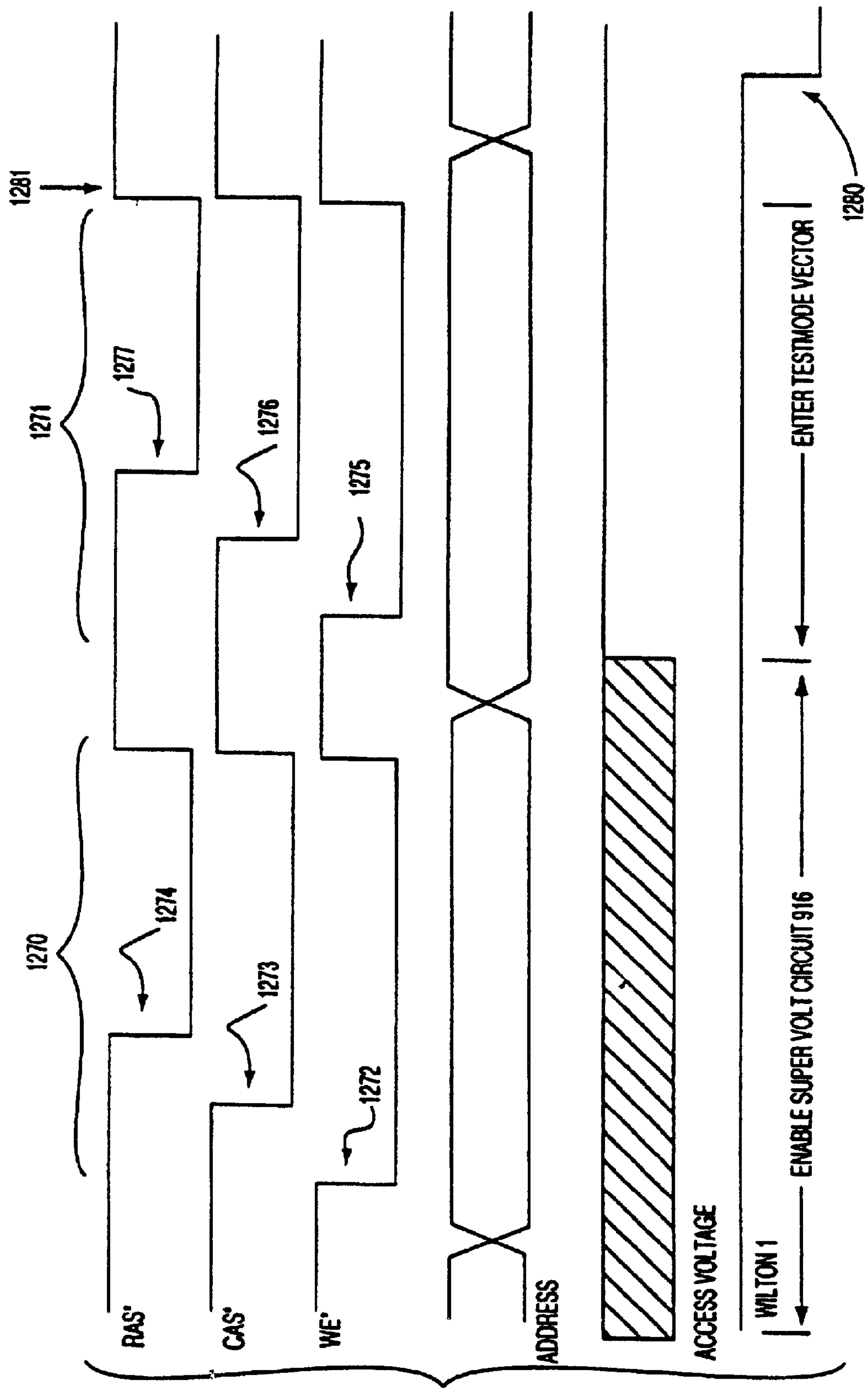
Figure 104:
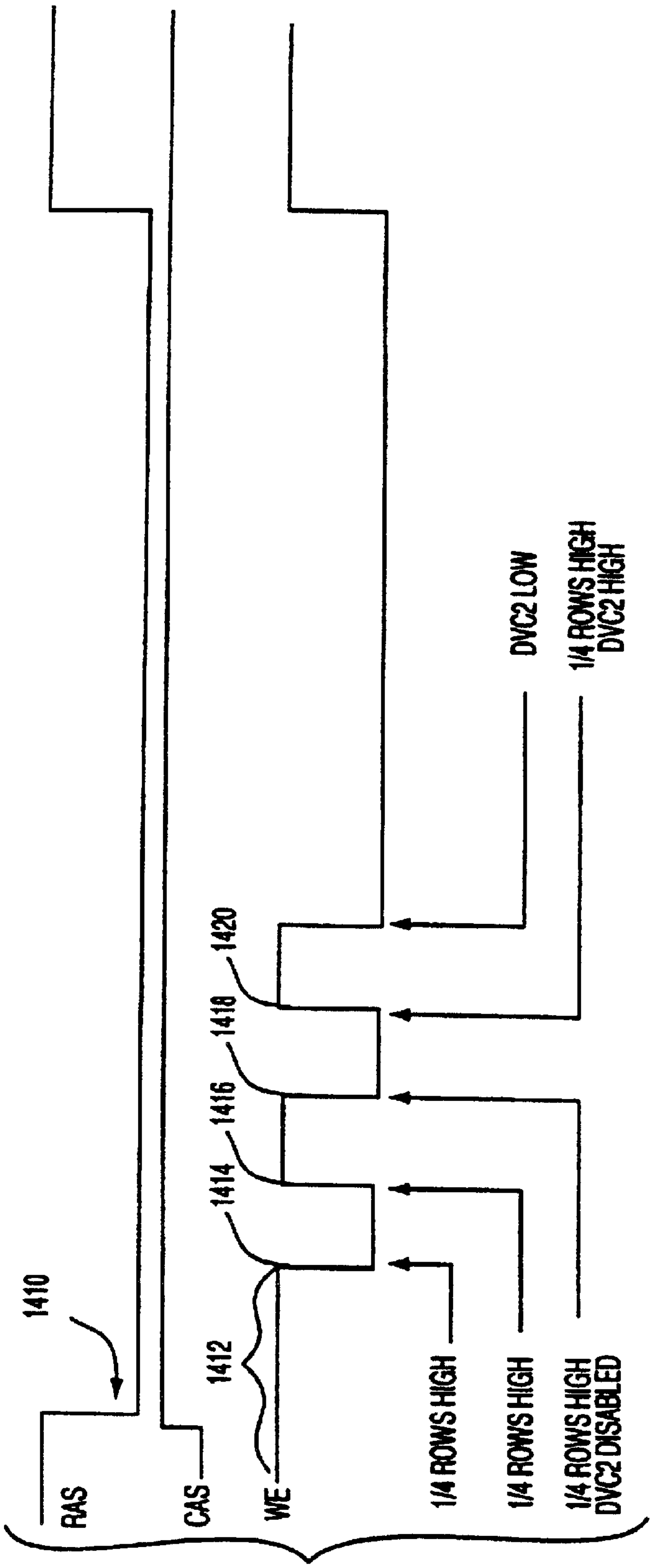
Figure 105:
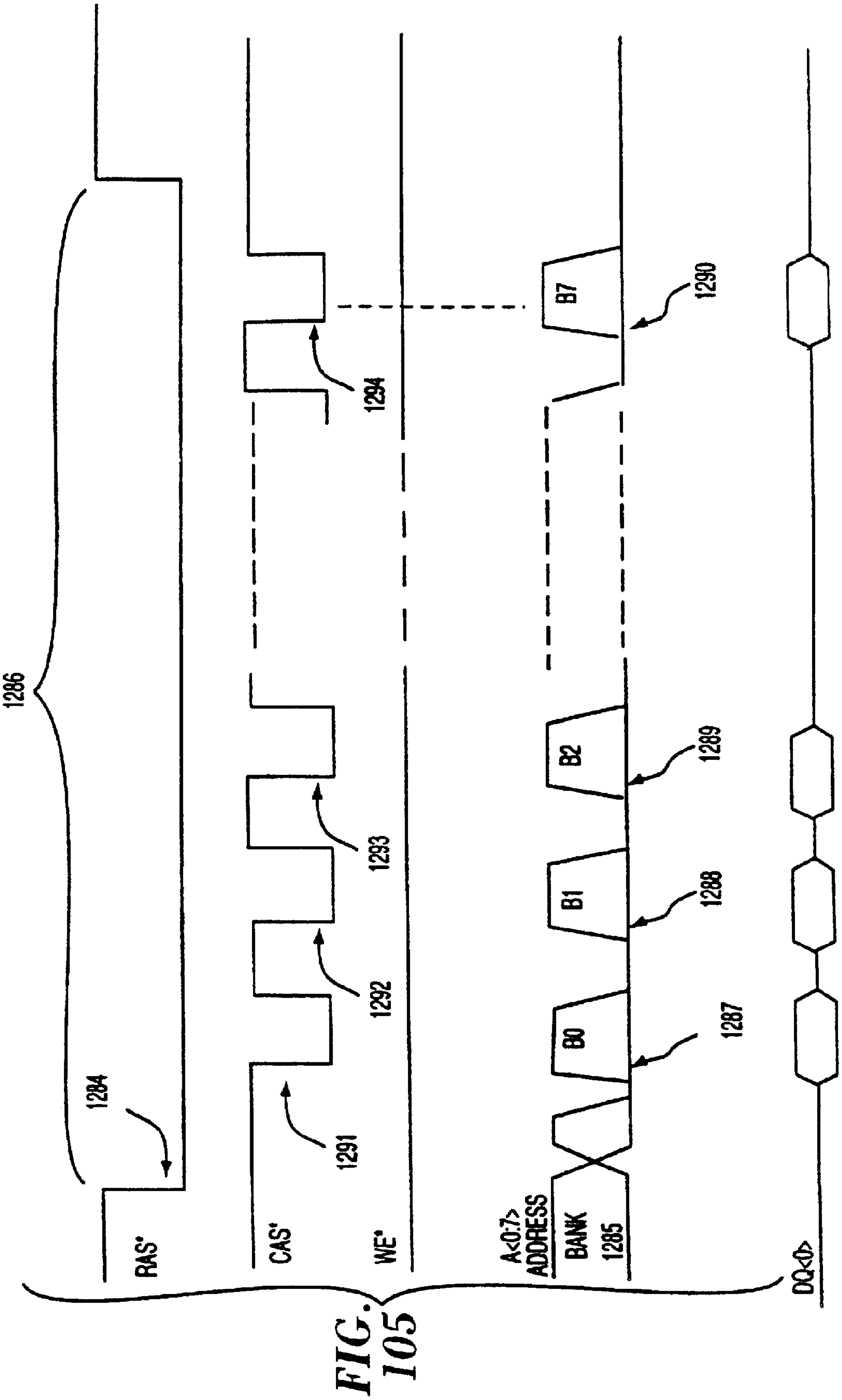
Figure 106:
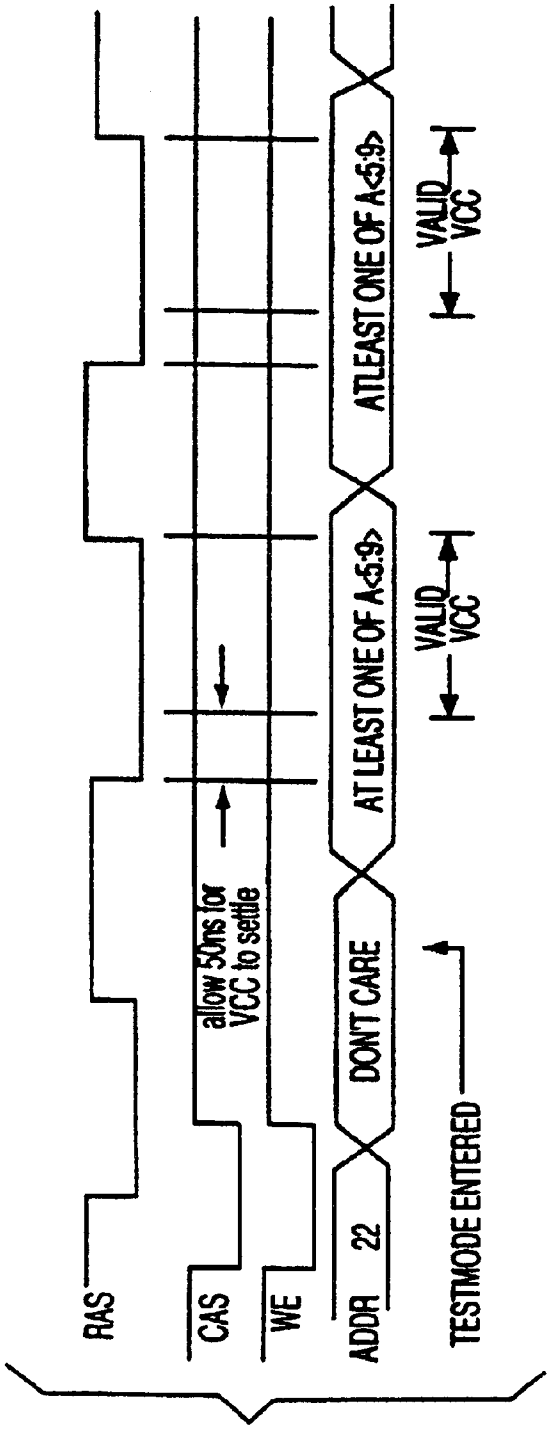
Figure 107:
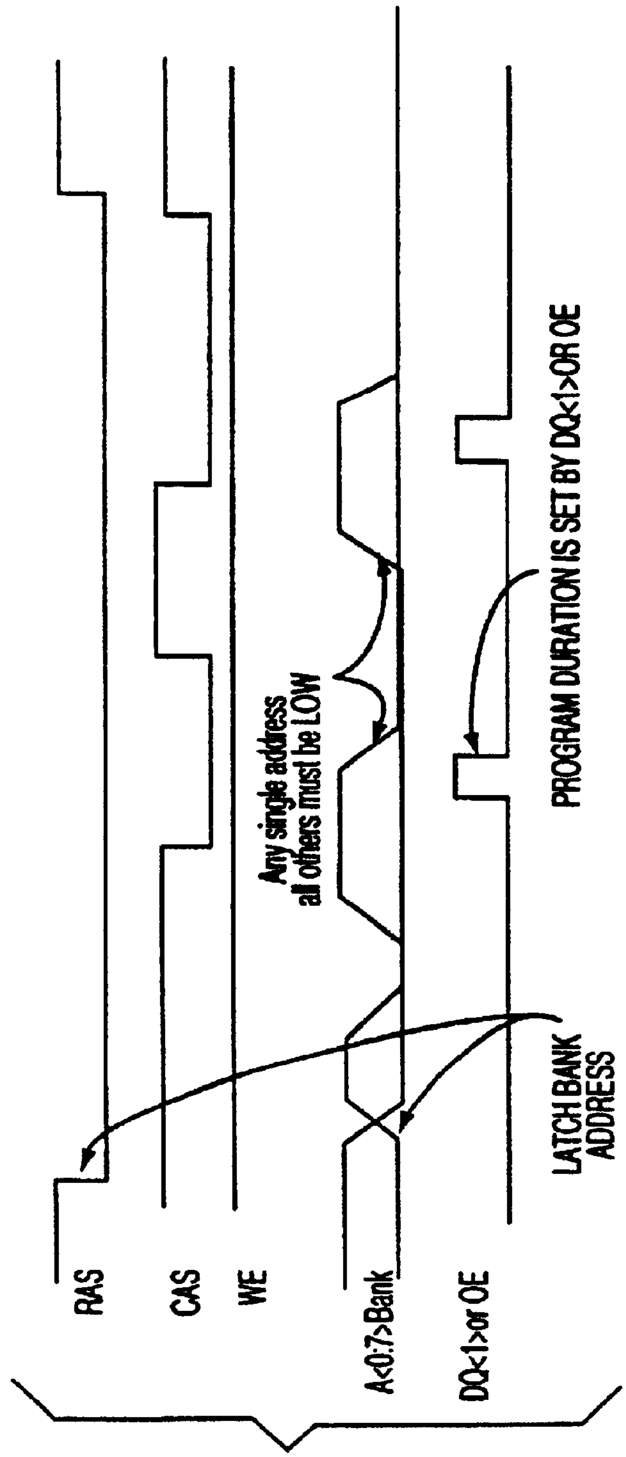
Figure 108:
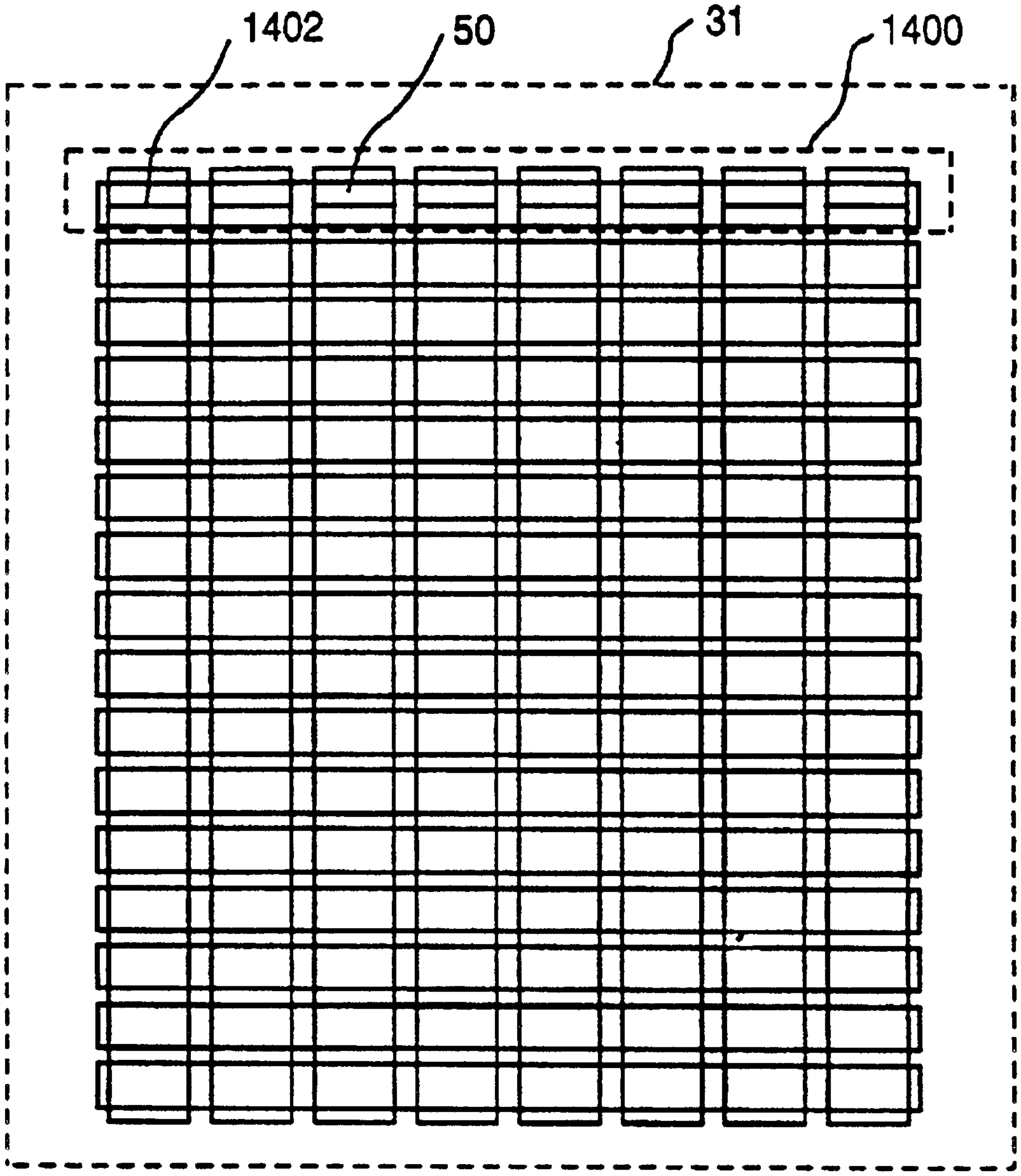
Figures 1, 109:
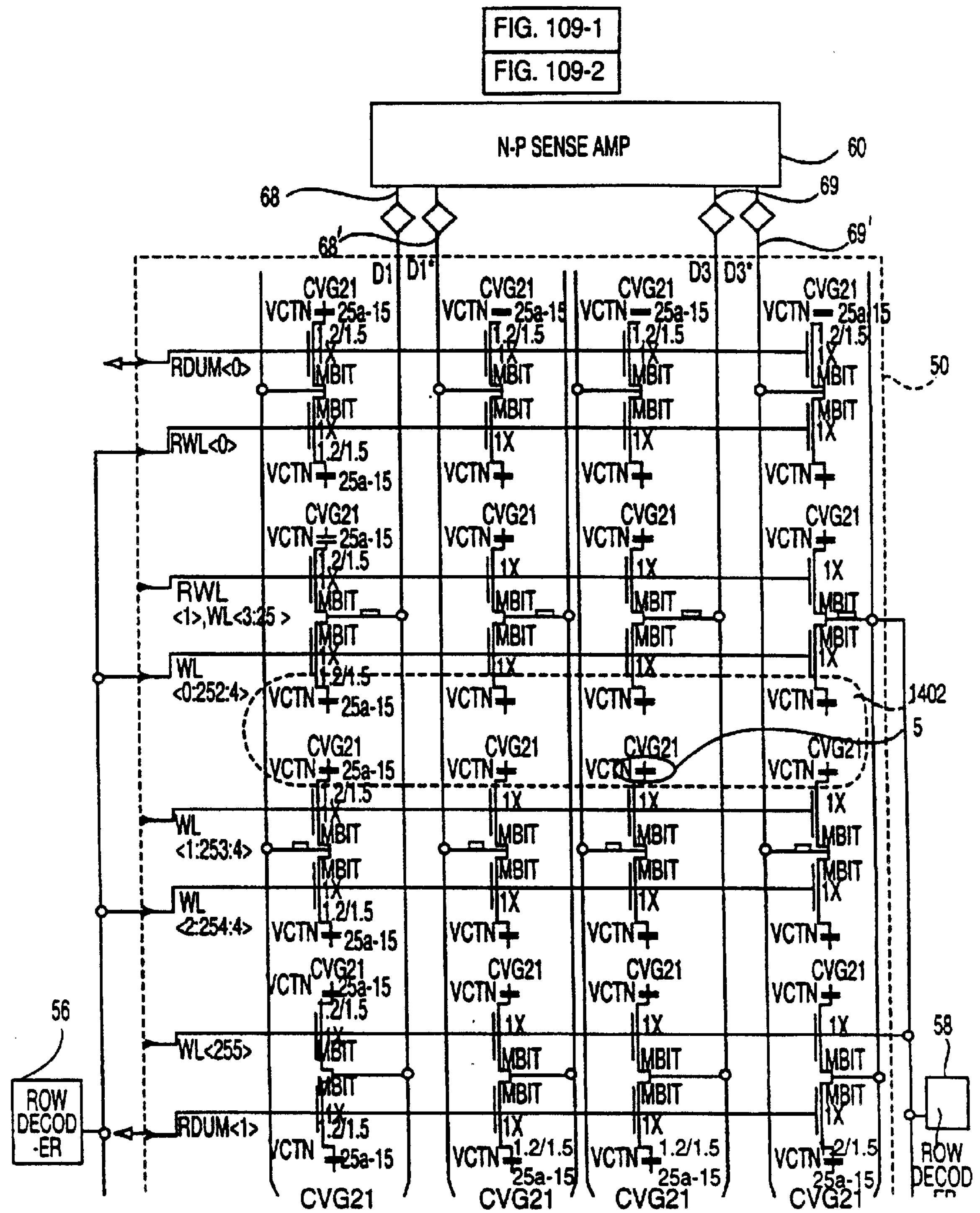
Figures 2, 109:
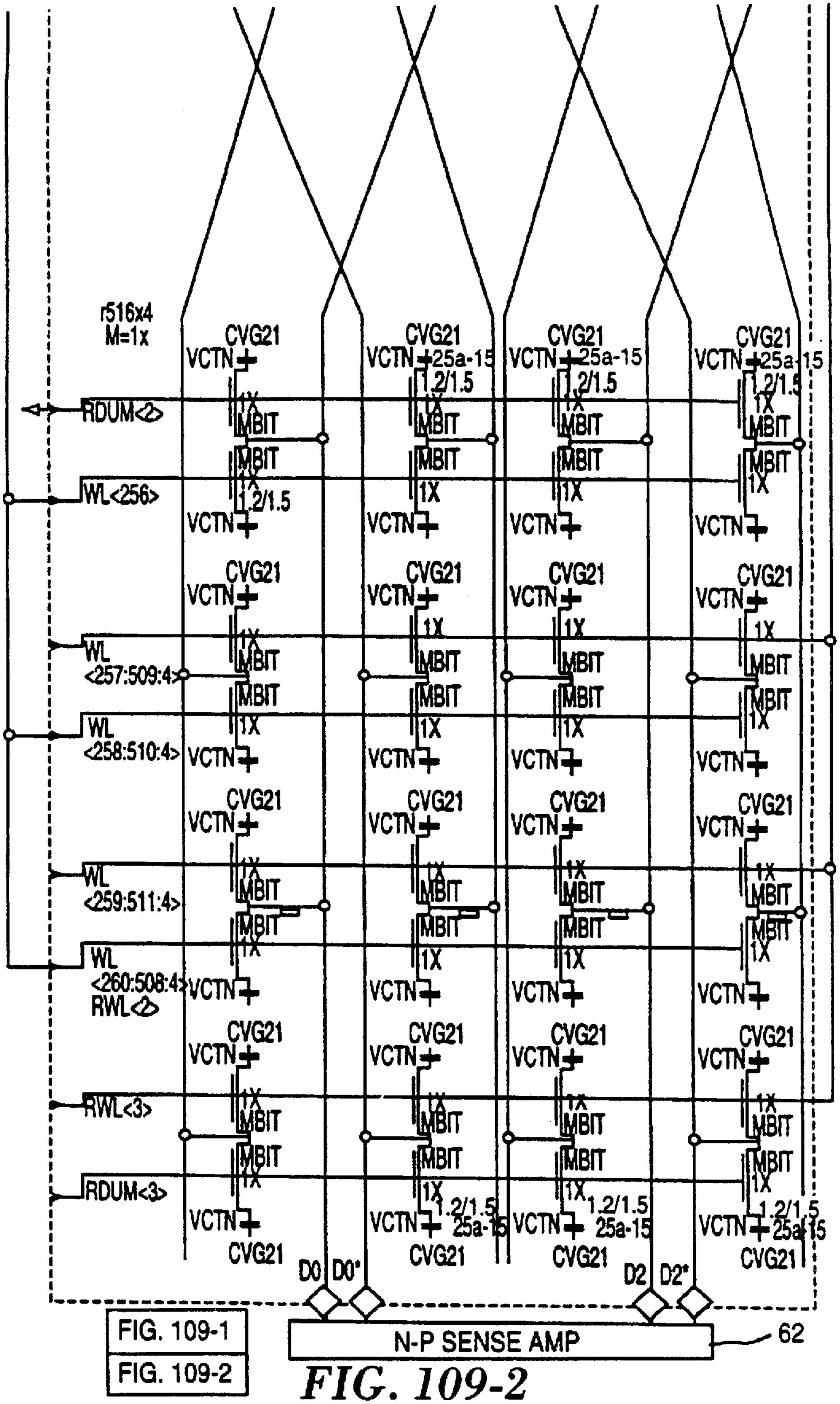
Figure 110:
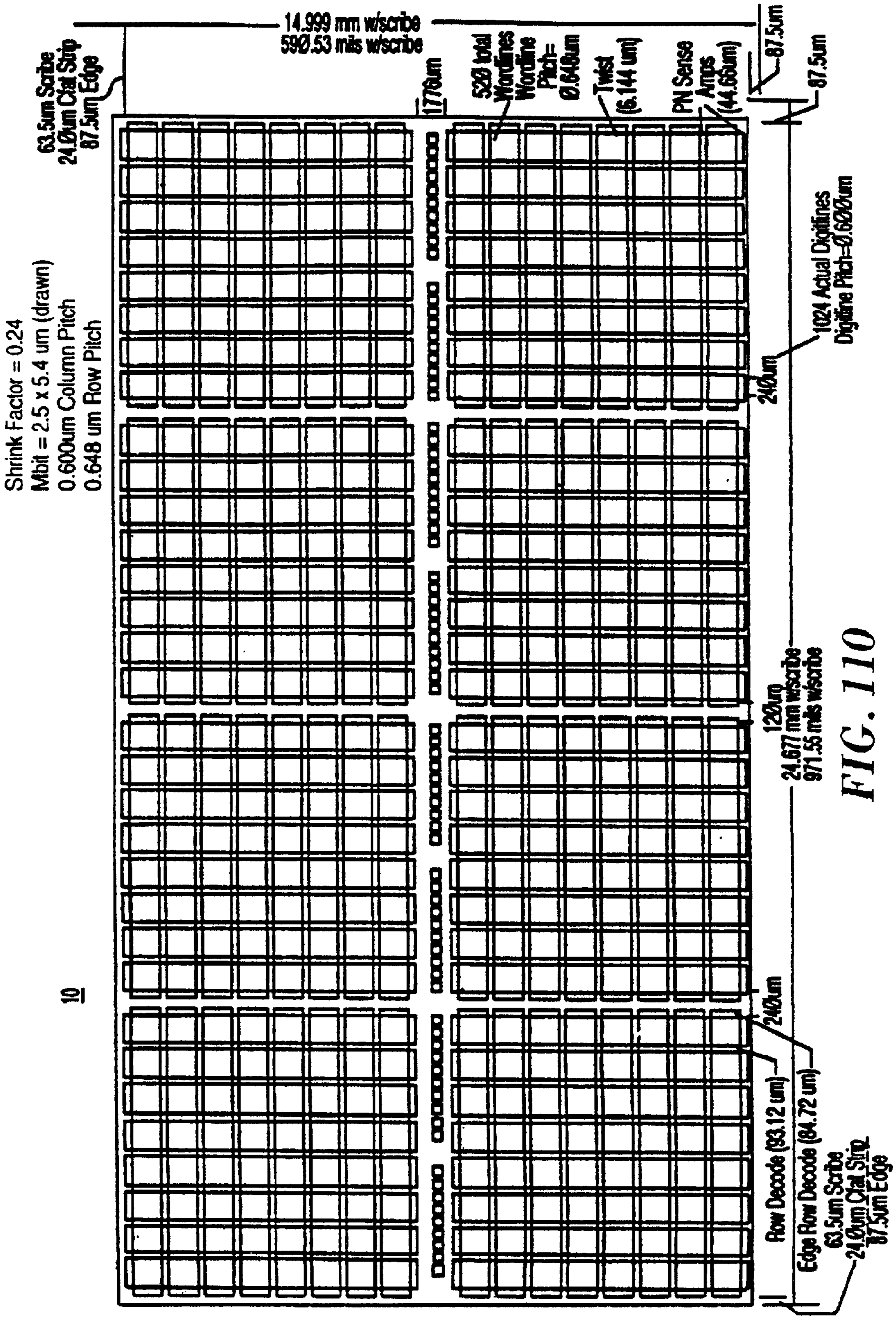
Figure 111:
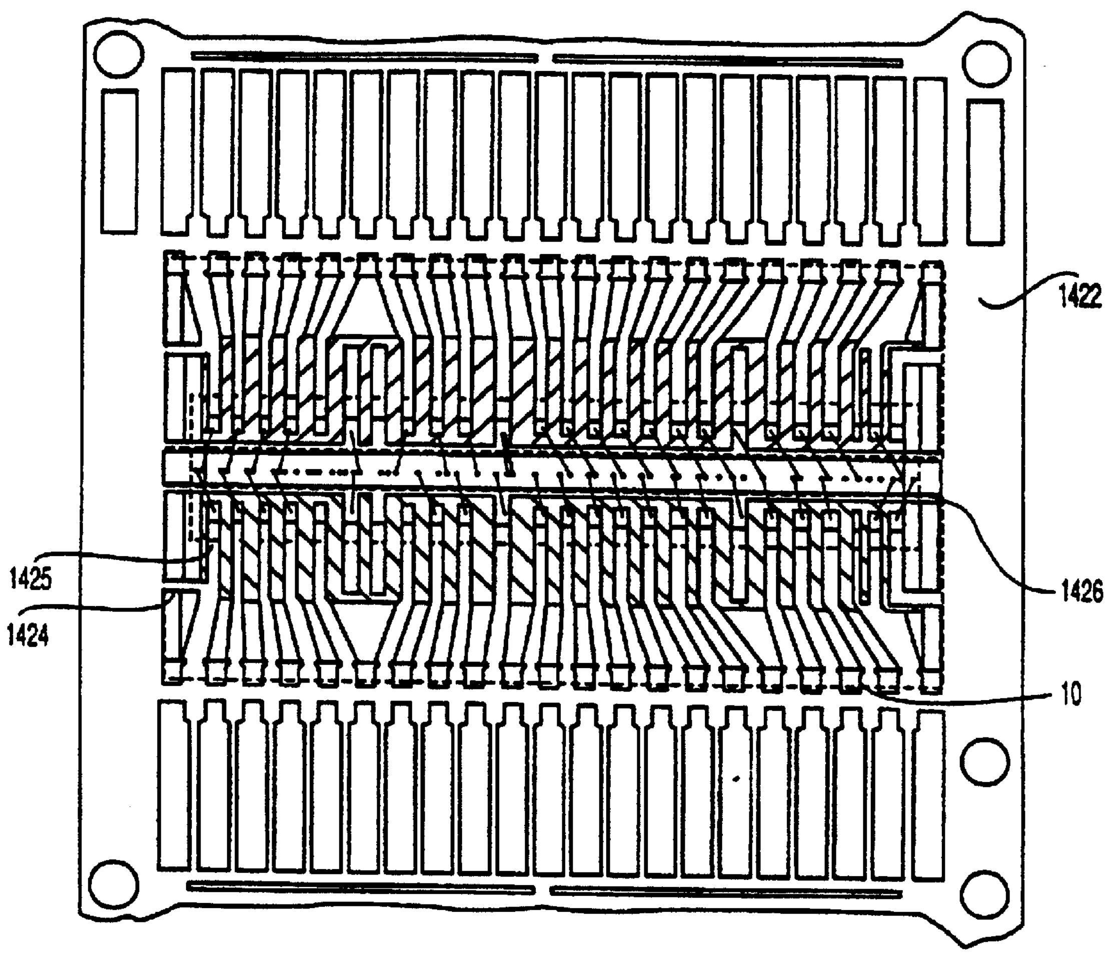
Figure 112:
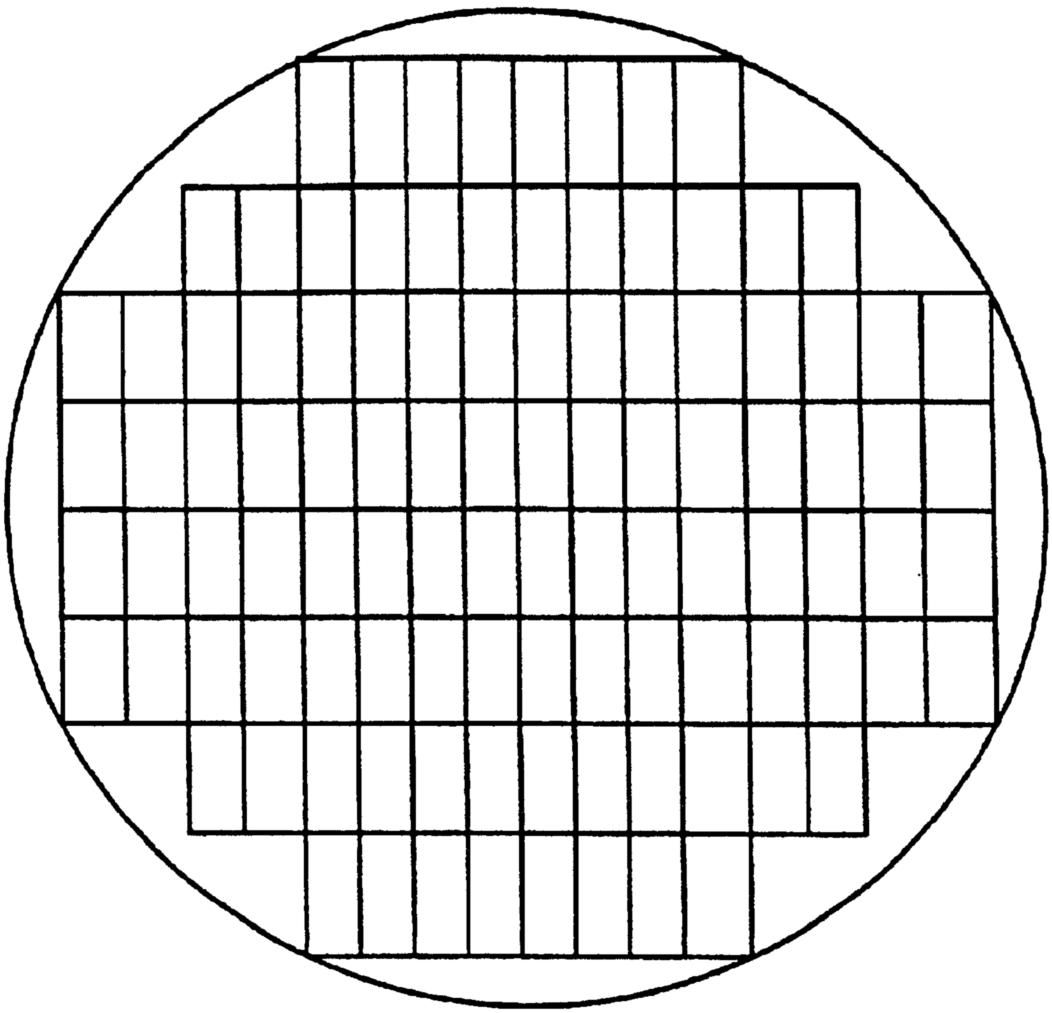
Figure 113:
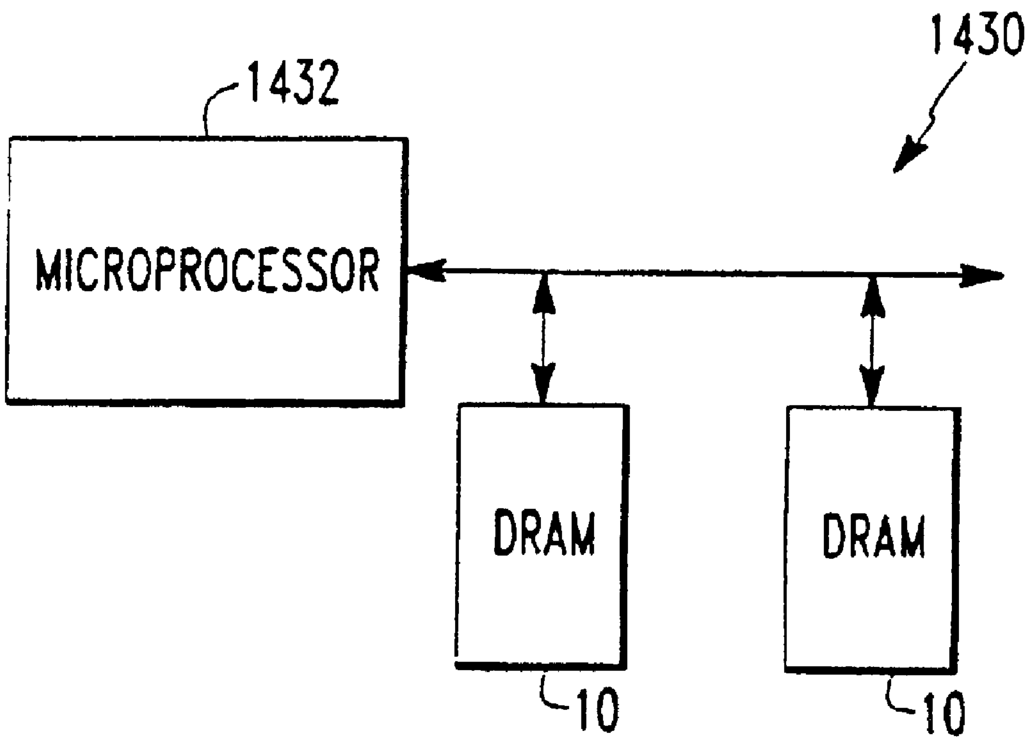

FIG. 97 illustrates the array data topology;

FIG. 98 illustrates the details of one of the memory cells shown in FIG. 97;

FIG. 99 is a diagram illustrating the states of a powerup sequence circuit which may be used to control powerup of the present invention;

FIG. 100 is a block diagram of the powerup sequence circuit and alternative components;

FIG. 101A illustrates the details of the voltage detector shown in FIG. 100;

FIGS. 101B and 101C are voltage diagrams illustrating the operation of the voltage detector shown in FIG. 101A;

FIG. 101D illustrates the details of the reset logic shown in FIG. 100;

FIG. 101E illustrates one of the delay circuits shown in FIG. 101D;

FIG. 101F illustrates the details of one of the RC timing circuits shown in FIG. 100;

FIG. 101G illustrates the details of the other of the RC timing circuits shown in FIG. 100;

FIG. 101H illustrates the details of the output logic shown in FIG. 100;

FIG. 101I illustrates the details of the bond option shown in FIG. 100;

FIG. 101J illustrates the details of the state machine circuit in FIG. 100;

FIG. 102A is a timing diagram illustrating the externally-supplied voltage Vccx associated with the powerup sequence circuit shown in FIG. 100;

FIG. 102B is a timing diagram illustrating the signal UNDERVOLT* associated with the powerup sequence circuit shown in FIG. 100;

FIG. 102C is a timing diagram illustrating the signal CLEAR* associated with the powerup sequence circuit shown in FIG. 100;

FIG. 102D is a timing diagram illustrating the signal VBBON associated with the powerup sequence circuit shown in FIG. 100;

FIG. 102E is a timing diagram illustrating the signal DVC2EN* associated with the powerup sequence circuit shown in FIG. 100;

FIG. 102F is a timing diagram illustrating the signal DVC2OKR associated with the powerup sequence circuit shown in FIG. 100;

FIG. 102G is a timing diagram illustrating the signal VCCPEN* associated with the powerup sequence circuit shown in FIG. 100;

FIG. 102H is a timing diagram illustrating the signal VCCPON associated with the powerup sequence circuit shown in FIG. 100;

FIG. 102I is a timing diagram illustrating the signal PWRRAS* associated with the powerup sequence circuit shown in FIG. 100;

FIG. 102J is a timing diagram illustrating the signal RASUP associated with the powerup sequence circuit shown in FIG. 100;

FIG. 102K is a timing diagram illustrating the signal PWRDUP* associated with the powerup sequence circuit shown in FIG. 100;

FIG. 103 is a test mode entry timing diagram;

FIG. 104 is a timing diagram illustrating the ALLROW high and HALFROW high test modes;

FIG. 105 is a timing diagram illustrating the output of information when the chip is in a test mode;

FIG. 106 is a timing diagram illustrating the timing of the REGPRETM test mode;

FIG. 107 is a timing diagram illustrating the timing of the OPTPROG test mode;

FIG. 108 is reproduction of FIG. 4 illustrating an array slice to be discussed in connection with the all row high test mode;

FIG. 109 is a reproduction of FIG. 6A with the sense amps and the row decoders illustrated for purposes of explaining the all row high test mode;

FIG. 110 identifies various exemplary dimensions for the chip of the present invention;

FIG. 111 illustrates the bonding connections between the chip and the lead frame;

FIG. 112 illustrates a substrate carrying a plurality of chips constructed according to the teachings of the present invention; and FIG. 113 illustrates the DRAM of the present invention used in a microprocessor based system.

MICROFICHE APPENDIX

Figure 1:
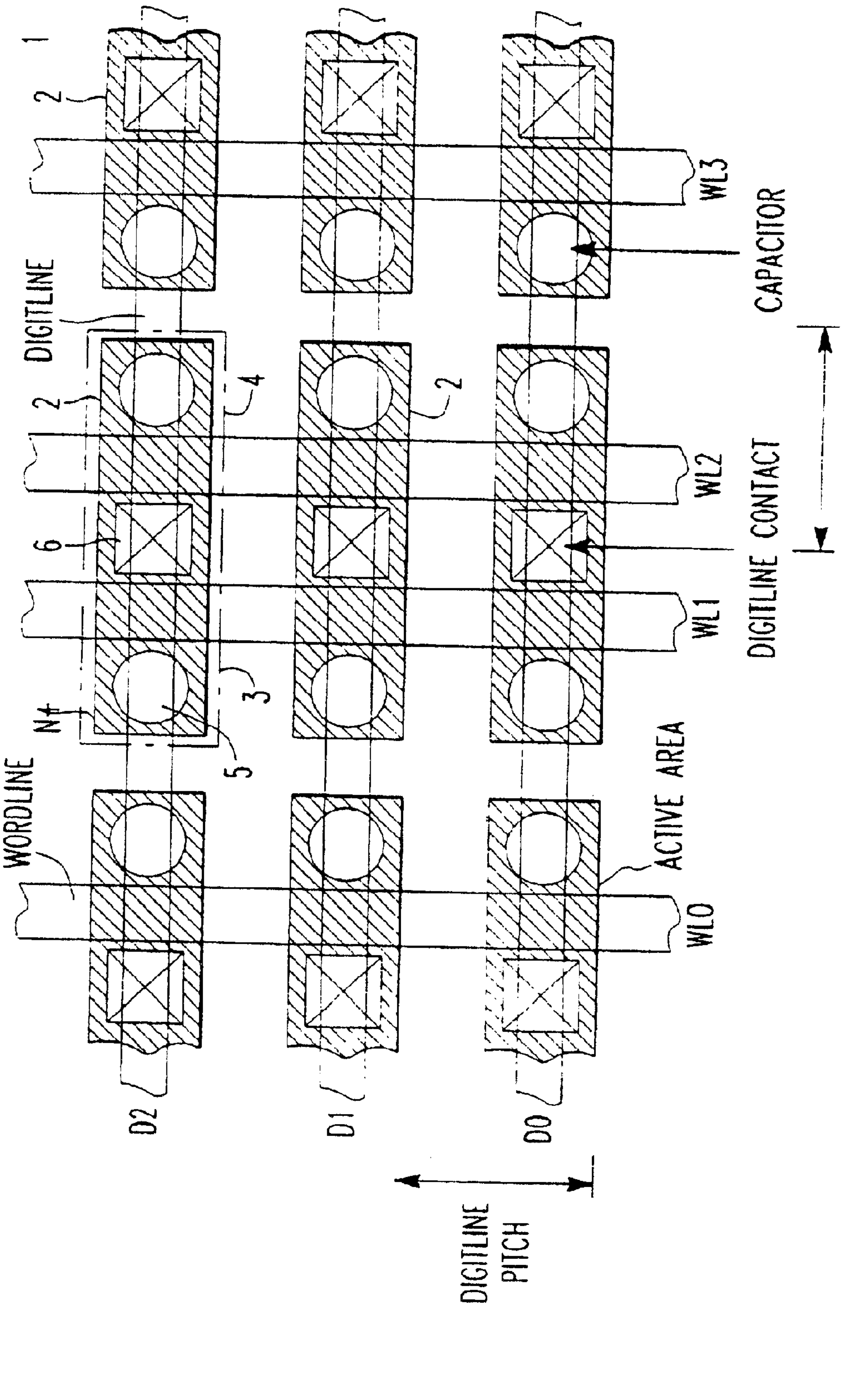
FIG. 1 illustrates the topology of one type of array architecture found in the prior art.

Reference is hereby made to an appendix which contains eleven microfiche having a total of sixty-six frames. The appendix contains 44 drawings which illustrate substantially the same information as is shown in FIGS. 1–113, but in a more connected format.

DESCRIPTION OF THE PREFERRED EMBODIMENTS

For convenience, this Description of the Preferred Embodiments is divided into the following sections:

I. Introduction
II. 256 Meg DRAM Architecture
III. Array Architecture
IV. Data and Test Paths
V. Product Configuration and Exemplary Design Specifications
VI. Bus Architecture
VII. Voltage Supplies
VIII. Center Logic
IX. Global Sense Amp Drivers
X. Right and Left Logic
XI. Miscellaneous Figures
XII. Conclusion I. Introduction In the following description, various aspects of the disclosed memory device are depicted in different figures, and often the same component is depicted in different ways and/or different levels of detail in different figures for the purposes of describing various aspects of the present invention. It is to be understood, however, that any component depicted in more than one figure retains the same reference numeral in each.

Regarding the nomenclature to be used herein, throughout this specification and in the figures, "CA<x>" and "RA<y>" are to be understood as representing bit x of a given column address and bit y of a given row address, respectively. References to DLa<0>, DLb<0>, DLc<0>, and DLd<0> will be understood to represent the least significant bit of an n bit byte coming from four distinct memory locations.

It is to be understood that the various signal line designations are used consistently in the figures, such that the same signal line designation (e.g., "Vcc", "CAS," etc . . . ) appearing in two or more figures is to be interpreted as indicating a connection between the lines that they designate in those figures, in accordance with conventional practice relating to schematic, wiring, and/or block diagrams. Finally, a signal having an asterisk indicates that that signal is the logical complement of the signal having the same designation but without the asterisk, e.g., CMAT* is the logical complement of the column match signal CMAT.

There are a number of voltages used through the DRAM of the present invention. The production of those voltages is described in detail in Section VII—Supply Voltages. However, the voltages appear throughout the figures and in some instances are discussed in conjunction with the operation of specific circuits prior to Section VII. Therefore, to minimize confusion, the various voltages will now be introduced and defined.

Vccx—externally supplied voltage

Vccq—power for the data output pad drivers

Vcca—array voltage (produced by voltage regulator 220 shown in FIG. 35)

Vcc—peripheral voltage (produced by voltage regulator 220 shown in FIG. 35)

Vccp—boosted version of Vcc used for biasing the wordlines (produced by the Vccp pump 400 shown in FIG. 39)

Vbb—back bias voltage (produced by the Vbb pump 280 shown in FIG. 37)

Vss—nominally ground (externally supplied)

Vssq—ground for the data output pad drivers

DVC2—one half of Vcc used for biasing the digitlines (produced by the DVC2 generators 500–507 shown in FIG. 41)

AVC2—one half of Vcc used as the cellplate voltage (has the same value as DVC2)

The prefix "map" before a voltage or signal indicates that the voltage or signal is switched, i.e., it can be turned on or off.

Certain of the components and/or signals identified in the description of the preferred embodiment are known in the industry by other names. For example, the conductors in the array which are referred to in the Description of the Preferred Embodiments as digitlines are sometimes referred to in the industry as bitlines. The term "column" actually refers to two conductors which comprise the column. Another example is the conductor which is referred to herein as a rowline. That conductor is also known in the industry as a wordline. Those of ordinary skill in the art will recognize that the terminology used herein is used for purposes of explaining exemplary embodiments of the present invention and not for limiting the same. Terms used in this document are intended to include the other names by which signals or parts are commonly known in the industry.

II. 256 Meg DRAM Architecture

FIG. 2 is a high level block diagram illustrating a 256 Meg DRAM 10 constructed according to the teachings of present invention. Although the following description is specific to this presently preferred embodiment of the invention, it is to be understood that the architecture and circuits of the present invention may be advantageously applied to semiconductor memories of different sizes, both larger and smaller in capacity. Additionally, certain circuits disclosed herein, such as the powerup sequence circuit, voltage pumps, etc. may find uses in circuits other than memory devices.

In FIG. 2, the chip 10 is comprised of a main memory 12. Main memory 12 is comprised of four equally sized array quadrants numbered consecutively, beginning with array quadrant 14 in the upper right hand corner, array quadrant 15 in the bottom right hand corner, array quadrant 16 in the bottom left hand corner, and array quadrant 17 in the upper left hand corner. Between array quadrant 14 and array quadrant 15 is situated right logic 19. Between the array quadrant 16 and the array quadrant 17 is situated left logic 21. Between the right logic 19 and the left logic 21 is situated center logic 23. The center logic 23 is discussed in greater detail hereinbelow in Section VIII. The right and left logic 19 and 21, respectively, are described in greater detail hereinbelow in Section X.

The array quadrant 14 is illustrated in greater detail in FIGS. 3A–3E. Each of the other array quadrants 15, 16, 17, is identical in construction and operation to the array quadrant 14. Therefore, only the array quadrant 14 will be described in detail.

The array quadrant 14 is comprised of a left 32 Meg array block 25 and a right 32 Meg array block 27. The array blocks 25 and 27 are identical. The signals destined for or output from left 32 Meg array block 25 carry an L in their designation whereas the signals destined for or output from right 32 Meg array block 27 carry an R in their designation. A global sense amp driver 29 is located between left array block 25 and right array block 27. Returning briefly to FIG. 2, the array quadrant 15 is comprised of a left 32 Meg array block 31, a right 32 Meg array block 33, and a global sense amp driver 35. Array quadrant 16 is comprised of a left 32 Meg array block 38, a right 32 Meg array block 40, and a global sense amp driver 42. Array quadrant 17 is comprised of a left 32 Meg array block 45, a right 32 Meg array block 47, and a global sense amp driver 49. Because there are two 32 Meg array blocks in each of the four array quadrants, there are thus eight 32 Meg array blocks carried on the chip 10.

It is seen from FIG. 3A that the left 32 Meg array 25 can be physically disconnected from the various voltage supplies that supply voltage to the array 25 by controlling the condition of switches 48. The switches 48 control the application of the switched array voltage (mapVcca), the switched, boosted, array voltage (mapVccp), (the switch 48 associated with mapVccp is not shown in the figure), the switched digitline bias voltage (mapDVC2), and the switched, cellplate bias voltage (mapAVC2). The 32 Meg array 25 also includes one or more decoupling capacitors 44. The purpose of the decoupling capacitors is to provide a capacitive load for the voltage supplies as will be described hereinbelow in greater detail in Section VII. For now, it is sufficient to note the that the decoupling capacitor 44 is located on the opposite side of the switch from the voltage supplies. The right 32 Meg array 27, and all the other 32 Meg arrays 31, 33, 38, 40, 45, and 47 are similarly provided with decoupling capacitors 44 and switched versions of the array voltage, boosted array voltage, digitline bias voltage, and cellplate bias voltage.

III. Array Architecture

FIG. 4 is a block diagram of the 32 Meg array block 25 which illustrates an 8×16 array of individual arrays 50, each 256 k, which make up the 32 Meg array block 25. Between each row of individual arrays 50 are positioned sense amplifiers 52. Between each column of individual arrays 50 are positioned row decoders 54. In the gaps, multiplexers 55 are positioned. The portion of the figure shaded in FIG. 4 is illustrated in greater detail in FIG. 5.

In FIG. 5, one of the individual arrays 50 is illustrated. The individual array 50 is serviced by a left row decoder 56 and a right row decoder 58. The individual array 50 is also serviced by a "top" N-P sense amplifier 60 and a "bottom" N-P sense amplifier 62. A top sense amp driver 64 and a bottom sense amp driver 66 are also provided.

Between the individual array 50 and the N-P sense amp 60 are a plurality of digit lines, two of which 68, 68' and, 69, 69' are shown. As is known in the art, the digitlines extend through the array 50 and into the sense amp 60. The digitlines are a pair of lines with one of the lines carrying a signal and the other line carrying the complement of the signal. It is the function of the N-P sense amp 60 to sense a difference between the two lines. The sense amplifier 60 also services the 256 k array located above the array 50, which is not shown in FIG. 5, via a plurality of digitlines, two of which, 70, 70' and 77, 71', are shown. The upper N-P sense amp 60 places the signals sensed on the various digitlines onto I/O lines 72, 72', 74, 74'. (Like the digitlines, the I/O lines designated with a prime carry the complement of the signal carried by the I/O line bearing the same reference number but without the prime designation.) The I/O lines run through multiplexers 76, 78 (also referred to as muxes). The mux 76 takes the data on the I/O lines 72, 72', 74, 74' and places the data on datalines. Datalines 79, 79', 80, 80', 81, 81', 82, 82' are responsive to mux 76. (The same designation scheme used for the I/O lines applies to the datalines, e.g., dataline 79' carries the complement of the signal carried on dataline 79.)

In a similar fashion, N-P sense amp 62 senses signals on the digitlines represented generally by reference numbers 86, 87 and places signals on I/O lines represented generally by reference No. 88 which are then input to multiplexers 90 and 92. The multiplexer 90, like the multiplexer 76, places signals on the datalines 79, 79', 80, 80', 81, 81', 82, 82'.

The 256 k individual array 50 illustrated in the block diagram of FIG. 5 is illustrated in detail in FIG. 6A. The individual array 50 is comprised of a plurality of individual cells which may be as described hereinabove in conjunction with FIG. 1. The individual array 50 may include a twist, represented generally by reference number 84, as is well known in the art. Twisting improves the signal-to-noise characteristics. There are a variety of twisting schemes used in the industry, e.g., single standard, triple standard, complex, etc., any of which may be used for the twist 84 illustrated in FIG. 6A. (The reader seeking more detail regarding the construction of the array 50 is directed to FIG. 97 which is a topological view of the array 50, and the description associated therewith, and FIG. 98, which is a view of a cell, and the description associated therewith.)

FIG. 6B illustrates the row decoder 56 illustrated in FIG. 5. The purpose of the row decoder 56 is to fire one of the wordlines within individual array 50 which is identified in address information received by the chip 10. The use of local row decoders enables sending the full address and eliminates a metal layer. Those of ordinary skill in the art will understand the operation of the row decoder 56 from an examination of FIG. 6B. However, it is important to note that the RED (redundant) line runs through the sense amp 60 in metal 2, and is input to an lph driver circuit 96 and a redundant wordline driver circuit 97 in row decoder 56 for the purpose of turning off the normal wordline and turning on the redundant wordline.

FIG. 6C illustrates the sense amplifier 60 shown in FIG. 5 in detail. The purpose of the sense amplifier 60 is to sense the difference between, for example, digitline 68, 68' to determine if the storage element whose wordline is fired and that is connected to digitline 68, 68' has a logic "1" or a logic "0" stored therein. In the design illustrated in FIG. 6C, the sense amps are located inside isolation transistors 83. It is necessary to gate the isolation transistors 83 with a sufficiently high voltage to enable the isolation transistors 83 to conduct a full Vcc to enable a write of a full "one" into the device. It is, thus, necessary to gate the transistors 83 high enough to pass the voltage Vcc and not the voltage Vcc-Vth. Therefore, the boosted voltage Vccp is used to gate the isolation transistors 83. The operation of the sense amplifier 60 will be understood by those of ordinary skill in the art from an examination of FIG. 6C.

FIG. 6D illustrates the array multiplexer 78 and the sense amp driver 64 shown in FIG. 5 in detail. As previously mentioned, the purpose of the multiplexer 78 is to determine which signals available on the array's I/O lines are to be placed on the array's datalines. That may be accomplished by programming the switches in the area generally designated 63. Such "softswitching" allows for different types of mapping without requiring hardware changes. The sense amp driver 64 provides known control signals, e.g.. ACT, ISO, LEQ, etc., to N-P sense amplifier 60. From the schematic illustrated in FIG. 6D, the construction and operation of the array multiplexer 78 and sense amp driver 64 will be understood.

IV. Data and Test Paths

The data read path begins, of course, in an individual storage element within one of the 256 k arrays. The data in that element is sensed by an N-P sense amplifier, such as sense amplifier 60 in FIG. 6C. Through proper operation of the I/O switches 85 within N-P sense amplifier 60, that data is then placed on I/O lines 72, 72', 74, 74'. Once on the I/O lines, the data's "journey" to the output pads of the chip 10 begins.

Turning now to FIG. 7, the 32 Meg array 25 shown in FIG. 4 is illustrated. In FIG. 7, the 8×16 array of 256 k individual arrays 50 is again illustrated. The lines running vertically in FIG. 7 between the columns of arrays 50 are data lines. Recall from FIG. 5 that the row decoders are also positioned between the columns of individual arrays 50. In FIG. 6B, the detail is illustrated as to how the datalines route through the row decoders. In that manner, the row decoders are used for wordline driving as is known in the art, and to provide "streets" for dataline routing to the peripheral circuits.

Returning to FIG. 7, the lines running horizontally between rows of individual arrays 50 are the I/O lines. The I/O lines must route through the sense amplifiers, as shown in FIG. 6C, because the sense amplifiers are also located in the space between the rows of arrays 50. Recall that it is the function of the multiplexers as described hereinabove in conjunction with FIG. 5 to take signals from the I/O lines and place them on the datalines. The positioning of the multiplexers within the array 25 is illustrated in FIG. 7. In FIG. 7, nodes 94 indicate the positioning of a multiplexer of the type shown in FIG. 6D at an intersection of the I/O lines with the datalines. As will be appreciated from an examination of FIG. 7, the I/O lines, which route through the sense amplifiers, extend across two arrays 50 before being input to a multiplexer. That architecture permits a 50% reduction in the number of data muxes required in the gap cells. The data muxes are carefully programmed to support the firing of only two rows, separated by a predetermined number of arrays, per 32 Meg block without data contention on the datalines. For example, rows may be fired in arrays 0 and 8, 1 and 9, etc. Both fire and repairs are done on the same associated groups. Additionally, as previously mentioned, the architecture of the present invention routes the redundant wordline enable signal (shown in FIG. 6B) through the sense amp strip in metal 2 to ensure quick deselection of the normal row. Finally, normal phase lines are remapped, as shown in FIG. 61, to appropriate redundant wordline drivers for efficient reuse of signals.

The architecture illustrated in FIG. 7 is, of course, repeated in the other 32 Meg array blocks 27, 31, 33, 38, 40, 45, 47. Use of the architecture illustrated in FIG. 7 allows the data to be routed directly to the peripheral circuits which shortens the data path and speeds part operation. Second, doubling the I/O line length by appropriately positioning the multiplexers simplifies the gap cell layout and provides a convenient framework for 4 k operation, i.e., two rows per 32 Meg block. Third, sending the RED signal through the sense amp is faster when combined with the phase signal remapping discussed above.

After the data has been transferred from the I/O lines to the data lines, that data is next input to an array I/O block 100 as shown in FIG. 8. The array I/O block 100 services the array quadrant 14 illustrated in FIG. 2. In a similar fashion, an array I/O block 102 services array quadrant 15; an array I/O block 104 services array quadrant 16; an array I/O block services array quadrant 17. Thus, each of the array I/O blocks 100, 102, 104, 106 serves as the interface between the 32 Meg array blocks in each of the quadrants and the remainder of the data path illustrated in FIG. 8.

In FIG. 8, after the array I/O blocks, the next element in the data read path is a data read mux 108. The data read mux 108 determines the data to be input to an output data buffer 110 in response to control signals produced by a data read mux control circuit 112. The output data buffer 110 outputs the data to a data pad driver 114 in response to a data out control circuit 116. The data pad driver 114 drives a data pad to either Vccq or Vssq to represent a logic level "1" or a logic level "0", respectively, on the output pad.

With respect to the write data path, that data path includes a data in buffer 118 under the control of a data in buffer control circuit 120. Data in the data in buffer 118 is input to a data write mux 122 which is under the control of a data write mux control circuit 124. From the data write mux 122, the input data is input to the array I/O blocks 100, 102, 104, 106 and ultimately written into array quadrants 14, 15, 16, 17, respectively, according to address information received by chip 10.

The data test path is comprised of a data test block 126 and a data path test block 128 connected between the array I/O blocks 100, 102, 104, 106 and the data read mux 108.

Completing the description of the block diagram of FIG. 8, a data read bus bias circuit 130, a DC sense amp control circuit 132, and a data test DC enable circuit 134 are also provided. The circuits 130, 132, and 134 provide control and other signals to the various blocks illustrated in FIG. 8. Each of the blocks illustrated in FIG. 8 will now be described in more detail.

One of the array blocks 100 is illustrated in block diagram form in FIG. 9 and as a wiring schematic in FIGS. 10A–10D. The I/O block 100 is comprised of a plurality of data select blocks 136. An electrical schematic of one type of data select block 136 that may be used is illustrated in FIG. 11. In FIG. 11, the EQIO line is fired when the columns are to be charged or for a write recovery. When the two transistors 137 and 138 are conductive, the voltage on the lines LIOA and LIOA* are clamped to one Vth below Vcc.

Returning to FIG. 9, the I/O block 100 is also comprised of a plurality of data blocks 140 and data test comp circuits 141. The data test comp circuits 141 are described hereinbelow in conjunction with FIG. 25. A type of data block 140 that may be used is shown in detail in the electrical schematics of FIGS. 12A and 12B. The data blocks 140 may contain, for example, a write driver 142 illustrated in FIG. 12A, and a DC sense amp 143 illustrated in FIG. 12B. The write driver 142 is part of the write data path while the DC sense amp 143 is part of the data read path.

The write driver 142, as the name implies, writes data into specific memory locations. The write driver 142 is connected to only one set of I/O lines, although multiple sets of I/O lines may be fed by a single write driver circuit via muxes. The write driver 142 uses a tri-state output stage to connect to the I/O lines. Tri-state outputs are necessary because the I/O lines are used for both read and write operations. The write driver 142 remains in a high impedance state unless the signal labeled WRITE is high, indicating a write operation. As shown in FIG. 12A, the write driver 142 is controlled by specific column addresses, the WRITE signal, and Data Write (DW) Signal.

The write driver 142 also receives topinv and topinv*. The purpose of the topo signals is to ensure that a logical one is written when a logical one is input to the part. The topo decoder circuit, which produces the topo signals, knows what m-bits are connected to the digit and digit* lines. The topo decoder circuit is illustrated in FIG. 95. Each array I/O block gets four topo signals.

The drive transistors are sized large enough to ensure a quick, efficient, write operation, which is important because the array sense amplifiers usually remain on during a write cycle. The signals placed on the IOA, IOA* lines in FIG. 12A are the signals (LIOA, LIOA*) input to the data select block 136 as illustrated in the upper left hand corner of FIG. 11.

The DC sense amplifier 143 illustrated in FIG. 12B is sometimes referred to as a data amplifier or read amplifier. Such an amplifier is an important component even though it may take a variety of configurations. The purpose of the DC sense amp 143 is to provide a high speed, high gain, differential amplifier for amplifying very small read signals appearing on the I/O lines into full CMOS data signals used in the data read mux 108. In most designs, the I/O lines connected to the sense amplifiers are very capacitive. The array sense amplifiers have very limited drive capability and are unable to drive those lines quickly. Because the DC sense amp has a very high gain, it amplifies even the slightest separation of the I/O lines into full CMOS levels, essentially gaining back any delay associated with the I/O lines. The illustrated sense amp is capable of outputting full rail-to-rail signals with input signals as small as 15 mV.

As illustrated in FIG. 12B, the DC sense amp 143 consists of four differential pair amplifiers and self biasing CMOS stages 144, 144', 145, 145'. The differential pairs are configured as two sets of balanced amplifiers. The amplifiers are built with an nMOS differential pair using pMOS active loads and nMOS current mirrors. Because the nMOS transistors have higher mobility providing for smaller transistors and lower parasitic loads, nMOS amplifiers usually provide faster operation than pMOS amplifiers. Furthermore, Vth matching is usually better for nMOS transistors providing for a more balanced design. The first set of amplifiers is fed with the signals from the I/O lines from the array (IOA*, IOA) while the second set of amplifiers is fed with output signals from the first pair labeled DAX, DAX*. Bias levels into each stage are carefully controlled to provide optimum performance.

The outputs from the second stage, labeled DAY, feed into self biasing CMOS inverter stages 147, 147' which provide for fast operation. The final output stage is capable of tri-state operation to allow multiple sets of DC sense amps to drive a given set of data read lines (DR <n> and DR* <n>). The entire DC sense amplifier 143 is equilibrated prior to operation, including the self-biasing CMOS inverter stages 147, 147', by the signals labeled EQSA, EQSA*, and EQSA2. Equilibration is necessary to ensure that the DC sense amplifier 143 is electrically balanced and properly biased before the input signals are applied. The DC sense amplifier 143 is enabled whenever the enable sense amp signal ENSA* is brought low, turning on the output stage and the current mirror bias circuit 148 (seen in FIG. 12A), which is connected to the differential amplifiers via the signal labeled CM.

In FIG. 12B, the production of the signals DRT and DRT* is shown in the left-hand portion of the figure. The signals DRT and DRT* are used for data compression testing and cause the normal data path to be bypassed.

The data block 140 requires a number of control signals to ensure proper operation. Those signals are generated by the DC sense amp control circuit 132 illustrated in FIG. 8. The details of the DC sense amp control circuit 132 are shown in the electrical schematics of FIGS. 13A and 13B. In FIGS. 13A and 13B, a number of signals are received which, through the proper combination of logic gates as shown in the figure, are combined to produce the necessary control signals for the data block 140. It is seen in FIG. 13A that the DC sense amp control circuit 132 includes a mux decode A circuit 150 and a mux decode B circuit 151. Electrical schematics of one type of such circuits which may be utilized are provided in FIGS. 14 and 15, respectively. Mux decode A circuit 150 and mux decode B circuit 151 use row addresses to determine which datalines from the array will be used for read/write access in each array block. Thus, the mux decode A circuit 150 and the mux decode B circuit 151 produce signals for controlling the muxes found within the array IO blocks 100, 102, 104, and 106.

The purpose of the data blocks 140 when in the read mode is to place data coming from the data select blocks 136 from the data lines coming out of the array onto the lines which feed into the data read mux 108 of FIG. 8. The data read mux 108 is illustrated in detail in FIGS. 16A, 16B, and 16C. The purpose of the data read muxes is to provide more part flexibility by enabling data output buffer 110 to be responsive to more data. For example, for ×16 operation, each output buffer 110 has access to only one data read (DR) line pair. For ×8 operation, the eight output buffers 110 each have two pairs of data read lines available, doubling the quantity of mbits accessible by each output buffer. Similarly, for ×4 operation, the four output buffers have four pairs of data read lines available, again doubling the quantity of mbits available for each output. For those configurations with multiple pairs available, address lines control which data read line pair is connected to a data buffer.

The data read mux 108 receives control signals from data read mux control circuit 112, an electrical schematic of one type being illustrated in FIG. 17. The purpose of the data read mux control circuit 112 is to produce control signals to enable data read mux 108 to operate so as to select the appropriate data signals for output to data buffer 110. Note in FIG. 17 the change in signal notation from DR for the input signals to LDQ for the output signals of the Mux 108.

An electrical schematic of data buffer 110 is provided in FIG. 18. The control signals used to control the operation of the data output buffer 110 are generated by the data output control circuit 116, an electrical schematic of which is illustrated in FIG. 19. The data output control circuit 116 is one type which may be employed; other types of control circuits may be used.

Returning to FIG. 18, the data output buffer 110 is comprised of a latch circuit 160 for receiving data which is to be output. The latch circuit 160 frees the DC sense amp 143 and other circuits upstream to get subsequent data for output. The input to the latch is connected to the LQD, LQD* signals coming from the data read mux 108. Latch circuits 160 appear in a variety of forms, each serving the needs of a specific application or architecture. The data path may, of course, contain additional latches in support of special modes of operation, such as burst mode.

A logic circuit 162 is responsive to the latch 160 for controlling the condition, conductive or nonconductive, of a plurality of drive transistors in a drive transistor section 164. By proper operation of the drive transistors in drive transistor section 164, a pullup terminal 167 can be pulled up to the voltage Vcc and a pulldown terminal 183 can be pulled down to ground. The signals PUP and PDN available at terminals 167 and 183, respectively, are used to control the data pad driver 114 shown in FIG. 20. If both the PUP terminal and the PDN terminal are pulled low, a tri-state or high impedance condition results.

To ensure sufficient voltage is available at the gate of the output drive transistor responsible for pulling the PUP terminal up, a boot capacitor 168 is used. To charge the boot capacitor 168 and also to avoid the effects of inherent leakage, the capacitor 168 is held at its booted up or fully charged level by a holding transistor 170. The holding transistor is connected to the boosted voltage Vccp, which is greater than the voltage Vcc, and which may be developed by a voltage pump of the type described hereinbelow. Upon a change of state, the boot capacitor 168 is unbooted. In prior art circuits, because of transient effects, the holding transistor 170 was prone to continue to conduct and draw power from the voltage pump although the boot capacitor was unbooted, or in the process of being unbooted. That condition is undesirable, and this aspect of the present invention addresses and solves that problem by providing a self-timed path 172. The self-timed path ensures the boot capacitor 168 is not unbooted until the holding transistor 170 is completely off.

The self-timed circuit path 172 is connected between the gate of transistor 170 and the low side of the boot capacitor 168. The path 172 is comprised of an inverter 174 having its input terminal connected to the gate of the transistor 170 and having its output terminal connected to one of the input terminals of a NAND gate 176. In that manner, the gate potential of the holding transistor 170 is continually monitored and fed into the NAND gate 176. An output terminal of the NAND gate 176 is connected to the low side of the boot capacitor 168. The path 172 is referred to as being self-timed because it operates directly in response to the condition of the transistor 170 rather than relying upon some arbitrary time delay.

A second input terminal of the NAND gate 176 is connected to an output terminal of an inverter 178. The inverter 178 is part of the logic circuit 162 and is in the path between the latch 160 and the gate terminal of a PUP transistor 166. The inverter 178 directly controls the state of PUP transistor 166 and, therefore, the state of the terminal 167. The PUP transistor 166 may be a pMOS transistor with the voltage of the boot capacitor being used to ensure that the voltage output is sufficient to drive the transistor in the data pad driver 114. When the holding transistor 170 is on, a logic "1" is input to the inverter 174 causing a logic "0" to appear at the first input terminal of the NAND gate 176. With a logic "0" at the first input terminal, the signal available at the output terminal is high and the signal available at the second input terminal does not matter.

When the signal available at an output terminal of the inverter 178 goes high thereby shutting off PUP transistor 166, a logic "1" is input to the second input terminal of NAND gate 176. That logic "1" also propagates through the circuitry illustrated in the upper portion of FIG. 18 and becomes a logic "0" which turns off transistor 170. The logic "0" which turns off transistor 170 is input to inverter 174 such that a logic "1" is input to the first input terminal of NAND gate 176. With the input signals at both input terminals now high, the signal available at the output terminal of the NAND gate 176 goes low allowing the capacitor 168 to unboot.

A string of transistors 190, 192, 194, 196, and 198 act as a buffer clamp circuit for limiting the maximum voltage on boot capacitor 168. A transistor 199 is connected to the peripheral voltage Vcc for precharging the boot capacitor 168 prior to the operation of holding transistor 170 and the application of the boosted voltage Vccp. An optional feature illustrated in FIG. 18 is that the pullup terminal 167 may be additionally regulated through a switch 180 so that a PUP pulldown transistor 182 is subject to self-timing according to the state of the signal at the bottom of the boot capacitor 168.

The terminal 167, a terminal 181, and the terminal 183 are electrically connected to the data pad driver 114, an electrical schematic of which is illustrated in FIG. 20. The data pad driver 114 drives a data output/data input pad DQn. The data output/data input pad DQn represents the end of the data output path.

A data read bus bias circuit 130 is illustrated in detail in FIG. 21. The purpose of the data read bus bias circuit 130 is to keep the DR lines from floating when not in use. When the EQSA* signal disables the sense amps, the circuit 130 monitors that condition and holds the DR lines at a predetermined voltage.

The data write path begins at an input/output pad and continues with the data in buffer 118 which is under control of the data in buffer enable control circuit 120 which are both illustrated in FIG. 22. The buffer 118 is comprised primarily of a latch as shown in the figure. For a DRAM that is 8 bits wide (×8), there will be eight input buffers, each driving into one or more write drivers through a signal labeled DW <n> (Data Write where n corresponds to the specific data bit 0–15). The data in buffer enable control circuit 120 produces control signals according to the type of part.

In the present invention, the data write mux 122, illustrated in FIG. 23, is provided. While some DRAM designs connect the input buffer directly to the write driver circuits, a block of data write muxes between the input buffers and the write drivers allows the DRAM design to support multiple configurations such as ×4, ×8, and ×16. As shown in FIG. 23, the muxes are programmed according to the bond option control signals labeled OPT×4, OPT×8, and OPT×16. For ×16 operation, each input buffer 110 is muxed to only one set of DW lines. For ×8 operation, each input buffer is muxed to two sets of DW lines, essentially doubling the quantity of mbits available to each input buffer. For ×4 operation, each input buffer is muxed to four sets of DW lines, again doubling the number of mbits available to the remaining four operable input buffers. Essentially, as the quantity of input buffers is reduced, the amount of column address space is increased for the remaining buffers.

The data write mux 122 is under the control of the data write mux control circuit 124 which is illustrated in detail in FIG. 24. In FIGS. 23 and 24, note the change in notation between the signals input to the data write mux 122 (DIN) and the signals output from data write mux 122 (DW).

From the data write mux 122, the data to be written is input to the write driver 142 within data block 140, described hereinabove in conjunction with FIG. 12A, where the DW signal is input in the upper left hand corner of FIG. 12A. The write driver 142 places the data to be written on the I/O lines which allow the signals to work their way back into the array through the sense amplifiers.

Now that the data read and data write paths have been described, our attention will now turn to compression issues. Address compression and data compression are two special test modes supported by the test path design. DRAM designs include test paths to extend test capabilities, speed component testing, or subject a part to conditions that are not seen during normal operation. Compression test modes yield shorter test times by allowing data from multiple array locations to be tested and compressed on chip, thereby reducing the effective memory size by a factor of 128 or more in some cases. Address compression usually on the order of 4× to 32×, is accomplished by internally treating certain address bits as "don't care" addresses. The data from all of the don't care address locations, which correspond to specific DQ pins, are compared together with special match circuits. Match circuits are usually realized with NAND and NOR logic gates. The match circuits determine if the data from each address location is the same, reporting the result on the respective DQ pin as a match or a fail. The data path must be designed to support the desired level of data compression. That may necessitate more DC sense amp circuits, logic, and other pathways than those necessary for normal operation.

The second form of test compression is data compression, i.e., combining data upstream of the output drivers. Data compression usually reduces the number of DQ pins to four, which reduces the number of tester pins required for each part and increases through-put by allowing additional parts to be tested in parallel. Therefore ×16 parts accommodate 4× data compression and ×8 parts accommodate 2× data compression. The cost of any additional circuitry to implement address and data compression must be balanced against cost benefits derived from test time reduction. It is also important that operation in test mode achieve 100% correlation to operation in non-test mode. Correlation is often difficult to achieve, however, because additional circuitry must be activated during compression, which modifies the noise and power characteristics on the die.

In the description of FIGS. 25, 26, 27, 28, and 29, we address primarily the issue of data compression. The issue of address compression is additionally dealt with hereinbelow.

In FIG. 25, one of the data test comparison circuits 141 found in the array I/O block 100 is illustrated. The circuit 141 receives a test signal from a data test DC enable circuit 134 also seen in FIG. 8. The purpose of the data test comparison circuit 141 is to provide a first level of comparison.

The signals output by the various array I/O blocks 100, 102, 104, 106 are input to the data test block b 126 illustrated in the center of FIG. 26. The purpose of the data test block b 126 is to provide some additional compression and to reduce the number of tracks which must be provided. The output of the data test block b 126 is input to the data path test block 128, which is illustrated in detail in FIG. 27. As seen in FIG. 27, the data test block 128 is constructed of two types of circuits, a data test DC21 circuit 186 and a data test BLK circuit 188. One type of data test DC21 circuit 186 is shown in detail in FIG. 28, which facilitates data and address compression, while one type of data test BLK circuit 188 is illustrated in detail in FIG. 29, which facilitates address compression. Each of the circuits 186, 188 performs compression and comparison of the various input signals so as to produce at the output of the data path test block 128 a data read signal (DR, DR*) suitable for input to the data read mux 108. Through the combination of the foregoing circuits which comprise the test data path, data compression and the benefits flowing therefrom as discussed above are achieved.

V. Product Configuration and Exemplary Design Specifications

The memory chip 10 of the present invention may be configured to provide parts of varying size. FIG. 30 illustrates the mapping of the address bits to the 256 Meg array so as to provide ×16, ×8, and ×4 operation. Illustrated in FIG. 30 is the mapping for each of the 32 Meg array blocks 25, 27, 31, 33, 38, 40, 45, 47 for various types of operation. For example, for ×16 operation, the array block 45 is divided into four sections for storage of DQ0, DQ1, DQ2, DQ3, DQ4, DQ5, DQ6, and DQ7. If the chip 10 were configured for ×8 operation, the same array block 45 would be mapped to provide storage for only DQ0, DQ1, DQ2, and DQ3. If the chip 10 were configured for ×4 operation, the array block 45 would be mapped so as to provide storage for only DQ0 and DQ1. The other array blocks are similarly mapped as shown in FIG. 30.

The different part configurations are primarily a function of the various muxes provided in the read and write data paths as described hereinabove. Part configurations may be selected through bond options, which are "read" by the various logic circuits. The bond options for the present preferred embodiment are illustrated in Table 3 below. There are only two bond option pads. The logic circuits produce control signals for controlling the muxes and other components based on the selected part configuration.

TABLE 3

| Bond Options | | |
|---|---|---|
| OPTBPAD | OPTAPAD | MODE |
| N/C | N/C | X16 |
| N/C | VCC | X4 |
| VCC | N/C | X8 |
| VCC | VCC | X8 |

For each configuration, the amount of array sections available to an input buffer must change. By using data write muxes as described hereinabove to drive as few or as many write driver circuits as required, design flexibility is easily accommodated. The pin configurations corresponding to operation as a ×16, ×8, and ×4 part are illustrated in FIGS. 31A, 31B, and 31C.

Regardless of the product configuration, all data is stored and retrieved from the main array 12. The part is designed so that all data in the 256 Meg main array 12 can be located by bit column addresses and bit row addresses, the number of which is dependent on part size or type.

FIG. 32A illustrates one column address mapping scheme for the 256 Meg main array 12. Column address CA_9<0:1> selects between the bottom 64 Meg quadrants 15 and 16 and the top 64 Meg quadrants 14 and 17. Selecting between 32 Meg array blocks within any 128 Meg quadrant is accomplished with a column address which is a function of part type and refresh rate (e.g. 32 Meg uses <0:1> in the figure). Within any 32 Meg array block, the array is divided into eight blocks of four Meg each, and the blocks are organized into four pairs. For example, column addresses CA1011<0:3> select one of the four pair, and column address CA_7<0:1> selects between the four Meg blocks making up the pair. Columns within each four Meg block are accessed with an eight bit address. Those eight bits are represented by column addresses CA_6<0:1>, CA45<0:3>, CA23<0:3>, CA01<0:3>, and CA_8<0:1>. Column address CA_6<0:1> represents the most significant bit in the address, and column address CA_8<0:1> represents the least significant bit in the address.

FIG. 32B illustrates the row address mapping for a single 64 Meg quadrant. Because row addresses are identical for each 64 Meg quadrant, row addressing will be described only with respect to a single 64 Meg quadrant. Each 64 Meg quadrant is divided into two 32 Meg array blocks, and row address RA_13<0:1> selects between the two 32 Meg array blocks. Each 32 Meg array block is divided into sixteen blocks of two Meg each, and those sixteen blocks are organized into four groups of four. Row addresses RA11<0:1> and 16 Meg select <0:1> together select one of the four groups. 16 Meg select <0:1> is a function of part type and refresh rate as shown in the table in the Figure. Within each group, row addresses RA910<0:3> select one of the two Meg blocks. Rows within each two Meg block are accessed with a nine bit row address. Those nine bits are represented by row addresses RA_0<0:1>, RA12<0:3>, RA34<0:3>, RA56<0:3>, and RA78<0:3>. Row addresses RA78<0:3> represent the most significant bits in the address, and row address RA_0<0:1> represents the least significant bit in the address.

Exemplary design specifications for the present preferred embodiment are as follows:

TABLE 4

| Product Overview | |
|---|---|
| Product | 256 Mbit DRAM |
| Die Size | 14.99 × 24.68 mm (590.5 × 971.6 Mil) w/scribe |
| Package | 16 × 25.55 mm (630 × 1006 mils) 62 pin SOJ/TSOPII (0.8 mm Lead Pitch) |
| Shrink Factor | 0.24 |
| MBit Size | 0.6 umF × .684 umF |
| Process | .25 um CMOS, 3-Poly, 2-Metal, Rugged Poly container cell |
| Async Speed | 50/60 ns |
| Active Power | 215 mA |
| Standby Power | 200 uA |

TABLE 5

| Features |
|---|
| 3.3 volt supply internally regulated to 2.5 volts |
| Laser fuses and antifuse cell Redundancy |
| 32 rows/32 Meg and 16 cols/16 Meg Laser Fuse Redundancy |
| 8 rows/32 Meg and 4 cols/16 Meg Anti-Fuse |
| Lead Over Chip Bonding (LOC) |
| Separate power and ground pins for output buffers |
| Fuse ID (laser and antifuse) |

TABLE 6

| Configurations | |
|---|---|
| Prime Part (Bond option) | 32 Meg × 8<br>16 Meg × 16<br>8K refresh<br>EDO |
| 128 Meg Partial Die (Fuse Option) | 8 Meg × 16<br>4K refresh |

VI. Bus Architecture

The power bussing scheme implemented in the present invention is based upon central distribution of voltages from a central area 200 illustrated in FIGS. 33A through 33C and 33D and E. The central area 200 is where the pads are physically located on the chip 10. As seen in FIGS. 33D and E, a Vcc regulator 220 is centrally located within the pads area 200. As will be discussed hereinbelow in conjunction with FIG. 35, the Vcc regulator 220 produces the array voltage Vcca and the peripheral voltage Vcc. A Vbb pump 280, discussed in detail hereinbelow in conjunction with FIG. 37, is located in the right portion of the pads area 200 as seen in FIG. 33E. A Vccp pump, which is described hereinbelow in conjunction with FIG. 39, is comprised of Vcc pump control 401, a first plurality of pump circuits 402, and a second plurality of pump circuits 403. The Vccp pump produces a boosted version of Vcc referred to as Vccp which is used for biasing the wordlines. Finally, a plurality of DVC2 generators 500, 501, 502, 503, 504, 505, 506, and 507 are distributed throughout the central pads area 200. One of the DVC2 generators 500 is described in detail hereinbelow in conjunction with FIG. 41. The DVC2 generators 500–507 produce a voltage which is one-half of the peripheral voltage Vcc which is used for biasing the digitlines and the cell plate.

As seen in FIGS. 33A, 33B, and 33C, the web 202 is constructed so as to emanate from the central pads area 200 to surround each of the 32 Meg array blocks 40 and 47 illustrated in FIG. 33A, each of the array blocks 27, 33, 38, and 45 illustrated in FIG. 33B, and each of the array blocks 25 and 31 illustrated in FIG. 33C. For example, focusing upon the array block 40 in FIG. 33A, it is seen that the web 202 is comprised of a first plurality of conductors surrounding the array block 10 and carrying the following voltages: mapAVC2, mapDVC2 , mapVccp, Vss, Vbb, and Vcca. The voltages AVC2, DVC2, and Vccp may be switched as shown in FIGS. 3A and 3C such that those voltages are no longer delivered to the array in the event the array is shut down. The web 202, comprised of conductors carrying the foregoing voltages, surrounds each of the 32 Meg array blocks for efficient low resistance distribution.

Extending vertically into each 32 Meg array block at, for example, nine locations, are conductors carrying the following voltages: mapVccp, Vcca, and Vss. Extending horizontally through the 32 Meg array block at, for example, seventeen locations are conductors carrying the following voltages: mapAVC2, Vss, Vcca, mapDVC2 , and Vbb. Thus, not only are each of the array blocks ringed, the power bussing layout features fully gridded power distribution through a second plurality of conductors for better IR and electromigration performance.

FIGS. 34A, 34B, and 34C illustrate the 71 pads and certain of the conductors connected to those pads. It is understood that the subject matter illustrated in FIGS. 34A, 34B, and 34C is located in the central pads area 200 of FIGS. 33A through C and 33D and E. As seen in FIGS. 34A, 34B, and 34C, the pads designated Vccq, which are pads 1, 5, 11, and 15 are connected to a Vccq conductor 204. Conductor 204 runs parallel to the central portion of the web 202 as best seen in FIG. 33A but is not part of the web 202. The conductor 204 carries the power needed for the output buffers.

Pads 17, 32, and 53, which are designated Vccx, are connected to a Vccx conductor 206. Conductor 206 runs parallel to the central portion of the web 202 as best seen in FIG. 33B but is not part of the web. Pads 59, 65, and 69, which are designated Vccq, are connected to a Vccq conductor 208. Conductor 208 runs parallel to the central portion of the web 202 as best seen in FIG. 33C but is not part of the web 202. Above, and parallel to the conductors 204, 206, and 208, are conductors 210, 211, and 212 for carrying the voltages Vcc, Vcca, and Vcc, respectively. The conductors 210, 211, 212 are part of the first plurality of conductors forming the web 202.

A conductor 214, which provides a ground for the output buffers, is provided for connection to the pads designated Vssq which are pads 2, 6, 12, and 16 as shown in FIG. 34A. Conductor 214 runs parallel to the central portion of the web 202 as best seen in FIG. 33A but is not part of the web. Another Vssq conductor 216 is provided for connection to the pads 56, 60, 66, and 70. Conductor 216 runs parallel to the central portion of the web 202 as best seen in FIG. 33C but is not part of the web 202. Finally, a conductor 218 is provided for connection to pads marked Vss, which are pads 18, 33, and 54. The Vss conductor 218 also extends below and beyond the conductors 214 and 216 as illustrated in FIGS. 34A, 34B, and 34C. Conductor 218 is part of the first plurality of conductors forming the web 202. Through that method of distribution, voltages impressed upon the pads are efficiently distributed to the voltage supplies distributed throughout the central pads area 200 and the external voltage and ground are made available for the data output pad drivers.

VII. Voltage Supplies

The chip 10 of the present invention produces from the externally supplied voltage Vccx all of the various voltages that are used throughout the chip 10. The voltage regulator 220 (FIG. 35) may be used to produce the array voltage Vcca and the peripheral voltage Vcc. The voltage pump 280 (FIG. 37) may be used to produce a back bias voltage Vbb for the die. The voltage pump 400 (FIG. 39) may be used to produce a boosted voltage Vccp needed for, inter alia, driving the word lines. The DVC2 generators 500–507 (FIG. 41) may be used to produce a bias voltage DVC2 for biasing the digitlines and a voltage AVC2 (which is equal to DVC2)for the cellplate. The voltage regulator, Vbb pump, Vccp pump, and DVC2 generators, which may be collectively referred to as a power supply, will each be described in detail.

FIG. 35 is a block diagram illustrating the voltage regulator 220 which may be used to produce the peripheral voltage Vcc and array voltage Vcca from the externally supplied voltage Vccx. As seen from FIG. 33E, the voltage regulator 220 is located in the center of the pads area 200 in what is referred to hereinbelow as the center logic (See Section VIII).

The process used to fabricate the chip 10 determines such properties as gate oxide thickness, field device characteristics, and diffused junction properties. Each of those properties in turn effects breakdown voltages and leakage parameters which limit the maximum operating voltage which a part produced by a particular process can reliably tolerate. For example, a 16 Meg DRAM built on a 0.35 $\mu$m CMOS process with 120 angstrom gate oxide can operate reliably with an internal supply voltage not exceeding 3.6 volts. If that DRAM had to operate in a 5 volt system, an internal voltage regulator would be needed to convert the external 5 volt supply to an internal 3.3 volt supply. For the same DRAM operating in a 3.3 volt system, an internal voltage regulator would not be required. Although the actual operating voltage is determined by process considerations and reliability studies, the internal supply voltage is generally proportional to the minimum feature size. The following table summarizes that relationship.

TABLE 7

| Process | Vcc Internal |
|---|---|
| 0.45 $\mu$M | 4.0 Volts |
| 0.35 $\mu$M | 3.3 Volts |
| 0.25 $\mu$M | 2.5 Volts |
| 0.20 $\mu$M | 2.0 Volts |

The circuit 220 is comprised of three major sections, an amplifier portion 222, a tri-region voltage reference circuit 224, which produces a reference voltage input to the amplifier portion 222, and a control circuit 226 which produces control signals input to the amplifier portion 222. Each will now be described in detail.

In FIG. 36A, the tri-region voltage reference circuit 224 is illustrated in detail. The tri-region voltage reference circuit 224 is comprised of a current source 228. A current I1 flowing through a resistor 244 generates a voltage which is equal to the gate to source voltage of a transistor 230. The drain to source voltage of another transistor 231 is equal to the gate to source voltage plus Vth. The current flowing through the transistor 231 is constrained by a current mirror comprised of transistors 245, 246, 247, and 248 to be equal to the current I1. In that manner, the current source 228 provides a current I1 to a circuit node 232. Current is drained from the circuit node 232 by a trimmable, or programmable, "pseudo" diode stack 234. The pseudo diode stack 234 is a plurality of transistors connected in series with their gate terminals connected to a common potential. The pseudo diode stack 234 is essentially a long channel FET which can be programmed or trimmed to provide the desired impedance.

Connected across each of the transistors in the pseudo diode stack 234 is a switching or trimming transistor from a stack 236 of such transistors. The gates of each of the switching transistors in the stack 236 are connected to a reference potential through a closed fuse or other type of device which may be either opened or closed. Assuming fuses are used, half of the gates may be connected to a potential which renders the switching transistor conductive, thereby removing the associated transistor from the stack 234 while the gates of the remaining transistors may be connected through fuses to a potential which renders the switching transistor nonconductive, thereby leaving the associated transistor in the stack 234. In that manner, fuses may be blown to either turn on or turn off a switching transistor to thereby decrease or increase, respectively, the impedance of the trimmable diode stack 234. In that manner, a reference signal (voltage) available at the circuit node 232 can be precisely controlled. Such trimming is required due to process variations during fabrication.

The current source 228 together with the pseudo diode stack 234 and switching transistors 236 form an active voltage reference circuit which produces the reference signal available at the circuit node 232 that is responsive to the external voltage Vccx applied to the circuit 224. Those components are considered to form an active voltage reference circuit as contrasted with a resistor/trimmable pseudo diode stack combination found in the prior art which passively produces a signal at node 232. A bootstrap circuit 255 is also provided to "kickstart" the current source 228.

The reference signal available at circuit node 232 is input to a unity gain amplifier 238. The output of the unity gain amplifier 238 is available at an output terminal 240 at which a regulated reference voltage Vref is available. Use of an active voltage reference circuit for producing the reference signal at circuit node 232 produces the desired relationship between Vref and Vccx which is not available with prior art circuits at the voltage range. Additionally, by making amplifier 238 a unity gain amplifier, common mode range and overall voltage characteristics are improved.

The tri-region voltage reference circuit includes a pullup stage 242 for pulling up the reference voltage available at output terminal 240 so that the reference voltage substantially tracks the external voltage when the external voltage exceeds a predetermined value. The pullup stage 242 is comprised of a plurality of diodes formed by pMOS transistors connected between the external voltage Vccx and the output terminal 240. When the voltage Vccx exceeds the voltage at the terminal 240 by the number of diode drops in the series connected diodes comprising the pullup stage 242, the pMOS diodes will be turned on clamping the voltage available at the output terminal 240 to Vccx minus the voltage drop across the diode stack.

The voltage available at the output terminal 240 is input to the amplifier portion 222 of the voltage regulator 220 where it is amplified to produce both the array voltage Vcca and peripheral voltage Vcc as will be described hereinbelow in conjunction with a description of amplifier portion 222.

The relationship between the peripheral voltage Vcc and the externally supplied voltage Vccx is illustrated in FIG. 36B. The tri-region voltage reference circuit 224 is responsible for those portions of the curve occurring in region 2, corresponding to the "operating range" of the externally supplied voltage Vccx, and region 3, corresponding to the "burn-in range" of the externally supplied voltage Vccx. The output of the tri-region voltage reference circuit 224 is not used to generate the peripheral voltage Vcc during region 1. Region 1 is implemented by shorting the bus carrying the external voltage Vccx and the bus carrying the peripheral voltage Vcc together though pMOS output transistors found in the power stage of each power amplifier as will be described hereinbelow. The first region occurs during a powerup or powerdown cycle in which the externally supplied voltage Vccx is below a first predetermined value. In the first region, the peripheral voltage Vcc is set equal to the externally supplied voltage Vccx to provide the maximum operating voltage allowable in the part. A maximum voltage is desirable in region 1 to extend the DRAM's operating range and to ensure data retention during low-voltage conditions.

After the first predetermined value for the externally supplied voltage Vccx has been reached, the buses carrying the voltages Vccx and Vcc are no longer shorted together. After the first predetermined value for the externally supplied voltage Vccx is reached, the normal operating range, region 2, illustrated in FIG. 36B is entered. In region 2, the peripheral voltage Vcc flattens out and establishes a relatively constant supply voltage to the peripheral devices of the chip 10. Certain manufacturers strive to make region 2 absolutely flat, thereby eliminating any dependance on the externally supplied voltage Vccx. A moderate amount of slope in region 2 is advantageous for characterizing performance. It is important in the manufacturing environment that each DRAM meet the advertized specifications with some margin for error. A simple way to ensure such margins is to exceed the operating range by a fixed amount during component testing. The voltage slope depicted in FIG. 36B allows that margin testing to occur by establishing a moderate degree of dependance between the externally supplied voltage Vccx and the peripheral voltage Vcc.

The third region illustrated in FIG. 36B is used for component burn-in, and is entered whenever the externally supplied voltage Vccx exceeds a second predetermined value. That second predetermined value is set by the number of diodes in the diode stack comprising pullup stage 242. During burn-in, both temperature and voltage are elevated above the normal operating range to stress the DRAM and weed out infant failures. Again, if there were no relationship between the external voltage Vccx and the peripheral voltage Vcc, the internal voltage could not be elevated.

The characteristic of the peripheral voltage Vcc may be summarized as follows: the slope of the peripheral voltage Vcc is substantially the same as the slope of the external voltage Vccx in region 1 (up to the first predetermined value); the slope of the peripheral voltage Vcc is substantially less than the slope of the external voltage Vccx in region 2 (between the first predetermined value and the second predetermined value); and the slope of the peripheral voltage Vcc is greater than the slope of the external voltage Vccx in region 3 (above the second predetermined value) because the signal available at output terminal 240, which substantially tracks the external voltage Vccx, is multiplied in an amplifier having a gain greater than one.

The next section of the voltage regulator 220 is the control circuit 226. The control circuit 226 is comprised of a logic circuit 1 250 illustrated in FIG. 36C, a Vccx 2 v circuit 252 and a Vccx detect circuit 253 illustrated in FIG. 36D, and a second logic circuit 258 illustrated in FIG. 36E. Turning first to FIG. 36C, the logic circuit 1 250 receives a number of input signals: SEL32M<0:7>, LLOW, EQ*, RL*, 8KREF, ACT, DISABLEA, DISABLEA*, and PWRUP. The logic circuit 1 250 may be comprised primarily of static CMOS logic gates and level translators. The logic gates are referenced to the peripheral voltage Vcc. The level translators are necessary to drive the power stages, which are referenced to the external voltage Vccx. A series of delay elements tune the control circuit 226 relative to P-sense activation (ACT) and RAS* (RL*) timing. The purpose of the logic circuit 1 250 is: (i) to produce, from the aforementioned input signals, clamp signals (for both N and P type transistors) for shorting, in the power amplifiers, a voltage bus carrying the external voltage Vccx with a voltage bus supplying the peripheral voltage Vcc, (ii) to produce an enable signal (for both N and P type transistors) for enabling the power amplifiers, and (iii) to produce a boost signal (for both N and P type transistors) for changing the slew rate of the amplifiers. The particular combination of logic gates illustrated in FIG. 36C illustrates but one method of manipulating the aforementioned input signals to produce the previously listed output signals. The uses for the output signals will be described hereinbelow in conjunction with the amplifier portion 222. Other methods for producing control signals are known. See, for example, U.S. Pat. No. 5,373,227 entitled Control Circuit Responsive To Its Supply Voltage Level and issued Dec. 13, 1994.

FIG. 36D illustrates the Vccx 2 v circuit 252 and the Vccx detect circuit 253. The circuit 252 receives the DISABLEA and DISABLEA* signals and produces two reference signals, VSW and VTH. The circuit 253 receives those signals and acts as a comparator to determine if the first predetermined value for Vccx (see FIG. 36B) has been reached. Circuit 253 may be implemented as a CMOS comparator. The circuit 253 produces the signals PWRUP and PWRUP*. The PWRUP and PWRUP* signals are input to a number of circuits, such as the logic circuit 1 250 and the amplifiers within the amplifier portion 222 as will be described hereinbelow.

FIG. 36E illustrates the second logic circuit 258 which is the last element of the control circuit 226. The second logic circuit 258 produces the PUMPBOOST signal and the DISABLEA and DISABLEA* signals used in other parts of the control circuit 226 from the following input signals: PWRDUP*, VccpON, VbbON, DISABLEA*, DISREG, and SV0. The PUMPBOOST signal will be described in conjunction with the amplifier portion 222 whereas the other two signals output from the second logic circuit 258 are, as mentioned, used both within the control circuit 226 and in the amplifier portion 222.

Returning to FIG. 35, it is seen that the amplifier portion 222 is comprised of a plurality of power amps 260, 261 a plurality of boost amps 262, and a standby amp 264 which are selectively operated to achieve better characteristics than those obtainable with a single amplifier. The power amps 260 have greater than unity gain (e.g., 1.5×) which reduces the requirements of the reference voltage, Vref, and smooth transitions such as between the powerup range and the operating range shown in FIG. 36B. Further, the power amps 260 may be controlled in groups (e.g., two groups of three each and a third group of twelve) rather than all on or all off at a time. Such controlled operation permits the number of operational power amps 260 to be reduced when power demand is low. Such controlled operation also enables additional amps to be activated, as needed, to achieve multiple refresh operations, e.g., firing two or more rows of the array at the same time. As explained further hereinbelow, the groups of power amplifiers have additional flexibility due to the ability to control individual power amps in a group.

A further novel characteristic of the amplifier portion 222 is to include one or more boost amplifiers 262 that are specialized in that they operate only when voltage pumps fire.

A further component of the amplifier portion 222 is the standby amplifier 264. The standby amplifier 264 allows for a further reduction in current consumption when the other amplifiers are not operating. Prior voltage regulators for DRAMs included a standby amplifier but not one in combination with the power amplifiers 260 and boost amplifiers 262. In the present invention, the standby amplifier 264 does not need to be designed to provide a regulated supply for voltage pumps, which is accomplished by the boost amplifiers 262, such that the standby amplifier 264 may truly function as a standby amplifier.

The power amplifiers 260, boost amplifiers 262, and standby amplifier 264 are similar in general structure but the power amps operate at a moderate bias current level (e.g., approximately 1 ma, or about half of that required in the prior art) during memory array operations, such as reading and writing. The boost amplifiers 262 are designed for a low bias such as about 300 $\mu$a, and may also have a lower slew rate than the power amps because the boost amps operate only during operation of the voltage pumps which are described hereinbelow. The standby amplifier operates continuously at a very low bias of about 20 $\mu$a. Through the use of multiple power amplifiers 260, boost amplifiers 262, and the standby amplifier 244, minimization of operating current for each of the various operating conditions experienced by the DRAM is achieved.

Six of the amplifiers in the amplifier portion 222 may be connected in parallel between the output of the tri-region voltage circuit 224 and the bus 266 which carries the peripheral voltage Vcc and twelve of the amplifiers in the amplifier portion 222 may be connected in parallel between the output of the tri-region voltage circuit 224 and the bus 267 which carries the array voltage Vcca. The power buses 266 and 267 are isolated except for a twenty ohm resistor 269 that bridges the two buses together. Isolating the buses is important because it keeps high current spikes that occur in the array from effecting the peripheral circuits. Failure to isolate buses 266 and 267 can result in speed degradation for the DRAM because large current spikes in the array may cause voltage cratoring and a corresponding slowdown in logic transitions. With isolation, the peripheral voltage Vcc is almost immune to array noise.

An electrical schematic illustrating one type of power amplifier 260 is illustrated in FIG. 36F. To improve the slew rate, the power amplifier 260 features a boost circuit 270 that raises the bias current of a differential amplifier 272 to improve the slew rate during expected periods of large current spikes. Large spikes are normally associated with P-sense amp activation.

To reduce active current consumption, the boost circuit 270 is disabled a short time after P-sense amp activation by the signal labeled pump BOOST. The power stages are enabled by the signal ENS* only when RAS* is low and the part is active. When RAS* is high, all of the power amplifiers 260 are disabled.

The signal labeled CLAMP* ensures that the pMOS output transistor 274 is off whenever the amplifier is disabled to prevent unwanted charging of the Vcc bus. When forced to ground, however, the signal labeled VPWRUP shorts the Vccx and Vcc buses together through a pMOS output transistor 274. The need for that function was described earlier in conjunction with the description of region 1 of FIG. 36B. Basically, the bus carrying Vccx and the bus carrying Vcc are shorted together whenever the DRAM is operating in the powerup range of FIG. 36B. The signals CLAMP* and VPWRUP are mutually exclusive to prevent a short circuit between the external voltage Vccx and ground.

The ENS signal is supplied to the gate of a transistor switch 276 whose conduction path is coupled at one end to the gate of one of the transistors of the differential amplifier 272 through a resistor R1 while the other end of the conduction path is tied to ground. A second resistor R2 is connected between the gate of the aforementioned transistor and the Vcc bus. The ratio of the resistors R1 and R2 determines the closed loop gain of the circuit. As previously mentioned, the power amplifiers 260 have somewhat higher than unity gain.

An example of a boost amplifier 262 is illustrated in FIG. 36G. The boost amplifier 262 is very similar in construction and operation to the power amplifier in that it has an output pMOS transistor capable of shorting together the buses carrying Vccx and Vcc. The boost amplifiers 262 also have a greater than unity gain as a result of the ratio between resistors R1 and R2. One difference between the boost amps 262 and the power amps 260 is that that boost amps 262 are responsive to the PUMPBOOST signal so that the boost amps 262 are operational whenever the voltage pumps are operational. Another difference is that the boost amplifiers 262 are designed to operate with a smaller bias current.

The standby amplifier 264 is illustrated in FIG. 36H. The standby amplifier 264 is included to sustain the peripheral voltage Vcc whenever the DRAM is inactive, as determined by RAS*. The standby amplifier 264 is similar in design to the other amplifiers in that it is built around a differential pair, but is specifically designed for a very low operating current and a correspondingly low slew rate. Accordingly, the standby amplifier 264 cannot sustain any type of active load.

FIG. 36I illustrates the details of one of the power amplifiers 261 in the group of twelve power amplifiers 277 illustrated in FIG. 35. The power amplifiers 261 are of the same design as the boost amplifiers 262 described hereinabove and illustrated in detail in FIG. 36G. The power amplifiers 261, however, receive different control signals than the boost amplifiers 262. For example, the power amplifiers 261 are responsive to the CLAMPF* signal in a manner similar to the power amplifiers 260. Furthermore, the power amplifiers 261 are responsive to the VPWRUP and BOOSTF signals in a manner similar to the power amplifiers 260. The functions of the CLAMPF*, VPWRUP, and BOOSTF signals are described hereinabove with respect to the power amplifiers 260 and FIG. 36F.

The numbers of respective power amps 260, 261 and boost amps 262 are matters of design choice according to the overall requirements of the DRAM. For example, a greater bandwidth is achieved by larger numbers of power amplifiers, which can be made relatively smaller if a larger number are to be provided.

A further factor affecting the choice of the number of power amplifiers has to do with the construction of the memory array. As described hereinabove, the memory array of the present invention is constructed of eight 32 Meg array blocks. Each block can be shut down if the quantity of failures or the extent of the failures exceeds the array's repair capability. That shutdown is both logical and physical. The physical shutdown includes removing power such as the voltages Vcc, DVC2, AVC2, and Vccp. It is often the case that the switches which disconnect power from the array block must be placed ahead of some of the decoupling capacitors 44 (seen in FIG. 3A) for that block. The decoupling capacitors 44 are provided to help maintain the voltage regulator's 220 stability. Reasons dictating the location of the decoupling capacitors 44 include the desire to have some decoupling capacitance proximate the array block because of possible current spikes in the array block and die geometry constraints. In the general case, the decoupling capacitance can be provided on both sides of the switch controlling an array block. When the total amount of decoupling capacitance available on the die is reduced with each array block that is disabled, there could be an adverse effect on voltage stability. Therefore, according to a further feature of the present invention, each array block has a corresponding power amplifier that is associated therewith and which is disabled whenever the array block is disabled. Disabling of a power amplifier 260 is accomplished by properly controlling the state of the ENS* signal produced by the eight pwr Amp Drive circuits seen in FIG. 36C. That compensates for the reduction in decoupling capacitance and maintains the desired voltage stability by removing power amplifiers proportionately to the removal of decoupling capacitance.

More specifically, in the preferred embodiment, the power amps 260 are configured with a certain load capacitance and compensation network such that their slew rate and voltage stability are considered optimum when there is about 0.25 nanofarads of decoupling capacitance in the array block per power amplifier. In the disclosed embodiment, a group of twelve power amplifiers (277 in FIG. 35), includes eight that are respectively associated with each one of the eight array blocks and four additional amplifiers that are not affected by the array switches. When a switch is opened that disables an array block and its associates decoupling capacitors, a signal is input to the control circuit 226 to disable the corresponding power amplifier to maintain the correct, optimal, relationship. In additional to maintaining voltage stability, that reduces unneeded current consumption. In general, more decoupling capacitance is better for voltage stability and lower ripple but is worse for amplifier slew rate and hence an optimum is sought to be maintained.

The next elements which comprise the voltage supplies provided on the chip 10 are the voltage pumps, which include the voltage pump 280 (FIG. 37) which may be used to produce the Voltage Vbb used to back bias the die, and the voltage pump 400 (FIG. 39) which may be used to produce the Voltage Vccp which is a boosted voltage for the wordline drivers. Voltage pumps are commonly used to create voltages that are more positive or more negative than available supply voltages. The Vbb pump is typically built from pMOS transistors while the Vcc pump is built primarily from nMOS transistors. The exclusive use of nMOS transistors or pMOS transistors in each pump is required to prevent latchup from occurring and prevent current injection into the mbit arrays. The use of pMOS transistors is required in the Vbb pump because various active nodes will swing negative with respect to the substrate voltage, Vbb. Any n-diffusion regions connected to those active nodes would forward bias and cause latchup and injection. Similar conditions mandate the use of nMOS transistors in the Vccp pump.

Turning to FIG. 37, the Vbb pump 280 is illustrated in block diagram form. As seen from FIG. 33E, the Vbb pump is located in the right portion of the pads area 200 in what is referred to hereinbelow as the right logic (See Section X). The pump is constructed of two pump circuits 282, 283. An electrical schematic of one of the pump circuits is illustrated in FIG. 38A. The pump circuit 283 is the same as the circuit 282 and is therefore not illustrated.

In FIG. 38A, it is seen that the pump circuit 282 is responsive to an oscillator signal OSC input at an input terminal thereof. The circuit 282 is comprised of an upper pump portion 285 and a lower pump portion 286 which work in tandem to produce the output Voltage Vbb. Assume that the value of the oscillator signal OSC is such that the output of an inverter 290 available at a node 292 is high. A voltage available at a node 293 is clamped to ground by a pMOS transistor 294. The nodes 292 and 293 are separated by a capacitor 296. As the oscillator signal changes state such that the voltage available at the node 292 begins to decrease, the transistor 294 will be turned off and a pMOS transistor 298 will become conductive so that the charge on the capacitor 296 is made available to the bus carrying the voltage Vbb. The lower pump portion 286 operates in substantially the same manner but is constructed so that its output transistor 298' is conductive when the transistor 298 of upper pump portion 285 is nonconductive, and vice versa.

Returning to FIG. 37, the input to the pump circuits 282 and 283 which controls their operation is the signal OSC which is generated by a Vbb oscillator circuit 300. An electrical schematic of one type of oscillator is illustrated in FIG. 38B. The oscillator circuit 300 used in the voltage pump may be a CMOS ring oscillator of the type illustrated in FIG. 38B. A unique feature of the oscillator circuit 300 is the capability for multi-frequency operation permitted by the inclusion of mux circuits 302 which are connected to various different tap points within the oscillator ring. The muxes, which are controlled by a signal labeled VBBOK*, enable higher frequency operation by reducing the number of inverter stages 304 comprising the ring oscillator. Typically, the oscillator circuit 300 is operated at a higher frequency when the DRAM is in a power-up state, because the higher frequency of operation will assist the Vbb pump to produce the required back bias voltage. The oscillator is enabled and disabled through a signal labeled OSCEN* which is produced by a Vbb regulator select circuit 306 as shown in FIG. 37. The oscillator may also include the concepts disclosed in U.S. Pat. No. 5,519,360 entitled Ring Oscillator Enable Circuit With Immediate Shutdown, issued May 21, 1996, so that it can be immediately shut down thereby reducing the amount of noise.

The Vbb regulator select circuit 306 is illustrated in detail in FIG. 38C. The circuit 306 receives the following input signals: DIFFVBBON, REG2VBBON, PWRDUP, DISVBB, and GNDVBB. The logic illustrated in FIG. 38C combines those signals to provide a signal labeled VBBREG* which is the same as the signal OSCEN* input to the oscillator 300. An inverted version of that signal is also available as signal VBBON. Two other signals are generated by the circuit 306, the signals labeled DIFFREGEN* and REG2EN*, which are used to select which of the two regulator circuits 308 and 320 will be enabled.

Returning to FIG. 37, a Vbb differential regulator 2 circuit 308 is provided. FIG. 38D illustrates an electrical schematic of the circuit 308. The circuit 308, if enabled by the Vbb Regulator Select Circuit 306, basically controls the operation of the Vbb pump circuits 282, 283 albeit indirectly. The circuit 308 has a first portion 310 which produces the signal DIFFVBBON, that is input to the Vbb regulator select circuit 306, which produces the signal for running the oscillator 300, which drives the pump circuits 282, 283. The signal DIFFVBBON goes high whenever the back bias voltage Vbb is more positive than minus 1 volt.

A second portion 312 of the circuit 308 produces the signal VBBOK* which is directly input to the oscillator 300. The signal VBBOK* speeds up the oscillator. The first circuit portion 310 and the second circuit portion 312 are the same circuit, and both operate as differential amplifiers. Basically, regardless of the specific circuit design, the Vbb differential regulator 2 circuit 308 should be constructed using low-biased current sources and pMOS diodes to translate the pump voltage Vbb to a normal voltage level. The reader seeking additional information concerning the Vbb differential regulator 2 circuit 308 is directed to U.S. patent application Ser. No. 08/668,347 entitled Differential Voltage Regulator, filed Jun. 26, 1996, and assigned to the same assignee as the present invention (Micron No. 96-172).

Returning to FIG. 37, the last element of the Vbb pump is the Vbb Reg 2 circuit 320. An electrical schematic of the Vbb Reg 2 circuit 320 is illustrated in FIG. 38E. The circuit 320 produces the REG2VBBON signal input to the Vbb regulator select circuit 306. The input portion of the circuit 320 normalizes the input voltage. That normalized voltage level is then fed into a modified inverter stage having an adjustable trip point. The trip point may be modified with feedback to provide hysteresis for the circuit. Minimum and maximum operating voltages for the Vbb pump 280 are controlled by the first inverter stage trip point, the hysteresis, and the PMOS diode voltages.

Two regulator 2 circuits (308 and 320) are provided for enabling the selection of one of two control signals produced by circuits implementing different control philosophies. The Vbb differential regulator 2 circuit 308 produces a control signal from a differential amplifier stage. In contrast, the Vbb Reg 2 circuit 320 compares a normalized voltage to fixed trip points. Selection of one of the Vbb differential Reg 2 circuit 308 and Vbb Reg 2 circuit 320 may be made through a mask option. Depending upon the mask option selected, the Vbb regulator circuit 306 produces one of the two signals DIFFREGEN* or REG2EN* for activating either the Vbb differential regulator 2 circuit 308 or the Vbb regulator 2 circuit 320, respectively. The activated regulator circuit then produces its control signal which is input to the Vbb regulator select circuit 306 for production of the signal OSCEN* for driving the Vbb oscillator circuit 300.

The other voltage pump used in the circuit 10 is the Vccp pump 400 illustrated in FIG. 39. The Vccp pump 400 produces a boosted voltage Vccp for, inter alia, the wordline drivers. The demand for the voltage Vccp varies considerably in different refresh modes. For example, a 256 Meg DRAM requires approximately 6.5 milliamps of current from the Vccp pump 400 when operating in an 8K refresh mode. In contrast, the same DRAM requires over 12.8 milliamps of current when operating in a 4K refresh mode. Unfortunately, a Vccp pump that can provide adequate current in 4K refresh mode is not suitable for use in an 8K refresh mode because it will generate an unacceptable level of noise and excessive Vccp ripple with the relatively light load applied in 8K refresh mode.

The Vccp pump 400 of the present invention is comprised of multiple pump circuits, six (410, 411, 412, 413, 414, 415) being illustrated in the embodiment shown in FIG. 39. All six pump circuits 410–415 are used to generate Vccp voltage during 4K refresh mode. However, if all six pump circuits are operated during 8K refresh mode, an unacceptable level of noise and excessive Vccp ripple will be generated because there will be an insufficient load on the pumps 410–415. As a result, only a portion of the pump circuits 410–415 are used during 8K refresh mode.

The pump circuits 410–415 are divided into two groups, a primary group 422 comprising pump circuits 410–412, and a secondary group 423 comprising pump circuits 413–415. The primary group 422 of pump circuits 410–412 is always enabled by having their enable terminals tied to the peripheral voltage Vcc. The secondary group 423 of pump circuits 413–415, however, are only enabled during 4K refresh mode by having their enable terminals tied to a 4K signal. The 4K signal is produced in the center logic as described herein below in conjunction with FIG. 59J.

In addition to the six pump circuits 410–415, the Vccp pump 400 includes the control portion 401. As seen from FIGS. 33D and E, the control portion 401 is found in the center logic (See Section VIII) while the pump circuits 410–415 are found in both the right and the left logic (See Section X).

All of the pump circuits 410–415 are driven by an OSC signal generated by an oscillator 424. The OSC signal acts as an additional enable signal because it is required for the pump circuits 410–415 to operate. The oscillator 424 may be controlled by either of two regulators, a Vccp Reg. 3 circuit 426 or a differential regulator circuit 428. The regulators 426, 428 regulate Vccp by turning the pump circuits 410–415 on and off as needed to maintain Vccp at a desired level. The regulators 426, 428 control the pump circuits 410–415 indirectly by controlling the oscillator 424. Because only one of the regulators 426, 428 may control the oscillator 424, and thereby control the pump circuits 410–415, a selection between the two regulators 426, 428 is made by a regulator select circuit 430. The selection may be made, for example, by opening or closing connections within the regulator select circuit 430. Once a selection is made, the regulator select circuit 430 provides an enable signal to one of the regulators 426, 428. The regulator select circuit 430 then enables the oscillator 424 in response to signals received back from the enabled regulator 426 or 428. FIG. 40A illustrates the details of one type of regulator select circuit 430.

The Vccp pump 400 also includes a burnin circuit 434. The burnin circuit 434 generates a signal BURNIN used by various components, including the pump circuits 410–415, to put components in a special "burnin mode" during component burnin tests. One type of burnin circuit 434 is illustrated in detail in FIG. 40B.

The Vccp pump 400 further includes a pullup circuit 438. The pullup circuit 438 connects the bus carrying Vccp to the bus carrying Vcc whenever Vccp falls at least one Vth below Vcc. One type of pullup circuit 438 is illustrated in detail in FIG. 40C.

The Vccp pump 400 also includes four clamp circuits 442, one of which is seen in FIG. 40D. The clamp circuits 442 are usually enabled but can be disabled in a Test mode. Vccp is normally higher than Vcc, usually by a little more than one Vth. However, if Vccp becomes too high, e.g., more than about three Vths above Vcc, it will be clamped to Vcc to bring it back within acceptable limits. If Vccp becomes too low, e.g., more than about one Vth below Vcc, it will be clamped so as not to fall more than one Vth below Vcc by the clamp circuits 442. Thus, the clamp circuits 442 bracket Vccp to keep it no greater than three Vths above Vcc and no less than one Vth below Vcc.

FIG. 40E illustrates the details of one of the pump circuits 410. The pump circuits 410–415 are two-phase pump circuits, meaning that one portion of the pump circuit pumps current when the OSC signal is high and another portion pumps current when the OSC signal is low. The pump circuits 410–415 are very similar in construction and operation to the pump circuits 282, 283 of the Vbb pump, except that nMOS transistors are used. The pump circuits 410–415 include a first latch 450 and a second latch 452 which pump current through capacitors 456, 456' and drive logic circuits 462, 462'. The logic circuit 462 provides a voltage to a gate of a transistor 464. Transistor 464 conducts current to the Vccp bus when the OSC signal is low and transistor 464' conducts current to the Vccp bus when the OSC signal is high. The pump circuit 410 includes a Vccplim2 circuit 474 and a Vccplim3 circuit 476 which can be used during burnin mode to limit voltages on internal nodes of the pump. The details of one type of Vccplim2 circuit 474 and the details of one type of Vccplim3 circuit 476 are illustrated in FIGS. 40F and 40G, respectively.

FIG. 40H illustrates the details of the oscillator 424. The oscillator 424 is a ring-type oscillator similar to the oscillator 300 illustrated in FIG. 38B. The oscillator 424 has a variable a frequency so that, for example, the pump circuits 410–415 may be operated at a higher frequency during powerup to more quickly bring the Vccp bus to its operating voltage. The oscillator 424 includes a series of inverters 478 which loops back on itself to form a ring. The time required for a signal to propagate through the inverters 478 determines the period of the signal OSC. Multiple frequency operation is implemented by the inclusion of several multiplexers 479 which receive signals from various tap points in the chain of inverters 478. The multiplexers are controlled by a signal VPWRUP* and produce a higher frequency OSC signal by reducing the number of inverters 478 in the ring.

FIG. 40I illustrates the details of one type of Reg Vccp 3 circuit 426 shown in FIG. 39. The circuit 426 may use several series connected pMOS and nMOS diodes to "normalize" the voltage Vccp to the level of Vcc. In other words, several Vths are subtracted from Vccp by the diodes. The normalized voltage is used by transistors 480, 481, 482, and 483 for generating an enable signal REG2VCCPON for the oscillator 424. If the normalized voltage is too high, a low value of the enable signal is generated, and if the normalized voltage is too low, a high value of the enable signal is generated.

FIG. 40J illustrates the details of the differential regulator circuit 428 shown in FIG. 39. The differential regulator circuit 428 generates an enable signal DIFFVCCPON by comparing Vccp with a reference voltage in a differential amplifier 486. When Vccp is below the reference voltage, a high value of the enable signal is generated to enable the oscillator 424. When Vcc is above the reference voltage, a low value of the enable signal is generated to disable the oscillator 424. A similar differential regulator circuit is disclosed in U.S. patent application Ser. No. 08/521,563 entitled Improved Voltage Regular Circuit, filed Aug. 30, 1995, and assigned to the same assignee as the present invention (Micron No. 94-088).

The last of the voltage supplies on the chip 10 are the DVC2 generators one of which, generator 500, is illustrated in FIG. 41. FIG. 41 is a block diagram of one of the DVC2 generators 500 located in the right and left logic (See Section X). The DVC2 generator 500 produces a voltage of one half of Vcc, known as DVC2, for biasing the memory capacitor cellplates. A related voltage, AVC2, which has the same value as DVC2, is used for biasing the digitlines between array accesses. The DVC2 generator 500 includes a voltage generator 510 for producing the voltage DVC2 and an enable 1 circuit 512 for enabling and disabling the voltage generator 510. A stability sensor 514 receives the output from the voltage generator 510 and produces an output signal indicative of whether the voltage DVC2 is stable.

The stability sensor 514 includes an enable 2 circuit 515 which generates enable signals for the stability sensor 514. The stability sensor 514 includes a voltage detection circuit 516 for producing a signal indicative of whether the voltage level of the voltage DVC2 is within a first predetermined range. A pullup current monitor 518 produces a signal indicative of whether a pullup current is stable. A pulldown current monitor 520 produces a signal indicative of whether a pulldown current is stable. An overcurrent monitor 522 produces a signal indicative of whether the pullup current is above a predetermined value, suggesting short circuits within the array.

An output logic circuit 524 receives the output signals from the voltage detection circuit 516, the pullup current monitor 518, and the pulldown current monitor 520, and produces an output signal indicative of whether the voltage DVC2 is stable. The output of the overcurrent monitor 522 is not input to the output logic 524 because overcurrent is not a measure of the stability of the voltage DVC2. Instead, the overcurrent output signal may be used during testing of the DRAM to diagnose defective array blocks. Furthermore, the output of the overcurrent monitor 522 may be latched at the end of powerup and used by the DRAM for self-diagnosis to determine whether an excessive current situation exists and whether a partial array shutdown is required.

Although the stability sensor 514 will be described as being used with the voltage generator 510 producing the voltage DVC2, the stability sensor 514 may be used with any power source, either on an integrated circuit or constructed of discrete components. Furthermore, the stability sensor 514 will be described as including the voltage detection circuit 516, the pullup current monitor 518, the overcurrent monitor 522, and the pulldown current monitor 520. Any of those components, however, may be used individually or in other combinations to provide an indication of the stability of a voltage generator.

FIG. 42A illustrates the details of the voltage generator 510 shown in FIG. 41. The voltage generator 510 is enabled by a signal DVC2EN* received from a powerup sequence circuit described below in Section XI, and signals ENABLE and ENABLE* received from the enable 1 circuit 512. The voltage generator 510 generates the voltage DVC2 which is available at a node 530 by varying the conductivity of transistors 532 and 534 connecting node 530 to Vcc and to ground, respectively. Current flowing from Vcc through transistor 532 to node 530 is "pullup" current because it raises the voltage at node 530. Current flowing from node 530 through transistor 534 to ground is "pulldown" current because it lowers the voltage of node 530. Pullup current and pulldown current are controlled by controlling the gate voltage, and thereby the conductivity, of transistors 532 and 534, respectively. Feedback is provided from node 530 to the gates of a series of pMOS transistors 536 and the gates of a series of nMOS transistors 538. The transistors 536 control the resistance of the path from the voltage Vcc to the gate of transistor 532. Two nMOS transistors 540 and 542 control the resistance of the path away from the gate of transistor 532. The nMOS transistors 538 control the resistance of the path from the gate of transistor 534 to ground. A pMOS transistor 548 controls the resistance of the path of the gate of transistor 534 to Vcc. A series of capacitors 550 and 552 connect the gate of transistor 532 to Vcc and to ground, respectively, thereby smoothing transitions in the gate voltage. Likewise, capacitors 554 and 556 connect the gate of transistor 534 to Vcc and to ground, respectively.

In operation, the voltage DVC2 is held steady under varying loads by controlling transistors 532 and 534 in response to feedback signals. If DVC2 is too high, pMOS transistors 536 begin to turn off thereby lowering the gate voltage of transistor 532 and decreasing the pullup current. At the same time, nMOS transistors 538 begin to turn on thereby decreasing the gate voltage and resistance of transistor 534 and increasing the pulldown current. The combination of decreased pullup current and increased pulldown current decreases the value of the DVC2 voltage. Conversely, if DVC2 is too low, transistors 536 begin to turn on thereby increasing the gate voltage of transistor 532 and increasing the pullup current. In addition, transistors 538 begin to turn off thereby increasing the gate voltage of transistor 534 and decreasing the pulldown current. The combination of increased pullup current and decreased pulldown current raises the voltage of DVC2. Related circuitry is disclosed in U.S. Pat. No. 5,212,440 entitled Quick Response CMOS Voltage Reference Circuit issued May 18, 1993.

FIG. 42B illustrates the details of one type of enable 1 circuit 512 shown in FIG. 41. The enable 1 circuit 512 generates the signals ENABLE and ENABLE* for enabling the voltage generator 510.

FIG. 42C illustrates the details of one type of enable 2 circuit 515 shown in FIG. 41. The enable 2 circuit 515 generates signals SENSEON, SENSEONB, SENSEON*, and SENSEONB*. Those signals are used to enable the voltage detection circuit 516, the pullup current monitor 518, the overcurrent monitor 522, and the pulldown current monitor 520.

FIG. 42D illustrates the details of one type of voltage detection circuit 516 shown in FIG. 41. The voltage detection circuit 516 is enabled by signals SENSEON and SENSEON*. The voltage detection circuit 516 receives the voltage DVC2 from the voltage generator 510 and produces signals VOLTOK1 and VOLTOK2 indicative of whether the voltage DVC2 is within a predetermined range of voltages. The predetermined range is defined by ground plus the turn-on voltage of an nMOS transistor 560, and Vcc minus the turn-on voltage of a pMOS transistor 562. The range may be adjusted by adjusting the turn-on voltages of the transistors 560 and 562. The voltage DVC2 is connected to the gate of the nMOS transistor 560 and the gate of the pMOS transistor 562, and only when the voltage DVC2 is within the predetermined range are both of the transistors 560 and 562 turned on and both of the signals VOLTOK1 and VOLTOK2 at a high logic value. If the voltage DVC2 is too high, transistor 560 will be turned on but transistor 562 will be turned off, so that signal VOLTOK1 will be high but signal VOLTOK2 will be low. Likewise, if the voltage DVC2 is too low, transistor 560 will be turned off but transistor 562 will be turned on, so that signal VOLTOK1 will be low and signal VOLTOK2 will be high.

More particularly, a resistor 564 allows current to trickle from Vcc to the input terminal of an inverter 566. When transistor 560 is turned off, the current coming through resistor 564 creates a high logic state at the input terminal of the inverter 566. When transistor 560 is turned on, current flows through transistor 560 and the input terminal of the inverter 566 is pulled to a low logic state. Likewise, a resistor 568 allows current to drain from the input terminal of an inverter 570, resulting in a low logic state. When transistor 562 is turned off, the low logic state is undisturbed at the input terminal of inverter 570. When transistor 562 is turned on, however, current flows through transistor 562 and into the input terminal of the inverter 570, and a high logic state exists at the input terminal of inverter 570.

FIG. 42E illustrates the details of one type of pullup current monitor 518 shown in FIG. 41. The pullup current monitor 518 is enabled by signals SENSEONB, SENSEONB*, and ENABLE*, is responsive to the PULLUP current and the voltage DVC2, and produces signals PULLUPOK1 and PULLUPOK2 indicative of whether the pullup current is stable. The pullup current monitor 518 includes several current sources in the form of transistors 582, 583, 584, and 585. The current sources 582–585 are responsive to the PULLUP current such that each transistor sources a current indicative of the present pullup current in the voltage generator 510. The pullup current monitor 518 also includes several current sinks in the form of transistors 588, 589, and 590. The current sink 588 sinks a current indicative of the present pullup current. The current sinks 589–590 each sink a current indicative of a past pullup current. A time delay between the past pullup current and the present pullup current is defined by an RC time constant created by a resistor 594 and a capacitor 596. The charge on the capacitor 596 is indicative of the past pullup current and changes when current flows into or out of the capacitor 596 through the resistor 594. Current flows into capacitor 596 when the source current from transistor 582 is greater than the sink current flowing through transistor 588. Conversely, current flows out of capacitor 596 when the source current from transistor 582 is less than the sink current through transistor 588. A delay in the charging and the discharging of the capacitor 596 is caused by the RC time constant and can be adjusted to obtain a desired delay between the current sinks 589–590 and the current sources 582–585. Transistors 589–590 have gates connected to capacitor 596 such that they each sink a current indicative of the past pullup current.

As seen in FIG. 42E, transistor 582 is connected in series with transistor 588, transistor 583 is connected in series with transistor 589, and transistor 585 is connected in series with transistor 590. In operation, transistor 588 acts to control the current input to the capacitor 596. When the source current exceeds the sink current, transistor 582 is generating more current than transistor 588 is sinking. As a result, the additional source current flows through resistor 594 and charges capacitor 596. If the source current is less than the sink current, then transistor 588 is sinking more current than transistor 582 is sourcing and the additional sink current flows from the capacitor 596 through the resistor 594 and through transistor 588, thereby decreasing the charge on capacitor 596.

A resistor 600, current source 583, and current sink 589 form a positive differential current circuit for determining whether the present pullup current is greater than the past pullup current. When the source current through transistor 583 is greater than the sink current through transistor 589, the additional source current flows through resistor 600 to ground. That current creates a positive voltage across resistor 600, raising the voltage at an input terminal of an inverter 602. When the voltage at the input terminal of the inverter 602 becomes a high logic value, the inverter 602 will change the output signal PULLUPOK1 to a low logic value indicating an increase in the pullup current. When the source current is less than or equal to the sink current, the voltage across resistor 600 is zero or negative, and does not affect the signal PULLUPOK1.

Similarly, a resistor 606, current source 585, and current sink 590 form a negative current differential circuit for determining whether the present pullup current is less than the past pullup current. When the sink current through transistor 590 is greater than the source current through transistor 585, the additional sink current flows from Vcc through resistor 606 and into transistor 590. As a result, a voltage at an input terminal of an inverter 608 is lowered. When the voltage at the input terminal of the inverter 608 becomes a low logic value, the signal PULLUPOK2 will change to a low logic value as a result of the series connection of inverter 608 with an inverter 609 thereby indicating that the pullup current has decreased. However, when the sink current through transistor 590 is equal to or less than the source current through transistor 585, additional current builds up at the input terminal of inverter 608, causing the voltage at the input terminal of inventor 608 to remain at a high logic value, thereby maintaining a high logic value for the PULLUPOK2 signal.

The pullup current monitor 518 also includes the overcurrent monitor 522. The overcurrent monitor 522 includes current source 584 and generates a signal DVC2HIC indicative of whether the pullup current is excessive. The source current from transistor 584 flows into a resistor 514. Resister 514 converts the current into a voltage that is monitored by an inverter 616. As long as the source current is not too high, the input terminal of inverter 616 remains at a low logic state. If, however, the source current becomes excessive, the input terminal of inverter 616 changes to a high logic state and causes signal DVC2HIC to assume a high logic state, as a result of the series connection of the inverter 616 with an inverter 617, indicating an overcurrent situation. The amount of current required to trigger the overcurrent monitor is defined by the input voltage at which the inverter 616 changes states divided by the resistance of resistor 514.

The pulldown current monitor 520 illustrated in FIG. 42F functions in an analogous manner to the pullup current monitor 518. The pulldown current monitor 520 includes current sinking transistor 620–622 for sinking a current indicative of the present pulldown current in the voltage generator 510. The pulldown current monitor 520 also includes current sourcing transistor 626–628. Transistor 626 generates a source current indicative of the present pulldown current and transistors 627 and 628 generate a source current indicative of a past pulldown current. The time difference between the present pulldown current and the past pulldown current is defined by an RC time constant formed from a resistor 630 and a capacitor 632. Pulldown current monitor 520 also includes a resistor 636 forming part of a positive differential current circuit for producing signal PULLDOWNOK1 and a resistor 638 forming part of a negative differential current circuit for producing signal PULLDOWNOK2. The pulldown current monitor 520, however, does not include a circuit analogous to the overcurrent monitor 522.

FIG. 42G illustrates the details of the output logic 524 shown in FIG. 41. The output logic 524 is enabled by signal ENABLE and receives signals VOLTOK1 and VOLTOK2 from the voltage detection circuit 516, PULLUPOK1 and PULLUPOK2 from the pullup current monitor 518, and PULLDOWNOK1 and PULLDOWNOK2 from the pulldown current monitor 520. If the output logic 524 is enabled, and if all the input signals indicate that the voltage generator 510 is stable, the output logic 524 will generate a signal DVC2OK*, indicating that the DVC2 voltage is stable. That, completes the description of the voltage supplies.

VIII. Center Logic

The center logic 23 illustrated in FIG. 2 is illustrated in block diagram from in FIG. 43. The center logic is responsible for performing a number of functions including processing of the row address strobe signals in a RAS chain circuit 650, processing of column address strobe signals in control logic 651, row address predecoding in row address block 652, and column address predecoding in block 654. The center logic 23 also contains test mode logic 656, option logic 658, a "spares" circuit 660, and a misc. signal input circuit 662. The control portion 401 of the Vccp pump 400 (see FIG. 39) and the voltage regulator 220 (see FIG. 35) are located in the center logic. Completing the description of the center logic 23 illustrated in FIG. 43, a power up sequence circuit 1348 of the type illustrated in FIG. 100 is also provided. Each of the blocks 650, 651, 652, 654, 656, 658, 660 and 662 illustrated in FIG. 43 will now be described. The voltage regulator 220 and the control portion 401 of the Vccp pump 400 have already been described hereinabove in Section VII; the power up sequence circuit 1348 is described hereinbelow in Section XI.

The RAS chain circuit 650 is illustrated in block diagram form in FIG. 44. The purpose of the RAS chain circuit 650 is to provide read and write control signals for the circuit 10. Beginning in the upper left hand corner of FIG. 44, a RAS D generator 665 is provided. The purpose of the generator 665 is to simulate the time needed for the address buffers to set up. A signal RASD is produced by the generator 665 in response to that simulation. An electrical schematic of one type of RAS D generator 665 is illustrated in FIG. 45A.

The next circuit in the RAS chain circuit 650 is the enable phase circuit 670. The purpose of the circuit 670 is to generate phase signals ENPH, ENPH* used for timing purposes. An electric schematic of one type of circuit 670 is illustrated in FIG. 45B.

An ra enable circuit 675 is provided to generate row address latch signals RAL and row address enable signals RAEN*. Those signals are input to an equilibration circuit 700 and an isolation circuit 705, the purpose of which will be described hereinbelow. An electric schematic illustrating one type of circuit 675 is illustrated in FIG. 45C.

The RAS chain circuit 650 includes a WL tracking circuit 680 the purpose of which is to approximate how long it takes a wordline to fire. An electrical schematic of one type of tracking circuit 680 is illustrated in FIG. 45D. The tracking circuit illustrated in FIG. 45D is comprised of a first portion 681 which estimates the time needed for the row encoders to power up, a second portion 682 which estimates the time required for the array to power up (shown schematically in the enlargement), and a third portion 683 which provides additional delay before the signal WLTON is produced. The signal WLTON is used for wordline tracking.

A sense amps enable circuit 685 is provided which produces signals ENSA, ENSA* for firing the N-sense amplifiers and signals EPSA, EPSA* for firing the P-sense amplifiers. An electrical schematic of one type of sense amps enable circuit 685 is illustrated in FIG. 45E.

A RAS lockout circuit 690 is provided for generating a signal RASLK* which is used elsewhere in the logic for lockout purposes. An electric schematic of one type of RAS lockout circuit 690 is illustrated in FIG. 45F.

An enable column circuit 695 is provided to produce the signals ECOL, ECOL* which are used to enable the column address circuitry. An electrical schematic of one type of enable column circuit 695 is illustrated in FIG. 45G.

An equilibration circuit 700 and isolation circuit 705 each receive the signals RAEN*, RAEND which are used to produce the EQ* signal and ISO* signal, respectively. The EQ* signal is used to control the equilibration process while the ISO* signal controls the isolation of the array. An electrical schematic of one type of circuit which may be used for the equilibration circuit 700 is illustrated in FIG. 45H while an electrical schematic of one type of circuit which may be used for the isolation circuit 705 is illustrated in FIG. 45I.

A read/write control circuit 710 is provided for producing the signals CAL* and RWL. The purpose of the circuit 710 is to latch the column address buffers when the correct combination of CAS*, RAS*, and WE* are provided at the input thereto. An electrical schematic of one type of circuit which may be used for the read/write control circuit 710 is illustrated in FIG. 45J.

A write time out circuit 715 is provided to control the write function. That control is implemented through the production of a signal WRTLOCK* which is input to the read/write control circuit 710 for control purposes. An electrical schematic of one type of write time out circuit 715 is illustrated in FIG. 45K.

A plurality of data in latches 720 and 725 are provided for latching data. An electrical schematic of one type of latch circuit which may be used for data in latch 720 is illustrated in FIG. 45L while an electrical schematic of one type of latch circuit which may be used for the data in latch 725 is illustrated in FIG. 45M. The latch circuits 720 and 725 may, in fact, be identical with only the signals input thereto changing.

A stop equilibration circuit 730 is provided to generate a signal STOPEQ* for the purposes of ending the equilibration process. An electrical schematic of one type of stop equilibration circuit 730 which may be used is illustrated in FIG. 45N.

Figure 450:
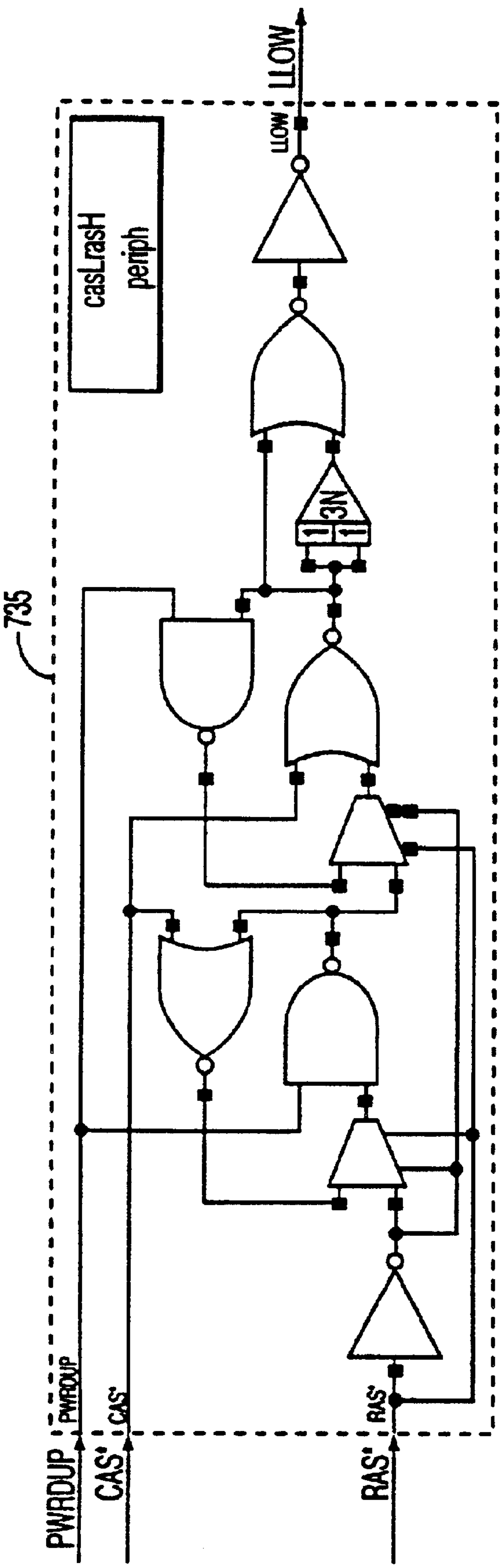

Completing the description of the RAS chain circuit 650, a CAS L RAS H circuit 735 and a RAS-RASB circuit 740 are provided to monitor the status of the CAS and RAS signals for producing output signals used elsewhere in the logic, and ultimately for controlling the amount of power generated by the voltage regulators. An electrical schematic of one type of CAS L RAS H circuit 735 is illustrated in FIG. 450 while an electrical schematic of one type of RAS-RAS B circuit 740 is illustrated in FIG. 45P.

The control logic 651 illustrated in FIG. 43 is illustrated in block diagram form in FIG. 46. The control logic 651 includes a RAS buffer 745. The RAS buffer is produces two output signals PROW* which is for powering up the row address buffer and a signal RAS* which starts the RAS chain circuit 650. An electrical schematic of one type of RAS buffer which may be used for the buffer 745 is illustrated in FIG. 47A.

A fuse pulse generator 750 is provided which is responsive to the powered up signal, produced by the powerup sequence circuit described hereinbelow, and the RAS* signal. The fuse pulse generator 750 produces a number of pulses which effectively prompt the circuit 10 to determine the status of various bond options and fuses. An electrical schematic of one type of fuse pulse generator 750 is illustrated in FIG. 47B.

An output enable buffer 755 is responsive to a number of input signals for producing an output enable OE signal. An electrical schematic of one type of output enable buffer which may be used for the output enable buffer 755 is illustrated in FIG. 47C.

The next two circuits, a CAS buffer 760 and a dual CAS buffer 765, are responsive to various input signals related to the CAS signal to produce output signals input to a QED logic circuit 775. In an x16 part, CAS H refers to the eight most significant bits of the data while CAS L refers to the eight least significant bits of the data. An electrical schematic illustrating one type of CAS buffer which may be used for the CAS buffer 760 is illustrated in FIG. 47D while 47E is an electrical schematic of one type of dual CAS buffer which may be used for the dual CAS buffer 765.

A write enable buffer 770 produces a write enable signal WE* and a signal PWE* which are input to the QED logic circuit 775. An electrical schematic of one type of circuit which may be used for the write enable buffer 770 is illustrated in FIG. 47F.

The QED logic circuit 775 is responsive to a number of input signals illustrated in both FIG. 46 and FIG. 47G. The QED logic circuit 775 is responsible for producing the control signals QEDL, responsible for the low byte, and QEDH, responsible for the high byte. The control signals QEDL and QEDH are ultimately responsible for controlling the transfer of data. The electrical schematic illustrated in FIG. 47G illustrates one type of QED logic circuit which may be used for the QED logic circuit 775.

A data out latch 780 is provided to hold the data until the CAS signal goes low and new data is latched. An electrical schematic for one type of data latch which may be used as the data out latch 780 is illustrated in FIG. 47H.

A row fuse precharge circuit 785 produces signals which are input to row fuse blocks, discussed hereinbelow, for initiating the process of determining if there is a match between a row address and a redundant row address. An electrical schematic of one type of circuit which may be used for the row fuse precharge circuit 785 is illustrated in FIG. 47I.

A CBR circuit 790 is provided for determining when there is an occurrence of CAS before RAS. An electrical schematic of one type of circuit suitable for the CBR circuit 790 is illustrated in FIG. 47J.

A pcol circuit 800 is provided which is responsive to the input signals RAS*, WCBR, CBR, and RAEN* for producing the signals PCOL WCBR*, PCOL*, and PCOL. An electrical schematic of one type of circuit which may be used for the p col circuit 800 is illustrated in FIG. 47K. The signal PCOL WCBR* is input to the column predecode enable circuits to enable the column predecoders.

Finally, write enable circuits 805 and 810 are provided which are substantially identical in construction and operation. An electrical schematic of one type of write enable circuit which may be used for the circuit 805 is illustrated in FIG. 47L while an example of a write enable circuit which may be used for the circuit 810 is illustrated in FIG. 47M.

The row address block 652 of FIG. 43 is illustrated in block diagram form in FIGS. 48A and B. In FIGS. 48A and B a number of row address buffers 820 through 833 are illustrated. Each of the row address buffers 820 through 833 is responsive to a different bit of the row address information. The row address buffers are also responsive to a row address enable circuit 835 while the first row address buffer 820 is responsive to a clock 837. The row address block 652 also includes a row address predecoder 840 comprised of a 2 inv driver 842, an all row P decode row driver 844, and a plurality of NANDP decoders 846 through 850. The row address block 652 also includes a 4k8k log circuit 852 and an 8k16k log circuit 854.

An electrical schematic of the row address buffer 820 as well as the row address enable circuit 835 and clock 837 is illustrated in FIG. 49A. FIGS. 49B and 49C illustrate the wiring between the row address buffers 820 through 833. The electrical schematics illustrated in FIG. 49A and the wiring diagrams illustrated in FIGS. 49B and C are one implementation of the required functionality.

Turning to FIG. 50A, an example of a 2 inv driver 842 is illustrated. Also illustrated is an example of one type of an all row P decode row address driver 844 and an exemplary circuit for the NAND P decoders 846. The inputs and outputs for the NAND P decoders 847, 848, and 849 are illustrated in FIG. 50B. It is to be understood that the NAND P decoders 847, 848, and 849 illustrated in FIG. 50B may take the form of the NAND P decoder 846 illustrated in FIG. 50A. Finally, the NAND P decoder 850 and the log circuits 852 and 854 are illustrated in detail in FIG. 50C.

FIGS. 51A and 51B illustrate in block diagram form the column address block 654 illustrated in FIG. 43. The column address block 654 is comprised of a plurality of column address buffers 860 through 872 which are each responsive to a bit of the column address information. The column address buffers 860 through 868 are also responsive to a pcol address 1 circuit 874. The column address buffer 869 is responsive to a pcol address circuit 876. Similarly, the column address buffers 870, 871, 872 are each responsive to a pcol address 10, address 11, and address 12 circuits 878, 880, and 882, respectively.

The column address block 654 also includes a column predecode portion 884 which includes a column P decoder enable circuit 886 and a plurality of encode P decoders 888 through 893. The decoder 893 is also responsive to a mux 895.

Completing the description of the column address block 654 illustrated in FIG. 51B, two select circuits, a 16 meg select circuit 897 and a 32 meg select circuit 898 are provided to produce control signals which dictate the functions of the various addresses. An equilibration driver 900 is responsive to a plurality of ATD 4AND circuits 902, 903, and 904.

Figure 52A:
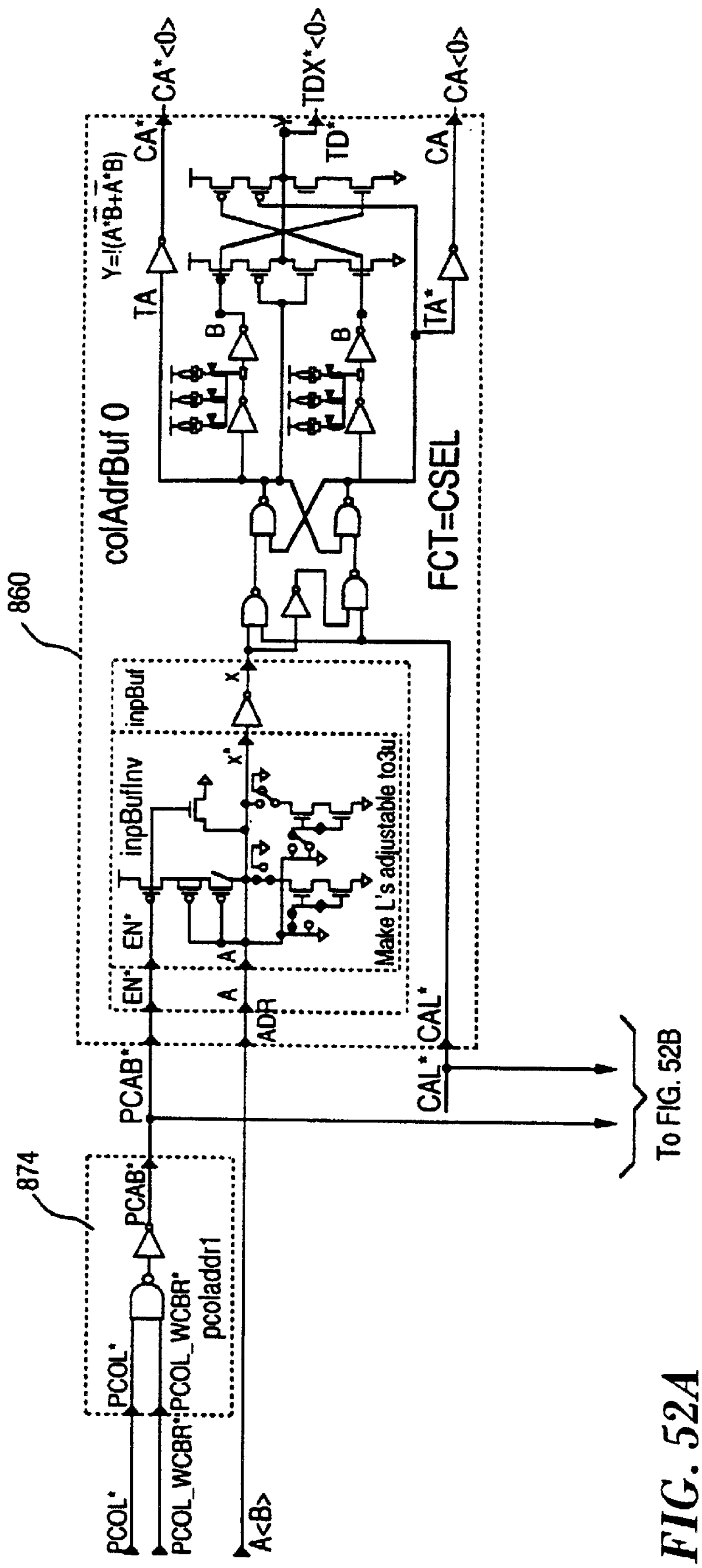
Figure 52B:
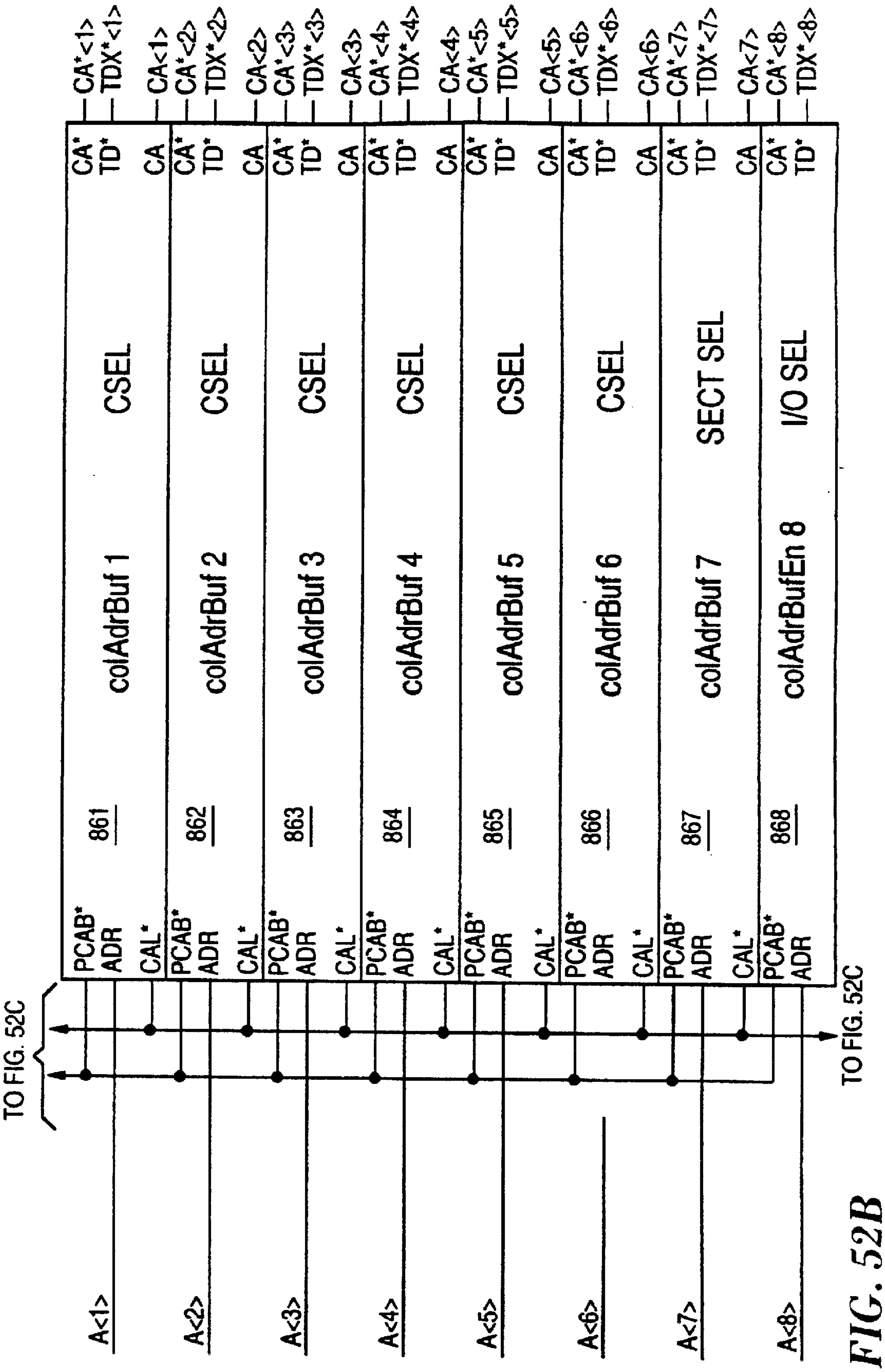
Figure 52C:
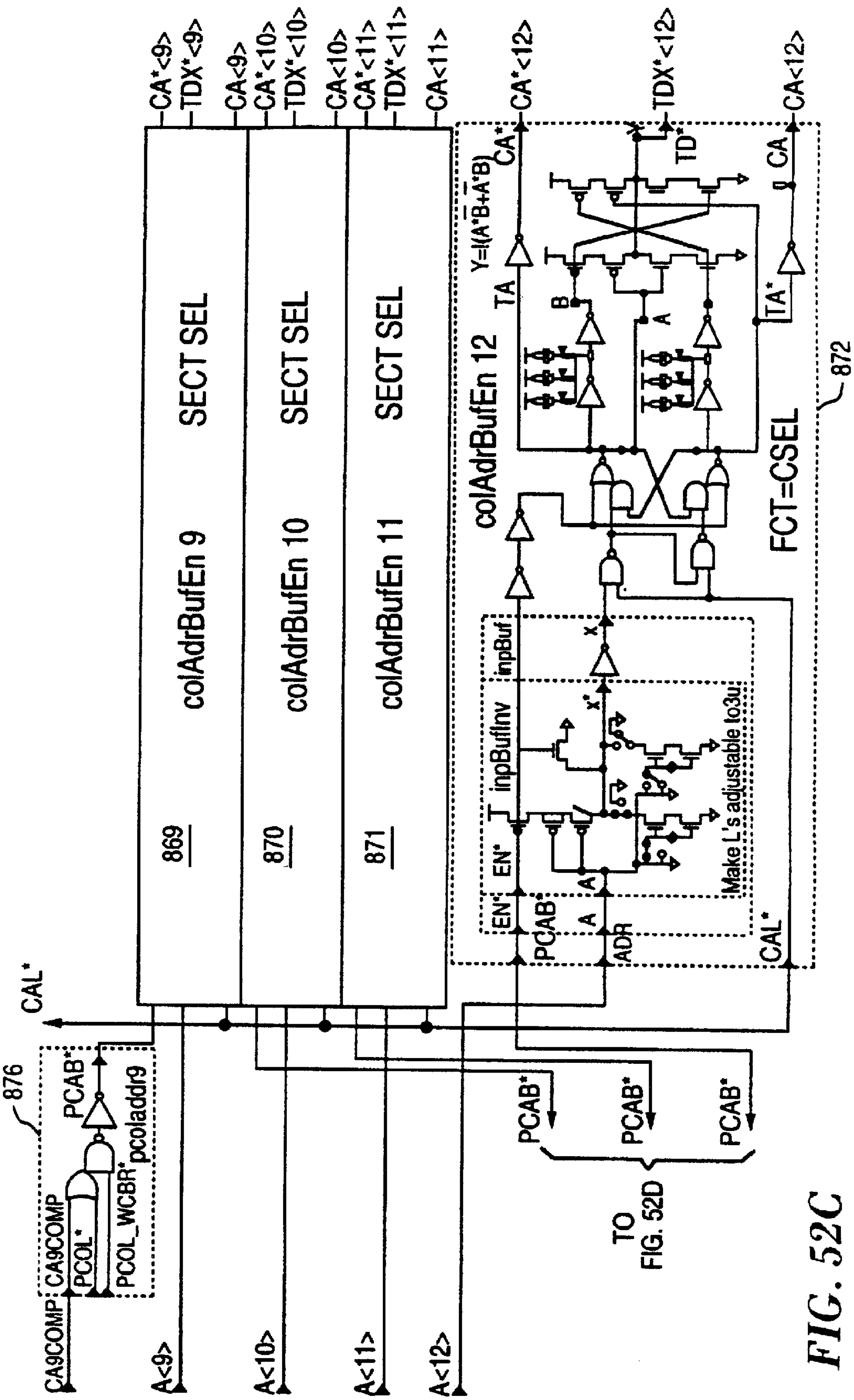
Figure 52D:
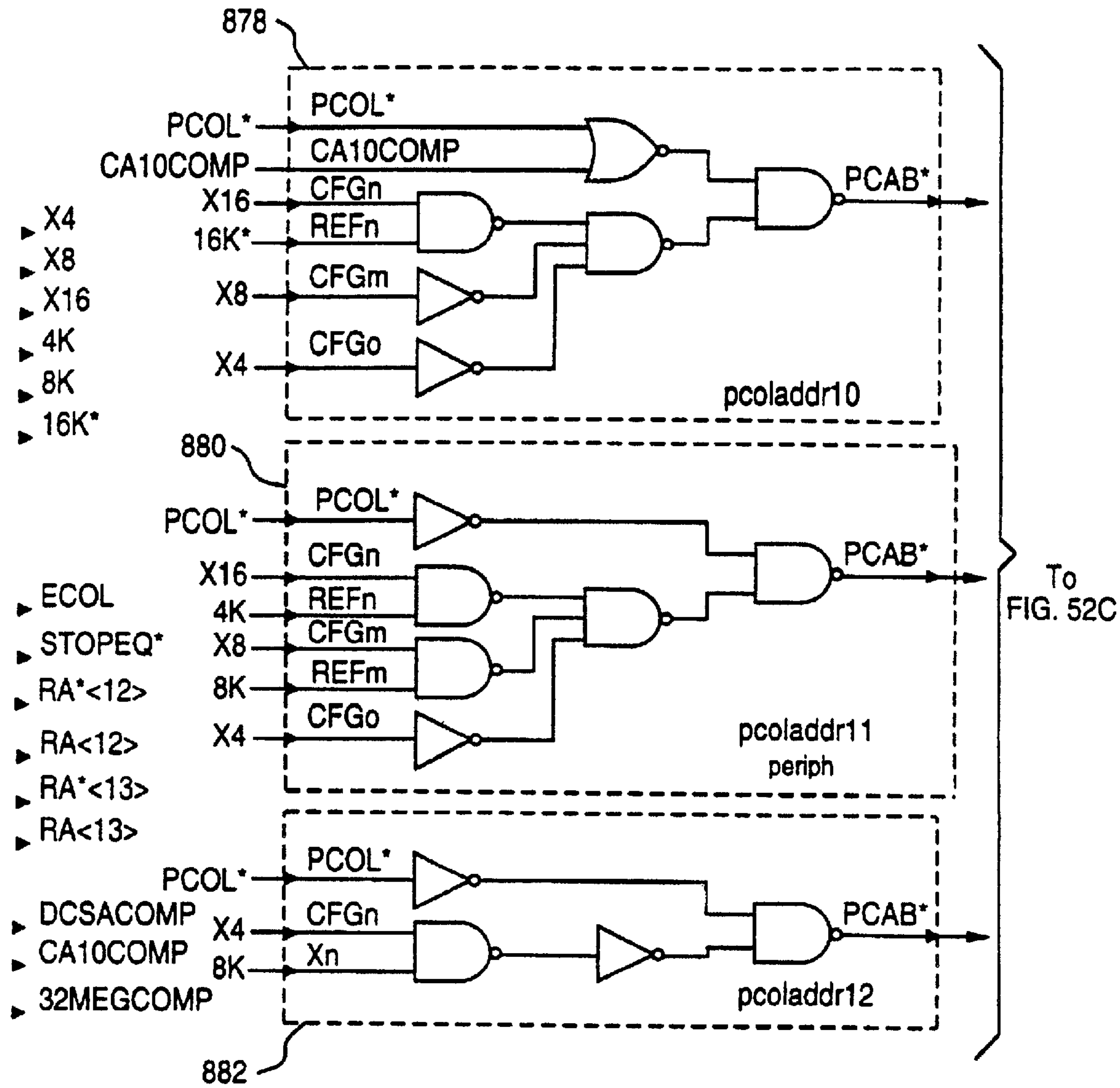

FIGS. 52A, 52B, and 52C illustrate the column address buffers 860 through 872 with the column address buffer 860 and the column address buffer 872 being illustrated as electrical schematics. Also illustrated as electrical schematics are the pcol address 1 circuit 874 and the pcol address 9 circuit 876. The address circuits 878, 880, and 882 are illustrated as electrical schematics in FIG. 52D. The reader should understand that the electrical schematics and wiring configuration illustrated in FIGS. 52A through 52D illustrate but one example for implementing and interconnecting the column address buffers.

The predecoder portion 884 of the column address block 654 is illustrated as an electrical schematic and wiring diagram in FIG. 53. One of the encode P decoders 888 is illustrated as an electrical schematic as are the column P decoder enable circuit 886 and the mux 895. The reader should understand that the electrical schematic and wiring configuration illustrated in FIG. 53 is but one implementation for the predecoder portion 884.

An electrical schematic which may be used to implement the 16 meg select circuit 897 is illustrated in FIG. 54A. An electrical schematic which may be used to implement the 32 meg select circuit 898 is illustrated in FIG. 54B. The select circuits 897 and 898 determine the significance of the address information.

Finally, the equilibration driver 900 and associated circuits 902, 903, 904 are illustrated as an electrical schematic in FIG. 55. The equilibration driver 900 produces the signals which are used to equilibrate the sense amps and IO lines. The reader should understand that the electrical schematic illustrated in FIG. 55 is but one way to implement the equilibration driver 900.

The test mode logic 656 illustrated in FIG. 43 is illustrated as a block diagram in FIG. 56. In FIG. 56, the test mode logic 656 is comprised of the following circuits:

- a test mode reset circuit 910 shown in detail in FIG. 57A;
- a test mode enable latch 912 shown in detail in FIG. 57B;
- a test option logic circuit 914 shown in detail in FIG. 57C;
- a supervolt circuit 916 shown in detail in FIG. 57D;
- a test mode decode circuit 918 shown in detail in FIG. 57E;
- a plurality of SV test mode decode 2 circuits 920 and a plurality of associated output buses 921 shown in detail in FIG. 57F;
- an optprog driver circuit 922 shown in detail in FIG. 57F;
- a red test circuit 923 shown in detail in FIG. 57G;
- a Vccp clamp shift circuit 924 shown in detail in FIG. 57H;
- a DVC2 up/down circuit 925 shown in detail in FIG. 57I;
- a DVC2 OFF circuit 926 shown in detail in FIG. 57J;
- a pass Vcc circuit 927 shown in detail in FIG. 57K;
- a TTLSV circuit 928 shown in detail in FIG. 57L; and
- a disred circuit 929 shown in detail in FIG. 57M.

An electrical schematic of one type of test mode reset circuit which may be used for the reset circuit 910 is illustrated in FIG. 57A. If a test mode is to be reset, test mode reset circuit 910 provides the SVTMRESET signal to the SV test mode decode 2 circuits 920 of FIG. 57F and the TMRESET signal to the test mode decode circuit 918 of FIG. 57E.

An example of a test mode enable latch 912 is illustrated in FIG. 57B. In the present preferred embodiment of the invention, addresses have been divided into two categories: for the low set of addresses, signal SVTMLATCHL is used while the signal SVTMLATCHH is used for the high set of addresses. The signals SVTMLATCHL and SVTMLATCHH are mutually exclusive. The signal TMLATCH is supplied to the test mode decode circuit 918 of FIG. 57E and the SV test mode decode 2 circuits 920 of FIG. 57F.

An example of the test option logic 914 is illustrated as an electrical schematic in FIG. 57C. The logic illustrated in FIG. 57C is but one example of how the test mode logic 914 of FIG. 56 may be implemented.

One example of an electrical schematic for implementing the supervolt circuit 916 is illustrated in FIG. 57D. The purpose of the supervolt circuit 916 is to prevent a power-up when the chip is in a supervoltage mode.

An electrical schematic illustrating one example of a test mode decode circuit 918 is illustrated in FIG. 57E. Test mode decode circuit 918 is employed to decode certain column address bits to activate a supervolt test mode enable signal (SVTMEN*) when a signal (TMLATCH), indicating that the supervoltage mode is to be looked for, is latched. By latching a test or detect mode with latches 906, 907, if the address signal is correct or a match, then initiation of a test mode begins with the SVTMEN* signal being activated. Latch 906 latches a supervoltage enable test mode at a RAS active (low) time. Latch 907 latches the supervoltage enable test mode after RAS goes inactive (high) and the WLTON 1 signal is inactive. That allows other test mode(s) to be looked at or entered provided signal NCSV (FIG. 57D) goes to a supervoltage level. Test mode decode circuit 918 provides the signal SVTMEN* to the supervolt circuit 916 (FIG. 57D) and test mode enable latch 912 (FIG. 57B). Supervolt circuit 916, in response to the signal SVTMEN*, activates the supervolt signal SV when the signal NCSV is in the supervolt mode. The signal SV is provided to the test mode reset circuit 910 of FIG. 57A and the test mode enable circuit latch 912. To prevent inadvertent access, two cycles are needed to enter a test mode to test mode decode circuit 918 (FIG. 57E). In one embodiment, a first WCBR cycle is used to initiate a ready state; a second WCBR cycle is used to actually enter a test mode state. That makes it more difficult to inadvertently enable supervoltage and enter a test mode state. If the test mode enable latch 912 is active, either the signal SVTMLATCHH or the signal SVTMLATCHL (FIG. 57B) will be active for activating certain of the supervolt test mode decode 2 circuits 920 of FIG. 57F.

The SV test mode decode 2 circuits 920, of which there are eight, are illustrated in detail in FIG. 57F together with the respective output buses 921. The reader should realize that the electrical schematic illustrated in the bottom portion of FIG. 57F may be used to implement the other SV test mode decode 2 circuits as well as the fact that other combinations of logic gates may be used to implement that functionality. Also shown in FIG. 57F is the optprog driver circuit 922 which produces the signal OPTPROG* which is input to the option logic 658.

The SV test mode decode 2 circuits 920 receive column address fuse identification signals (CAFID), column address test mode bit signals, test mode latch signals (SVTMLATCH), and fuse identification select signals (FIDBSEL), in addition to the TMSLAVE signal, TMSLAVE* signal, and supervolt test mode reset signal (SVTMRESET). The number of column address test mode bit signals depend on array size, number of test modes, number of fuse identifications, multiplexing, and the like. Each of the SV test mode decode 2 circuits 920 provides test mode signals TM, TM*, as well as fuse identification signals FIDDATA, FIDDATA*. While the signals FIDDATA indicate fuse ID, it should be understood that technology other than fuses, such as latches, flash cells, ROM cells, antifuses, RAM cells, mask programmed cells, or the like, may be used.

With continuing reference to FIG. 57F, SV test mode decode 2 circuit 920 receives column address bits via inputs A0 and A1. Such bits may be multiplexed. Bits received by a NOR gate 1262 are for identifying a selected test mode. The column address fuse ID signal (CAFID) is supplied to a NAND gate 1263 along with the fuse ID select signal (FIDBSEL). The signal FIDBSEL is for selecting a fuse bank while the signal CAFID is for selecting a bit of a selected bank.

A signal available at an output terminal of the NAND gate 1263 is input directly to an inverting tri-state buffer 1264 and is input to the buffer 1264 through an inverter 1265. When the output of the NAND gate 1263 is inactive, output buffer 1264 is tri-stated. When the output of the NAND gate 1265 is active, data signals FIDDATA, FIDDATA* are active such that information is output. The TMSLAVE and TMSLAVE* signals are for setting a latch 1266 formed by a pair of multiplexers. The signal TMLATCH is for setting a latch 1267 formed by another pair of multiplexers. As the column address bit information is processed, a test mode can be latched by the latch 1267 via signal TMLATCH. The latched test mode status of latch 1267 is provided to latch 1266 resulting in the output of the signal SEL32MTM after RAS and WLTON go inactive. A discussion of a timing diagram for test mode entry is set forth hereinbelow in conjunction with FIG. 103.

An electrical schematic illustrating one implementation of the redundant test circuit 923 is illustrated in FIG. 57G. The circuit 923 produces redundant row and redundant column signals as illustrated.

The Vccp clamp shift circuit 924 is illustrated in FIG. H. The circuit 924 is used to shift the voltage level of the input signal. Other types of clamp shift circuits may be implemented.

FIG. 57I illustrates an example of a DVC2 up/down circuit 925. The circuit 925 produces the signals DVC2 up* and DVC2 down which are input to the DVC2 up circuit 1069 and the DVC2 down circuit 1070, respectively, both of which are illustrated in FIG. 72B.

In FIG, 57J an example of a DVC2OFF Circuit 926 is illustrated. The circuit 926 produces the signal DVC2OFF which is input to the enable 1 circuit 512 illustrated in FIG. 42B.

FIG. 57K illustrates the Pass Vcc circuit 927. Other ways of implementing the functionality provided by the circuit 927 may be implemented.

FIG. 57L illustrates an implementation for the TTLSV circuit 928. The primary function of the circuit 928 is to delay the signal TTLSVPAD.

Lastly, a disred circuit 929 is illustrated in FIG. 57M. The circuit 929 may be implemented by a Nor gate as shown in the figure.

The next element of FIG. 43 to be described is the option logic 658 which is illustrated as a block diagram in FIGS. 58A and 58B. In FIG. 58A, a plurality of both fuse 2 circuits 930 through 940 are responsive to a number of external signals. The both fuse 2 circuits 932 through 940 are responsive to an SGND circuit 941 while the both fuse 2 circuits 930, 931 are responsive to a second SGND circuit 942.

An ecol delay circuit 944 provides input to an anti-fuse cancel enable circuit 945.

In FIG. 58B, a first CGND circuit 946 is responsive to an OPTPROG signal and a CGND Probe signal. Additional CGND circuits 947–951 are responsive to an XA<10> signal; CGND circuit #947 is responsive to the OPTPROG signal, and CGND circuit 948–951 are responsive to an ANTIFUSE signal.

Returning to FIG. 58A, an anti-fuse program enable circuit 956 produces a signal input to a plurality of passgate circuits 952 through 955. A PRG CAN decode circuit 957 is responsive to the passgate 952, a PRG CAN decode circuit 958 is responsive to the passgate circuit 953, and FAL circuits 959 and 960 are responsive to both the passgate 952 and the passgate 954.

Bond option circuits 965, 966 produce input signals which are input to a bond option logic circuit 967.

Two laser fuse option circuits 970 and 971 are also provided. In addition to the laser fuse option circuits 970, 971, a bank of laser fuse option 2 circuits 978 through 982 (See FIG. 58B) are provided. The laser fuse option 2 circuits 978 through 982 are responsive to a reg pretest circuit 983.

Completing the description of FIG. 58A, the option logic 658 also includes a 4K logic circuit 985, a fuse ID circuit 986, a DVC2E circuit 987, a DVC2GEN circuit 988, and a 128 Meg circuit 989.

An electrical schematic of one type of circuit which may be used as the both fuse 2 circuits 930 through 940 is illustrated in FIG. 59A. The external signals which are on a bus which interconnects all of the both fuse 2 circuits 931 through 940 is illustrated in FIG. 59B as is the 120 Meg circuit 989.

FIG. 59C illustrates an electrical schematic of one type of SGND circuit 941.

One embodiment of the ecol delay circuit 944 and the antifuse cancel enable circuit 945 is illustrated in detail in FIG. 59D. The circuits 944 and 945 cooperate to produce the LATMAT signal.

FIG. 59E illustrates an electrical schematic of the CGND circuit 951, which may be used to implement the other CGND circuits 947–951, as well as the interconnection of the CGND circuits 946–951.

FIG. 59E illustrates one implementation for the passgates 952–955, anti-fuse program enable circuit 956, PRG decode circuits 957, 958, and FAL circuits 959, 960. The reader should understand that the details illustrated in FIG. 59F are but one method of implementing the functionality of that circuitry.

An electrical schematic for implementing the bond option circuits 965, 966 is illustrated in FIG. 59G as is the bond option logic circuit 967. The purpose of the bond option circuits 965, 966 and the bond option logic 967 is to determine the bond option selected and to produce logic signals instructing the part if it is an ×4, ×8 or ×16 part.

The laser fuse option circuits 970, 971 are illustrated in FIG. 59H. FIG. 59H illustrates one type of circuit implementation for the option. Other types of fuse option circuits may be provided.

FIG. 59I illustrates one of the laser fuse opt 2 circuits 978 as well as the interconnections between the reg pretest circuit 983 and the laser fuse opt 2 circuits 978–982. The circuitry used to implement the laser fuse opt 2 circuit 978 may be used to implement the circuits 979–982.

FIG. 59J is an example of how the 4k logic circuit 985 may be implemented. The 4k logic circuit produces signals which are ultimately used by the voltage supplies of the chip to determine the amount of power which must be produced. For example, recall that the 4k signal is input to the pump circuits 413–415 comprising the secondary group 423 to control the operation of those pump circuits (see FIG. 39).

The construction of the fuse ID circuit 986 is illustrated in FIGS. 59K and 59L. The fuse ID circuit may be comprised of eight multibit banks. The banks may be used to store unique information about the part such as part number, position on the die, etc.

Finally, FIGS. 59M and 59N illustrate the details of one implementation of the DVC2E circuit 987 and the DVC2GEN circuit 988, respectively.

Completing the description of the block diagram illustrated in FIG. 43, the spare circuit 660 is shown in detail in FIG. 59O and the miscellaneous signal input circuit 662 is illustrated in detail in FIG. 59P. The spare circuit 660 illustrates various additional components which may be fabricated to provide spares for repair purposes. The miscellaneous signal input circuit 662 illustrates a plurality of pads at which signals may be input or available.

IX. Global Sense Amp Drivers

The global sense amp driver 29 illustrated in FIG. 3C is illustrated in block diagram form in FIG. 60. As seen in FIG. 3C, a substantial number of signals generated by the right logic 19 are input, vertically as shown in FIG. 3C, into global sense amp driver 29. It is the function of global sense amp driver 29 to reorient those signals 90° and in some cases decode or produce signals therefrom for input to the circuits in the horizontal space existing between the rows of individual 256K arrays 50 making up left 32 Meg array block 25 and right 32 Meg array block 27. The global sense amp drivers 35, 42, and 49 are identical in construction and operation to the global sense amp driver 29 such that only one will be described.

As shown in the block diagram of FIG. 60, the global sense amp driver 29 is comprised of alternating row gap drivers 990, of which there are seventeen, and sense amp driver blocks 992, of which there are sixteen in this embodiment. The row gap drivers 990 determine which of the sixteen strips is enabled. An example of one type of sense amp driver block 992 which may be used in connection with the present invention is illustrated in FIG. 61. An electrical schematic of one type of row gap driver 990 which may be used in connection with the present invention is illustrated in FIG. 62. Those of ordinary skill in the art will recognize that many types of row gap drivers 990 and sense amp driver blocks 992 may be provided.

Sense amp driver block 992 includes an isolation driver 994 which receives an enable signal and a select signal to produce the ISO* signal used to drive the isolation transistors 83 shown in FIG. 6C. The condition of the isolation driver 994 is controlled by the state of the enable signal.

The isolation driver 994 is illustrated in detail in FIG. 63. The isolation driver 994 includes a control circuit 995 which is responsive to an internal signal 1004 generated by a detector circuit 998. The control circuit 995 is also responsive to the enable signal ENISO and the select signal SEL32M. The control circuit 995 includes an enable circuit 996, which ensures that all devices connected to the pumped potential are disabled when the isolation driver 994 is disabled. The detector circuit 998 monitors a first driver circuit 999, which circuit includes a transistor 1003, and generates the internal signal 1004 to deactivate the first driver circuit 999 when an output node 1000 is driven to the supply voltage. The detector circuit 998 includes a pull-down transistor 1001 to prevent latch-up. A second driver circuit 1002 is responsive to the internal signal 1004 produced by the detector circuit 998 to couple the output node 1000 to the pumped potential. In that manner, latch up within the isolation driver 994 is prevented when the isolation driver is disabled.

X. Right and Left Logic

FIGS. 64A, 64B, 65A, and 65B are high level block diagrams illustrating the right and left logic 19 and 21, respectively, of the present invention. The right logic 19 and left logic 21 are each associated with two 64 Meg array quadrants. As illustrated above in FIG. 2, the right logic 19 is associated with array quadrants 14 and 15 and the left logic 21 is associated with array quadrants 16 and 17. The right and left logic 19 and 21 are very similar to each other in both construction and operation. The right logic 19 is comprised of a left side and a right side, illustrated in FIGS. 64A and 64B, respectively. The sides are not identical because, as described below, some functions are performed for both sides by a single circuit.

As illustrated in FIG. 64A, the left side of the right logic 19 includes a 128 Meg driver block A 1010 and a 128 Meg driver block B 1012, each of which drive signals used by many circuits in the right logic 19. The architecture of the present invention allows for a clock-tree distribution of control signals, with some signals being redriven several times. The 128 Meg driver block A 1010 receives and drives predecoded row address signals RAnm<0:3>, ODD and EVEN signals, and control signals, such as ISO* and EQ*, for the sense amp elements. The 128 Meg driver block A 1010 is illustrated in detail in FIG. 66.

FIG. 67 is a block diagram of the 128 Meg driver block B 1012, which includes a row address driver 1014 for driving additional predecoded row address signals RA910<0:3> and RA1112<0:3>, and column address delay circuits 1016 for delaying predecoded column address signals CAnm<0:3>. The column address signals are delayed to allow time to determine if a redundant column should be fixed. Details of the row address driver 1014 and column address delay circuits 1016 are illustrated in FIGS. 68A and 68B, respectively.

Referring back to FIG. 64A, the right logic 19 includes a number of decoupling elements 1017. A decoupling element 1017, illustrated in detail in FIG. 69, may be embodied as two decoupling capacitors 44 together with an associated transistor 1019. The decoupling elements 1017 are distributed around the right logic 19 to stabilize voltage levels and to prevent localized voltage fluctuations. Generally, the concentration of decoupling elements 1017 in a given region of the right logic 19 is proportional to the power consumption in that region. If too few decoupling elements 1017 are present, power levels will fluctuate as components turn on and off, and power levels will vary from one location to another.

The right logic 19 also includes four global column decoders 1020–1023, one for each 32 Meg array block associated with the right logic 19. The 32 Meg array blocks are discussed in detail hereinabove in Section II. Closely associated with each global column decoder 1020–1023 is a column address driver block 1026–1029, and an odd/even driver 1032–1035, respectively. Associated with the column decoders 1020, 1021 are a column address driver block 2 1038 and a column redundancy block 1042; associated with the column decoders 1022, 1023 are a column address driver block 2 1039 and a column redundancy block 1043.

The odd/even drivers 1032–1035 drive signals ODD and EVEN to circuits in the global column decoders 1020–1023. One of the odd/even drivers 1032 is illustrated in detail in FIG. 70. Signal SEL32M<n> enables the odd/even drivers 1020–1023 and is indicative of whether the 32 Meg array block associated with the odd/even drivers 1020–1023 is enabled.

Each column address driver block 1026–1029 determines whether the 32 Meg array block associated with it is enabled. If the 32 Meg array block is enabled, an enable signal is provided to the column address driver block 2 1038, 1039 and column address signals are provided to the global column decoders 1020, 1021 or 1022, 1023, respectively. If the 32 Meg array block is not enabled, the column address driver block 1026–1029 discontinues the column address signals. The column address driver blocks 1026–1029 are discussed in more detail below in conjunction with FIG. 74.

Each side of the right logic 19 includes only one column address driver block 2. Column address driver block 2 1038 is responsive to enable signals from the column address driver blocks 1026, 1027, and column address driver block 2 1039 is responsive to enable signals from the column address driver blocks 1028, 1029. Only one enable signal is required to enable each column address driver block 2 1038, 1039. Once enabled, they provide column address data to the column redundancy blocks 1042, 1043, respectively. The column address driver block 2 1038 and 1039 are discussed in more detail below in conjunction with FIG. 76.

Only two column redundancy blocks 1042, 1043 are present in the entire right logic 19, one in the left side and one in the right side. Each of the column redundancy blocks 1042, 1043 is associated with two 32 Meg array blocks and two global column decoders 1020, 1021 and 1022, 1023, respectively. The column redundancy blocks 1042, 1043 receive column address signals from the column address driver block 2 1038, 1039, respectively, and determine whether the columns being accessed have been replaced with redundant columns. Information regarding redundant columns is provided to the appropriate global column decoder 1020, 1021 in the case of column redundancy block 1042, and the appropriate global column decoder 1022, 1023 in the case of column redundancy block 1043. The column redundancy blocks 1042, 1043 are discussed in more detail below in conjunction with FIG. 78.

The global column decoders 1020–1023 receive information regarding redundant columns, column address signals, and row address signals, and provide address signals to the 32 Meg array blocks. The global column decoders 1020–1023 are discussed in more detail below in conjunction with FIG. 82.

The right logic 19 also includes four row redundancy blocks 1046–1049, one for each 32 Meg array block. The row redundancy blocks 1046–1049, in a manner analogous to the column redundancy blocks 1042–1043, determine whether a row address has been logically replaced with a redundant row and produce output signals indicative thereof. The output signals from the row redundancy blocks 1046–1049 are driven by row redundancy buffers 1052–1055, respectively, and are also provided, via topo decoders 1058–1061, respectively, to the datapath 1064. The datapath 1064 is discussed in more detail hereinabove in Section IV.

The right logic 19 includes certain of the Vccp pump circuits 403, the Vbb pump 280, and four DVC2 generators 504, 505, 506, and 507, one for each 32 Meg array. The Vccp pump circuits are described in conjunction with FIG. 39, the Vbb pump 280 is described in conjunction with FIG. 37, and the DVC2 generators are described in conjunction with FIG. 41, hereinabove.

The right logic 19 also includes array V switches 1080–1083 and associated array V drivers 1086–1089, respectively. FIG. 71A illustrates one of the array V drivers 1086–1089. The array V drivers 1086–1089 are comprised primarily of two level translators 1094 and 1095 and two inverters 1096 and 1097. The array V drivers 1086–1089 translate signals to levels high enough to drive the array V switches 1080–1083, respectively. The array V drivers 1086–1089 each drive one of the signals SEL32M*<2:5> to a corresponding array V switch 1080–1083, respectively. Each of the array V drivers 1086–1089 also produces one of the signals ENDVC2<2:5> and provides it to an associated array V switch 1080–1083, respectively. Signals SEL32M*<2:5> are indicative of whether each of the four 32 Meg array blocks associated with the right logic 19 is enabled. Each one of the signals ENDVC2L<2:5> is indicative of whether an associated one of the DVC2 generators 504, 505, 506, and 507 is enabled. Each of the array V switches 1080–1083, one of which is shown in detail in FIG. 71B, receives one of the signals SEL32M*<n>, and produces one of the signals Vccp<n>. Similar functionality can be used to switch the voltage Vcca.

FIG. 72A illustrates the details of the DVC2 switch 1066 shown in FIG. 64B. The DVC2 switch 1067 may be implemented in the same manner as the switch 1066. The DVC2 switches 1066, 1067 receive signals AVC2<2:5> and DVC2<2:5>, respectively. Because both DVC2 switches 1066, 1067 are identical in construction but receive different signals, FIG. 72A uses signal DVC2I<0:3> to represent signal AVC2<2:5> in the case of DVC2 switch 1066. In the case of DVC2 switch 1067, signal DVC2<2:5> is used. The DVC2 switches 1066, 1067 are responsive to signals SEL32<n> and DVC2OFF, and can connect signals DVC2I<n> to DVC2PROBE. DVC2PROBE is connected to a probe pad and can be measured with a probe, for example, during testing of the DRAM. DVC2PRIBE is connected to ground when not in a test mode.

FIG. 72B illustrates the details of the DVC2 up circuit 1069 and DVC2 down circuit 1070 illustrated in FIG. 64B. The circuits 1069 and 1070 regulate the voltage level of the voltage DVC2 received by the DVC2 switch 1066 in response to signals DVC2 up and DVC2 down, respectively. When the voltage DVC2 is too high, the signal DVC2 down turns on the transistor in circuit 1070 which tends to pull the voltage DVC2 to ground. Conversely, when the voltage DVC2 is too low, the signal DVC2 up turns on the transistor in circuit 1069 which tends to pull the voltage DVC2 up toward the voltage Vccx.

The right logic 19 includes a DVC2 NOR circuit 1092, illustrated in detail in FIG. 73. The DVC2 NOR circuit 1092 logically combines signals DVC2OK*<n> generated by the four DVC2 generators 504, 505, 506, and 507. Logic gate 1073 produces a signal indicative of all of the DVC2 generators being good while logic gate 1072 produces a signal if any of the DVC2 generators is good. Switches 1074 are set to conduct the desired DVC2OK signal to an output terminal of circuit 1092.

Some of the components identified above will now be described in more detail. Unless stated otherwise, the following description is made with respect to the left side of the right logic 19, which is illustrated in FIG. 64A. In particular, the description is made with respect to the components located in the bottom portion of FIG. 64A, associated with the 32 Meg array block 31 on the left side of quadrant 15, as illustrated in FIG. 2. As with the electrical schematics and wiring diagrams previously shown, the following electrical schematics and wiring diagrams are being provided for exemplary purposes and not for limiting the claims to any particular preferred embodiment.

FIG. 74 is a block diagram of the column address driver block 1027 illustrated in FIG. 64A. The column address driver block 1027 includes an enable circuit 1110, a delay circuit 1112, and five column address drivers 1114. The enable circuit 1110 determines whether the 32 Meg array block 31 is enabled and generates signals 32MEGEN and 32MEGEN*. Signal 32MEGEN is output to enable the column address driver block 2, 1038 and signal 32MEGEN* is provided to the delay circuit 1112 and eventually enables the column address drivers 1114. The delay is needed to determine if a redundant column should be fired. Once the column address drivers 1114 are enabled, they drive the column address signals CAnm*<0:3> for use by the global column decoder 1021.

FIG. 75A illustrates the enable circuit 1110 for producing signals 32MEGEN* and 32MEGEN. FIG. 75B illustrates the delay circuit 1112 as a series of inverters which delay the propagation of the signal 32MEGEN*. The delay is increased by capacitors connected to an output terminal and an input terminal of two series connected inverters. The delay circuit 1112 produces a signal EN* for enabling the column address drivers 1114. The purpose of the delay circuit 1112 is to prevent the column address drivers 1114 from being enabled before the column redundancy can evaluate a new column address.

FIG. 75C illustrates one of the column address drivers 1114. Each column address driver 1114 receives column address signals CAnm*<0:3>, is enabled by signal EN*, and produces output signals LCAnm*<0:3> input to the global column decoder 1021.

FIG. 76 illustrates a block diagram of the column address driver block 2 1038 which services the entire left side of the right logic 19. The column address driver block 2 1038 drives column address signals CAnm<0:3> to the column redundancy block 1042. The column address driver block 2 1038 includes a NOR gate 1120 and five column address drivers 1122. The NOR gate 1120 receives signals 32MEGENa and 32MEGENb from column address driver blocks 1026 and 1027, respectively, and produces an enable signal EN* for the column address drivers 1122. If either of signals 32MEGENa and 32MEGENb is a logic high, the NOR gate 1120 will enable the column address drivers 1122.

FIG. 77 illustrates one of the column address drivers 1122. Each column address driver 1122 receives column address signals CAnm*<0:3>, is enabled by signal EN* from the NOR gate 1120, and produces output signals LCAnm*<0:3> input to the column redundancy block 1042.

FIG. 78 is a block diagram of the column redundancy block 1042. The column redundancy block 1042 services both the top and bottom portions of the left side of the right logic 19 and is comprised of two sets of eight identical column banks 1130. The first set 1132 of eight column banks 1130 serves global column decoder 1020 and the second set 1134 of eight column banks 1130 serves global column decoder 1021. The purpose of the column redundancy block 1042 is to determine whether a column address matches a redundant column address. Such matching will occur whenever a column has been logically replaced with a redundant column.

FIG. 79 is a block diagram of one of the column banks 1130 shown in FIG. 78. The column bank 1130 includes four column fuse blocks 1136–1139. All of the column fuse blocks 1136–1139 may be programmed by opening fuses with a precision laser, and one of the column fuse blocks 1136 may also be programmed electrically. The column fuse blocks 1136–1139 receive column address signals and produce column match signals CMAT*<0:3> which are indicative of a match between a column address and a redundant column. The CMAT* <0:3> signals cancel column select signals CSEL produced by the global column decoder 1021, and enable redundant column select signals RCSEL.

FIG. 80A is a block diagram of the column fuse block 1136 shown in FIG. 79. The column fuse block 1136 contains four column fuse circuits 1144, each of which receives column address signals CAnm*<0:3> and produces a column address match signal CAM* indicative of whether the column address signals match a portion of a redundant column address. An enable circuit 1146 produces an enable signal EN indicative of whether the column fuse block 1136 is enabled. The output signals CAM* and the enable signal EN* are combined in output circuit 1148 to produce a column match signal CMAT*, indicative of whether there is a match between a column address and a redundant column. Details of the output circuit 1148 are illustrated in FIG. 80B.

FIG. 80C illustrates the details of one of the columns fuse circuits 1144 shown in FIG. 80A. The column fuse circuit 1144 contains two fuses which may be opened to represent two bits of a redundant column address. Associated with each fuse is a latch, comprising two inverters in a feedback loop. Once enabled by column fuse power signals CFP and CFP* generated by the enable circuit 1146, the latches read the fuses and latch the data. The latches are generally enabled on powerup and during RAS cycles. The data in the latches is predecoded into true and complement signals and provided, along with the column address signals CAnm*<0:3>, to comparator logic for producing signal CAM*.

FIG. 80D illustrates details of the enable circuit 1046 shown in FIG. 80A. The enable circuit 1046 contains two fuses, one for enabling the fuse block 1136, and one for subsequently disabling the fuse block 1136 in the event the fuse block 1136 itself becomes defective. The enable circuit 1046 feeds the column fuse power signals CFP and CFP* for the column fuse circuits 1144 and a feedback signal EFDIS<n> indicative of whether the fuse block 1136 is disabled.

Referring back to FIG. 79, column electric fuse circuits 1150 and a column electric fuse block enable circuit 1152 provide signals to the electrically programmable column fuse block 1136. A fuse block select circuit 1154 receives the column address signals CAnm*<0:3> and produces a fuse block select signal FBSEL* indicative of whether the fuse blocks 1136–1139 are enabled. A CMATCH circuit 1156 receives the signals CMAT*<0:3> from the column fuse blocks 1136–1139 and produces signals CELEM and CMATCH* indicative of whether there is a match between a column address and a redundant column. Details of the column electric fuse circuits 1150, column electric fuse block enable circuit 1152, fuse block select circuit 1154, and CMATCH circuit 1156 are illustrated in FIGS. 81A, 81B, 81C, and 81D, respectively.

FIG. 82 is a block diagram of the global column decoder 1021 shown in FIG. 64A. The global column decoder 1021 includes four groups of column drivers, with each group having two column decode CMAT drivers 1160, 1161 and one column decode CA01 driver 1164. Each group of column CMAT drivers 1160, 1161 and column decode CA01 driver 1164 provides signals to a pair of global column decode sections 1170, 1171. The global column decoder 1021 also includes nine row driver blocks 1166. Each row driver block 1166 drives row address data to produce row address signals nLRA12<0:3>, nLRA34<0:3>, and nLRA56<0:3> for use by the 32 Meg array block 31. FIG. 83A illustrates the details of one of the row driver blocks 1166.

Each pair of column decode CMAT drivers 1160, 1161 are enabled by one of signals CA1011*<0:3> and collectively drive eight of the CMAT*<0:3> signals. Each of the column decode CA01 drivers 1164 is enabled by two of the signals CELEM<0:7> and each drives the signals CA01*<0:3>. FIGS. 83B and 83C illustrate the details of one of the column decode CMAT drivers 1160 and one of the column decode CA01 driver 1164, respectively.

Each of the global column decode sections 1170, 1171 are enabled by signals LCA01<0:3> and further predecode a group of column address signals to produce 132 column select signals CSEL for use by the 32 Meg block array 31. A total of 1056 column select signals CSEL<0:1055> are generated by all of the global column decode sections.

FIG. 83D is a block diagram of one of the global column decode sections 1170. The global column decode section 1170 is comprised of a plurality of column select drivers 1174 and R column select drivers 1176.

FIGS. 84A and 84B illustrate one of the column select drivers 1174 and R column select drivers 1176, respectively, found in the global column decode sections 1170, 1171.

FIG. 85 is a block diagram of the row redundancy block 1047 illustrated in FIG. 64A. The row redundancy block 1047 includes eight identical row banks 1180 for comparing a portion of a row address RAnm<0:3> to a portion of a redundant row address and for producing row match signals RMAT indicative of a match. Redundant logic 1182 logically combines the RMAT signals and produces output signals indicative of whether the row address RAnm<0:3> has been replaced with a redundant row. The redundant logic 1182 is shown in detail in FIG. 86.

In FIG. 86, the redundant logic 1182 receives the row match signals RMAT <n>. A node 1183 is charged to a high level. If any of the RMAT signals goes high, the node 1183 is discharged which is captured in a latch. If the signal ROWRED <n> stays low, then there is no redundancy match. Under those circumstances, the normal row is used. If the signal ROWRED <n> goes high, then one of the redundancy rows is to be used and the particular signal which goes high identifies the phase to be fired.

The redundant logic 1182 also receives the fuse address latch signal FAL which is combined with other signals to produce the RMATCH* signal, which is used for programming. The redundant logic 1182 also receives all of the ROWRED signals and combines them to produce a signal RELEM* which indicates that there is a match somewhere in the redundant logic. That signal is used to create the redundant (RED) signal.

FIG. 87 is a block diagram of one of the row banks 1180 illustrated in FIG. 85. The row bank 1180 includes one row electrical block 1186 which may be programmed either electrically or with a precision laser, and three row fuse blocks 1187–1189 which may be programmed only with a precision laser. The row electrical block 1186 and row fuse blocks 1187–1189 receive row address signals RAnm<0:3> and produce output signals RMAT<0:3> indicative of whether a row address matches a redundant row. Rsect logic 1192 receives the signals RMAT<0:3> and produces a signal RSECT<n> indicating which array section has a redundant match. The details of the rsect logic 1192 are illustrated in FIG. 88.

FIG. 89 is a block diagram of the row electric block 1186 illustrated in FIG. 87. The row electric block 1186 includes six electric banks 1200–1205 which receive row address signals and produce signals RED* indicative of whether there is a match between a row address and a redundant row. The addresses of redundant rows are represented electrically by signals EFnm<0:3>. A redundancy enable circuit 1208 is programmable with fuses to enable and disable the row electric block 1186, and to produce a signal PR to enable the electric banks 1200–1205 and an electric bank 2 1210. A select circuit 1212 and the electric bank 2 1210 receive row address signals and produce signals G252 and RED*, respectively, indicative of whether the row electric block 1186 is enabled. Like the electric banks 1200–1205, the electric bank 2 1210 compares row address data, represented by signals EVEN and ODD, to electrical signals EFeo<0:1>. An output circuit 1214 receives signals RED* from the electric banks 1200–1205 and signals G252 and RED* from the select circuit 1212 and the electric bank 2 1210, and produces row match signal RMAT indicative of whether there is a match between a row address and a redundant row. Details of one of the electric banks 1200, the redundancy enable circuit 1208, the select circuit 1212, the electric bank 2 1210, and the output circuit 1214, are illustrated in FIGS. 90A, 90B, 90C, 90D, and 90E, respectively.

FIG. 91 is a block diagram of one of the row fuse blocks 1187 illustrated in FIG. 87. The row fuse block 1187 includes fuse banks 1220–1225, a fuse bank 2 1228, a redundancy enable circuit 1230, a select circuit 1232, and an output circuit 1234. The components of the row fuse block 1187 are identical to the row electric fuse block 1186, except that redundant rows are represented by fuses in the fuse banks 1220–1225 and fuse bank 2 1228 of the row fuse block 1187, rather than with electrical signals EFnm<0:3> and EFeo<0:1> in the row electric banks 1200–1205 and row electric bank 2 1210 of the row electric block 1186. Details of one of the fuse banks 1220, the redundancy enable circuit 1230, the select circuit 1232, fuse bank 2 1228, and the output circuit 1234 are illustrated in FIGS. 92A–92E, respectively.

Referring back to FIG. 87, row electric pairs 1240–1245 and a row electric fuse 1248 provide signals EFnm<0:3> representing a redundant row address to the row electrical block 1186. The row electric pairs 1240–1245 and row electric fuse 1248 are enabled by fuse block select signal FBSEL* produced by input logic 1250, shown in more detail in FIG. 93A. The row electrical block 1186 is enabled by signal EFEN, produced by row electric fuse block enable circuit 1252 illustrated in detail in FIG. 93B.

FIG. 93C illustrates the row electric fuse 1248 shown in FIG. 87. The row electric fuse 1248 includes an antifuse that can be shorted electrically by applying a high voltage at signal CGND. The data stored in the antifuse is output as predecoded signals EFB*<0> and EFB<1>.

FIG. 93D illustrates one of the row electric pairs 1240 shown in FIG. 87. The row electric pairs 1240–1245 each store two bits of data, a most significant bit and a least significant bit, and include two independent and identical circuits, one for the most significant bit and one for the least significant bit. Each of the circuits store its bit of data with an antifuse that can be shorted by applying a high voltage at signals CGND. The row electric pairs 1240–1245 also include a predecode circuit for producing predecoded signals EFnm<0:3>.

Referring briefly back to FIG. 64A, the output of the row redundancy block 1047 is driven by the row redundancy buffer 1053, illustrated in detail in FIG. 94. The output of the row redundancy buffer 1053 is also input to the topo decoder 1059, illustrated in FIG. 95. The topo decoder 1059 produces signals TOPINVODD, TOPINVODD*, TOPINVEVEN, and TOPINVEVEN* which are input to the datapath 1064.

The left logic 21, illustrated in FIGS. 65A and 65B, is nearly identical to the right logic 19. Generally, components in the left logic 21 use the same reference numbers, followed by a prime symbol "'", as functionally-identical components in the right logic 19. Exceptions to the numbering scheme are made for the Vccp pump circuits 402 and the DVC2 generators 500, 501, 502, and 503, which were introduced and are described in more detail in Section VII.

The left logic 21 differs from the right logic 19 in that the left logic 21 does not include a Vbb pump 280. Furthermore, the left logic 21 does include a data fuse id 1260, which is not present in the right logic 19. The data fuse id 1260 drives fuse id data through the datapath 1064' to one or more data pads. FIG. 96 illustrates the details of the data fuse id 1260. The data used in the data fuse id circuit 1260 comes from the center logic.

XI. Miscellaneous Figures

FIG. 97 illustrates the data topology of one of the 256K arrays 50 shown in FIG. 4 which is constructed in accordance with the teachings of the present invention. The array 50 is constructed from a plurality of individual memory cells 1312, all of which are constructed in a similar manner.

FIG. 98 illustrates the details of one of the memory cells 1312. Each memory cell 1312 includes first and second transistor/capacitor pairs 1314, 1315. Each of the transistor/capacitor pairs 1314, 1315 include a storage node 1318, 1319, respectively. A contact 1320, shared by the two transistor/capacitor pairs 1314, 1315, connects the transistor/capacitor pairs 1314, 1315 to the wordlines WL<n>.

Referring back to FIG. 97, the memory array 50 has wordlines WL<n> running horizontally and digitlines DIGa<n>, DIGa*<n>, DIGb<n>, and DIGb*<n> running vertically. The wordlines WL<n> overlay active areas of the transistor/capacitor pairs 1314, 1315 and determine whether transistors in the transistor/capacitor pairs 1314, 1315 are in a conductive or a non-conductive state. The wordline signals originate from row decoders located to the left and right of the memory array 10. The memory array 10 has 512 live wordlines WL<0:511>, two redundant wordlines RWL<0:1> located on the bottom of the memory array 50, and two redundant wordlines RWL<2:3> located on the top of the memory array 50. The redundant wordlines may be logically substituted in place of defective wordlines. The digitlines are organized in pairs, with each pair representing a true and a complement value for the same bit of data in the array 50. The digitlines carry data into or away from the digital contact 1320, and connect the digital contact 1320 to sense amps located on the top and bottom of the memory array 50. There are 512 digitline pairs in the memory array, with an additional 32 redundant digitline pairs.

The wordlines are preferably constructed of polysilicon while the digitlines are preferably constructed of either polysilicon or metal. Most preferably, the wordlines are constructed of polysilicon that is silicided to reduce resistance and heat to thereby permit longer wordline segments without reducing speed. The storage nodes 1318 may be constructed with an oxide-nitride-oxide dielectric between two polysilicon layers.

FIG. 99 is a state diagram 1330 illustrating the operation of a powerup sequence circuit 1348 (shown in FIG. 100) which may be used to control the powering up of the various voltage supplies and associated components of the chip 10. The state diagram 1330 includes a reset state 1332, a Vbb pump powerup state 1334, a DVC2 generator powerup state 1336, a Vccp pump powerup state 1338, a RAS powerup state 1340, and a finish powerup sequence state 1342. The Vbb pumps, the DVC2 generators, and the Vccp pumps are discussed hereinabove in Section VII.

When power is first applied to the chip 10, the powerup sequence circuit 1348 begins in the reset state 1332. The purpose of the reset state 1332 is to wait for the externally supplied voltage Vccx to reach a third predetermined value preferably below the first predetermined value shown in FIG. 36B, before allowing the powerup sequence to begin. Once Vccx exceeds that third predetermined value, the sequence circuit 1348 proceeds to the Vbb powerup state 1334. If Vccx ever falls below the third predetermined value, the sequence circuit 1348 will return to the reset state 1332.

The purpose of the Vbb powerup state 1334 is to wait for the back bias voltage Vbb, provided by Vbb pumps 280, to reach a predetermined value, preferably −1 volt or less, before proceeding with powering up additional voltage supplies. The Vbb pumps 280 are automatically activated when Vccx begins to rise, and they are usually still running when the sequence circuit 1348 reaches the Vbb powerup state 1334. When the voltage Vbb has reached its predetermined state, the Vbb pumps 280 turn off and the sequence circuit 1348 leaves the Vbb powerup state 1334 and proceeds to the DVC2 powerup state 1336.

The purpose of the DVC2 powerup state 1336 is to wait for the voltage DVC2 to reach a predetermined state before proceeding with powering up additional voltage supplies. That may mean waiting for all the DVC2 generators to reach a steady state or just one depending upon how the switches 74 are set in the DVC2 NOR circuit 1092 shown in FIG. 73. When the voltage DVC2 has reached a predetermined state, and assuming that the voltages Vccx and Vbb are each in their desired respective predetermined states, the sequence circuit 1348 proceeds from the DVC2 powerup state 1336 to the Vccp powerup state 1338.

The purpose of the Vccp powerup state 1338 is to wait for the voltage Vccp to reach a predetermined state, preferably above approximately Vcc plus 1.5 volts. Before voltage Vccp can reach its predetermined state, however, voltage Vcc must be in its predetermined state. Vcc usually does not delay the Vccp powerup state because, as mentioned above, Vcc is powered up during the reset state 1332. Once the voltage Vccp has reached its predetermined state, and assuming that the voltages Vccx, Vbb, and DVC2 are each in their desired respective predetermined states, the sequence circuit 1348 proceeds from the Vccp powerup state 1338 to the RAS powerup state 1340.

The purpose of the RAS powerup state 1340 is to provide power to the RAS buffers 745 (shown in FIG. 46). The sequence circuit 1348 then proceeds to a finish powerup sequence state 1342 where it remains until Vccx falls below the third predetermined value. At that time, the sequence circuit 1348 returns to the reset state 1332 and waits for Vccx to return to the third predetermined value.

FIG. 100 is a block diagram of one example of a powerup sequence circuit 1348 constructed to implement the functionality of the state diagram 1330 illustrated in FIG. 99. A voltage detector 1350 receives the externally supplied voltage Vccx and generates an output signal UNDERVOLT* indicative of whether Vccx is above the third predetermined value, preferably approximately two volts. FIG. 101A is an electrical schematic illustrating one example of a voltage detector 1350 which may be used. The voltage detector 1350 includes a pair of parallel-connected resistors, one of which is optioned out, in series with series-connected pMOS transistors to form a first voltage limiting circuit 1352 responsive to Vccx. The first voltage limiting circuit 1352 produces a first threshold signal VTH1 seen in FIG. 101B at a junction between the resistors and the pMOS transistors. The first threshold signal VTH1 is used to gate a transistor of a first signal generating circuit 1354 which produces a signal VSW when Vccx is above a fourth predetermined value, preferably approximately 2.0 volts.

The voltage detector 1350 also includes a second voltage limiting circuit 1356 and a second signal generating circuit 1358 which are constructed and function in an analogous manner to the first voltage limiting circuit 1352 and the first signal generating circuit 1354, respectively. The second voltage limiting circuit 1356 is constructed of series-connected nMOS transistors and a resistors, one of which is optioned out. The circuit 1356 is responsive to Vccx and produces a second threshold signal VTH2 seen in FIG. 101C. The second signal generating circuit 1358 is constructed of an nMOS transistor and a pair of parallel-connected resistors, is responsive to Vccx and VTH2, and produces a second signal VSW2 indicative of whether Vccx is above the fourth predetermined value.

The signals VSW and VSW2 from the first and second signal generating circuits 1354, 1358, respectively, are logically combined in a logic circuit 1360 to produce the UNDERVOLT* signal indicative of whether both first and second signal generating circuits 1354, 1358 indicate that Vccx is above the fourth predetermined value.

The voltage detector 1350 contains two pair of substantially identical circuits to compensate for fabrication variances that may cause either nMOS devices or pMOS devices to operate in a different manner than anticipated. Such variances, if they occur, will likely cause one of the voltage limiting circuits 1352, 1356 or one of the signal generating circuits 1354, 1358 to trigger sooner than expected, thereby prematurely indicating that Vccx is above the fourth predetermined value. If that happens, the sequence circuit 1348 may begin to operate before Vccx can reliably support operation of the circuits, potentially resulting in errors. However, because the logic circuit 1360 requires that both signal generating circuits 1354, 1358 indicate Vccx is above the fourth predetermined value before UNDERVOLT* is produced in a high logic state, an error by any one of the circuits 1352, 1354, 1356, 1358 will not adversely affect the performance of the voltage detector 1350. It is, of course, possible that a fabrication variance will cause one of the circuits 1352, 1354, 1356, 1358 to trigger too late, delaying one of the signals VSW or VSW2. That type of variance, however, is more easily corrected and, in any event, will not result in the sequence circuit 1348 operating without sufficient voltage. Other types of logic circuits 1360 may be used to effect different results, e.g., production of the UNDERVOLT* signal when only one of the signals VSW and VSW2 is available.

FIG. 101D is an electrical schematic illustrating one example of the reset circuit 1362 which may be used. The reset logic 1362 receives the UNDERVOLT* signal and generates a signal CLEAR* indicative of whether UNDERVOLT* is stable. In the preferred embodiment, the reset circuit 1362 determines that Vccx is stable if it is above two volts for at least a predetermined period of time, approximately 100 nanoseconds. The reset circuit 1362 includes a number of series-connected delay circuits 1363 responsive to the signal UNDERVOLT*. The number of delay circuits 1363, and the propagation delay associated with each one, largely determines the predetermined period of time that Vccx must be above two volts before the reset circuit 1362 determines that Vccx is stable. The reset circuit 1362 also includes a reset logic gate, comprised of an inverter responsive to the signal UNDERVOLT* for producing a reset signal RST to reset the delay circuits 1363. When the UNDERVOLT* signal goes to a low logic state, indicating that Vccx is less than the first predetermined value, the reset logic gate generates a high logic state signal that discharges a capacitor in the delay circuits 1363 as shown in FIG. 101E. By discharging the capacitor, the delay is always the same. If a power "glitch" is relied upon to discharge the capacitor, the glitch might not be long enough to completely discharge the capacitor. Under such cases, the delay time would become unpredictable.

The reset logic 1362 also includes a logic circuit comprising a NAND gate and an inverter that are responsive to both the UNDERVOLT* signal and to an output signal from the last delay circuit 1363. If both the UNDERVOLT* signal and the output signal from the last delay circuit 1363 are in a high logic state, then the logic circuit will generate a CLEAR* signal in a high logic state, indicating that Vccx is stable. If, however, the UNDERVOLT* signal goes to a low logic state at any time, the delay circuits 1363 will be reset and the logic circuit will generate the CLEAR* signal in a low logic state, indicating that Vccx is not stable. The CLEAR* signal will remain in a low logic state until the UNDERVOLT* signal remains in a high logic state long enough for a signal to propagate through the delay circuits 1363 and through the logic circuit. The reset logic 1362 is used in the preferred embodiment to prevent the sequence circuit 1348 from proceeding beyond the reset sequence state 1332 (shown in FIG. 99) before Vccx is both above the desired predetermined value and stable. The reset logic 1362, however, is not required for the sequence circuit to implement the functionality of the state diagram 1330 illustrated in FIG. 99.

A state machine circuit 1364 shown in FIG. 100 receives the CLEAR* signal from the reset logic 1362, and also receives other signals indicative of the state of Vbb, DVC2, and Vccp. The state machine circuit 1364 performs the functions illustrated in the state diagram shown in FIG. 99, as will be described in more detail below.

An alternative to the powerup sequence circuit 1348 is RC timing circuits 1368, 1369. RC timing circuits 1368, 1369 generate powerup signals based only on the passage of time since the application of the externally supplied voltage Vccx, and they do not receive feedback signals. The RC timing circuits 1368, 1369 are provided as an alternative to the sequence circuit 1348, but they are not required for the sequence circuit 1348 to operate. FIG. 101F and FIG. 101G are electrical schematics illustrating one embodiment of the RC timing circuits 1368, 1369, respectively.

Output logic 1372 receives output signals from both the state machine circuit 1364 and the RC timing circuits 1368, 1369. The output logic uses only one set of output signals, either from the state machine circuit 1364 or from the RC timing circuits 1368, 1369. A STATEMACH* signal received by the output logic 1372 determines which set of output signals are used by the output logic 1372. FIG. 101H illustrates an electrical schematic of one embodiment of the output logic 1372 comprising a number of multiplexers controlled by the STATEMACH* signal.

Bond option 1374 allows for a selection between the use of the state machine circuit 1364 or the use of the RC timing circuits 1368, 1369. That selection is made, for example, by opening or not opening a fuse within the bond option 1374 so as to generate the STATEMACH* signal for use by the output logic 1372. FIG. 101I illustrates an electrical schematic of one embodiment of the bond option 1374.

FIG. 101J is an electrical schematic of one embodiment of the state machine circuit 1364 shown in FIG. 100. A NOR gate 1379 receives the VBBON and VBBOK* signals and generates a VBBOK2 signal, which is provided along with a CLEAR* signal to a spare circuit 1388. The spare circuit 1388 is provided to allow for modifications of the DRAM in the event an additional powerup state is desired at a later time. If the CLEAR* signal is in a high logic state, the VBBOK2 signal is passed through the spare circuit 1388 and provided to a DVC2 enable circuit 1380. If the CLEAR* signal is in a low logic state, the spare circuit 1388 generates a low logic signal for the DVC2 enable circuit 1380, indicating that Vccx is not stable. The DVC2 enable circuit 1380 also receives the CLEAR* signal, and generates a DVC2EN* signal to enable the DVC2 generators 500 when the above-described conditions are met. Signals DVC2OKR and DVC2OKL are indicative of whether DVC2 is determined to be within a predetermined range in the right and left logic 19, 21, respectively. A NAND gate 1377, whose output is coupled to an inverter 1378, logically combines the DVC2OKR and DVC2OKL signals to produce the DVC2OK signal indicative of whether DVC2 is determined to be within a predetermined range in both the right and left logic 19, 21.

A Vccp enable circuit 1382 receives the CLEAR*, VBBOK2, and DVC2OK signals and generates the VCCPEN* signal to enable the Vccp pumps 400 when the above-described conditions are met. An inverter 1383 converts the VCCPON signal into its complement, VCCPON*. A power RAS circuit 1384 receives the CLEAR*, VBBOK2, DVC2OK, and VCCPON* signals and generates the PWRRAS* signal to enable the RAS buffers 745 when the above-described conditions are met. A RAS feedback circuit 1366 receives a PWRRAS* signal and generates a RASUP signal indicative of whether the RAS buffers have been enabled.

A powered up circuit 1386 receives the CLEAR*, VBBOK2, DVC2OK, VCCPON*, and RASUP signals and generates the PWRDUP and PWRDUP* signals to indicate that the chip 10 has reached a powered up state when the above-described conditions are met. Each of the circuits 1380, 1382, 1384, 1386, 1388 are comprised of a NAND gate receiving various signals and a latch that is reset by the CLEAR* signal when Vccx is determined to be unstable.

FIGS. 102A–102K are simulations of timing diagrams illustrating the signals associated with the powerup sequence circuit 1348. FIG. 102A illustrates Vccx as it ramps steadily upward as more external power is applied.

FIG. 102B illustrates the UNDERVOLT* signal, which changes state from a low to a high logic state to indicate when the voltage Vccx has reached or exceeded the first predetermined value.

FIG. 102C illustrates the CLEAR* signal, which is responsive to the UNDERVOLT* signal and changes state from a low to a high logic state after the UNDERVOLT* signal has been in a high logic state for a predetermined period of time, preferably approximately 100 nanoseconds. The CLEAR* signal indicates that the externally supplied voltage Vccx is believed to be stable.

FIG. 102D illustrates the VBBOK2 signal. The VBBOK2 signal falls from a high to a low logic state at a point in time indicated by reference number 1390 when the voltage Vbb reaches a predetermined state and the Vbb pumps 280 turn off.

FIG. 102E illustrates the DVC2EN* signal, which is output from the sequence circuit 1348 to enable the DVC2 generators 500. As can be seen by comparing FIGS. 102D and 102E, the DVC2 generators 500 are not enabled until the signal VBBOK2 goes to a low logic state.

FIG. 102F illustrates the DVC2OKR signal, which is indicative of whether the voltage DVC2 is stable in the right logic. An analogous signal indicative of the whether the voltage DVC2 is stable in the left logic, DVC2OKL, is provided to the sequence circuit 1348 illustrated in FIG. 100 but is not shown in the timing diagram because, under normal circumstances, both DVCOKR and DVC2OKL react very similarly. The signal DVC2OKR does not indicate a stable state for the voltage DVC2 until a time indicated by reference number 1391.

FIG. 102G illustrates the VCCPEN* signal, which is output from the sequence circuit 1348 to enable the Vccp pumps 400. The signal VCCPEN* will not enable the Vccp pumps 400 until point 1392, when the CLEAR* signal is high, the VBBOK2 signal is low, and the DVC2OKR signal is high.

FIG. 102H illustrates the VCCPON signal, which is indicative of whether the Vccp pumps 400 are on after the pumps have been enabled. Prior to that time, its state is irrelevant.

FIG. 102I illustrates the PWRRAS* signal, which is output from the sequence circuit 1348 to provide power to the RAS buffers 745. The PWRRAS* signal does not provide power to the RAS buffers 745 until a point in time indicated by reference number 1393, when the CLEAR* signal is high, the VBBOK2 signal is low, the DVC2OKR signal is high, and the VCCPON signal is low.

FIG. 102J illustrates the RASUP signal, which is indicative of whether the RAS buffers 745 are receiving power.

FIG. 102K illustrates the PWRDUP* signal, which is output from the sequence circuit 1348 to indicate that the chip 10 has completed its powerup sequence. The PWRDUP* signal does not indicate completion of powerup until a point in time indicated by reference number 1394, when the CLEAR* signal is high, the VBBOK2 signal is low, the DVC2OKR signal is high, the VCCPON signal is low, and the RASUP signal is high.

If, at any time during the powerup sequence, the external voltage Vccx falls below the first predetermined value, the signal CLEAR* will go low and reset the sequence circuit 1348, including the output signals DVC2EN*, VCCPEN*, PWRRAS, and PWRDUP*.

Referring to FIG. 103, a test mode entry timing diagram is illustrated. Supervoltage WCBR test modes require a vectored WCBR to load the supervoltage enable test key. That is followed by a second SVWCBR, to load the desired test key, but with the supervoltage applied to the N/C (no connect) pin. Testkeys may be entered on CA0–7, and the test mode will remain valid until the supervoltage is removed or the clear test mode key is asserted. Once the supervoltage enable test mode has been loaded into the DRAM, subsequent SVWCBRs will load in additional test modes. For example, if mode 2 (discussed below) is to be combined with mode 4 (discussed below), then 1 WCBR and 2 SVWCBRs are performed. The first WCBR will enable the supervoltage circuit and the next two SVWCBRs load in key 2 and key 4 (see FIG. 103). To exit all selected test modes, including the supervoltage enable test mode, enter either the clear test mode key during a SVWCBR or drop the supervoltage on the N/C pin. All of the tests which can be performed on the DRAM are entered using this supervoltage test mode.

As shown in FIG. 103, two CAS before RAS cycles 1270, 1271 are used. Cycles 1270, 1271 correspond to edges 1272, 1273, 1274 and edges 1275, 1276, 1277, of the write enable (WE*) signal, CAS* signal, and RAS* signal, respectively. During cycles 1270, 1271 the address signal may provide address information for putting the chip 10 in a ready state and a test mode state, respectively. At time 1280, which is after time 1281 when RAS* goes inactive, if the WLTON 1 signal goes inactive low, then a test mode operation may be entered provided the access voltage signal is at a supervoltage level.

According to the present preferred embodiment of the invention, the test modes which can be entered are as follows:

0. CLEAR—This testkey will disable all test modes previously entered by WCBR cycles, including the supervoltage enable.

1. DCSACOMP—This test mode provides 2× address compression without writing adjacent bits or crossing redundancy regions by compressing CA<12> on a ×8 4K part, CA<11> on a ×16 4K part, or RA<12> on any 8K part. This address compression combines the data from upper and lower 16 Meg array sections within a 32 Meg array. This test mode can be combined with other test modes.

2. CA9COMP—This test mode provides 2× address compression without writing adjacent bits but does cross redundancy regions by compressing CA<9>. This address compression combines the data from upper and lower 64 Meg quadrants. This test mode can be combined with other test modes.

3. 32MEGCOMP—This test mode provides 2× address compression without writing adjacent bits but does cross redundancy regions by compressing CA<11> for a ×8 part (CA<10> for a ×16 8K part, CA<12> for ×4 8K part or RA<13> for any 16K part). This address compression combines the data from left and right 32 Megs within 64 Meg quadrants. This test mode can be combined with other test modes.

4. REDROW—This test mode allows independent testing of the row redundant elements. The addresses at RAS and CAS during subsequent cycles select the bits to be accessed. From the row pretest, if one of the hard-coded addresses used to select a redundant row is entered, the subsequent column addresses will be from this redundant row. The 32 redundant row banks per octant are hard-coded using row addresses RA0-6. For the standard 8K refresh, all 32 MEG octants will fire a redundant row. For the 8K-×4 part, CA9 and CA12 determine which octant is connected to the DQs. If both REDROW and REDCOL are selected, the row address selects one of the redundant row elements, while the column address selects either a normal or redundant column. This allows testing of crossing redundant bits. This test mode can be combined with DCSACOMP, CA9COMP, 32MEGCOMP or CA10COMP test modes. Also see the descrition of "redundancy pretest" herein below.

5. REDCOL—This test mode allows independent testing of column redundant elements. The column redundant elements use hard-coded addresses to enable them. While performing column pretest, the column address is fully decoded which permits testing redundant columns or any normal columns that don't match the hard-coded addresses. Since the 64 redundant column locations are fully decoded it requires all column addresses to select them. The redundant element crossing bits are tested if both REDROW and REDCOL are loaded. This test mode can be combined with DCSACOMP, CA9COMP, 32MEGCOMP or CA10COMP test modes.

6. ALLROW—The RAS cycle following the selection of this test mode will latch all bits on the "seed" wordline selected by the row address. On each of the next 2 WE signal edges another ¼ of the rows within a 2 Meg section of each octant will be brought high. On the 3rd WE transition another quarter of the rows will be brought high and the DVC2 generator will be disabled. The 4th WE transition will bring the last quarter of the rows high and will force DVC2 high. After the 4th WE transition WE will control the voltage of DVC2. If WE is high then DVC2 will be pulled to internal Vcc through a p-channel device; if WE is low DVC2 will be pulled to GND. See FIG. 104. Once RAS is brought low, the data stored in the memory cells will be corrupted since EQ will fire before all wordlines are low. When combining with other test modes, this must be the last WCBR entered. The ALLROW high test mode is described in greater detail hereinbelow in conjunction with FIGS. 104, 108, and 109.

7. HALFROW—Similar to the ALLROW test mode, HALFROW will Allow A0 to control whether EVEN or ODD rows are brought high. All other functions of HALFROW are the same as ALLROW.

8. DISLOCK—This test mode disables the RAS and Write lockout circuit so that full characterization can be done.

9. DISRED—This test mode disables all row and column redundant elements.

10. FLOATDVC2—This test mode disables the AVC2 and DVC2 generators allowing the voltage on the cellplate and digitlines to be externally driven.

11. FLOATVBB—This test mode will disable the VBB pump and float the substrate.

12. GNDVBB—This test mode will disable the Vbb pump and ground the substrate.

13. FUSEID—This test mode allows access to 64 bits of laser and antifuse FuseID, 32 bits of data representing currently active test modes, and 24 bits representing the status of various chip options. All bits will be accessible through DQ<0>. These bits are accessed using row address <1:4> to select 1 of 16 banks and column address <0:7> to select 1 of 8 bits in each bank. Table 8 below lists the various FuseID banks. Currently the first 7 banks of FuseID are laser with bank 7 as the only antifuse bank.

TABLE 8

FUSEID Test mode Addressing

| Bank | Row Addr | Col. Addr | Test mode |
|---|---|---|---|
| 0–6 | 0–12 | 0–7 | Probe programmable FID (Laser) |
| 7 | 14 | 0–7 | Backend programmable FID (antifuse) |
| 8 | 16 | 0 | CLEAR |
| | | 1 | DCSACOMP |
| | | 2 | CA9COMP |
| | | 3 | 32MEGCOMP |
| | | 4 | REDROW |
| | | 5 | REDCOL |
| | | 6 | ALLROW |
| | | 7 | HALFROW |

TABLE 8-continued

FUSEID Test mode Addressing

| Bank | Row Addr | Col. Addr | Test mode |
|---|---|---|---|
| 9 | 18 | 0 | DISLOCK |
| | | 1 | DISRED |
| | | 2 | FLOATDVC2 |
| | | 3 | FLOATVBB |
| | | 4 | GNDVBB |
| | | 5 | FUSEID |
| | | 6 | VCCPCLAMP |
| | | 7 | FAST |
| 10 | 20 | 0 | ANTIFUSE |
| | | 1 | CA10COMP |
| | | 2 | FUSESTRESS |
| | | 3 | PASSVCC |
| | | 4 | REGOFF |
| | | 5 | NOTOPO |
| | | 6 | REGPRE |
| | | 7 | OPTPROG |
| 11 | 22 | 0–7 | SEL32M<0:7> Test mode |
| 12 | 24 | 0–7 | DVC2 Status<0:7> |
| 13 | 26 | 0–7 | 32Meg Select<0:7> (antifuse or laser fuse option) |
| 14 | 28 | 0 | FAST |
| | | 1 | 8KOPT |
| | | 2 | 128MEG |

FIG. 105 illustrates the timing for reading out FUSEID information. After the RAS* signal goes low at time 1284, a bank address 1285 is latched. Later, the CAS* signal goes low. Each CAS* cycle, while the RAS* signal is held low, is used for accessing bits. In the embodiment illustratively shown in FIG. 105, eight bits (B0 to B7) per bank are accessed per read cycle 1286. The WE* signal is held inactive high. Bits B0, B1, B2, . . . B7 are latched for access prior to each CAS* cycle. In other words, transition times 1287, 1288, 1289, 1290 of the address signal respectively lead transition times 1291, 1292, 1293, 1294 of the CAS* signal. Each of bits B0 through B7 may then be provided to the data path and output.

Table 9 provides additional details of certain exemplary values which may be represented by banks 0–7. A blown laser fuse in the fuse ID banks fires the DQ<1> output pin high. This is the case for banks <0:6> of fuse ID. In bank 7 antifuses are used and therefore a "blown" fuse will drive the DQ<1> output pin low. Note that the generic bits will contain both 8 antifuses and 2 laser fuses. Fuse ID data register fields will then be scrambled using standardized fuse ID bit #'s as follows:

TABLE 9

FUSEID Specification

| # of Fuses | Fuse ID bit #'s LSB to MSB | Maximum Range | Used Range | EXPLANATION |
|---|---|---|---|---|
| 23 | #0–#22 | 0 to 8388607 | 0 to 5399999 | 7 digit fuse ID lot number "WWFSSSS" consisting of work week WW (01–53), FAB digit F (1–9), and 4 digit wafer scribe number SSSS, (0000–9999). Will match the lot number on the traveler for non-bonus lots. For bonus lots, and off-line database will have to map wafer scribe numbers to the traveler lot number. |
| 6 | #23–#28 | 0 to 63 | 1–50 | Wafer number |
| 12 | #29–#42 | 0 to 4095 | 0 to ?? | Ordinal die position register that is a function of X and Y probe coordinates i.e. diepos = F(X, Y). Preferred function is to code for a rectangular region covering the wafer leading to a function of the form diepos = (Y + A) * (# of rows) + X + B where A and B are constants to account for the placement of the origin. A generous amount has been assigned here to allow distinction between 6 and 8 inch wafer positions for which mutually exclusive die position ranges would be used. This would be handled by 2 different sets of values for the A and B constants. In the event that 4095 combos are insufficient (unlikely to be the case on any future DRAM or SRAM design), additional bits can be taken from the generic designator register below. |
| 8 antifuse 2 laser | #43–#50 | 0 to 255 | 0 to 255 | Generic designator register for miscellaneous uses. Will be programmed and read as a single register. Possible values will be defined as needed over the life of the design. Will be treated as "used" from the beginning with a default value of 0 even though all possible values are initially undefined. (This information will include the fast/slow option code fuse.) Product engineers should be responsible for coordinating the usage of these bits. |
| 2 | #51–#52 | 0 to 3 | 0 to 3 | Will be encoded by the function fid_year = year % 4 where "%" is the modulus or remainder function. For 1994, the fid_year value would be 2. Avoids non-unique fuse ID's in case lot number and work week rollover. |
| 7 | #53–#59 | 0 to 127 | 0 to 127 | Design Revision register. Should be able to open these fuses with both metal mask and laser. "Hard coding" by the metal mask is the preferred method. Laser programming is used as a |

TABLE 9-continued

FUSEID Specification

| # of Fuses | Fuse ID bit #'s LSB to MSB | Maximum Range | Used Range | EXPLANATION |
|---|---|---|---|---|
| | | | | backup. Will be reprogrammed whenever the metal mask is taped out. In some rare cases, a metal mask may be taped out just to reprogram this register given there are significant enough changes on other layers to require careful backend sorting between mask sets. |
| 4 | #60–#63 | 0 to 15 | 0 to 15 | Parity error detection bits. This helps determine whether a failing condition on a reject affected a correct fuse ID read. As a bonus, it also serves as a fuse blow process monitor. (The error detection will apply to the entire die id word.) |

See modes 24–31 for the numbering of the arrays which correspond to the DVC2 status and 32 Meg Select Bits. The FUSEID is programmed using the OPTPROG test mode, which is mode 23 below.

14. VCCPCLAMP—This test mode disconnects the clamp between Vcc and Vccp allowing the characterization of the Vccp pump. See FIG. 574. This allows the Vccp level to be elevated at low Vcc stressing silicon pits between memory cells.

15. FASTTM—This test mode speeds up the EQ, ISO, Row Address latch, and P and N Sense Amp enable timing paths.

16. ANTIFUSE—This test mode is used to test and program the row and column redundancy antifuse elements.

17. CA10COMP—This test mode provides 2× address compression on ×4 and ×8 parts or 2× data compression on ×16 parts without writing adjacent bits but does cross redundancy regions. On a ×4 or ×8 part CA<10> is compressed. This combines left and right 16 Megs within a 32 Meg octant. On a ×16 part this is DQ compression. This test mode can be combined with other test modes.

18. FUSESTRESS—This test mode applies Vcc across all antifuses. The DVC2E line is pulled to Vccp and the antifuses are all read, which stresses the antifuses with Vcc. The antifuses will be stressed as long as this test mode is selected and RAS is low.

19. PASSVCC—This test mode passes the internal periphery Vcc onto DQ1.

20. REGOFFTM—This test mode will disable the regulator and short external Vccx and internal Vcc.

21. NOTOPO—This test mode will disable the topo scrambler circuit.

22. REGPRETM—This test mode uses RA<5:9> to pretest the trim values on the voltage regulator. The addresses map to the fuses as shown in Table 10 below. A HIGH address value represents a blown fuse. Note that at least one address needs to be high throughout the RAS low time of this test mode. A timing diagram illustrating the timing of the REGPRETM test mode is set forth in FIG. 106.

TABLE 10

Address to fuse map for REGPRETM Test Mode

| RA | FUSE |
|---|---|
| 5 | REF12* |
| 6 | REF24* |
| 7 | REF48* |
| 8 | REF100A* |
| 9 | REF100B* |

23. OPTPROG—This test mode enables the antifuse options and antifuse FUSEID bits to be programmed. A <10> is used as the CGND signal which sets the programming voltage and either DQ<3> or OE is used as both the chip select and to set the program duration on the antifuse. OE can be used in situations where the DQ's may be OR'ed together from multiple parts and DQ<3> can be used in situations where OE is grounded. A timing diagram illustrating the timing of the OPTPROG test mode is set forth in FIG. 107.

24. 32 Meg Pretest<0>—This test mode disables array<0> (38 in FIG. 2) by powering down Vccp, DVC2 and AVC2.

25. 32 Meg Pretest<1>—This test mode disables array<1> (40 in FIG. 2) by powering down Vccp, DVC2 and AVC2.

26. 32 Meg Pretest<2>—This test mode disables array<2> (31 in FIG. 2) by powering down Vccp, DVC2 and AVC2.

27. 32 Meg Pretest<3>—This test mode disables array<3> (33 in FIG. 2) by powering down Vccp, DVC2 and AVC2.

28. 32 Meg Pretest<4>—This test mode disables array<4> (27 in FIG. 2) by powering down Vccp, DVC2 and AVC2.

29. 32 Meg Pretest<5>—This test mode disables array<5> (25 in FIG. 2) by powering down Vccp, DVC2 and AVC2.

30. 32 Meg Pretest<6>—This test mode disables array<6> (47 in FIG. 2) by powering down Vccp, DVC2 and AVC2.

31. 32 Meg Pretest<7>—This test mode disables array<7> (45 in FIG. 2) by powering down Vccp, DVC2 and AVC2.

All laser/antifuse options can be read out through the FUSEID test mode on banks 13 and 14.

FAST—Removes delay in the raend_enph and wl_tracking circuits.

128MEG —Forces the part to be accessed as a 128 Meg density part. This option must be combined with 4 of the SEL32MOPT<0:7> option.

8KOPT*—Puts the part in 4K refresh mode if combined with 128 MEG option, otherwise the part will be in 16K refresh.

SEL32MOPT<0:7>—Blowing the fuse on these options disables the corresponding 32 Meg array.

The following laser options are available in the present preferred embodiment:

DISREG—Disables the regulator by clamping Vccx to Vcc through a large p-channel.

DISANTIFUSE—Disables the backend redundancy antifuses. Antifuse FID bits are still available.

REF12*—LSB of voltage regulator trim.

REF24*—regulator trim.

REF48*—regulator trim.

REF100A*—regulator trim.

REF100B*—MSB of voltage regulator trim.

Referring now to the ALLROW high test mode, as noted that test mode is used to rapidly reproduce data for testing a memory array. In the preferred embodiment, the test mode operates on 2 Meg "array slices" 1400 taken from a 32 Meg array block 31, as illustrated in FIG. 108. Each array slice 1400 includes eight adjacent 256k arrays 50 in the 32 Meg array block 31. The 32 Meg array block 31 is discussed in more detail hereinabove in Section III.

FIG. 109 illustrates the details of a 256k array 50 making up a portion of the array slice 1400, and also shows sense amps 60, 62 located above and below the 256k array 50 and row decoders 56, 58 located on the left and right of the 256k array 50, respectively. The 256k array 50, the sense amps 60, 62, and the row decoders 56, 58 are described in more detail hereinabove in Section III. A "seed row" 1402, consisting of a number of storage nodes or storage elements 5 including both true and complement data, extends across the 256k array 50 and across the array slice 1400 (as shown in FIG. 108), and is programmed with a pattern of data that is used to test the array. Patterns of data used to test for defects in memory arrays are well known in the art of semiconductor fabrication and they will not be discussed herein. The writing of data into the 256k array is a relatively slow process because in most memory devices no more than one or two bits of data can be written in the array slice 1400 during each write cycle. Once the seed row 1402 is written, however, the present invention allows the data stored in the seed row 1402 to be quickly duplicated into the remaining rows within the array slice 1400. More specifically, by "firing" the appropriate wordline, the data stored in the seed row 1402 is placed on the digitlines 68, 68', 69, 69' in the 256k array 50. Once the data is on the digitlines 68, 68', 69, 69', the data is latched by the sense amps 60, 62. Thereafter, the latched data may be stored in any row of storage nodes 5 in the 256k array 50 by firing the appropriate wordline to connect the row of storage nodes to the digitlines 68, 68', 69, 69'.

In the preferred embodiment, the seed row 1402 is written in a conventional manner. In addition, the seed row 1402 is always the same row within the 256k array 50 so that the test mode knows where to find the data. After the seed row 1400 is written, the test mode is entered by any one of many means known in the art. Once in the test mode, signals take on special meanings to accomplish the testing. Cycling the RAS* signal will cause all storage nodes 5 in the seed row 1402 to be connected to the digitlines 68, 68', 69, 69', so that the sense amps 60, 62 latch the data. After the data is latched, cycling the CAS signal will cause additional rows of storage nodes 5 to be connected to the digitlines 68, 68', 69, 69' and, thereby, to have the data on the digitlines 68, 68', 69, 69' written thereto. Preferably, multiple rows are accessed with each CAS cycle so that the array 50 is written more quickly. In the preferred embodiment, each CAS cycle causes approximately 25% of the rows in the array slice 1400 to be programmed with the data on the digitlines 68, 68', 69, 69'. As a result, only four CAS cycles are required to program an entire array slice 1400 from a single seed row 1402. The choice of duplicating the array slice 1400 in 25% increments is based on considerations such as power supply capacity. Greater or smaller increments may, of course, be used. For example, in some applications the entire array slice 1400 may be programmed in a single CAS cycle. Furthermore, external signals other than CAS and RAS* may be used to control the test mode.

In the present invention, the row and column address signals required to select the array slice 1400 are provided externally. In contrast, the row address signals required to select rows within the array slice 1400 are provided internally by the test mode. The test mode selects 25% of the array slice 1400 by generating a high logic state signal for each predecoded row address signal RA_0<0:1>, RA34<0:3>, RA56<0:3>, and RA78<0:3>, in combination with generating a high logic state signal for only one of the four predecoded row address signals RA12<0:3>. The one row address signal RA12<n> that is a high logic state will determine which 25% of the array slice 1400 is selected. The row address mapping and column address mapping schemes for the present invention are discussed in more detail hereinabove in Section V. Row address data signals RA12<0:3> are provided by a CAS before RAS CBR ripple counter formed from cascading one bit CBR counters located in the row address buffers. In normal operation, the CBR ripple counter is used to provide internally-generated refresh address signals, but in the all row high test mode it is used to automatically generate row address signals RA12<0:3> for each CAS cycle. During each CAS cycle, the CBR ripple counter generates new row address signals RA12<0:3>. For example, during the first CAS cycle, the CBR ripple counter will generate a high logic state signal for row address signal RA12<0> only, thereby selecting 25% of the array slice 1400. During the second CAS cycle, the CBR ripple counter will, generate a high logic state signal for row address signal RA12<1> only, thereby selecting a different 25% of the array slice 1400. Likewise, during third and fourth CAS cycles the CBR counter will generate high logic state signals for only row address signals RA12<2> and RA12<3>, respectively. After four CAS cycles, the CBR counter will have selected the entire array slice 1400.

Referring back to FIG. 104, FIG. 104 illustrates timing diagrams of the RAS*, CAS, and WE signals used to practice the present invention. As shown, RAS* goes to a low logic state at a time indicated by reference number 1410 to fire the seed row 1402 so that the seed row data is latched by the sense amps 60, 62. A delay period 1412 following the RAS* cycle allows the sense amps 60, 62 to reach a stable state. At a time indicated by reference number 1414, WE goes to a low logic state and 25% of the rows in the array slice 1400, represented by row address; signal RA12<0>, are written with the data latched by the sense amps 60, 62. On the rising edge 1416 of the WE signal, another 25% of the rows in the array slice, represented by row address signal RA12<1>, is written. At trailing edge 1418 of the WE signal, another 25% of the rows in the array slice, represented by row address signal RA12<2>, is written. DVC2 is also disabled. At rising edge 1420, the final 25% of the rows in the array slice, represented by row address signal RA12<3>, is written. On the following trailing edge, DVC2 is set low. After the array slice 1400 has been written, the data can be read and analyzed to identify defects in the DRAM. Testing may also proceed to other array slices 1400 within the DRAM so that, with multiple iterations, the entire DRAM may be tested for defects.

One advantage of the all row high test mode is that it allows data to be quickly reproduced in a memory array. Another advantage is that the rate at which data is reproduced can be controlled by controlling the RAS*, CAS, and WE signals. As a result, the test mode can be used to study how quickly and in what manner a memory device will react during testing to better understand the DRAM 10 and to optimize the testing process.

In addition to operating in a plurality of test modes, in the present preferred embodiment, redundancy pretesting can be performed. There are two possible ways to use the redundancy pretest. At Probe there is the REDPRE probe pad. This pad is latched at RAS and CAS time to function as another address. If REDPRE is high at RAS time then the accompanying address will function as a redundancy pretest address. The same is true at CAS time. If the REDPRE pad is low at RAS time the address pins function in their normal manner. The same is true again at CAS time. That allows Probe to enter a redundancy pretest address at Row time and follow that with a normal column address. Also, a normal Row address can be followed by a redundant pretest column address. Once the part is packaged the REDPRE pad is no longer available and the REDROW and REDCOL test modes must be used.

The row redundancy pretest addresses are described in tables 11, 12 and 13. There are 32 elements in each 32 Meg octant organized into 8 banks of 4 elements. Element 3 in each bank is laser or antifuse programmable. Two physical rows are replaced in a 32 Meg array by each element. To exercise both physical rows attached to any particular element both states of the 16MEG* signal must be used. Table 11 illustrates how 16MEG is controlled by the various part types. Redundant rows can be pretested even if some of the redundancy has been enabled or if all redundancy has been disabled.

TABLE 11

16 MEG signal control

| part type | 16 MEG |
|---|---|
| X8 4K | CA12 |
| X16 4K | CA11 |
| ANY 8K | RA<12> |
| ANY 16K | RA<12> |

TABLE 12

Row Element Address Within a Bank

| RA0 | RA12 | Element |
|---|---|---|
| 0 | 0 | 0 |
| 1 | 1 | 1 |
| 0 | 2 | 2 |
| 1 | 3 | 3 laser/elect |

TABLE 13

Row Pretest Bank Address

| RA34 | RA56 | Bank |
|---|---|---|
| 0 | 0 | 0 |
| 1 | 0 | 1 |
| 2 | 0 | 2 |
| 3 | 0 | 3 |
| 0 | 1 | 4 |
| 1 | 1 | 5 |
| 2 | 1 | 6 |
| 3 | 1 | 7 |

Tables 14 to 19 below show the pretest addressing for the redundant column elements and their corresponding DQ. Each octant contains 32 column elements grouped into 8 banks of 4 elements. Element 3 is both laser or antifuse programmable. Table 14 shows how CA9, 32MEG are used to decode the octants. Addresses CA11, CA10 and CA7 are used to decode the various banks and CA1 and CA0 are used to decode 1 of 4 elements within each bank. Address CA8 selects between I/O pairs and must be tested in both states. Because the column pretest addresses feed through the laser fuses, the pretest may not work if any redundant elements have been enabled. Redundant column elements cannot be pretested if redundancy has been disabled.

TABLE 14

Addressing for Column Redundancy Pretest

| | 32 MEG<0> | 32 MEG<1> | 32 MEG<0> | 32 MEG<1> |
|---|---|---|---|---|
| CA9<1> | Octant 7 | Octant 6 | Octant 5 | Octant 4 |
| | | Periph | | |
| CA9<0> | Octant 0 | Octant 1 | Octant 2 | Octant 3 |

TABLE 15

32 MEG Signal Control

| Part Type | 32 MEG |
|---|---|
| ANY 16K | RA<13> |
| X4 8K or 4K | CA<12> |
| X8 8K or 4K | CA<11> |
| X16 8K or 4K | CA<10> |

TABLE 16

Column Element Address Within a Bank

| CA01 | Element |
|---|---|
| 0 | 0 |
| 1 | 1 |
| 2 | 2 |
| 3 | 3 Laser/Elect |

TABLE 17

Column Pretest Bank Addresses (X4)

| CA1011 | CA7 | Bank |
|---|---|---|
| 0 | 0 | 0 |
| 0 | 1 | 1 |
| 1 | 0 | 2 |
| 1 | 1 | 3 |
| 2 | 0 | 4 |
| 2 | 1 | 5 |
| 3 | 0 | 6 |
| 3 | 1 | 7 |

TABLE 18

Column Pretest Bank Addresses (X8)

| CA10 | CA7 | Banks |
|---|---|---|
| 0 | 0 | 0, 4 |
| 0 | 1 | 1, 5 |
| 1 | 0 | 2, 6 |
| 1 | 1 | 3, 7 |

TABLE 19

| Column Pretest Addresses (X16) | |
|---|---|
| CA7 | Banks |
| 0 | 0, 2, 4, 6 |
| 1 | 1, 3, 5, 7 |

FIG. 110 illustrates the chip 10 of the present invention and provides some exemplary dimensions of one embodiment. In the illustrated embodiment, total die space is approximately 574.5 k $mils^2$ with approximately 323.5 k $mils^2$ devoted to the active array. Thus, the active array occupies over half the total die space.

FIG. 111 illustrates an example of the connection of the bonding pads of the present invention to a lead frame 1422. As can be seen in FIG. 111, there are tie bars 1424 connecting several lead fingers 1425 to the lead frame 1422, thereby supporting the lead fingers 1425 so they do not move during a molding process. There are also combination tie bars and bus bars 1426. The combination tie bar and bus bar 1426 supports lead fingers 1425 during the molding process and, after the tie bars are cut in a trim and form process, the bus bar remains to serve as a power bus or a ground bus. The chip 10 of the present invention may be encapsulated in a package during a molding process, so that the package has an encapsulating body and electrically conductive interconnect pins, or leads, extending outwardly from the body. After the molding process, the trim and form process separates the lead frame from the leads and separates the leads from each other.

FIG. 112 illustrates a substrate carrying a plurality of chips 10, each constructed according to the teachings of the present invention. The size of the substrate, or wafer, is determined by the size of the fabrication equipment. A six inch wafer size is typical.

FIG. 113 is a block diagram illustrating the DRAM 10 of the present invention used in a microprocessor-based system 1430. The DRAM 10 is under the control of a microprocessor 1432 which may be programmed to carry out particular functions as is known in the art. The microprocessor-based system 1430 may be used, for example, in a personal computer, computer workstations, and consumer electronics products.

XII. Conclusion

While the present invention has been described in conjunction with preferred embodiments thereof, many modifications and variations will be apparent to those of ordinary skill in the art. For example, the number of individual arrays and their organization into array blocks, and the organization of the array blocks into quadrants may be varied. Rotation of an array by ninety degrees causes the rows to become columns and the columns to become rows. Therefore, descriptors such as "between adjacent columns" should be understood as including "between adjacent rows" in such a rotated device. Additionally, the position of the peripheral devices may be interchanged such that devices in the "columns" are in the "rows" and vice versa. The amount and location of the decoupling capacitors may be varied. More or less redundancy may be provided, and various combinations of laser and electrical types of fuses may be provided for logically replacing defective rows/columns with operational rows/columns. Other types of test modes may be supported. The number and location of the voltage supplies may be varied and numerous other types of circuits and logic may be supplied to provide the described functionality.

Other modifications and variations include varying the orientation of the array with respect to the periphery. The sequence of powering up the power supplies may be varied. Various signals may be combined with switched gates to effect different or additional functionality. Address space and DQ plans can be allocated differently. The distribution of address and control signals, predecoded versus nonpredecoded, results in various structural differences which are apparent to those of ordinary skill in the art. Decisions such as the number of metal layers also leads to distinctive circuit implementation. For example, the use of only two metal layers mandates the use of local row decoders. Different overall dimensions may be employed, as well as different bonding schemes between the chip and the lead frame.

Other decisions such as the size of the overall chip, density, memory size, and process limitations, will lead to many modifications and variations of the present invention too numerous to enumerate. The foregoing description and the following claims are intended to cover all such modifications and variations.

What is claimed is:

1. A device responsive to first and second external signals for controlling a power up of a first voltage supply, comprising:

a first circuit responsive to the first external signal for producing a first output signal indicative of whether the first external signal is greater than a first predetermined voltage; and a second circuit responsive to the first output signal and the second external signal for producing a first enable signal to enable the first voltage supply.

2. The device of claim 1, wherein said first predetermined voltage is approximately two volts.

3. The device of claim 1, wherein said first circuit includes:

a first voltage detector responsive to the first external signal for producing a first signal indicative of the first external signal being greater than said first predetermined voltage;

a second voltage detector responsive to the first external signal for producing a second signal indicative of the first external signal being greater than said first predetermined voltage; and a logic circuit responsive to said first and second signals for producing said first output signal.

4. The device of claim 3, wherein said first voltage detector includes:

a voltage limiting circuit responsive to the first external signal for producing a threshold signal; and a signal generating circuit responsive to the first external signal and said threshold signal for producing said first signal.

5. The device of claim 4, wherein said voltage limiting circuit includes:

a resistor having a first end and a second end, said first end in communication with the first external signal;

a plurality of series-connected, p-channel transistors each having a gate terminal in communication with a reference potential, with one of said transistors having a source terminal in communication with said second end of said resistor for producing said threshold signal, and another of said transistors having a drain terminal in communication with said reference potential, said transistors being capable of being shorted across their source and drain terminals to change the value of said threshold signal.

6. The device of claim 5, wherein said signal generating circuit includes:

a resistor having a first end and a second end, said first end in communication with a reference potential; and a p-channel transistor having a source terminal in communication with the first external signal, a gate terminal in communication with the threshold signal, and a drain terminal in communication with said second end of said resistor for producing said first signal.

7. The device of claim 3, wherein said second voltage detector includes:

a voltage limiting circuit responsive to the first external signal for producing a threshold signal; and a signal generating circuit responsive to the first external signal and said threshold signal for producing said second signal.

8. The device of claim 7, wherein said voltage limiting circuit includes:

a resistor having a first end and a second end, said first end in communication with a reference potential;

a plurality of series-connected, n-channel transistors each having a gate terminal in communication with the first external signal, with one of said transistors having a drain terminal in communication with the first external signal, and another of said transistors having a source terminal in communication with said second end of said resistor for producing the threshold signal, said transistors being capable of being shorted across their source and drain terminals to change the value of said threshold signal.

9. The device of claim 8, wherein said signal generating circuit includes:

a resistor having a first end and a second end, said first end in communication with the first external signal; and an n-channel transistor having a source terminal in communication with the reference potential, a gate terminal in communication with said threshold signal, and a drain terminal in communication with said second end of said resistor for producing said second signal.

10. The device of claim 7, wherein said second predetermined voltage is approximately 0.7 volts.

11. The device of claim 3, wherein said logic circuit includes:

first and second series connected inverters for receiving said first signal;

a third inverter for receiving said second signal;

a NAND gate responsive to said series connected first and second inverters and said third inverter; and a fourth inverter responsive to said NAND gate for producing said first output signal.

12. The device of claim 1, additionally comprising a reset circuit interposed between said first and second circuits for receiving said first output signal from said first circuit and for terminating said first output signal when predetermined stability requirements are not met.

13. The device of claim 12, wherein said predetermined stability requirements include said first output signal remaining within a predetermined range for approximately one hundred nanoseconds.

14. The device of claim 12 wherein said reset circuit includes:

a plurality of series-connected buffer gates with a first one of said buffer gates responsive to said first output signal; and a logic circuit responsive to said first output signal and a last one of said series-connected buffer gates.

15. The device of claim 14, wherein said reset circuit includes:

a NAND gate having a first input terminal in communication with said first output signal, a second input terminal in communication with said last one of said series-connected buffer gates, and an output terminal; and an inverter having an input terminal in communication with said output terminal of said NAND gate, and an output terminal at which said first output signal is available.

16. The device of claim 14 wherein said reset circuit further includes a reset logic gate responsive to said first output signal for producing a reset signal for resetting said buffer gates to a predetermined state.

17. The device of claim 1, wherein said second circuit includes:

a logic circuit responsive to said first output signal and the second external signal for producing an output signal; and a latch responsive to said output signal of said logic circuit for producing said first enable signal.

18. The device of claim 17, wherein said logic circuit includes a NAND gate having a first input terminal in communication with said first output signal, a second input terminal in communication with the second external signal, and an output terminal for producing said output signal of said logic circuit.

19. The device of claim 1, wherein said device is responsive to a third external signal for controlling the power up sequence of a second voltage supply, said device comprising:

a third circuit responsive to said first output signal, the second external signal, and the third external signal for producing a second enable signal to enable the second voltage supply.

20. The device of claim 19, wherein said third circuit includes:

a logic circuit responsive to said first output signal, the second external signal, and the third external signal for producing an output signal; and a latch responsive to said output signal of said logic circuit for producing said second enable signal.

21. The device of claim 20, wherein said logic circuit includes:

a NAND gate having a first input terminal in communication with said first output signal, a second input terminal in communication with the second external signal, a third input terminal in communication with the third external signal, and an output terminal for producing said output signal of said logic circuit.

22. A device for controlling the powering up of a first voltage supply, comprising:

a first voltage detector constructed of substantially identical p-channel and n-channel devices for producing a first output signal indicative of a first external signal being greater than a predetermined voltage substantially independently of process variations;

a reset circuit responsive to said first voltage detector for outputting said first output signal when said first external signal is stable;

a logic circuit responsive to said reset circuit and a second external signal; and a latch responsive to said logic circuit for producing a first enable signal for controlling the powering up of a first voltage supply.

23. The device of claim 22 wherein said reset circuit comprises:

a plurality of series-connected buffers with a first one of said buffers responsive to said first output signal; and a logic circuit responsive to said first output signal and a last one of said series-connected buffers.

24. The device of claim 23 wherein said reset circuit is constructed such that the first external signal must remain within a predetermined range for approximately one hundred nanoseconds for said logic circuit to output said first output signal.

25. A device for controlling the powering up of a first voltage supply, comprising:

a first voltage detector comprised of p-channel devices for producing a first signal indicative of a first external signal being greater than a first predetermined voltage;

a second voltage detector comprised of n-channel devices for producing a second signal indicative of the first external signal being greater than said first predetermined voltage;

a logic circuit responsive to said first and second signals for producing a first output signal;

a reset circuit responsive to said first output signal;

a logic circuit responsive to said reset circuit and a second external signal; and a latch responsive to said logic circuit for producing a first enable signal for controlling the powering up of a first voltage supply.

26. The device of claim 25 wherein said reset circuit comprises:

a plurality of series-connected buffers with a first one of said buffers responsive to said first output signal; and a logic circuit responsive to said first output signal and a last one of said series-connected buffers.

27. The device of claim 26 wherein said reset circuit is constructed such that the first external signal must remain within a predetermined range for approximately one hundred nanoseconds for said logic circuit to output said first output signal.

28. A device for an integrated circuit having a voltage supply responsive to a voltage external to the integrated circuit and generating a feedback signal, said device comprising:

a first circuit portion responsive to the external voltage for producing a first output signal indicative of whether the external voltage is above a predetermined value; and a second circuit portion responsive to said first output signal and the feedback signal for producing a first enable signal to enable the voltage supply.

29. The device of claim 28, wherein said first circuit portion includes:

a first voltage detector constructed of p-type components and responsive to the external voltage for producing a first signal indicative of the external voltage being greater than said predetermined value;

a second voltage detector constructed of n-type components and responsive to the external voltage for producing a second signal indicative of the external voltage being greater than said predetermined value; and a logic circuit responsive to said first and second signals for producing said first output signal.

30. The device of claim 28, wherein said second circuit portion includes:

a logic circuit responsive to said first output signal and the feedback signal for producing an output signal; and a latch responsive to said output signal of said logic circuit for producing said first enable signal.

31. The device of claim 28, additionally comprising a reset circuit interposed between said first and second circuit portions for receiving said first output signal from said first circuit portion and for terminating said first output signal when predetermined stability requirements are not meet.

* * * * *

UNITED STATES PATENT AND TRADEMARK OFFICE

CERTIFICATE OF CORRECTION

PATENT NO. : 6,934,173 B2
APPLICATION NO. : 09/893389
DATED : August 23, 2005
INVENTOR(S) : Brent Keeth et al.

It is certified that error appears in the above-identified patent and that said Letters Patent is hereby corrected as shown below:

TITLE PAGE

(*) Notice:

Subject to any disclaimer, the term of this patent is extended or adjusted under 35 U.S.C. 154(b) by 961 days.

SHOULD READ

Subject to any disclaimer, the term of this patent is extended or adjusted under 35 U.S.C. 154(b) by 562 days.

Signed and Sealed this

Fifteenth Day of January, 2008

JON W. DUDAS
*Director of the United States Patent and Trademark Office*